US012652950B2

(12) United States Patent
Seo et al.

(10) Patent No.: US 12,652,950 B2
(45) Date of Patent: Jun. 9, 2026

(54) IRIDIUM COMPLEX, LIGHT-EMITTING ELEMENT, DISPLAY DEVICE, ELECTRONIC DEVICE, AND LIGHTING DEVICE

(71) Applicant: SEMICONDUCTOR ENERGY LABORATORY CO., LTD., Atsugi (JP)

(72) Inventors: Satoshi Seo, Sagamihara (JP); Takeyoshi Watabe, Isehara (JP); Hideko Inoue, Atsugi (JP); Yui Yamada, Atsugi (JP); Satomi Mitsumori, Atsugi (JP); Tatsuyoshi Takahashi, Atsugi (JP); Tomoka Hara, Zama (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 898 days.

(21) Appl. No.: 17/875,925

(22) Filed: Jul. 28, 2022

(65) Prior Publication Data

US 2023/0105618 A1 Apr. 6, 2023

Related U.S. Application Data

(63) Continuation of application No. 16/874,737, filed on May 15, 2020, now abandoned, which is a continuation of application No. 15/181,605, filed on Jun. 14, 2016, now abandoned.

(30) Foreign Application Priority Data

| | | |
|---|---|---|
| Jun. 17, 2015 | (JP) | 2015-122398 |
| Aug. 7, 2015 | (JP) | 2015-157207 |
| Nov. 30, 2015 | (JP) | 2015-233283 |
| Mar. 15, 2016 | (JP) | 2016-051311 |

(51) Int. Cl.

| | |
|---|---|
| ***H10K 50/11*** | (2023.01) |
| ***C07F 15/00*** | (2006.01) |
| ***C09K 11/02*** | (2006.01) |
| ***C09K 11/06*** | (2006.01) |
| ***H10K 85/30*** | (2023.01) |
| *H10K 85/60* | (2023.01) |
| *H10K 101/00* | (2023.01) |
| *H10K 101/10* | (2023.01) |
| *H10K 101/30* | (2023.01) |

(52) U.S. Cl.

CPC ....... *H10K 85/342* (2023.02); *C07F 15/0033* (2013.01); *C09K 11/025* (2013.01); *C09K 11/06* (2013.01); *H10K 50/11* (2023.02); *C09K 2211/1007* (2013.01); *C09K 2211/1059* (2013.01); *C09K 2211/185* (2013.01); *H10K 85/654* (2023.02); *H10K 85/6572* (2023.02); *H10K 85/6576* (2023.02); *H10K 2101/10* (2023.02); *H10K 2101/30* (2023.02); *H10K 2101/80* (2023.02); *H10K 2101/90* (2023.02)

(58) Field of Classification Search

None

See application file for complete search history.

(56) References Cited

U.S. PATENT DOCUMENTS

| | | | |
|---|---|---|---|
| 7,175,922 | B2 | 2/2007 | Jarikov et al. |
| 7,183,010 | B2 | 2/2007 | Jarikov |
| 7,332,857 | B2 | 2/2008 | Seo et al. |
| 7,597,967 | B2 | 10/2009 | Kondakova et al. |
| 7,902,374 | B2 | 3/2011 | Lin et al. |
| 7,906,226 | B2 | 3/2011 | Matsuura et al. |
| 7,993,760 | B2 | 8/2011 | Komori et al. |
| 8,007,927 | B2 | 8/2011 | Lin et al. |
| 8,034,465 | B2 | 10/2011 | Liao et al. |
| 8,105,701 | B2 | 1/2012 | Matsuura et al. |
| 8,221,905 | B2 | 7/2012 | Lin et al. |
| 8,274,214 | B2 | 9/2012 | Ikeda et al. |

(Continued)

FOREIGN PATENT DOCUMENTS

| | | |
|---|---|---|
| CN | 101180304 A | 5/2008 |
| CN | 103155201 A | 6/2013 |

(Continued)

OTHER PUBLICATIONS

Seo.S et al., "Exciplex-triplet energy transfer: A new method to achieve extremely efficient organic light-emitting diode with external quantum efficiency over 30% and drive voltage below 3V", Jpn. J. Appl. Phys. (Japanese Journal of Applied Physics) , Mar. 17, 2014, vol. 53, No. 4, pp. 042102-1-042102-8, The Japan Society of Applied Physics.

German Office Action (Application No. 112016002728.1) Dated Nov. 17, 2023.

International Search Report (Application No. PCT/IB2016/053427) Dated Oct. 4, 2016.

Written Opinion (Application No. PCT/IB2016/053427) Dated Oct. 4, 2016.

Yersin.H et al., Highly Efficient OLEDs with Phosphorescent Materials, 2008, pp. 1-97,283-309, Wiley-VCH Verlag Gmbh & Co.

(Continued)

*Primary Examiner* — Robert S Loewe

(74) *Attorney, Agent, or Firm* — Fish & Richardson P.C.

(57) ABSTRACT

Provided is a light-emitting element with high emission efficiency. The light-emitting element includes a first organic compound, a second organic compound, and a guest material. The LUMO level of the first organic compound is lower than that of the second organic compound, and the HOMO level of the first organic compound is lower than that of the second organic compound. The LUMO level of a guest material is higher than that of the first organic compound, and the HOMO level of the guest material is lower than that of the second organic compound. The guest material has a function of converting triplet excitation energy into light emission. The first organic compound and the second organic compound form an exciplex.

17 Claims, 100 Drawing Sheets

(56) References Cited

U.S. PATENT DOCUMENTS

| | | | |
|---|---|---|---|
| 8,367,850 | B2 | 2/2013 | Ma et al. |
| 8,470,455 | B2 | 6/2013 | Matsuura et al. |
| 8,580,402 | B2 | 11/2013 | Lin et al. |
| 8,586,204 | B2 | 11/2013 | Xia et al. |
| 8,652,652 | B2 | 2/2014 | Brooks et al. |
| 8,736,157 | B2 | 5/2014 | Seo et al. |
| 8,795,851 | B2 | 8/2014 | Inoue et al. |
| 8,822,708 | B2 | 9/2014 | Ma et al. |
| 8,853,680 | B2 | 10/2014 | Yamazaki et al. |
| 8,866,377 | B2 | 10/2014 | Adamovich et al. |
| 8,921,548 | B2 | 12/2014 | Inoue et al. |
| 8,957,236 | B2 | 2/2015 | Zhang et al. |
| 8,963,127 | B2 | 2/2015 | Pieh et al. |
| 8,981,355 | B2 | 3/2015 | Seo |
| 8,993,129 | B2 | 3/2015 | Endo et al. |
| 8,994,263 | B2 | 3/2015 | Shitagaki et al. |
| 9,029,558 | B2 | 5/2015 | Osaka et al. |
| 9,051,344 | B2 | 6/2015 | Lin et al. |
| 9,054,317 | B2 | 6/2015 | Monkman et al. |
| 9,065,066 | B2 | 6/2015 | Seo et al. |
| 9,123,903 | B2 | 9/2015 | Lin et al. |
| 9,123,907 | B2 | 9/2015 | Seo et al. |
| 9,153,786 | B2 | 10/2015 | Ma et al. |
| 9,159,942 | B2 | 10/2015 | Seo et al. |
| 9,175,213 | B2 | 11/2015 | Seo et al. |
| 9,184,398 | B2 | 11/2015 | Inoue et al. |
| 9,269,906 | B2 | 2/2016 | Suzuki et al. |
| 9,273,079 | B2 | 3/2016 | Inoue et al. |
| 9,309,458 | B2 | 4/2016 | Inoue et al. |
| 9,356,250 | B2 | 5/2016 | Ohsawa et al. |
| 9,412,962 | B2 | 8/2016 | Hamada et al. |
| 9,502,666 | B2 | 11/2016 | Nakayama et al. |
| 9,577,200 | B2 | 2/2017 | Ma et al. |
| 9,590,180 | B2 | 3/2017 | Brooks et al. |
| 9,595,686 | B2 | 3/2017 | Seo et al. |
| 9,604,928 | B2 | 3/2017 | Shitagaki et al. |
| 9,608,206 | B2 | 3/2017 | Brooks et al. |
| 9,735,377 | B2 | 8/2017 | Xia et al. |
| 9,799,834 | B2 | 10/2017 | Osaka et al. |
| 9,985,223 | B2 | 5/2018 | Inoue et al. |
| 9,997,726 | B2 | 6/2018 | Lin et al. |
| 9,997,727 | B2 | 6/2018 | Ma et al. |
| 10,069,076 | B2 | 9/2018 | Hamada et al. |
| 10,141,524 | B2 | 11/2018 | Inoue et al. |
| 10,193,097 | B2 | 1/2019 | Suzuki et al. |
| 10,224,494 | B2 | 3/2019 | Watabe et al. |
| 10,312,450 | B2 | 6/2019 | Brooks et al. |
| 10,374,171 | B2 | 8/2019 | Ma et al. |
| 10,381,579 | B2 | 8/2019 | Lin et al. |
| 10,439,150 | B2 | 10/2019 | Nakayama et al. |
| 10,573,829 | B2 | 2/2020 | Shitagaki et al. |
| 10,586,931 | B2 | 3/2020 | Kanamoto et al. |
| 10,586,934 | B2 | 3/2020 | Shitagaki et al. |
| 10,593,895 | B2 | 3/2020 | Shitagaki et al. |
| 10,818,861 | B2 | 10/2020 | Seo et al. |
| 10,897,012 | B2 | 1/2021 | Hamada et al. |
| 11,043,637 | B2 | 6/2021 | Hamada et al. |
| 11,088,332 | B2 | 8/2021 | Kanamoto et al. |
| 2003/0175553 | A1 | 9/2003 | Thompson et al. |
| 2005/0048310 | A1 | 3/2005 | Cocchi et al. |
| 2005/0221116 | A1 | 10/2005 | Cocchi et al. |
| 2006/0134464 | A1 | 6/2006 | Nariyuki |
| 2006/0251923 | A1 | 11/2006 | Lin et al. |
| 2007/0090756 | A1 | 4/2007 | Okada et al. |
| 2008/0314965 | A1 | 12/2008 | Roberts et al. |
| 2009/0153034 | A1 | 6/2009 | Lin et al. |
| 2011/0198988 | A1 | 8/2011 | Inoue et al. |
| 2012/0098417 | A1 | 4/2012 | Inoue et al. |
| 2012/0133273 | A1 | 5/2012 | Inoue et al. |
| 2012/0205632 | A1 | 8/2012 | Shitagaki et al. |
| 2012/0217486 | A1 | 8/2012 | Takemura et al. |
| 2012/0217487 | A1 | 8/2012 | Yamazaki et al. |
| 2012/0235131 | A1 | 9/2012 | Okamoto |
| 2012/0256535 | A1 | 10/2012 | Seo et al. |
| 2012/0305896 | A1 | 12/2012 | Inoue et al. |
| 2013/0048964 | A1 | 2/2013 | Takeda et al. |
| 2013/0277654 | A1 | 10/2013 | Seo et al. |
| 2013/0277655 | A1 | 10/2013 | Seo et al. |
| 2013/0281693 | A1 | 10/2013 | Inoue et al. |
| 2013/0292656 | A1 | 11/2013 | Seo et al. |
| 2014/0034927 | A1 | 2/2014 | Seo et al. |
| 2014/0042413 | A1 | 2/2014 | Xia et al. |
| 2014/0284578 | A1 | 9/2014 | Takeda et al. |
| 2015/0069352 | A1 | 3/2015 | Kim et al. |
| 2015/0073144 | A1 | 3/2015 | Inoue et al. |
| 2015/0188068 | A1 | 7/2015 | Seo et al. |
| 2015/0236278 | A1 | 8/2015 | Bryman et al. |
| 2015/0311464 | A1 | 10/2015 | Seo et al. |
| 2016/0028022 | A1 | 1/2016 | Seo et al. |
| 2016/0056396 | A1 | 2/2016 | Sugino et al. |
| 2016/0315273 | A1 | 10/2016 | Kawabe et al. |
| 2016/0372688 | A1* | 12/2016 | Seo .................... C07F 15/0033 |
| 2017/0025615 | A1 | 1/2017 | Seo et al. |
| 2017/0025630 | A1 | 1/2017 | Seo et al. |
| 2017/0040553 | A1 | 2/2017 | Watabe et al. |
| 2019/0245147 | A1 | 8/2019 | Brooks et al. |
| 2020/0006674 | A1 | 1/2020 | Lin et al. |
| 2020/0194692 | A1 | 6/2020 | Shitagaki et al. |
| 2020/0365819 | A1 | 11/2020 | Seo et al. |
| 2021/0328145 | A1 | 10/2021 | Hamada et al. |
| 2024/0057474 | A1 | 2/2024 | Hamada et al. |

FOREIGN PATENT DOCUMENTS

| | | | |
|---|---|---|---|
| CN | 103168043 | A | 6/2013 |
| CN | 103254241 | A | 8/2013 |
| CN | 103288879 | A | 9/2013 |
| CN | 103374043 | A | 10/2013 |
| CN | 103378300 | A | 10/2013 |
| CN | 104247075 | A | 12/2014 |
| CN | 104247077 | A | 12/2014 |
| CN | 105304825 | A | 2/2016 |
| DE | 112011103544 | | 8/2013 |
| DE | 112012003517 | | 5/2014 |
| DE | 112013002094 | | 1/2015 |
| DE | 112013002566 | | 2/2015 |
| DE | 102015213426 | | 1/2016 |
| EP | 1202608 | A | 5/2002 |
| EP | 2511254 | A | 10/2012 |
| EP | 2738177 | A | 6/2014 |
| EP | 2980094 | A | 2/2016 |
| EP | 3112336 | A | 1/2017 |
| EP | 3159333 | A | 4/2017 |
| EP | 3424918 | A | 1/2019 |
| JP | 2004-063277 | A | 2/2004 |
| JP | 2005-154396 | A | 6/2005 |
| JP | 2007-251097 | A | 9/2007 |
| JP | 2008-069221 | A | 3/2008 |
| JP | 2008-210941 | A | 9/2008 |
| JP | 2008-288344 | A | 11/2008 |
| JP | 2009-016719 | A | 1/2009 |
| JP | 2009-021335 | A | 1/2009 |
| JP | 2009-021336 | A | 1/2009 |
| JP | 2010-182699 | A | 8/2010 |
| JP | 2010-530640 | | 9/2010 |
| JP | 2011-258373 | A | 12/2011 |
| JP | 2012-149030 | A | 8/2012 |
| JP | 2012-186461 | A | 9/2012 |
| JP | 2012-195572 | A | 10/2012 |
| JP | 2012-212879 | A | 11/2012 |
| JP | 2012-227524 | A | 11/2012 |
| JP | 2013-008806 | A | 1/2013 |
| JP | 2013-038299 | A | 2/2013 |
| JP | 2013-041990 | A | 2/2013 |
| JP | 2013-236058 | A | 11/2013 |
| JP | 2013-237662 | A | 11/2013 |
| JP | 2013-239431 | A | 11/2013 |
| JP | 2013-239704 | A | 11/2013 |
| JP | 2014-015444 | A | 1/2014 |
| JP | 2014-029971 | A | 2/2014 |
| JP | 2014-078703 | A | 5/2014 |
| JP | 2014-096557 | A | 5/2014 |
| JP | 2014-112715 | A | 6/2014 |
| JP | 2014-152151 | A | 8/2014 |

(56) References Cited

FOREIGN PATENT DOCUMENTS

| | | | |
|---|---|---|---|
| JP | 2014-197657 | A | 10/2014 |
| JP | 2014-208614 | A | 11/2014 |
| JP | 2015-005765 | A | 1/2015 |
| JP | 2015-144303 | A | 8/2015 |
| JP | 2016-032108 | A | 3/2016 |
| JP | 2016-106119 | A | 6/2016 |
| JP | 2017-119682 | A | 7/2017 |
| KR | 2013-0114377 | A | 10/2013 |
| KR | 2013-0116185 | A | 10/2013 |
| KR | 2014-0001850 | A | 1/2014 |
| KR | 2014-0012769 | A | 2/2014 |
| KR | 2014-0064892 | A | 5/2014 |
| KR | 2015-0002674 | A | 1/2015 |
| KR | 2015-0008859 | A | 1/2015 |
| KR | 2015-0121107 | A | 10/2015 |
| KR | 2016-0012948 | A | 2/2016 |
| TW | 201233767 | | 8/2012 |
| TW | 201311650 | | 3/2013 |
| TW | 201336969 | | 9/2013 |
| TW | 201347265 | | 11/2013 |
| TW | 201349619 | | 12/2013 |
| TW | 201351745 | | 12/2013 |
| TW | 201610091 | | 3/2016 |
| WO | WO-2006/121811 | | 11/2006 |
| WO | WO-2008/054584 | | 5/2008 |
| WO | WO-2008/156554 | | 12/2008 |
| WO | WO-2009/021107 | | 2/2009 |
| WO | WO-2009/021126 | | 2/2009 |
| WO | WO-2009/030981 | | 3/2009 |
| WO | WO-2009/085344 | | 7/2009 |
| WO | WO-2009/086028 | | 7/2009 |
| WO | WO-2011/065138 | | 6/2011 |
| WO | WO-2012/053627 | | 4/2012 |
| WO | WO-2012/111579 | | 8/2012 |
| WO | WO-2012/137693 | | 10/2012 |
| WO | WO-2013/027846 | | 2/2013 |
| WO | WO-2013/157506 | | 10/2013 |
| WO | WO-2013/157559 | | 10/2013 |
| WO | WO-2014/021441 | | 2/2014 |
| WO | WO-2014/046221 | | 3/2014 |
| WO | WO-2014/085296 | | 6/2014 |
| WO | WO-2014/156922 | | 10/2014 |
| WO | WO-2017/109637 | | 6/2017 |

OTHER PUBLICATIONS

Tokito.S et al., "Improvement in performance by doping", Organic EL Display, Aug. 20, 2004, pp. 67-99, Ohmsha.

Jeon.W et al., "Ideal host and guest system in phosphorescent OLEDs", Organic Electronics, 2009, vol. 10, pp. 240-246, Elsevier.

Su.S et al., "RGB Phosphorescent Organic Light-Emitting Diodes by Using Host Materials with Heterocyclic Cores:Effect of Nitrogen Atom Orientations", Chem. Mater. (Chemistry of Materials), 2011, vol. 23, No. 2, pp. 274-284.

Rausch.A et al., "Matrix Effects on the Triplet State of the OLED Emitter Ir(4,6-dFppy)2(pic)(FIrpic): Investigations by High-Resolution Optical Spectroscopy", Inorg. Chem. (Inorganic Chemistry), 2009, vol. 48, No. 5, pp. 1928-1937.

Gong.X et al., "Phosphorescence from iridium complexes doped into polymer blends", J. Appl. Phys. (Journal of Applied Physics) , Feb. 1, 2004, vol. 95, No. 3, pp. 948-953.

Zhao.Q et al., "Synthesis and Photophysical, Electrochemical, and Electrophosphorescent Properties of a Series of Iridium(III) Complexes Based on Quinoline Derivatives and Different B-Diketonate Ligands", Organometallics, Jun. 14, 2006, vol. 25, No. 15, pp. 3631-3638.

Hino.Y et al., "Red Phosphorescent Organic Light-Emitting Diodes Using Mixture System of Small-Molecule and Polymer Host", Jpn. J. Appl. Phys. (Japanese Journal of Applied Physics) , Apr. 21, 2005, vol. 44, No. 4B, pp. 2790-2794.

Tsuboyama.A et al., "Homoleptic Cyclometalated Iridium Complexes with Highly Efficient Red Phosphorescence and Application to Organic Light-Emitting Diode", J. Am. Chem. Soc. (Journal of the American Chemical Society), 2003, vol. 125, No. 42, pp. 12971-12979.

Kondakova.M et al., "High-efficiency, low-voltage phosphorescent organic light-emitting diode devices with mixed host", J. Appl. Phys. (Journal of Applied Physics) , Nov. 4, 2008, vol. 104, pp. 094501-1-094501-17.

Chen.F et al., "Triplet Exciton Confinement in Phosphorescent Polymer Light-Emitting Diodes", Appl. Phys. Lett. (Applied Physics Letters) , Feb. 17, 2003, vol. 82, No. 7, pp. 1006-1008.

Lee.J et al., "Stabilizing the efficiency of phosphorescent organic light-emitting diodes", SPIE Newsroom, Apr. 21, 2008, pp. 1-3.

Tokito.S et al., "Confinement of Triplet Energy on Phosphorescent Molecules for Highly-Efficient Organic Blue-Light-Emitting Devices", Appl. Phys. Lett. (Applied Physics Letters) , Jul. 21, 2003, vol. 83, No. 3, pp. 569-571.

Endo.A et al., "Efficient Up-Conversion of Triplet Excitons Into a Singlet State and Its Application for Organic Light Emitting Diodes", Appl. Phys. Lett. (Applied Physics Letters) , Feb. 24, 2011, vol. 98, No. 8, pp. 083302-1-083302-3.

Itano.K et al., "Exciplex formation at the organic solid-state interface: Yellow emission in organic light-emittingdiodes using green-fluorescent tris(8-quinolinolato)aluminum and hole-transporting molecular materials with low ionization potentials", Appl. Phys. Lett. (Applied Physics Letters) , Feb. 9, 1998, vol. 72, No. 6, pp. 636-638.

Park.Y et al., "Efficient triplet harvesting by fluorescent molecules through exciplexes for high efficiency organic light-emitting diodes", Appl. Phys. Lett. (Applied Physics Letters) , Apr. 18, 2013, vol. 102, No. 15, pp. 153306-1-153306-5.

Lee.J et al., "An Exciplex Forming Host for Highly Efficient Blue Organic Light Emitting Diodes with Low Driving Voltage", Adv. Funct. Mater. (Advanced Functional Materials), Oct. 22, 2014, vol. 25, No. 3, pp. 361-366.

Lee.S et al., "Low Roll-Off and High Efficiency Orange Organic Light Emitting Diodes with Controlled Co-Doping of Green and Red Phosphorescent Dopants in an Exciplex Forming Co-Host", Adv. Funct. Mater. (Advanced Functional Materials), Sep. 6, 2013, vol. 23, No. 33, pp. 4105-4110.

Park.Y et al., "Exciplex-Forming Co-host for Organic Light-Emitting Diodes with Ultimate Efficiency", Adv. Funct. Mater. (Advanced Functional Materials), Oct. 18, 2013, vol. 23, No. 39, pp. 4914-4920.

Taiwanese Office Action (Application No. 105119160) Dated Apr. 7, 2020.

* cited by examiner

IRIDIUM COMPLEX, LIGHT-EMITTING ELEMENT, DISPLAY DEVICE, ELECTRONIC DEVICE, AND LIGHTING DEVICE

CROSS-REFERENCE TO RELATED APPLICATIONS

This application is a continuation of U.S. application Ser. No. 16/874,737, filed May 15, 2020, now pending, which is a continuation of U.S. application Ser. No. 15/181,605, filed Jun. 14, 2016, now abandoned, which claims the benefit of foreign priority applications filed in Japan as Serial No. 2015-122398 on Jun. 17, 2015, Serial No. 2015-157207 on Aug. 7, 2015, Serial No. 2015-233283 on Nov. 30, 2015, and Serial No. 2016-051311 on Mar. 15, 2016, all of which are incorporated by reference.

TECHNICAL FIELD

One embodiment of the present invention relates to a light-emitting element, or a display device, an electronic device, and a lighting device each including the light-emitting element.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

In recent years, research and development have been extensively conducted on light-emitting elements using electroluminescence (EL). In a basic structure of such a light-emitting element, a layer containing a light-emitting substance (an EL layer) is interposed between a pair of electrodes. By applying a voltage between the pair of electrodes of this element, light emission from the light-emitting substance can be obtained.

Since the above light-emitting element is of a self-luminous type, a display device using this light-emitting element has advantages such as high visibility, no necessity of a backlight, low power consumption, and the like. Further, the display device also has advantages in that it can be formed to be thin and lightweight, and has high response speed.

In a light-emitting element (e.g., an organic EL element) whose EL layer contains an organic compound as a light-emitting substance and is provided between a pair of electrodes, application of a voltage between the pair of electrodes causes injection of electrons from a cathode and holes from an anode into the EL layer having a light-emitting property and thus a current flows. By recombination of the injected electrons and holes, the organic compound having a light-emitting property is brought into an excited state to provide light emission.

Note that an excited state formed by an organic compound can be a singlet excited state (S*) or a triplet excited state (T*). Light emission from the singlet excited state is referred to as fluorescence, and light emission from the triplet excited state is referred to as phosphorescence. The formation ratio of S* to T* in the light-emitting element is 1:3. In other words, a light-emitting element containing a compound emitting phosphorescence (phosphorescent compound) has higher light emission efficiency than a light-emitting element containing a compound emitting fluorescence (fluorescent compound). Therefore, light-emitting elements containing phosphorescent compounds capable of converting a triplet excited state into light emission has been actively developed in recent years (e.g., see Patent Document 1).

Energy for exciting an organic compound depends on an energy difference between the LUMO level and the HOMO level of the organic compound. The energy difference approximately corresponds to singlet excitation energy. In a light-emitting element including a phosphorescent compound, triplet excitation energy is converted into light emission energy. Accordingly, when the organic compound has a large difference between the singlet excitation energy and the triplet excitation energy, the energy for exciting the organic compound is higher than the light emission energy by the energy difference. The difference between the energy for exciting the organic compound and the light emission energy affects element characteristics of a light-emitting element: the driving voltage of the light-emitting element increases. For this reason, a method for reducing driving voltage has been searched (see Patent Document 2).

Among light-emitting elements including phosphorescent compounds, a light-emitting element that emits blue light has not been put into practical use yet because it is difficult to develop a stable compound having a high triplet excitation energy level. Accordingly, development of a stable phosphorescent compound with high emission efficiency and a highly reliable phosphorescent light-emitting element with high emission efficiency is required.

REFERENCE

Patent Document

[Patent Document 1] Japanese Published Patent Application No. 2010-182699

[Patent Document 2] Japanese Published Patent Application No. 2012-212879

DISCLOSURE OF INVENTION

An iridium complex is known as a phosphorescent compound with high emission efficiency. An iridium complex including a nitrogen-containing five-membered heterocyclic skeleton as a ligand is known as an iridium complex with high light emission energy. The nitrogen-containing five-membered heterocyclic skeleton has high triplet excitation energy but has a lower electron-accepting property than a nitrogen-containing six-membered heterocyclic skeleton. Thus, the iridium complex including a nitrogen-containing five-membered heterocyclic skeleton as a ligand has a high LUMO level and to which electron carriers are not easily injected. For this reason, in the iridium complex including a nitrogen-containing five-membered heterocyclic skeleton as a ligand, excitation of carriers by direct carrier recombination is difficult, which means that efficient light emission is difficult.

In view of the above, an object of one embodiment of the present invention is to provide a light-emitting element that contains a phosphorescent compound and has high emission efficiency. Another object of one embodiment of the present invention is to provide a light-emitting element with low power consumption. Another object of one embodiment of the present invention is to provide a light-emitting element with high reliability. Another object of one embodiment of the present invention is to provide a novel compound. Another object of one embodiment of the present invention is to provide a light-emitting element including a novel compound. Another object of one embodiment of the present invention is to provide a novel light-emitting element. Another object of one embodiment of the present invention is to provide a novel light-emitting device. Another object of one embodiment of the present invention is to provide a novel display device.

Note that the description of these objects does not disturb the existence of other objects. In one embodiment of the present invention, there is no need to achieve all the objects. Other objects will be apparent from and can be derived from the description of the specification and the like.

One embodiment of the present invention is a light-emitting element including an exciplex that can excite a phosphorescent compound efficiently or a light-emitting element including a novel phosphorescent compound that can emit light with high emission energy.

Therefore, one embodiment of the present invention is a light-emitting element including a first organic compound, a second organic compound, and a guest material. The LUMO level of the first organic compound is lower than that of the second organic compound. The HOMO level of the first organic compound is lower than that of the second organic compound. An energy difference between the LUMO level and the HOMO level of the guest material is larger than an energy difference between the LUMO level of the first organic compound and the HOMO level of the second organic compound. The guest material has a function of converting triplet excitation energy into light emission. A combination of the first organic compound and the second organic compound forms an exciplex.

Another embodiment of the present invention is a light-emitting element including a first organic compound, a second organic compound, and a guest material. The LUMO level of the first organic compound is lower than the LUMO level of the second organic compound. The HOMO level of the first organic compound is lower than the HOMO level of the second organic compound. The LUMO level of the guest material is higher than the LUMO level of the first organic compound. The HOMO level of the guest material is lower than the HOMO level of the second organic compound. The guest material is configured to convert triplet excitation energy into light emission. A combination of the first organic compound and the second organic compound forms an exciplex.

Another embodiment of the present invention is a light-emitting element including a first organic compound, a second organic compound, and a guest material. The LUMO level of the first organic compound is lower than the LUMO level of the second organic compound. The HOMO level of the first organic compound is lower than the HOMO level of the second organic compound. The LUMO level of the guest material is the same as the LUMO level of the first organic compound. The HOMO level of the guest material is lower than the HOMO level of the second organic compound. The guest material is configured to convert triplet excitation energy into light emission. A combination of the first organic compound and the second organic compound forms an exciplex.

Another embodiment of the present invention is a light-emitting element including a first organic compound, a second organic compound, and a guest material. The LUMO level of the first organic compound is lower than the LUMO level of the second organic compound. The HOMO level of the first organic compound is lower than the HOMO level of the second organic compound. The LUMO level of the guest material is higher than the LUMO level of the first organic compound. The HOMO level of the guest material is the same as the HOMO level of the second organic compound. The guest material is configured to convert triplet excitation energy into light emission. A combination of the first organic compound and the second organic compound forms an exciplex.

Another embodiment of the present invention is a light-emitting element including a first organic compound, a second organic compound; and a guest material. A reduction potential of the first organic compound is higher than a reduction potential of the second organic compound. An oxidation potential of the first organic compound is higher than an oxidation potential of the second organic compound. A reduction potential of the guest material is lower than the reduction potential of the first organic compound. An oxidation potential of the guest material is higher than the oxidation potential of the second organic compound. The guest material is configured to convert triplet excitation energy into light emission. A combination of the first organic compound and the second organic compound forms an exciplex.

Another embodiment of the present invention is a light-emitting element including a first organic compound, a second organic compound; and a guest material. A reduction potential of the first organic compound is higher than a reduction potential of the second organic compound. An oxidation potential of the first organic compound is higher than an oxidation potential of the second organic compound. A reduction potential of the guest material is the same as the reduction potential of the first organic compound. An oxidation potential of the guest material is higher than the oxidation potential of the second organic compound. The guest material is configured to convert triplet excitation energy into light emission. A combination of the first organic compound and the second organic compound forms an exciplex.

Another embodiment of the present invention is a light-emitting element including a first organic compound, a second organic compound; and a guest material. A reduction potential of the first organic compound is higher than a reduction potential of the second organic compound. An oxidation potential of the first organic compound is higher than an oxidation potential of the second organic compound. A reduction potential of the guest material is lower than the reduction potential of the first organic compound. An oxidation potential of the guest material is the same as the oxidation potential of the second organic compound. The guest material is configured to convert triplet excitation energy into light emission. A combination of the first organic compound and the second organic compound forms an exciplex.

In each of the above structures, it is preferable that an energy difference between the LUMO level of the first organic compound and the HOMO level of the second organic compound be larger than or equal to transition energy obtained from an absorption edge of the guest material.

In each of the above structures, it is preferable that an energy difference between the LUMO level of the first organic compound and the HOMO level of the second organic compound be larger than or equal to light emission energy of the guest material.

In each of the above structures, it is preferable that an energy difference between the LUMO level of the guest material and the HOMO level of the guest material be larger than the transition energy obtained from the absorption edge of the guest material by 0.4 eV or more.

In each of the above structures, it is preferable that the energy difference between the LUMO level of the guest material and the HOMO level of the guest material be larger than the light emission energy of the guest material by 0.4 eV or more.

In each of the above structures, it is preferable that an emission spectrum of the guest material have at least one peak in a wavelength region of greater than or equal to 400 nm and less than 505 nm.

In each of the above structures, it is preferable that the exciplex be configured to transfer excitation energy to the guest material. In addition, it is preferable that an emission spectrum of the exciplex have a region overlapping an absorption band on the lowest energy side of the guest material.

In each of the above structures, the guest material preferably includes iridium. The guest material preferably includes a ligand coordinated to the iridium and the ligand preferably includes a nitrogen-containing five-membered heterocyclic skeleton. The ligand preferably includes a triazole skeleton or an imidazole skeleton.

Another embodiment of the present invention is an iridium complex represented by General Formula (G1).

(G1)

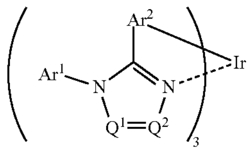

In General Formula (G1), $Ar^1$ represents a substituted or unsubstituted first aryl group having 6 to 13 carbon atoms; $Ar^2$ represents a substituted or unsubstituted second aryl group having 6 to 13 carbon atoms; each of $Q^1$ and $Q^2$ independently represents N or C—R; R represents any of hydrogen, an alkyl group having 1 to 6 carbon atoms, a haloalkyl group having 1 to 6 carbon atoms, and a substituted or unsubstituted third aryl group having 6 to 13 carbon atoms; at least one of $Q^1$ and $Q^2$ includes C—R; and at least one of the first aryl group to the third aryl group includes a cyano group.

Another embodiment of the present invention is an iridium complex represented by General Formula (G2).

(G2)

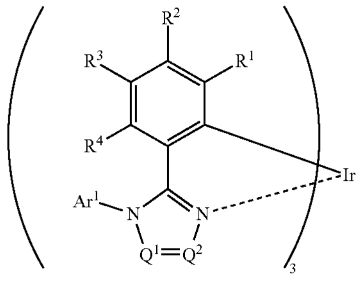

In General Formula (G2), $Ar^1$ represents a substituted or unsubstituted first aryl group having 6 to 13 carbon atoms; each of R to $R^4$ independently represents any of hydrogen, an alkyl group having 1 to 6 carbon atoms, a cycloalkyl group having 3 to 6 carbon atoms, a substituted or unsubstituted fourth aryl group having 6 to 13 carbon atoms, and a cyano group; each of $Q^1$ and $Q^2$ independently represents N or C—R; R represents any of hydrogen, an alkyl group having 1 to 6 carbon atoms, a haloalkyl group having 1 to 6 carbon atoms, and a substituted or unsubstituted third aryl group having 6 to 13 carbon atoms; at least one of $Q^1$ and $Q^2$ includes C—R; and at least one of the first aryl group, the third aryl group, the fourth aryl group, and $R^1$ to $R^4$ includes a cyano group.

Another embodiment of the present invention is an iridium complex represented by General Formula (G3).

(G3)

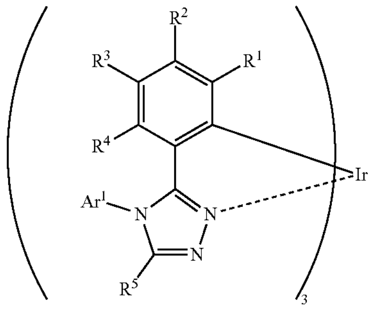

In General Formula (G3), $Ar^1$ represents a substituted or unsubstituted first aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, a substituted or unsubstituted fourth aryl group having 6 to 13 carbon atoms, and a cyano group; $R^5$ represents any of hydrogen, an alkyl group having 1 to 6 carbon atoms, a haloalkyl group having 1 to 6 carbon atoms, and a substituted or unsubstituted third aryl group having 6 to 13 carbon atoms; and at least one of the first aryl group, the third aryl group, the fourth aryl group, and $R^1$ to $R^4$ includes a cyano group.

Another embodiment of the present invention is an iridium complex represented by General Formula (G4).

(G4)

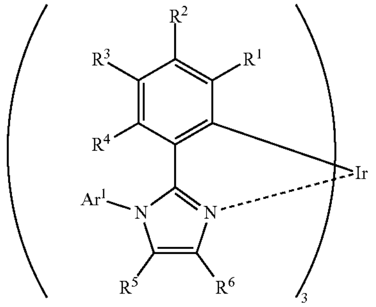

In General Formula (G4), $Ar^1$ represents a substituted or unsubstituted first aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, and a substituted or unsubstituted fourth aryl group having 6 to 13 carbon atoms; each of $R^5$ and $R^6$ independently represents any of hydrogen, an alkyl group having 1 to 6 carbon atoms, a haloalkyl group having 1 to 6 carbon atoms, and a substituted or unsubstituted third aryl group having 6 to 13 carbon atoms; and at least one of the first aryl group, the third aryl group, the fourth aryl group, and $R^1$ to $R^4$ includes a cyano group.

In each of the above structures, $Ar^1$ preferably represents a substituted or unsubstituted phenyl group, and the phenyl group preferably includes a cyano group as a substituent.

Another embodiment of the present invention is an iridium complex represented by General Formula (G5).

(G5)

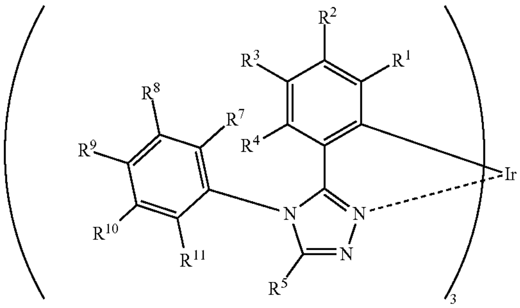

In General Formula (G5), each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; $R^5$ represents any of hydrogen, an alkyl group having 1 to 6 carbon atoms, a haloalkyl group having 1 to 6 carbon atoms, and a substituted or unsubstituted aryl group having 6 to 13 carbon atoms; each of $R^7$ and $R^{11}$ represents an alkyl group having 1 to 6 carbon atoms, and $R^7$ and $R^{11}$ have the same structure; each of $R^8$ to $R^{10}$ independently represents any of hydrogen, an alkyl group having 1 to 6 carbon atoms, a cycloalkyl group having 3 to 6 carbon atoms, a substituted or unsubstituted phenyl group, and a cyano group; and at least one of $R^8$ to $R^{10}$ includes a cyano group.

Another embodiment of the present invention is an iridium complex represented by General Formula (G6).

(G6)

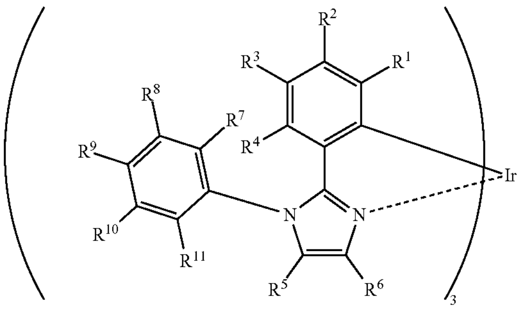

In General Formula (G6), each of R to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms; each of $R^7$ and $R^{11}$ represents an alkyl group having 1 to 6 carbon atoms, and $R^7$ and $R^{11}$ have the same structure; each of $R^8$ to $R^{10}$ independently represents any of hydrogen, an alkyl group having 1 to 6 carbon atoms, a cycloalkyl group having 3 to 6 carbon atoms, a substituted or unsubstituted phenyl group, and a cyano group; and at least one of $R^8$ to $R^{10}$ includes a cyano group.

Another embodiment of the present invention is an iridium complex represented by General Formula (G7).

(G7)

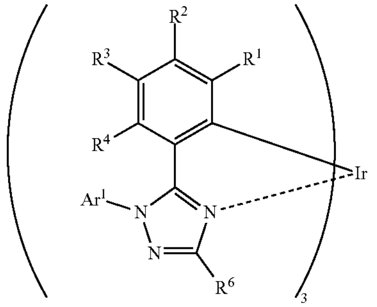

In General Formula (G7), $Ar^1$ represents a substituted or unsubstituted first aryl group having 6 to 13 carbon atoms; each of R to $R^4$ independently represents any of hydrogen, an alkyl group having 1 to 6 carbon atoms, a cycloalkyl group having 3 to 6 carbon atoms, and a substituted or unsubstituted fourth aryl group having 6 to 13 carbon atoms; $R^6$ represents any of hydrogen, an alkyl group having 1 to 6 carbon atoms, a haloalkyl group having 1 to 6 carbon atoms, and a substituted or unsubstituted third aryl group having 6 to 13 carbon atoms; and at least one of the first aryl group, the third aryl group, the fourth aryl group, and $R^1$ to $R^4$ includes a cyano group.

In the above structure, $Ar^1$ preferably represents a substituted or unsubstituted phenyl group, and the phenyl group preferably includes a cyano group.

Another embodiment of the present invention is an iridium complex represented by General Formula (G8).

(G8)

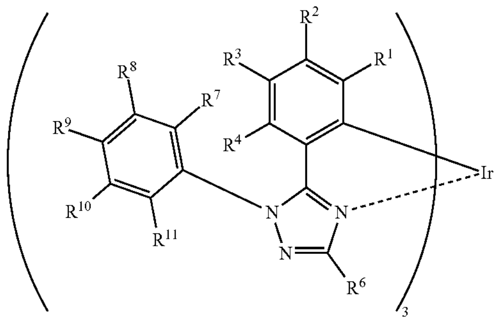

In General Formula (G8), each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; $R^6$ represents any of hydrogen, an alkyl group having 1 to 6 carbon atoms, a haloalkyl group having 1 to 6 carbon atoms, and a substituted or unsubstituted aryl group having 6 to 13 carbon atoms; each of $R^7$ and $R^{11}$ represents an alkyl group having 1 to 6 carbon atoms, and $R^7$ and $R^{11}$ have the same structure; each of $R^8$ to $R^{10}$ independently represents any of hydrogen, an alkyl group having 1 to 6 carbon atoms, a cycloalkyl group having 3 to 6 carbon atoms, a substituted or unsubstituted phenyl group, and a cyano group; and at least one of $R^8$ to $R^{10}$ includes a cyano group.

Another embodiment of the present invention is a light-emitting element including any of the iridium complexes described above.

Another embodiment of the present invention is a light-emitting element including any of the above-described iridium complexes, a first organic compound, and a second organic compound. The LUMO level of the first organic compound is lower than that of the second organic compound. The HOMO level of the first organic compound is lower than that of the second organic compound. An energy difference between the LUMO level and the HOMO level of the iridium complex is larger than an energy difference between the LUMO level of the first organic compound and the HOMO level of the second organic compound. A combination of the first organic compound and the second organic compound forms an exciplex.

Another embodiment of the present invention is a light-emitting element including any of the above-described iridium complexes, a first organic compound, and a second organic compound. The LUMO level of the first organic compound is lower than the LUMO level of the second organic compound. The HOMO level of the first organic compound is lower than the HOMO level of the second organic compound. The LUMO level of the iridium complex is higher than the LUMO level of the first organic compound. The HOMO level of the iridium complex is lower than the HOMO level of the second organic compound. A combination of the first organic compound and the second organic compound forms an exciplex.

Another embodiment of the present invention is a light-emitting element including any of the above-described iridium complexes, a first organic compound, and a second organic compound. The LUMO level of the first organic compound is lower than the LUMO level of the second organic compound. The HOMO level of the first organic compound is lower than the HOMO level of the second organic compound. The LUMO level of the iridium complex is the same as the LUMO level of the first organic compound. The HOMO level of the iridium complex is lower than the HOMO level of the second organic compound. A combination of the first organic compound and the second organic compound forms an exciplex.

Another embodiment of the present invention is a light-emitting element including any of the above-described iridium complexes, a first organic compound, and a second organic compound. The LUMO level of the first organic compound is lower than the LUMO level of the second organic compound. The HOMO level of the first organic compound is lower than the HOMO level of the second organic compound. The LUMO level of the iridium complex is higher than the LUMO level of the first organic compound. The HOMO level of the iridium complex is the same as the HOMO level of the second organic compound. A combination of the first organic compound and the second organic compound forms an exciplex.

Another embodiment of the present invention is a light-emitting element including any of the above-described iridium complexes, a first organic compound, and a second organic compound. A reduction potential of the first organic compound is higher than a reduction potential of the second organic compound. An oxidation potential of the first organic compound is higher than an oxidation potential of the second organic compound. A reduction potential of the iridium complex is lower than the reduction potential of the first organic compound. An oxidation potential of the iridium complex is higher than the oxidation potential of the second organic compound. A combination of the first organic compound and the second organic compound forms an exciplex.

Another embodiment of the present invention is a light-emitting element including any of the above-described iridium complexes, a first organic compound, and a second organic compound. The reduction potential of the first organic compound is higher than that of the second organic compound. The oxidation potential of the first organic compound is higher than that of the second organic compound. The reduction potential of the iridium complex is the same as that of the first organic compound. The oxidation potential of the iridium complex is higher than that of the second organic compound. A combination of the first organic compound and the second organic compound forms an exciplex.

Another embodiment of the present invention is a light-emitting element including any of the above-described iridium complexes, a first organic compound, and a second organic compound. The reduction potential of the first organic compound is higher than that of the second organic compound. The oxidation potential of the first organic compound is higher than that of the second organic compound. The reduction potential of the iridium complex is lower than that of the first organic compound. The oxidation potential of the iridium complex is the same as that of the second organic compound. A combination of the first organic compound and the second organic compound forms an exciplex.

In each of the above-described structures, the exciplex preferably has a function of transferring excitation energy to the iridium complex. In addition, light emitted from the exciplex preferably has a region overlapping an absorption band on the lowest energy side of the iridium complex.

In the above structure, it is preferable that an energy difference between the LUMO level of the first organic compound and the HOMO level of the second organic compound be larger than or equal to transition energy obtained from an absorption edge of the iridium complex.

In the above structure, it is preferable that an energy difference between the LUMO level of the first organic compound and the HOMO level of the second organic compound be larger than or equal to light emission energy of the iridium complex.

In each of the above structures, the first organic compound preferably has a function of transporting an electron, and the second organic compound preferably has a function of transporting a hole. The first organic compound preferably includes a π-electron deficient heteroaromatic ring skeleton, and the second organic compound preferably includes at least one of a π-electron rich heteroaromatic ring skeleton and an aromatic amine skeleton.

Another embodiment of the present invention is a display device including the light-emitting element having any of the above-described structures, and at least one of a color filter and a transistor. Another embodiment of the present invention is an electronic device including the above-described display device and at least one of a housing and a touch sensor. Another embodiment of the present invention is a lighting device including the light-emitting element having any of the above-described structures, and at least one of a housing and a touch sensor. The category of one embodiment of the present invention includes not only a light-emitting device including a light-emitting element but also an electronic device including a light-emitting device. The light-emitting device in this specification refers to an image display device and a light source (e.g., a lighting device). The light-emitting device may be included in a display module in which a connector such as a flexible printed circuit (FPC) or a tape carrier package (TCP) is connected to a light-emitting device, a display module in which a printed wiring board is provided on the tip of a TCP, or a display module in which an integrated circuit (IC) is directly mounted on a light-emitting element by a chip on glass (COG) method.

With one embodiment of the present invention, a light-emitting element that contains a phosphorescent compound and has high emission efficiency can be provided. With one embodiment of the present invention, a light-emitting element with low power consumption can be provided. With one embodiment of the present invention, a light-emitting element with high reliability can be provided. With one embodiment of the present invention, a novel compound can be provided. With one embodiment of the present invention, a novel a novel light-emitting element including the novel compound can be provided. With one embodiment of the present invention, a novel light-emitting element can be provided. With one embodiment of the present invention, a novel light-emitting device can be provided. With one embodiment of the present invention, a novel display device can be provided.

Note that the description of these effects does not disturb the existence of other effects. One embodiment of the present invention does not necessarily have all the effects described above. Other effects will be apparent from and can be derived from the description of the specification, the drawings, the claims, and the like.

BEST MODE FOR CARRYING OUT THE INVENTION

Figure 1A:
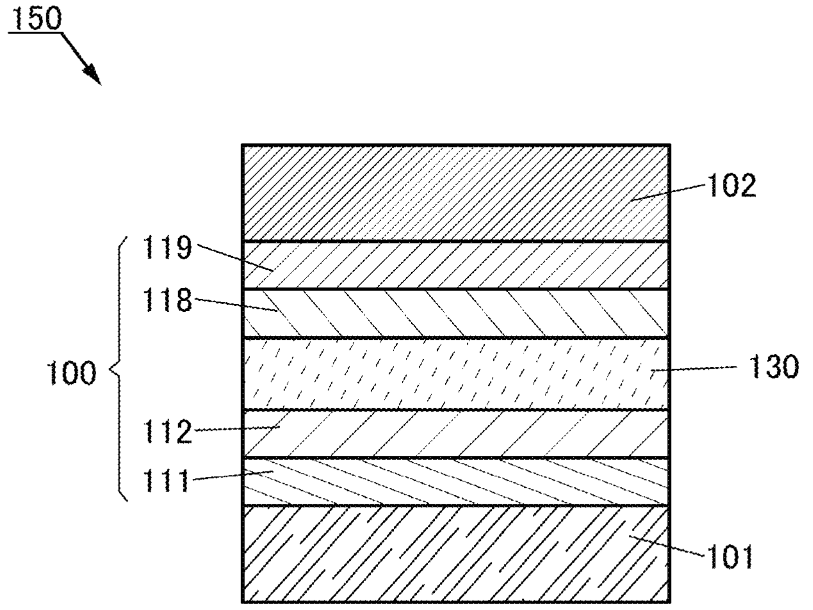
FIGS. 1A and 1B are schematic cross-sectional views of a light-emitting element of one embodiment of the present invention.

Embodiments of the present invention will be described below with reference to the drawings. However, the present invention is not limited to description to be given below, and it is to be easily understood that modes and details thereof can be variously modified without departing from the purpose and the scope of the present invention. Accordingly, the present invention should not be interpreted as being limited to the content of the embodiments below.

Note that the position, the size, the range, or the like of each structure illustrated in drawings and the like is not accurately represented in some cases for simplification. Therefore, the disclosed invention is not necessarily limited to the position, the size, the range, or the like disclosed in the drawings and the like.

Note that the ordinal numbers such as “first”, “second”, and the like in this specification and the like are used for convenience and do not denote the order of steps or the stacking order of layers. Therefore, for example, description can be made even when “first” is replaced with “second” or “third”, as appropriate. In addition, the ordinal numbers in this specification and the like are not necessarily the same as those which specify one embodiment of the present invention.

In the description of modes of the present invention in this specification and the like with reference to the drawings, the same components in different diagrams are commonly denoted by the same reference numeral in some cases.

In this specification and the like, the terms “film” and “layer” can be interchanged with each other depending on the case or circumstances. For example, the term “conductive layer” can be changed into the term “conductive film” in some cases. Also, the term “insulating film” can be changed into the term “insulating layer” in some cases.

In this specification and the like, a singlet excited state (S*) refers to a singlet state having excitation energy. The lowest level of the singlet excitation energy level (S1 level) refers to the excitation energy level of the lowest singlet excited state. A triplet excited state (T*) refers to a triplet state having excitation energy. The lowest level of the triplet excitation energy level (T1 level) refers to the excitation energy level of the lowest triplet excited state. Note that in this specification and the like, a singlet excited state and a singlet excitation energy level mean the lowest singlet excited state and the S1 level, respectively, in some cases. A triplet excited state and a triplet excitation energy level mean the lowest triplet excited state and the T1 level, respectively, in some cases.

In this specification and the like, a fluorescent compound refers to a compound that emits light in the visible light region when the relaxation from the singlet excited state to the ground state occurs. A phosphorescent compound refers to a compound that emits light in the visible light region at room temperature when the relaxation from the triplet excited state to the ground state occurs. That is, a phosphorescent compound refers to a compound that can convert triplet excitation energy into visible light.

Phosphorescence emission energy or a triplet excitation energy can be obtained from a wavelength of a phosphorescence emission peak (including a shoulder) on the shortest wavelength side of phosphorescence emission. Note that the phosphorescence emission can be observed by time-resolved photoluminescence in a low-temperature (e.g., 10 K) environment. A thermally activated delayed fluorescence emission energy can be obtained from a wavelength of an emission peak (including a shoulder) on the shortest wavelength side of thermally activated delayed fluorescence.

Note that in this specification and the like, "room temperature" refers to a temperature higher than or equal to 0° C. and lower than or equal to 40° C.

In this specification and the like, a wavelength range of blue refers to a wavelength range of greater than or equal to 400 nm and less than 505 nm, and blue light has at least one peak in that range in an emission spectrum. A wavelength range of green refers to a wavelength range of greater than or equal to 505 nm and less than 580 nm, and green light has at least one peak in that range in an emission spectrum. A wavelength range of red refers to a wavelength range of greater than or equal to 580 nm and less than or equal to 680 nm, and red light has at least one peak in that range in an emission spectrum.

Embodiment 1

In this embodiment, a light-emitting element of one embodiment of the present invention will be described below with reference to FIGS. 1A and 1B and FIGS. 2A and 2B.

<Structure Example of Light-Emitting Element>

First, a structure of the light-emitting element of one embodiment of the present invention will be described with reference to FIGS. 1A and 1B.

FIG. 1A is a schematic cross-sectional view of a light-emitting element 150 of one embodiment of the present invention.

The light-emitting element 150 includes a pair of electrodes (an electrode 101 and an electrode 102) and an EL layer 100 between the pair of electrodes. The EL layer 100 includes at least a light-emitting layer 130.

The EL layer 100 illustrated in FIG. 1A includes functional layers such as a hole-injection layer 111, a hole-transport layer 112, an electron-transport layer 118, and an electron-injection layer 119, in addition to the light-emitting layer 130.

In this embodiment, although description is given assuming that the electrode 101 and the electrode 102 of the pair of electrodes serve as an anode and a cathode, respectively, they are not limited thereto for the structure of the light-emitting element 150. That is, the electrode 101 may be a cathode, the electrode 102 may be an anode, and the stacking order of the layers between the electrodes may be reversed. In other words, the hole-injection layer 111, the hole-transport layer 112, the light-emitting layer 130, the electron-transport layer 118, and the electron-injection layer 119 may be stacked in this order from the anode side.

The structure of the EL layer 100 is not limited to the structure illustrated in FIG. 1A, and a structure including at least one layer selected from the hole-injection layer 111, the hole-transport layer 112, the electron-transport layer 118, and the electron-injection layer 119 may be employed. Alternatively, the EL layer 100 may include a functional layer which is capable of lowering a hole- or electron-injection barrier, improving a hole- or electron-transport property, inhibiting a hole- or electron-transport property, or suppressing a quenching phenomenon by an electrode, for example. Note that the functional layers may each be a single layer or stacked layers.

Figure 1B:
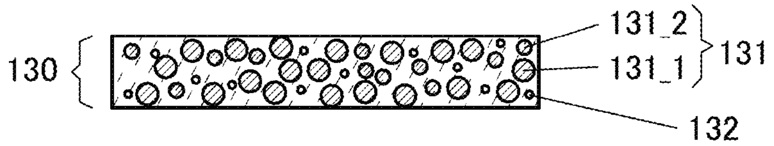

FIG. 1B is a schematic cross-sectional view illustrating an example of the light-emitting layer 130 in FIG. 1A. The light-emitting layer 130 in FIG. 1B includes a host material 131 and a guest material 132. The host material 131 includes an organic compound 131_1 and an organic compound 131_2.

The guest material 132 may be a light-emitting organic compound, and the light-emitting organic compound is preferably a substance capable of emitting phosphorescence (hereinafter also referred to as a phosphorescent compound). A structure in which a phosphorescent compound is used as the guest material 132 will be described below. The guest material 132 may be rephrased as the phosphorescent compound.

<Light Emission Mechanism of Light-Emitting Element>

Next, the light emission mechanism of the light-emitting layer 130 is described below.

The organic compound 131_1 and the organic compound 1312 included in the host material 131 in the light-emitting layer 130 form an exciplex.

Although it is acceptable as long as a combination of the organic compound 131_1 and the organic compound 131_2 can form an exciplex, it is preferable that one of them be a compound having a function of transporting holes (a hole-transport property) and the other be a compound having a function of transporting electrons (an electron-transport property). In that case, a donor-acceptor exciplex is formed easily; thus, efficient formation of an exciplex is possible.

The combination of the organic compound 131_1 and the organic compound 1312 is preferably as follows: one has a lower HOMO (highest occupied molecular orbital) level and a lower LUMO (lowest unoccupied molecular orbital) level than the other.

Figure 2A:
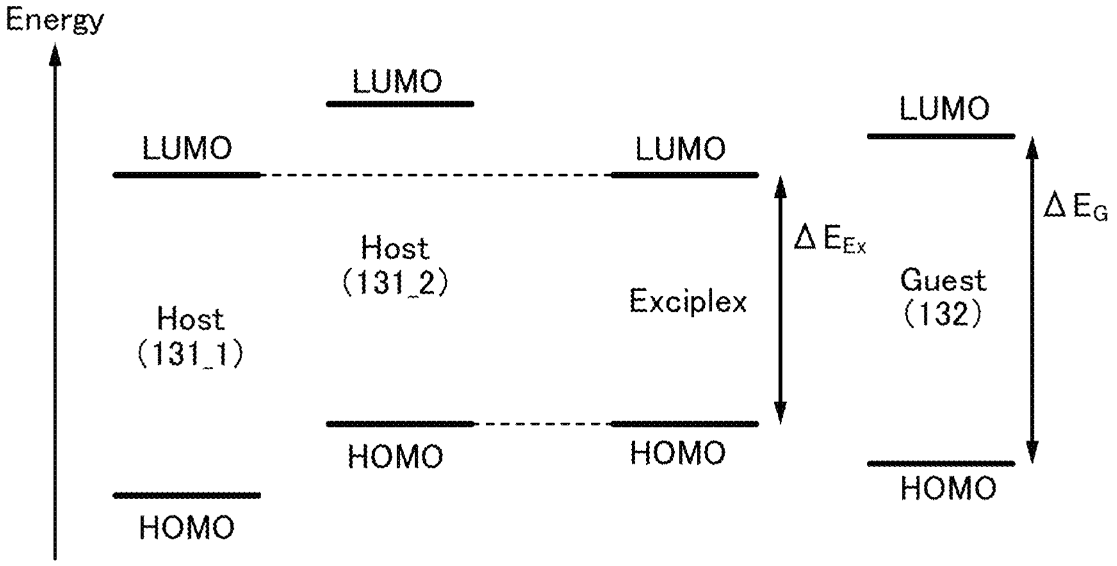
FIGS. 2A and 2B show a correlation of energy bands and a correlation of energy levels in a light-emitting layer of a light-emitting element of one embodiment of the present invention.

For example, in the case where the organic compound 131_1 has an electron-transport 35 property and the organic compound 131_2 has a hole-transport property, it is preferable that the HOMO level of the organic compound 131_1 be lower than that of the organic compound 131_2 and the LUMO level of the organic compound 131_1 be lower than that of the organic compound 131_2 as shown in the energy band diagram of FIG. 2A.

At this time, an exciplex formed by the organic compound 131_1 and the organic compound 131_2 has excitation energy that approximately corresponds to an energy difference between the LUMO level of the organic compound 131_1 and the HOMO level of the organic compound 131_2. A difference between the HOMO level of the organic compound 131_1 and that of the organic compound 1312 is preferably greater than or equal to 0.1 eV, and more preferably greater than or equal to 0.2 eV. Similarly, a difference between the LUMO level of the organic compound 131_1 and that of the organic compound 131_2 is preferably greater than or equal to 0.1 eV, and more preferably greater than or equal to 0.2 eV. The energy difference is preferable because it facilitates injection of electron carriers and hole carriers from the pair of electrodes (the electrode 101 and the electrode 102) to the organic compound 131_1 and the organic compound 1312. Note that in FIG. 2A, Host (1311) represents the organic compound 131_1, Host (1312) represents the organic compound 131_2, Guest (132) represents the guest material 132, $\Delta E_{Ex}$ represents an energy difference between the LUMO level of the organic compound 131_1 and the HOMO level of the organic compound 131_2, and $\Delta E_G$ represents an energy difference between the LUMO level and the HOMO level of the guest material 132.

It is preferable that the HOMO level of the guest material 132 be lower than the HOMO level of the organic compound 131_2 and that the LUMO level of the guest material 132 be higher than the LUMO level of the organic compound 131_1. That is, the energy difference ($\Delta E_G$) between the LUMO level and the HOMO level of the guest material 132 is larger than the energy difference ($\Delta E_{Ex}$) between the LUMO level of the organic compound 131_1 and the HOMO level of the organic compound 131_2. Thus, formation of an exciplex by the guest material 132 and the organic compound 131_1 or the organic compound 131_2 can be inhibited.

For example, there is a possibility that the guest material 132 and the organic compound 131_1 form an exciplex when the HOMO level of the guest material 132 is higher than or equal to the HOMO level of the organic compound 131_2 and the guest material 132 has the highest HOMO level and the organic compound 131_1 has the lowest LUMO level among materials included in the light-emitting layer 130. In particular, as an energy difference between the HOMO level of the guest material 132 and the LUMO level of the organic compound 131_1 becomes smaller than light emission energy of the guest material, an exciplex is more likely to be formed by the guest material 132 and the organic compound 131_1. In such a case, the guest material 132 itself is less likely to form an excited state, which decreases emission efficiency of the light-emitting element.

For example, there is a possibility that the guest material 132 and the organic compound 131_2 form an exciplex when the LUMO level of the guest material 132 is lower than or equal to the LUMO level of the organic compound 131_1 and the guest material 132 has the lowest LUMO level and the organic compound 131_2 has the highest HOMO level among materials included in the light-emitting layer 130. In particular, as an energy difference between the LUMO level of the guest material 132 and the HOMO level of the organic compound 131_2 becomes smaller than light emission energy of the guest material, an exciplex is more likely to be formed by the guest material 132 and the organic compound 1312. In such a case, the guest material 132 itself is less likely to form an excited state, which decreases emission efficiency of the light-emitting element.

However, in the light-emitting element of one embodiment of the present invention, formation of an exciplex by the guest material 132 and the organic compound 131_1 or the organic compound 131_2 can be inhibited, whereby a light-emitting element with high emission efficiency can be fabricated.

The HOMO level of the guest material 132 is lower than that of the organic compound 1312, and the LUMO level of the guest material 132 is higher than that of the organic compound 131_1. Among carriers (holes and electrons) injected from the pair of electrodes (the electrode 101 and the electrode 102), holes injected from the anode are easily injected to the organic compound 131_2 and electrons injected from the cathode are easily injected to the organic compound 131_1 in the light-emitting layer 130.

In the above view, in one embodiment of the present invention, the HOMO level of the guest material 132 may be equal to that of the organic compound 131_2 or the LUMO level of the guest material 132 may be equal to that of the organic compound 131_1. However, it is preferable that the energy difference ($\Delta E_G$) between the LUMO level and the HOMO level of the guest material 132 be larger than the energy difference ($\Delta E_{Ex}$) between the LUMO level of the organic compound 131_1 and the HOMO level of the organic compound 131_2. The reason is described below.

Since the energy difference ($\Delta E_{Ex}$) between the LUMO level of the organic compound 131_1 and the HOMO level of the organic compound 131_2 is smaller than the energy difference between the LUMO level and the HOMO level of the organic compound 131_1 and smaller than the energy difference between the LUMO level and the HOMO level of the organic compound 1312, formation of an exciplex by the organic compound 131_1 and the organic compound 131_2 is more energetically stable than formation of an excited state only by either the organic compound 131_1 or the organic compound 131_2. Furthermore, since the energy difference ($\Delta E_G$) between the LUMO level and the HOMO level of the guest material 132 is larger than the energy difference ($\Delta E_{Ex}$) between the LUMO level of the organic compound 131_1 and the HOMO level of the organic compound 131_2, formation of an exciplex by the organic compound 131_1 and the organic compound 131_2 is more energetically stable as an excited state formed by recombination of carriers (holes and electrons) injected to the light-emitting layer 130. Therefore, most of excited states generated in the light-emitting layer 130 exist as exciplexes formed by the organic compound 131_1 and the organic compound 131_2.

The guest material 132 is a phosphorescent light-emitting material and thus has a function of converting triplet excitation energy into light emission. In addition, energy is more stable in a triplet excited state than in a singlet excited state. Thus, the guest material 132 can emit light with energy smaller than the energy difference ($\Delta E_G$) between the LUMO level and the HOMO level of the guest material 132. The present inventors have found out that even in the case where the energy difference ($\Delta E_G$) between the LUMO level and the HOMO level of the guest material 132 is larger than the energy difference ($\Delta E_{Ex}$) between the LUMO level of the organic compound 131_1 and the HOMO level of the organic compound 131_2, excitation energy transfer from an exciplex formed by the organic compound 131_1 and the organic compound 131_2 to the guest material 132 is possible and light emission can be obtained from the guest material 132 as long as light emission energy of the guest material 132 or transition energy obtained from an absorption spectrum is smaller than or equal to $\Delta E_{Ex}$. When $\Delta E_G$ of the guest material 132 is larger than the light emission energy of the guest material 132 or the transition energy obtained from the absorption spectrum, high electrical energy that corresponds to $\Delta E_G$ is necessary to directly cause electrical excitation of the guest material 132 and thus the driving voltage is increased. However, in one embodiment of the present invention, an exciplex is electrically excited with electrical energy that corresponds to $\Delta E_{Ex}$ (that is smaller than $\Delta E_G$), and light emission from the guest material 132 can be obtained by energy transfer therefrom, so that light emission of the guest material with high efficiency can be obtained with low voltage. That is, one embodiment of the present invention is useful in the case where $\Delta E_G$ is significantly larger than the light emission energy of the guest material 132 or the transition energy obtained from the absorption spectrum (for example, in the case where the guest material is a blue light-emitting material).

Note that in the case where the guest material 132 includes a heavy metal, intersystem crossing between a singlet state and a triplet state is promoted by spin-orbit interaction (interaction between spin angular momentum and orbital angular momentum of an electron), and transition between a singlet ground state and a triplet excited state of the guest material 132 is not forbidden in some cases. Therefore, the emission efficiency and the absorption probability which relate to the transition between the singlet ground state and the triplet excited state of the guest material

132 can be increased. Accordingly, the guest material 132 preferably includes a metal element with large spin-orbit interaction, specifically a platinum group element (ruthenium (Ru), rhodium (Rh), palladium (Pd), osmium (Os), iridium (Ir), or platinum (Pt)). In particular, iridium is preferred because the absorption probability that relates to direct transition between a singlet ground state and a triplet excited state can be increased.

As described above, even when the energy difference ($\Delta E_G$) between the LUMO level and the HOMO level of the guest material 132 is larger than the energy difference ($\Delta E_{Ex}$) between the LUMO level of the organic compound 131_1 and the HOMO level of the organic compound 131_2, excitation energy transfers efficiently from an exciplex formed by the organic compound 131_1 and the organic compound 131_2 to the guest material 132 as long as transition energy (abbreviation: $\Delta E_{G\_abs}$) obtained from an absorption edge of the guest material 132 is smaller than or equal to $\Delta E_{Ex}$. As a result, a light-emitting element with high emission efficiency and low driving voltage can be obtained, which is a feature of one embodiment of the present invention. At this time, the formula $\Delta E_{G\_abs}$; $\Delta E_{Ex}<\Delta E_G$ ($\Delta E_{G\_abs}$ is smaller than or equal to $\Delta E_{Ex}$ and $\Delta E_{Ex}$ is smaller than $\Delta E_G$) is satisfied. Therefore, the mechanism of one embodiment of the present invention is suitable in the case where the transition energy ($\Delta E_{G\_abs}$) obtained from the absorption edge of the guest material 132 is smaller than the energy difference ($\Delta E_G$) between the LUMO level and the HOMO level of the guest material 132. In other words, the mechanism of one embodiment of the present invention is suitable in the case where the energy difference ($\Delta E_G$) between the LUMO level and the HOMO level of the guest material 132 is larger than the transition energy ($\Delta E_{G\_abs}$) obtained from the absorption edge of the guest material 132. Specifically, the energy difference ($\Delta E_G$) between the LUMO level and the HOMO level of the guest material 132 is preferably larger than the transition energy ($\Delta E_{G\_abs}$) obtained from the absorption edge of the guest material 132 by 0.4 eV or more. Since the light emission energy of the guest material 132 is smaller than or equal to $\Delta E_{G\_abs}$, the energy difference ($\Delta E_G$) between the LUMO level and the HOMO level of the guest material 132 is preferably larger than the light emission energy of the guest material 132 by 0.4 eV or more. Note that the light emission energy can be derived from a peak wavelength (the maximum value, or including a shoulder peak) on the shortest wavelength side of the emission spectrum.

The shorter the emission wavelength of the guest material 132 is (the higher light emission energy is), the larger the energy difference ($\Delta E_G$) between the LUMO level and the HOMO level of the guest material 132 is, and accordingly, larger energy is needed for electrically exciting the guest material. However, when the transition energy ($\Delta E_{G\_abs}$) obtained from the absorption edge of the guest material 132 is smaller than or equal to $\Delta E_{Ex}$ according to the invention, the guest material 132 can be excited with energy as small as $\Delta E_{Ex}$, which is greatly smaller than $\Delta E_G$, whereby the power consumption of the light-emitting element can be reduced. Therefore, the effect of the mechanism of one embodiment of the present invention is brought to the fore in the case where an energy difference between the transition energy ($\Delta E_{G\_abs}$) obtained from the absorption edge of the guest material 132 and the energy difference ($\Delta E_G$) between the LUMO level and the HOMO level of the guest material 132 is large (i.e., particularly in the case where the guest material is a blue light-emitting material).

As the transition energy ($\Delta E_{G\_abs}$) obtained from the absorption edge of the guest material 132 decreases, the light emission energy of the guest material 132 also decreases. In that case, light emission that needs high energy, such as blue light emission, is difficult to obtain. That is, when a difference between $\Delta E_{G\_abs}$ and $\Delta E_G$ is too large, high-energy light emission such as blue light emission is obtained with difficulty.

For these reasons, the energy difference ($\Delta E_G$) between the LUMO level and the HOMO level of the guest material 132 is preferably larger than the transition energy ($\Delta E_{G\_abs}$) obtained from the absorption edge of the guest material 132 by 0.4 eV to 0.8 eV, more preferably by 0.5 eV to 0.8 eV. Since the light emission energy of the guest material 132 is smaller than or equal to $\Delta E_{G\_abs}$, the energy difference ($\Delta E_G$) between the LUMO level and the HOMO level of the guest material 132 is preferably larger than the light emission energy of the guest material 132 by 0.4 eV to 0.8 eV, more preferably by 0.5 eV to 0.8 eV.

A difference in LUMO level between the guest material 132 and the organic compound 131_1 is preferably greater than or equal to 0.05 eV, more preferably greater than or equal to 0.1 eV, and still more preferably greater than or equal to 0.2 eV. A difference in HOMO level between the guest material 132 and the organic compound 131_2 is preferably greater than or equal to 0.05 eV, more preferably greater than or equal to 0.1 eV, and still more preferably greater than or equal to 0.2 eV. Setting the differences within the above ranges is preferable because injection of electron carriers and hole carriers to the organic compound 131_1 and the organic compound 131_2 is facilitated.

Note that the HOMO level of the guest material 132 may be higher than or lower than the HOMO level of the organic compound 131_1. Similarly, the LUMO level of the guest material 132 may be higher than or lower than the LUMO level of the organic compound 131_2.

According to the above-described relation between the LUMO level and the HOMO level, the combination of the organic compound 131_1 and the organic compound 131_2 is preferably as follows: one has a higher oxidation potential and a higher reduction potential than the other.

For example, in the case where the organic compound 131_1 has an electron-transport property and the organic compound 131_2 has a hole-transport property, it is preferable that the oxidation potential of the organic compound 131_1 be higher than that of the organic compound 131_2, and that the reduction potential of the organic compound 131_1 be higher than that of the organic compound 131_2. Note that the oxidation potential and the reduction potential can be measured by cyclic voltammetry (CV).

It is preferable that the oxidation potential of the guest material 132 be higher than that of the organic compound 131_2, and that the reduction potential of the guest material 132 be lower than that of the organic compound 131_1. Thus, as described above, formation of an exciplex by the guest material 132 and the organic compound 131_1 or the organic compound 131_2 can be inhibited.

In the case where the combination of the organic compounds 131_1 and 131_2 is a combination of a compound having a hole-transport property and a compound having an electron-transport property, the carrier balance can be easily controlled depending on the mixture ratio. Specifically, the weight ratio of the compound having a hole-transport property to the compound having an electron-transport property is preferably within a range of 1:9 to 9:1. Since the carrier balance can be easily controlled with the structure, a carrier recombination region can also be controlled easily.

The exciplex formed by the organic compound 131_1 and the organic compound 131_2 has HOMO in one of the organic compounds and LUMO in the other of the organic compounds; thus, the overlap between the HOMO and the LUMO is extremely small. That is, the exciplex has a small difference between the singlet excitation energy level and the triplet excitation energy level. Thus, the difference between the triplet excitation energy level and the singlet excitation energy level of the exciplex formed by the organic compound 131_1 and the organic compound 131_2 is preferably larger than 0 eV and smaller than or equal to 0.2 eV.

Figure 2B:
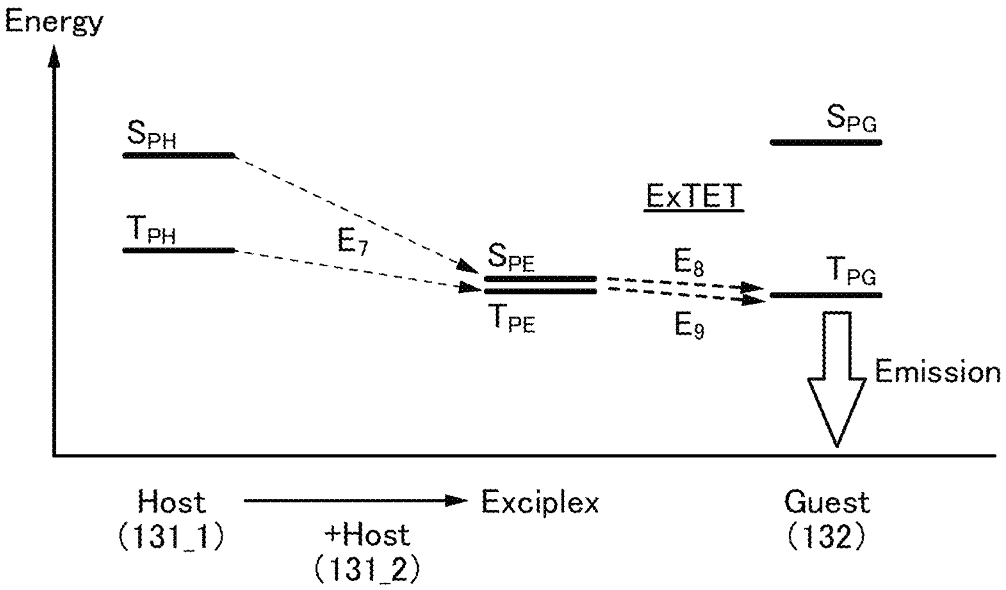

FIG. 2B shows a correlation of energy levels of the organic compound 131_1, the organic compound 1312, and the guest material 132 in the light-emitting layer 130. The following explains what terms and signs in FIG. 2B represent:

Host (131_1): a host material (the organic compound 131_1);

Host (131_2): a host material (the organic compound 131_2);

Guest (132): the guest material 132 (the phosphorescent compound);

$S_{PH}$: the S1 level of the host material (the organic compound 131_1);

$T_{PH}$: the T1 level of the host material (the organic compound 131_1);

$S_{PG}$: the S1 level of the phosphorescent compound (the guest material 132);

$T_{PG}$: the T1 level of the phosphorescent compound (the guest material 132);

$S_{PE}$: the S1 level of the exciplex; and $T_{PE}$: the T1 level of the exciplex.

In the light-emitting element of one embodiment of the present invention, the organic compounds 131_1 and 131_2 included in the light-emitting layer 130 form an exciplex. The lowest singlet excitation energy level of the exciplex ($S_{PE}$) and the lowest triplet excitation energy level of the exciplex ($T_{PE}$) are adjacent to each other (see Route $E_7$ in FIG. 2B).

An exciplex is an excited state formed from two kinds of substances. In photoexcitation, the exciplex is formed by interaction between one substance in an excited state and the other substance in a ground state. The two kinds of substances that have formed the exciplex return to a ground state by emitting light and serve as the original two kinds of substances. In electrical excitation, when one substance is brought into an excited state, the one immediately interacts with the other substance to form an exciplex. Alternatively, one substance receives a hole and the other substance receives an electron to readily form an exciplex. In this case, any of the substances can form an exciplex without forming an excited state by itself and accordingly, most of excited states generated in the light-emitting layer 130 can exist as exciplexes. Because the excitation energy levels of the exciplex ($S_E$ or $T_E$) are lower than the singlet excitation energy level of the host materials ($S_{PH}$) (the organic compound 131_1 and the organic compound 131_2) that form the exciplex, the excited state of the host material 131 can be formed with lower excitation energy. Accordingly, the driving voltage of the light-emitting element 150 can be reduced.

Both energies of $S_{PE}$ and $T_{PE}$ of exciplexes are then transferred to the level ($T_{PG}$) of the lowest triplet excited state of the guest material 132 (the phosphorescent compound); thus, light emission is obtained (see Routes $E_8$ and $E_9$ in FIG. 2B).

Furthermore, the triplet excitation energy level ($T_{PE}$) of the exciplex is preferably higher than the triplet excitation energy level ($T_{PG}$) of the guest material 132. In this way, the singlet excitation energy and the triplet excitation energy of the formed exciplex can be transferred from the singlet excitation energy level ($S_{PE}$) and the triplet excitation energy level ($T_{PE}$) of the exciplex to the triplet excitation energy level ($T_{PG}$) of the guest material 132.

When the light-emitting layer 130 has the above-described structure, light emission from the guest material 132 (the phosphorescent compound) of the light-emitting layer 130 can be obtained efficiently.

The above-described processes through Routes $E_7$, $E_8$, and $E_9$ may be referred to as exciplex-triplet energy transfer (ExTET) in this specification and the like. In other words, in the light-emitting layer 130, excitation energy is given from the exciplex to the guest material 132. In that case, the reverse intersystem crossing efficiency from $T_{PE}$ to $S_{PE}$ is not necessarily high and the emission quantum yield from $S_{PE}$ is also not necessarily high, whereby materials can be selected from a wide range of options.

Note that the reactions described above can be expressed by General Formulae (G11) to (G13).

$$D^{+}+A^{-}\rightarrow(D-A)^{*} \quad \text{(G11)}$$

$$(D-A)^{*}+G\rightarrow D+A+G^{*} \quad \text{(G12)}$$

$$G^{*}\rightarrow G+h\nu \quad \text{(G13)}$$

In General Formula (G11), one of the organic compound 131_1 and the organic compound 131_2 accepts a hole ($D^+$) and the other accepts an electron ($A^-$), whereby the organic compound 131_1 and the organic compound 131_2 form an exciplex ((D−A)*). In General Formula (G12), energy transfers from the exciplex ((D−A)*) to the guest material 132 (G), whereby an excited state of the guest material 132 (G*) is generated. After that, as expressed by General Formula (G13), the guest material 132 in the excited state emits light (hv).

Note that in order to efficiently transfer excitation energy from the exciplex to the guest material 132, the triplet excitation energy level of the exciplex is preferably lower than the triplet excitation energy levels of the organic compounds (the organic compound 131_1 and the organic compound 131_2) in the host material which form the exciplex. Thus, quenching of the triplet excitation energy of the exciplex due to the organic compounds is less likely to occur, which causes efficient energy transfer to the guest material 132.

When the organic compound 131_2 includes a skeleton having a strong donor property, a hole that has been injected to the light-emitting layer 130 is easily injected in the organic compound 131_2 and easily transported. When the organic compound 131_1 includes a skeleton having a strong acceptor property, an electron that has been injected to the light-emitting layer 130 is easily injected in the organic compound 131_1 and easily transported. Thus, the organic compound 131_1 and the organic compound 131_2 easily form an exciplex.

When the light-emitting layer 130 has the above-described structure, light emission from the guest material 132 of the light-emitting layer 130 can be obtained efficiently.

<Energy Transfer Mechanism>

Next, factors controlling the processes of intermolecular energy transfer between the host material 131 and the guest material 132 will be described. As mechanisms of the intermolecular energy transfer, two mechanisms, i.e., Forster mechanism (dipole-dipole interaction) and Dexter mechanism (electron exchange interaction), have been proposed. Although the intermolecular energy transfer process between the host material 131 and the guest material 132 is described here, the same can apply to a case where the host material 131 is an exciplex.

<<Förster Mechanism>>

In Förster mechanism, energy transfer does not require direct contact between molecules and energy is transferred through a resonant phenomenon of dipolar oscillation between the host material 131 and the guest material 132. By the resonant phenomenon of dipolar oscillation, the host material 131 provides energy to the guest material 132, and thus, the host material 131 in an excited state is brought to a ground state and the guest material 132 in a ground state is brought to an excited state. Note that the rate constant $k_{h^*\rightarrow g}$ of Förster mechanism is expressed by Formula (1).

$$k_{h^*\rightarrow g} = \frac{9000c^4K^2\phi\ln10}{128\pi^5n^4N\tau R^6}\int\frac{f'_h(v)\varepsilon_g(v)}{v^4}dv \quad (1)$$

In Formula (1), ν denotes a frequency, $f'_h(\nu)$ denotes a normalized emission spectrum of the host material 131 (a fluorescent spectrum in energy transfer from a singlet excited state, and a phosphorescent spectrum in energy transfer from a triplet excited state), $\varepsilon_g(\nu)$ denotes a molar absorption coefficient of the guest material 132, N denotes Avogadro's number, n denotes a refractive index of a medium, R denotes an intermolecular distance between the host material 131 and the guest material 132, τ denotes a measured lifetime of an excited state (fluorescence lifetime or phosphorescence lifetime), c denotes the speed of light, φ denotes a luminescence quantum yield (a fluorescence quantum yield in energy transfer from a singlet excited state, and a phosphorescence quantum yield in energy transfer from a triplet excited state), and $K^2$ denotes a coefficient (0 to 4) of orientation of a transition dipole moment between the host material 131 and the guest material 132. Note that $K^2$ is ⅔ in random orientation.

<<Dexter Mechanism>>

In Dexter mechanism, the host material 131 and the guest material 132 are close to a contact effective range where their orbitals overlap, and the host material 131 in an excited state and the guest material 132 in a ground state exchange their electrons, which leads to energy transfer. Note that the rate constant $k_{h^*\rightarrow g}$ of Dexter mechanism is expressed by Formula (2).

$$k_{h^*\rightarrow g} = \left(\frac{2\pi}{h}\right)K^2\exp\left(-\frac{2R}{L}\right)\int f'_h(v)\varepsilon'_g(v)dv \quad (2)$$

In Formula (2), h denotes a Planck constant, K denotes a constant having an energy dimension, ν denotes a frequency, $f_h(\nu)$ denotes a normalized emission spectrum of the host material 131 (a fluorescent spectrum in energy transfer from a singlet excited state, and a phosphorescent spectrum in energy transfer from a triplet excited state), $\varepsilon'_g(\nu)$ denotes a normalized absorption spectrum of the guest material 132, L denotes an effective molecular radius, and R denotes an intermolecular distance between the host material 131 and the guest material 132.

Here, the efficiency of energy transfer from the host material 131 to the guest material 132 (energy transfer efficiency $\phi_{ET}$) is expressed by Formula (3). In the formula, $k_r$ denotes a rate constant of a light-emission process (fluorescence in energy transfer from a singlet excited state, and phosphorescence in energy transfer from a triplet excited state) of the host material 131, $k_n$ denotes a rate constant of a non-light-emission process (thermal deactivation or intersystem crossing) of the host material 131, and ti denotes a measured lifetime of an excited state of the host material 131.

$$\phi_{ET} = \frac{k_{h^*\rightarrow g}}{k_r + k_n + k_{h^*\rightarrow g}} = \frac{k_{h^*\rightarrow g}}{\left(\frac{1}{\tau}\right) + k_{h^*\rightarrow g}} \quad (3)$$

According to Formula (3), it is found that the energy transfer efficiency $\phi_{ET}$ can be increased by increasing the rate constant $k_{h^*\rightarrow g}$ of energy transfer so that another competing rate constant $k_r+k_n(=1/\tau)$ becomes relatively small.

<<Concept for Promoting Energy Transfer>>

In energy transfer by Forster mechanism, high energy transfer efficiency $\varphi_{ET}$ is obtained when quantum yield φ (a fluorescence quantum yield in the case where energy transfer from a singlet excited state is discussed, and a phosphorescence quantum yield in the case where energy transfer from a triplet excited state is discussed) is high. Furthermore, it is preferable that the emission spectrum (the fluorescence spectrum in the case where energy transfer from the singlet excited state is discussed) of the host material 131 largely overlap with the absorption spectrum (absorption corresponding to the transition from the singlet ground state to the triplet excited state) of the guest material 132. It is preferable that the molar absorption coefficient of the guest material 132 be also high. This means that the emission spectrum of the host material 131 overlaps with the absorption band of the guest material 132 which is on the longest wavelength side.

In energy transfer by Dexter mechanism, in order to make the rate constant $k_{h^*\rightarrow g}$ large, it is preferable that the emission spectrum (a fluorescence spectrum in the case where energy transfer from a singlet excited state is discussed, and a phosphorescence spectrum in the case where energy transfer from a triplet excited state is discussed) of the host material 131 largely overlap with the absorption spectrum (absorption corresponding to transition from a singlet ground state to a triplet excited state) of the guest material 132. Therefore, the energy transfer efficiency can be optimized by making the emission spectrum of the host material 131 overlap with the absorption band of the guest material 132 which is on the longest wavelength side.

In a manner similar to that of the energy transfer from the host material 131 to the guest material 132, the energy transfer by both Fömechanism and Dexter mechanism also occurs in the energy transfer process from the exciplex to the guest material 132.

Accordingly, one embodiment of the present invention provides a light-emitting element including, as the host material 131, the organic compound 131_1 and the organic compound 131_2 which are a combination for forming an exciplex that functions as an energy donor capable of efficiently transferring energy to the guest material 132. The excitation energy for forming the exciplex by the organic compound 131_1 and the organic compound 131_2 can be lower than the excitation energy of the organic compound 131_1 in the excited state and lower than the excitation energy of the organic compound 131_2 in the excited state. Therefore, the driving voltage of the light-emitting element 150 can be reduced. Furthermore, in order to facilitate energy transfer from the singlet excitation energy level of the exciplex to the triplet excitation energy level of the guest material 132 having a function as an energy acceptor, it is preferable that the emission spectrum of the exciplex overlap with the absorption band of the guest material 132 which is on the longest wavelength side (low energy side). Thus, the efficiency of generating the triplet excited state of the guest material 132 can be increased. The exciplex generated in the light-emitting layer 130 has a feature in that the singlet excitation energy level is close to the triplet excitation energy level. Therefore, by overlapping the emission spectrum of the exciplex and the absorption band of the guest material 132 which is on the longest wavelength side (lowest energy side), energy transfer from the triplet excitation energy level of the exciplex to the triplet excitation energy level of the guest material 132 can be facilitated.

<Material>

Next, components of a light-emitting element of one embodiment of the present invention are described in detail below.

<<Light-Emitting Layer>>

In the light-emitting layer 130, the host material 131 is present in the largest proportion by weight, and the guest material 132 (the phosphorescent compound) is dispersed in the host material 131. The T1 level of the host material 131 (the organic compound 131_1 and the organic compound 131_2) in the light-emitting layer 130 is preferably higher than the T1 level of the guest material (the guest material 132) in the light-emitting layer 130.

As the organic compound 1311, a material having a property of transporting more electrons than holes can be used, and a material having an electron mobility of $1\times10^{-6}$ $cm^2/Vs$ or higher is preferable. A compound including a π-electron deficient heteroaromatic ring skeleton, such as a nitrogen-containing heteroaromatic compound, or a zinc- or aluminum-based metal complex can be used, for example, as the material which easily accepts electrons (the material having an electron-transport property). Examples of the compound including a π-electron deficient heteroaromatic ring skeleton include an oxadiazole derivative, a triazole derivative, a benzimidazole derivative, a quinoxaline derivative, a dibenzoquinoxaline derivative, a phenanthroline derivative, a pyridine derivative, a bipyridine derivative, a pyrimidine derivative, and a triazine derivative. Examples of the zinc- or aluminum-based metal complex include a metal complex having a quinoline ligand, a metal complex having a benzoquinoline ligand, a metal complex having an oxazole ligand, and a metal complex having a thiazole ligand.

Specific examples include metal complexes having a quinoline or benzoquinoline skeleton, such as tris(8-quinolinolato)aluminum(III) (abbreviation: Alq), tris(4-methyl-8-quinolinolato)aluminum(III) (abbreviation: $Almq_3$), bis(10-hydroxybenzo[h]quinolinato)beryllium(II) (abbreviation: $BeBq_2$), bis(2-methyl-8-quinolinolato)(4-phenylphenolato) aluminum(III) (abbreviation: BAlq), and bis(8-quinolinolato)zinc(II) (abbreviation: Znq). Alternatively, a metal complex having an oxazole-based or thiazole-based ligand, such as bis[2-(2-benzoxazolyl)phenolate]zinc(II) (abbreviation: ZnPBO) or bis[2-(2-benzothiazolyl)phenolato]zinc(II) (abbreviation: ZnBTZ) can be used. Other than such metal complexes, any of the following can be used: heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 3-(4-biphenylyl)-4-phenyl-5-(4-tert-butylphenyl)-1,2,4-triazole (abbreviation: TAZ), 9-[4-(4,5-diphenyl-4H-1,2,4-triazol-3-yl)phenyl]-9H-carbazole (abbreviation: CzTAZ1), 2,2',2"-(1,3,5-benzenetriyl) tris(1-phenyl-1H-benzimidazole) (abbreviation: TPBI), 2-[3-(dibenzothiophen-4-yl)phenyl]-1-phenyl-1H-benzimidazole (abbreviation: mDBTBIm-II), bathophenanthroline (abbreviation: BPhen), and bathocuproine (abbreviation: BCP); heterocyclic compounds having a diazine skeleton such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl) biphenyl-3-yl]dibenzo[f,h]quinoxaline (abbreviation: 2mCzBPDBq), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), 6-[3-(dibenzothiophen-4-yl)phenyl]dibenzo[f,h]quinoxaline (abbreviation: 6mDBTPDBq-II), 2-[3-(3,9'-bi-9H-carbazol-9-yl)phenyl] dibenzo[f,h]quinoxaline (abbreviation: 2mCzCzPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), and 4,6-bis[3-(9H-carbazol-9-yl)phenyl]pyrimidine (abbreviation: 4,6mCzP2Pm); heterocyclic compounds having a triazine skeleton such as 2-{4-[3-(N-phenyl-9H-carbazol-3-yl)-9H-carbazol-9-yl]phenyl}-4,6-diphenyl-1,3,5-triazine (abbreviation: PCCzPTzn); heterocyclic compounds having a pyridine skeleton such as 3,5-bis[3-(9H-carbazol-9-yl)phenyl] pyridine (abbreviation: 35DCzPPy); and heteroaromatic compounds such as 4,4'-bis(5-methylbenzoxazol-2-yl)stilbene (abbreviation: BzOs). Among the heterocyclic compounds, the heterocyclic compounds having a triazine skeleton, a diazine skeleton (pyrimidine, pyrazine, pyridazine), or a pyridine skeleton are highly reliable and stable and are thus preferably used. In addition, the heterocyclic compounds having the skeletons have a high electron-transport property to contribute to a reduction in driving voltage. Further alternatively, a high molecular compound such as poly(2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used. The substances described here are mainly substances having an electron mobility of $1\times10^{-6}$ $cm^2/Vs$ or higher. Note that other substances may also be used as long as their electron-transport properties are higher than their hole-transport properties.

As the organic compound 131_2, a substance which can form an exciplex together with the organic compound 131_1 is preferably used. Specifically, the organic compound 131_2 preferably includes a skeleton having a high donor property, such as a π-electron rich heteroaromatic ring skeleton or an aromatic amine skeleton. Examples of the compound having a π-electron rich heteroaromatic ring skeleton include heteroaromatic compounds such as a dibenzothiophene derivative, a dibenzofuran derivative, and a carbazole derivative. In that case, it is preferable that the organic compound 1311, the organic compound 1312, and the guest material 132 (the phosphorescent material) be selected such that the emission peak of the exciplex formed by the organic compound 131_1 and the organic compound 131_2 overlaps with an absorption band, specifically an absorption band on the longest wavelength side, of a triplet metal to ligand charge transfer (MLCT) transition of the guest material 132 (the phosphorescent material). This makes it possible to provide a light-emitting element with drastically improved emission efficiency. Note that in the case where a thermally activated delayed fluorescence material is used instead of the phosphorescent compound, it is preferable that the absorption band on the longest wavelength side be a singlet absorption band.

As the organic compound 131_2, materials having a hole-transport property given below can be used.

A material having a property of transporting more holes than electrons can be used as the hole-transport material, and a material having a hole mobility of $1\times10^{-6}$ $cm^2/Vs$ or higher is preferable. Specifically, an aromatic amine, a carbazole derivative, an aromatic hydrocarbon, a stilbene derivative, or the like can be used. Furthermore, the hole-transport material may be a high molecular compound.

Examples of the aromatic amine compounds that can be used as the material having a high hole-transport property are NN-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N'-bis{4-[bis(3-methylphenyl)amino]phenyl}-N,N'-diphenyl-(1,1'-biphenyl)-4,4'-diamine (abbreviation: DNTPD), 1,3,5-tris[N-(4-diphenylaminophenyl)-N-phenylamino]benzene (abbreviation: DPA3B), and the like.

Specific examples of the carbazole derivative are 3-[N-(4-diphenylaminophenyl)-N-phenylamino]-9-phenylcarbazole (abbreviation: PCzDPA1), 3,6-bis[N-(4-diphenylaminophenyl)-N-phenylamino]-9-phenylcarbazole (abbreviation: PCzDPA2), 3,6-bis[N-(4-diphenylaminophenyl)-N-(1-naphthyl)amino]-9-phenylcarbazole (abbreviation: PCzTPN2), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), and the like.

Other examples of the carbazole derivative are 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), 1,4-bis[4-(N-carbazolyl)phenyl]-2,3,5,6-tetraphenylbenzene, and the like.

Examples of the aromatic hydrocarbon are 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, and the like. Other examples are pentacene, coronene, and the like. The aromatic hydrocarbon having a hole mobility of $1\times10^{-6}$ $cm^2/Vs$ or higher and having 14 to 42 carbon atoms is particularly preferable.

The aromatic hydrocarbon may have a vinyl skeleton. Examples of the aromatic hydrocarbon having a vinyl group are 4,4'-bis(2,2-diphenylvinyl)biphenyl (abbreviation: DPVBi), 9,10-bis[4-(2,2-diphenylvinyl)phenyl]anthracene (abbreviation: DPVPA), and the like.

Other examples are high molecular compounds such as poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: poly-TPD).

Examples of the material having a high hole-transport property are aromatic amine compounds such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4',4"-tris(carbazol-9-yl)triphenylamine (abbreviation: TCTA), 4,4',4"-tris[N-(1-naphthyl)-N-phenylamino]triphenylamine (abbreviation: 1'-TNATA), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), N-(9,9-dimethyl-9H-fluoren-2-yl)-N-{9,9-dimethyl-2-[N'-phenyl-N'-(9,9-dimethyl-9H-fluoren-2-yl)amino]-9H-fluoren-7-yl}phenylamine (abbreviation: DFLADFL), N-(9,9-dimethyl-2-diphenylamino-9H-fluoren-7-yl)diphenylamine (abbreviation: DPNF), 2-[N-(4-diphenylaminophenyl)-N-phenylamino]spiro-9,9'-bifluorene (abbreviation: DPASF), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 4-phenyldiphenyl-(9-phenyl-9H-carbazol-3-yl)amine (abbreviation: PCA1BP), N,N'-bis(9-phenylcarbazol-3-yl)-N,N'-diphenylbenzene-1,3-diamine (abbreviation: PCA2B), N,N',N"-triphenyl-N,N',N"-tris(9-phenylcarbazol-3-yl)benzene-1,3,5-triamine (abbreviation: PCA3B), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine (abbreviation: PCBBiF), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 2-[N-(9-phenylcarbazol-3-yl)-N-phenylamino]spiro-9,9'-bifluorene (abbreviation: PCASF), 2,7-bis[N-(4-diphenylaminophenyl)-N-phenylamino]-spiro-9,9'-bifluorene (abbreviation: DPA2SF), N-[4-(9H-carbazol-9-yl)phenyl]-N-(4-phenyl)phenylaniline (abbreviation: YGA1BP), and N,N'-bis[4-(carbazol-9-yl)phenyl]-N,N'-diphenyl-9,9-dimethylfluorene-2,7-diamine (abbreviation: YGA2F). Other examples are amine compounds, carbazole compounds, thiophene compounds, furan compounds, fluorene compounds, triphenylene compounds, phenanthrene compounds, and the like such as 3-[4-(1-naphthyl)-phenyl]-9-phenyl-9H-carbazole (abbreviation: PCPN), 3-[4-(9-phenanthryl)-phenyl]-9-phenyl-9H-carbazole (abbreviation: PCPPn), 3,3'-bis(9-phenyl-9H-carbazole) (abbreviation: PCCP), 1,3-bis(N-carbazolyl)benzene (abbreviation: mCP), 3,6-bis(3,5-diphenylphenyl)-9-phenylcarbazole (abbreviation: CzTP), 3,6-di(9H-carbazol-9-yl)-9-phenyl-9H-carbazole (abbreviation: PhCzGI), 2,8-di(9H-carbazol-9-yl)-dibenzothiophene (abbreviation: Cz2DBT), 4-{3-[3-(9-phenyl-9H-fluoren-9-yl)phenyl]phenyl}dibenzofuran (abbreviation: mmDBFFLBi-II), 4,4', 4"-(benzene-1,3,5-triyl)tri(dibenzofuran) (abbreviation: DBF3P-II), 1,3,5-tri(dibenzothiophen-4-yl)-benzene (abbreviation: DBT3P-II), 2,8-diphenyl-4-[4-(9-phenyl-9H-fluoren-9-yl)phenyl]dibenzothiophene (abbreviation: DBTFLP-III), 4-[4-(9-phenyl-9H-fluoren-9-yl)phenyl]-6-phenyldibenzothiophene (abbreviation: DBTFLP-IV), and 4-[3-(triphenylen-2-yl)phenyl]dibenzothiophene (abbreviation: mDBTPTp-II). Among the above compounds, compounds including a pyrrole skeleton, a furan skeleton, a thiophene skeleton, or an aromatic amine skeleton are preferred because of their high stability and reliability. In addition, the compounds having such skeletons have a high hole-transport property to contribute to a reduction in driving voltage.

As the guest material 132 (phosphorescent compound), an iridium-, rhodium-, or platinum-based organometallic complex or metal complex can be used; in particular, an organoiridium complex such as an iridium-based ortho-metalated complex is preferable. As an ortho-metalated ligand, a 4H-triazole ligand, a 1H-triazole ligand, an imidazole ligand, a pyridine ligand, a pyrimidine ligand, a pyrazine ligand, an isoquinoline ligand, and the like can be given. As the metal complex, a platinum complex having a porphyrin ligand and the like can be given.

The organic compound 131_1, the organic compound 131_2, and the guest material 132 (phosphorescent compound) are preferably selected such that the LUMO level of the guest material 132 (the phosphorescent compound) is higher than that of the organic compound 131_1 and the HOMO level of the guest material 132 is lower than that of the organic compound 1312. With this structure, a light-emitting element with high emission efficiency and low driving voltage can be obtained.

Examples of the substance that has an emission peak in the blue or green wavelength range include organometallic iridium complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: $Ir(mpptz\text{-}dmp)_3$), tris(5-methyl-3,4-diphenyl-4H-1,2,4-triazolato)iridium(III) (abbreviation: $Ir(Mptz)_3$), tris[4-(3-biphenyl)-5-isopropyl-3-phenyl-4H-1,2,4-triazolato]iridium (III) (abbreviation: $Ir(iPrptz\text{-}3b)_3$), and tris[3-(5-biphenyl)-5-isopropyl-4-phenyl-4H-1,2,4-triazolato]iridium(III) (abbreviation: $Ir(iPr5btz)_3$); organometallic iridium complexes having a 1H-triazole skeleton, such as tris[3-methyl-1-(2-methylphenyl)-5-phenyl-1H-1,2,4-triazolato]iridium (III) (abbreviation: $Ir(Mptz1\text{-}mp)_3$) and tris(1-methyl-5-phenyl-3-propyl-1H-1,2,4-triazolato)iridium(III) (abbreviation: $Ir(Prptz1\text{-}Me)_3$); organometallic iridium complexes having an imidazole skeleton, such as fac-tris[1-(2,6-diisopropylphenyl)-2-phenyl-1H-imidazole]iridium(III) (abbreviation: $Ir(iPrpmi)_3$) and tris[3-(2,6-dimethylphenyl)-7-methylimidazo[1,2-]phenanthridinato]iridium(III) (abbreviation: $Ir(dmpimpt\text{-}Me)_3$); and organometallic iridium complexes in which a phenylpyridine derivative having an electron-withdrawing group is a ligand, such as bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III)picolinate (abbreviation: $Ir(CF_3ppy)_2(pic)$), and bis[2-(4',6'-difluorophenyl)pyridinato-N,$C^{2'}$]iridium(III) acetylacetonate (abbreviation: FIr(acac)). Among the materials given above, the organometallic iridium complexes including a nitrogen-containing five-membered heterocyclic skeleton, such as a 4H-triazole skeleton, a 1H-triazole skeleton, or an imidazole skeleton have high triplet excitation energy, reliability, and emission efficiency and are thus especially preferable.

Examples of the substance that has an emission peak in the green or yellow wavelength range include organometallic iridium complexes having a pyrimidine skeleton, such as tris(4-methyl-6-phenylpyrimidinato)iridium(III) (abbreviation: $Ir(mppm)_3$), tris(4-t-butyl-6-phenylpyrimidinato) iridium(III) (abbreviation: $Ir(tBuppm)_3$), (acetylacetonato) bis(6-methyl-4-phenylpyrimidinato)iridium(III) (abbreviation: $Ir(mppm)_2(acac)$), (acetylacetonato)bis(6-tert-butyl-4-phenylpyrimidinato)iridium(III) (abbreviation: $Ir(tBuppm)_2(acac)$), (acetylacetonato)bis[4-(2-norbornyl)-6-phenylpyrimidinato]iridium(III) (abbreviation: $Ir(nbppm)_2(acac)$), (acetylacetonato)bis[5-methyl-6-(2-methylphenyl)-4-phenylpyrimidinato]iridium(III) (abbreviation: $Ir(mpmppm)_2(acac)$), (acetylacetonato)bis{4,6-dimethyl-2-[6-(2,6-dimethylphenyl)-4-pyrimidinyl-κN3]phenyl-κC}iridium(III) (abbreviation: $Ir(dmppm\text{-}dmp)_2(acac)$), (acetylacetonato)bis(4,6-diphenylpyrimidinato)iridium(III) (abbreviation: $Ir(dppm)_2(acac)$); organometallic iridium complexes having a pyrazine skeleton, such as (acetylacetonato)bis(3,5-dimethyl-2-phenylpyrazinato)iridium(III) (abbreviation: $Ir(mppr\text{-}Me)_2(acac)$) and (acetylacetonato)bis (5-isopropyl-3-methyl-2-phenylpyrazinato)iridium(III) (abbreviation: $Ir(mppr\text{-}iPr)_2(acac)$); organometallic iridium complexes having a pyridine skeleton, such as tris(2-phenylpyridinato-N,$C^{2'}$)iridium(III) (abbreviation: $Ir(ppy)_3$), bis(2-phenylpyridinato-N,$C^{2'}$)iridium(III) acetylacetonate (abbreviation: $Ir(ppy)_2(acac)$), bis(benzo[h]quinolinato) iridium(III) acetylacetonate (abbreviation: $Ir(bzq)_2(acac)$), tris(benzo[h]quinolinato)iridium(III) (abbreviation: $Ir(bzq)_3$), tris(2-phenylquinolinato-N,$C^{2'}$)iridium(III) (abbreviation: $Ir(pq)_3$), and bis(2-phenylquinolinato-N,$C^{2'}$) iridium(III) acetylacetonate (abbreviation: $Ir(pq)_2(acac)$); organometallic iridium complexes such as bis(2,4-diphenyl-1,3-oxazolato-N,$C^{2'}$)iridium(III)acetylacetonate (abbreviation: $Ir(dpo)_2(acac)$), bis{2-[4'-(perfluorophenyl)phenyl] pyridinato-N,$C^{2'}$}iridium(III)acetylacetonate (abbreviation: $Ir(p\text{-}PF\text{-}ph)_2(acac)$), and bis(2-phenylbenzothiazolato-N,$C^{2'}$)iridium(III)acetylacetonate (abbreviation: $Ir(bt)_2(acac)$); and a rare earth metal complex such as tris(acetylacetonato) (monophenanthroline)terbium(III) (abbreviation: $Tb(acac)_3(Phen)$). Among the materials given above, the organometallic iridium complexes having apyrimidine skeleton have distinctively high reliability and light emission efficiency and are thus particularly preferable.

Examples of the substance that has an emission peak in the yellow or red wavelength range include organometallic iridium complexes having a pyrimidine skeleton, such as (diisobutyrylmethanato)bis[4,6-bis(3-methylphenyl)pyrimidinato]iridium(III) (abbreviation: $Ir(5mdppm)_2(dibm)$), bis [4,6-bis(3-methylphenyl)pyrimidinato](dipivaloylmethanato)iridium(III) (abbreviation: $Ir(5mdppm)_2(dpm)$), and bis[4,6-di(naphthalen-1-yl)pyrimidinato](dipivaloylmethanato)iridium(III) (abbreviation: $Ir(d1npm)_2(dpm)$); organometallic iridium complexes having a pyrazine skeleton, such as (acetylacetonato)bis(2,3,5-triphenylpyrazinato)iridium (III) (abbreviation: $Ir(tppr)_2(acac)$), bis(2,3,5-triphenylpyrazinato) (dipivaloylmethanato)iridium(III) (abbreviation: $Ir(tppr)_2(dpm)$), and (acetylacetonato)bis[2,3-bis(4-fluorophenyl)quinoxalinato]iridium(III) (abbreviation: $Ir(Fdpq)_2(acac)$); organometallic iridium complexes having a pyridine skeleton, such as tris(1-phenylisoquinolinato-N,$C^{2'}$)iridium(III) (abbreviation: $Ir(piq)_3$) and bis(1-phenylisoquinolinato-N,$C^{2'}$)iridium(III)acetylacetonate (abbreviation: $Ir(piq)_2(acac)$); a platinum complex such as 2,3,7,8,12,13,17,18-octaethyl-21H,23H-porphyrin platinum(II) (abbreviation: PtOEP); and rare earth metal complexes such as tris(1,3-diphenyl-1,3-propanedionato)(monophenanthroline)europium(III) (abbreviation: $Eu(DBM)_3(Phen)$) and tris[1-(2-thenoyl)-3,3,3-trifluoroacetonato](monophenanthroline)europium(III) (abbreviation: $Eu(TTA)_3(Phen)$). Among the materials given above, the organometallic iridium complexes having a pyrimidine skeleton have distinctively high reliability and light emission efficiency and are thus particularly preferable. Further, the organometallic iridium complexes having a pyrazine skeleton can provide red light emission with favorable chromaticity.

As the light-emitting material included in the light-emitting layer 130, any material can be used as long as the material can convert the triplet excitation energy into light emission. As an example of the material that can convert the triplet excitation energy into light emission, a thermally activated delayed fluorescent (TADF) material can be given in addition to a phosphorescent compound. Therefore, it is acceptable that the "phosphorescent compound" in the description is replaced with the "thermally activated delayed fluorescence material". Note that the thermally activated delayed fluorescence material is a material having a small difference between the triplet excitation energy level and the singlet excitation energy level and a function of converting triplet excitation energy into singlet excitation energy by reverse intersystem crossing. Thus, the TADF material can up-convert a triplet excited state into a singlet excited state (i.e., reverse intersystem crossing is possible) using a little thermal energy and efficiently exhibit light emission (fluorescence) from the singlet excited state. The TADF is efficiently obtained under the condition where the difference in energy between the triplet excitation energy level and the singlet excitation energy level is preferably larger than 0 eV and smaller than or equal to 0.2 eV, further preferably larger than 0 eV and smaller than or equal to 0.1 eV.

In the case where the thermally activated delayed fluorescence material is composed of one kind of material, any of the following materials can be used, for example.

First, a fullerene, a derivative thereof, an acridine derivative such as proflavine, eosin, and the like can be given. Furthermore, a metal-containing porphyrin, such as a porphyrin containing magnesium (Mg), zinc (Zn), cadmium (Cd), tin (Sn), platinum (Pt), indium (In), or palladium (Pd), can be given. Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$(OEP)).

As the thermally activated delayed fluorescence material composed of one kind of material, a heterocyclic compound including a π-electron rich heteroaromatic ring and a π-electron deficient heteroaromatic ring can also be used. Specifically, 2-(biphenyl-4-yl)-4,6-bis(12-phenylindolo[2,3-a]carbazol-11-yl)-1,3,5-triazine (abbreviation: PIC-TRZ), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), or 10-phenyl-10H,10'H-spiro[acridin-9,9'-anthracen]-10'-one (abbreviation: ACRSA) can be used. The heterocyclic compound is preferable because of having the it-electron rich heteroaromatic ring and the it-electron deficient heteroaromatic ring, for which the electron-transport property and the hole-transport property are high. Among skeletons having the π-electron deficient heteroaromatic ring, a diazine skeleton (a pyrimidine skeleton, a pyrazine skeleton, or a pyridazine skeleton) and a triazine skeleton have high stability and reliability and are particularly preferable. Among skeletons having the it-electron rich heteroaromatic ring, an acridine skeleton, a phenoxazine skeleton, a thiophene skeleton, a furan skeleton, and a pyrrole skeleton have high stability and reliability; therefore, one or more of these skeletons are preferably included. As the pyrrole skeleton, an indole skeleton, a carbazole skeleton, or a 3-(9-phenyl-9H-carbazol-3-yl)-9H-carbazole skeleton is particularly preferred. Note that a substance in which the it-electron rich heteroaromatic ring is directly bonded to the it-electron deficient heteroaromatic ring is particularly preferable because the donor property of the it-electron rich heteroaromatic ring and the acceptor property of the it-electron deficient heteroaromatic ring are both increased and the difference between the singlet excitation energy level and the triplet excitation energy level becomes small.

The light-emitting layer 130 can have a structure in which two or more layers are stacked. For example, in the case where the light-emitting layer 130 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. A light-emitting material included in the first light-emitting layer may be the same as or different from a light-emitting material included in the second light-emitting layer. In addition, the materials may have functions of emitting light of the same color or light of different colors. Two kinds of light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

The light-emitting layer 130 may include a material other than the host material 131 and the guest material 132.

Note that the light-emitting layer 130 can be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be used.

<<Hole-Injection Layer>>

The hole-injection layer 111 has a function of reducing a barrier for hole injection from one of the pair of electrodes (the electrode 101 or the electrode 102) to promote hole injection and is formed using a transition metal oxide, a phthalocyanine derivative, or an aromatic amine, for example. As the transition metal oxide, molybdenum oxide, vanadium oxide, ruthenium oxide, tungsten oxide, manganese oxide, or the like can be given. As the phthalocyanine derivative, phthalocyanine, metal phthalocyanine, or the like can be given. As the aromatic amine, a benzidine derivative, a phenylenediamine derivative, or the like can be given. It is also possible to use a high molecular compound such as polythiophene or polyaniline; a typical example thereof is poly(ethylenedioxythiophene)/poly(styrenesulfonic acid), which is self-doped polythiophene.

As the hole-injection layer 111, a layer containing a composite material of a hole-transport material and a material having a property of accepting electrons from the hole-transport material can also be used. Alternatively, a stack of a layer containing a material having an electron accepting property and a layer containing a hole-transport material may also be used. In a steady state or in the presence of an electric field, electric charge can be transferred between these materials. As examples of the material having an electron-accepting property, organic acceptors such as a quinodimethane derivative, a chloranil derivative, and a hexaazatriphenylene derivative can be given. A specific example is a compound having an electron-withdrawing group (a halogen group or a cyano group), such as 7,7,8,8-tetracyano-2,3,5,6-tetrafluoroquinodimethane (abbreviation: $F_4$-TCNQ), chloranil, or 2,3,6,7,10,11-hexacyano-1,4,5,8,9,12-hexaazatriphenylene (abbreviation: HAT-CN). Alternatively, a transition metal oxide such as an oxide of a metal from Group 4 to Group 8 can also be used. Specifically, vanadium oxide, niobium oxide, tantalum oxide, chromium oxide, molybdenum oxide, tungsten oxide, manganese oxide, rhenium oxide, or the like can be used. In particular, molybdenum oxide is preferable because it is stable in the air, has a low hygroscopic property, and is easily handled.

A material having a property of transporting more holes than electrons can be used as the hole-transport material, and a material having a hole mobility of $1\times10^{-6}$ $cm^2/Vs$ or higher is preferable. Specifically, any of the aromatic amine, carbazole derivative, aromatic hydrocarbon, stilbene derivative, and the like described as examples of the hole-transport material that can be used in the light-emitting layer 130 can be used. Furthermore, the hole-transport material may be a high molecular compound.

<<Hole-Transport Layer>>

The hole-transport layer 112 is a layer containing a hole-transport material and can be formed using any of the hole-transport materials given as examples of the material of the hole-injection layer 111. In order that the hole-transport layer 112 has a function of transporting holes injected into the hole-injection layer 111 to the light-emitting layer 130, the HOMO level of the hole-transport layer 112 is preferably equal or close to the HOMO level of the hole-injection layer 111.

As the hole-transport material, a substance having a hole mobility of $1\times10^{-6}$ $cm^2/Vs$ or higher is preferably used. Note that any substance other than the above substances may be used as long as the hole-transport property is higher than the electron-transport property. The layer including a substance having a high hole-transport property is not limited to a single layer, and two or more layers containing the aforementioned substances may be stacked.

<<Electron-Transport Layer>>

The electron-transport layer 118 has a function of transporting, to the light-emitting layer 130, electrons injected from the other of the pair of electrodes (the electrode 101 or the electrode 102) through the electron-injection layer 119. A material having a property of transporting more electrons than holes can be used as the electron-transport material, and a material having an electron mobility of $1\times10^{-6}$ $cm^2/Vs$ or higher is preferable. As the compound which easily accepts electrons (the material having an electron-transport property), a π-electron deficient heteroaromatic compound such as a nitrogen-containing heteroaromatic compound, a metal complex, or the like can be used, for example. Specifically, a metal complex having a quinoline ligand, a benzoquinoline ligand, an oxazole ligand, or a thiazole ligand, which is described as the electron-transport material that can be used in the light-emitting layer 130, can be given. In addition, an oxadiazole derivative, a triazole derivative, a benzimidazole derivative, a quinoxaline derivative, a dibenzoquinoxaline derivative, a phenanthroline derivative, a pyridine derivative, a bipyridine derivative, a pyrimidine derivative, and a triazine derivative can be given. A substance having an electron mobility of $1\times10^{-6}$ $cm^2/Vs$ or higher is preferable. Note that other than these substances, any substance that has a property of transporting more electrons than holes may be used for the electron-transport layer. The electron-transport layer 118 is not limited to a single layer, and may include stacked two or more layers containing the aforementioned substances.

Between the electron-transport layer 118 and the light-emitting layer 130, a layer that controls transfer of electron carriers may be provided. This is a layer formed by addition of a small amount of a substance having a high electron-trapping property to a material having a high electron-transport property described above, and the layer is capable of adjusting carrier balance by suppressing transfer of electron carriers. Such a structure is very effective in preventing a problem (such as a reduction in element lifetime) caused when electrons pass through the light-emitting layer.

<<Electron-Injection Layer>>

The electron-injection layer 119 has a function of reducing a barrier for electron injection from the electrode 102 to promote electron injection and can be formed using a Group 1 metal or a Group 2 metal, or an oxide, a halide, or a carbonate of any of the metals, for example. Alternatively, a composite material containing an electron-transport material (described above) and a material having a property of donating electrons to the electron-transport material can also be used. As the material having an electron-donating property, a Group 1 metal, a Group 2 metal, an oxide of any of the metals, or the like can be given. Specifically, an alkali metal, an alkaline earth metal, or a compound thereof, such as lithium fluoride (LiF), sodium fluoride (NaF), cesium fluoride (CsF), calcium fluoride ($CaF_2$), or lithium oxide ($LiO_x$), can be used. Alternatively, a rare earth metal compound like erbium fluoride ($ErF_3$) can be used. Electride may also be used for the electron-injection layer 119. Examples of the electride include a substance in which electrons are added at high concentration to calcium oxide-aluminum oxide. The electron-injection layer 119 can be formed using the substance that can be used for the electron-transport layer 118.

A composite material in which an organic compound and an electron donor (donor) are mixed may also be used for the electron-injection layer 119. Such a composite material is excellent in an electron-injection property and an electron-transport property because electrons are generated in the organic compound by the electron donor. In this case, the organic compound is preferably a material that is excellent in transporting the generated electrons. Specifically, the above-listed substances for forming the electron-transport layer 118 (e.g., the metal complexes and heteroaromatic compounds) can be used, for example. As the electron donor, a substance showing an electron-donating property with respect to the organic compound may be used. Specifically, an alkali metal, an alkaline earth metal, and a rare earth metal are preferable, and lithium, sodium, cesium, magnesium, calcium, erbium, and ytterbium are given. In addition, an alkali metal oxide or an alkaline earth metal oxide is preferable, and lithium oxide, calcium oxide, barium oxide, and the like are given. A Lewis base such as magnesium oxide can also be used. An organic compound such as tetrathiafulvalene (abbreviation: TTF) can also be used.

Note that the light-emitting layer, the hole-injection layer, the hole-transport layer, the electron-transport layer, and the electron-injection layer described above can each be formed by an evaporation method (including a vacuum evaporation method), an inkjet method, a coating method, a gravure printing method, or the like. Besides the above-mentioned materials, an inorganic compound such as a quantum dot or a high molecular compound (e.g., an oligomer, a dendrimer, and a polymer) may be used in the light-emitting layer, the hole-injection layer, the hole-transport layer, the electron-transport layer, and the electron-injection layer.

The quantum dot may be a colloidal quantum dot, an alloyed quantum dot, a core-shell quantum dot, or a core quantum dot, for example. The quantum dot containing elements belonging to Groups 2 and 16, elements belonging to Groups 13 and 15, elements belonging to Groups 13 and 17, elements belonging to Groups 11 and 17, or elements belonging to Groups 14 and 15 may be used. Alternatively, the quantum dot containing an element such as cadmium (Cd), selenium (Se), zinc (Zn), sulfur (S), phosphorus (P), indium (In), tellurium (Te), lead (Pb), gallium (Ga), arsenic (As), or aluminum (Al) may be used.

<<Pair of Electrodes>>

The electrodes 101 and 102 function as an anode and a cathode of each light-emitting element. The electrodes 101 and 102 can be formed using a metal, an alloy, or a conductive compound, a mixture or a stack thereof, or the like.

One of the electrode 101 and the electrode 102 is preferably formed using a conductive material having a function of reflecting light. Examples of the conductive material include aluminum (Al), an alloy containing Al, and the like. Examples of the alloy containing Al include an alloy containing Al and L (L represents one or more of titanium (Ti), neodymium (Nd), nickel (Ni), and lanthanum (La)), such as an alloy containing Al and Ti and an alloy containing Al, Ni, and La. Aluminum has low resistance and high light reflectivity. Aluminum is included in earth's crust in large amount and is inexpensive; therefore, it is possible to reduce costs for manufacturing a light-emitting element with aluminum. Alternatively, Ag, an alloy of silver (Ag) and N (N represents one or more of yttrium (Y), Nd, magnesium (Mg), ytterbium (Yb), Al, Ti, gallium (Ga), zinc (Zn), indium (In), tungsten (W), manganese (Mn), tin (Sn), iron (Fe), Ni, copper (Cu), palladium (Pd), iridium (Ir), or gold (Au)), or the like can be used. Examples of the alloy containing silver include an alloy containing silver, palladium, and copper, an alloy containing silver and copper, an alloy containing silver and magnesium, an alloy containing silver and nickel, an alloy containing silver and gold, an alloy containing silver and ytterbium, and the like. Besides, a transition metal such as tungsten, chromium (Cr), molybdenum (Mo), copper, or titanium can be used.

Light emitted from the light-emitting layer is extracted through the electrode 101 and/or the electrode 102. Thus, at least one of the electrode 101 and the electrode 102 is preferably formed using a conductive material having a function of transmitting light. As the conductive material, a conductive material having a visible light transmittance higher than or equal to 40% and lower than or equal to 100%, preferably higher than or equal to 60% and lower than or equal to 100%, and a resistivity lower than or equal to $1\times10^{-2}$ Ω·cm can be used.

The electrodes 101 and 102 may each be formed using a conductive material having functions of transmitting light and reflecting light. As the conductive material, a conductive material having a visible light reflectivity higher than or equal to 20% and lower than or equal to 80%, preferably higher than or equal to 40% and lower than or equal to 70%, and a resistivity lower than or equal to $1\times10^{-2}$ Ω·cm can be used. For example, one or more kinds of conductive metals and alloys, conductive compounds, and the like can be used. Specifically, a metal oxide such as indium tin oxide (hereinafter, referred to as ITO), indium tin oxide containing silicon or silicon oxide (ITSO), indium oxide-zinc oxide (indium zinc oxide), indium oxide-tin oxide containing titanium, indium titanium oxide, or indium oxide containing tungsten oxide and zinc oxide can be used. A metal thin film having a thickness that allows transmission of light (preferably, a thickness greater than or equal to 1 nm and less than or equal to 30 nm) can also be used. As the metal, Ag, an alloy of Ag and Al, an alloy of Ag and Mg, an alloy of Ag and Au, an alloy of Ag and ytterbium (Yb), or the like can be used.

In this specification and the like, as the material transmitting light, a material that transmits visible light and has conductivity is used. Examples of the material include, in addition to the above-described oxide conductor typified by an ITO, an oxide semiconductor and an organic conductor containing an organic substance. Examples of the organic conductor containing an organic substance include a composite material in which an organic compound and an electron donor (donor material) are mixed and a composite material in which an organic compound and an electron acceptor (acceptor material) are mixed. Alternatively, an inorganic carbon-based material such as graphene may be used. The resistivity of the material is preferably lower than or equal to $1\times10^{5}$ Ω·cm, further preferably lower than or equal to $1\times10^{4}$ Ω·cm.

Alternatively, the electrode 101 and/or the electrode 102 may be formed by stacking two or more of these materials.

In order to improve the light extraction efficiency, a material whose refractive index is higher than that of an electrode having a function of transmitting light may be formed in contact with the electrode. The material may be electrically conductive or non-conductive as long as it has a function of transmitting visible light. In addition to the oxide conductors described above, an oxide semiconductor and an organic substance are given as the examples of the material. Examples of the organic substance include the materials for the light-emitting layer, the hole-injection layer, the hole-transport layer, the electron-transport layer, and the electron-injection layer. Alternatively, an inorganic carbon-based material or a metal film thin enough to transmit light can be used. Further alternatively, stacked layers with a thickness of several nanometers to several tens of nanometers may be used.

In the case where the electrode 101 or the electrode 102 functions as the cathode, the electrode preferably contains a material having a low work function (lower than or equal to 3.8 eV). The examples include an element belonging to Group 1 or 2 of the periodic table (e.g., an alkali metal such as lithium, sodium, or cesium, an alkaline earth metal such as calcium or strontium, or magnesium), an alloy containing any of these elements (e.g., Ag—Mg or Al—Li), a rare earth metal such as europium (Eu) or Yb, an alloy containing any of these rare earth metals, an alloy containing aluminum and silver, and the like.

When the electrode 101 or the electrode 102 is used as an anode, a material with a high work function (4.0 eV or higher) is preferably used.

The electrode 101 and the electrode 102 may be a stacked layer of a conductive material having a function of reflecting light and a conductive material having a function of transmitting light. In that case, the electrode 101 and the electrode 102 can have a function of adjusting the optical path length so that light with a desired wavelength emitted from each light-emitting layer resonates and is intensified, which is preferable.

As the method for forming the electrode 101 and the electrode 102, a sputtering method, an evaporation method, a printing method, a coating method, a molecular beam epitaxy (MBE) method, a CVD method, a pulsed laser deposition method, an atomic layer deposition (ALD) method, or the like can be used as appropriate.

<<Substrate>>

A light-emitting element in one embodiment of the present invention may be formed over a substrate of glass, plastic, or the like. As the way of stacking layers over the substrate, layers may be sequentially stacked from the electrode 101 side or sequentially stacked from the electrode 102 side.

For the substrate over which the light-emitting element of one embodiment of the present invention can be formed, glass, quartz, plastic, or the like can be used, for example. Alternatively, a flexible substrate can be used. The flexible substrate means a substrate that can be bent, such as a plastic substrate made of polycarbonate or polyarylate, for example. Alternatively, a film, an inorganic vapor deposition film, or the like can be used. Another material may be used as long as the substrate functions as a support in a manufacturing process of the light-emitting element or an optical element or as long as it has a function of protecting the light-emitting element or an optical element.

In this specification and the like, a light-emitting element can be formed using any of a variety of substrates, for example. The type of a substrate is not limited particularly. Examples of the substrate include a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, cellulose nanofiber (CNF) and paper which include a fibrous material, a base material film, and the like. As an example of a glass substrate, a barium borosilicate glass substrate, an aluminoborosilicate glass substrate, a soda lime glass substrate, and the like can be given. Examples of the flexible substrate, the attachment film, the base material film, and the like are substrates of plastics typified by polyethylene terephthalate (PET), polyethylene naphthalate (PEN), polyether sulfone (PES), and polytetrafluoroethylene (PTFE). Another example is a resin such as acrylic. Furthermore, polypropylene, polyester, polyvinyl fluoride, and polyvinyl chloride can be given as examples. Other examples are polyamide, polyimide, aramid, epoxy, an inorganic vapor deposition film, paper, and the like.

Alternatively, a flexible substrate may be used as the substrate such that the light-emitting element is provided directly on the flexible substrate. Further alternatively, a separation layer may be provided between the substrate and the light-emitting element. The separation layer can be used when part or the whole of a light-emitting element formed over the separation layer is separated from the substrate and transferred onto another substrate. In such a case, the light-emitting element can be transferred to a substrate having low heat resistance or a flexible substrate as well. For the above separation layer, a stack including inorganic films, which are a tungsten film and a silicon oxide film, or a structure in which a resin film of polyimide or the like is formed over a substrate can be used, for example.

In other words, after the light-emitting element is formed using a substrate, the light-emitting element may be transferred to another substrate. Example of the substrate to which the light-emitting element is transferred are, in addition to the above substrates, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like. When such a substrate is used, a light-emitting element with high durability, high heat resistance, reduced weight, or reduced thickness can be formed.

The light-emitting element 150 may be formed over an electrode electrically connected to a field-effect transistor (FET), for example, that is formed over any of the above-described substrates. Accordingly, an active matrix display device in which the FET controls the driving of the light-emitting element 150 can be manufactured.

In Embodiment 1, one embodiment of the present invention has been described. Other embodiments of the present invention are described in Embodiments 2 to 12. Note that one embodiment of the present invention is not limited thereto. That is, since various embodiments of the present invention are disclosed in Embodiment 1 and Embodiments 2 to 12, one embodiment of the present invention is not limited to a specific embodiment. The example in which one embodiment of the present invention is used in a light-emitting element is described; however, one embodiment of the present invention is not limited thereto. For example, depending on circumstances or conditions, one embodiment of the present invention is not necessarily used in a light-emitting element. One embodiment of the present invention shows, but is not limited to, an example of including a first organic compound, a second organic compound, and a guest material capable of converting triplet excitation energy into light emission, in which the LUMO level of the first organic compound is lower than that of the second organic compound and the HOMO level of the first organic compound is lower than that of the second organic compound. Depending on circumstances or conditions, in one embodiment of the present invention, for example, the LUMO level of the first organic compound is not necessarily lower than that of the second organic compound. Alternatively, the HOMO level of the first organic compound is not necessarily lower than that of the second organic compound. One embodiment of the present invention shows, but is not limited to, an example in which the first organic compound and the second organic compound form an exciplex. Depending on circumstances or conditions, in one embodiment of the present invention, for example, the first organic compound and the second organic compound do not necessarily form an exciplex. One embodiment of the present invention shows, but is not limited to, an example in which the LUMO level of the guest material is higher than that of the first organic compound and the HOMO level of the guest material is lower than that of the second organic compound. Depending on circumstances or conditions, in one embodiment of the present invention, for example, the LUMO level of the guest material is not necessarily higher than that of the first organic compound. Alternatively, the HOMO level of the guest material is not necessarily lower than that of the second organic compound.

The structure described in this embodiment can be used in combination with any of the structures described in the other embodiments as appropriate.

Embodiment 2

In this embodiment, a novel compound that can suitably be used in a light-emitting element of one embodiment of the present invention is described below.

A compound of one embodiment of the present invention is an iridium complex including a nitrogen-containing five-membered heterocyclic skeleton as a ligand. The nitrogen-containing five-membered heterocyclic skeleton at least includes a substituent including a cyano group. The nitrogen-containing five-membered heterocyclic skeleton such as an imidazole skeleton or a triazole skeleton has a high triplet excitation energy level but has a lower electron-accepting property than a nitrogen-containing six-membered heterocyclic skeleton. Thus, the iridium complex including a nitrogen-containing five-membered heterocyclic skeleton as a ligand has a high LUMO level and to which electron carriers are not easily injected. However, since the iridium complex of one embodiment of the present invention at least includes a substituent including a cyano group, the LUMO level and the HOMO level are decreased due to a high electron-withdrawing property of the cyano group. Accordingly, a light-emitting element including the iridium complex can have high emission efficiency. Furthermore, since the iridium complex has a high triplet excitation energy level, a light-emitting element including the iridium complex can emit blue light with high emission efficiency. Since the iridium complex is highly resistant to repetition of oxidation and reduction, a light-emitting element including the iridium complex can have a long driving lifetime. As described above, the use of the iridium complex of one embodiment of the present invention in a light-emitting element achieves a high-performance light-emitting element having excellent emission characteristics.

A compound of one embodiment of the present invention is an iridium complex including, as a ligand, a nitrogen-containing five-membered heterocyclic skeleton to which an aryl group including a cyano group is bonded. The ligand can be easily synthesized with high purity, so that deterioration due to impurities can be suppressed. Note that the number of carbon atoms of the aryl group including a cyano group and being bonded to the nitrogen-containing five-membered heterocyclic skeleton is preferably 6 to 13 in terms of stability and reliability of the element characteristics. In that case, the iridium complex can be vacuum-evaporated at a relatively low temperature, and accordingly is unlikely to deteriorate due to pyrolysis or the like at evaporation.

The iridium complex including a ligand in which a cyano group is bonded to a nitrogen atom of a nitrogen-containing five-membered heterocyclic skeleton through an arylene group can keep high triplet excitation energy level, and thus can be preferably used in a light-emitting element emitting high-energy light such as blue light. The light-emitting element including the iridium complex including a ligand to which a cyano group is bonded can emit high-energy light such as blue light with high emission efficiency as compared with a light-emitting element that does not include a cyano group. Moreover, by bonding a cyano group to a particular site as described above, a highly reliable light-emitting element emitting high-energy light such as blue light can be obtained. Note that it is preferable that the nitrogen-containing five-membered heterocyclic skeleton and the cyano group be bonded through an arylene group such as a phenylene group.

When the number of carbon atoms of the arylene group is 6 to 13, the iridium complex is a compound with a relatively low molecular weight and accordingly suitable for vacuum evaporation (capable of being vacuum-evaporated at a relatively low temperature). In general, a lower molecular weight compound tends to have lower heat resistance after film formation. However, even with a low molecular weight of a ligand, the iridium complex has an advantage in that sufficient heat resistance can be ensured because the iridium complex includes a plurality of ligands.

That is, the iridium complex has a feature of a high triplet excitation energy level, in addition to the ease of evaporation and electrochemical stability. Therefore, it is preferable to use the iridium complex as a guest material in a light-emitting layer in a light-emitting element, particularly in a blue light-emitting element.

Example 1 of Iridium Complex

This iridium complex is represented by General Formula (G1).

(G1)

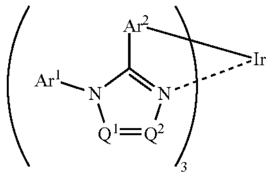

In General Formula (G1), each of $Ar^1$ and $Ar^2$ independently represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $Q^1$ and $Q^2$ independently represents N or C—R, and R represents hydrogen, an alkyl group having 1 to 6 carbon atoms, a haloalkyl group having 1 to 6 carbon atoms, or a substituted or unsubstituted aryl group having 6 to 13 carbon atoms. At least one of $Q^1$ and $Q^2$ includes C—R. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of the aryl groups represented by $Ar^1$ and $Ar^2$ and the aryl group represented by R includes a cyano group.

Example 2 of Iridium Complex

An iridium complex of one embodiment of the present invention is preferably an ortho-metalated complex. This iridium complex is represented by General Formula (G2).

(G2)

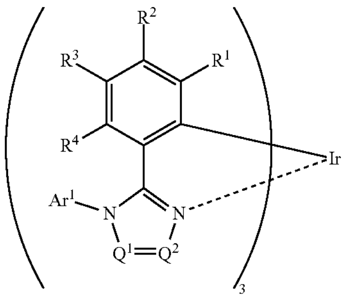

In General Formula (G2), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, a substituted or unsubstituted aryl group having 6 to 13 carbon atoms, and a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $Q^1$ and $Q^2$ independently represents N or C—R, and R represents hydrogen, an alkyl group having 1 to 6 carbon atoms, a haloalkyl group having 1 to 6 carbon atoms, or a substituted or unsubstituted aryl group having 6 to 13 carbon atoms. At least one of $Q^1$ and $Q^2$ includes C—R. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^4$ and R includes a cyano group.

Example 3 of Iridium Complex

An iridium complex of one embodiment of the present invention includes a 4H-triazole skeleton as a ligand, which is preferable because the iridium complex can have a high triplet excitation energy level and can be suitably used in a light-emitting element emitting high-energy light such as blue light. This iridium complex is represented by General Formula (G3).

(G3)

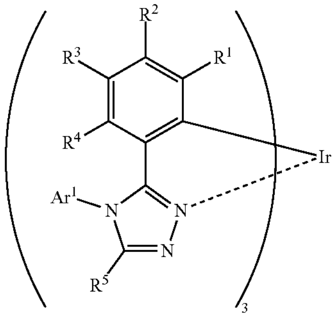

In General Formula (G3), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, a substituted or unsubstituted aryl group having 6 to 13 carbon atoms, and a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^5$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^5$ includes a cyano group.

Example 4 of Iridium Complex

An iridium complex of one embodiment of the present invention includes an imidazole skeleton as a ligand, which is preferable because the iridium complex can have a high triplet excitation energy level and can be suitably used in a light-emitting element emitting high-energy light such as blue light. This iridium complex is represented by General Formula (G4).

(G4)

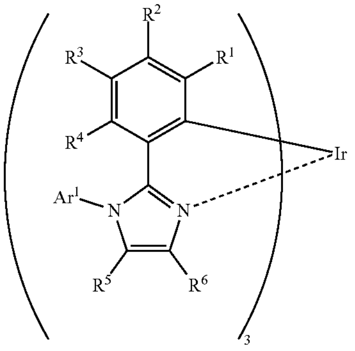

In General Formula (G4), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms.

Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$ and $R^1$ to $R^6$ includes a cyano group.

Example 5 of Iridium Complex

An iridium complex of one embodiment of the present invention includes a nitrogen-containing five-membered heterocyclic skeleton, and an aryl group bonded to nitrogen of the skeleton is preferably a substituted or unsubstituted phenyl group. In that case, the iridium complex can be vacuum-evaporated at a relatively low temperature and can have a high triplet excitation energy level, and accordingly can be used in a light-emitting element emitting high-energy light such as blue light. The iridium complex is represented by General Formula (G5) or (G6).

(G5)

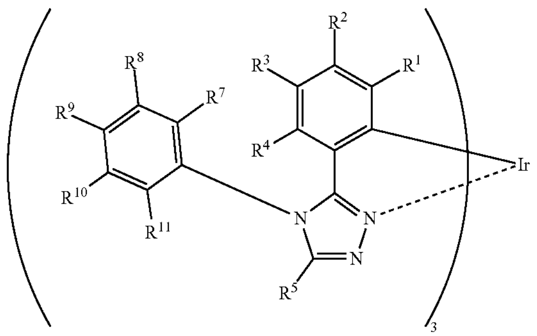

In General Formula (G5), each of $R^7$ and $R^{11}$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^5$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

(G6)

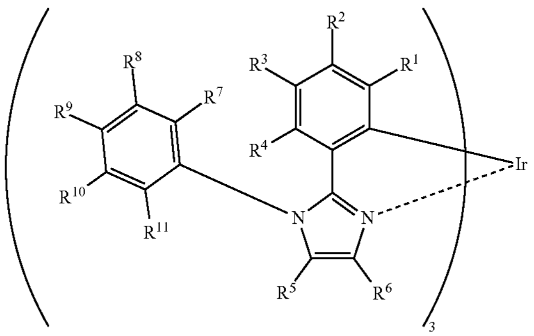

In General Formula (G6), each of $R^7$ and $R^{11}$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

Each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Example 6 of Iridium Complex

An iridium complex of one embodiment of the present invention includes a 1H-triazole skeleton as a ligand, which is preferable because the iridium complex can have a high triplet excitation energy level and can be suitably used in a light-emitting element emitting high-energy light such as blue light. This iridium complex is represented by General Formula (G7) or (G8).

(G7)

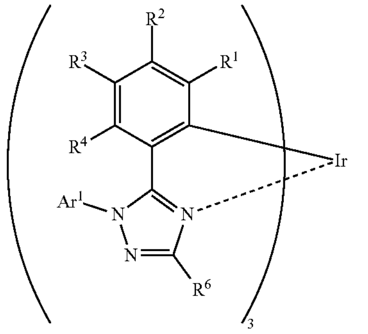

In General Formula (G7), $Ar^1$ represents a substituted or unsubstituted aryl group having 6 to 13 carbon atoms. Specific examples of the aryl group having 6 to 13 carbon atoms include a phenyl group, a naphthyl group, a biphenyl group, and a fluorenyl group. In the case where the aryl group has a substituent, as the substituent, an alkyl group having 1 to 6 carbon atoms, a cycloalkyl group having 3 to 6 carbon atoms, or a substituted or unsubstituted aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^6$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

At least one of $R^1$ to $R^4$ and the aryl groups represented by $Ar^1$, $R^1$ to $R^4$, and $R^6$ includes a cyano group.

(G8)

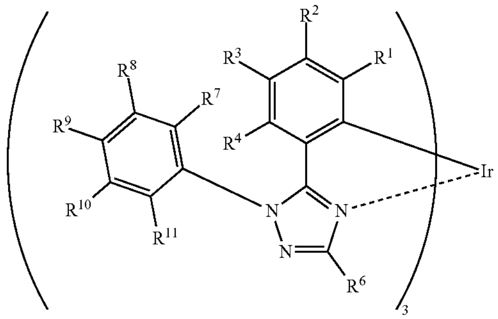

In General Formula (G8), each of $R^7$ and $R^{11}$ represents an alkyl group having 1 to 6 carbon atoms, and $R^7$ and $R^{11}$ have the same structure. Specific examples of the alkyl group having 1 to 6 carbon atoms include a methyl group, an ethyl group, a propyl group, an isopropyl group, a butyl group, an isobutyl group, a tert-butyl group, and an n-hexyl group.

Each of $R^8$ to $R^{10}$ independently represents hydrogen, an alkyl group having 1 to 6 carbon atoms, a cycloalkyl group having 3 to 6 carbon atoms, a substituted or unsubstituted phenyl group, or a cyano group. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Note that at least one of $R^8$ to $R^{10}$ preferably includes a cyano group.

Each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of a cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group. The case where all of $R^1$ to $R^4$ are hydrogen has advantages in easiness of synthesis and material cost.

$R^6$ represents any of hydrogen, an alkyl group having 1 to 6 carbon atoms, a haloalkyl group having 1 to 6 carbon atoms, and a substituted or unsubstituted aryl group having 6 to 13 carbon atoms. Specific examples of the alkyl group having 1 to 6 carbon atoms include a methyl group, an ethyl group, a propyl group, an isopropyl group, a butyl group, an isobutyl group, a tert-butyl group, and an n-hexyl group. The haloalkyl group having 1 to 6 carbon atoms is an alkyl group in which at least one hydrogen is replaced with a Group 17 element (fluorine, chlorine, bromine, iodine, or astatine). Examples of the haloalkyl group having 1 to 6 carbon atoms include an alkyl fluoride group, an alkyl chloride group, an alkyl bromide group, and an alkyl iodide group. Specific examples thereof include a methyl fluoride group, a methyl chloride group, an ethyl fluoride group, and an ethyl chloride group. Note that the number of halogen elements and the kinds thereof may be one or two or more. Specific examples of the aryl group having 6 to 13 carbon atoms include a phenyl group, a naphthyl group, a biphenyl group, and a fluorenyl group. The aryl group may have a substituent, and substituents of the aryl group may be bonded to form a ring. As the substituent, an alkyl group having 1 to 6 carbon atoms, a cycloalkyl group having 3 to 6 carbon atoms, or an aryl group having 6 to 13 carbon atoms can also be selected. Specific examples of the alkyl group having 1 to 6 carbon atoms include a methyl group, an ethyl group, a propyl group, an isopropyl group, a butyl group, an isobutyl group, a tert-butyl group, and an n-hexyl group. Specific examples of the cycloalkyl group having 3 to 6 carbon atoms include a cyclopropyl group, a cyclobutyl group, a cyclopentyl group, and a cyclohexyl group. Specific examples of the aryl group having 6 to 13 carbon atoms include a phenyl group, a naphthyl group, a biphenyl group, and a fluorenyl group.

<Examples of Substituents>

As an alkyl group and an aryl group represented by $R^1$ to $R^4$ in General Formulae (G2) to (G8), for example, groups represented by Structural Formulae (R-1) to (R-29) can be used. Note that groups that can be used as the alkyl group and the aryl group are not limited thereto.

(R-1)

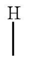

(R-2)

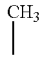

(R-3)

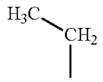

(R-4)

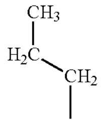

(R-5)

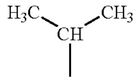

(R-6)

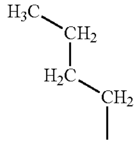

(R-7)

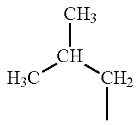

(R-8)

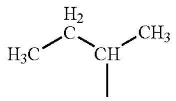

(R-9)

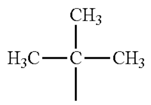

-continued (R-10)

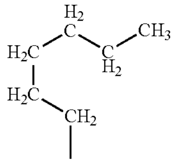

(R-11)

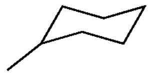

(R-12)

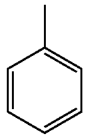

(R-13)

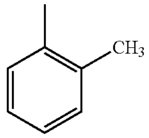

(R-14)

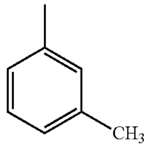

(R-15)

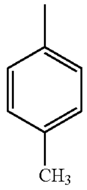

(R-16)

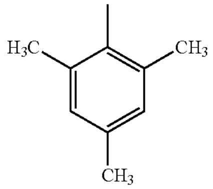

(R-17)

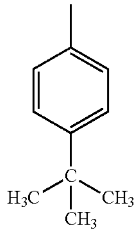

(R-18)

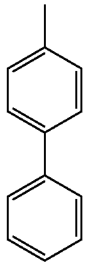

-continued (R-19)

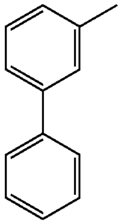

(R-20)

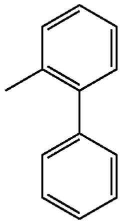

(R-21)

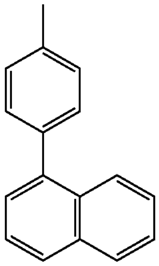

(R-22)

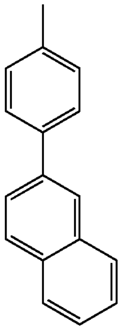

(R-23)

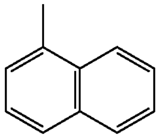

(R-24)

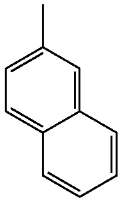

-continued (R-25)

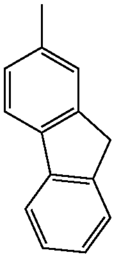

(R-26)

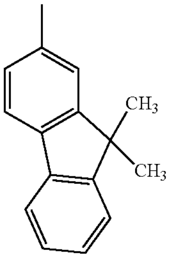

(R-27)

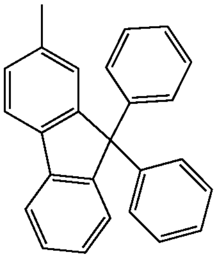

(R-28)

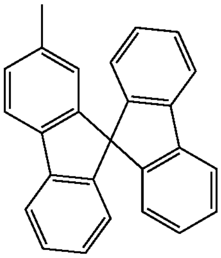

(R-29)

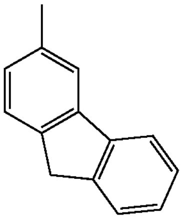

For example, groups represented by Structural Formulae (R-12) to (R-29) can be used as an aryl group represented by $Ar^1$ in General Formulae (G1) to (G4) and (G7) and an aryl group represented by $Ar^2$ in General Formula (G1). Note that groups that can be used as $Ar^1$ and $Ar^2$ are not limited to these groups.

For example, the groups represented by Structural Formulae (R-1) to (R-10) can be used as alkyl groups represented by $R^7$ and $R^{11}$ in General Formulae (G5), (G6), and (G8). Note that groups that can be used as the alkyl group are not limited to these groups.

As the alkyl group or substituted or unsubstituted phenyl group represented by $R^8$ to $R^{10}$ in General Formulae (G5), (G6), and (G8), groups represented by Structure Formulae (R-1) to (R-22) above can be used, for example. Note that groups which can be used as the alkyl group or the phenyl group are not limited thereto.

For example, groups represented by Structural Formulae (R-1) to (R-29) and Structural Formulae (R-30) to (R-37) can be used as an alkyl group, an aryl group, and a haloalkyl group represented by $R^5$ in General Formulae (G3) to (G6) and $R^6$ in General Formulae (G4) and (G6) to (G8). Note that a group that can be used as the alkyl group, the aryl group, or the haloalkyl group is not limited to these groups.

(R-30)

(R-31)

(R-32)

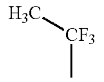

(R-33)

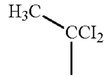

(R-34)

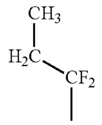

(R-35)

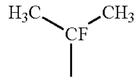

(R-36)

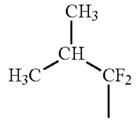

(R-37)

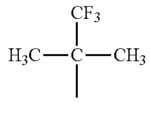

<Specific Examples of Iridium Complexes>

Specific examples of structures of the iridium complexes represented by General Formulae (G1) to (G8) are compounds represented by Structural Formulae (100) to (134). Note that the iridium complexes represented by General Formulae (G1) to (G8) are not limited the examples shown below.

(100)

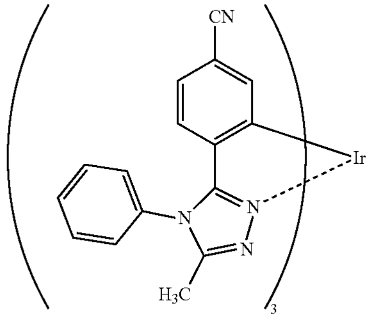

(101)

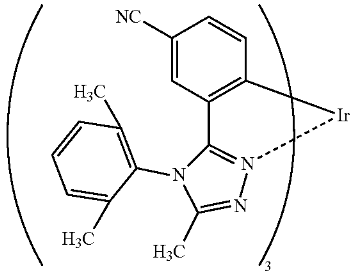

(102)

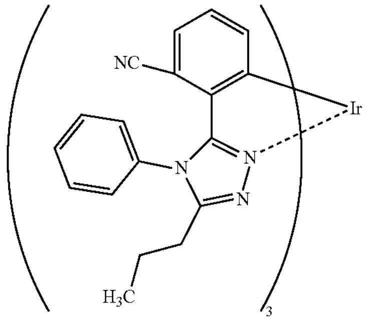

(103)

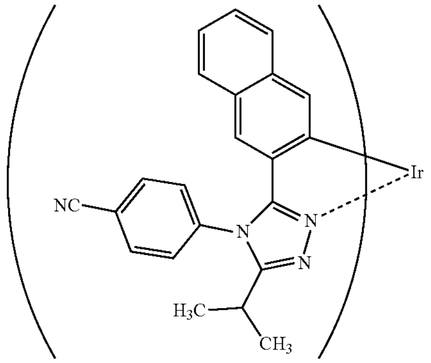

(104)

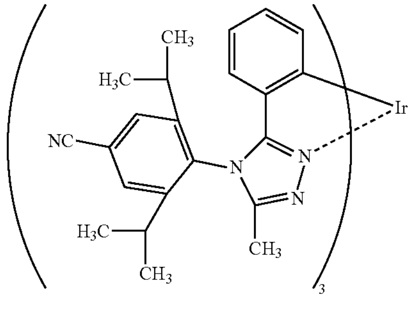

-continued
(105)
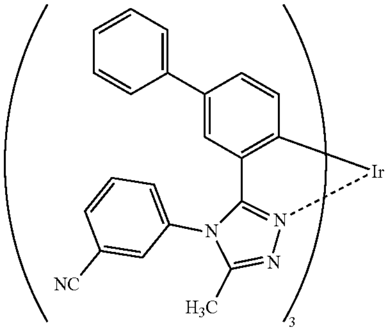
(106)
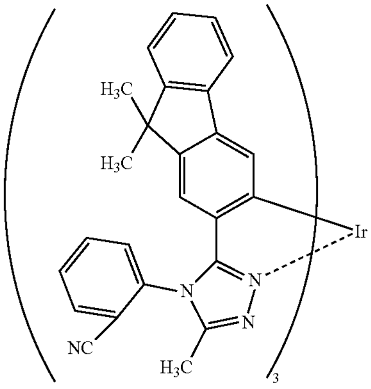
(107)
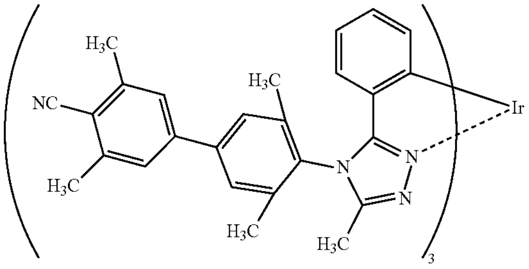
(108)
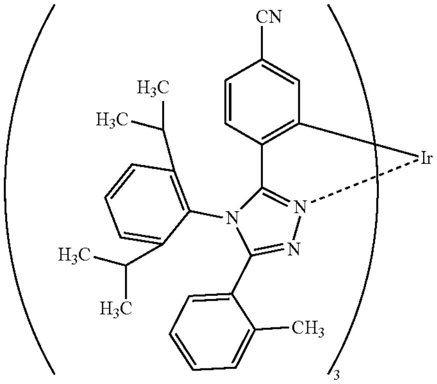
-continued
(109)
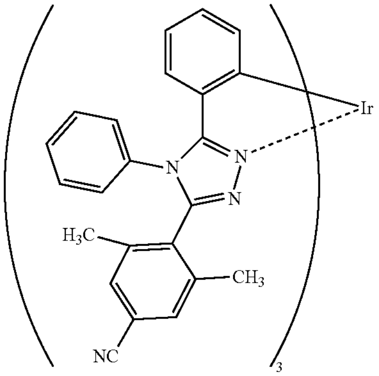
(110)
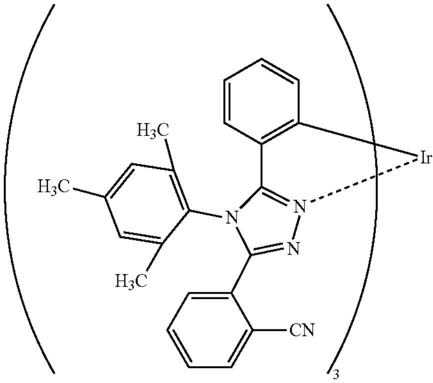
(111)
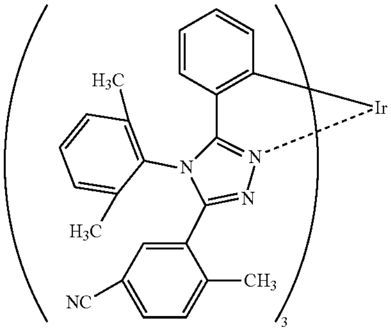
(112)
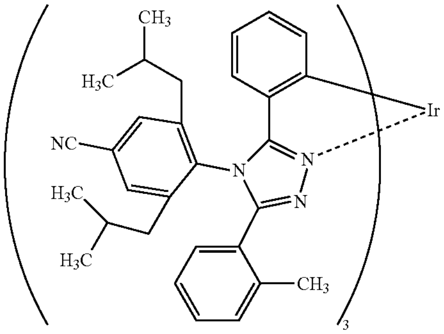

-continued
(113)
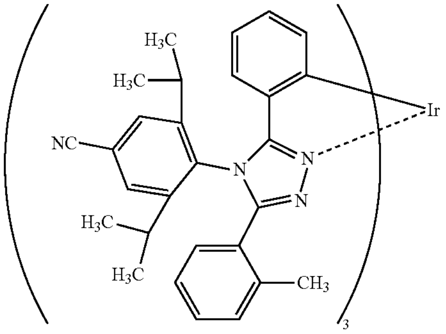
(114)
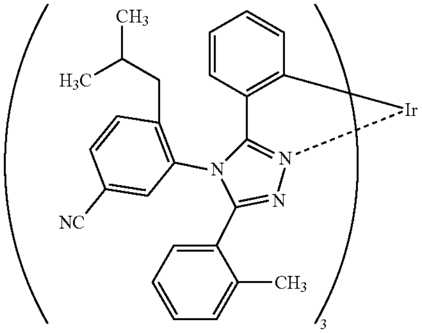
(115)
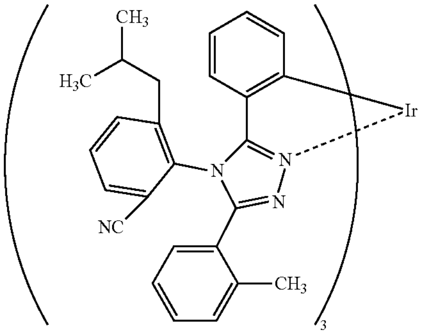
(116)
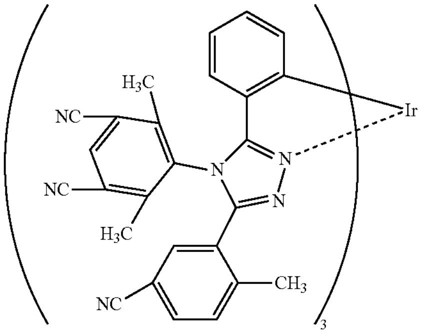
-continued
(117)
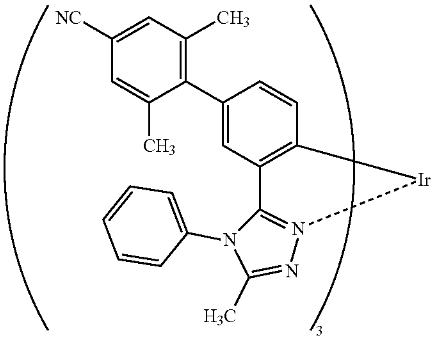
(118)
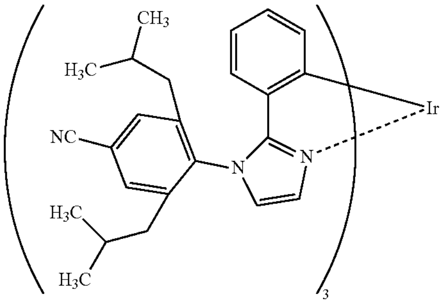
(119)
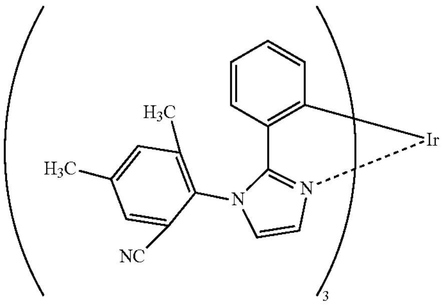
(120)
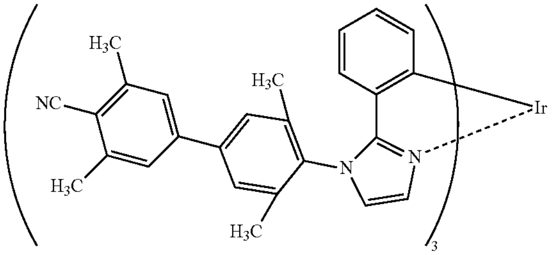
(121)
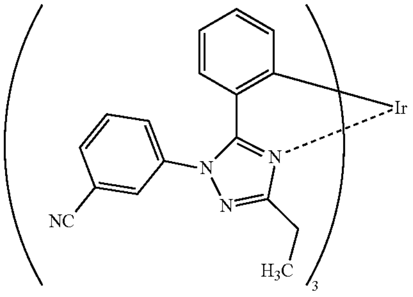

-continued
(122)
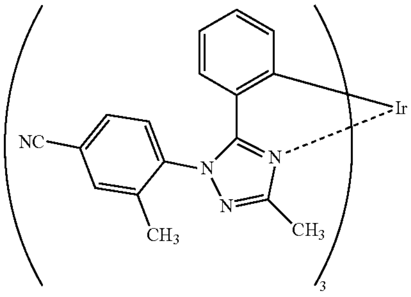
(123)
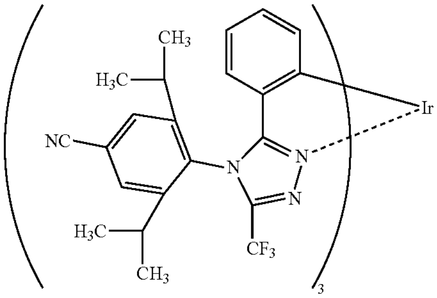
(124)
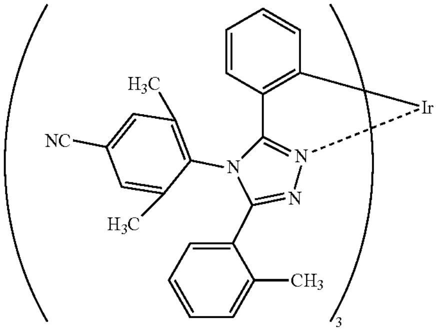
(125)
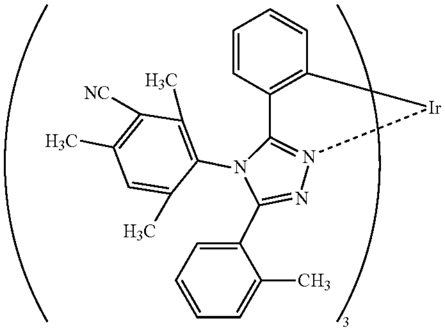
(126)
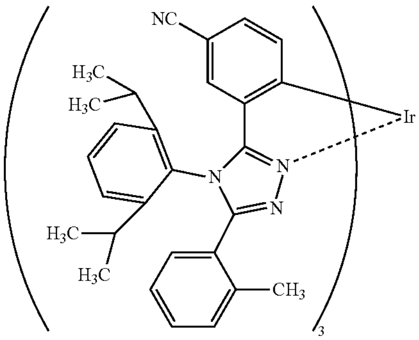
-continued
(127)
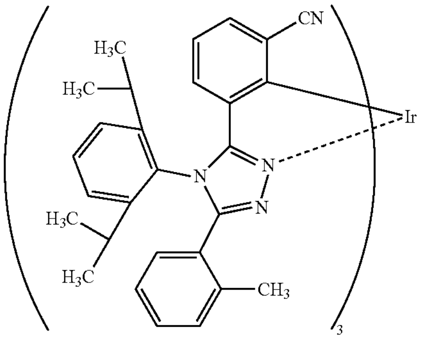
(128)
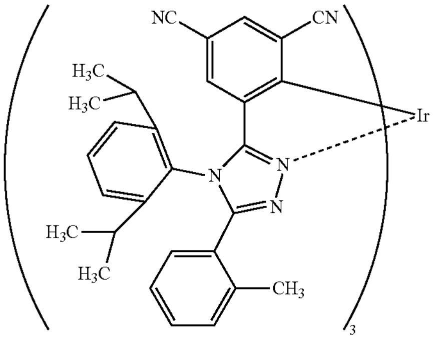
(129)
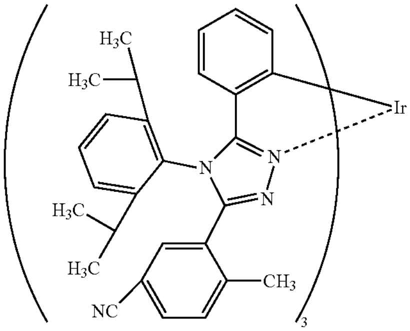
(130)
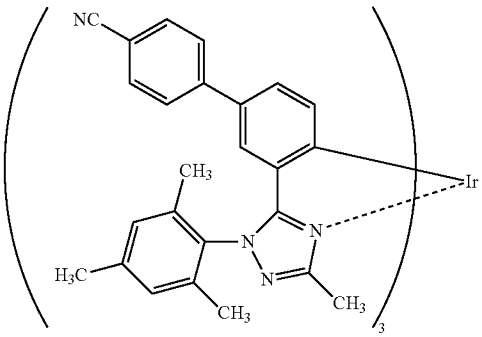

-continued (131)

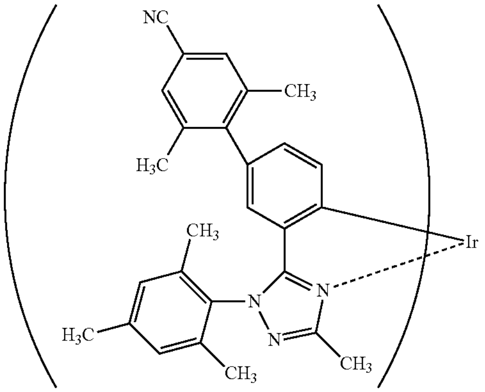

(132)

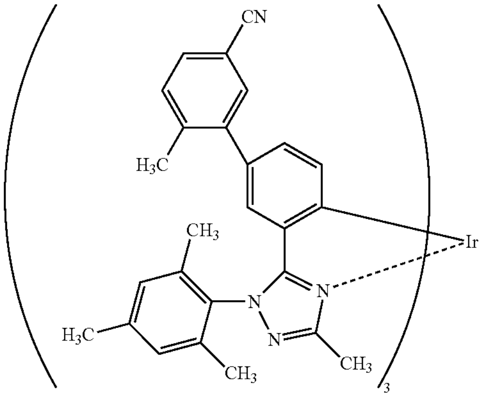

(133)

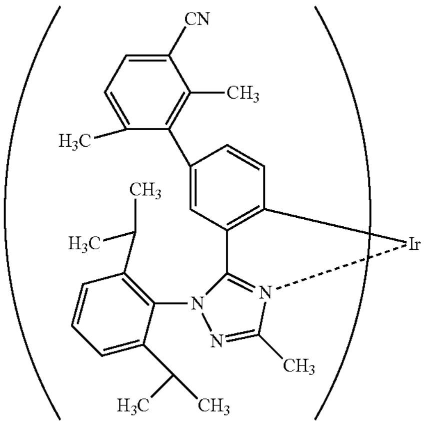

-continued (134)

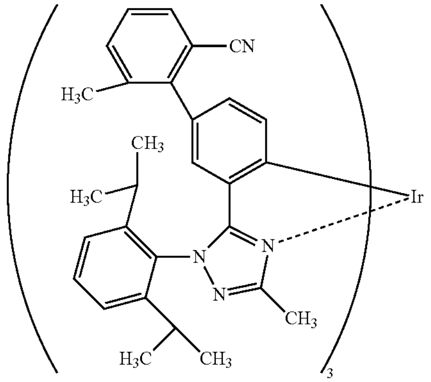

The iridium complex of one embodiment of the present invention has relatively low HOMO and LUMO levels as described above, and is accordingly preferred as a guest material of a light-emitting element. In that case, the light-emitting element can have high emission efficiency. In addition, the iridium complex of one embodiment of the present invention has a high triplet excitation energy level, and is accordingly preferred particularly as a guest material of a blue light-emitting element. In that case, the blue light-emitting element can have high emission efficiency. Moreover, since the iridium complex of one embodiment of the present invention is highly resistant to repetition of oxidation and reduction, a light-emitting element including the iridium complex can have a long driving lifetime. Therefore, the iridium complex of one embodiment of the present invention is a material suitably used in a light-emitting element.

Note that the iridium complex of one embodiment of the present invention can be deposited by an evaporation method (including a vacuum evaporation method), an ink-jet method, a coating method, a gravure printing method, or the like.

Note that the compound described in this embodiment can be used in combination with any of the structures described in the other embodiments as appropriate.

Embodiment 3

In this embodiment, an example of a method for synthesizing the iridium complexes with the structures represented by General Formulae (G1), (G3), (G4), and (G7) is described. For synthesizing the iridium complexes, a variety of reactions can be used. For example, the iridium complexes represented by General Formulae (G1), (G3), (G4), and (G7) can be synthesized by synthesis reactions described below. Note that the method of synthesizing the iridium complex of one embodiment of the present invention is not limited to the following synthesis methods.

<Method for Synthesizing Iridium Complex Represented by General Formula (G1)>

An example of a method for synthesizing the iridium complex with the structure represented by General Formula (G1) is described.

As shown in Synthesis Scheme (a) below, the iridium complex with the structure represented by General Formula (G1) can be obtained when a nitrogen-containing five-membered ring derivative represented by General Formula (G0) is mixed with an iridium metal compound containing a halogen (e.g., iridium chloride hydrate or ammonium hexachloroiridate) or an iridium organometallic complex compound (e.g., an acetylacetonato complex or a diethylsulfide complex) and then the mixture is heated. This heating process may be performed after the nitrogen-containing five-membered ring derivative represented by General Formula (G0) and the iridium metal compound containing a halogen or the iridium organometallic complex compound are dissolved in an alcohol-based solvent (e.g., glycerol, ethylene glycol, 2-methoxyethanol, or 2-ethoxyethanol).

(a)

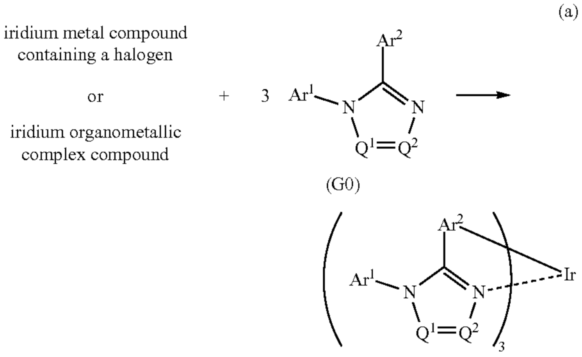

(G0)

(G1)

In Synthesis Scheme (a), each of $Ar^1$ and $Ar^2$ independently represents a substituted or unsubstituted aryl group having 6 to 13 carbon atoms. Each of $Q^1$ and $Q^2$ independently represents N or C—R, and R represents hydrogen, an alkyl group having 1 to 6 carbon atoms, a haloalkyl group having 1 to 6 carbon atoms, or a substituted or unsubstituted aryl group having 6 to 13 carbon atoms. At least one of $Q^1$ and $Q^2$ includes C—R. At least one of the aryl groups represented by $Ar^1$, $Ar^2$, and R includes a cyano group.

Note that the method for synthesizing the iridium complex with the structure represented by General Formula (G1) is not limited to Synthesis Scheme (a). As another example shown in Synthesis Scheme (a'), an iridium complex that includes a ligand in which a halogen group is bonded to at least one of the aryl groups represented by $Ar^3$ and $Ar^4$ reacts with an arylboronic acid compound to which a cyano group is bonded or copper cyanide, whereby the iridium complex with the structure represented by General Formula (G1) can be obtained. Note that an iridium complex that includes as a ligand a compound in which at least one of the aryl groups represented by $Ar^3$ and $Ar^4$ is a boronic acid, a boronic ester, or a cyclic-triolborate salt may react with halogenated aryl to which a cyano group is bonded.

(a')

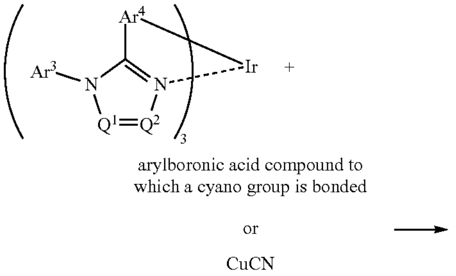

-continued

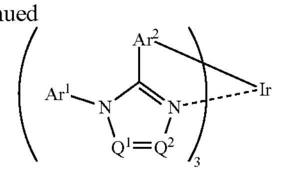

(G1)

In Synthesis Scheme (a'), each of $Ar^1$ and $Ar^2$ independently represents a substituted or unsubstituted aryl group having 6 to 13 carbon atoms. Each of $Q^1$ and $Q^2$ independently represents N or C—R, and R represents hydrogen, an alkyl group having 1 to 6 carbon atoms, a haloalkyl group having 1 to 6 carbon atoms, or a substituted or unsubstituted aryl group having 6 to 13 carbon atoms. At least one of $Q^1$ and $Q^2$ includes C—R. At least one of the aryl groups represented by $Ar^1$, $Ar^2$, and R includes a cyano group.

The iridium complex represented by General Formula (G1) can be synthesized as described above.

<Method for Synthesizing Iridium Complex Represented by General Formula (G3)>

Next, an example of a method for synthesizing the iridium complex with the structure represented by General Formula (G3) is described.

<<Method for Synthesizing 1,2,4-Triazole Derivative>>

First, an example of a method for synthesizing a 1,2,4-triazole derivative represented by General Formula (G0-X1) is described.

(G0-X1)

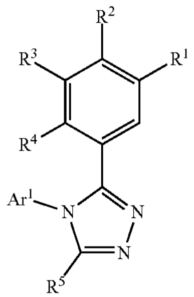

In General Formula (G0-X1), $Ar^1$ represents a substituted or unsubstituted aryl group having 6 to 13 carbon atoms; each of R to $R^4$ independently represents any of hydrogen, an alkyl group having 1 to 6 carbon atoms, a cycloalkyl group having 3 to 6 carbon atoms, a substituted or unsubstituted aryl group having 6 to 13 carbon atoms, and a cyano group; $R^5$ represents any of hydrogen, an alkyl group having 1 to 6 carbon atoms, a haloalkyl group having 1 to 6 carbon atoms, and a substituted or unsubstituted aryl group having 6 to 13 carbon atoms; and at least one of $R^1$ to $R^4$ and the aryl groups represented by $Ar^1$ and $R^1$ to $R^5$ includes a cyano group.

As shown in Synthesis Scheme (b), a hydrazide compound (A1) reacts with a thioether compound or an N-substituted thioamide compound (A2), whereby the 1,2,4-triazole derivative represented by General Formula (G0-X1) can be obtained. In Synthesis Scheme (b), $Ar^1$ represents a substituted or unsubstituted aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; $R^5$ represents any of hydrogen, an alkyl group having 1 to 6 carbon atoms, a haloalkyl group having 1 to 6 carbon atoms, and a substituted or unsubstituted aryl group having 6 to 13 carbon atoms; and at least one of $R^1$ to $R^4$ and the aryl groups represented by $Ar^1$ and $R^1$ to $R^5$ includes a cyano group.

(b)

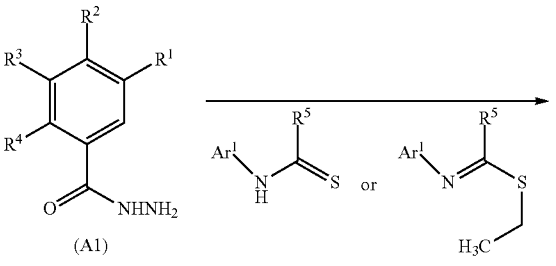

(A1) or (A2)

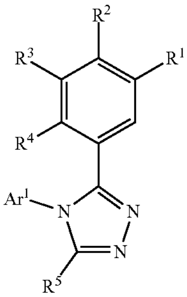

(G0-X1)

Note that the method for synthesizing the 1,2,4-triazole derivative represented by General Formula (G0-X1) is not limited to Synthesis Scheme (b). As an example of another synthesizing method, as shown in Synthesis Scheme (b'), there is a method in which a dihydrazide compound (A1') is reacted with a primary amine compound (A2'). In Synthesis Scheme (b'), $Ar^1$ represents a substituted or unsubstituted aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, a substituted or unsubstituted aryl group having 6 to 13 carbon atoms, and a cyano group; $R^5$ represents any of hydrogen, an alkyl group having 1 to 6 carbon atoms, a haloalkyl group having 1 to 6 carbon atoms, and a substituted or unsubstituted aryl group having 6 to 13 carbon atoms; and at least one of $R^1$ to $R^4$ and the aryl groups represented by $Ar^1$ and $R^1$ to $R^5$ includes a cyano group.

(b')

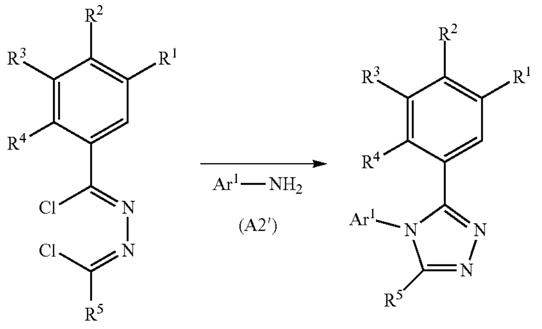

(A1') (A2') (G0-X1)

As described above, the 1,2,4-triazole derivative represented by General Formula (G0-X1) can be synthesized by a simple synthesis scheme.

Then, by a synthesizing method similar to that of Synthesis Scheme (a), the iridium complex with the structure represented by General Formula (G3) can be obtained when the 1,2,4-triazole derivative represented by General Formula (G0-X1) is mixed with an iridium metal compound containing a halogen (e.g., iridium chloride hydrate or ammonium hexachloroiridate) or an iridium organometallic complex compound (e.g., an acetylacetonato complex or a diethylsulfide complex) and then the mixture is heated.

The iridium complex represented by General Formula (G3) can be synthesized as described above.

In one embodiment of the present invention, in order to obtain an ortho-metalated complex including the 1,2,4-triazole derivative as a ligand, which is the iridium complex represented by General Formula (G3), a substituent may be bonded to the 5-position (i.e., $R^5$) of the 1,2,4-triazole derivative represented by General Formula (G0-X1). In particular, an alkyl group having 1 to 6 carbon atoms, a haloalkyl group having 1 to 6 carbon atoms, or a substituted or unsubstituted aryl group having 6 to 13 carbon atoms is preferably used as $R^5$, in which case the yield in Synthesis Scheme (a) can be increased as compared with the case where hydrogen is used as $R^5$.

<Method for Synthesizing Iridium Complex Represented by General Formula (G4)>

Next, an example of a method for synthesizing the iridium complex with the structure represented by General Formula (G4) is described.

<<Method for Synthesizing Imidazole Derivative>>

First, an example of a method for synthesizing an imidazole derivative represented by General Formula (G0-X2) is described.

(G0-X2)

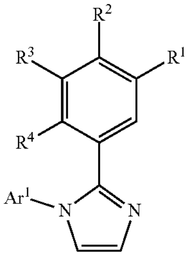

In General Formula (G0-X2), $Ar^1$ represents a substituted or unsubstituted aryl group having 6 to 13 carbon atoms; each of R to $R^4$ independently represents any of hydrogen, an alkyl group having 1 to 6 carbon atoms, a cycloalkyl group having 3 to 6 carbon atoms, and at least one of $R^1$ to $R^4$ and the aryl groups represented by $Ar^1$ and $R^1$ to $R^4$ and includes a cyano group.

As shown in Synthesis Scheme (c), first, an N-(2-chloroethyl)benzamide compound (B1) reacts with a chloro agent, and then reacts with a primary amine compound (B2), whereby an intermediate (B3) can be obtained. Examples of the chloro agent include phosphorus pentachloride and phosphoryl chloride. Then, the intermediate (B3) reacts with a dehydrogenation agent, whereby an imidazole derivative represented by General Formula (G0-X2) can be obtained. Examples of the dehydrogenation agent include potassium permanganate and a benzoquinone derivative. In Synthesis Scheme (c), $Ar^1$ represents a substituted or unsubstituted aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; and at least one of $R^1$ to $R^4$ and the aryl groups represented by $Ar^1$ and $R^1$ to $R^4$ includes a cyano group.

(c)

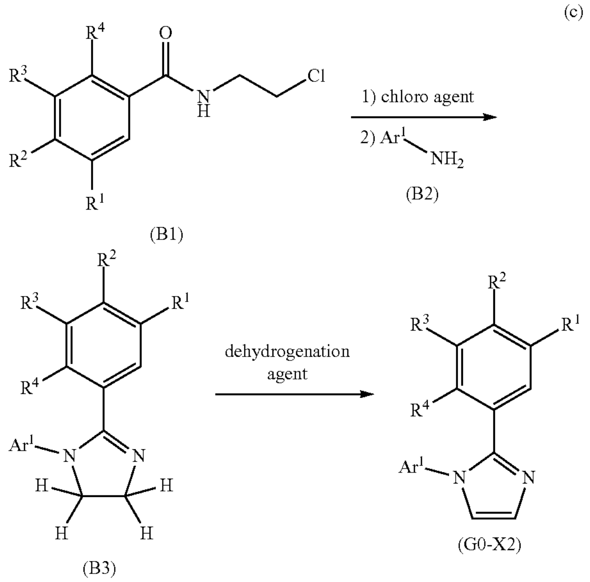

(B1) (B2) (B3) (G0-X2)

Note that the method for synthesizing the imidazole derivative represented by General Formula (G0-X2) is not limited to Synthesis Scheme (c). As another example shown in Synthesis Scheme (c'), first, a thioether compound or an imino chloride compound (B1') reacts with aminoacetaldehyde dimethyl acetal, and then an inorganic acid is added thereto. Examples of the inorganic acid include a phosphoric acid and a hydrochloric acid. In Synthesis Scheme (c'), $Ar^1$ represents a substituted or unsubstituted aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; and at least one of $R^1$ to $R^4$ and the aryl groups represented by $Ar^1$ and $R^1$ to $R^4$ includes a cyano group.

(c')

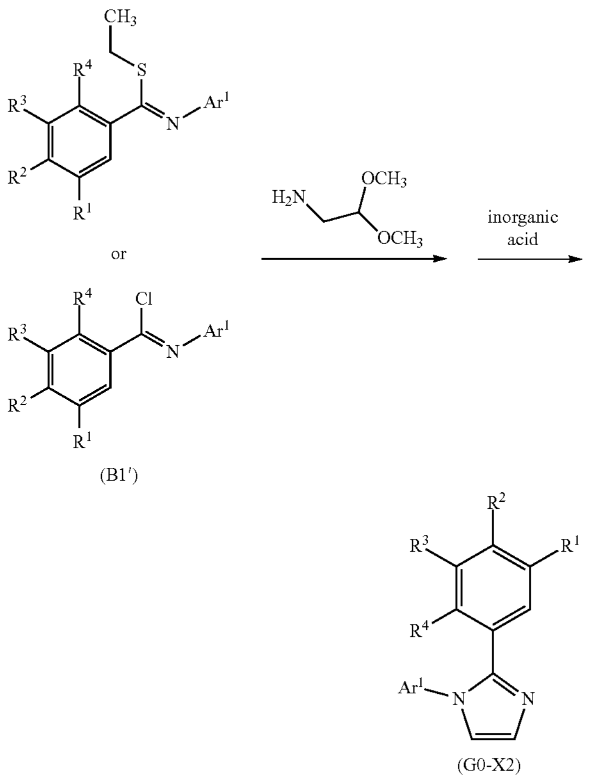

(B1') (G0-X2)

Next, an example of synthesizing an imidazole derivative represented by General Formula (G0-X3) is described.

(G0-X3)

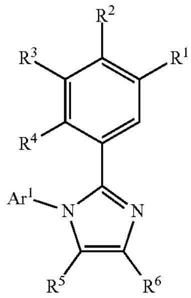

In General Formula (G0-X3), $Ar^1$ represents a substituted or unsubstituted aryl group having 6 to 13 carbon atoms; each of R to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms; and at least one of $R^1$ to $R^6$ and the aryl groups represented by $Ar^1$ and $R^1$ to $R^6$ includes a cyano group.

As shown in Synthesis Scheme (c''), a β-diketone compound (B1''), the primary amine compound (B2), and a benzaldehyde compound (B3'') are mixed to be reacted. In Synthesis Scheme (c''), $Ar^1$ represents a substituted or unsubstituted aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; each of $R^5$ and $R^6$ independently represents any of hydrogen, an alkyl group having 1 to 6 carbon atoms, a haloalkyl group having 1 to 6 carbon atoms, and a substituted or unsubstituted aryl group having 6 to 13 carbon atoms; and at least one of $R^1$ to $R^4$ and the aryl groups represented by $Ar^1$ and $R^1$ to $R^4$ includes a cyano group.

(c″)

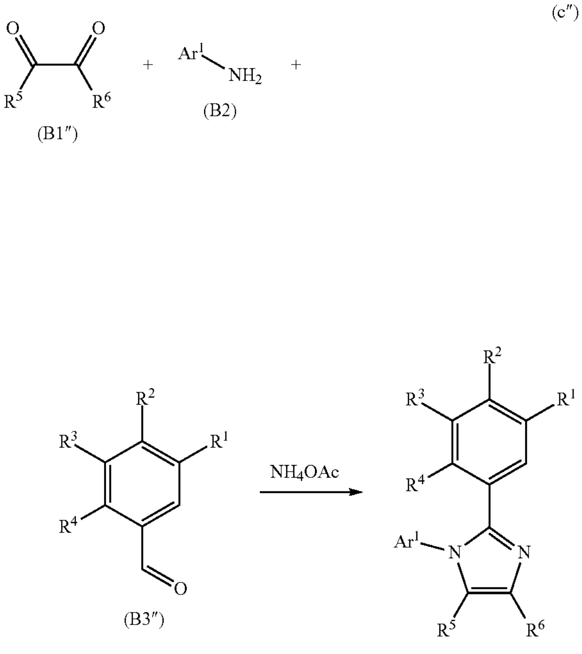

(B1″) (B2) (B3″) (G0-X3)

As described above, the imidazole derivative represented by General Formula (G0-X3) can be synthesized by a simple synthesis scheme.

Then, by a synthesizing method similar to that of Synthesis Scheme (a), the iridium complex with the structure represented by General Formula (G4) can be obtained when the imidazole derivative represented by General Formula (G0-X3) is mixed with an iridium metal compound containing a halogen (e.g., iridium chloride hydrate or ammonium hexachloroiridate) or an iridium organometallic complex compound (e.g., an acetylacetonato complex or a diethylsulfide complex) and then the mixture is heated.

The iridium complex represented by General Formula (G4) can be synthesized as described above.

<Method for Synthesizing Iridium Complex Represented by General Formula (G7)>

Next, an example of a method for synthesizing the iridium complex with the structure represented by General Formula (G7) is described.

<<Method for Synthesizing 1H-1,2,4-Triazole Derivative>>

First, an example of a method for synthesizing a 1H-1,2,4-triazole derivative represented by General Formula (G0-X4) is described.

(G0-X4)

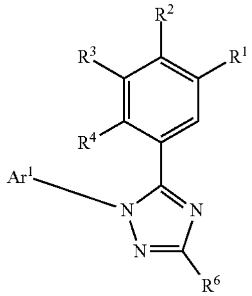

In General Formula (G0-X4), $Ar^1$ represents a substituted or unsubstituted aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; $R^6$ represents any of hydrogen, an alkyl group having 1 to 6 carbon atoms, a haloalkyl group having 1 to 6 carbon atoms, and a substituted or unsubstituted aryl group having 6 to 13 carbon atoms; and at least one of $R^1$ to $R^4$ and the aryl groups represented by $Ar^1$, $R^1$ to $R^4$, and $R^6$ includes a cyano group.

As shown in Synthesis Scheme (d), an acylamidine compound (C1) reacts with a hydrazine compound (C2), whereby the 1H-1,2,4-triazole derivative can be obtained. Note that Z in the formula represents a group (a leaving group) that is detached through a ring closure reaction, such as an alkoxy group, an alkylthio group, an amino group, or a cyano group. In Synthesis Scheme (d), $Ar^1$ represents a substituted or unsubstituted aryl group having 6 to 13 carbon atoms; each of $R^1$ to $R^4$ independently represents any of hydrogen, an alkyl group having 1 to 6 carbon atoms, a cycloalkyl group having 3 to 6 carbon atoms, and a substituted or unsubstituted aryl group having 6 to 13 carbon atoms; $R^6$ represents any of hydrogen, an alkyl group having 1 to 6 carbon atoms, a haloalkyl group having 1 to 6 carbon atoms, and a substituted or unsubstituted aryl group having 6 to 13 carbon atoms; and at least one of $R^1$ to $R^4$ and the aryl groups represented by $Ar^1$, $R^1$ to $R^4$, and $R^6$ includes a cyano group.

(d)

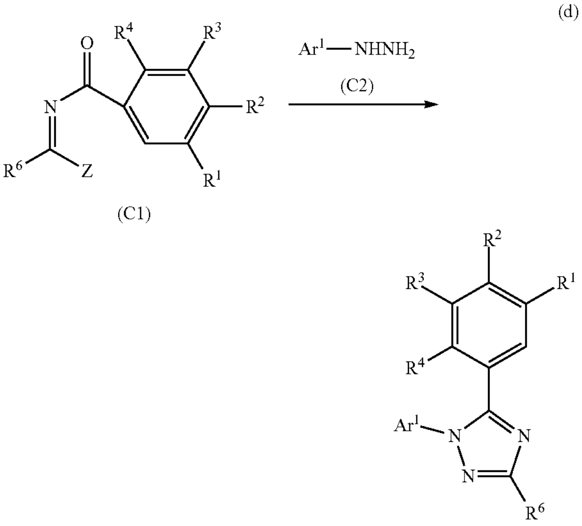

(C1) (G0-X4)

Note that the method for synthesizing the 1H-1,2,4-triazole derivative is not limited to Synthesis Scheme (d). As described above, the 1H-1,2,4-triazole derivative represented by General Formula (G0-X4) can be synthesized by a simple synthesis scheme.

Then, by a synthesizing method similar to that of Synthesis Scheme (a), the iridium complex with the structure represented by General Formula (G7) can be obtained when the 1H-1,2,4-triazole derivative represented by General Formula (G0-X4) is mixed with an iridium metal compound containing a halogen (e.g., iridium chloride hydrate or ammonium hexachloroiridate) or an iridium organometallic complex compound (e.g., an acetylacetonato complex or a diethylsulfide complex) and then the mixture is heated.

Note that the compound described in this embodiment can be used in combination with any of the structures described in the other embodiments as appropriate.

Embodiment 4

In this embodiment, a structure example of a light-emitting element including the iridium complex described in Embodiment 2 is described below with reference to FIGS. 3A and 3B.

<Structure Example of Light-Emitting Element>

Figure 3A:
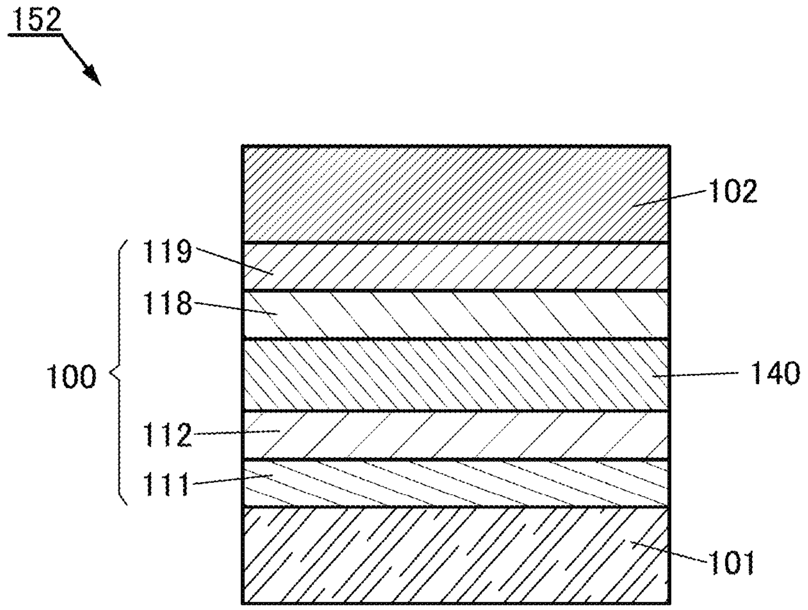
FIGS. 3A and 3B are schematic cross-sectional views of a light-emitting element of one embodiment of the present invention.

FIG. 3A is a schematic cross-sectional view of a light-emitting element 152 of one embodiment of the present invention.

The light-emitting element 152 includes the EL layer 100 between a pair of electrodes, and a layer in the EL layer 100 includes the iridium complex described in Embodiment 2.

The EL layer 100 includes at least a light-emitting layer 140. The EL layer 100 can include the hole-injection layer 111, the hole-transport layer 112, the electron-transport layer 118, and the electron-injection layer 119 which are described in Embodiment 1, in addition to the light-emitting layer 140. The stacked layer structure of the EL layer 100 is not limited thereto.

The materials described in Embodiment 1 can be used for the pair of electrodes (the electrodes 101 and 102), the hole-injection layer 111, the hole-transport layer 112, the electron-transport layer 118, and the electron-injection layer 119 in this embodiment.

Figure 3B:
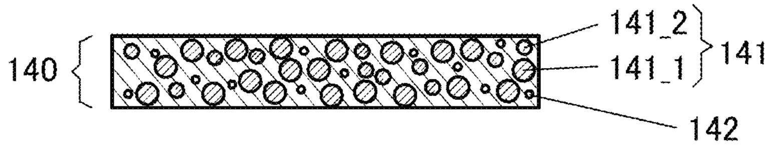

FIG. 3B is a schematic cross-sectional view illustrating an example of the light-emitting layer 140 included in the light-emitting element 152. The light-emitting layer 140 includes a host material 141 and a guest material 142. The materials for the host material 131 described in Embodiment 1 can be used for the host material 141. That is, the organic compound 131_1 and the organic compound 131_2 described in Embodiment 1 can be respectively used as the organic compound 141_1 and the organic compound 1412 included in the host material 141.

The iridium complex described in Embodiment 2 has relatively low HOMO and LUMO levels and thus is suitably used as a guest material of a light-emitting element of one embodiment of the present invention. Thus, with the use of the iridium complex described in Embodiment 2 as the guest material 142 in the light-emitting element 152, a light-emitting element with high emission efficiency can be fabricated. Moreover, since the iridium complex has a high triplet excitation energy level, a blue light-emitting element with high emission efficiency can be fabricated. Thus, the structure of this embodiment can provide a light-emitting element with high emission efficiency and an emission spectrum peak in the blue wavelength range. The iridium complex, which is highly resistant to repetition of oxidation and reduction, can provide a light-emitting element having a long driving lifetime.

Like the light emission mechanism shown in FIGS. 2A and 2B, it is preferable that the HOMO level of the guest material 142 be lower than that of the organic compound 141_2 and the LUMO level of the guest material 142 be higher than that of the organic compound 141_1. The iridium complex described in Embodiment 2 has relatively low HOMO and LUMO levels and can be suitably used as the guest material with the above-mentioned structure. Materials for the organic compound 141_1, the organic compound 141_2, and the guest material 142 are selected such that an energy difference between the LUMO and HOMO levels of the guest material 142 is larger than an energy difference between the LUMO level of the organic compound 141_1 and the HOMO level of the organic compound 141_2. It is preferable to use the iridium complex described in Embodiment 2 as the guest material 142. With such a structure, formation of an exciplex by the guest material 142 and the organic compound 141_1 or the organic compound 141_2 can be inhibited, whereby a light-emitting element with high emission efficiency can be fabricated.

The iridium complex described in Embodiment 2 has a function of converting triplet excitation energy into light emission. For this reason, the iridium complex can emit light with energy smaller than the energy difference between the LUMO level and the HOMO level. Accordingly, even in the case where the energy difference between the LUMO level and the HOMO level of the iridium complex is larger than the energy difference between the LUMO level of the organic compound 141_1 and the HOMO level of the organic compound 1412, as long as light emission energy or absorption energy of the iridium complex is smaller than an energy difference between the LUMO level of the organic compound 141_1 and the HOMO level of the organic compound 1412, excitation energy transfer from an exciplex formed by the organic compound 141_1 and the organic compound 141_2 to the iridium complex is possible and light emission can be obtained from the iridium complex.

It is preferable that the oxidation potential of the guest material 142 be higher than that of the organic compound 1412, and that the reduction potential of the guest material 142 be lower than that of the organic compound 141_1. The iridium complex described in Embodiment 2 has relatively high oxidation and reduction potentials and can be suitably used as the guest material with the above-mentioned structure. With such a structure, formation of an exciplex by the guest material 142 and the organic compound 141_1 or the organic compound 1412 can be inhibited, whereby a light-emitting element with high emission efficiency can be fabricated. Note that the oxidation potential and the reduction potential can be measured by cyclic voltammetry (CV).

The light-emitting layer 140 can have a structure in which two or more layers are stacked. For example, in the case where the light-emitting layer 140 is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. A light-emitting material included in the first light-emitting layer may be the same as or different from a light-emitting material included in the second light-emitting layer. In addition, the materials may have functions of emitting light of the same color or light of different colors. Two kinds of light-emitting materials having functions of emitting light of different colors are used for the two light-emitting layers, so that light of a plurality of emission colors can be obtained at the same time. It is particularly preferable to select light-emitting materials of the light-emitting layers so that white light can be obtained by combining light emission from the two light-emitting layers.

The light-emitting layer 140 may include a material other than the host material 141 and the guest material 142.

Note that the light-emitting layer 140 can be formed by an evaporation method (including a vacuum evaporation method), an inkjet method, a coating method, gravure printing, or the like. Besides the above-mentioned materials, an inorganic compound such as a quantum dot or a high molecular compound (e.g., an oligomer, a dendrimer, and a polymer) may be used.

For the other structures of the light-emitting element 152 described in this embodiment, the structures of the light-emitting element 150 described in Embodiment 1 can be referred to.

The structure described in this embodiment can be used in combination with any of the structures described in the other embodiments as appropriate.

Embodiment 5

Figure 4:
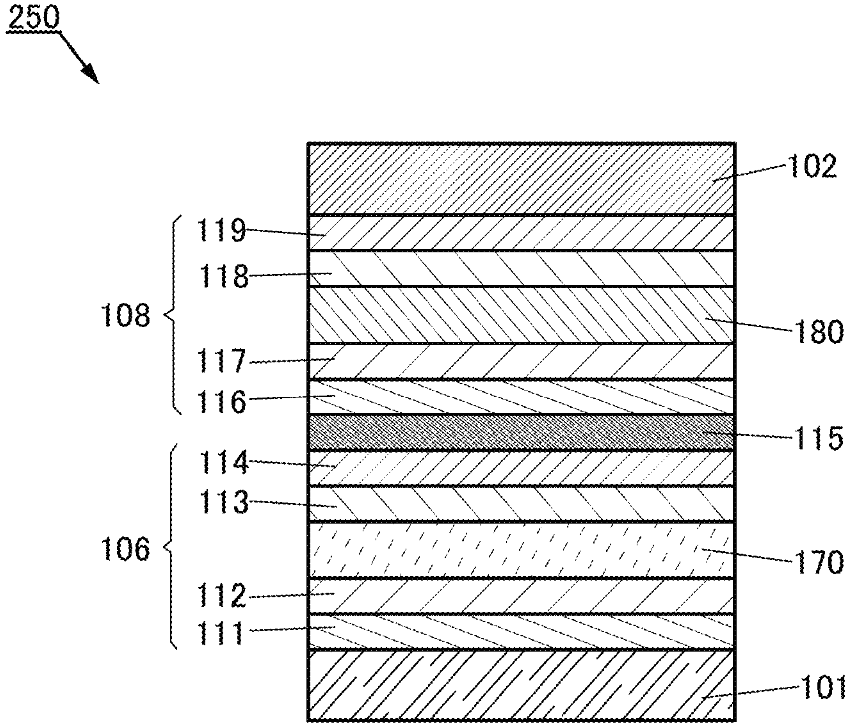
FIG. 4 is a schematic cross-sectional view of a light-emitting element of one embodiment of the present invention.

In this embodiment, a light-emitting element having a structure different from that described in Embodiments 1 and 4 is described below with reference to FIG. 4. In FIG. 4, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

FIG. 4 is a schematic cross-sectional view of a light-emitting element 250.

The light-emitting element 250 illustrated in FIG. 4 includes a plurality of light-emitting units (a light-emitting unit 106 and a light-emitting unit 108 in FIG. 4) between a pair of electrodes (the electrode 101 and the electrode 102). One of light-emitting units preferably has the same structure as the EL layer 100 illustrated in FIGS. 1A and 1B or FIGS. 3A and 3B. That is, it is preferable that each of the light-emitting element 150 in FIGS. 1A and 1B and the light-emitting element 152 in FIGS. 3A and 3B include one light-emitting unit, while the light-emitting element 250 include a plurality of light-emitting units. Note that the electrode 101 functions as an anode and the electrode 102 functions as a cathode in the following description of the light-emitting element 250; however, the functions may be interchanged in the light-emitting element 250.

In the light-emitting element 250 illustrated in FIG. 4, the light-emitting unit 106 and the light-emitting unit 108 are stacked, and a charge-generation layer 115 is provided between the light-emitting unit 106 and the light-emitting unit 108. Note that the light-emitting unit 106 and the light-emitting unit 108 may have the same structure or different structures. For example, it is preferable that the EL layer 100 illustrated in FIGS. 1A and 1B or FIGS. 3A and 3B be used in the light-emitting unit 108.

The light-emitting element 250 includes a light-emitting layer 170 and a light-emitting layer 180. The light-emitting unit 106 includes the hole-injection layer 111, the hole-transport layer 112, an electron-transport layer 113, and an electron-injection layer 114 in addition to the light-emitting layer 170. The light-emitting unit 108 includes a hole-injection layer 116, a hole-transport layer 117, an electron-transport layer 118, and an electron-injection layer 119 in addition to the light-emitting layer 180.

The charge-generation layer 115 may have either a structure in which an acceptor substance that is an electron acceptor is added to a hole-transport material or a structure in which a donor substance that is an electron donor is added to an electron-transport material. Alternatively, both of these structures may be stacked.

In the case where the charge-generation layer 115 contains a composite material of an organic compound and an acceptor substance, the composite material that can be used for the hole-injection layer 111 described in Embodiment 1 may be used for the composite material. As the organic compound, a variety of compounds such as an aromatic amine compound, a carbazole compound, an aromatic hydrocarbon, and a high molecular compound (such as an oligomer, a dendrimer, or a polymer) can be used. An organic compound having a hole mobility of $1\times10^{-6}$ $cm^2/Vs$ or higher is preferably used as the organic compound. Note that any other material may be used as long as it has a property of transporting more holes than electrons. Since the composite material of an organic compound and an acceptor substance has excellent carrier-injection and carrier-transport properties, low-voltage driving or low-current driving can be realized. Note that when a surface of a light-emitting unit on the anode side is in contact with the charge-generation layer 115 like the light-emitting unit 108, the charge-generation layer 115 can also serve as a hole-injection layer or a hole-transport layer of the light-emitting unit; thus, a hole-injection layer or a hole-transport layer need not be included in the light-emitting unit.

The charge-generation layer 115 may have a stacked structure of a layer containing the composite material of an organic compound and an acceptor substance and a layer containing another material. For example, the charge-generation layer 115 may be formed using a combination of a layer containing the composite material of an organic compound and an acceptor substance with a layer containing one compound selected from among electron-donating materials and a compound having a high electron-transport property. Furthermore, the charge-generation layer 115 may be formed using a combination of a layer containing the composite material of an organic compound and an acceptor substance with a layer containing a transparent conductive material.

The charge-generation layer 115 provided between the light-emitting unit 106 and the light-emitting unit 108 may have any structure as long as electrons can be injected to the light-emitting unit on one side and holes can be injected into the light-emitting unit on the other side when a voltage is applied between the electrode 101 and the electrode 102. For example, in FIG. 4, the charge-generation layer 115 injects electrons into the light-emitting unit 106 and holes into the light-emitting unit 108 when a voltage is applied such that the potential of the electrode 101 is higher than that of the electrode 102.

Note that in terms of light extraction efficiency, the charge-generation layer 115 preferably has a visible light transmittance (specifically, a visible light transmittance of higher than or equal to 40%). The charge-generation layer 115 functions even if it has lower conductivity than the pair of electrodes (the electrodes 101 and 102).

Note that forming the charge-generation layer 115 by using any of the above materials can suppress an increase in drive voltage caused by the stack of the light-emitting layers.

The light-emitting element having two light-emitting units has been described with reference to FIG. 4; however, a similar structure can be applied to a light-emitting element in which three or more light-emitting units are stacked. With a plurality of light-emitting units partitioned by the charge-generation layer between a pair of electrodes as in the light-emitting element 250, it is possible to provide a light-emitting element which can emit light with high luminance with the current density kept low and has a long lifetime. A light-emitting element with low power consumption can be provided.

When the structures described in Embodiments 1 and 4 is used for at least one of the plurality of units, a light-emitting element with high emission efficiency can be provided.

Note that in each of the above-described structures, the guest materials (light-emitting materials) used in the light-emitting unit 106 and the light-emitting unit 108 may be the same or different. In the case where the same guest materials emitting light of the same color are used for the light-emitting unit 106 and the light-emitting unit 108, the light-emitting element 250 can exhibit high emission luminance at a small current value, which is preferable. In the case where guest materials emitting light of different colors are used for the light-emitting unit 106 and the light-emitting unit 108, the light-emitting element 250 can exhibit multi-color light emission, which is preferable. In that case, when a plurality of light-emitting substances with different emission wavelengths are used in one or both of the light-emitting layers 170 and 180, lights with different emission peaks synthesize light emission from the light-emitting element 250. That is, the emission spectrum of the light-emitting element 250 has at least two peaks.

The above structure is also suitable for obtaining white light emission. When the light-emitting layer 170 and the light-emitting layer 180 emit light of complementary colors, white light emission can be obtained. It is particularly favorable to select the guest materials so that white light emission with high color rendering properties or light emission of at least red, green, and blue can be obtained.

One or both of the light-emitting layers 170 and 180 may be divided into layers and each of the divided layers may contain a different light-emitting material. That is, one or both of the light-emitting layers 170 and 180 may consist of two or more layers. For example, in the case where the light-emitting layer is formed by stacking a first light-emitting layer and a second light-emitting layer in this order from the hole-transport layer side, the first light-emitting layer is formed using a substance having a hole-transport property as the host material and the second light-emitting layer is formed using a substance having an electron-transport property as the host material. In that case, a light-emitting material included in the first light-emitting layer may be the same as or different from a light-emitting material included in the second light-emitting layer. In addition, the materials may have functions of emitting light of the same color or light of different colors. White light emission with a high color rendering property that is formed of three primary colors or four or more colors can be obtained by using a plurality of light-emitting materials emitting light of different colors.

As a material that can be used in the light-emitting layers 170 and 180, a material that can be used in the light-emitting layer 130 in Embodiment 1 or the light-emitting layer 140 in Embodiment 4 may be used. The iridium complex described in Embodiment 2 is preferably used as the guest material. Thus, a light-emitting element with high emission efficiency can be fabricated.

Note that the light-emitting units 106 and 108 and the charge-generation layer 115 can be formed by an evaporation method (including a vacuum evaporation method), an ink-jet method, a coating method, gravure printing, or the like.

The structure described in this embodiment can be used in combination with any of the structures described in the other embodiments as appropriate.

Embodiment 6

In this embodiment, examples of light-emitting elements having structures different from those described in Embodiments 1, 4, and 5 are described below with reference to FIGS. 5A and 5B, FIGS. 6A and 6B, FIGS. 7A to 7C, and FIGS. 8A to 8C.

<Structure Example 1 of Light-Emitting Element>

Figure 5A:
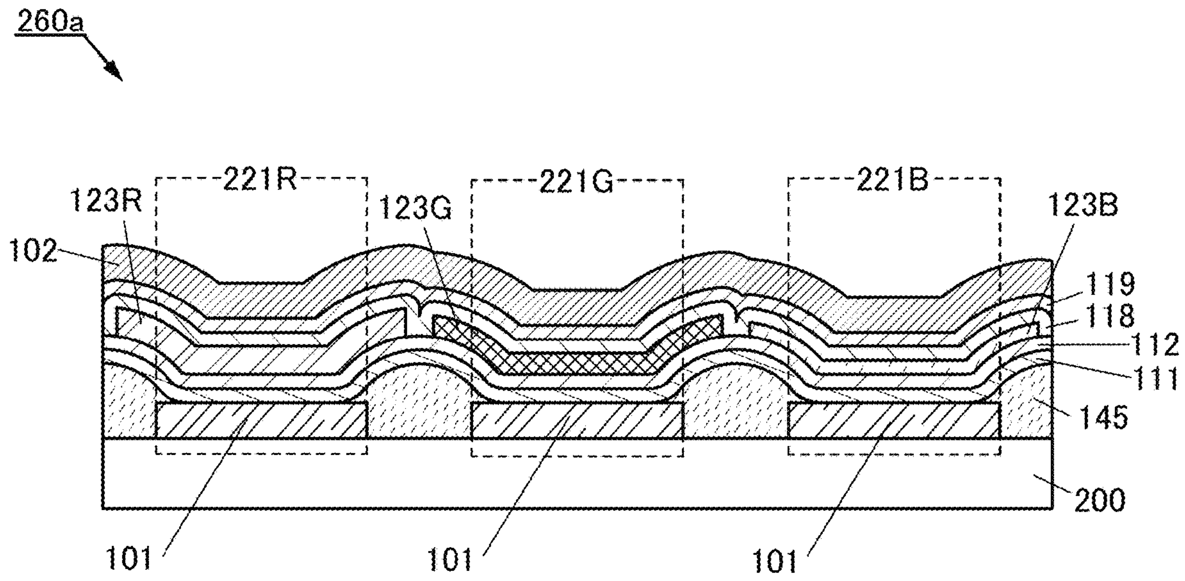
FIGS. 5A and 5B are each a schematic cross-sectional view of a light-emitting element of one embodiment of the present invention.
Figure 5B:
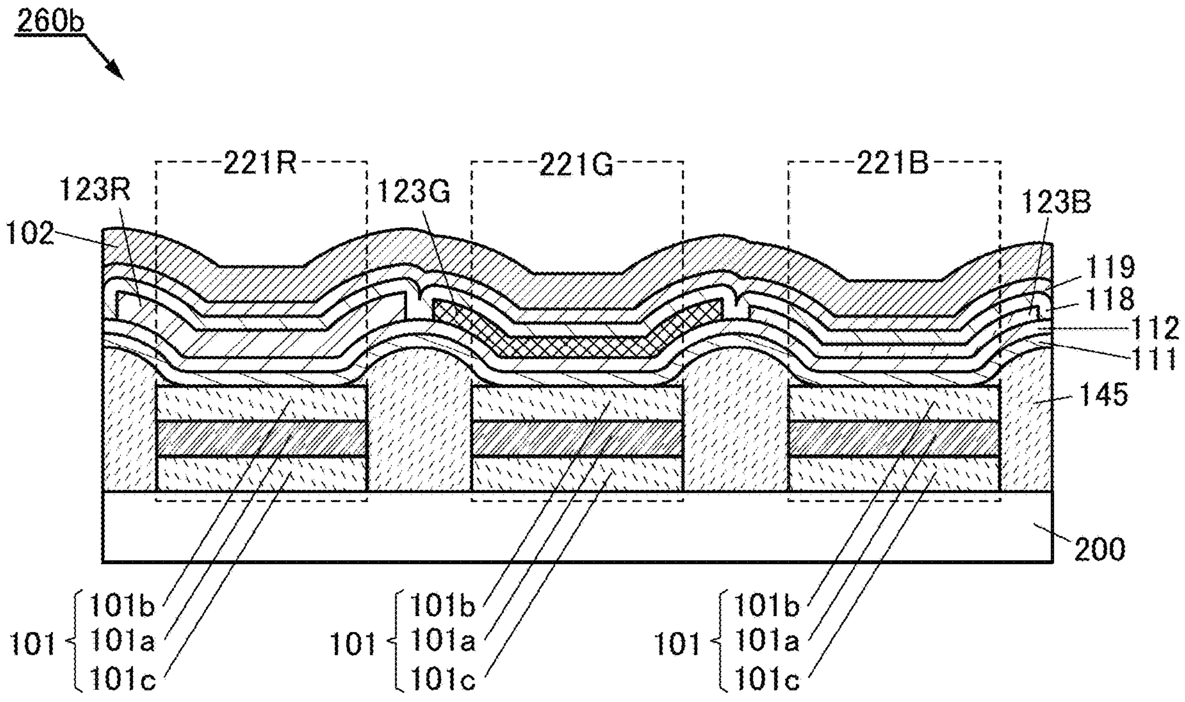

FIGS. 5A and 5B are cross-sectional views each illustrating a light-emitting element of one embodiment of the present invention. In FIGS. 5A and 5B, a portion having a function similar to that in FIG. 1A is represented by the same hatch pattern as in FIG. 1A and not especially denoted by a reference numeral in some cases. In addition, common reference numerals are used for portions having similar functions, and a detailed description of the portions is omitted in some cases.

Light-emitting elements 260*a* and 260*b* in FIGS. 5A and 5B may have a bottom-emission structure in which light is extracted through the substrate 200 or may have a top-emission structure in which light emitted from the light-emitting element is extracted in the direction opposite to the substrate 200. However, one embodiment of the present invention is not limited to this structure, and a light-emitting element having a dual-emission structure in which light emitted from the light-emitting element is extracted in both top and bottom directions of the substrate 200 may be used.

In the case where the light-emitting elements 260*a* and 260*b* each have a bottom emission structure, the electrode 101 preferably has a function of transmitting light and the electrode 102 preferably has a function of reflecting light. Alternatively, in the case where the light-emitting elements 260*a* and 260*b* each have a top emission structure, the electrode 101 preferably has a function of reflecting light and the electrode 102 preferably has a function of transmitting light.

The light-emitting elements 260*a* and 260*b* each include the electrode 101 and the electrode 102 over the substrate 200. Between the electrodes 101 and 102, a light-emitting layer 123B, a light-emitting layer 123G, and a light-emitting layer 123R are provided. The hole-injection layer 111, the hole-transport layer 112, the electron-transport layer 118, and the electron-injection layer 119 are also provided.

The light-emitting element 260*b* includes, as part of the electrode 101, a conductive layer 101*a*, a conductive layer 101*b* over the conductive layer 101*a*, and a conductive layer 101*c* under the conductive layer 101*a*. In other words, the light-emitting element 260*b* includes the electrode 101 having a structure in which the conductive layer 101*a* is sandwiched between the conductive layer 101*b* and the conductive layer 101*c*.

In the light-emitting element 260*b*, the conductive layer 101*b* and the conductive layer 101*c* may be formed of different materials or the same material. The electrode 101 preferably has a structure in which the conductive layer 101*a* is sandwiched by the layers formed of the same conductive material, in which case patterning by etching in the process for forming the electrode 101 can be performed easily.

In the light-emitting element 260*b*, the electrode 101 may include one of the conductive layer 101*b* and the conductive layer 101*c*.

For each of the conductive layers 101*a*, 101*b*, and 101*c*, which are included in the electrode 101, the structure and materials of the electrode 101 or 102 described in Embodiment 1 can be used.

In FIGS. 5A and 5B, a partition wall 145 is provided between a region 221B, a region 221G, and a region 221R, which are sandwiched between the electrode 101 and the electrode 102. The partition wall 145 has an insulating property. The partition wall 145 covers end portions of the electrode 101 and has openings overlapping with the electrode. With the partition wall 145, the electrode 101 provided over the substrate 200 in the regions can be divided into island shapes.

Note that the light-emitting layer 123B and the light-emitting layer 123G may overlap with each other in a region where they overlap with the partition wall 145. The light-emitting layer 123G and the light-emitting layer 123R may overlap with each other in a region where they overlap with the partition wall 145. The light-emitting layer 123R and the light-emitting layer 123B may overlap with each other in a region where they overlap with the partition wall 145.

The partition wall 145 has an insulating property and is formed using an inorganic or organic material. Examples of the inorganic material include silicon oxide, silicon oxynitride, silicon nitride oxide, silicon nitride, aluminum oxide, and aluminum nitride. Examples of the organic material include photosensitive resin materials such as an acrylic resin and a polyimide resin.

Note that a silicon oxynitride film refers to a film in which the proportion of oxygen is higher than that of nitrogen. The silicon oxynitride film preferably contains oxygen, nitrogen, silicon, and hydrogen in the ranges of 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen in the ranges of 55 atomic % to 65 atomic %, 1 atomic % to 20 atomic %, 25 atomic % to 35 atomic %, and 0.1 atomic % to 10 atomic %, respectively.

The light-emitting layers 123R, 123G, and 123B preferably contain light-emitting materials having functions of emitting light of different colors. For example, when the light-emitting layer 123R contains a light-emitting material having a function of emitting red, the region 221R emits red light. When the light-emitting layer 123G contains a light-emitting material having a function of emitting green, the region 221G emits green light. When the light-emitting layer 123B contains a light-emitting material having a function of emitting blue, the region 221B emits blue light. The light-emitting element 260*a* or 260*b* having such a structure is used in a pixel of a display device, whereby a full-color display device can be fabricated. The thicknesses of the light-emitting layers may be the same or different.

One or more of the light-emitting layer 123B, the light-emitting layer 123G, and the light-emitting layer 123R preferably have at least one of the structure of the light-emitting layer 130 described in Embodiment 1 and the structure of the light-emitting layer 140 described in Embodiment 4. In addition, one or more of the light-emitting layer 123B, the light-emitting layer 123G, and the light-emitting layer 123R preferably include the iridium complex described in Embodiment 2 as a light-emitting material. In that case, a light-emitting element with high emission efficiency can be fabricated.

One or more of the light-emitting layers 123B, 123G, and 123R may include two or more stacked layers.

When at least one light-emitting layer includes the light-emitting layer described in Embodiments 1 and 4 or the light-emitting material described in Embodiment 2 as described above and the light-emitting element 260*a* or 260*b* including the light-emitting layer is used in pixels in a display device, a display device with high emission efficiency can be fabricated. The display device including the light-emitting element 260*a* or 260*b* can thus have reduced power consumption.

By providing an optical element (e.g., a color filter, a polarizing plate, and an anti-reflection film) on the light extraction side of the electrode through which light is extracted, the color purity of each of the light-emitting elements 260*a* and 260*b* can be improved. Therefore, the color purity of a display device including the light-emitting element 260*a* or 260*b* can be improved. Alternatively, the reflection of external light by each of the light-emitting elements 260*a* and 260*b* can be reduced. Therefore, the contrast ratio of a display device including the light-emitting element 260*a* or 260*b* can be improved.

For the other components of the light-emitting elements 260*a* and 260*b*, the components of the light-emitting element in Embodiments 1, 4, or 5 may be referred to.

<Structure Example 2 of Light-Emitting Element>

Next, structure examples different from the light-emitting elements illustrated in FIGS. 5A and 5B will be described below with reference to FIGS. 6A and 6B.

Figure 6A:
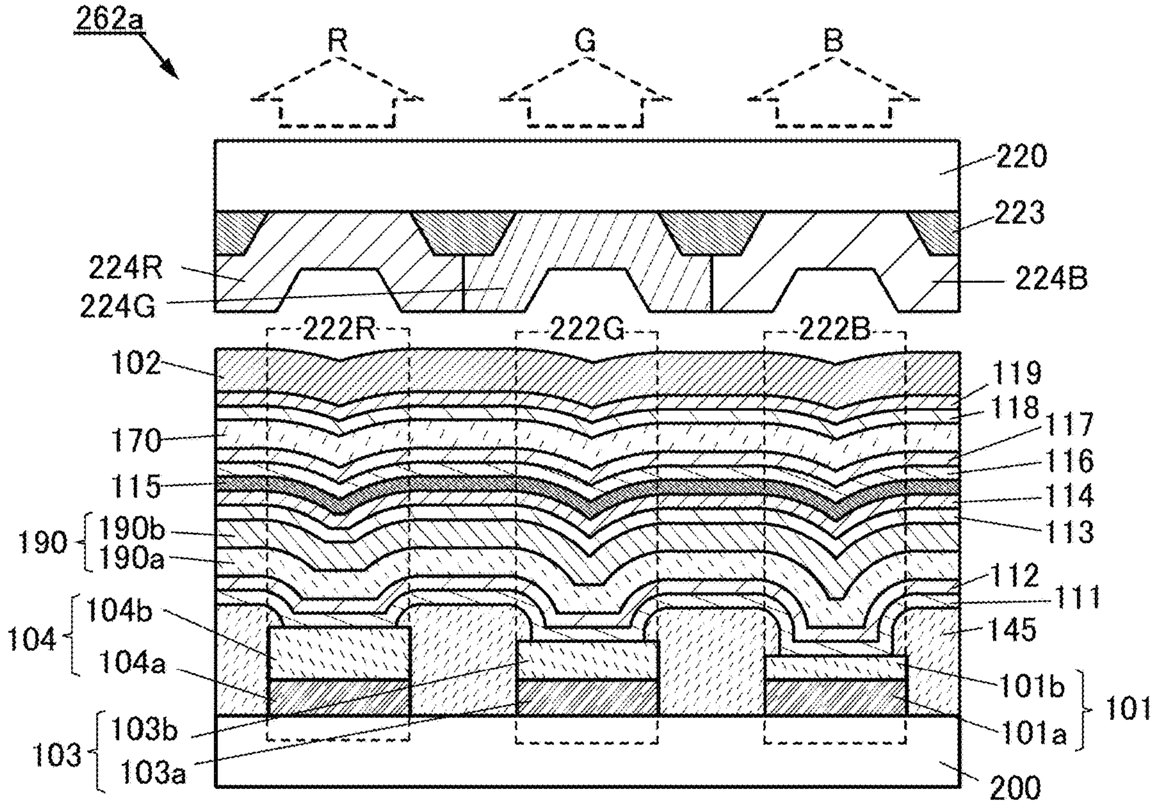
FIGS. 6A and 6B are each a schematic cross-sectional view of a light-emitting element of one embodiment of the present invention.
Figure 6B:
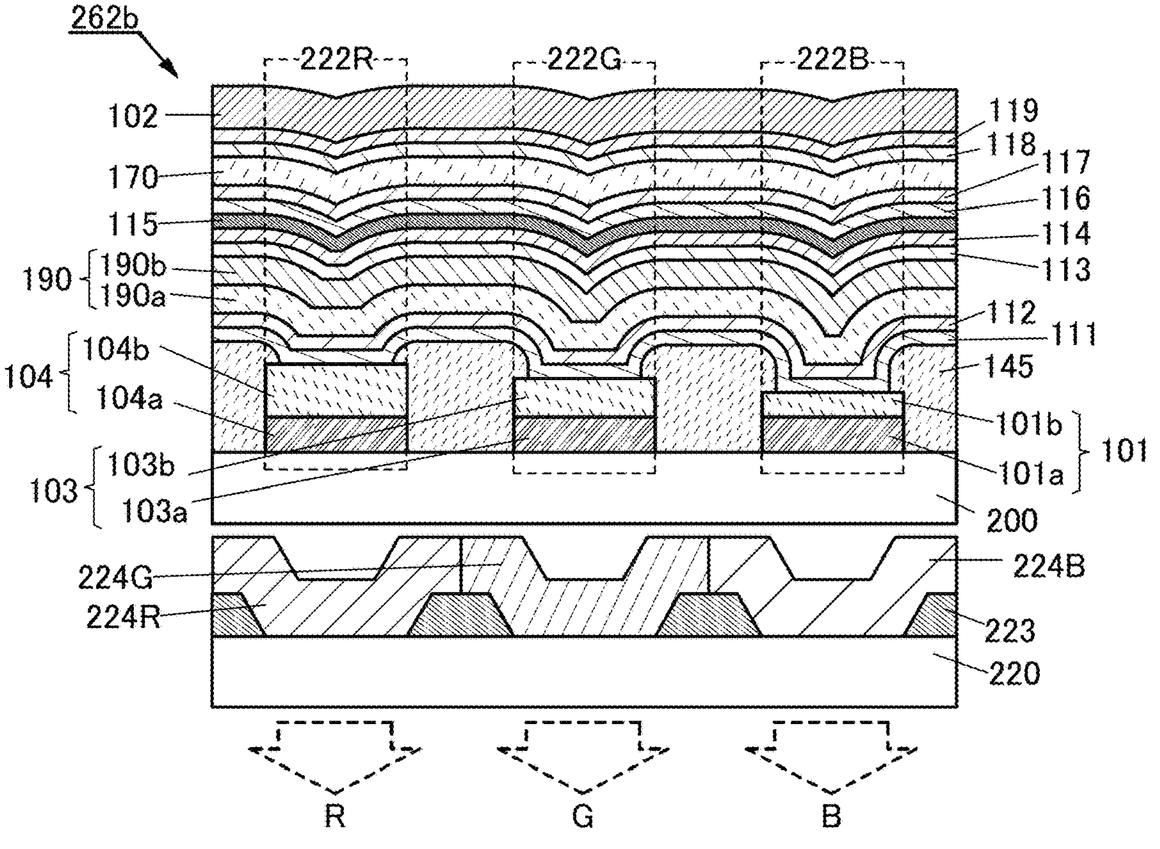

FIGS. 6A and 6B are cross-sectional views of a light-emitting element of one embodiment of the present invention. In FIGS. 6A and 6B, a portion having a function similar to that in FIGS. 5A and 5B is represented by the same hatch pattern as in FIGS. 5A and 5B and not especially denoted by a reference numeral in some cases. In addition, common reference numerals are used for portions having similar functions, and a detailed description of such portions is not repeated in some cases.

FIGS. 6A and 6B illustrate structure examples of a light-emitting element including the light-emitting layer between a pair of electrodes. A light-emitting element 262*a* illustrated in FIG. 6A has a top-emission structure in which light is extracted in a direction opposite to the substrate 200, and a light-emitting element 262*b* illustrated in FIG. 6B has a bottom-emission structure in which light is extracted to the substrate 200 side. However, one embodiment of the present invention is not limited to these structures and may have a dual-emission structure in which light emitted from the light-emitting element is extracted in both top and bottom directions with respect to the substrate 200 over which the light-emitting element is formed.

The light-emitting elements 262*a* and 262*b* each include the electrode 101, the electrode 102, an electrode 103, and an electrode 104 over the substrate 200. At least a light-emitting layer 170, a light-emitting layer 190, and the charge-generation layer 115 are provided between the electrode 101 and the electrode 102, between the electrode 102 and the electrode 103, and between the electrode 102 and the electrode 104. The hole-injection layer 111, the hole-transport layer 112, the electron-transport layer 113, the electron-injection layer 114, the hole-injection layer 116, the hole-transport layer 117, the electron-transport layer 118, and the electron-injection layer 119 are further provided.

The electrode 101 includes a conductive layer 101*a* and a conductive layer 101*b* over and in contact with the conductive layer 101*a*. The electrode 103 includes a conductive layer 103*a* and a conductive layer 103*b* over and in contact with the conductive layer 103*a*. The electrode 104 includes a conductive layer 104*a* and a conductive layer 104*b* over and in contact with the conductive layer 104*a*.

The light-emitting element 262*a* illustrated in FIG. 6A and the light-emitting element 262*b* illustrated in FIG. 6B each include a partition wall 145 between a region 222B sandwiched between the electrode 101 and the electrode 102, a region 222G sandwiched between the electrode 102 and the electrode 103, and a region 222R sandwiched between the electrode 102 and the electrode 104. The partition wall 145 has an insulating property. The partition wall 145 covers end portions of the electrodes 101, 103, and 104 and has openings overlapping with the electrodes. With the partition wall 145, the electrodes provided over the substrate 200 in the regions can be separated into island shapes.

The charge-generation layer 115 can be formed with a material obtained by adding an electron acceptor (acceptor) to a hole-transport material or a material obtained by adding an electron donor (donor) to an electron-transport material. Note that when the conductivity of the charge-generation layer 115 is as high as that of the pair of electrodes, carriers generated in the charge-generation layer 115 might transfer to an adjacent pixel and light emission might occur in the pixel. In order to prevent such false light emission from an adjacent pixel, the charge-generation layer 115 is preferably formed with a material whose conductivity is lower than that of the pair of electrodes.

The light-emitting elements 262*a* and 262*b* each include a substrate 220 provided with an optical element 224B, an optical element 224G, and an optical element 224R in the direction in which light emitted from the region 222B, light emitted from the region 222G, and light emitted from the region 222R are extracted. The light emitted from each region is emitted outside the light-emitting element through each optical element. In other words, the light from the region 222B, the light from the region 222G, and the light from the region 222R are emitted through the optical element 224B, the optical element 224G, and the optical element 224R, respectively.

The optical elements 224B, 224G, and 224R each have a function of selectively transmitting light of a particular color out of incident light. For example, the light emitted from the region 222B through the optical element 224B is blue light, the light emitted from the region 222G through the optical element 224G is green light, and the light emitted from the region 222R through the optical element 224R is red light.

For example, a coloring layer (also referred to as color filter), a band pass filter, a multilayer filter, or the like can be used for the optical elements 224R, 224G, and 224B. Alternatively, color conversion elements can be used as the optical elements. A color conversion element is an optical element that converts incident light into light having a longer wavelength than the incident light. As the color conversion elements, quantum-dot elements can be favorably used. The usage of the quantum-dot type can increase color reproducibility of the display device.

One or more optical elements may be stacked over each of the optical elements 224R, 224G, and 224B. As another optical element, a circularly polarizing plate, an anti-reflective film, or the like can be provided, for example. A circularly polarizing plate provided on the side where light emitted from the light-emitting element of the display device is extracted can prevent a phenomenon in which light entering from the outside of the display device is reflected inside the display device and returned to the outside. An anti-reflective film can weaken external light reflected by a surface of the display device. This leads to clear observation of light emitted from the display device.

Note that in FIGS. 6A and 6B, blue light (B), green light (G), and red light (R) emitted from the regions through the optical elements are schematically illustrated by arrows of dashed lines.

A light-blocking layer 223 is provided between the optical elements. The light-blocking layer 223 has a function of blocking light emitted from the adjacent regions. Note that a structure without the light-blocking layer 223 may also be employed.

The light-blocking layer 223 has a function of reducing the reflection of external light. The light-blocking layer 223 has a function of preventing mixture of light emitted from an adjacent light-emitting element. As the light-blocking layer 223, a metal, a resin containing black pigment, carbon black, a metal oxide, a composite oxide containing a solid solution of a plurality of metal oxides, or the like can be used.

Note that the optical element 224B and the optical element 224G may overlap with each other in a region where they overlap with the light-blocking layer 223. In addition, the optical element 224G and the optical element 224R may overlap with each other in a region where they overlap with the light-blocking layer 223. In addition, the optical element 224R and the optical element 224B may overlap with each other in a region where they overlap with the light-blocking layer 223.

As for the structures of the substrate 200 and the substrate 220 provided with the optical elements, Embodiment 1 can be referred to.

Furthermore, the light-emitting elements 262*a* and 262*b* have a microcavity structure.

<<Microcavity Structure>>

Light emitted from the light-emitting layer 170 and the light-emitting layer 190 resonates between a pair of electrodes (e.g., the electrode 101 and the electrode 102). The light-emitting layer 170 and the light-emitting layer 190 are formed at such a position as to intensify the light of a desired wavelength among light to be emitted. For example, by adjusting the optical length from a reflective region of the electrode 101 to the light-emitting region of the light-emitting layer 170 and the optical length from a reflective region of the electrode 102 to the light-emitting region of the light-emitting layer 170, the light of a desired wavelength among light emitted from the light-emitting layer 170 can be intensified. By adjusting the optical length from the reflective region of the electrode 101 to the light-emitting region of the light-emitting layer 190 and the optical length from the reflective region of the electrode 102 to the light-emitting region of the light-emitting layer 190, the light of a desired wavelength among light emitted from the light-emitting layer 190 can be intensified. In the case of a light-emitting element in which a plurality of light-emitting layers (here, the light-emitting layers 170 and 190) are stacked, the optical lengths of the light-emitting layers 170 and 190 are preferably optimized.

In each of the light-emitting elements 262*a* and 262*b*, by adjusting the thicknesses of the conductive layers (the conductive layer 101*b*, the conductive layer 103*b*, and the conductive layer 104*b*) in each region, the light of a desired wavelength among light emitted from the light-emitting layers 170 and 190 can be increased. Note that the thickness of at least one of the hole-injection layer 111 and the hole-transport layer 112 may differ between the regions to increase the light emitted from the light-emitting layers 170 and 190.

For example, in the case where the refractive index of the conductive material having a function of reflecting light in the electrodes 101 to 104 is lower than the refractive index of the light-emitting layer 170 or 190, the thickness of the conductive layer 101*b* of the electrode 101 is adjusted so that the optical length between the electrode 101 and the electrode 102 is $m_B\lambda_B/2$ ($m_B$ is a natural number and $\lambda_B$ is the wavelength of light intensified in the region 222B). Similarly, the thickness of the conductive layer 103*b* of the electrode 103 is adjusted so that the optical length between the electrode 103 and the electrode 102 is $m_G\lambda_G/2$ ($m_G$ is a natural number and $\lambda_G$ is the wavelength of light intensified in the region 222G). Furthermore, the thickness of the conductive layer 104*b* of the electrode 104 is adjusted so that the optical length between the electrode 104 and the electrode 102 is $m_R\lambda_R/2$ ($m_R$ is a natural number and $\lambda_R$ is the wavelength of light intensified in the region 222R).

In the case where it is difficult to precisely determine the reflective regions of the electrodes 101 to 104, the optical length for increasing the intensity of light emitted from the light-emitting layer 170 or the light-emitting layer 190 may be derived on the assumption that certain regions of the electrodes 101 to 104 are the reflective regions. In the case where it is difficult to precisely determine the light-emitting regions of the light-emitting layer 170 and the light-emitting layer 190, the optical length for increasing the intensity of light emitted from the light-emitting layer 170 and the light-emitting layer 190 may be derived on the assumption that certain regions of the light-emitting layer 170 and the light-emitting layer 190 are the light-emitting regions.

In the above manner, with the microcavity structure, in which the optical length between the pair of electrodes in the respective regions is adjusted, scattering and absorption of light in the vicinity of the electrodes can be suppressed, resulting in high light extraction efficiency.

In the above structure, the conductive layers 101*b*, 103*b*, and 104*b* preferably have a function of transmitting light. The materials of the conductive layers 101*b*, 103*b*, and 104*b* may be the same or different. It is preferable to use the same material for the conductive layer 101*b*, the conductive layer 103*b*, and the conductive layer 104*b* because patterning by etching in the formation process of the electrode 101, the electrode 103, and the electrode 104 can be performed easily. Each of the conductive layers 101*b*, 103*b*, and 104*b* may have a stacked structure of two or more layers.

Since the light-emitting element 262*a* illustrated in FIG. 6A has a top-emission structure, it is preferable that the conductive layer 101*a*, the conductive layer 103*a*, and the conductive layer 104*a* have a function of reflecting light. In addition, it is preferable that the electrode 102 have functions of transmitting light and reflecting light.

Since the light-emitting element 262*b* illustrated in FIG. 6B has a bottom-emission structure, it is preferable that the conductive layer 101*a*, the conductive layer 103*a*, and the conductive layer 104*a* have functions of transmitting light and reflecting light. In addition, it is preferable that the electrode 102 have a function of reflecting light.

In each of the light-emitting elements 262*a* and 262*b*, the conductive layers 101*a*, 103*a*, and 104*a* may be formed of different materials or the same material. When the conductive layers 101*a*, 103*a*, and 104*a* are formed of the same material, manufacturing cost of the light-emitting elements 262*a* and 262*b* can be reduced. Note that each of the conductive layers 101*a*, 103*a*, and 104*a* may have a stacked structure including two or more layers.

At least one of the structures described in Embodiments 1 and 4 is preferably used for at least one of the light-emitting layers 170 and 190 included in the light-emitting elements 262*a* and 262*b*. In addition, the iridium complex described in Embodiment 2 is preferably included as a light-emitting material. In this way, the light-emitting elements can have high emission efficiency.

Either or both of the light-emitting layers 170 and 190 may have a stacked structure of two layers like the light-emitting layers 190*a* and 190*b*, for example. The two light-emitting layers each including two kinds of light-emitting materials (a first compound and a second compound) for emitting light of different colors enable emission of light of a plurality of colors. It is particularly preferable to select the light-emitting materials of the light-emitting layers so that white light can be obtained by combining light emissions from the light-emitting layers 170 and 190.

Either or both of the light-emitting layers 170 and 190 may have a stacked structure of three or more layers, in which a layer not including a light-emitting material may be included.

In the above-described manner, by using the light-emitting element 262*a* or 262*b* including the light-emitting layer having at least one of the structures described in Embodiments 1 and 4 in pixels in a display device, a display device with high emission efficiency can be fabricated. Accordingly, the display device including the light-emitting element 262*a* or 262*b* can have low power consumption.

For the other components of the light-emitting elements 262*a* and 262*b*, the components of the light-emitting element 260*a* or 260*b* or the light-emitting element in Embodiment 1, 4, or 5 may be referred to.

<Fabrication Method of Light-Emitting Element>

Next, a method for fabricating a light-emitting element of one embodiment of the present invention is described below with reference to FIGS. 7A to 7C and FIGS. 8A to 8C. Here, a method for fabricating the light-emitting element 262*a* illustrated in FIG. 6A is described.

FIGS. 7A to 7C and FIGS. 8A to 8C are cross-sectional views illustrating a method for fabricating the light-emitting element of one embodiment of the present invention.

The method for fabricating the light-emitting element 262*a* described below includes first to seventh steps.

<<First Step>>

Figure 7A:
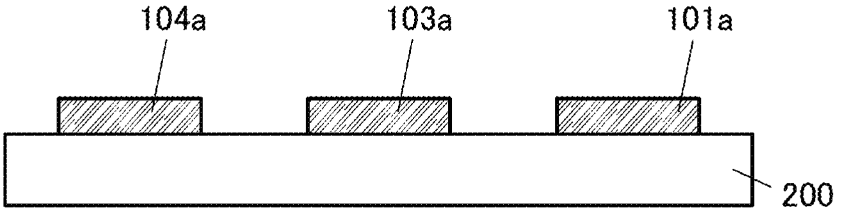
FIGS. 7A to 7C are schematic cross-sectional views illustrating a method for fabricating a light-emitting element of one embodiment of the present invention.

In the first step, the electrodes (specifically the conductive layer 101*a* of the electrode 101, the conductive layer 103*a* of the electrode 103, and the conductive layer 104*a* of the electrode 104) of the light-emitting elements are formed over the substrate 200 (see FIG. 7A).

In this embodiment, a conductive layer having a function of reflecting light is formed over the substrate 200 and processed into a desired shape; whereby the conductive layers 101*a*, 103*a*, and 104*a* are formed. As the conductive layer having a function of reflecting light, an alloy film of silver, palladium, and copper (also referred to as an Ag—Pd—Cu film or APC) is used. The conductive layers 101*a*, 103*a*, and 104*a* are preferably formed through a step of processing the same conductive layer, because the manufacturing cost can be reduced.

Note that a plurality of transistors may be formed over the substrate 200 before the first step. The plurality of transistors may be electrically connected to the conductive layers 101*a*, 103*a*, and 104*a*.

<<Second Step>>

Figure 7B:
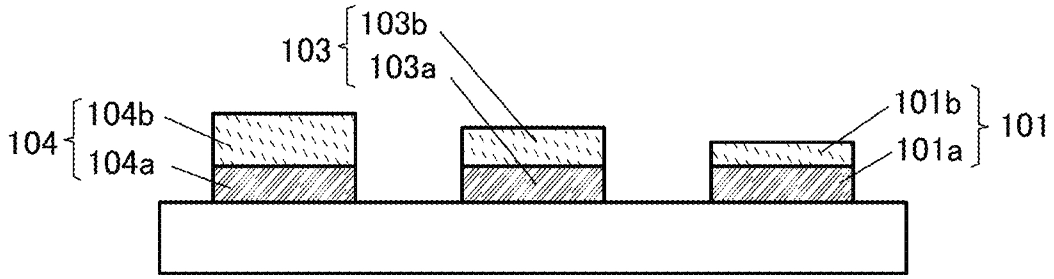

In the second step, the transparent conductive layer 101*b* having a function of transmitting light is formed over the conductive layer 101*a* of the electrode 101, the transparent conductive layer 103*b* having a function of transmitting light is formed over the conductive layer 103*a* of the electrode 103, and the transparent conductive layer 104*b* having a function of transmitting light is formed over the conductive layer 104*a* of the electrode 104 (see FIG. 7B).

In this embodiment, the conductive layers 101*b*, 103*b*, and 104*b* each having a function of transmitting light are formed over the conductive layers 101*a*, 103*a*, and 104*a* each having a function of reflecting light, respectively, whereby the electrode 101, the electrode 103, and the electrode 104 are formed. As the conductive layers 101*b*, 103*b*, and 104*b*, ITSO films are used.

The conductive layers 101*b*, 103*b*, and 104*b* having a function of transmitting light may be formed in a plurality of steps. When the conductive layers 101*b*, 103*b*, and 104*b* having a function of transmitting light are formed in a plurality of steps, they can be formed to have thicknesses which enable microcavity structures appropriate in the respective regions.

<<Third Step>>

Figure 7C:
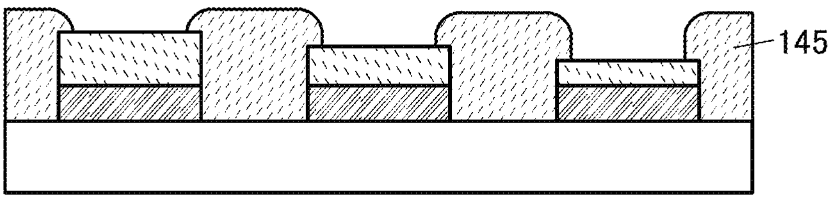

In the third step, the partition wall 145 that covers end portions of the electrodes of the light-emitting element is formed (see FIG. 7C).

The partition wall 145 includes an opening overlapping with the electrode. The conductive film exposed by the opening functions as the anode of the light-emitting element. As the partition wall 145, a polyimide-based resin is used in this embodiment.

In the first to third steps, since there is no possibility of damaging the EL layer (a layer containing an organic compound), a variety of film formation methods and micromachining technologies can be employed. In this embodiment, a reflective conductive layer is formed by a sputtering method, a pattern is formed over the conductive layer by a lithography method, and then the conductive layer is processed into an island shape by a dry etching method or a wet etching method to form the conductive layer 101*a* of the electrode 101, the conductive layer 103*a* of the electrode 103, and the conductive layer 104*a* of the electrode 104. Then, a transparent conductive film is formed by a sputtering method, a pattern is formed over the transparent conductive film by a lithography method, and then the transparent conductive film is processed into island shapes by a wet etching method to form the electrodes 101, 103, and 104.

<<Fourth Step>>

Figure 8A:
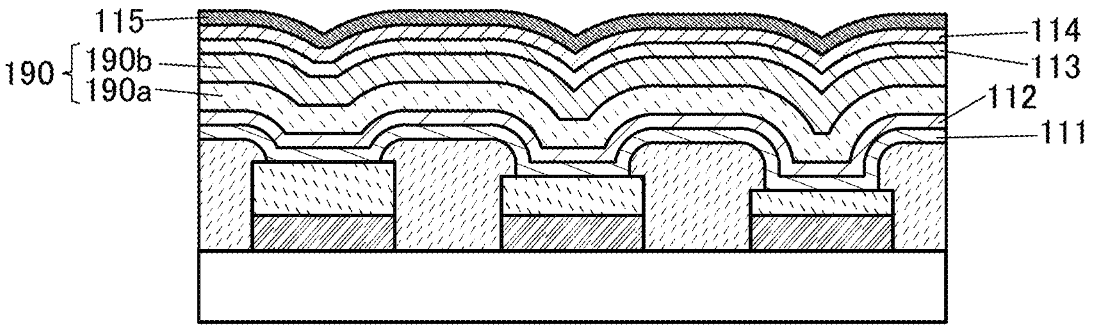
FIGS. 8A to 8C are schematic cross-sectional views illustrating a method for fabricating a light-emitting element of one embodiment of the present invention.

In the fourth step, the hole-injection layer 111, the hole-transport layer 112, the light-emitting layer 190, the electron-transport layer 113, the electron-injection layer 114, and the charge-generation layer 115 are formed (see FIG. 8A).

The hole-injection layer 111 can be formed by co-evaporating a hole-transport material and a material containing an acceptor substance. Note that a co-evaporation method is an evaporation method in which a plurality of different substances are concurrently vaporized from respective different evaporation sources. The hole-transport layer 112 can be formed by evaporating a hole-transport material.

The light-emitting layer 190 can be formed by evaporating a guest material that emits light of at least one color selected from violet, blue, blue green, green, yellow green, yellow, orange, and red. As the guest material, a fluorescent or phosphorescent organic compound can be used. The structure of the light-emitting layer described in Embodiment 1 or Embodiment 4 is preferably employed. The light-emitting layer 190 may have a two-layer structure. In such a case, the two light-emitting layers each preferably contain a light-emitting material that emits light of a different color.

The electron-transport layer 113 can be formed by evaporating a substance having a high electron-transport property. The electron-injection layer 114 can be formed by evaporating a substance having a high electron-injection property.

The charge-generation layer 115 can be formed by evaporating a material obtained by adding an electron acceptor (acceptor) to a hole-transport material or a material obtained by adding an electron donor (donor) to an electron-transport material.

<<Fifth Step>>

Figure 8B:
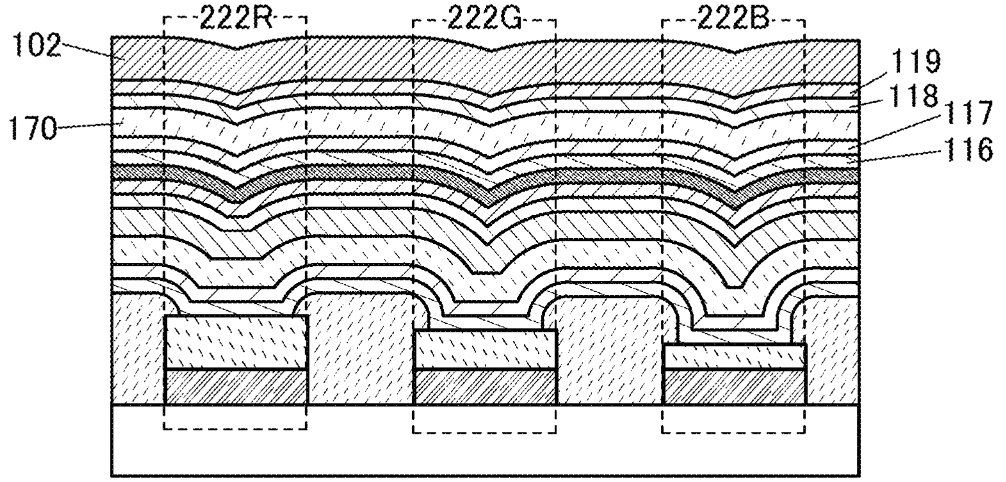

In the fifth step, the hole-injection layer 116, the hole-transport layer 117, the light-emitting layer 170, the electron-transport layer 118, the electron-injection layer 119, and the electrode 102 are formed (see FIG. 8B).

The hole-injection layer 116 can be formed by using a material and a method which are similar to those of the hole-injection layer 111. The hole-transport layer 117 can be formed by using a material and a method which are similar to those of the hole-transport layer 112.

The light-emitting layer 170 can be formed by evaporating a guest material that emits light of at least one color selected from violet, blue, blue green, green, yellow green, yellow, orange, and red. As the guest material, a fluorescent or phosphorescent organic compound can be used. The structure of the light-emitting layer described in Embodiment 1 or Embodiment 4 is preferably employed. Note that at least one of the light-emitting layer 170 and the light-emitting layer 190 preferably has the structure of a light-emitting layer described in Embodiment 1 or Embodiment 4. The light-emitting layer 170 and the light-emitting layer 190 preferably include light-emitting organic compounds exhibiting light of different colors.

The electron-transport layer 118 can be formed by using a material and a method which are similar to those of the electron-transport layer 113. The electron-injection layer 119 can be formed by using a material and a method which are similar to those of the electron-injection layer 114.

The electrode 102 can be formed by stacking a reflective conductive film and a light-transmitting conductive film. The electrode 102 may have a single-layer structure or a stacked-layer structure.

Through the above-described steps, the light-emitting element including the region 222B, the region 222G, and the region 222R over the electrode 101, the electrode 103, and the electrode 104, respectively, are formed over the substrate 200.

<<Sixth Step>>

Figure 8C:
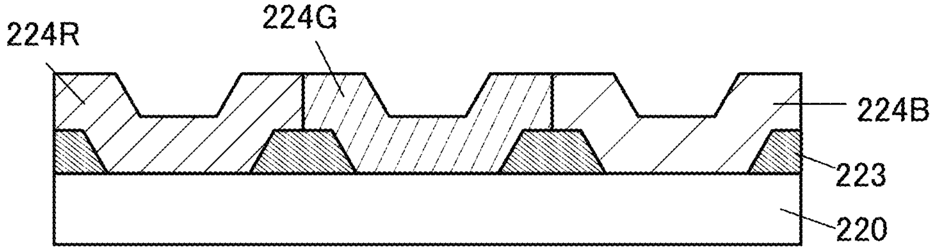

In the sixth step, the light-blocking layer 223, the optical element 224B, the optical element 224G, and the optical element 224R are formed over the substrate 220 (see FIG. 8C).

As the light-blocking layer 223, a resin film containing black pigment is formed in a desired region. Then, the optical element 224B, the optical element 224G, and the optical element 224R are formed over the substrate 220 and the light-blocking layer 223. As the optical element 224B, a resin film containing blue pigment is formed in a desired region. As the optical element 224G, a resin film containing green pigment is formed in a desired region. As the optical element 224R, a resin film containing red pigment is formed in a desired region.

<<Seventh Step>>

In the seventh step, the light-emitting element formed over the substrate 200 is attached to the light-blocking layer 223, the optical element 224B, the optical element 224G, and the optical element 224R formed over the substrate 220, and sealed with a sealant (not illustrated).

Through the above-described steps, the light-emitting element 262*a* illustrated in FIG. 6A can be formed.

The structure described in this embodiment can be used in combination with any of the structures described in the other embodiments as appropriate.

Embodiment 7

In this embodiment, a display device of one embodiment of the present invention will be described below with reference to FIGS. 9A and 9B, FIGS. 10A and 10B, FIG. 11, FIGS. 12A and 12B, FIGS. 13A and 13B, FIG. 14, FIGS. 15A and 15B, FIG. 16, and FIGS. 17A and 17B.

Structure Example 1 of Display Device

Figure 9A:
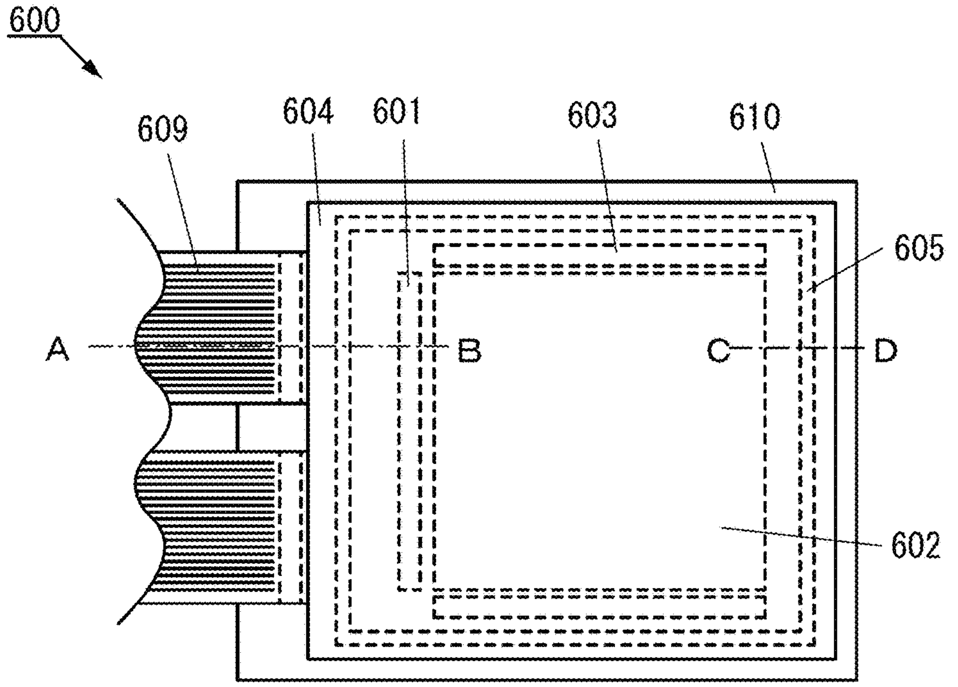
FIGS. 9A and 9B are a top view and a schematic cross-sectional view illustrating a display device of one embodiment of the present invention.
Figure 9B:
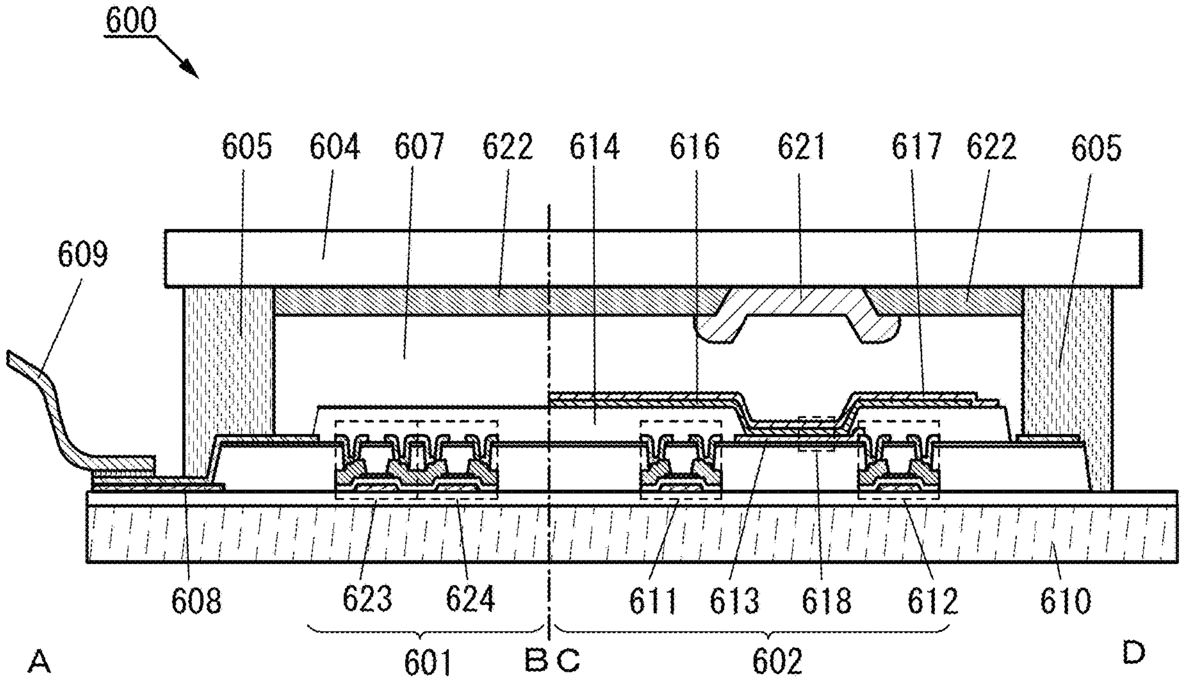

FIG. 9A is a top view illustrating a display device 600 and FIG. 9B is a cross-sectional view taken along the dashed-dotted line A-B and the dashed-dotted line C-D in FIG. 9A. The display device 600 includes driver circuit portions (a signal line driver circuit portion 601 and a scan line driver circuit portion 603) and a pixel portion 602. Note that the signal line driver circuit portion 601, the scan line driver circuit portion 603, and the pixel portion 602 have a function of controlling light emission from a light-emitting element.

The display device 600 also includes an element substrate 610, a sealing substrate 604, a sealant 605, a region 607 surrounded by the sealant 605, a lead wiring 608, and an FPC 609.

Note that the lead wiring 608 is a wiring for transmitting signals to be input to the signal line driver circuit portion 601 and the scan line driver circuit portion 603 and for receiving a video signal, a clock signal, a start signal, a reset signal, and the like from the FPC 609 serving as an external input terminal. Although only the FPC 609 is illustrated here, the FPC 609 may be provided with a printed wiring board (PWB).

As the signal line driver circuit portion 601, a CMOS circuit in which an n-channel transistor 623 and a p-channel transistor 624 are combined is formed. As the signal line driver circuit portion 601 or the scan line driver circuit portion 603, various types of circuits such as a CMOS circuit, a PMOS circuit, or an NMOS circuit can be used. Although a driver in which a driver circuit portion is formed and a pixel are formed over the same surface of a substrate in the display device of this embodiment, the driver circuit portion is not necessarily formed over the substrate and can be formed outside the substrate.

The pixel portion 602 includes a switching transistor 611, a current control transistor 612, and a lower electrode 613 electrically connected to a drain of the current control transistor 612. Note that a partition wall 614 is formed to cover end portions of the lower electrode 613. As the partition wall 614, for example, a positive type photosensitive acrylic resin film can be used.

In order to obtain favorable coverage, the partition wall 614 is formed to have a curved surface with curvature at its upper or lower end portion. For example, in the case of using a positive photosensitive acrylic as a material of the partition wall 614, it is preferable that only the upper end portion of the partition wall 614 have a curved surface with curvature (the radius of the curvature being 0.2 μm to 3 μm). As the partition wall 614, either a negative photosensitive resin or a positive photosensitive resin can be used.

Note that there is no particular limitation on a structure of each of the transistors (the transistors 611, 612, 623, and 624). For example, a staggered transistor can be used. In addition, there is no particular limitation on the polarity of these transistors. For these transistors, n-channel and p-channel transistors may be used, or either n-channel transistors or p-channel transistors may be used, for example. Furthermore, there is no particular limitation on the crystallinity of a semiconductor film used for these transistors. For example, an amorphous semiconductor film or a crystalline semiconductor film may be used. Examples of a semiconductor material include Group 14 semiconductors (e.g., a semiconductor including silicon), compound semiconductors (including oxide semiconductors), organic semiconductors, and the like. For example, it is preferable to use an oxide semiconductor that has an energy gap of 2 eV or more, preferably 2.5 eV or more and further preferably 3 eV or more, for the transistors, so that the off-state current of the transistors can be reduced. Examples of the oxide semiconductor include an In—Ga oxide and an In-M-Zn oxide (M is aluminum (Al), gallium (Ga), yttrium (Y), zirconium (Zr), lanthanum (La), cerium (Ce), tin (Sn), hafnium (Hf), or neodymium (Nd)).

An EL layer 616 and an upper electrode 617 are formed over the lower electrode 613. Here, the lower electrode 613 functions as an anode and the upper electrode 617 functions as a cathode.

In addition, the EL layer 616 is formed by various methods such as an evaporation method with an evaporation mask, an ink-jet method, or a spin coating method. As another material included in the EL layer 616, a low molecular compound or a high molecular compound (including an oligomer or a dendrimer) may be used.

Note that a light-emitting element 618 is formed with the lower electrode 613, the EL layer 616, and the upper electrode 617. The light-emitting element 618 preferably has any of the structures described in Embodiments 1, 4, 5, and 6. In the case where the pixel portion includes a plurality of light-emitting elements, the pixel portion may include both any of the light-emitting elements described in Embodiments 1, 4, 5, and 6 and a light-emitting element having a different structure.

When the sealing substrate 604 and the element substrate 610 are attached to each other with the sealant 605, the light-emitting element 618 is provided in the region 607 surrounded by the element substrate 610, the sealing substrate 604, and the sealant 605. The region 607 is filled with a filler. In some cases, the region 607 is filled with an inert gas (nitrogen, argon, or the like) or filled with an ultraviolet curable resin or a thermosetting resin which can be used for the sealant 605. For example, a polyvinyl chloride (PVC)-based resin, an acrylic-based resin, a polyimide-based resin, an epoxy-based resin, a silicone-based resin, a polyvinyl butyral (PVB)-based resin, or an ethylene vinyl acetate (EVA)-based resin can be used. It is preferable that the sealing substrate be provided with a recessed portion and a desiccant be provided in the recessed portion, in which case deterioration due to influence of moisture can be inhibited.

An optical element 621 is provided below the sealing substrate 604 to overlap with the light-emitting element 618. A light-blocking layer 622 is provided below the sealing substrate 604. The structures of the optical element 621 and the light-blocking layer 622 can be the same as those of the optical element and the light-blocking layer in Embodiment 6, respectively.

An epoxy-based resin or glass frit is preferably used for the sealant 605. It is preferable that such a material do not transmit moisture or oxygen as much as possible. As the sealing substrate 604, a glass substrate, a quartz substrate, or a plastic substrate formed of fiber reinforced plastic (FRP), poly(vinyl fluoride) (PVF), polyester, acrylic, or the like can be used.

In the above-described manner, the display device including any of the light-emitting elements and the optical elements which are described in Embodiments 1, 4, 5, and 6 can be obtained.

Structure Example 2 of Display Device

Next, another example of the display device is described with reference to FIGS. 10A and 10B and FIG. 11. Note that FIGS. 10A and 10B and FIG. 11 are each a cross-sectional view of a display device of one embodiment of the present invention.

Figure 10A:
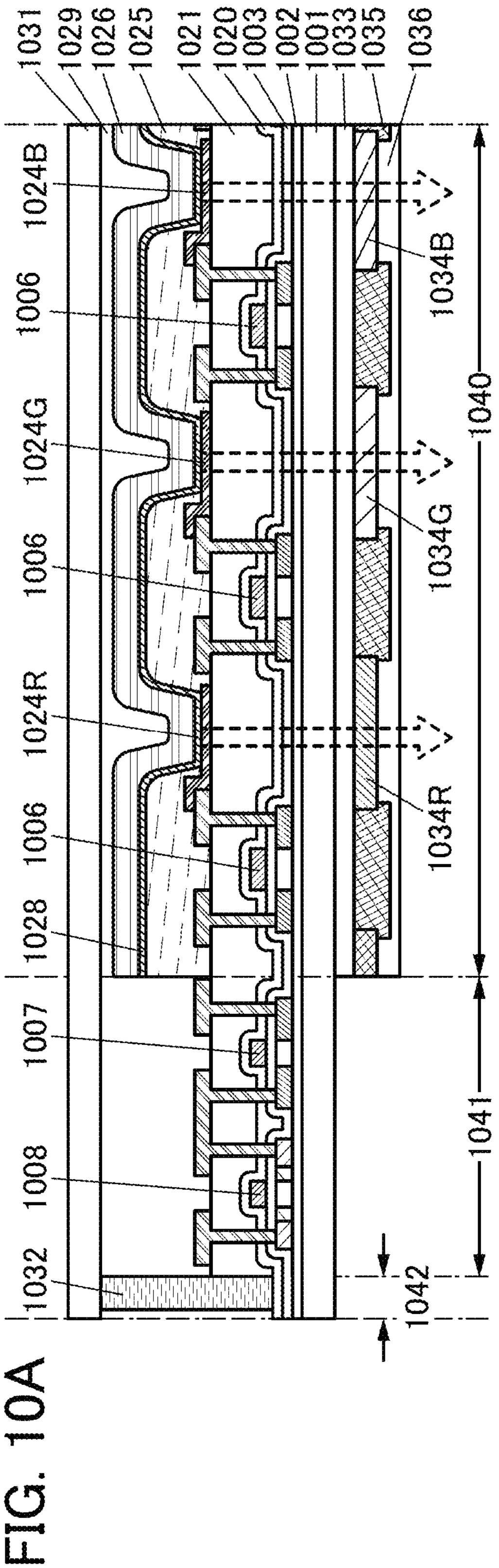
FIGS. 10A and 10B are schematic cross-sectional views each illustrating a display device of one embodiment of the present invention.
Figure 11:
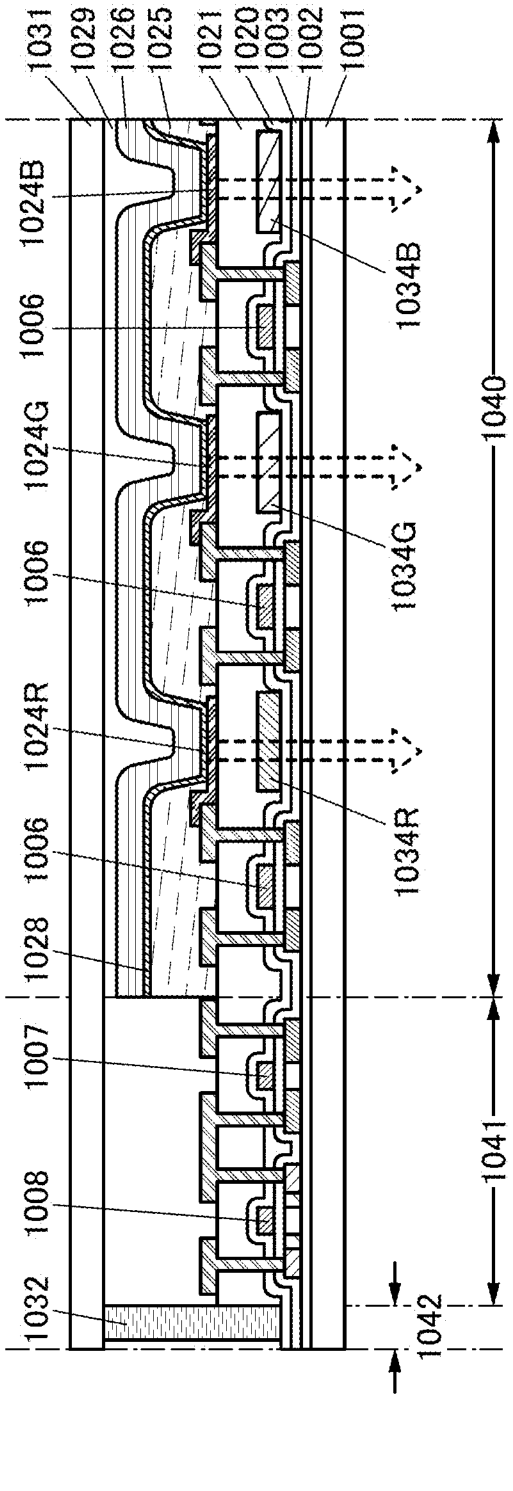
FIG. 11 is a schematic cross-sectional view illustrating a display device of one embodiment of the present invention.

In FIG. 10A, a substrate 1001, a base insulating film 1002, a gate insulating film 1003, gate electrodes 1006, 1007, and 1008, a first interlayer insulating film 1020, a second interlayer insulating film 1021, a peripheral portion 1042, a pixel portion 1040, a driver circuit portion 1041, lower electrodes 1024R, 1024G, and 1024B of light-emitting elements, a partition wall 1025, an EL layer 1028, an upper electrode 1026 of the light-emitting elements, a sealing layer 1029, a sealing substrate 1031, a sealant 1032, and the like are illustrated.

In FIG. 10A, examples of the optical elements, coloring layers (a red coloring layer 1034R, a green coloring layer 1034G, and a blue coloring layer 1034B) are provided on a transparent base material 1033. Further, a light-blocking layer 1035 may be provided. The transparent base material 1033 provided with the coloring layers and the light-blocking layer is positioned and fixed to the substrate 1001. Note that the coloring layers and the light-blocking layer are covered with an overcoat layer 1036. In the structure in FIG. 10A, red light, green light, and blue light transmit the coloring layers, and thus an image can be displayed with the use of pixels of three colors.

Figure 10B:
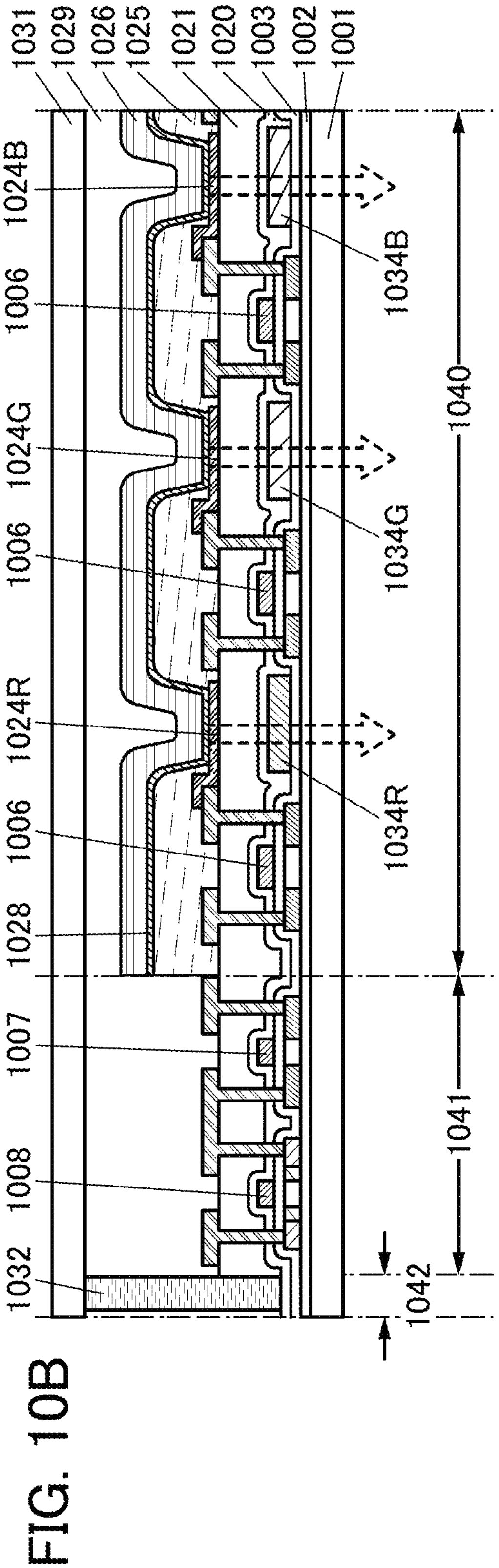

FIG. 10B illustrates an example in which, as examples of the optical elements, the coloring layers (the red coloring layer 1034R, the green coloring layer 1034G, and the blue coloring layer 1034B) are provided between the gate insulating film 1003 and the first interlayer insulating film 1020. As in this structure, the coloring layers may be provided between the substrate 1001 and the sealing substrate 1031.

FIG. 11 illustrates an example in which, as examples of the optical elements, the coloring layers (the red coloring layer 1034R, the green coloring layer 1034G, and the blue coloring layer 1034B) are provided between the first interlayer insulating film 1020 and the second interlayer insulating film 1021. As in this structure, the coloring layers may be provided between the substrate 1001 and the sealing substrate 1031.

The above-described display device has a structure in which light is extracted from the substrate 1001 side where the transistors are formed (a bottom-emission structure), but may have a structure in which light is extracted from the sealing substrate 1031 side (a top-emission structure).

Structure Example 3 of Display Device

Figure 12A:
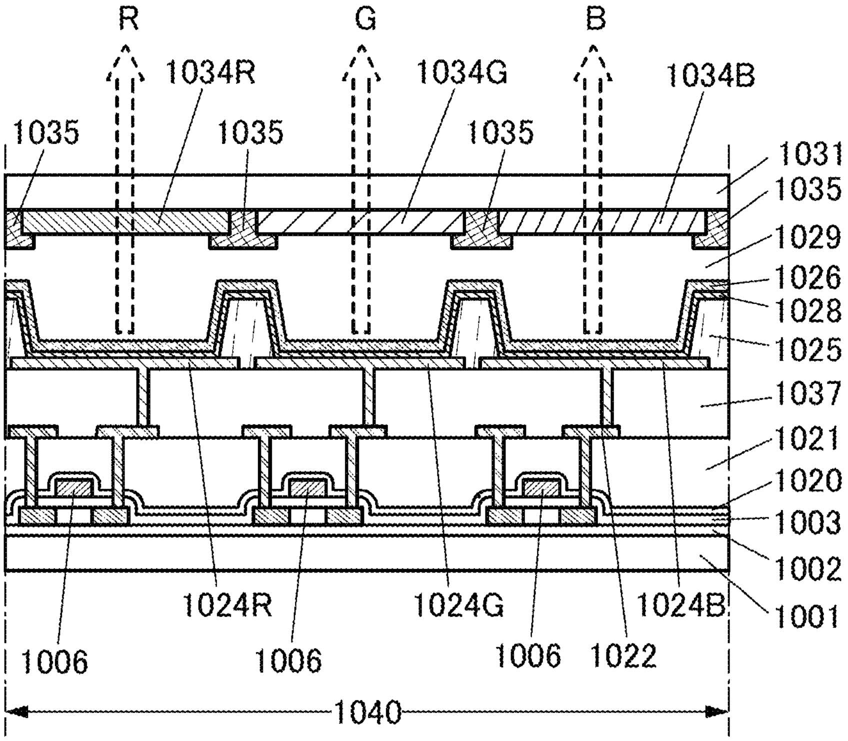
FIGS. 12A and 12B are schematic cross-sectional views each illustrating a display device of one embodiment of the present invention.
Figure 12B:
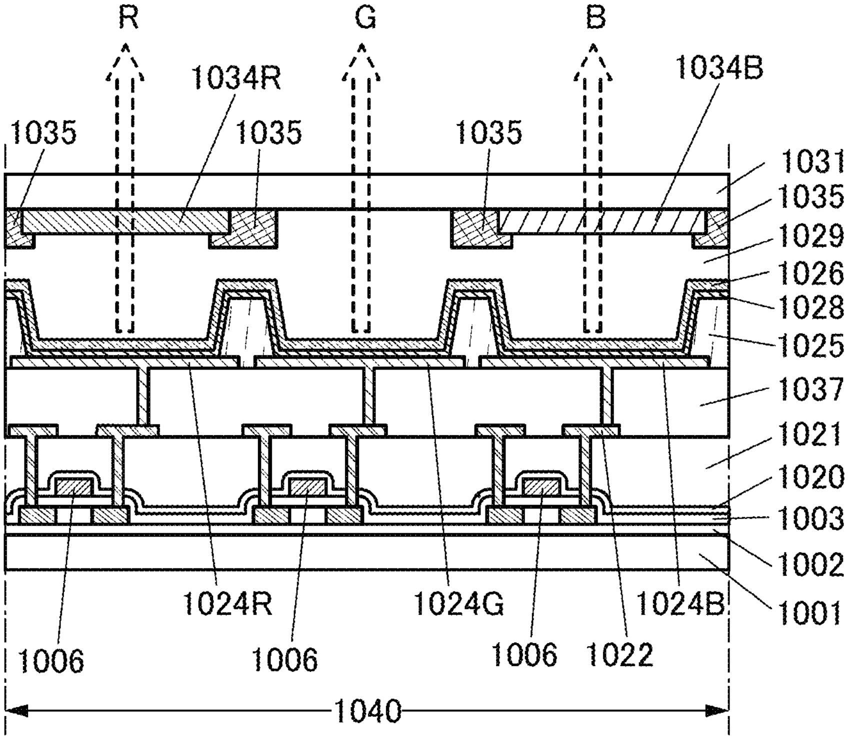

FIGS. 12A and 12B are each an example of a cross-sectional view of a display device having a top emission structure. Note that FIGS. 12A and 12B are each a cross-sectional view illustrating the display device of one embodiment of the present invention, and the driver circuit portion 1041, the peripheral portion 1042, and the like, which are illustrated in FIGS. 10A and 10B and FIG. 11, are not illustrated therein.

In this case, as the substrate 1001, a substrate that does not transmit light can be used. The process up to the step of forming a connection electrode which connects the transistor and the anode of the light-emitting element is performed in a manner similar to that of the display device having a bottom-emission structure. Then, a third interlayer insulating film 1037 is formed to cover an electrode 1022. This insulating film may have a planarization function. The third interlayer insulating film 1037 can be formed using a material similar to that of the second interlayer insulating film, or can be formed using any other various materials.

The lower electrodes 1024R, 1024G, and 1024B of the light-emitting elements each function as an anode here, but may function as a cathode. Further, in the case of a display device having a top-emission structure as illustrated in FIGS. 12A and 12B, the lower electrodes 1024R, 1024G, and 1024B preferably have a function of reflecting light. The upper electrode 1026 is provided over the EL layer 1028. It is preferable that the upper electrode 1026 have a function of reflecting light and a function of transmitting light and that a microcavity structure be used between the upper electrode 1026 and the lower electrodes 1024R, 1024G, and 1024B, in which case the intensity of light having a specific wavelength is increased.

In the case of a top-emission structure as illustrated in FIG. 12A, sealing can be performed with the sealing substrate 1031 on which the coloring layers (the red coloring layer 1034R, the green coloring layer 1034G, and the blue coloring layer 1034B) are provided. The sealing substrate 1031 may be provided with the light-blocking layer 1035 which is positioned between pixels. Note that a light-transmitting substrate is favorably used as the sealing substrate 1031.

FIG. 12A illustrates the structure provided with the light-emitting elements and the coloring layers for the light-emitting elements as an example; however, the structure is not limited thereto. For example, as shown in FIG. 12B, a structure including the red coloring layer 1034R and the blue coloring layer 1034B but not including a green coloring layer may be employed to achieve full color display with the three colors of red, green, and blue. The structure as illustrated in FIG. 12A where the light-emitting elements are provided with the coloring layers is effective to suppress reflection of external light. In contrast, the structure as illustrated in FIG. 12B where the light-emitting elements are provided with the red coloring layer and the blue coloring layer and without the green coloring layer is effective to reduce power consumption because of small energy loss of light emitted from the green light-emitting element.

Structure Example 4 of Display Device

Figure 13A:
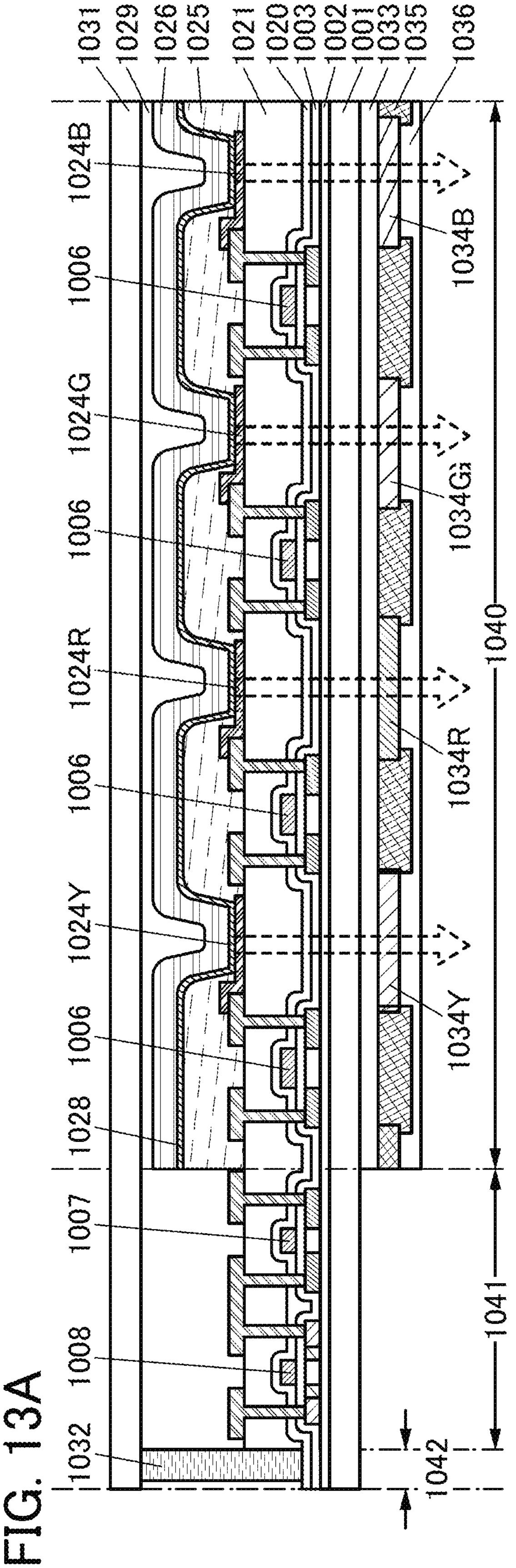
FIGS. 13A and 13B are schematic cross-sectional views each illustrating a display device of one embodiment of the present invention.
Figure 13B:
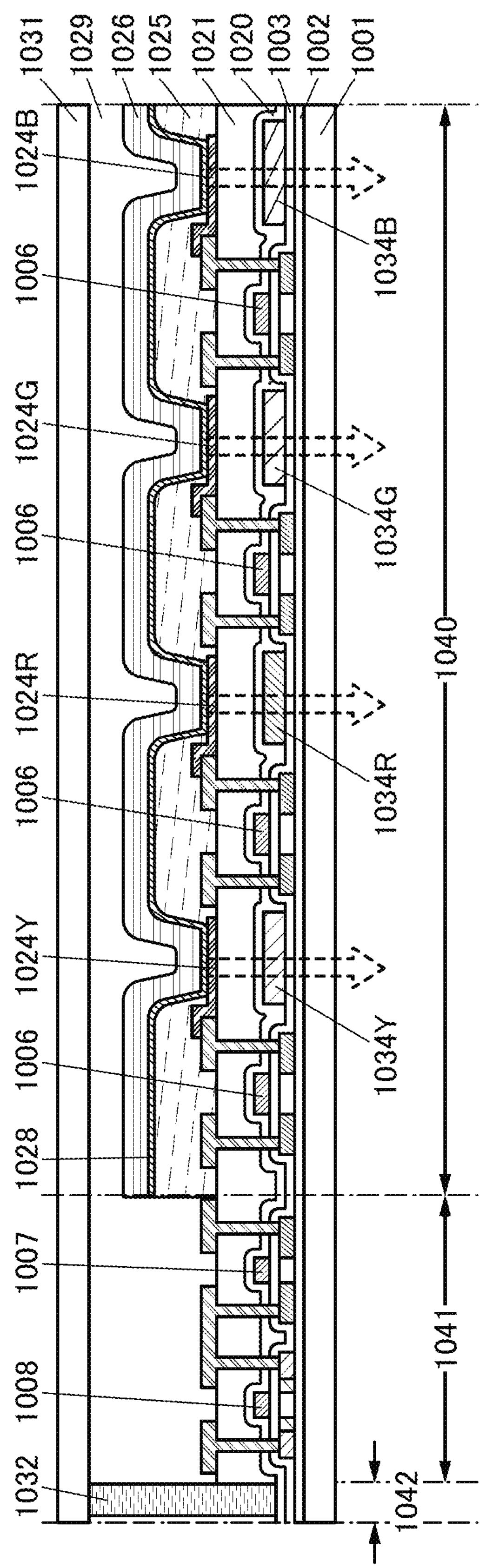
Figure 14:
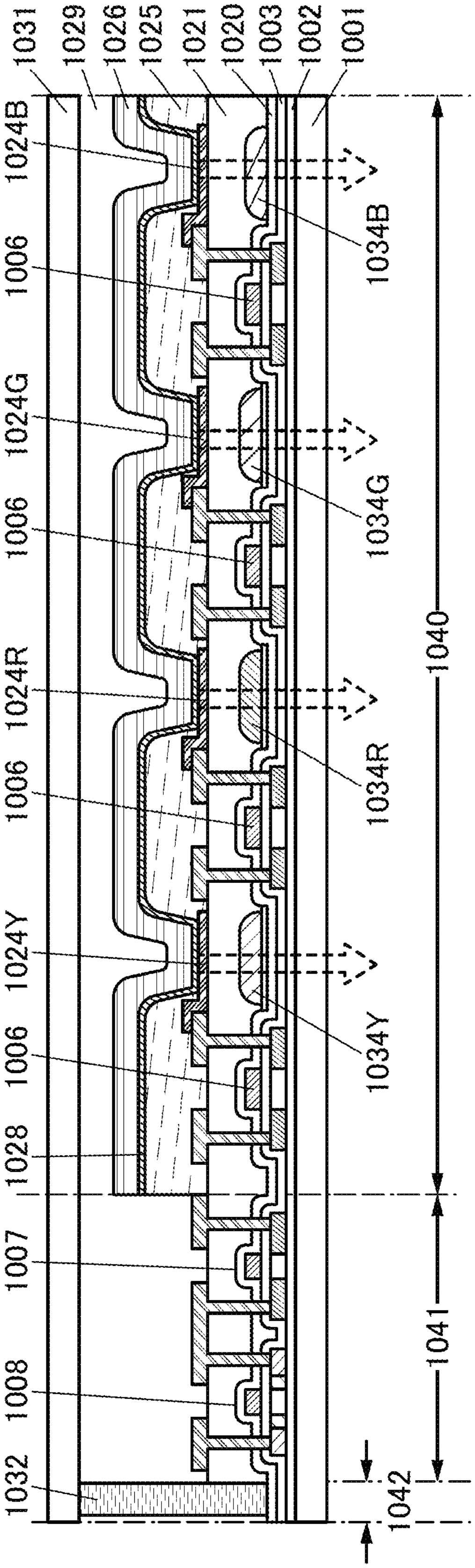
FIG. 14 is a schematic cross-sectional view illustrating a display device of one embodiment of the present invention.

Although a display device including sub-pixels of three colors (red, green, and blue) is described above, the number of colors of sub-pixels may be four (red, green, blue, and yellow, or red, green, blue, and white). FIGS. 13A and 13B, FIG. 14, and FIGS. 15A and 15B illustrate structures of display devices each including the lower electrodes 1024R, 1024G, 1024B, and 1024Y. FIGS. 13A and 13B and FIG. 14 each illustrate a display device having a structure in which light is extracted from the substrate 1001 side on which transistors are formed (bottom-emission structure), and FIGS. 15A and 15B each illustrate a display device having a structure in which light is extracted from the sealing substrate 1031 side (top-emission structure).

FIG. 13A illustrates an example of a display device in which optical elements (the coloring layer 1034R, the coloring layer 1034G, the coloring layer 1034B, and a coloring layer 1034Y) are provided on the transparent base material 1033. FIG. 13B illustrates an example of a display device in which optical elements (the coloring layer 1034R, the coloring layer 1034G, the coloring layer 1034B, and the coloring layer 1034Y) are provided between the gate insulating film 1003 and the first interlayer insulating film 1020. FIG. 14 illustrates an example of a display device in which optical elements (the coloring layer 1034R, the coloring layer 1034G, the coloring layer 1034B, and the coloring layer 1034Y) are provided between the first interlayer insulating film 1020 and the second interlayer insulating film 1021.

The coloring layer 1034R transmits red light, the coloring layer 1034G transmits green light, and the coloring layer 1034B transmits blue light. The coloring layer 1034Y transmits yellow light or transmits light of a plurality of colors selected from blue, green, yellow, and red. When the coloring layer 1034Y can transmit light of a plurality of colors selected from blue, green, yellow, and red, light released from the coloring layer 1034Y may be white light. Since the light-emitting element which transmits yellow or white light has high emission efficiency, the display device including the coloring layer 1034Y can have lower power consumption.

Figure 15A:
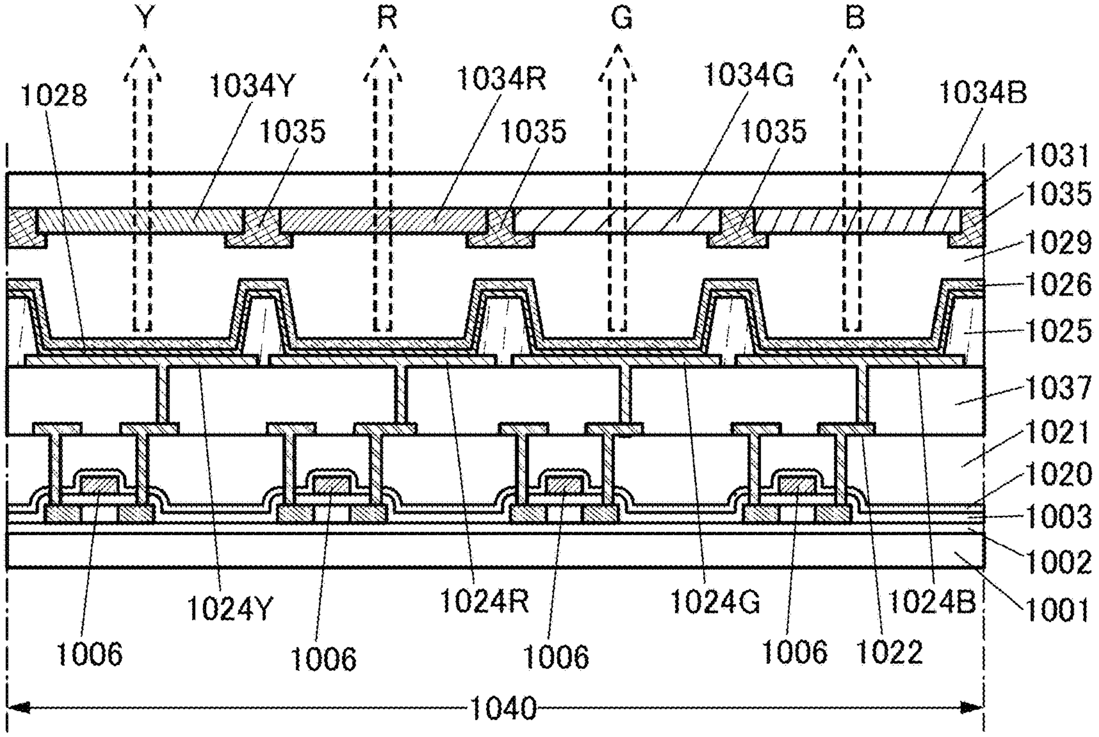
FIGS. 15A and 15B are schematic cross-sectional views each illustrating a display device of one embodiment of the present invention.
Figure 15B:
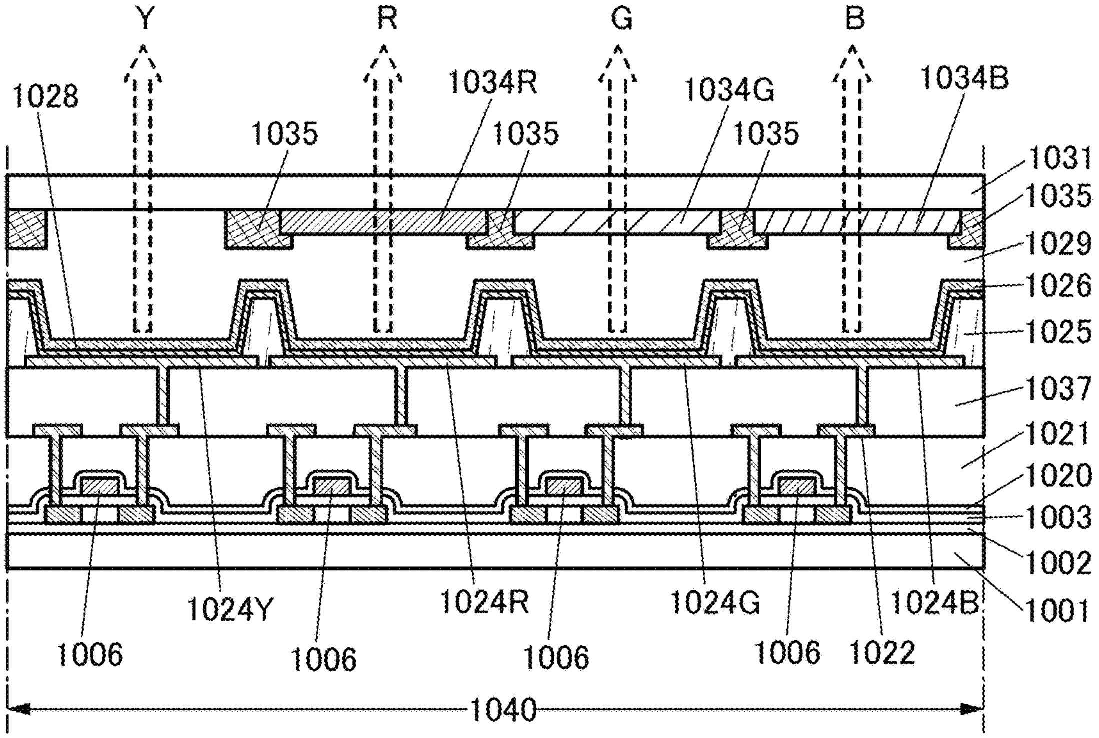

In the top-emission display devices illustrated in FIGS. 15A and 15B, a light-emitting element including the lower electrode 1024Y preferably has a microcavity structure between the lower electrode and the upper electrode 1026 and the lower electrodes 1024R, 1024G, 1024B, and 1024Y as in the display device illustrated in FIG. 12A. In the display device illustrated in FIG. 15A, sealing can be performed with the sealing substrate 1031 on which the coloring layers (the red coloring layer 1034R, the green coloring layer 1034G, the blue coloring layer 1034B, and the yellow coloring layer 1034Y) are provided.

Light emitted through the microcavity and the yellow coloring layer 1034Y has an emission spectrum in a yellow region. Since yellow is a color with a high luminosity factor, a light-emitting element emitting yellow light has high emission efficiency. Therefore, the display device of FIG. 15A can reduce power consumption.

FIG. 15A illustrates the structure provided with the light-emitting elements and the coloring layers for the light-emitting elements as an example; however, the structure is not limited thereto. For example, as shown in FIG. 15B, a structure including the red coloring layer 1034R, the green coloring layer 1034G, and the blue coloring layer 1034B but not including a yellow coloring layer may be employed to achieve full color display with the four colors of red, green, blue, and yellow or of red, green, blue, and white. The structure as illustrated in FIG. 15A where the light-emitting elements are provided with the coloring layers is effective to suppress reflection of external light. In contrast, the structure as illustrated in FIG. 15B where the light-emitting elements are provided with the red coloring layer, the green coloring layer, and the blue coloring layer and without the yellow coloring layer is effective to reduce power consumption because of small energy loss of light emitted from the yellow or white light-emitting element.

Structure Example 5 of Display Device

Next, a display device of another embodiment of the present invention is described with reference to FIG. 16.

Figure 16:
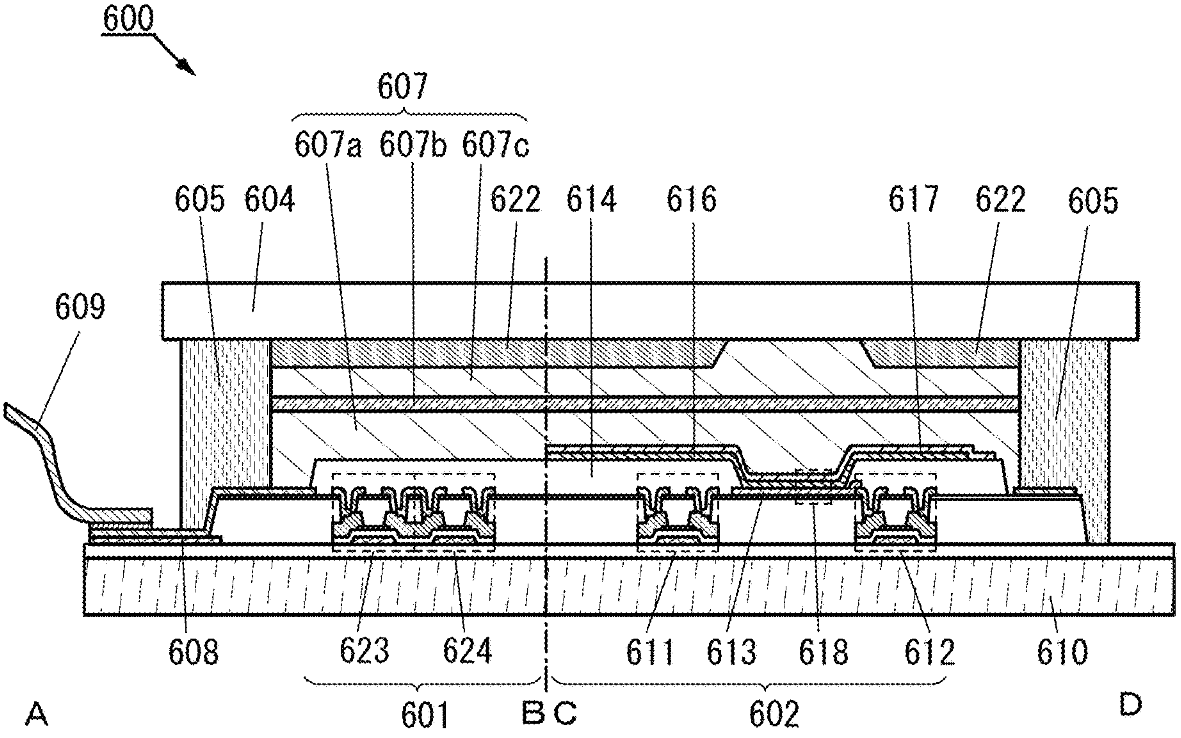
FIG. 16 is a schematic cross-sectional view illustrating a display device of one embodiment of the present invention.

FIG. 16 is a cross-sectional view taken along the dashed-dotted line A-B and the dashed-dotted line C-D in FIG. 9A. Note that in FIG. 16, portions having functions similar to those of portions in FIG. 9B are given the same reference numerals as in FIG. 9B, and a detailed description of the portions is omitted.

The display device 600 in FIG. 16 includes a sealing layer 607*a*, a sealing layer 607*b*, and a sealing layer 607*c* in a region 607 surrounded by the element substrate 610, the sealing substrate 604, and the sealant 605. For one or more of the sealing layer 607*a*, the sealing layer 607*b*, and the sealing layer 607*c*, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layers 607*a*, 607*b*, and 607*c* can prevent deterioration of the light-emitting element 618 due to impurities such as water, which is preferable. In the case where the sealing layers 607*a*, 607*b*, and 607*c* are formed, the sealant 605 is not necessarily provided.

Alternatively, any one or two of the sealing layers 607*a*, 607*b*, and 607*c* may be provided or four or more sealing layers may be formed. When the sealing layer has a multilayer structure, the impurities such as water can be effectively prevented from entering the light-emitting element 618 which is inside the display device from the outside of the display device 600. In the case where the sealing layer has a multilayer structure, a resin and an organic material are preferably stacked.

Structure Example 6 of Display Device

Although the display devices in the structure examples 1 to 4 in this embodiment each have a structure including optical elements, one embodiment of the present invention does not necessarily include an optical element.

Figure 17A:
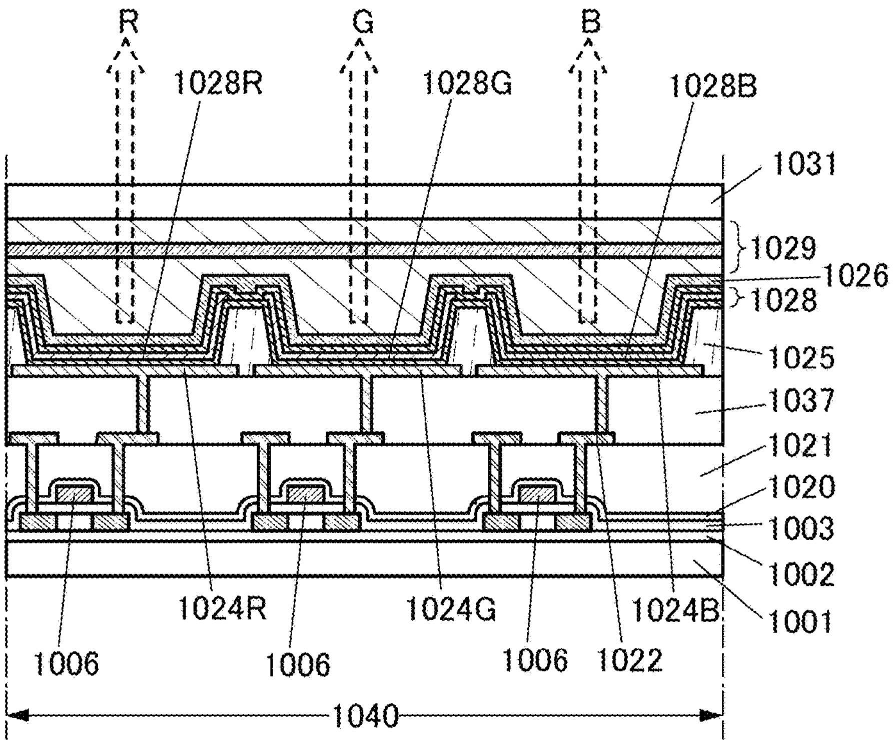
FIGS. 17A and 17B are schematic cross-sectional views each illustrating a display device of one embodiment of the present invention.
Figure 17B:
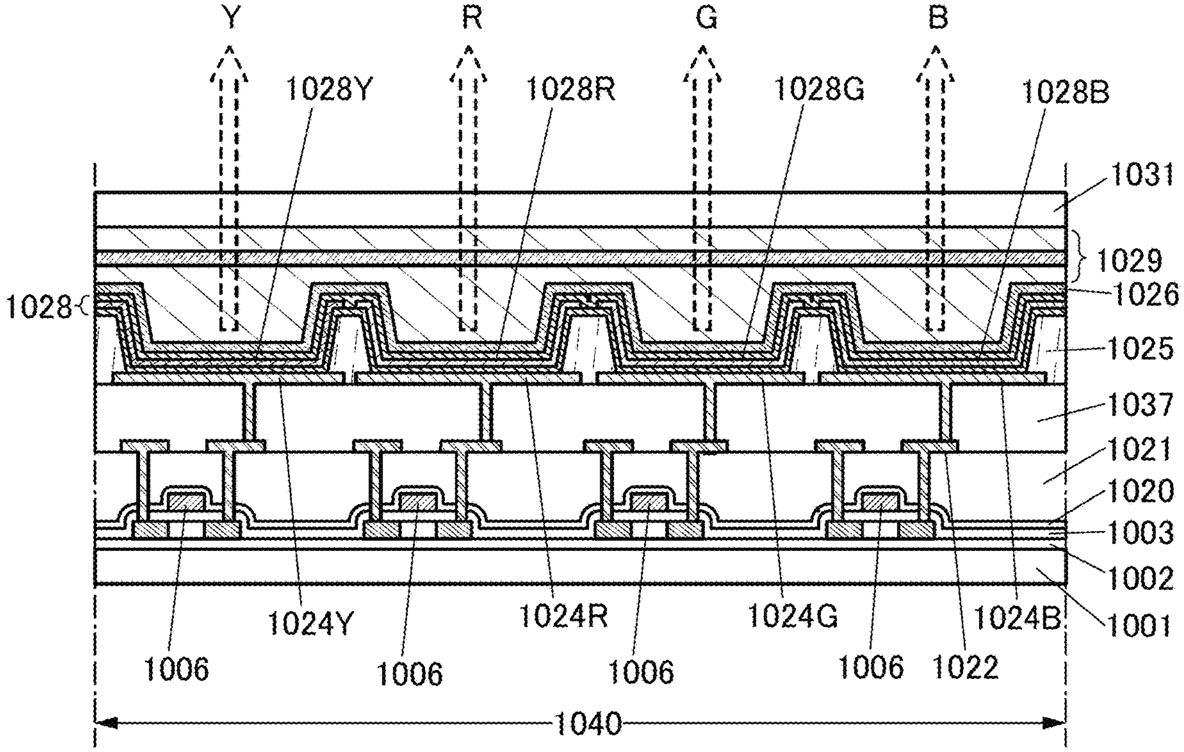

FIGS. 17A and 17B each illustrate a display device having a structure in which light is extracted from the sealing substrate 1031 side (a top-emission display device). FIG. 17A illustrates an example of a display device including a light-emitting layer 1028R, a light-emitting layer 1028G, and a light-emitting layer 1028B. FIG. 17B illustrates an example of a display device including a light-emitting layer 1028R, a light-emitting layer 1028G, a light-emitting layer 1028B, and a light-emitting layer 1028Y.

The light-emitting layer 1028R has a function of exhibiting red light, the light-emitting layer 1028G has a function of exhibiting green light, and the light-emitting layer 1028B has a function of exhibiting blue light. The light-emitting layer 1028Y has a function of exhibiting yellow light or a function of exhibiting light of a plurality of colors selected from blue, green, and red. The light-emitting layer 1028Y may exhibit whit light. Since the light-emitting element which exhibits yellow or white light has high light emission efficiency, the display device including the light-emitting layer 1028Y can have lower power consumption.

Each of the display devices in FIGS. 17A and 17B does not necessarily include coloring layers serving as optical elements because EL layers exhibiting light of different colors are included in sub-pixels.

For the sealing layer 1029, a resin such as a polyvinyl chloride (PVC) based resin, an acrylic-based resin, a polyimide-based resin, an epoxy-based resin, a silicone-based resin, a polyvinyl butyral (PVB) based resin, or an ethylene vinyl acetate (EVA) based resin can be used. Alternatively, an inorganic material such as silicon oxide, silicon oxynitride, silicon nitride oxide, silicon nitride, aluminum oxide, or aluminum nitride can be used. The formation of the sealing layer 1029 can prevent deterioration of the light-emitting element due to impurities such as water, which is preferable.

Alternatively, the sealing layer 1029 may have a single-layer or two-layer structure, or four or more sealing layers may be formed as the sealing layer 1029. When the sealing layer has a multilayer structure, the impurities such as water can be effectively prevented from entering the inside of the display device from the outside of the display device. In the case where the sealing layer has a multilayer structure, a resin and an organic material are preferably stacked.

Note that the sealing substrate 1031 has a function of protecting the light-emitting element. Thus, for the sealing substrate 1031, a flexible substrate or a film can be used.

The structures described in this embodiment can be combined as appropriate with any of the other structures in this embodiment and the other embodiments.

Embodiment 8

In this embodiment, a display device including a light-emitting element of one embodiment of the present invention will be described with reference to FIGS. 18A and 18B, FIGS. 19A and 19B, and FIGS. 20A and 20B.

Figure 18A:
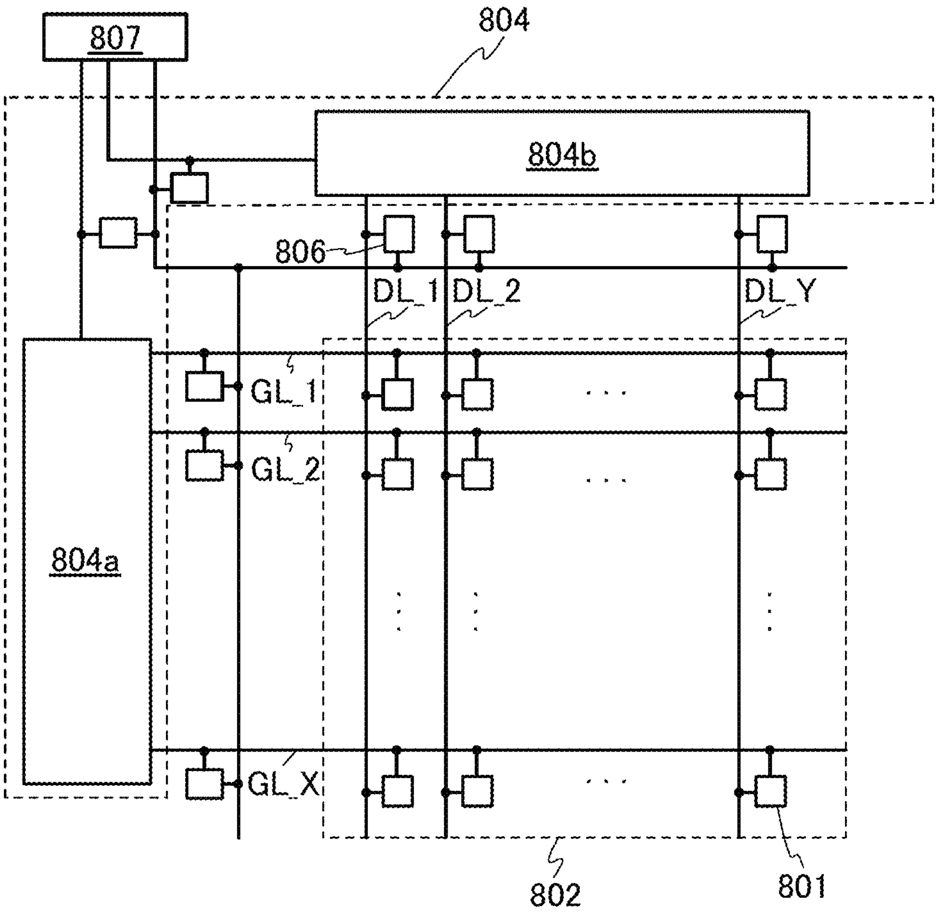
FIGS. 18A and 18B are a block diagram and a circuit diagram illustrating a display device of one embodiment of the present invention.
Figure 18B:
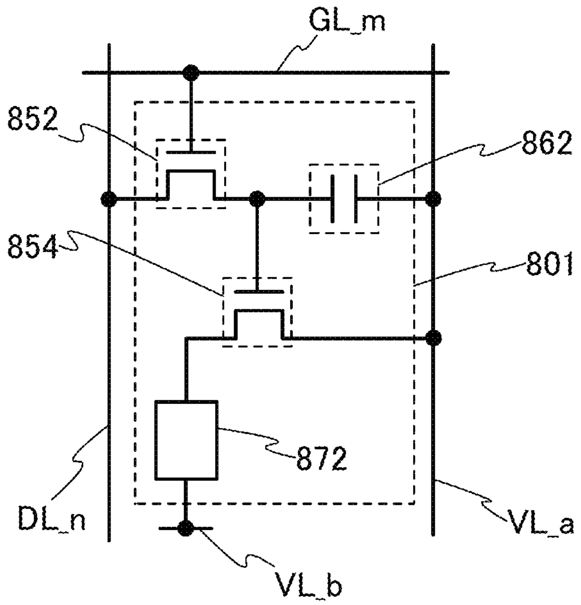

FIG. 18A is a block diagram illustrating the display device of one embodiment of the present invention, and FIG. 18B is a circuit diagram illustrating a pixel circuit of the display device of one embodiment of the present invention.

<Description of Display Device>

The display device illustrated in FIG. 18A includes a region including pixels of display elements (the region is hereinafter referred to as a pixel portion 802), a circuit portion provided outside the pixel portion 802 and including circuits for driving the pixels (the portion is hereinafter referred to as a driver circuit portion 804), circuits having a function of protecting elements (the circuits are hereinafter referred to as protection circuits 806), and a terminal portion 807. Note that the protection circuits 806 are not necessarily provided.

A part or the whole of the driver circuit portion 804 is preferably formed over a substrate over which the pixel portion 802 is formed, in which case the number of components and the number of terminals can be reduced. When a part or the whole of the driver circuit portion 804 is not formed over the substrate over which the pixel portion 802 is formed, the part or the whole of the driver circuit portion 804 can be mounted by COG or tape automated bonding (TAB).

The pixel portion 802 includes a plurality of circuits for driving display elements arranged in X rows (X is a natural number of 2 or more) and Y columns (Y is a natural number of 2 or more) (such circuits are hereinafter referred to as pixel circuits 801). The driver circuit portion 804 includes driver circuits such as a circuit for supplying a signal (scan signal) to select a pixel (the circuit is hereinafter referred to as a scan line driver circuit 804*a*) and a circuit for supplying a signal (data signal) to drive a display element in a pixel (the circuit is hereinafter referred to as a signal line driver circuit 804*b*).

The scan line driver circuit 804*a* includes a shift register or the like. Through the terminal portion 807, the scan line driver circuit 804*a* receives a signal for driving the shift register and outputs a signal. For example, the scan line driver circuit 804*a* receives a start pulse signal, a clock signal, or the like and outputs a pulse signal. The scan line driver circuit 804*a* has a function of controlling the potentials of wirings supplied with scan signals (such wirings are hereinafter referred to as scan lines GL_1 to GL_X). Note that a plurality of scan line driver circuits 804*a* may be provided to control the scan lines GL_1 to GL_X separately. Alternatively, the scan line driver circuit 804*a* has a function of supplying an initialization signal. Without being limited thereto, the scan line driver circuit 804*a* can supply another signal.

The signal line driver circuit 804*b* includes a shift register or the like. The signal line driver circuit 804*b* receives a signal (video signal) from which a data signal is derived, as well as a signal for driving the shift register, through the terminal portion 807. The signal line driver circuit 804*b* has a function of generating a data signal to be written to the pixel circuit 801 which is based on the video signal. In addition, the signal line driver circuit 804*b* has a function of controlling output of a data signal in response to a pulse signal produced by input of a start pulse signal, a clock signal, or the like. Furthermore, the signal line driver circuit 804*b* has a function of controlling the potentials of wirings supplied with data signals (such wirings are hereinafter referred to as data lines DL_1 to DL_Y). Alternatively, the signal line driver circuit 804*b* has a function of supplying an initialization signal. Without being limited thereto, the signal line driver circuit 804*b* can supply another signal.

The signal line driver circuit 804*b* includes a plurality of analog switches or the like, for example. The signal line driver circuit 804*b* can output, as the data signals, signals obtained by time-dividing the video signal by sequentially turning on the plurality of analog switches. The signal line driver circuit 804*b* may include a shift register or the like.

A pulse signal and a data signal are input to each of the plurality of pixel circuits 801 through one of the plurality of scan lines GL supplied with scan signals and one of the plurality of data lines DL supplied with data signals, respectively. Writing and holding of the data signal to and in each of the plurality of pixel circuits 801 are controlled by the scan line driver circuit 804*a*. For example, to the pixel circuit 801 in the m-th row and the n-th column (m is a natural number of less than or equal to X, and n is a natural number of less than or equal to Y), a pulse signal is input from the scan line driver circuit 804*a* through the scan line GL_m, and a data signal is input from the signal line driver circuit 804*b* through the data line DL_n in accordance with the potential of the scan line GL_m.

The protection circuit 806 shown in FIG. 18A is connected to, for example, the scan line GL between the scan line driver circuit 804*a* and the pixel circuit 801. Alternatively, the protection circuit 806 is connected to the data line DL between the signal line driver circuit 804*b* and the pixel circuit 801. Alternatively, the protection circuit 806 can be connected to a wiring between the scan line driver circuit 804*a* and the terminal portion 807. Alternatively, the protection circuit 806 can be connected to a wiring between the signal line driver circuit 804*b* and the terminal portion 807. Note that the terminal portion 807 means a portion having terminals for inputting power, control signals, and video signals to the display device from external circuits.

The protection circuit 806 is a circuit that electrically connects a wiring connected to the protection circuit to another wiring when a potential out of a certain range is applied to the wiring connected to the protection circuit.

As illustrated in FIG. 18A, the protection circuits 806 are provided for the pixel portion 802 and the driver circuit portion 804, so that the resistance of the display device to overcurrent generated by electrostatic discharge (ESD) or the like can be improved. Note that the configuration of the protection circuits 806 is not limited to that, and for example, a configuration in which the protection circuits 806 are connected to the scan line driver circuit 804*a* or a configuration in which the protection circuits 806 are connected to the signal line driver circuit 804*b* may be employed. Alternatively, the protection circuits 806 may be configured to be connected to the terminal portion 807.

In FIG. 18A, an example in which the driver circuit portion 804 includes the scan line driver circuit 804*a* and the signal line driver circuit 804*b* is shown; however, the structure is not limited thereto. For example, only the scan line driver circuit 804*a* may be formed and a separately prepared substrate where a signal line driver circuit is formed (e.g., a driver circuit substrate formed with a single crystal semiconductor film or a polycrystalline semiconductor film) may be mounted.

<Structure Example of Pixel Circuit>

Each of the plurality of pixel circuits 801 in FIG. 18A can have a structure illustrated in FIG. 18B, for example.

The pixel circuit 801 illustrated in FIG. 18B includes transistors 852 and 854, a capacitor 862, and a light-emitting element 872.

One of a source electrode and a drain electrode of the transistor 852 is electrically connected to a wiring to which a data signal is supplied (a data line DL_n). A gate electrode of the transistor 852 is electrically connected to a wiring to which a gate signal is supplied (a scan line GL_m).

The transistor 852 has a function of controlling whether to write a data signal.

One of a pair of electrodes of the capacitor 862 is electrically connected to a wiring to which a potential is supplied (hereinafter referred to as a potential supply line VL_a), and the other is electrically connected to the other of the source electrode and the drain electrode of the transistor 852.

The capacitor 862 functions as a storage capacitor for storing written data.

One of a source electrode and a drain electrode of the transistor 854 is electrically connected to the potential supply line VL_a. Furthermore, a gate electrode of the transistor 854 is electrically connected to the other of the source electrode and the drain electrode of the transistor 852.

One of an anode and a cathode of the light-emitting element 872 is electrically connected to a potential supply line VL_b, and the other is electrically connected to the other of the source electrode and the drain electrode of the transistor 854.

As the light-emitting element 872, any of the light-emitting elements described in Embodiments 1, 4, 5, and 6 can be used.

Note that a high power supply potential VDD is supplied to one of the potential supply line VL_a and the potential supply line VL_b, and a low power supply potential VSS is supplied to the other.

In the display device including the pixel circuits 801 in FIG. 18B, the pixel circuits 801 are sequentially selected row by row by the scan line driver circuit 804*a* in FIG. 18A, for example, whereby the transistors 852 are turned on and a data signal is written.

When the transistors 852 are turned off, the pixel circuits 801 in which the data has been written are brought into a holding state. Furthermore, the amount of current flowing between the source electrode and the drain electrode of the transistor 854 is controlled in accordance with the potential of the written data signal. The light-emitting element 872 emits light with a luminance corresponding to the amount of flowing current. This operation is sequentially performed row by row; thus, an image is displayed.

Alternatively, the pixel circuit can have a function of compensating variation in threshold voltages or the like of a transistor. FIGS. 19A and 19B and FIGS. 20A and 20B illustrate examples of the pixel circuit.

Figure 19A:
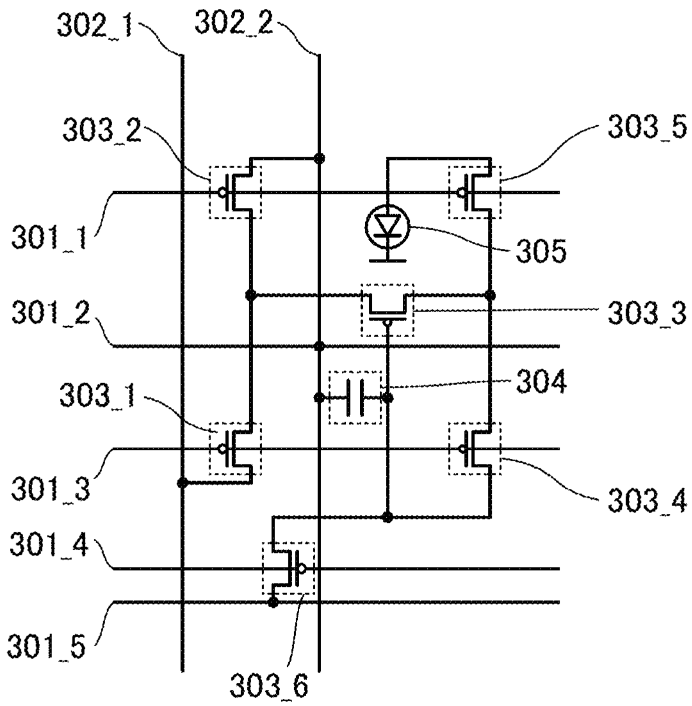
FIGS. 19A and 19B are circuit diagrams each illustrating a pixel circuit of a display device of one embodiment of the present invention.

The pixel circuit illustrated in FIG. 19A includes six transistors (transistors 303_1 to 303_6), a capacitor 304, and a light-emitting element 305. The pixel circuit illustrated in FIG. 19A is electrically connected to wirings 301_1 to 301_5 and wirings 302_1 and 302_2. Note that as the transistors 303_1 to 3036, for example, p-channel transistors can be used.

Figure 19B:
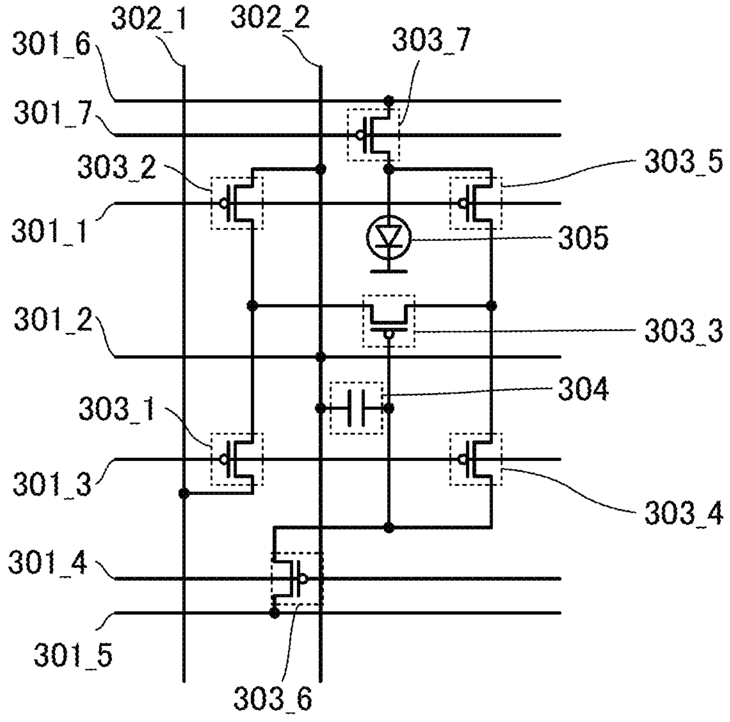

The pixel circuit shown in FIG. 19B has a configuration in which a transistor 303_7 is added to the pixel circuit shown in FIG. 19A. The pixel circuit illustrated in FIG. 19B is electrically connected to wirings 301_6 and 301_7. The wirings 301_5 and 301_6 may be electrically connected to each other. Note that as the transistor 3037, for example, a p-channel transistor can be used.

Figure 20A:
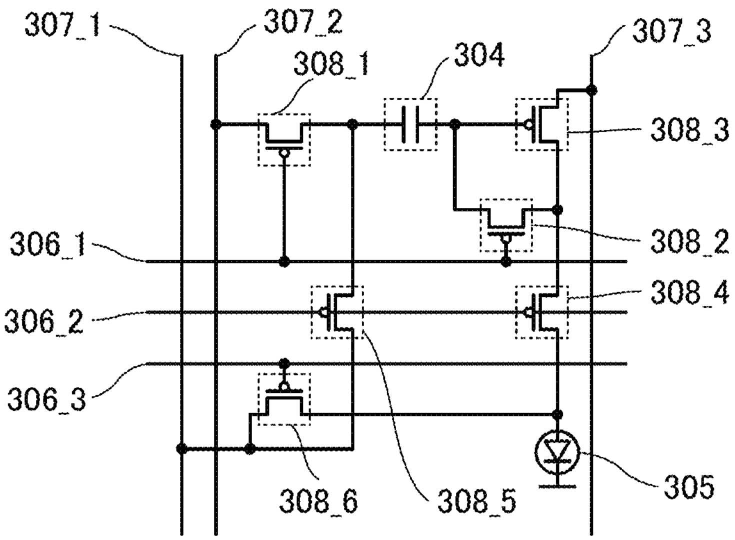
FIGS. 20A and 20B are circuit diagrams each illustrating a pixel circuit of a display device of one embodiment of the present invention.

The pixel circuit shown in FIG. 20A includes six transistors (transistors 308_1 to 308_6), the capacitor 304, and the light-emitting element 305. The pixel circuit illustrated in FIG. 20A is electrically connected to wirings 306_1 to 306_3 and wirings 307_1 to 307_3. The wirings 306_1 and 306_3 may be electrically connected to each other. Note that as the transistors 308_1 to 308_6, for example, p-channel transistors can be used.

Figure 20B:
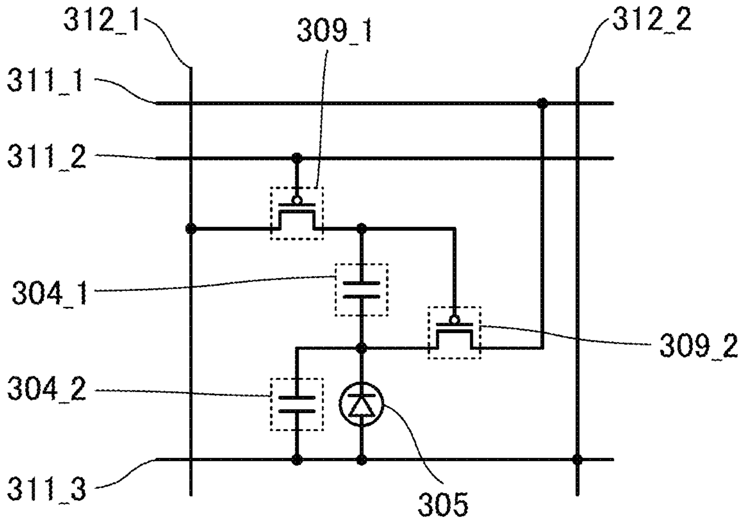

The pixel circuit illustrated in FIG. 20B includes two transistors (transistors 309_1 and 309_2), two capacitors (capacitors 304_1 and 304_2), and the light-emitting element 305. The pixel circuit illustrated in FIG. 20B is electrically connected to wirings 311_1 to 311_3 and wirings 312_1 and 312_2. With the configuration of the pixel circuit illustrated in FIG. 20B, the pixel circuit can be driven by a voltage inputting current driving method (also referred to as CVCC). Note that as the transistors 309_1 and 3092, for example, p-channel transistors can be used.

A light-emitting element of one embodiment of the present invention can be used for an active matrix method in which an active element is included in a pixel of a display device or a passive matrix method in which an active element is not included in a pixel of a display device.

In the active matrix method, as an active element (a non-linear element), not only a transistor but also a variety of active elements (non-linear elements) can be used. For example, a metal insulator metal (MIM), a thin film diode (TFD), or the like can also be used. Since these elements can be formed with a smaller number of manufacturing steps, manufacturing cost can be reduced or yield can be improved. Alternatively, since the size of these elements is small, the aperture ratio can be improved, so that power consumption can be reduced and higher luminance can be achieved.

As a method other than the active matrix method, the passive matrix method in which an active element (a non-linear element) is not used can also be used. Since an active element (a non-linear element) is not used, the number of manufacturing steps is small, so that manufacturing cost can be reduced or yield can be improved. Alternatively, since an active element (a non-linear element) is not used, the aperture ratio can be improved, so that power consumption can be reduced or higher luminance can be achieved, for example.

The structure described in this embodiment can be used in combination with any of the structures described in the other embodiments as appropriate.

Embodiment 9

In this embodiment, a display device including a light-emitting element of one embodiment of the present invention and an electronic device in which the display device is provided with an input device will be described with reference to FIGS. 21A and 21B, FIGS. 22A to 22C, FIGS. 23A and 23B, FIGS. 24A and 24B, and FIG. 25.

<Description 1 of Touch Panel>

In this embodiment, a touch panel 2000 including a display device and an input device will be described as an example of an electronic device. In addition, an example in which a touch sensor is included as an input device will be described.

Figure 21A:
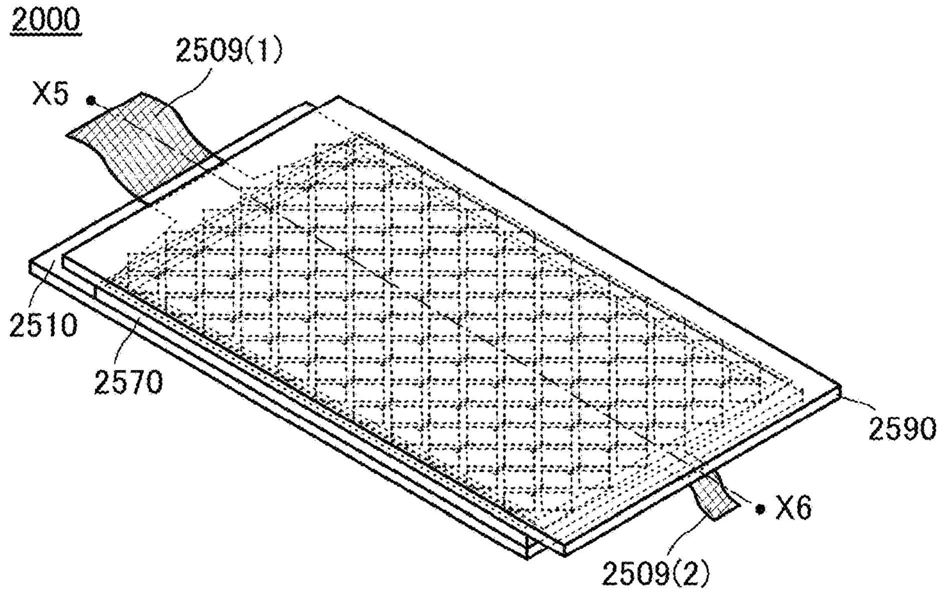
FIGS. 21A and 21B are perspective views illustrating an example of a touch panel of one embodiment of the present invention.
Figure 21B:
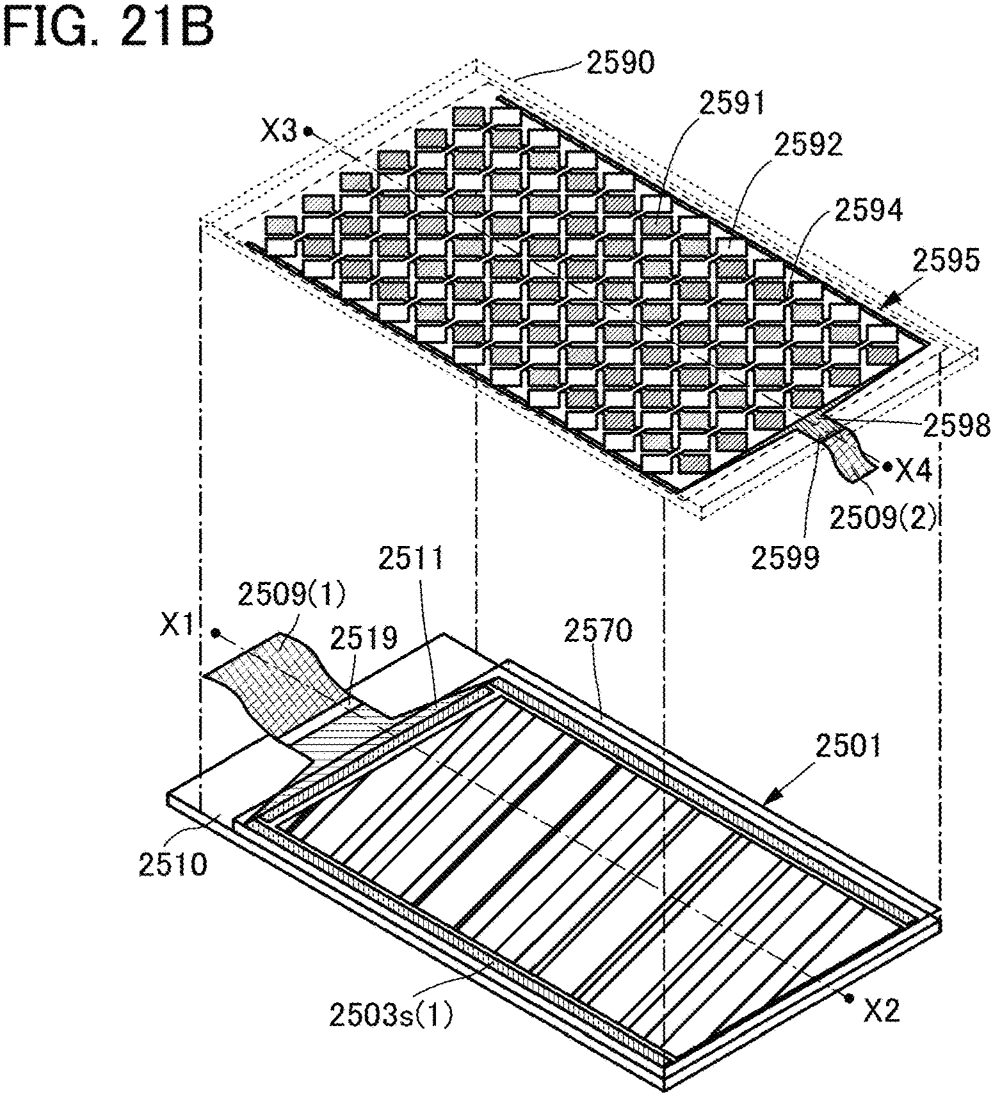

FIGS. 21A and 21B are perspective views of the touch panel 2000. Note that FIGS. 21A and 21B illustrate only main components of the touch panel 2000 for simplicity.

The touch panel 2000 includes a display device 2501 and a touch sensor 2595 (see FIG. 21B). The touch panel 2000 also includes a substrate 2510, a substrate 2570, and a substrate 2590. The substrate 2510, the substrate 2570, and the substrate 2590 each have flexibility. Note that one or all of the substrates 2510, 2570, and 2590 may be inflexible.

The display device 2501 includes a plurality of pixels over the substrate 2510 and a plurality of wirings 2511 through which signals are supplied to the pixels. The plurality of wirings 2511 are led to a peripheral portion of the substrate 2510, and parts of the plurality of wirings 2511 form a terminal 2519. The terminal 2519 is electrically connected to an FPC 2509(1). The plurality of wirings 2511 can supply signals from a signal line driver circuit 2503_s_(1) to the plurality of pixels.

The substrate 2590 includes the touch sensor 2595 and a plurality of wirings 2598 electrically connected to the touch sensor 2595. The plurality of wirings 2598 are led to a peripheral portion of the substrate 2590, and parts of the plurality of wirings 2598 form a terminal. The terminal is electrically connected to an FPC 2509(2). Note that in FIG. 21B, electrodes, wirings, and the like of the touch sensor 2595 provided on the back side of the substrate 2590 (the side facing the substrate 2510) are indicated by solid lines for clarity.

As the touch sensor 2595, a capacitive touch sensor can be used. Examples of the capacitive touch sensor are a surface capacitive touch sensor and a projected capacitive touch sensor.

Examples of the projected capacitive touch sensor are a self capacitive touch sensor and a mutual capacitive touch sensor, which differ mainly in the driving method. The use of a mutual capacitive type is preferable because multiple points can be sensed simultaneously.

Note that the touch sensor 2595 illustrated in FIG. 21B is an example of using a projected capacitive touch sensor.

Note that a variety of sensors that can sense proximity or touch of a sensing target such as a finger can be used as the touch sensor 2595.

The projected capacitive touch sensor 2595 includes electrodes 2591 and electrodes 2592. The electrodes 2591 are electrically connected to any of the plurality of wirings 2598, and the electrodes 2592 are electrically connected to any of the other wirings 2598.

The electrodes 2592 each have a shape of a plurality of quadrangles arranged in one direction with one corner of a quadrangle connected to one corner of another quadrangle as illustrated in FIGS. 21A and 21B.

The electrodes 2591 each have a quadrangular shape and are arranged in a direction intersecting with the direction in which the electrodes 2592 extend.

A wiring 2594 electrically connects two electrodes 2591 between which the electrode 2592 is positioned. The intersecting area of the electrode 2592 and the wiring 2594 is preferably as small as possible. Such a structure allows a reduction in the area of a region where the electrodes are not provided, reducing variation in transmittance. As a result, variation in luminance of light passing through the touch sensor 2595 can be reduced.

Note that the shapes of the electrodes 2591 and the electrodes 2592 are not limited thereto and can be any of a variety of shapes. For example, a structure may be employed in which the plurality of electrodes 2591 are arranged so that gaps between the electrodes 2591 are reduced as much as possible, and the electrodes 2592 are spaced apart from the electrodes 2591 with an insulating layer interposed therebetween to have regions not overlapping with the electrodes 2591. In this case, it is preferable to provide, between two adjacent electrodes 2592, a dummy electrode electrically insulated from these electrodes because the area of regions having different transmittances can be reduced.

<Description of Display Device>

Figure 22A:
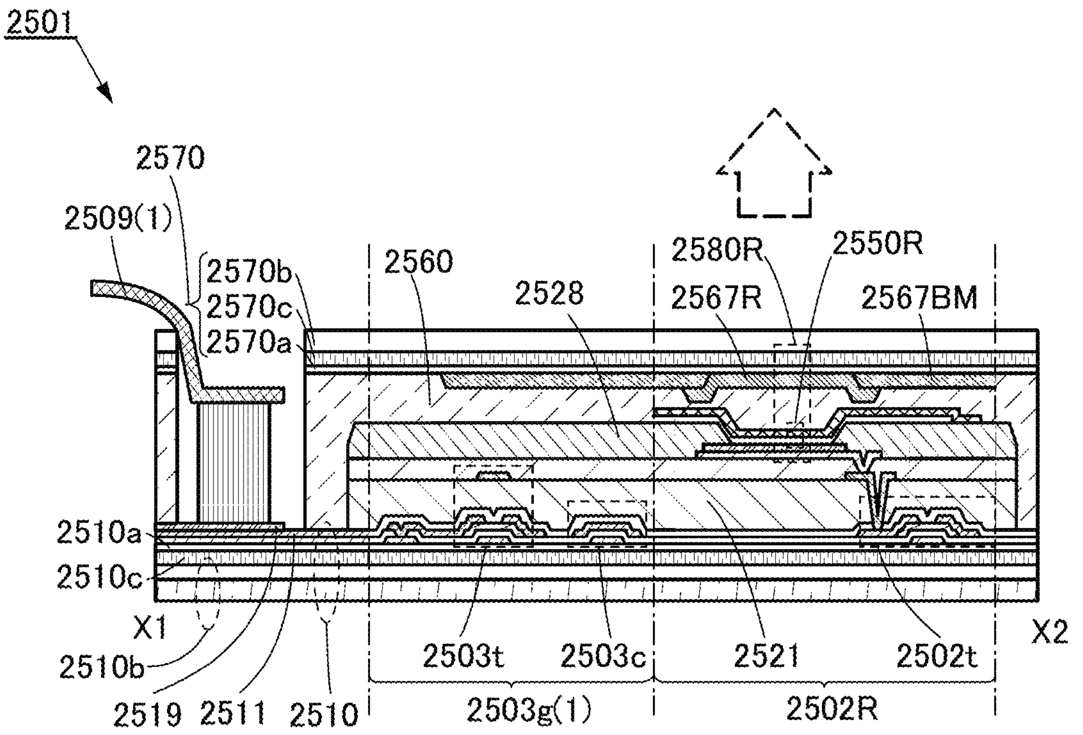
FIGS. 22A to 22C are cross-sectional views illustrating an example of a display device and a touch sensor of one embodiment of the present invention.

Next, the display device 2501 will be described in detail with reference to FIG. 22A. FIG. 22A corresponds to a cross-sectional view taken along dashed-dotted line X1-X2 in FIG. 21B.

The display device 2501 includes a plurality of pixels arranged in a matrix. Each of the pixels includes a display element and a pixel circuit for driving the display element.

In the following description, an example of using a light-emitting element that emits white light as a display element will be described; however, the display element is not limited to such an element. For example, light-emitting elements that emit light of different colors may be included so that the light of different colors can be emitted from adjacent pixels.

For the substrate 2510 and the substrate 2570, for example, a flexible material with a vapor permeability of lower than or equal to $1\times10^{-5}$ $g\cdot m^{-2}\cdot day^{-1}$, preferably lower than or equal to $1\times10^{-6}$ $g\cdot m^{-2}\cdot day^{-1}$ can be favorably used. Alternatively, materials whose thermal expansion coefficients are substantially equal to each other are preferably used for the substrate 2510 and the substrate 2570. For example, the coefficients of linear expansion of the materials are preferably lower than or equal to $1\times10^{-3}$/K, further preferably lower than or equal to $5\times10^{-5}$/K, and still further preferably lower than or equal to $1\times10^{-5}$/K.

Note that the substrate 2510 is a stacked body including an insulating layer 2510_a_ for preventing impurity diffusion into the light-emitting element, a flexible substrate 2510_b_, and an adhesive layer 2510_c_ for attaching the insulating layer 2510_a_ and the flexible substrate 2510_b_ to each other. The substrate 2570 is a stacked body including an insulating layer 2570_a_ for preventing impurity diffusion into the light-emitting element, a flexible substrate 2570_b_, and an adhesive layer 2570_c_ for attaching the insulating layer 2570_a_ and the flexible substrate 2570_b_ to each other.

For the adhesive layer 2510_c_ and the adhesive layer 2570_c_, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

A sealing layer 2560 is provided between the substrate 2510 and the substrate 2570. The sealing layer 2560 preferably has a refractive index higher than that of air. In the case where light is extracted to the sealing layer 2560 side as illustrated in FIG. 22A, the sealing layer 2560 can also serve as an optical adhesive layer.

A sealant may be formed in the peripheral portion of the sealing layer 2560. With the use of the sealant, a light-emitting element 2550R can be provided in a region surrounded by the substrate 2510, the substrate 2570, the sealing layer 2560, and the sealant. Note that an inert gas (such as nitrogen and argon) may be used instead of the sealing layer 2560. A drying agent may be provided in the inert gas so as to adsorb moisture or the like. A resin such as an acrylic resin or an epoxy resin may be used. An epoxy-based resin or a glass frit is preferably used as the sealant. As a material used for the sealant, a material which is impermeable to moisture and oxygen is preferably used.

The display device 2501 includes a pixel 2502R. The pixel 2502R includes a light-emitting module 2580R.

The pixel 2502R includes the light-emitting element 2550R and a transistor 2502*t* that can supply electric power to the light-emitting element 2550R. Note that the transistor 2502*t* functions as part of the pixel circuit. The light-emitting module 2580R includes the light-emitting element 2550R and a coloring layer 2567R.

The light-emitting element 2550R includes a lower electrode, an upper electrode, and an EL layer between the lower electrode and the upper electrode. As the light-emitting element 2550R, any of the light-emitting elements described in Embodiments 1, 4, 5, and 6 can be used.

A microcavity structure may be employed between the lower electrode and the upper electrode so as to increase the intensity of light having a specific wavelength.

In the case where the sealing layer 2560 is provided on the light extraction side, the sealing layer 2560 is in contact with the light-emitting element 2550R and the coloring layer 2567R.

The coloring layer 2567R is positioned in a region overlapping with the light-emitting element 2550R. Accordingly, part of light emitted from the light-emitting element 2550R passes through the coloring layer 2567R and is emitted to the outside of the light-emitting module 2580R as indicated by an arrow in the drawing.

The display device 2501 includes a light-blocking layer 2567BM on the light extraction side. The light-blocking layer 2567BM is provided so as to surround the coloring layer 2567R.

The coloring layer 2567R is a coloring layer having a function of transmitting light in a particular wavelength region. For example, a color filter for transmitting light in a red wavelength region, a color filter for transmitting light in a green wavelength region, a color filter for transmitting light in a blue wavelength region, a color filter for transmitting light in a yellow wavelength region, or the like can be used. Each color filter can be formed with any of various materials by a printing method, an inkjet method, an etching method using a photolithography technique, or the like.

An insulating layer 2521 is provided in the display device 2501. The insulating layer 2521 covers the transistor 2502*t*. Note that the insulating layer 2521 has a function of covering unevenness caused by the pixel circuit. The insulating layer 2521 may have a function of suppressing impurity diffusion. This can prevent the reliability of the transistor 2502*t* or the like from being lowered by impurity diffusion.

The light-emitting element 2550R is formed over the insulating layer 2521. A partition 2528 is provided so as to overlap with an end portion of the lower electrode of the light-emitting element 2550R. Note that a spacer for controlling the distance between the substrate 2510 and the substrate 2570 may be formed over the partition 2528.

A scan line driver circuit 2503*g*(1) includes a transistor 2503*t* and a capacitor 2503*c*. Note that the driver circuit can be formed in the same process and over the same substrate as those of the pixel circuits.

The wirings 2511 through which signals can be supplied are provided over the substrate 2510. The terminal 2519 is provided over the wirings 2511. The FPC 2509(1) is electrically connected to the terminal 2519. The FPC 2509(1) has a function of supplying a video signal, a clock signal, a start signal, a reset signal, or the like. Note that the FPC 2509(1) may be provided with a PWB.

Figure 22B:
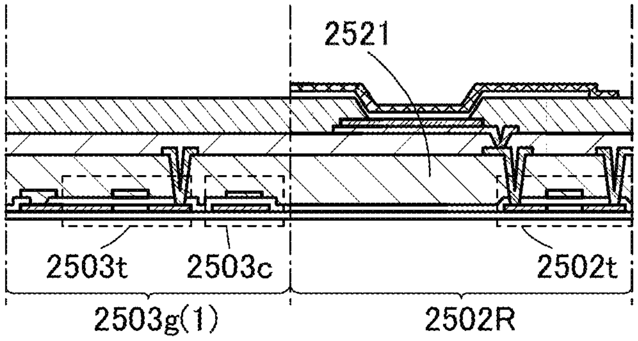

In the display device 2501, transistors with any of a variety of structures can be used. FIG. 22A illustrates an example of using bottom-gate transistors; however, the present invention is not limited to this example, and top-gate transistors may be used in the display device 2501 as illustrated in FIG. 22B.

In addition, there is no particular limitation on the polarity of the transistor 2502*t* and the transistor 2503*t*. For these transistors, n-channel and p-channel transistors may be used, or either n-channel transistors or p-channel transistors may be used, for example. Furthermore, there is no particular limitation on the crystallinity of a semiconductor film used for the transistors 2502*t* and 2503*t*. For example, an amorphous semiconductor film or a crystalline semiconductor film may be used. Examples of semiconductor materials include Group 14 semiconductors (e.g., a semiconductor including silicon), compound semiconductors (including oxide semiconductors), organic semiconductors, and the like. An oxide semiconductor that has an energy gap of 2 eV or more, preferably 2.5 eV or more, further preferably 3 eV or more is preferably used for one of the transistors 2502*t* and 2503*t* or both, so that the off-state current of the transistors can be reduced. Examples of the oxide semiconductors include an In—Ga oxide, an In-M-Zn oxide (M represents Al, Ga, Y, Zr, La, Ce, Sn, Hf, or Nd), and the like.

<Description of Touch Sensor>

Figure 22C:
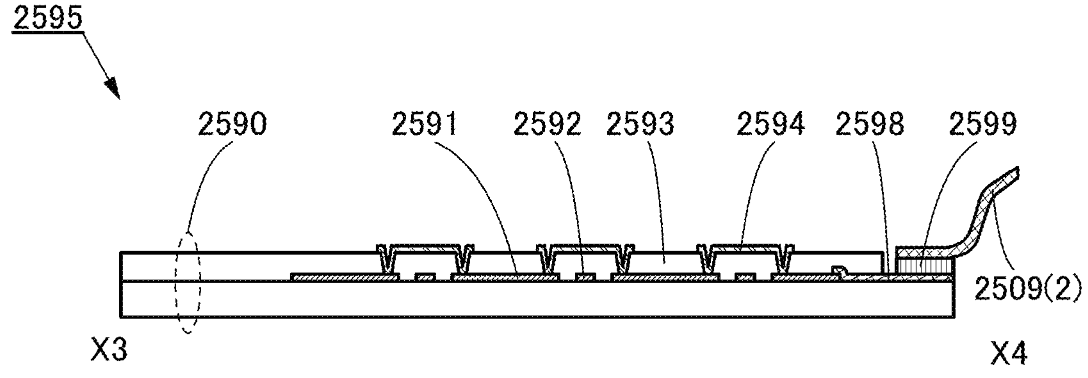

Next, the touch sensor 2595 will be described in detail with reference to FIG. 22C. FIG. 22C corresponds to a cross-sectional view taken along dashed-dotted line X3-X4 in FIG. 21B.

The touch sensor 2595 includes the electrodes 2591 and the electrodes 2592 provided in a staggered arrangement on the substrate 2590, an insulating layer 2593 covering the electrodes 2591 and the electrodes 2592, and the wiring 2594 that electrically connects the adjacent electrodes 2591 to each other.

The electrodes 2591 and the electrodes 2592 are formed using a light-transmitting conductive material. As a light-transmitting conductive material, a conductive oxide such as indium oxide, indium tin oxide, indium zinc oxide, zinc oxide, or zinc oxide to which gallium is added can be used. Note that a film including graphene may be used as well. The film including graphene can be formed, for example, by reducing a film containing graphene oxide. As a reducing method, a method with application of heat or the like can be employed.

The electrodes 2591 and the electrodes 2592 may be formed by, for example, depositing a light-transmitting conductive material on the substrate 2590 by a sputtering method and then removing an unnecessary portion by any of various pattern forming techniques such as photolithography.

Examples of a material for the insulating layer 2593 are a resin such as an acrylic resin or an epoxy resin, a resin having a siloxane bond, and an inorganic insulating material such as silicon oxide, silicon oxynitride, or aluminum oxide.

Openings reaching the electrodes 2591 are formed in the insulating layer 2593, and the wiring 2594 electrically connects the adjacent electrodes 2591. A light-transmitting conductive material can be favorably used as the wiring 2594 because the aperture ratio of the touch panel can be increased. Moreover, a material with higher conductivity than the conductivities of the electrodes 2591 and 2592 can be favorably used for the wiring 2594 because electric resistance can be reduced.

One electrode 2592 extends in one direction, and a plurality of electrodes 2592 are provided in the form of stripes. The wiring 2594 intersects with the electrode 2592.

Adjacent electrodes 2591 are provided with one electrode 2592 provided therebetween. The wiring 2594 electrically connects the adjacent electrodes 2591.

Note that the plurality of electrodes 2591 are not necessarily arranged in the direction orthogonal to one electrode 2592 and may be arranged to intersect with one electrode 2592 at an angle of more than 0 degrees and less than 90 degrees.

The wiring 2598 is electrically connected to any of the electrodes 2591 and 2592. Part of the wiring 2598 functions as a terminal. For the wiring 2598, a metal material such as aluminum, gold, platinum, silver, nickel, titanium, tungsten, chromium, molybdenum, iron, cobalt, copper, or palladium or an alloy material containing any of these metal materials can be used.

Note that an insulating layer that covers the insulating layer 2593 and the wiring 2594 may be provided to protect the touch sensor 2595.

A connection layer 2599 electrically connects the wiring 2598 to the FPC 2509(2).

As the connection layer 2599, any of various anisotropic conductive films (ACF), anisotropic conductive pastes (ACP), or the like can be used.

<Description 2 of Touch Panel>

Figure 23A:
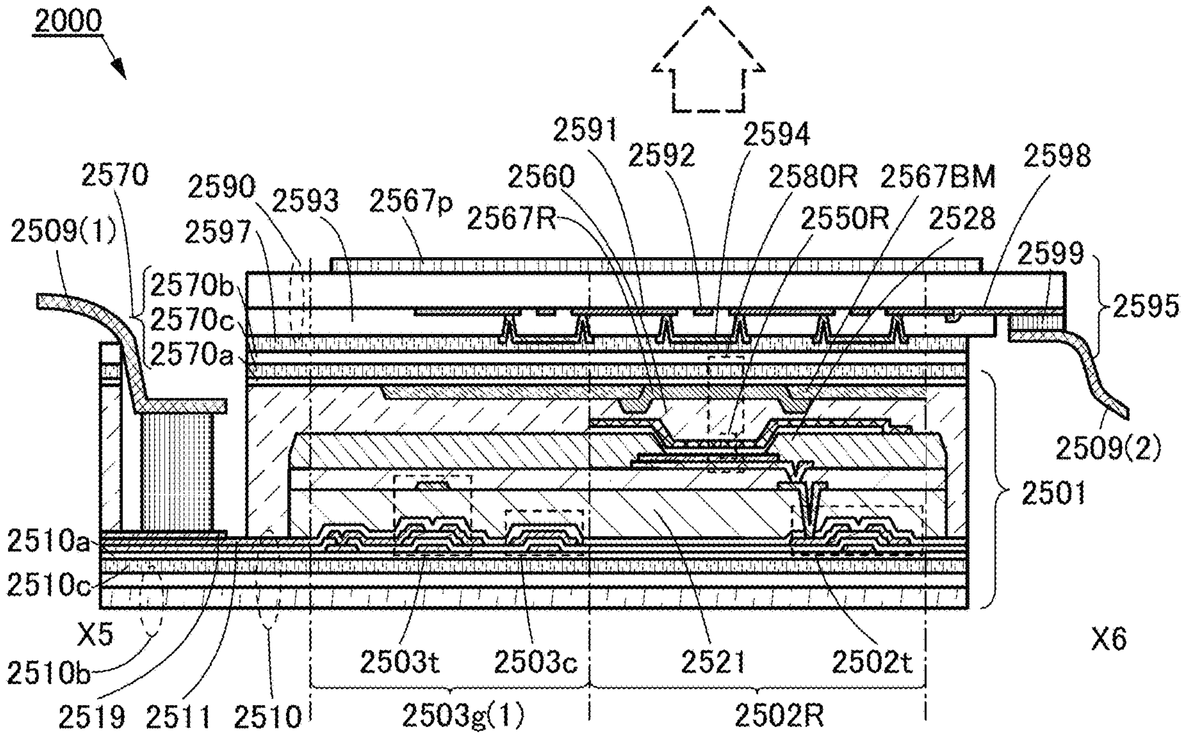
FIGS. 23A and 23B are cross-sectional views each illustrating an example of a touch panel of one embodiment of the present invention.

Next, the touch panel 2000 will be described in detail with reference to FIG. 23A. FIG. 23A corresponds to a cross-sectional view taken along dashed-dotted line X5-X6 in FIG. 21A.

In the touch panel 2000 illustrated in FIG. 23A, the display device 2501 described with reference to FIG. 22A and the touch sensor 2595 described with reference to FIG. 22C are attached to each other.

The touch panel 2000 illustrated in FIG. 23A includes an adhesive layer 2597 and an anti-reflective layer 2567*p* in addition to the components described with reference to FIGS. 22A and 22C.

The adhesive layer 2597 is provided in contact with the wiring 2594. Note that the adhesive layer 2597 attaches the substrate 2590 to the substrate 2570 so that the touch sensor 2595 overlaps with the display device 2501. The adhesive layer 2597 preferably has a light-transmitting property. A heat curable resin or an ultraviolet curable resin can be used for the adhesive layer 2597. For example, an acrylic resin, a urethane-based resin, an epoxy-based resin, or a siloxane-based resin can be used.

The anti-reflective layer 2567*p* is positioned in a region overlapping with pixels. As the anti-reflective layer 2567*p*, a circularly polarizing plate can be used, for example.

Next, a touch panel having a structure different from that illustrated in FIG. 23A will be described with reference to FIG. 23B.

Figure 23B:
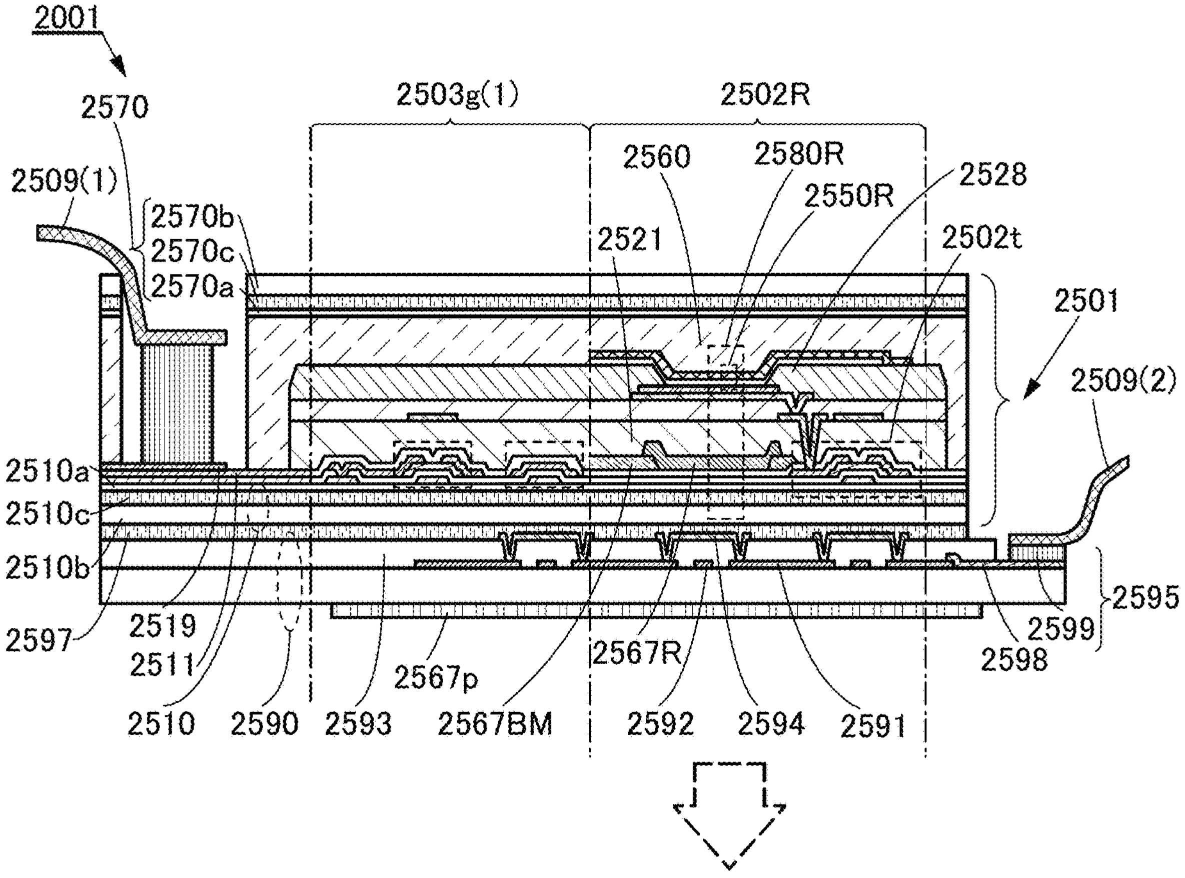

FIG. 23B is a cross-sectional view of a touch panel 2001. The touch panel 2001 illustrated in FIG. 23B differs from the touch panel 2000 illustrated in FIG. 23A in the position of the touch sensor 2595 relative to the display device 2501. Different parts are described in detail below, and the above description of the touch panel 2000 is referred to for the other similar parts.

The coloring layer 2567R is positioned in a region overlapping with the light-emitting element 2550R. The light-emitting element 2550R illustrated in FIG. 23B emits light to the side where the transistor 2502*t* is provided. Accordingly, part of light emitted from the light-emitting element 2550R passes through the coloring layer 2567R and is emitted to the outside of the light-emitting module 2580R as indicated by an arrow in FIG. 23B.

The touch sensor 2595 is provided on the substrate 2510 side of the display device 2501.

The adhesive layer 2597 is provided between the substrate 2510 and the substrate 2590 and attaches the touch sensor 2595 to the display device 2501.

As illustrated in FIG. 23A or 23B, light may be emitted from the light-emitting element through one or both of the substrate 2510 and the substrate 2570.

<Description of Method for Driving Touch Panel>

Next, an example of a method for driving a touch panel will be described with reference to FIGS. 24A and 24B.

Figure 24A:
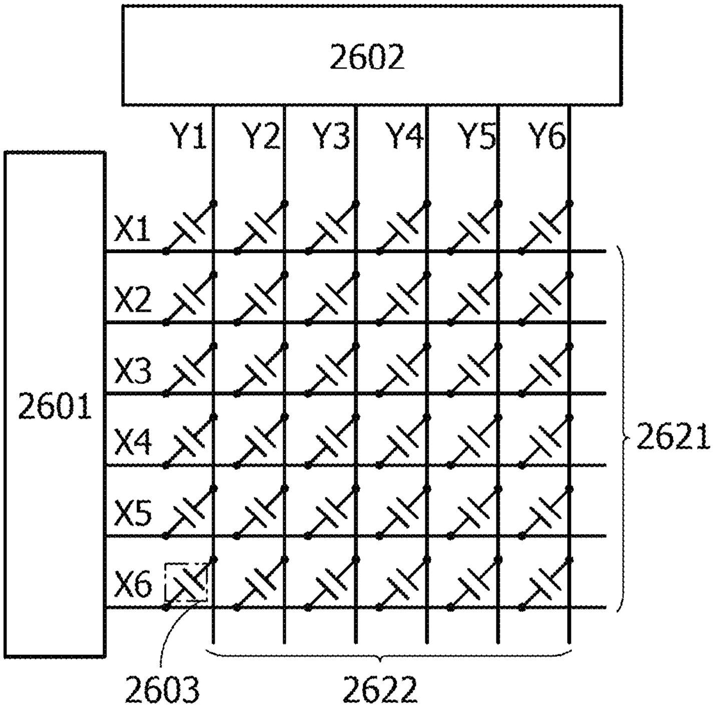
FIGS. 24A and 24B are a block diagram and a timing chart of a touch sensor of one embodiment of the present invention.

FIG. 24A is a block diagram illustrating the structure of a mutual capacitive touch sensor. FIG. 24A illustrates a pulse voltage output circuit 2601 and a current sensing circuit 2602. Note that in FIG. 24A, six wirings X1 to X6 represent the electrodes 2621 to which a pulse voltage is applied, and six wirings Y1 to Y6 represent the electrodes 2622 that detect changes in current. FIG. 24A also illustrates capacitors 2603 that are each formed in a region where the electrodes 2621 and 2622 overlap with each other. Note that functional replacement between the electrodes 2621 and 2622 is possible.

The pulse voltage output circuit 2601 is a circuit for sequentially applying a pulse voltage to the wirings X1 to X6. By application of a pulse voltage to the wirings X1 to X6, an electric field is generated between the electrodes 2621 and 2622 of the capacitor 2603. When the electric field between the electrodes is shielded, for example, a change occurs in the capacitor 2603 (mutual capacitance). The approach or contact of a sensing target can be sensed by utilizing this change.

The current sensing circuit 2602 is a circuit for detecting changes in current flowing through the wirings Y1 to Y6 that are caused by the change in mutual capacitance in the capacitor 2603. No change in current value is detected in the wirings Y1 to Y6 when there is no approach or contact of a sensing target, whereas a decrease in current value is detected when mutual capacitance is decreased owing to the approach or contact of a sensing target. Note that an integrator circuit or the like is used for sensing of current values.

Figure 24B:
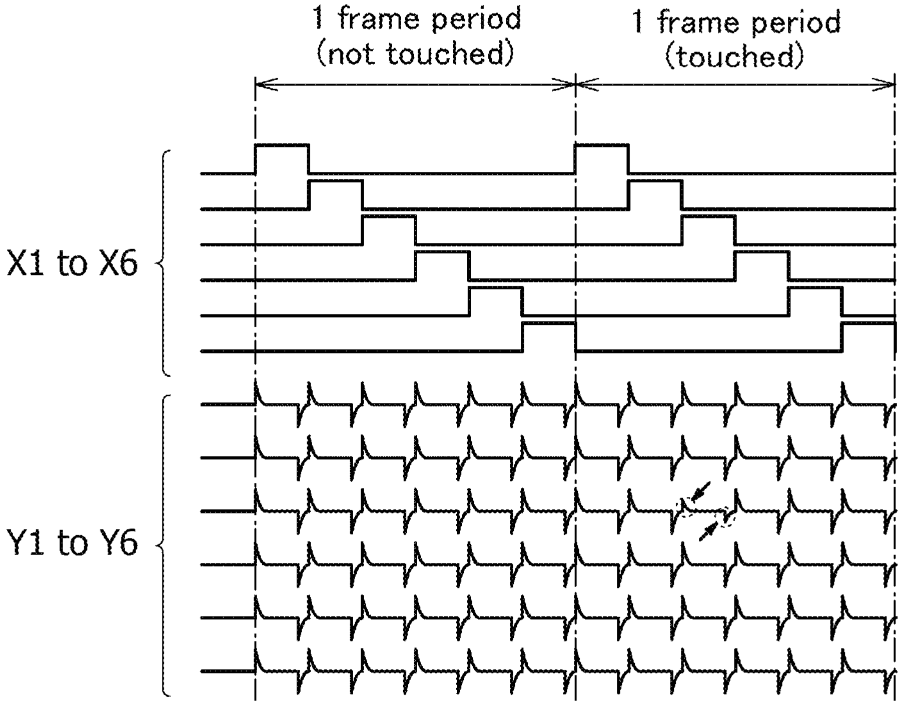

FIG. 24B is a timing chart showing input and output waveforms in the mutual capacitive touch sensor illustrated in FIG. 24A. In FIG. 24B, sensing of a sensing target is performed in all the rows and columns in one frame period. FIG. 24B shows a period when a sensing target is not sensed (not touched) and a period when a sensing target is sensed (touched). In FIG. 24B, sensed current values of the wirings Y1 to Y6 are shown as the waveforms of voltage values.

A pulse voltage is sequentially applied to the wirings X1 to X6, and the waveforms of the wirings Y1 to Y6 change in accordance with the pulse voltage. When there is no approach or contact of a sensing target, the waveforms of the wirings Y1 to Y6 change in accordance with changes in the voltages of the wirings X1 to X6. The current value is decreased at the point of approach or contact of a sensing target and accordingly the waveform of the voltage value changes.

By detecting a change in mutual capacitance in this manner, the approach or contact of a sensing target can be sensed.

<Description of Sensor Circuit>

Figure 25:
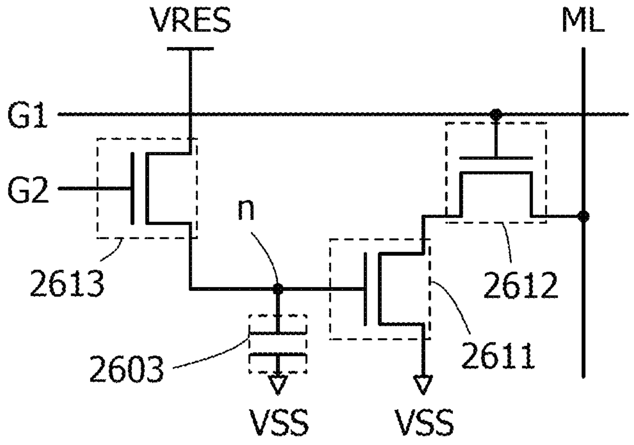
FIG. 25 is a circuit diagram of a touch sensor of one embodiment of the present invention.

Although FIG. 24A illustrates a passive matrix type touch sensor in which only the capacitor 2603 is provided at the intersection of wirings as a touch sensor, an active matrix type touch sensor including a transistor and a capacitor may be used. FIG. 25 illustrates an example of a sensor circuit included in an active matrix type touch sensor.

The sensor circuit in FIG. 25 includes the capacitor 2603 and transistors 2611, 2612, and 2613.

A signal G2 is input to a gate of the transistor 2613. A voltage VRES is applied to one of a source and a drain of the transistor 2613, and one electrode of the capacitor 2603 and a gate of the transistor 2611 are electrically connected to the other of the source and the drain of the transistor 2613. One of a source and a drain of the transistor 2611 is electrically connected to one of a source and a drain of the transistor 2612, and a voltage VSS is applied to the other of the source and the drain of the transistor 2611. A signal G1 is input to a gate of the transistor 2612, and a wiring ML is electrically connected to the other of the source and the drain of the transistor 2612. The voltage VSS is applied to the other electrode of the capacitor 2603.

Next, the operation of the sensor circuit in FIG. 25 will be described. First, a potential for turning on the transistor 2613 is supplied as the signal G2, and a potential with respect to the voltage VRES is thus applied to the node n connected to the gate of the transistor 2611. Then, a potential for turning off the transistor 2613 is applied as the signal G2, whereby the potential of the node n is maintained.

Then, mutual capacitance of the capacitor 2603 changes owing to the approach or contact of a sensing target such as a finger, and accordingly the potential of the node n is changed from VRES.

In reading operation, a potential for turning on the transistor 2612 is supplied as the signal G1. A current flowing through the transistor 2611, that is, a current flowing through the wiring ML is changed in accordance with the potential of the node n. By sensing this current, the approach or contact of a sensing target can be sensed.

In each of the transistors 2611, 2612, and 2613, an oxide semiconductor layer is preferably used as a semiconductor layer in which a channel region is formed. In particular, such a transistor is preferably used as the transistor 2613 so that the potential of the node n can be held for a long time and the frequency of operation of resupplying VRES to the node n (refresh operation) can be reduced.

The structure described in this embodiment can be used in combination with any of the structures described in the other embodiments as appropriate.

Embodiment 10

In this embodiment, a display module and electronic devices including a light-emitting element of one embodiment of the present invention will be described with reference to FIG. 26, FIGS. 27A to 27G, FIGS. 28A to 28D, and FIGS. 29A and 29B.

<Display Module>

Figure 26:
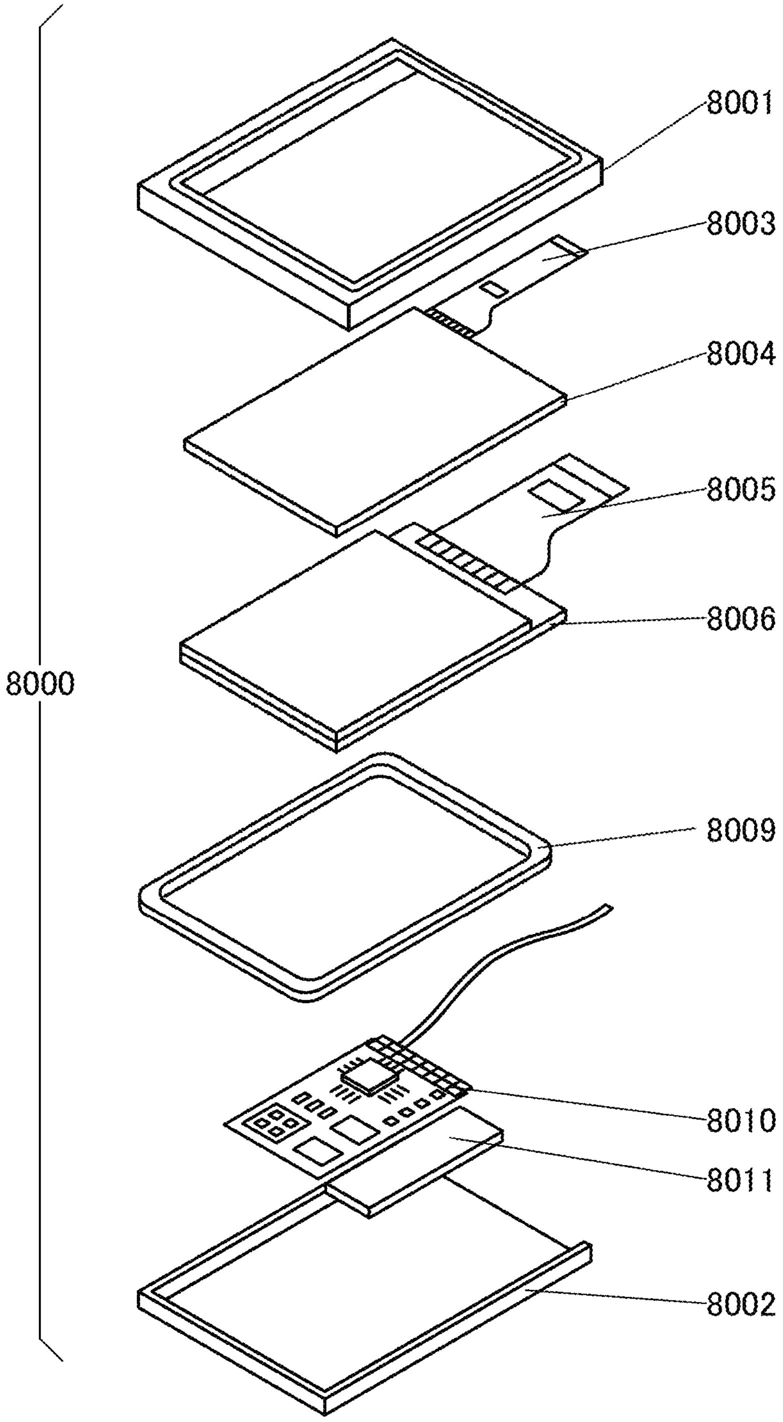
FIG. 26 is a perspective view illustrating a display module of one embodiment of the present invention.

In a display module 8000 in FIG. 26, a touch sensor 8004 connected to an FPC 8003, a display device 8006 connected to an FPC 8005, a frame 8009, a printed board 8010, and a battery 8011 are provided between an upper cover 8001 and a lower cover 8002.

The light-emitting element of one embodiment of the present invention can be used for the display device 8006, for example.

The shapes and sizes of the upper cover 8001 and the lower cover 8002 can be changed as appropriate in accordance with the sizes of the touch sensor 8004 and the display device 8006.

The touch sensor 8004 can be a resistive touch sensor or a capacitive touch sensor and may be formed to overlap with the display device 8006. A counter substrate (sealing substrate) of the display device 8006 can have a touch sensor function. A photosensor may be provided in each pixel of the display device 8006 so that an optical touch sensor is obtained.

The frame 8009 protects the display device 8006 and also serves as an electromagnetic shield for blocking electromagnetic waves generated by the operation of the printed board 8010. The frame 8009 may serve as a radiator plate.

The printed board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 can be additionally provided with a member such as a polarizing plate, a retardation plate, or a prism sheet.

<Electronic Device>

FIGS. 27A to 27G illustrate electronic devices. These electronic devices can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like. In addition, the sensor 9007 may have a function of measuring biological information like a pulse sensor and a finger print sensor.

The electronic devices illustrated in FIGS. 27A to 27G can have a variety of functions, for example, a function of displaying a variety of data (a still image, a moving image, a text image, and the like) on the display portion, a touch sensor function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic devices illustrated in FIGS. 27A to 27G are not limited to those described above, and the electronic devices can have a variety of functions. Although not illustrated in FIGS. 27A to 27G, the electronic devices may include a plurality of display portions. The electronic devices may have a camera or the like and a function of taking a still image, a function of taking a moving image, a function of storing the taken image in a memory medium (an external memory medium or a memory medium incorporated in the camera), a function of displaying the taken image on the display portion, or the like.

The electronic devices illustrated in FIGS. 27A to 27G will be described in detail below.

Figure 27A:
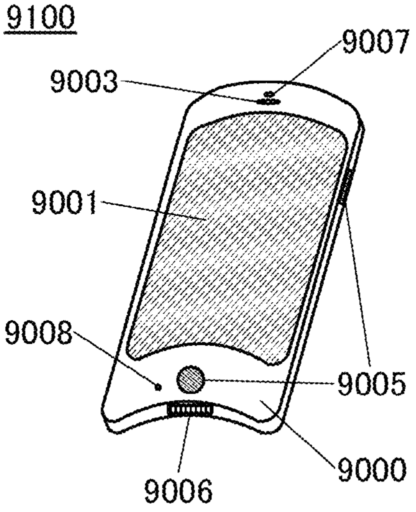
FIGS. 27A to 27G illustrate electronic devices of embodiments of the present invention.

FIG. 27A is a perspective view of a portable information terminal 9100. The display portion 9001 of the portable information terminal 9100 is flexible. Therefore, the display portion 9001 can be incorporated along a bent surface of a bent housing 9000. In addition, the display portion 9001 includes a touch sensor, and operation can be performed by touching the screen with a finger, a stylus, or the like. For example, when an icon displayed on the display portion 9001 is touched, an application can be started.

Figure 27B:
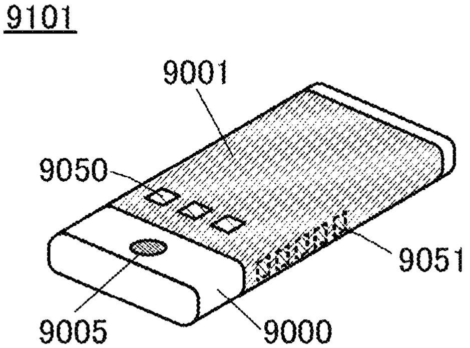

FIG. 27B is a perspective view of a portable information terminal 9101. The portable information terminal 9101 functions as, for example, one or more of a telephone set, a notebook, and an information browsing system. Specifically, the portable information terminal can be used as a smartphone. Note that the speaker 9003, the connection terminal 9006, the sensor 9007, and the like, which are not shown in FIG. 27B, can be positioned in the portable information terminal 9101 as in the portable information terminal 9100 shown in FIG. 27A. The portable information terminal 9101 can display characters and image information on its plurality of surfaces. For example, three operation buttons 9050 (also referred to as operation icons, or simply, icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, call, and the like; the title and sender of an email and SNS message; the date; the time; remaining battery; and the reception strength of an antenna. Instead of the information 9051, the operation buttons 9050 or the like may be displayed on the position where the information 9051 is displayed.

Figure 27C:
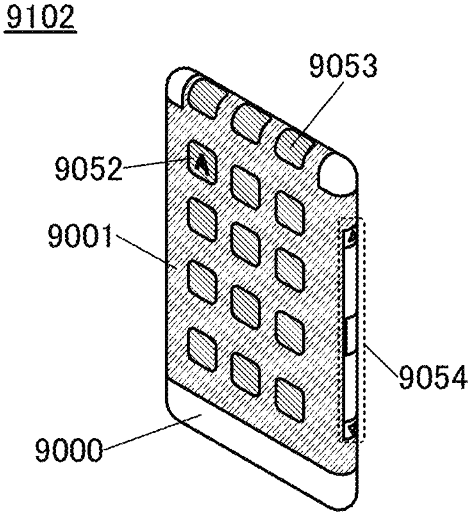

FIG. 27C is a perspective view of a portable information terminal 9102. The portable information terminal 9102 has a function of displaying information on three or more surfaces of the display portion 9001. Here, information 9052, information 9053, and information 9054 are displayed on different surfaces. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

Figure 27D:
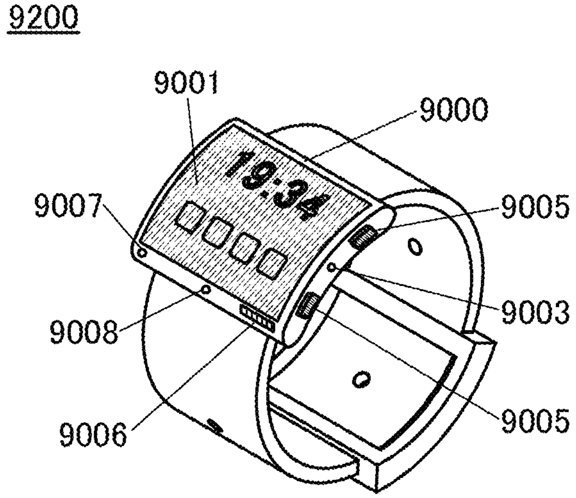

FIG. 27D is a perspective view of a watch-type portable information terminal 9200. The portable information terminal 9200 is capable of executing a variety of applications such as mobile phone calls, e-mailing, viewing and editing texts, music reproduction, Internet communication, and computer games. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is possible. Note that the charging operation may be performed by wireless power feeding without using the connection terminal 9006.

Figure 27E:
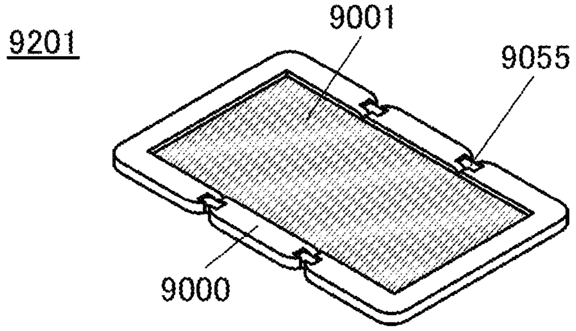
Figure 27F:
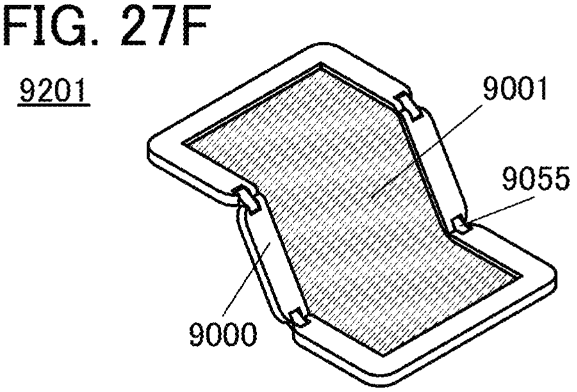
Figure 27G:
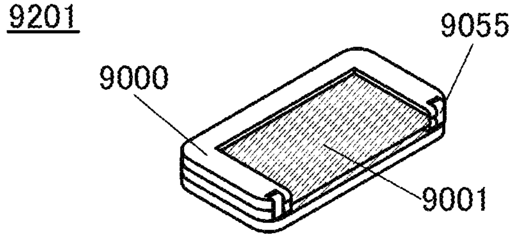

FIGS. 27E, 27F, and 27G are perspective views of a foldable portable information terminal 9201. FIG. 27E is a perspective view illustrating the portable information terminal 9201 that is opened. FIG. 27F is a perspective view illustrating the portable information terminal 9201 that is being opened or being folded. FIG. 27G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a goggle-type display (head mounted display), a portable game machine, a portable information terminal, an audio reproducing device, and a large-sized game machine such as a pachinko machine.

Figure 28A:
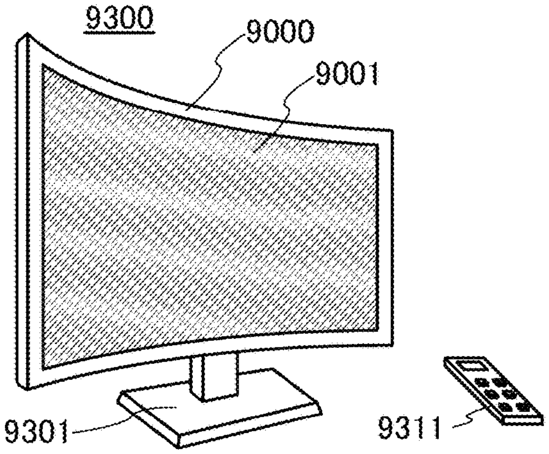
FIGS. 28A to 28D illustrate electronic devices of embodiments of the present invention.

FIG. 28A illustrates an example of a television set. In the television set 9300, the display portion 9001 is incorporated into the housing 9000. Here, the housing 9000 is supported by a stand 9301.

The television set 9300 illustrated in FIG. 28A can be operated with an operation switch of the housing 9000 or a separate remote controller 9311. The display portion 9001 may include a touch sensor. The television set 9300 can be operated by touching the display portion 9001 with a finger or the like. The remote controller 9311 may be provided with a display portion for displaying data output from the remote controller 9311. With operation keys or a touch panel of the remote controller 9311, channels or volume can be controlled and images displayed on the display portion 9001 can be controlled.

The television set 9300 is provided with a receiver, a modem, or the like. A general television broadcast can be received with the receiver. When the television set is connected to a communication network with or without wires via the modem, one-way (from a transmitter to a receiver) or two-way (between a transmitter and a receiver or between receivers) data communication can be performed.

The electronic device or the lighting device of one embodiment of the present invention has flexibility and therefore can be incorporated along a curved inside/outside wall surface of a house or a building or a curved interior/exterior surface of a car.

Figure 28B:
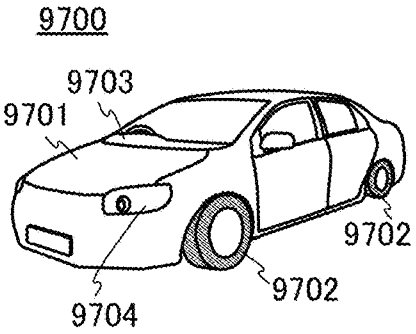
Figure 28C:
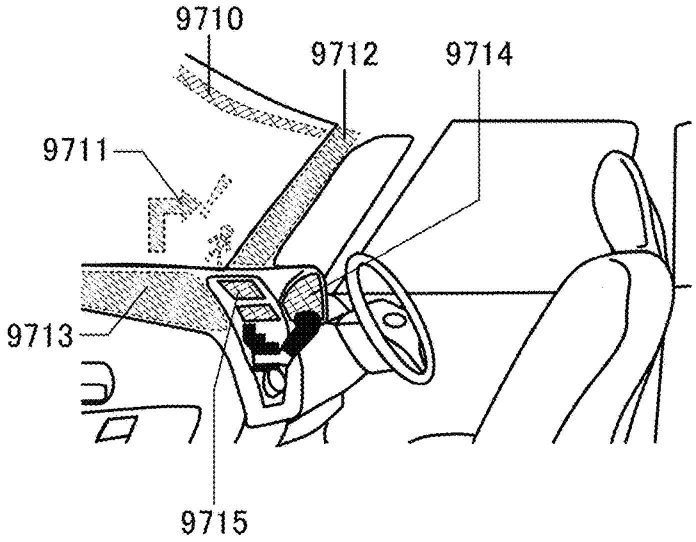

FIG. 28B is an external view of an automobile 9700. FIG. 28C illustrates a driver's seat of the automobile 9700. The automobile 9700 includes a car body 9701, wheels 9702, a dashboard 9703, lights 9704, and the like. The display device, the light-emitting device, or the like of one embodiment of the present invention can be used in a display portion or the like of the automobile 9700. For example, the display device, the light-emitting device, or the like of one embodiment of the present invention can be used in display portions 9710 to 9715 illustrated in FIG. 28C.

The display portion 9710 and the display portion 9711 are each a display device provided in an automobile windshield. The display device, the light-emitting device, or the like of one embodiment of the present invention can be a see-through display device, through which the opposite side can be seen, using a light-transmitting conductive material for its electrodes and wirings. Such a see-through display portion 9710 or 9711 does not hinder driver's vision during driving the automobile 9700. Thus, the display device, the light-emitting device, or the like of one embodiment of the present invention can be provided in the windshield of the automobile 9700. Note that in the case where a transistor or the like for driving the display device, the light-emitting device, or the like is provided, a transistor having a light-transmitting property, such as an organic transistor using an organic semiconductor material or a transistor using an oxide semiconductor, is preferably used.

The display portion 9712 is a display device provided on a pillar portion. For example, an image taken by an imaging unit provided in the car body is displayed on the display portion 9712, whereby the view hindered by the pillar portion can be compensated. The display portion 9713 is a display device provided on the dashboard. For example, an image taken by an imaging unit provided in the car body is displayed on the display portion 9713, whereby the view hindered by the dashboard can be compensated. That is, by displaying an image taken by an imaging unit provided on the outside of the automobile, blind areas can be eliminated and safety can be increased. Displaying an image to compensate for the area which a driver cannot see, makes it possible for the driver to confirm safety easily and comfortably.

Figure 28D:
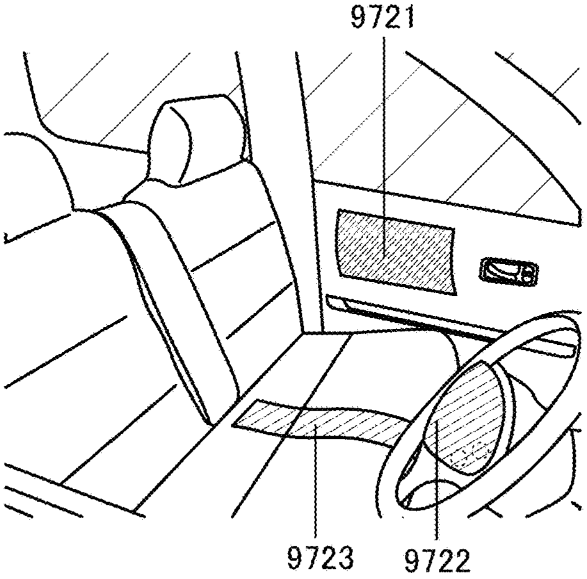

FIG. 28D illustrates the inside of a car in which bench seats are used for a driver seat and a front passenger seat. A display portion 9721 is a display device provided in a door portion. For example, an image taken by an imaging unit provided in the car body is displayed on the display portion 9721, whereby the view hindered by the door can be compensated. A display portion 9722 is a display device provided in a steering wheel. A display portion 9723 is a display device provided in the middle of a seating face of the bench seat. Note that the display device can be used as a seat heater by providing the display device on the seating face or backrest and by using heat generation of the display device as a heat source.

The display portion 9714, the display portion 9715, and the display portion 9722 can provide a variety of kinds of information such as navigation data, a speedometer, a tachometer, a mileage, a fuel meter, a gearshift indicator, and air-condition setting. The content, layout, or the like of the display on the display portions can be changed freely by a user as appropriate. The information listed above can also be displayed on the display portions 9710 to 9713, 9721, and 9723. The display portions 9710 to 9715 and 9721 to 9723 can also be used as lighting devices. The display portions 9710 to 9715 and 9721 to 9723 can also be used as heating devices.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a lithium-ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

Figure 29A:
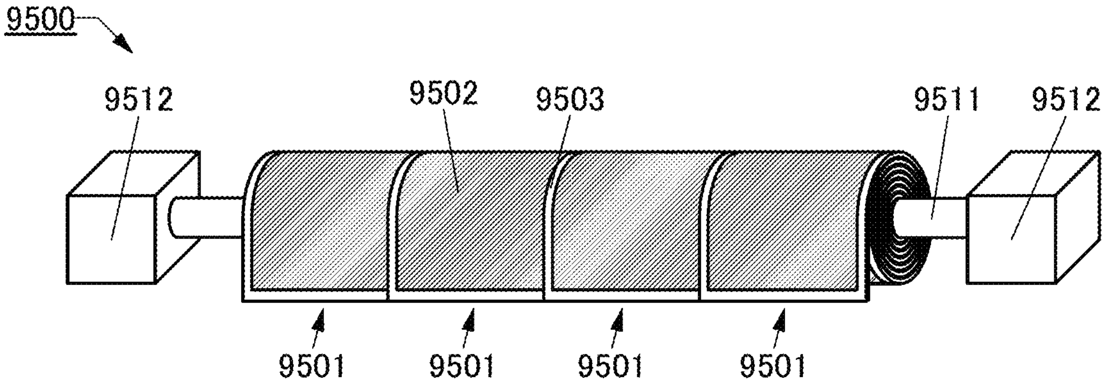
FIGS. 29A and 29B are perspective views illustrating a display device of one embodiment of the present invention.
Figure 29B:
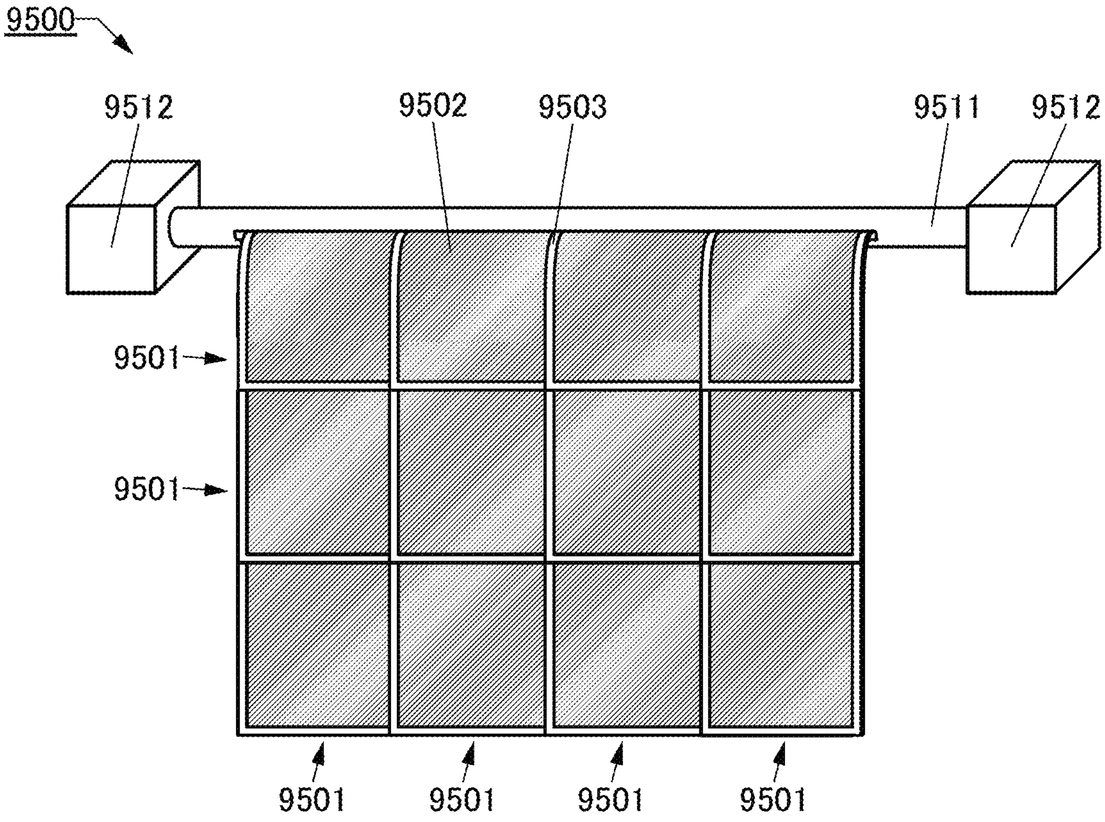

A display device 9500 illustrated in FIGS. 29A and 29B includes a plurality of display panels 9501, a hinge 9511, and a bearing 9512. The plurality of display panels 9501 each include a display region 9502 and a light-transmitting region 9503.

Each of the plurality of display panels 9501 is flexible. Two adjacent display panels 9501 are provided so as to partly overlap with each other. For example, the light-transmitting regions 9503 of the two adjacent display panels 9501 can be overlapped each other. A display device having a large screen can be obtained with the plurality of display panels 9501. The display device is highly versatile because the display panels 9501 can be wound depending on its use.

Moreover, although the display regions 9502 of the adjacent display panels 9501 are separated from each other in FIGS. 29A and 29B, without limitation to this structure, the display regions 9502 of the adjacent display panels 9501 may overlap with each other without any space so that a continuous display region 9502 is obtained, for example.

The electronic devices described in this embodiment each include the display portion for displaying some sort of data. Note that the light-emitting element of one embodiment of the present invention can also be used for an electronic device which does not have a display portion. The structure in which the display portion of the electronic device described in this embodiment is flexible and display can be performed on the bent display surface or the structure in which the display portion of the electronic device is foldable is described as an example; however, the structure is not limited thereto and a structure in which the display portion of the electronic device is not flexible and display is performed on a plane portion may be employed.

The structure described in this embodiment can be used in combination with any of the structures described in the other embodiments as appropriate.

Embodiment 11

In this embodiment, a light-emitting device including the light-emitting element of one embodiment of the present invention will be described with reference to FIGS. 30A to 30C and FIGS. 31A to 31D.

Figure 30A:
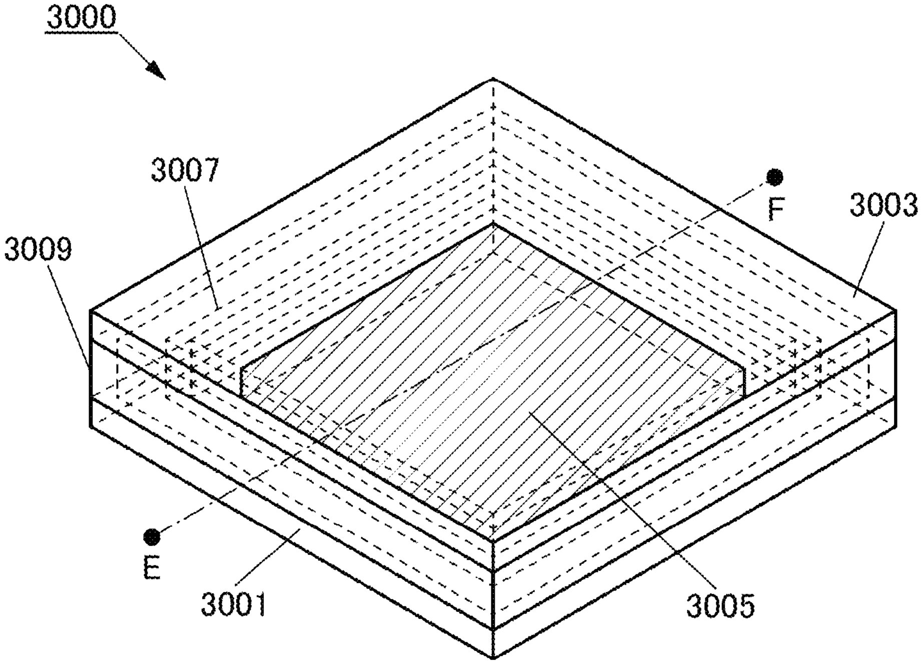
FIGS. 30A to 30C are a perspective view and cross-sectional views illustrating a light-emitting device of one embodiment of the present invention.
Figure 30B:
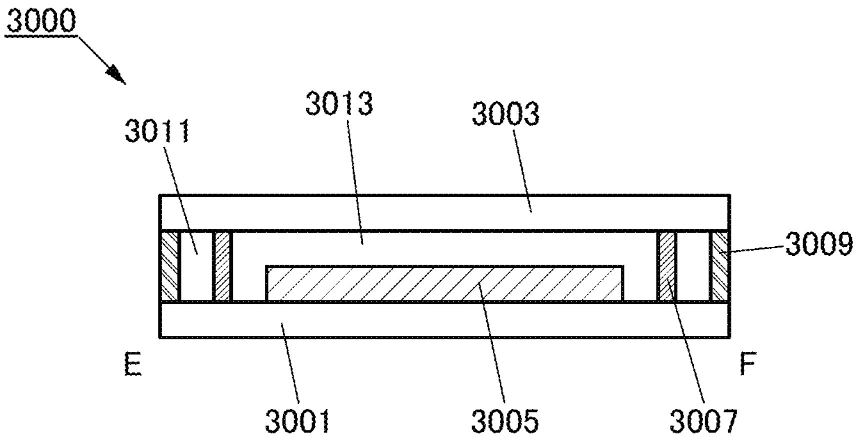

FIG. 30A is a perspective view of a light-emitting device 3000 shown in this embodiment, and FIG. 30B is a cross-sectional view along dashed-dotted line E-F in FIG. 30A. Note that in FIG. 30A, some components are illustrated by broken lines in order to avoid complexity of the drawing.

The light-emitting device 3000 illustrated in FIGS. 30A and 30B includes a substrate 3001, a light-emitting element 3005 over the substrate 3001, a first sealing region 3007 provided around the light-emitting element 3005, and a second sealing region 3009 provided around the first sealing region 3007.

Light is emitted from the light-emitting element 3005 through one or both of the substrate 3001 and a substrate 3003. In FIGS. 30A and 30B, a structure in which light is emitted from the light-emitting element 3005 to the lower side (the substrate 3001 side) is illustrated.

As illustrated in FIGS. 30A and 30B, the light-emitting device 3000 has a double sealing structure in which the light-emitting element 3005 is surrounded by the first sealing region 3007 and the second sealing region 3009. With the double sealing structure, entry of impurities (e.g., water, oxygen, and the like) from the outside into the light-emitting element 3005 can be favorably suppressed. Note that it is not necessary to provide both the first sealing region 3007 and the second sealing region 3009. For example, only the first sealing region 3007 may be provided.

Note that in FIG. 30B, the first sealing region 3007 and the second sealing region 3009 are each provided in contact with the substrate 3001 and the substrate 3003. However, without limitation to such a structure, for example, one or both of the first sealing region 3007 and the second sealing region 3009 may be provided in contact with an insulating film or a conductive film provided on the substrate 3001. Alternatively, one or both of the first sealing region 3007 and the second sealing region 3009 may be provided in contact with an insulating film or a conductive film provided on the substrate 3003.

The substrate 3001 and the substrate 3003 can have structures similar to those of the substrate 200 and the substrate 220 described in the above embodiment, respectively. The light-emitting element 3005 can have a structure similar to that of any of the light-emitting elements described in the above embodiments.

For the first sealing region 3007, a material containing glass (e.g., a glass frit, a glass ribbon, and the like) can be used. For the second sealing region 3009, a material containing a resin can be used. With the use of the material containing glass for the first sealing region 3007, productivity and a sealing property can be improved. Moreover, with the use of the material containing a resin for the second sealing region 3009, impact resistance and heat resistance can be improved. However, the materials used for the first sealing region 3007 and the second sealing region 3009 are not limited to such, and the first sealing region 3007 may be formed using the material containing a resin and the second sealing region 3009 may be formed using the material containing glass.

The glass frit may contain, for example, magnesium oxide, calcium oxide, strontium oxide, barium oxide, cesium oxide, sodium oxide, potassium oxide, boron oxide, vanadium oxide, zinc oxide, tellurium oxide, aluminum oxide, silicon dioxide, lead oxide, tin oxide, phosphorus oxide, ruthenium oxide, rhodium oxide, iron oxide, copper oxide, manganese dioxide, molybdenum oxide, niobium oxide, titanium oxide, tungsten oxide, bismuth oxide, zirconium oxide, lithium oxide, antimony oxide, lead borate glass, tin phosphate glass, vanadate glass, or borosilicate glass. The glass frit preferably contains at least one kind of transition metal to absorb infrared light.

As the above glass frits, for example, a frit paste is applied to a substrate and is subjected to heat treatment, laser light irradiation, or the like. The frit paste contains the glass frit and a resin (also referred to as a binder) diluted by an organic solvent. Note that an absorber which absorbs light having the wavelength of laser light may be added to the glass frit. For example, an Nd:YAG laser or a semiconductor laser is preferably used as the laser. The shape of laser light may be circular or quadrangular.

As the above material containing a resin, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

Note that in the case where the material containing glass is used for one or both of the first sealing region 3007 and the second sealing region 3009, the material containing glass preferably has a thermal expansion coefficient close to that of the substrate 3001. With the above structure, generation of a crack in the material containing glass or the substrate 3001 due to thermal stress can be suppressed.

For example, the following advantageous effect can be obtained in the case where the material containing glass is used for the first sealing region 3007 and the material containing a resin is used for the second sealing region 3009.

The second sealing region 3009 is provided closer to an outer portion of the light-emitting device 3000 than the first sealing region 3007 is. In the light-emitting device 3000, distortion due to external force or the like increases toward the outer portion. Thus, the outer portion of the light-emitting device 3000 where a larger amount of distortion is generated, that is, the second sealing region 3009 is sealed using the material containing a resin and the first sealing region 3007 provided on an inner side of the second sealing region 3009 is sealed using the material containing glass, whereby the light-emitting device 3000 is less likely to be damaged even when distortion due to external force or the like is generated.

Furthermore, as illustrated in FIG. 30B, a first region 3011 corresponds to the region surrounded by the substrate 3001, the substrate 3003, the first sealing region 3007, and the second sealing region 3009. A second region 3013 corresponds to the region surrounded by the substrate 3001, the substrate 3003, the light-emitting element 3005, and the first sealing region 3007.

The first region 3011 and the second region 3013 are preferably filled with, for example, an inert gas such as a rare gas or a nitrogen gas. Alternatively, the first region 3011 and the second region 3013 are preferably filled with a resin such as an acrylic resin or an epoxy resin. Note that for the first region 3011 and the second region 3013, a reduced pressure state is preferred to an atmospheric pressure state.

Figure 30C:
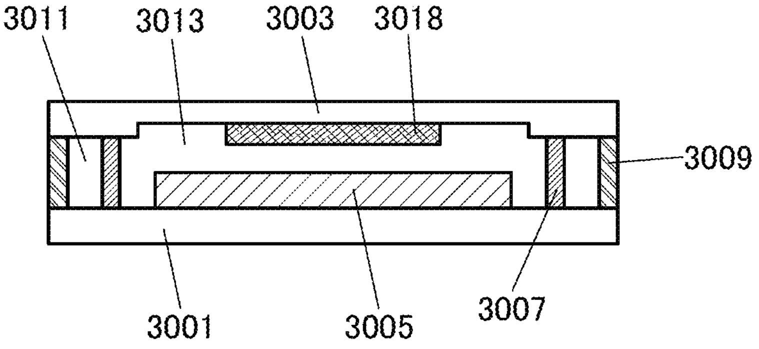

FIG. 30C illustrates a modification example of the structure in FIG. 30B. FIG. 30C is a cross-sectional view illustrating the modification example of the light-emitting device 3000.

FIG. 30C illustrates a structure in which a desiccant 3018 is provided in a recessed portion provided in part of the substrate 3003. The other components are the same as those of the structure illustrated in FIG. 30B.

As the desiccant 3018, a substance which adsorbs moisture and the like by chemical adsorption or a substance which adsorbs moisture and the like by physical adsorption can be used. Examples of the substance that can be used as the desiccant 3018 include alkali metal oxides, alkaline earth metal oxide (e.g., calcium oxide, barium oxide, and the like), sulfate, metal halides, perchlorate, zeolite, silica gel, and the like.

Next, modification examples of the light-emitting device 3000 which is illustrated in FIG. 30B are described with reference to FIGS. 31A to 31D. Note that FIGS. 31A to 31D are cross-sectional views illustrating the modification examples of the light-emitting device 3000 illustrated in FIG. 30B.

In each of the light-emitting devices illustrated in FIGS. 31A to 31D, the second sealing region 3009 is not provided but only the first sealing region 3007 is provided. Moreover, in each of the light-emitting devices illustrated in FIGS. 31A to 31D, a region 3014 is provided instead of the second region 3013 illustrated in FIG. 30B.

For the region 3014, for example, polyester, polyolefin, polyamide (e.g., nylon, aramid), polyimide, polycarbonate, or an acrylic resin, polyurethane, or an epoxy resin can be used. Alternatively, a material that includes a resin having a siloxane bond such as silicone can be used.

When the above-described material is used for the region 3014, what is called a solid-sealing light-emitting device can be obtained.

Figure 31A:
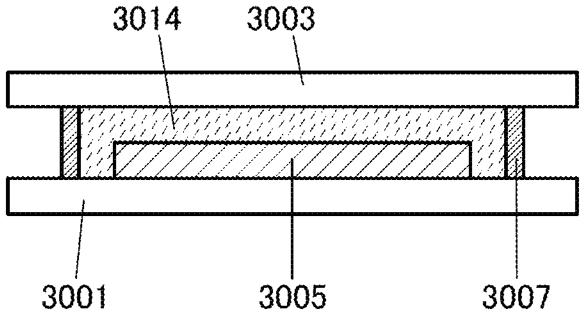
FIGS. 31A to 31D are cross-sectional views each illustrating a light-emitting device of one embodiment of the present invention.
Figure 31B:
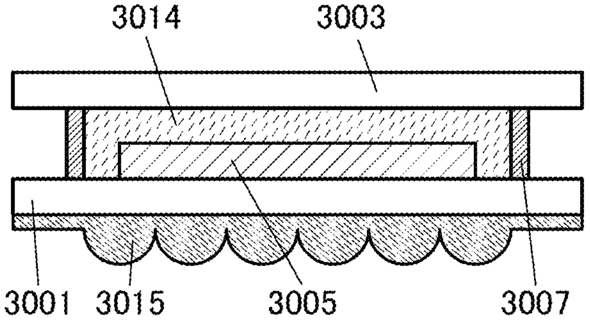

In the light-emitting device illustrated in FIG. 31B, a substrate 3015 is provided on the substrate 3001 side of the light-emitting device illustrated in FIG. 31A.

The substrate 3015 has unevenness as illustrated in FIG. 31B. With a structure in which the substrate 3015 having unevenness is provided on the side through which light emitted from the light-emitting element 3005 is extracted, the efficiency of extraction of light from the light-emitting element 3005 can be improved. Note that instead of the structure having unevenness and illustrated in FIG. 31B, a substrate having a function as a diffusion plate may be provided.

Figure 31C:
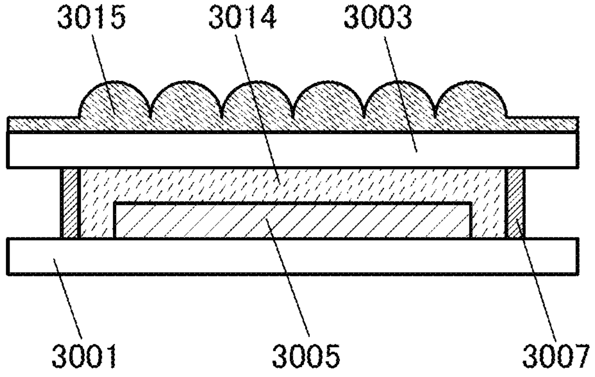

In the light-emitting device illustrated in FIG. 31C, light is extracted through the substrate 3003 side, unlike in the light-emitting device illustrated in FIG. 31A, in which light is extracted through the substrate 3001 side.

The light-emitting device illustrated in FIG. 31C includes the substrate 3015 on the substrate 3003 side. The other components are the same as those of the light-emitting device illustrated in FIG. 31B.

Figure 31D:
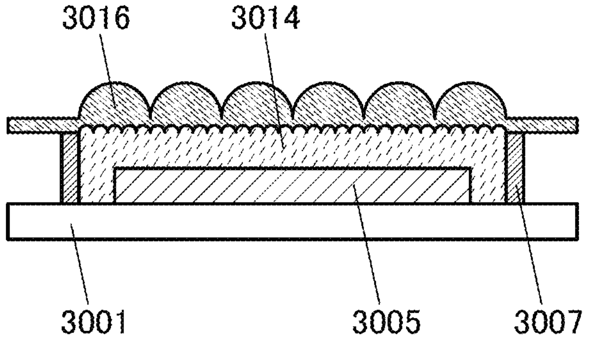

In the light-emitting device illustrated in FIG. 31D, the substrate 3003 and the substrate 3015 included in the light-emitting device illustrated in FIG. 31C are not provided but a substrate 3016 is provided.

The substrate 3016 includes first unevenness positioned closer to the light-emitting element 3005 and second unevenness positioned farther from the light-emitting element 3005. With the structure illustrated in FIG. 31D, the efficiency of extraction of light from the light-emitting element 3005 can be further improved.

Thus, the use of the structure described in this embodiment can provide a light-emitting device in which deterioration of a light-emitting element due to impurities such as moisture and oxygen is suppressed. Alternatively, with the structure described in this embodiment, a light-emitting device having high light extraction efficiency can be obtained.

Note that the structure described in this embodiment can be combined as appropriate with any of the structures described in the other embodiments.

Embodiment 12

In this embodiment, examples in which the light-emitting element of one embodiment of the present invention is used for various lighting devices and electronic devices will be described with reference to FIGS. 32A to 32C and FIG. 33.

An electronic device or a lighting device that has a light-emitting region with a curved surface can be obtained with the use of the light-emitting element of one embodiment of the present invention which is manufactured over a substrate having flexibility.

Furthermore, a light-emitting device to which one embodiment of the present invention is applied can also be used for lighting for motor vehicles, examples of which are lighting for a dashboard, a windshield, a ceiling, and the like.

Figure 32A:
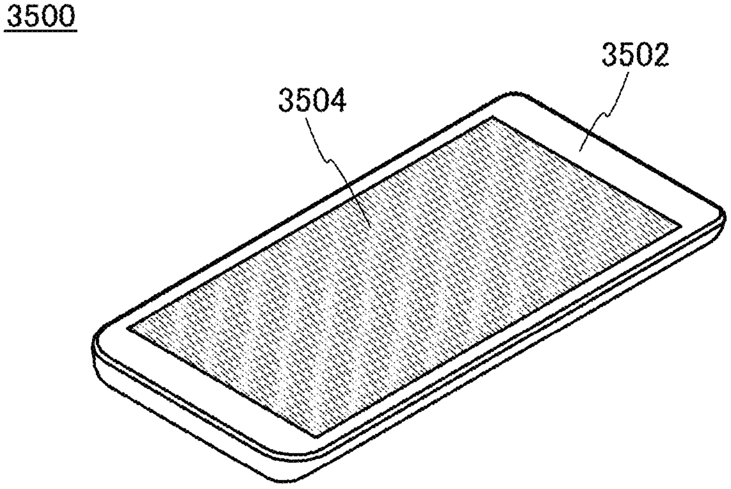
FIGS. 32A and 32B illustrate an electronic device of one embodiment of the present invention and FIG. 32C illustrates a lighting device of one embodiment of the present invention.
Figure 32B:
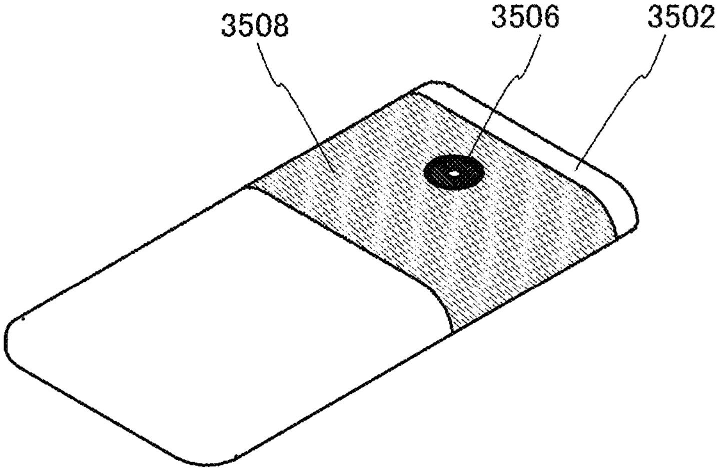

FIG. 32A is a perspective view illustrating one surface of a multifunction terminal 3500, and FIG. 32B is a perspective view illustrating the other surface of the multifunction terminal 3500. In a housing 3502 of the multifunction terminal 3500, a display portion 3504, a camera 3506, lighting 3508, and the like are incorporated. The light-emitting device of one embodiment of the present invention can be used for the lighting 3508.

The lighting 3508 that includes the light-emitting device of one embodiment of the present invention functions as a planar light source. Thus, unlike a point light source typified by an LED, the lighting 3508 can provide light emission with low directivity. When the lighting 3508 and the camera 3506 are used in combination, for example, imaging can be performed by the camera 3506 with the lighting 3508 lighting or flashing. Because the lighting 3508 functions as a planar light source, a photograph as if taken under natural light can be taken.

Note that the multifunction terminal 3500 illustrated in FIGS. 32A and 32B can have a variety of functions as in the electronic devices illustrated in FIGS. 27A to 27G.

The housing 3502 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. When a detection device including a sensor for detecting inclination, such as a gyroscope or an acceleration sensor, is provided inside the multifunction terminal 3500, display on the screen of the display portion 3504 can be automatically switched by determining the orientation of the multifunction terminal 3500 (whether the multifunction terminal is placed horizontally or vertically for a landscape mode or a portrait mode).

The display portion 3504 may function as an image sensor. For example, an image of a palm print, a fingerprint, or the like is taken when the display portion 3504 is touched with the palm or the finger, whereby personal authentication can be performed. Furthermore, by providing a backlight or a sensing light source which emits near-infrared light in the display portion 3504, an image of a finger vein, a palm vein, or the like can be taken. Note that the light-emitting device of one embodiment of the present invention may be used for the display portion 3504.

Figure 32C:
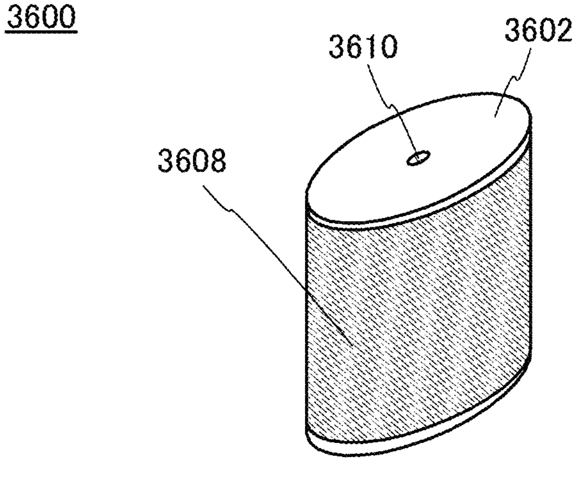

FIG. 32C is a perspective view of a security light 3600. The security light 3600 includes lighting 3608 on the outside of the housing 3602, and a speaker 3610 and the like are incorporated in the housing 3602. The light-emitting device of one embodiment of the present invention can be used for the lighting 3608.

The security light 3600 emits light when the lighting 3608 is gripped or held, for example. An electronic circuit that can control the manner of light emission from the security light 3600 may be provided in the housing 3602. The electronic circuit may be a circuit that enables light emission once or intermittently a plurality of times or may be a circuit that can adjust the amount of emitted light by controlling the current value for light emission. A circuit with which a loud audible alarm is output from the speaker 3610 at the same time as light emission from the lighting 3608 may be incorporated.

The security light 3600 can emit light in various directions; therefore, it is possible to intimidate a thug or the like with light, or light and sound. Moreover, the security light 3600 may include a camera such as a digital still camera to have a photography function.

Figure 33:
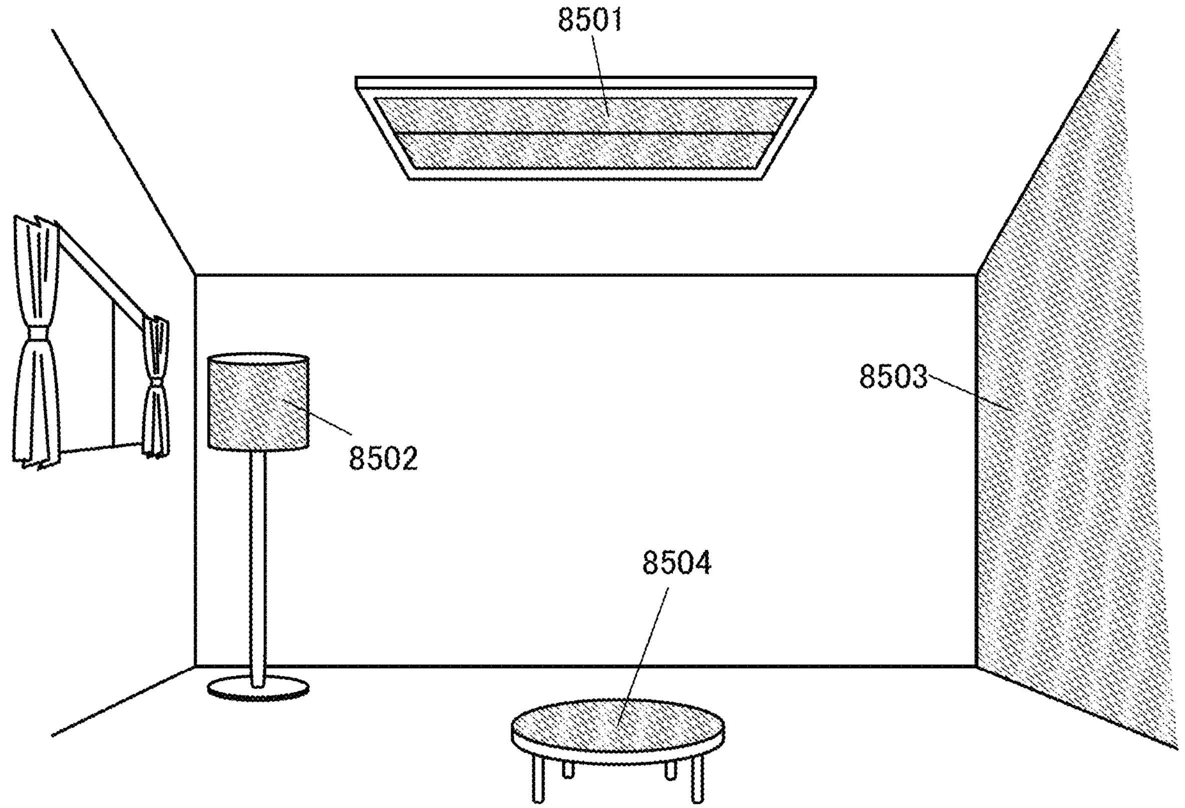
FIG. 33 illustrates lighting devices of embodiments of the present invention.

FIG. 33 illustrates an example in which the light-emitting element is used for an indoor lighting device 8501. Since the light-emitting element can have a larger area, a lighting device having a large area can also be formed. In addition, a lighting device 8502 in which a light-emitting region has a curved surface can also be formed with the use of a housing with a curved surface. A light-emitting element described in this embodiment is in the form of a thin film, which allows the housing to be designed more freely. Therefore, the lighting device can be elaborately designed in a variety of ways. Furthermore, a wall of the room may be provided with a large-sized lighting device 8503. Touch sensors may be provided in the lighting devices 8501, 8502, and 8503 to control the power on/off of the lighting devices.

Moreover, when the light-emitting element is used on the surface side of a table, a lighting device 8504 which has a function as a table can be obtained. When the light-emitting element is used as part of other furniture, a lighting device which has a function as the furniture can be obtained.

As described above, lighting devices and electronic devices can be obtained by application of the light-emitting device of one embodiment of the present invention. Note that the light-emitting device can be used for lighting devices and electronic devices in a variety of fields without being limited to the lighting devices and the electronic devices described in this embodiment.

The structure described in this embodiment can be used in combination with any of the structures described in the other embodiments as appropriate.

Example 1

Synthesis Example 1

In this example, a method for synthesizing (OC-6-22)-tris{5-cyano-2-[4-(2,6-diisopropylphenyl)-5-(2-methylphenyl)-4H-1,2,4-triazol-3-yl-κ$N^2$]phenyl-κC}iridium(III) (abbreviation: fac-Ir(mpCNptz-diPrp)$_3$), which is an organometallic complex of one embodiment of the present invention represented by Structural Formula (108) in Embodiment 2 is described. The structure of fac-Ir(mpCNptz-diPrp)$_3$ is shown below.

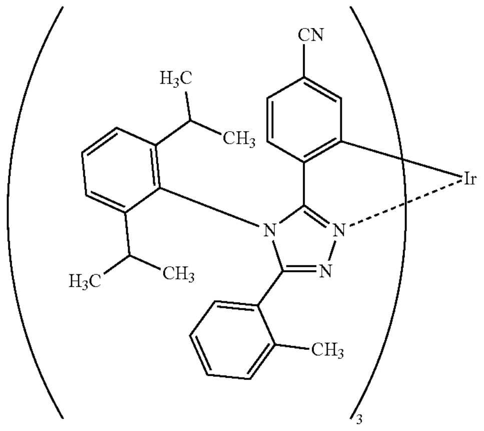

fac-Ir(mpCNptz-diPrp)$_3$

Step 1: Synthesis of N-4-cyanobenzoyl-N'-2-methylbenzoylhydrazide

Into a 300 mL three-neck flask were put 13 g (89 mmol) of o-toluic hydrazide and 60 mL of N-methyl-2-pyrrolidinone (NMP), and the mixture was stirred under a nitrogen stream while being cooled with ice. To this mixed solution, a mixed solution of 15 g (91 mmol) of 4-cyanobenzoyl chloride and 30 mL of NMP was slowly added dropwise, and the mixture was stirred for 16 hours to be reacted. After the reaction, the reacted solution was slowly added to 500 mL of water, so that a solid was precipitated. The precipitated solid was washed in such a manner that ultrasonic cleaning using 1M hydrochloric acid and ultrasonic cleaning using water were alternately performed twice (four times in total). Then, ultrasonic cleaning was performed using ethanol, whereby 20 g of a white solid was obtained in a yield of 82%. The obtained white solid was identified as N-4-cyanobenzoyl-N'-2-methylbenzoylhydrazide by nuclear magnetic resonance (NMR) spectroscopy. The synthesis scheme of Step 1 is shown in (a-0) below.

(a-0)

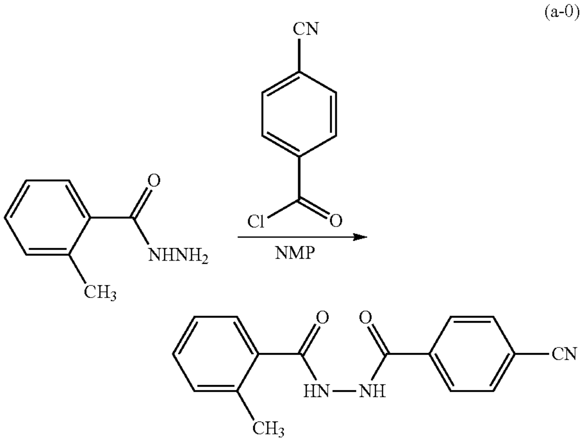

Step 2: Synthesis of N-chloro-4-cyanophenylmethylidene-N'-chloro-2-methylphenylmethylidenehydrazone Into a 1000 mL three-neck flask were put 20 g (73 mmol) of N-4-cyanobenzoyl-N'-2-methylbenzoylhydrazide synthesized in Step 1 and 500 mL of toluene. To this mixed solution, 50 g (240 mmol) of phosphorus pentachloride was added, and the mixture was stirred at 120° C. under a nitrogen stream for 7 hours to be reacted. After the reaction, the reacted solution was slowly added to 300 mL of water, and the mixture was stirred at room temperature for 30 minutes. An aqueous layer and an organic layer of this mixture were separated, and the aqueous layer was subjected to extraction with toluene. A mixture obtained by combining the obtained solution of the extract and the organic layer was slowly added to 400 mL of a 1M aqueous solution of potassium hydroxide, and the mixture was stirred at room temperature for 30 minutes. An aqueous layer and an organic layer of this mixture were separated, and the aqueous layer was subjected to extraction with toluene. The obtained solution of the extract and the organic layer were combined, and washed with a saturated aqueous solution of sodium hydrogen carbonate and then saturated saline. After the washing, anhydrous magnesium sulfate was added to the organic layer for drying, and the resulting mixture was subjected to gravity filtration to give a filtrate. The obtained filtrate was concentrated to give an oily substance. The obtained oily substance was purified by silica column chromatography. Toluene was used as a developing solvent. The obtained fraction was concentrated to give a solid. Hexane was added to the obtained solid, and ultrasonic wave irradiation was performed. A solid was collected by suction filtration to give 17 g of a yellow solid in a yield of 72%. The obtained yellow solid was identified as N-chloro-4-cyanophenylmethylidene-N'-chloro-2-methylphenylmethylidenehydrazone by nuclear magnetic resonance (NMR) spectroscopy. The synthesis scheme of Step 2 is shown in (b-0) below.

(b-0)

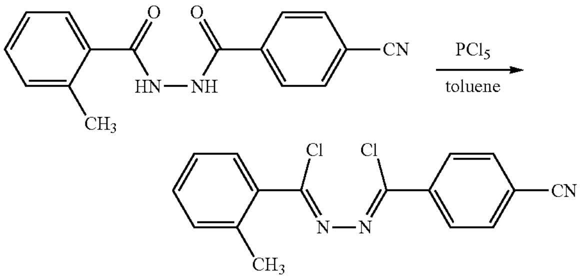

Step 3: Synthesis of 5-(4-cyanophenyl)-4-(2,6-diisopropylphenyl)-3-(2-methylphenyl)-4H-1,2,4-triazole (abbreviation: HmpCNptz-diPrp)

Into a 500 mL three-neck flask were put 4.7 g (16 mmol) of N-chloro-4-cyanophenylmethylidene-N'-chloro-2-methylphenylmethylidenehydrazone synthesized in Step 2, 17 g (95 mmol) of 2,6-diisopropylaniline, and 100 mL of N,N-dimethylaniline, and the mixture was stirred under a nitrogen stream at 160° C. for 8 hours to be reacted. After the reaction, the reacted solution was added to 300 mL of 1M hydrochloric acid and stirring was performed for 1 hour, and an organic layer and an aqueous layer were separated. The aqueous layer was subjected to extraction with ethyl acetate. The organic layer and the obtained solution of the extract were combined, and washed with a saturated aqueous solution of sodium hydrogen carbonate and then with saturated saline, and anhydrate magnesium sulfate was added to the organic layer for drying. The obtained mixture was subjected to gravity filtration, and the filtrate was concentrated to give an oily substance. The obtained oily substance was purified by silica column chromatography. As a developing solvent, a 5:1 hexane-ethyl acetate mixed solvent was used. The obtained fraction was concentrated to give a solid. Ethyl acetate was added to the obtained solid, and the mixture was irradiated with ultrasonic waves and then subjected to suction filtration to give 4.7 g of a white solid in a yield of 35%. The obtained white solid was identified as 5-(4-cyanophenyl)-4-(2,6-diisopropylphenyl)-3-(2-methylphenyl)-4H-1,2,4-triazole (abbreviation: HmpCNptz-diPrp) by nuclear magnetic resonance (NMR) spectroscopy. The synthesis scheme of Step 3 is shown in (c-0) below.

(c-0)

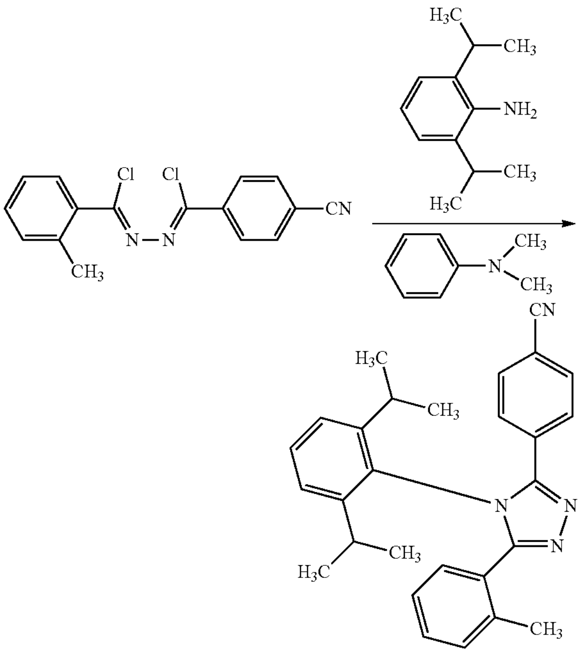

HmpCNptz-diPrp

Step 4: Synthesis of fac-Ir(mpCNptz-diPrp)$_3$

Into a reaction container provided with a three-way cock were put 4.7 g (11 mmol) of HmpCNptz-diPrp synthesized in Step 3 and 1.1 g (2.2 mmol) of tris(acetylacetonato) iridium(III), and the mixture was stirred under an argon stream at 250° C. for 40 hours. The obtained reaction mixture was added to dichloromethane, and the mixture was subjected to filtration to remove an insoluble matter. The obtained filtrate was concentrated to give a solid. The obtained solid was purified by silica column chromatography. As a developing solvent, a 4:1 dichloromethane-hexane mixed solvent was used. The obtained fraction was concentrated to give a solid. The obtained solid was identified as a mixture of a facial isomer and a meridional isomer. The isomer ratio of the facial isomer to the meridional isomer was 2:3 by $^1$H-NMR. For isomer separation, purification was performed again by silica column chromatography. As developing solvents, first, a 1:1 dichloromethane-hexane mixed solvent was used, and then a 4:1 dichloromethane-hexane mixed solvent was used. After disappearance of a fraction of the meridional isomer was confirmed by silica-gel thin layer chromatography (TLC), the developing solvent was changed to dichloromethane. The obtained fraction was concentrated to give a solid. The obtained solid was recrystallized from ethyl acetate/hexane, so that 0.31 g of a yellow solid was obtained in a yield of 10%. Then 0.30 g of the obtained yellow solid was purified by a train sublimation method. The purification by sublimation was performed by heating at 320° C. under a pressure of 2.6 Pa with an argon flow rate of 5.0 mL/min for 24 hours. After the purification by sublimation, 0.21 g of a yellow solid was obtained at a collection rate of 70%. The synthesis scheme of Step 4 is shown in (d-0) below.

(d-0)

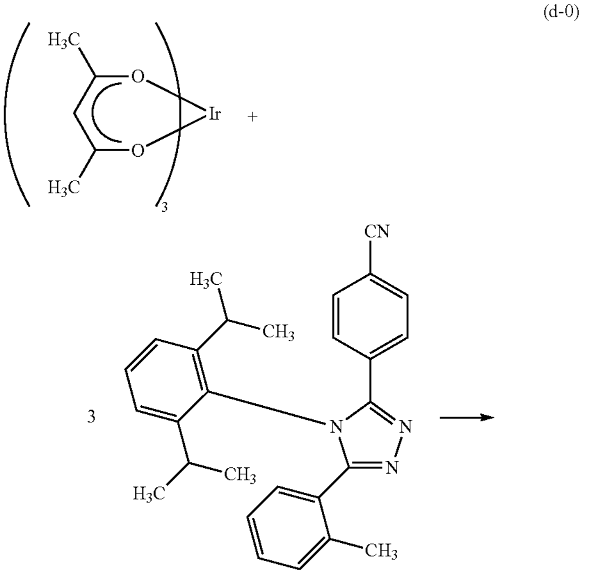

HmpCNptz-diPrp

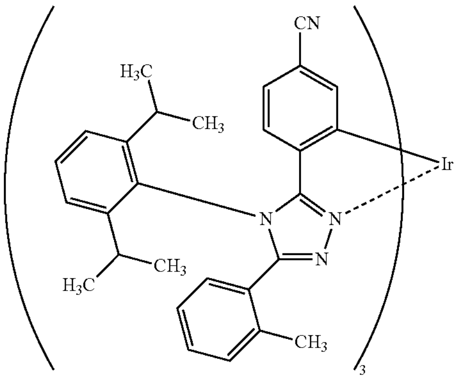

fac-Ir(mpCNptz-diPrp)$_3$
mer-Ir(mpCNptz-diPrp)$_3$

Figure 34:
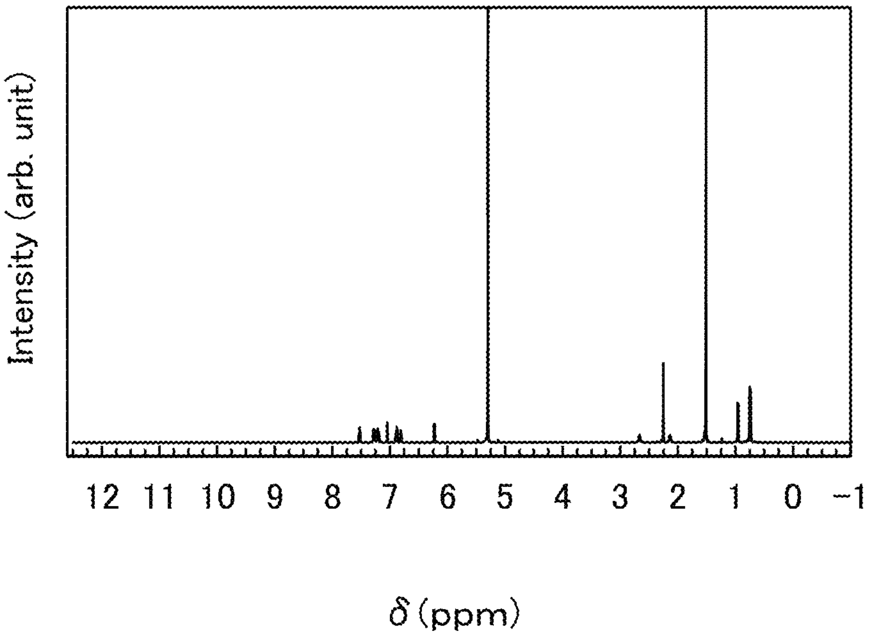
FIG. 34 is an NMR chart of a compound of one embodiment of the present invention.

The protons ($^1$H) of the yellow solid that was obtained in Step 4 was measured by a nuclear magnetic resonance (NMR) spectroscopy. The obtained values are shown below. The $^1$H-NMR chart is shown in FIG. 34. These results reveal that fac-Ir(mpCNptz-diPrp)$_3$, which is the organometallic complex of one embodiment of the present invention represented by Structural Formula (108), was obtained in Synthesis example 1.

$^1$H-NMR δ ($CD_2Cl_2$): 0.72-0.79 (m, 27H), 0.96 (d, 9H), 2.11-2.17 (m, 3H), 2.25 (s, 9H), 2.64-2.69 (m, 3H), 6.23 (d, 3H), 6.80 (d, 3H), 6.87-6.91 (m, 6H), 7.05 (s, 3H), 7.18-7.29 (m, 12H), 7.53 (t, 3H).

<Characteristics of fac-Ir(mpCNptz-diPrp)$_3$>

Figure 35:
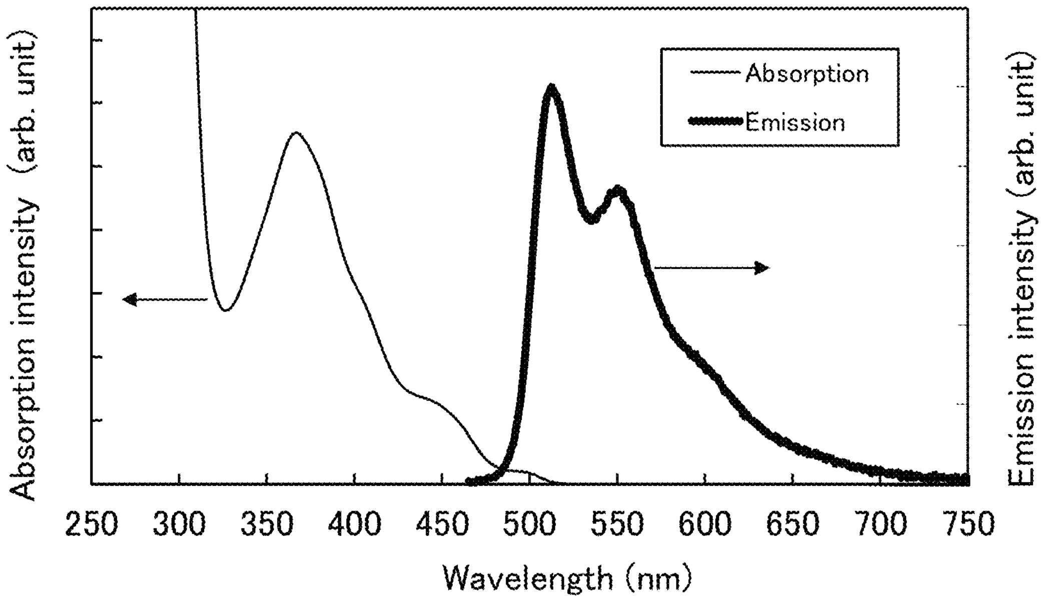
FIG. 35 is a graph showing an absorption spectrum and an emission spectrum of a compound of one embodiment of the present invention.

Next, an ultraviolet-visible absorption spectrum (hereinafter, simply referred to as an "absorption spectrum") and an emission spectrum of a dichloromethane solution (0.0100 mmol/L) of fac-Ir(mpCNptz-diPrp)$_3$ were measured. The absorption spectrum was measured at room temperature with the use of an ultraviolet-visible light spectrophotometer (V-550, produced by JASCO Corporation) in a state where the dichloromethane solution was put in a quartz cell. The emission spectrum was measured at room temperature in such a manner that an absolute PL quantum yield measurement system (C11347-01 produced by Hamamatsu Photonics K. K.) was used and the deoxidized dichloromethane solution was sealed in a quartz cell under a nitrogen atmosphere in a glove box (LABstar M13 (1250/780) produced by Bright Co., Ltd.). FIG. 35 shows measurement results of the absorption spectrum and the emission spectrum. The horizontal axis represents wavelength and the vertical axes represent absorption intensity and emission intensity. Note that the absorption spectrum in FIG. 35 is a result obtained by subtraction of a measured absorption spectrum of only dichloromethane that was put in a quartz cell from the measured absorption spectrum of the dichloromethane solution in a quartz cell.

As shown in FIG. 35, green light emission having emission peaks at 513 nm and 550 nm was observed from the dichloromethane solution of fac-Ir(mpCNptz-diPrp)$_3$.

Next, fac-Ir(mpCNptz-diPrp)$_3$ obtained in this example was subjected to mass spectrometric (MS) analysis by liquid chromatography mass spectrometry (LC/MS).

In the LC/MS, liquid chromatography (LC) separation was carried out with ACQUITY UPLC (produced by Waters Corporation) and mass spectrometry (MS) was carried out with Xevo G2 Tof MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that fac-Ir(mpCNptz-diPrp)$_3$ was dissolved in chloroform at a given concentration and the mixture was diluted with acetonitrile. The injection amount was 5.0 μL.

In the LC separation, a gradient method in which the composition of mobile phases is changed was employed. The ratio of Mobile Phase A to Mobile Phase B was 85:15 for 0 to 1 minute after the start of the measurement, and then the composition was changed such that the ratio of Mobile Phase A to Mobile Phase B after 10 minutes from the start of the measurement was 95:5. The composition was changed linearly.

In the MS analysis, ionization was carried out by an electrospray ionization (ESI) method. At this time, the capillary voltage and the sample cone voltage were set to 3.0 kV and 30 V, respectively, and detection was performed in a positive mode. A component with m/z of 1450.63 which underwent the ionization under the above-described conditions was collided with an argon gas in a collision cell to dissociate into product ions. Energy (collision energy) for the collision with argon was 50 eV. The mass range for the measurement was m/z=100 to 2000. The detection result of the dissociated product ions by time-of-flight (TOF) MS are shown in FIG. 36.

Figure 36:
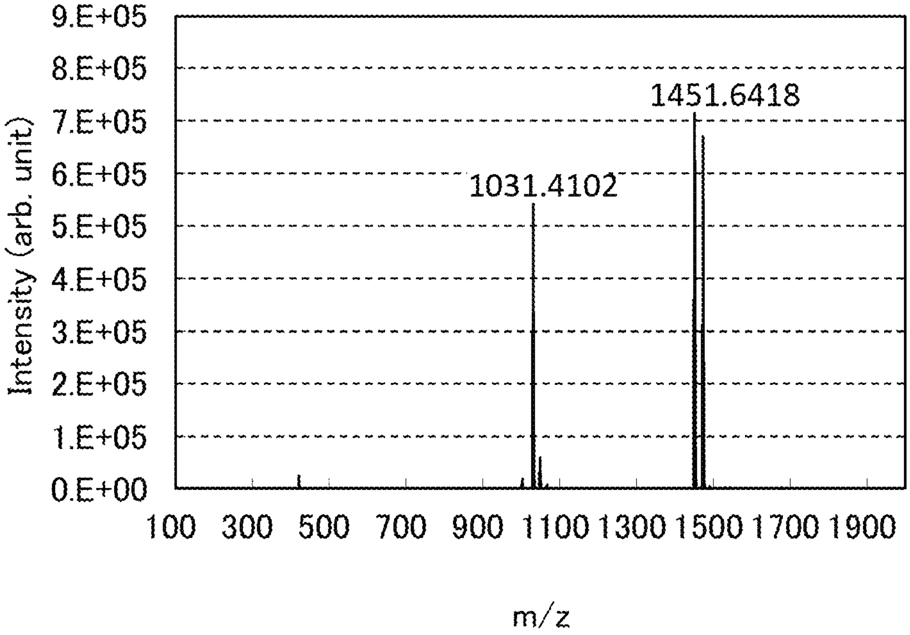
FIG. 36 is a graph showing the liquid chromatography mass spectrometry of a compound of one embodiment of the present invention.

FIG. 36 shows that product ions of fac-Ir(mpCNptz-diPrp)$_3$ are mainly detected around m/z=1031. The results in FIG. 36 show characteristics derived from fac-Ir(mpCNptz-diPrp)$_3$ and therefore can be regarded as important data for identifying fac-Ir(mpCNptz-diPrp)$_3$ contained in a mixture.

It is presumed that the product ion around m/z=1031 is a cation in a state where the ligand HmpCNptz-diPrp is eliminated from fac-Ir(mpCNptz-diPrp)$_3$, and this is characteristic of fac-Ir(mpCNptz-diPrp)$_3$.

Example 2

Synthesis Example 2

In this example, a method for synthesizing (OC-6-21)-tris{5-cyano-2-[4-(2,6-diisopropylphenyl)-5-(2-methylphenyl)-4H-1,2,4-triazol-3-yl-κN$^2$]phenyl-κC}iridium(III) (abbreviation: mer-Ir(mpCNptz-diPrp)$_3$), which is an organometallic complex of one embodiment of the present invention represented by Structural Formula (108) in Embodiment 2 is described. The structure of mer-Ir (mpCNptz-diPrp)$_3$ is shown below.

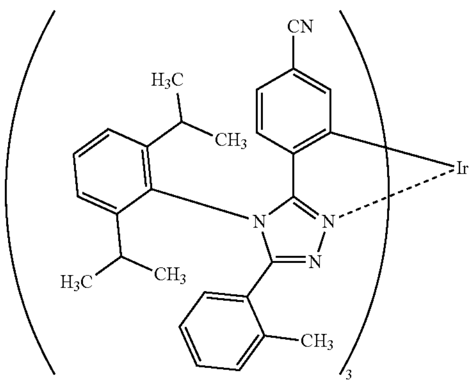

mer-Ir(mpCNptz-diPrp)$_3$

<<Synthesis of mer-Ir(mpCNptz-diPrp)$_3$>>

The mixture of the facial isomer and the meridional isomer synthesized by the method described in Synthesis example 1 in Example 1 was purified by silica column chromatography. As developing solvents, first, a 1:1 dichloromethane-hexane mixed solvent was used, and then a 4:1 dichloromethane-hexane mixed solvent was used. The obtained fraction was concentrated to give a solid. The resulting solid was recrystallized from ethyl acetate/hexane to give 0.38 g of a yellow solid in a yield of 12%. Then 0.37 g of the obtained yellow solid was purified by a train sublimation method. The purification by sublimation was performed by heating at 305° C. under a pressure of 2.6 Pa with an argon flow rate of 5.0 mL/min for 42 hours. After the purification by sublimation, 0.25 g of a yellow solid was obtained at a collection rate of 68%.

Figure 37:
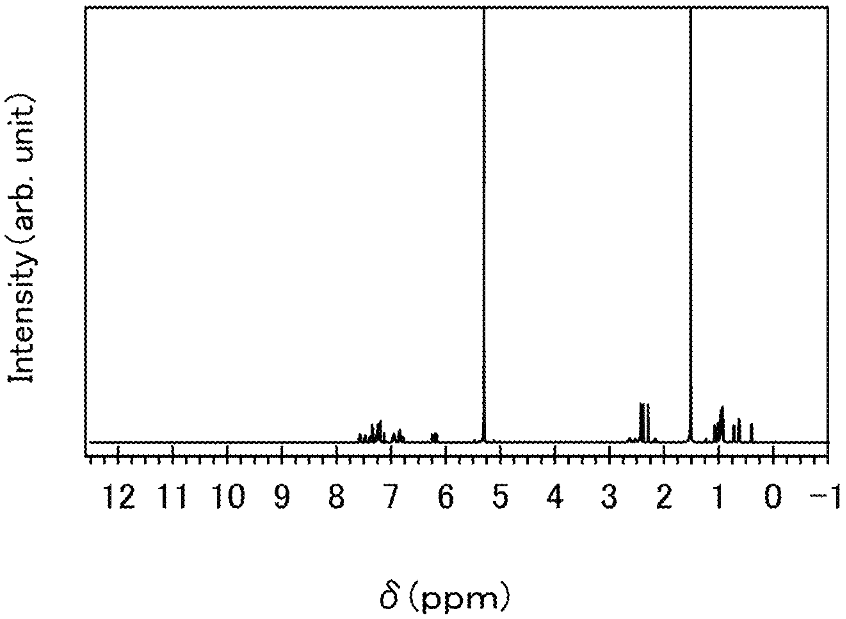
FIG. 37 is an NMR chart of a compound of one embodiment of the present invention.

The protons ($^1$H) of the yellow solid that was obtained in the above step was measured by a nuclear magnetic resonance (NMR) spectroscopy. The obtained values are shown below. The $^1$H-NMR chart is shown in FIG. 37. These results reveal that mer-Ir(mpCNptz-diPrp)$_3$, which is the organometallic complex of one embodiment of the present invention represented by Structural Formula (108), was obtained in Synthesis example 2.

$^1$H-NMR δ ($CD_2Cl_2$): 0.40 (d, 3H), 0.63 (t, 6H), 0.72 (d, 3H), 0.92-1.01 (m, 21H), 1.07 (d, 3H), 2.14-2.19 (m, 1H), 2.29 (s, 3H), 2.38-2.54 (m, 9H), 2.60-2.66 (m, 2H), 6.16-6.25 (m, 3H), 6.77-6.86 (m, 5H), 6.92-6.99 (m, 4H), 7.13 (s, 1H), 7.20-7.30 (m, 11H), 7.34-7.40 (m, 3H), 7.48 (t, 1H), 7.55-7.59 (m, 2H).

<Characteristics of mer-Ir(mpCNptz-diPrp)$_3$>

Figure 38:
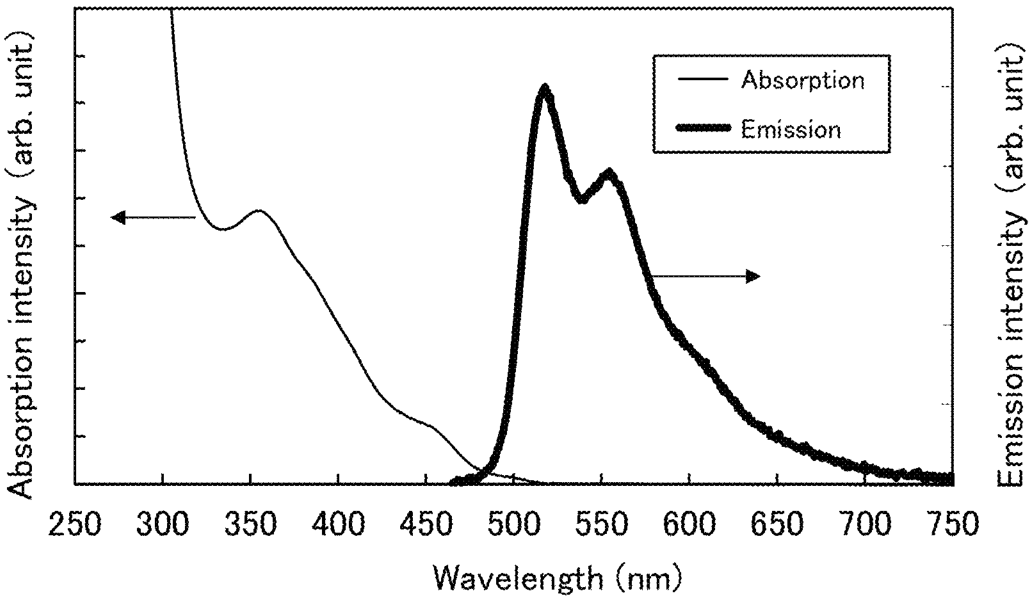
FIG. 38 is a graph showing an absorption spectrum and an emission spectrum of a compound of one embodiment of the present invention.

The absorption and emission spectra of a dichloromethane solution (0.0100 mmol/L) of mer-Ir(mpCNptz-diPrp)$_3$ were measured. The measurement of the absorption and emission spectra was performed in a manner similar to that described in Example 1. FIG. 38 shows measurement results of the absorption and emission spectra. The horizontal axis represents wavelength and the vertical axes represent absorption intensity and emission intensity.

As shown in FIG. 38, green light emission having emission peaks at 518 nm and 556 nm was observed from the dichloromethane solution of mer-Ir(mpCNptz-diPrp)$_3$.

Next, mer-Ir(mpCNptz-diPrp)$_3$ obtained in this example was subjected to mass spectrometric (MS) analysis by LC/MS. The conditions of the analysis were similar to those of the analysis in Example 1. The obtained results were also similar to those in Example 1 and thus it is difficult to determine whether facial or meridional by the measurement; however, it was found that the characteristic of the fragmentation is similar to that of the compound in Example 1.

Example 3

Synthesis Example 3

In this example, a method for synthesizing tris{2-[4-(4-cyano-2,6-diisobutylphenyl)-5-(2-methylphenyl)-4H-1,2,4-triazol-3-yl-κN$^2$]phenyl-κC}iridium(III) (abbreviation: Ir(mpptz-diBuCNp)$_3$), which is an organometallic complex of one embodiment of the present invention represented by Structural Formula (112) in Embodiment 2 is described. The structure of Ir(mpptz-diBuCNp)$_3$ is shown below.

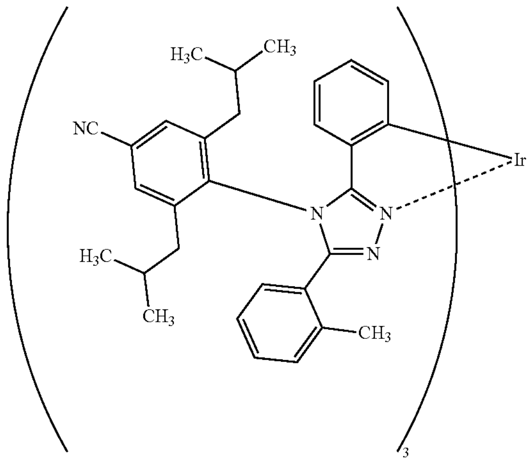

Ir(mpptz-diBuCNp)$_3$

Step 1: Synthesis of 4-amino-3,5-diisobutylbenzonitrile

Into a 1000 mL three-neck flask were put 9.4 g (50 mmol) of 4-amino-3,5-dichlorobenzonitrile, 26 g (253 mmol) of isobutylboronic acid, 54 g (253 mmol) of tripotassium phosphate, 2.0 g (4.8 mmol) of 2-dicyclohexylphosphino-2',6'-dimethoxybiphenyl (S-phos), and 500 mL of toluene. The atmosphere in the flask was replaced with nitrogen, and this mixture was degassed while being stirred under reduced pressure. After the degassing, 0.88 g (0.96 mmol) of tris(dibenzylideneacetone)palladium(0) was added, and the mixture was stirred under a nitrogen stream at 130° C. for 8 hours to be reacted. Toluene was added to the reacted solution, and the solution was filtered through a filter aid in which Celite, aluminum oxide, and Celite were stacked in this order. The obtained filtrate was concentrated to give an oily substance. The obtained oily substance was purified by silica column chromatography. Toluene was used as a developing solvent. The resulting fraction was concentrated to give 10 g of a yellow oily substance in a yield of 87%. The obtained yellow oily substance was identified as 4-amino-3,5-diisobutylbenzonitrile by nuclear magnetic resonance (NMR) spectroscopy. The synthesis scheme of Step 1 is shown in (a-1) below.

(a-1)

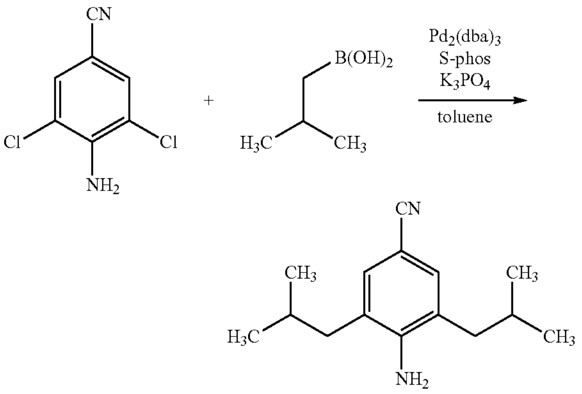

Step 2: Synthesis of 4-(4-cyano-2,6-diisobutylphenyl)-3-(2-methylphenyl)-5-phenyl-4H-1,2,4-triazole (abbreviation: Hmpptz-diBuCNp)

Into a 300 mL three-neck flask were put 11 g (48 mmol) of 4-amino-3,5-diisobutylbenzonitrile synthesized in Step 1, 4.7 g (16 mmol) of N-(2-methylphenyl)chloromethylidene-N'-phenylchloromethylidenehydrazine, and 40 mL of N,N-dimethylaniline, and the mixture was stirred under a nitrogen stream at 160° C. for 7 hours to be reacted. After the reaction, the reacted solution was added to 300 mL of 1M hydrochloric acid and stirring was performed for 3 hours, and an organic layer and an aqueous layer were separated. The aqueous layer was subjected to extraction with ethyl acetate. The organic layer and the obtained solution of the extract were combined, and washed with a saturated aqueous solution of sodium hydrogen carbonate and then with saturated saline, and anhydrate magnesium sulfate was added to the organic layer for drying. The obtained mixture was subjected to gravity filtration, and the filtrate was concentrated to give an oily substance. The obtained oily substance was purified by silica column chromatography. As a developing solvent, a 5:1 hexane-ethyl acetate mixed solvent was used. The obtained fraction was concentrated to give a solid. Hexane was added to the obtained solid, and the mixture was irradiated with ultrasonic waves and then subjected to suction filtration to give 2.0 g of a white solid in a yield of 28%. The obtained white solid was identified as Hmpptz-diBuCNp by nuclear magnetic resonance (NMR) spectroscopy. The synthesis scheme of Step 2 is shown in (b-1) below.

(b-1)

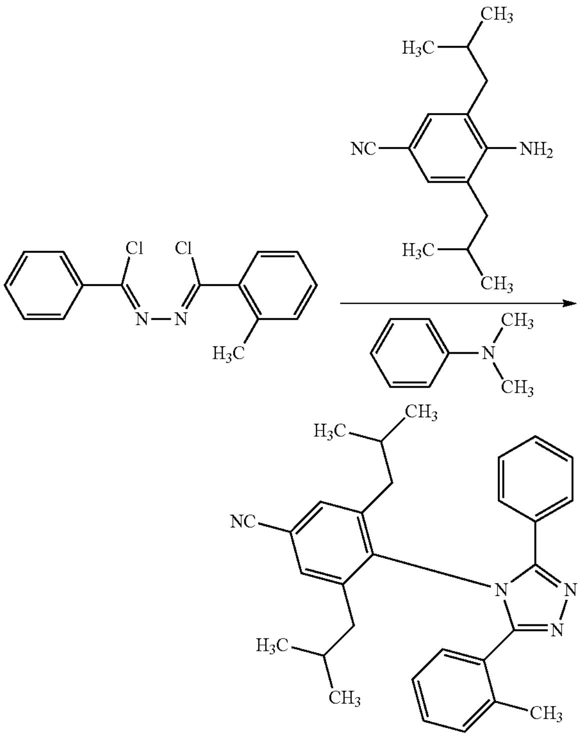

Hmpptz-diBuCNp

Step 3: Synthesis of tris{2-[4-(4-cyano-2,6-diisobutylphenyl)-5-(2-methylphenyl)-4H-1,2,4-triazol-3-yl-κ$N^2$]phenyl-κC}iridium(III) (abbreviation: Ir(mpptz-diBuCNp)$_3$)

Into a reaction container provided with a three-way cock were put 2.0 g (4.5 mmol) of Hmpptz-diBuCNp synthesized in Step 2 and 0.44 g (0.89 mmol) of tris(acetylacetonato)iridium(III), and the mixture was stirred under an argon stream at 250° C. for 43 hours to be reacted. The obtained reaction mixture was added to dichloromethane, and an insoluble matter was removed. The obtained filtrate was concentrated to give a solid. The obtained solid was purified by silica column chromatography. As a developing solvent, dichloromethane was used. The obtained fraction was concentrated to give a solid. The obtained solid was recrystallized from ethyl acetate/hexane, so that 0.32 g of a yellow solid was obtained in a yield of 23%. Then 0.31 g of the obtained yellow solid was purified by a train sublimation method. The purification by sublimation was performed by heating at 310° C. under a pressure of 2.6 Pa with an argon flow rate of 5.0 mL/min for 19 hours. After the purification by sublimation, 0.26 g of a yellow solid was obtained at a collection rate of 84%. The synthesis scheme of Step 3 is shown in (c-1) below.

(c-1)

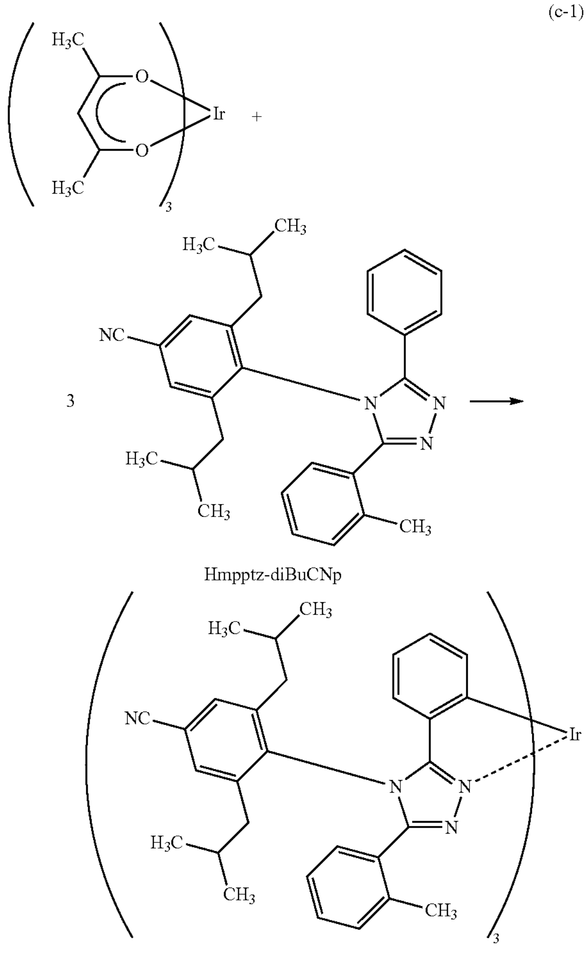

Hmpptz-diBuCNp

Ir(mpptz-diBuCNp)$_3$

Figure 39:
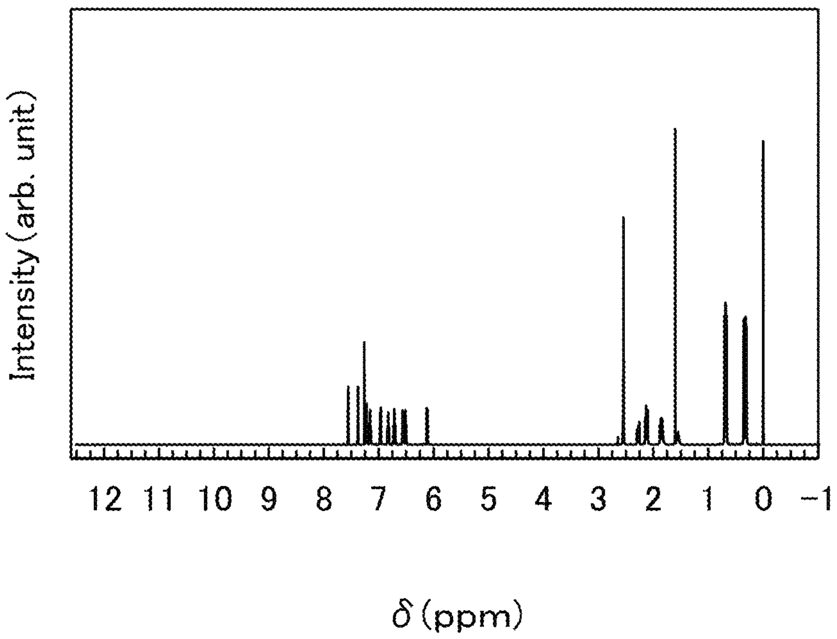
FIG. 39 is an NMR chart of a compound of one embodiment of the present invention.

The protons ($^1H$) of the yellow solid that was obtained in Step 3 was measured by a nuclear magnetic resonance (NMR) spectroscopy. The obtained values are shown below. The $^1H$-NMR chart is shown in FIG. 39. These results reveal that Ir(mpptz-diBuCNp)$_3$, which is the organometallic complex of one embodiment of the present invention represented by Structural Formula (112), was obtained in Synthesis example 3.

$^1H$-NMR δ ($CDCl_3$): 0.33 (d, 18H), 0.92 (d, 18H), 1.51-1.58 (m, 3H), 1.80-1.88 (m, 6H), 2.10-2.15 (m, 6H), 2.26-2.30 (m, 3H), 2.55 (s, 9H), 6.12 (d, 3H), 6.52 (t, 3H), 6.56 (d, 3H), 6.72 (t, 3H), 6.83 (t, 3H), 6.97 (d, 3H), 7.16 (t, 3H), 7.23 (d, 3H), 7.38 (s, 3H), 7.55 (s, 3H).

<Characteristics of Ir(mpptz-diBuCNp)$_3$>

Figure 40:
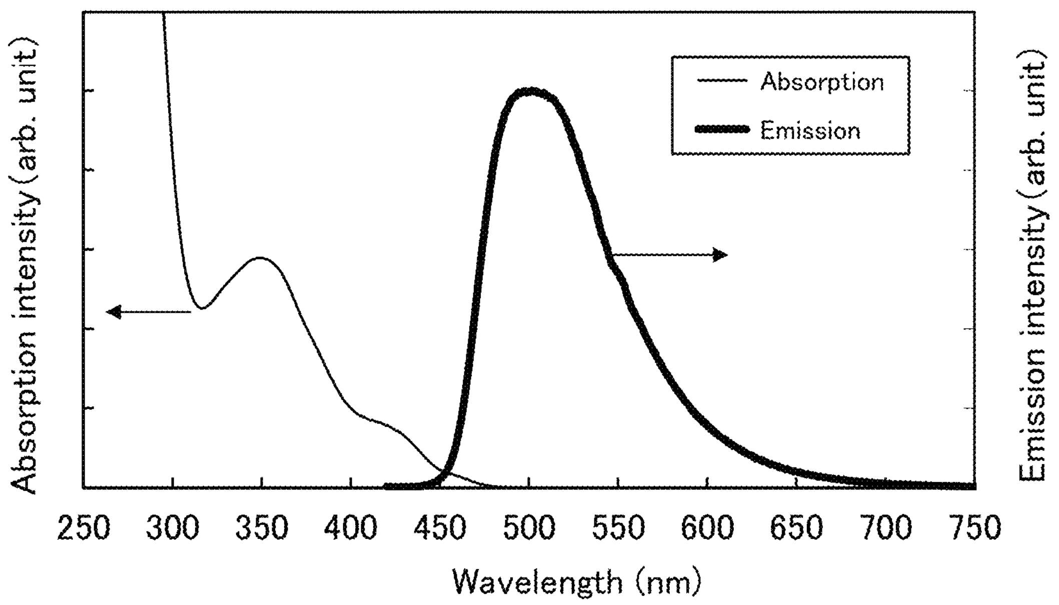
FIG. 40 is a graph showing an absorption spectrum and an emission spectrum of a compound of one embodiment of the present invention.

The absorption and emission spectra of a dichloromethane solution (0.0104 mmol/L) of Ir(mpptz-diBuCNp)$_3$ were measured. The measurement of the absorption and emission spectra was performed in a manner similar to that described in Example 1. FIG. 40 shows measurement results of the absorption and emission spectra. The horizontal axis represents wavelength and the vertical axes represent absorption intensity and emission intensity.

As shown in FIG. 40, blue light emission having an emission peak at 502 nm was observed from the dichloromethane solution of Ir(mpptz-diBuCNp)$_3$.

Next, Ir(mpptz-diBuCNp)$_3$ obtained in this example was subjected to mass spectrometric (MS) analysis by liquid chromatography mass spectrometry (LC/MS).

In the LC/MS, liquid chromatography (LC) separation was carried out with ACQUITY UPLC (produced by Waters Corporation) and mass spectrometry (MS) was carried out with Xevo G2 Tof MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that Ir(mpptz-diBuCNp)$_3$ was dissolved in chloroform at a given concentration and the mixture was diluted with acetonitrile. The injection amount was 5.0 μL.

In the LC separation, a gradient method in which the composition of mobile phases is changed was employed. The ratio of Mobile Phase A to Mobile Phase B was 90:10 for 0 to 1 minute after the start of the measurement, and then the composition was changed such that the ratio of Mobile Phase A to Mobile Phase B after 10 minutes from the start of the measurement was 95:5. The composition was changed linearly.

In the MS analysis, ionization was carried out by an electrospray ionization (ESI) method. At this time, the capillary voltage and the sample cone voltage were set to 3.0 kV and 30 V, respectively, and detection was performed in a positive mode. A component with m/z of 1534.73 which underwent the ionization under the above-described conditions was collided with an argon gas in a collision cell to dissociate into product ions. Energy (collision energy) for the collision with argon was 50 eV. The mass range for the measurement was m/z=100 to 2000. The detection result of the dissociated product ions by time-of-flight (TOF) MS are shown in FIG. 41.

Figure 41:
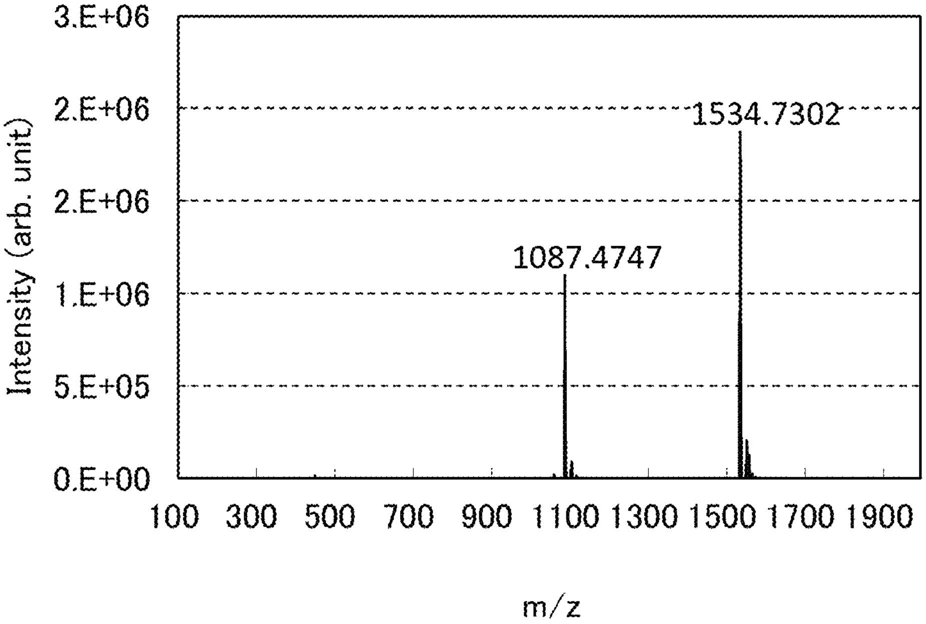
FIG. 41 is a graph showing the liquid chromatography mass spectrometry of a compound of one embodiment of the present invention.

FIG. 41 shows that product ions of Ir(mpptz-diBuCNp)$_3$ are mainly detected around m/z=1087. The results in FIG. 41 show characteristics derived from Ir(mpptz-diBuCNp)$_3$ and therefore can be regarded as important data for identifying Ir(mpptz-diBuCNp)$_3$ contained in a mixture.

It is presumed that the product ion around m/z=1087 is a cation in a state where the ligand Hmpptz-diBuCNp is eliminated from Ir(mpptz-diBuCNp)$_3$, and this is characteristic of Ir(mpptz-diBuCNp)$_3$.

Example 4

Figure 42:
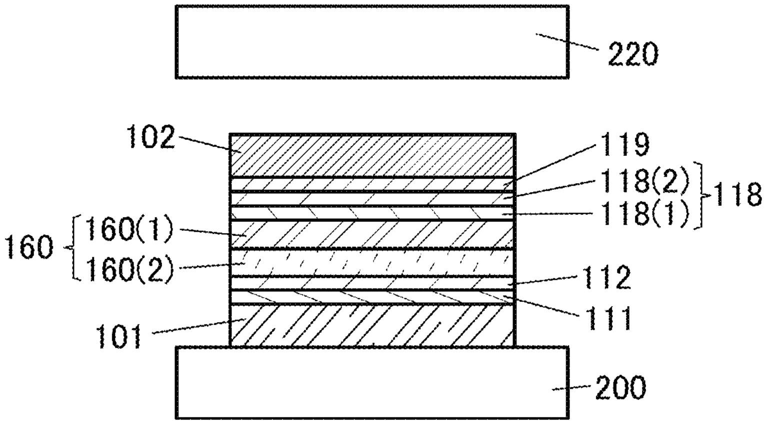
FIG. 42 is a schematic cross-sectional view illustrating a light-emitting element in Example.

In this example, examples of fabricating light-emitting elements of embodiments of the present invention (a light-emitting element 1 and a light-emitting element 2) and comparative light-emitting elements (a comparative light-emitting element 1 and a comparative light-emitting element 2) are described. FIG. 42 is a schematic cross-sectional view of each of the light-emitting elements fabricated in this example, and Table 1 shows details of the element structures. In addition, structures and abbreviations of compounds used here are given below. Note that Example 3 can be referred to for other compounds.

DBT3P-II

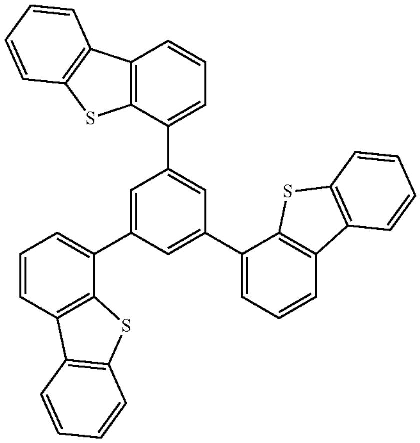

Ir(mpptz-diPrp)$_3$

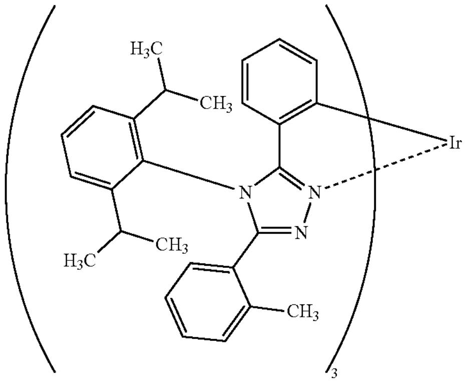

PCCP

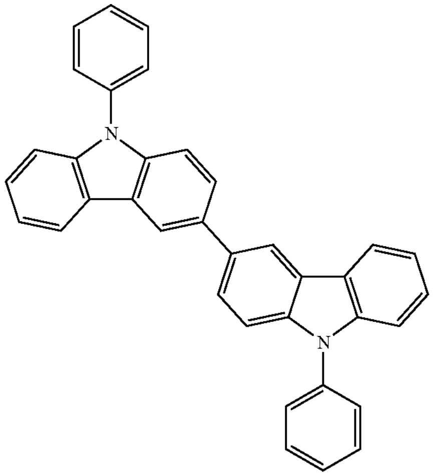

-continued 4,6mCzP2Pm

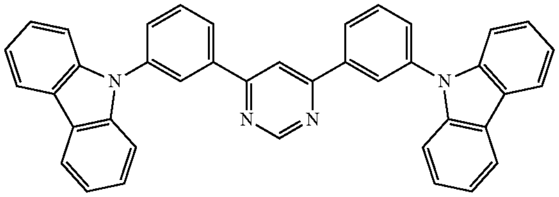

Bphen

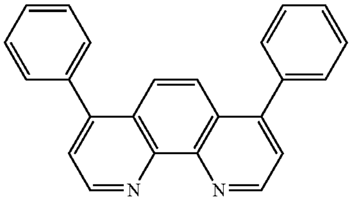

35DCzPPy

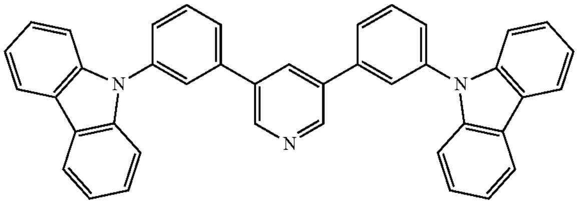

TABLE 1

| | Layer | Reference numeral | Thickness (nm) | Material | Weight ratio |
|---|---|---|---|---|---|
| Light-emitting element 1 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 35DCzPPy | — |
| | Light-emitting layer | 160(2) | 10 | 35DCzPPy:Ir(mpptz-diBuCNp)$_3$ | 1:0.06 |
| | | 160(1) | 30 | 35DCzPPy:PCCP:Ir(mpptz-diBuCNp)$_3$ | 0.65:0.65:0.06 |
| | Hole-transport layer | 112 | 20 | PCCP | — |
| | Hole-injection layer | 111 | 20 | DBT3P-II:$MoO_3$ | 1:0.5 |
| | Electrode | 101 | 70 | ITSO | — |

TABLE 1-continued

| | Layer | Reference numeral | Thickness (nm) | Material | Weight ratio |
|---|---|---|---|---|---|
| Light-emitting element 2 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 35DCzPPy | — |
| | Light-emitting layer | 160(2) | 10 | 4,6mCzP2Pm:PCCP:Ir(mpptz-diBuCNp)$_3$ | 0.8:0.2:0.06 |
| | | 160(1) | 30 | 4,6mCzP2Pm:PCCP:Ir(mpptz-diBuCNp)$_3$ | 0.4:0.6:0.06 |
| | Hole-transport layer | 112 | 20 | PCCP | — |
| | Hole-injection layer | 111 | 20 | DBT3P-II:$MoO_3$ | 1:0.5 |
| | Electrode | 101 | 70 | ITSO | — |
| Comparative light-emitting element 1 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 35DCzPPy | — |
| | Light-emitting layer | 160(2) | 10 | 35DCzPPy:Ir(mpptz-diPrp)$_3$ | 1:0.06 |
| | | 160(1) | 30 | 35DCzPPy:PCCP:Ir(mpptz-diPrp)$_3$ | 0.3:1:0.06 |
| | Hole-transport layer | 112 | 20 | PCCP | — |
| | Hole-injection layer | 111 | 20 | DBT3P-II:$MoO_3$ | 1:0.5 |
| | Electrode | 101 | 70 | ITSO | — |
| Comparative light-emitting element 2 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 160(2) | 20 | 4,6mCzP2Pm:PCCP:Ir(mpptz-diPrp)$_3$ | 0.8:0.2:0.05 |
| | | 160(1) | 20 | 4,6mCzP2Pm:PCCP:Ir(mpptz-diPrp)$_3$ | 0.5:0.5:0.05 |
| | Hole-transport layer | 112 | 20 | PCCP | — |
| | Hole-injection layer | 111 | 20 | DBT3P-II:$MoO_3$ | 1:0.5 |
| | Electrode | 101 | 110 | ITSO | — |

<Fabrication of Light-Emitting Elements>

<<Fabrication of light-emitting element 1>>

As the electrode 101, an JTSO film was formed to a thickness of 70 nm over the substrate 200. The electrode area of the electrode 101 was set to 4 $mm^2$ (2 mm×2 mm).

As the hole-injection layer 111, 4,4',4"-(benzene-1,3,5-triyl)tri(dibenzothiophene) (abbreviation: DBT3P-JJ) and molybdenum oxide ($MoO_3$) were deposited over the electrode 101 by co-evaporation in a weight ratio of DBT3P-JJ:$MoO_3$=1:0.5 to a thickness of 20 nm.

As the hole-transport layer 112, 3,3'-bis(9-phenyl-9H-carbazole) (abbreviation: PCCP) was deposited over the hole-injection layer 111 by evaporation to a thickness of 20 nm.

As the light-emitting layer 160 over the hole-transport layer 112, 3,5-bis[3-(9H-carbazol-9-yl)phenyl]pyridine (abbreviation: 35DCzPPy), PCCP, and Ir(mpptz-diBuCNp)$_3$ were deposited by co-evaporation in a weight ratio of 35DCzPPy:PCCP:Ir(mpptz-diBuCNp)$_3$=0.65:1:0.65:0.06 to a thickness of 30 nm, and successively, 35DCzPPy and Ir(mpptz-diBuCNp)$_3$ were deposited by co-evaporation in a weight ratio of 35DCzPPy:Ir(mpptz-diBuCNp)$_3$=1:0.06 to a thickness of 10 nm. Note that in the light-emitting layer 160, 35DCzPPy corresponds to the first organic compound, PCCP corresponds to the second organic compound, and Ir(mpptz-diBuCNp)$_3$ corresponds to the guest material (the phosphorescent compound).

As the electron-transport layer 118, 35DCzPPy and bathophenanthroline (abbreviation: BPhen) were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 1 was sealed by fixing the substrate 220 to the substrate 200 over which the organic material was deposited using a sealant for an organic EL device. Specifically, after the sealant was applied to surround the organic material over the substrate 200 and the substrate 200 was bonded to the substrate 220, irradiation with ultraviolet light having a wavelength of 365 nm at 6 J/$cm^2$ and heat treatment at 80° C. for one hour were performed. Through the above process, the light-emitting element 1 was obtained.

<<Fabrication of Light-Emitting Element 2>>

The light-emitting element 2 was fabricated through the same steps as those for the light-emitting element 1 except for the step of forming the light-emitting layer 160.

As the light-emitting layer 160 in the light-emitting element 2, 4,6-bis[3-(9H-carbazol-9-yl)phenyl]pyrimidine (abbreviation: 4,6mCzP2Pm), PCCP, and Ir(mpptz-diBuCNp)$_3$ were deposited by co-evaporation in a weight ratio of 4,6mCzP2Pm:PCCP:Ir(mpptz-diBuCNp)$_3$=0.4:0.6:0.06 to a thickness of 30 nm, and successively, 4,6mCzP2Pm, PCCP, and Ir(mpptz-diBuCNp)$_3$ were deposited by co-evaporation in a weight ratio of 4,6mCzP2Pm:PCCP:Ir(mpptz-diBuCNp)$_3$=0.8:0.2:0.06 to a thickness of 10 nm. Note that in the light-emitting layer 160, 4,6mCzP2Pm corresponds to the first organic compound, PCCP corresponds to the second organic compound, and Ir(mpptz-diBuCNp)$_3$ corresponds to the guest material (the phosphorescent compound).

<<Fabrication of Comparative Light-Emitting Element 1>>

The comparative light-emitting element 1 was fabricated through the same steps as those for the light-emitting element 1 except for the step of forming the light-emitting layer 160.

As the light-emitting layer 160 in the comparative light-emitting element 1, 35DCzPPy, PCCP, and tris{2-[5-(2-methylphenyl)-4-(2,6-diisopropylphenyl)-4H-1,2,4-triazol-3-yl-κ$N^2$]phenyl-κC}iridium(III) (abbreviation: Ir(mpptz-diPrp)$_3$) were deposited by co-evaporation in a weight ratio of 35DCzPPy:PCCP:Ir(mpptz-diPrp)$_3$=0.3:1:0.06 to a thickness of 30 nm, and successively, 35DCzPPy and Ir(mpptz-diPrp)$_3$ were deposited by co-evaporation in a weight ratio of 35DCzPPy:Ir(mpptz-diPrp)$_3$=1:0.06 to a thickness of 10 nm. Note that in the light-emitting layer 160, 35DCzPPy corresponds to the first organic compound, PCCP corresponds to the second organic compound, and Ir(mpptz-diPrp)$_3$ corresponds to the guest material (the phosphorescent compound).

<<Fabrication of Comparative Light-Emitting Element 2>>

As the electrode 101, an ITSO film was formed to a thickness of 110 nm over the substrate 200. The electrode area of the electrode 101 was set to 4 $mm^2$ (2 mm×2 mm).

As the hole-injection layer 111, DBT3P-II and $MoO_3$ were deposited over the electrode 101 by co-evaporation in a weight ratio of DBT3P-II:$MoO_3$=1:0.5 to a thickness of 20 nm. Next, as the hole-transport layer 112, PCCP was deposited over the hole-injection layer 111 by evaporation to a thickness of 20 nm.

As the light-emitting layer 160 over the hole-transport layer 112, 4,6mCzP2Pm, PCCP, and Ir(mpptz-diPrp)$_3$ were deposited by co-evaporation in a weight ratio of 4,6mCzP2Pm:PCCP:Ir(mpptz-diPrp)$_3$=0.5:0.5:0.05 to a thickness of 30 nm, and successively, 4,6mCzP2Pm, PCCP, and Ir(mpptz-diPrp)$_3$ were deposited by co-evaporation in a weight ratio of 4,6mCzP2Pm:PCCP:Ir(mpptz-diPrp)$_3$=0.8:0.2:0.05 to a thickness of 10 nm. Note that in the light-emitting layer 160, 4,6mCzP2Pm corresponds to the first organic compound, PCCP corresponds to the second organic compound, and Ir(mpptz-diPrp)$_3$ corresponds to the guest material (the phosphorescent compound).

As the electron-transport layer 118, 4,6mCzP2Pm and BPhen were sequentially deposited by evaporation to thicknesses of 20 nm and 10 nm, respectively, over the light-emitting layer 160. Then, as the electron-injection layer 119, LiF was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the comparative light-emitting element 2 was sealed by fixing the substrate 220 to the substrate 200 over which the organic material was deposited using a sealant for an organic EL device. For the detailed method, description of the light-emitting element 1 can be referred to. Through the above steps, the comparative light-emitting element 2 was obtained.

<Emission Spectra of Host Materials>

Figure 43A:
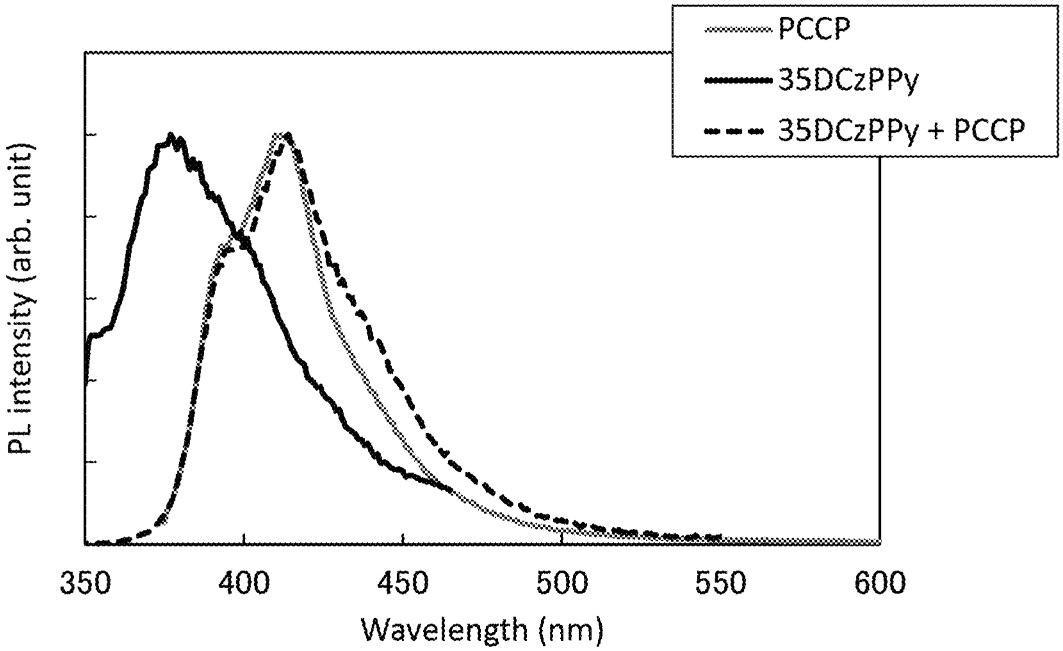
FIGS. 43A and 43B are graphs each showing electroluminescence spectra of host materials in Example.
Figure 43B:
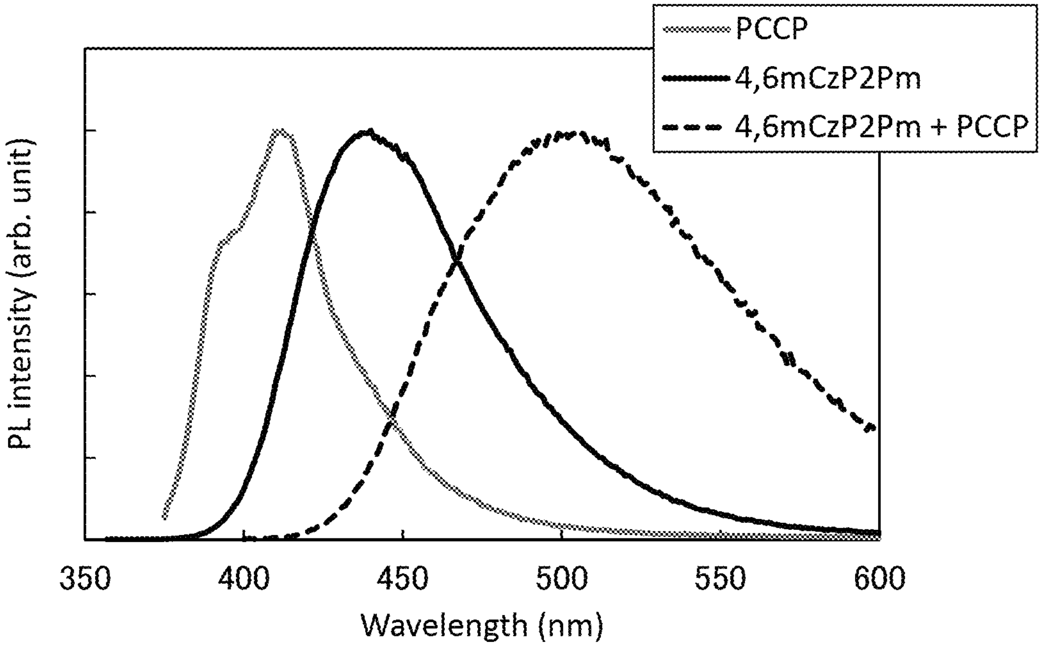

In the fabricated light-emitting elements (the light-emitting elements 1 and 2 and the comparative light-emitting elements 1 and 2), PCCP, 35DCzPPy, and 4,6mCzP2Pm were used as host materials (the first organic compound and the second organic compound). FIGS. 43A and 43B show measurement results of emission spectra of a thin film of PCCP, a thin film of 35DCzPPy, a thin film of 4,6mCzP2Pm, a mixed thin film of 35DCzPPy and PCCP, and a mixed thin film of 4,6mCzP2Pm and PCCP.

For the emission spectrum measurement, thin film samples were formed over a quartz substrate by a vacuum evaporation method. The emission spectra were measured at room temperature (in an atmosphere kept at 23° C.) with a PL-EL measurement apparatus (produced by Hamamatsu Photonics K.K.). The thickness of each thin film was 50 nm. The mixing ratio of the two kinds of compounds (the first organic compound: the second organic compound) in the mixed thin film was 1:1.

As shown in FIG. 43A, a peak wavelength of the emission spectrum of 35DCzPPy is 377 nm and that of PCCP is 412 nm; accordingly, each of 35DCzPPy and PCCP has an emission peak at a significantly short wavelength. A peak wavelength of the emission spectrum of the mixed thin film of 35DCzPPy and PCCP is 414 nm, which is substantially the same as that of PCCP. Therefore, it can be said that a combination of 35DCzPPy and PCCP does not form an exciplex.

As shown in FIG. 43B, a peak wavelength of the emission spectrum of the mixed thin film of 4,6mCzP2Pm and PCCP is 501 nm. The emission spectrum differs from the emission spectrum of 4,6mCzP2Pm (peak wavelength: 440 nm) and the emission spectrum of PCCP (peak wavelength: 412 nm). As described later, the LUMO level of 4,6mCzP2Pm is lower than that of PCCP, and the HOMO level of PCCP is higher than that of 4,6mCzP2Pm. The energy of light emission from the mixed thin film of 4,6mCzP2Pm and PCCP approximately corresponds to an energy difference between the LUMO level of 4,6mCzP2Pm and the HOMO level of PCCP. The light emission from the mixed thin film of 4,6mCzP2Pm and PCCP has a longer wavelength (lower energy) than light emission from 4,6mCzP2Pm and light emission from PCCP. Therefore, it can be said that the light emission from the mixed thin film of 4,6mCzP2Pm and PCCP is light emission from an exciplex formed by 4,6mCzP2Pm and PCCP. That is, a combination of 4,6mCzP2Pm and PCCP is a combination of organic compounds which forms an exciplex. With use of 4,6mCzP2Pm and PCCP as host materials, a light-emitting element utilizing ExTET can be fabricated.

As shown in FIG. 40, an absorption band on the lowest energy side (the longest wavelength side) of the absorption spectrum of Ir(mpptz-diBuCNp)$_3$ was at around 450 nm, which has a region overlapping with the emission spectrum of an exciplex formed by 4,6mCzP2Pm and PCCP. Therefore, in the light-emitting element using 4,6mCzP2Pm and PCCP as host materials, excitation energy can be effectively transferred to the guest material.

As described above, in each of the light-emitting element 1 and the comparative light-emitting element 1, the host materials do not form an exciplex; whereas in each of the light-emitting element 2 and the comparative light-emitting element 2, a combination of the host materials which are 4,6mCzP2Pm (the first organic compound) and PCCP (the second organic compound) forms an exciplex.

Next, the triplet excitation energy levels (T1 levels) of the first organic compound (4,6mCzP2Pm) and the second organic compound (PCCP), which were used as host materials, were measured.

For the triplet excitation energy level measurement, phosphorescence from each of the thin film samples of the compounds was measured. The measurement was performed by using a PL microscope, LabRAM HR-PL, produced by HORIBA, Ltd., a He—Cd laser (325 nm) as excitation light, and a CCD detector at a measurement temperature of 10 K. The triplet excitation energy level (T1 level) was obtained from a peak on the shortest wavelength side of the phosphorescent spectrum obtained by the measurement.

A peak wavelength on the shortest wavelength side of the phosphorescence emission spectrum of the first organic compound (4,6mCzP2Pm) was 459 nm, and that of the second organic compound (PCCP) was 467 nm. The triplet excitation energy level (T1 level) of the first organic compound (4,6mCzP2Pm) was 2.70 eV, and that of the second organic compound (PCCP) was 2.66 eV.

A peak wavelength on the shortest wavelength side of the phosphorescence emission spectrum of each of 4,6mCzP2Pm and PCCP is shorter than a peak wavelength on the shortest wavelength side of the emission spectrum of the exciplex formed by 4,6mCzP2Pm and PCCP which is shown in FIG. 43B. The exciplex has a feature in that an energy difference between the singlet excitation energy level (S1 level) and the triplet excitation energy level (T1 level) is small. Therefore, the triplet excitation energy level (T1 level) of the exciplex can be obtained from a peak wavelength on the shortest wavelength side of the emission spectrum. Accordingly, the triplet excitation energy level (T1 level) of each of the first organic compound (4,6mCzP2Pm) and the second organic compound (PCCP) is higher than the triplet excitation energy level (T1 level) of the exciplex.

As shown later, the triplet excitation energy level (T1 level) of each of 4,6mCzP2Pm and PCCP is higher than the transition energy of the guest material which is obtained from the absorption spectrum edge.

Therefore, the first organic compound (4,6mCzP2Pm) and the second organic compound (PCCP), which were used as host materials in this example, have triplet excitation energy levels (T1 levels) high enough for host materials.

<Characteristics of Light-Emitting Elements>

Figure 44:
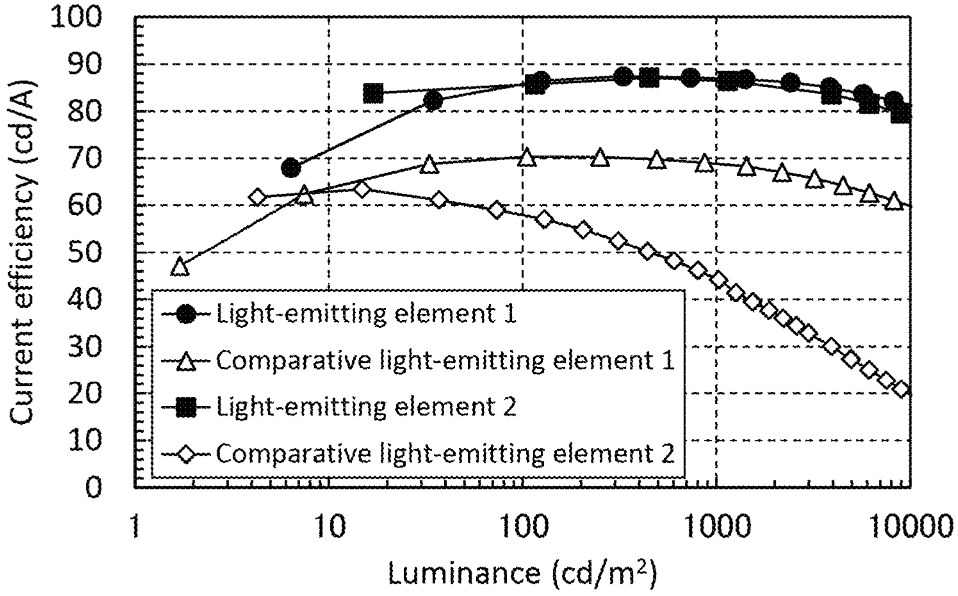
FIG. 44 is a graph showing current efficiency-luminance characteristics of light-emitting elements in Example.
Figure 45:
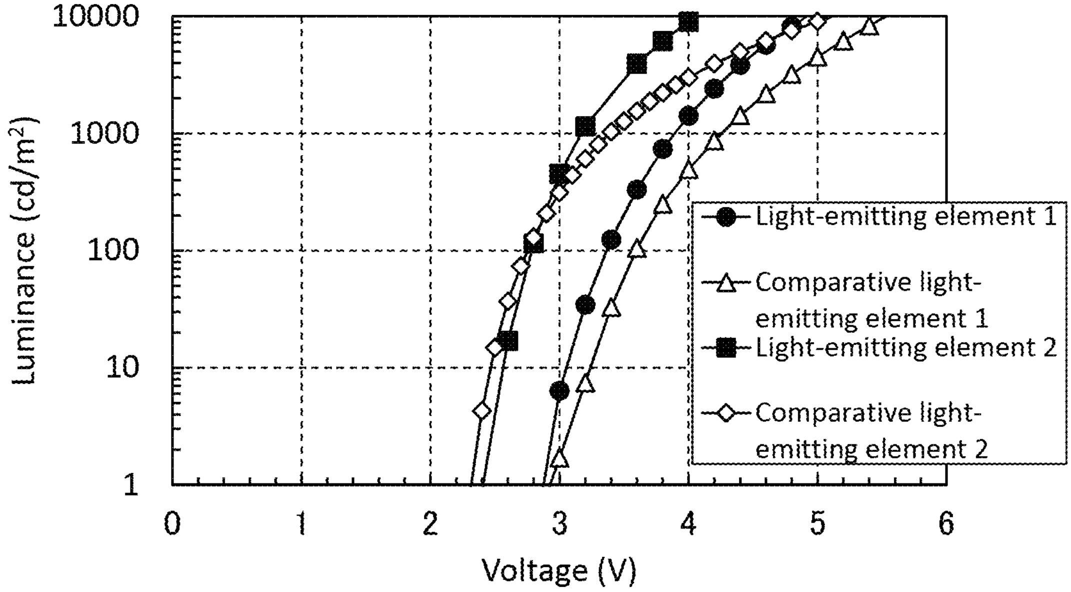
FIG. 45 is a graph showing luminance-voltage characteristics of light-emitting elements in Example.
Figure 46:
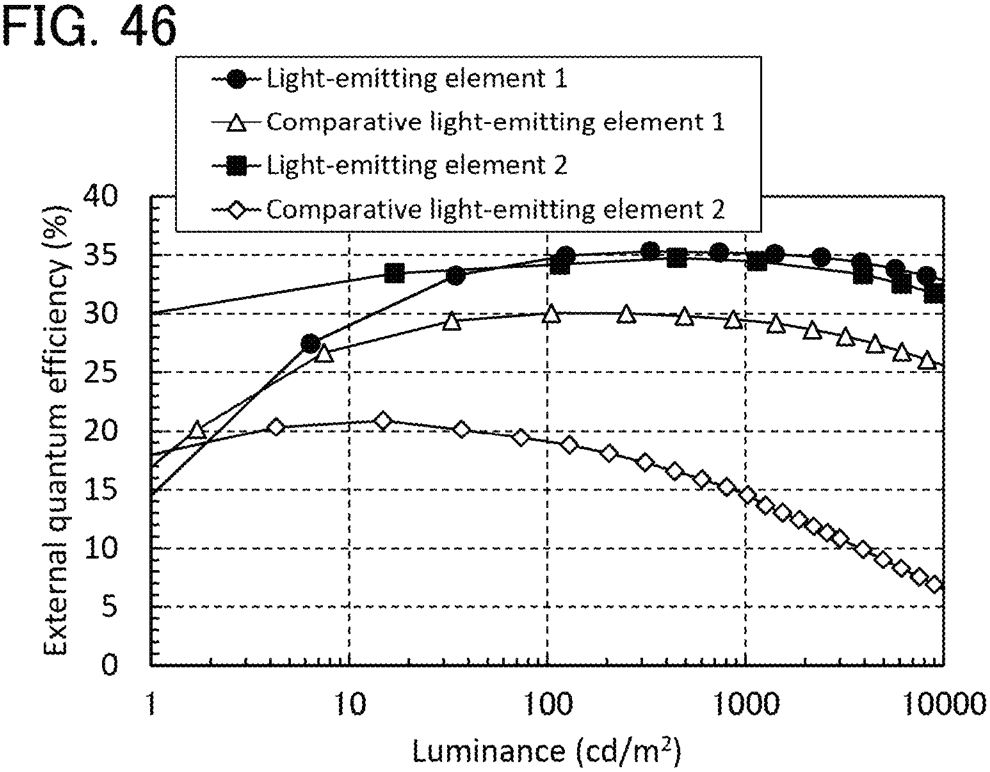
FIG. 46 is a graph showing external quantum efficiency-luminance characteristics of light-emitting elements in Example.
Figure 47:
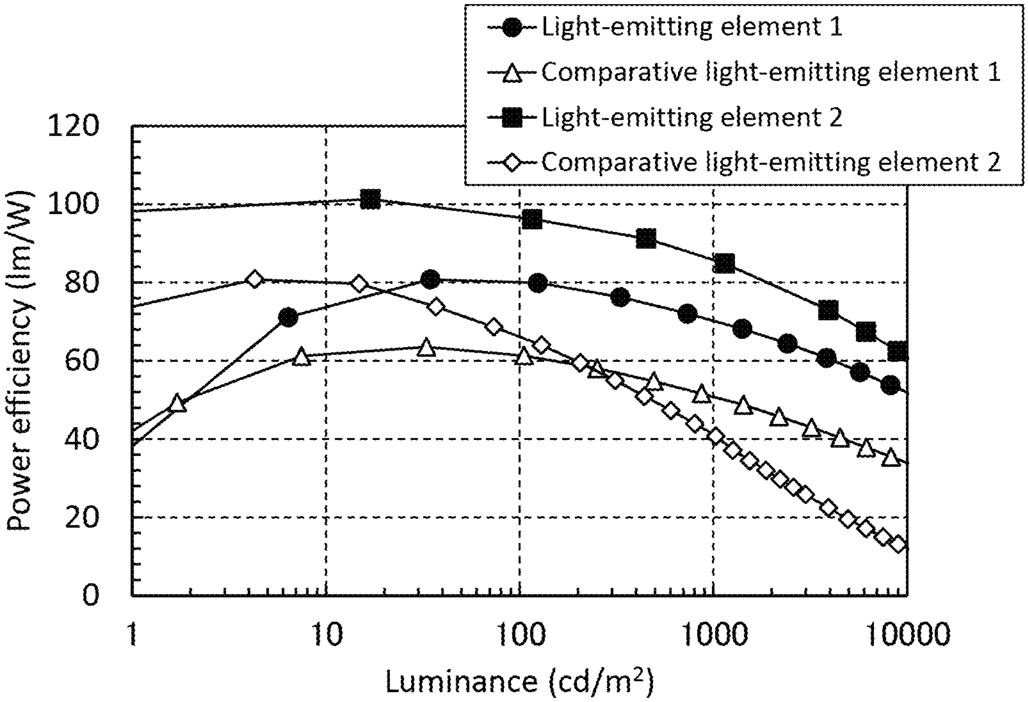
FIG. 47 is a graph showing power efficiency-luminance characteristics of light-emitting elements in Example.

FIG. 44 shows current efficiency-luminance characteristics of the light-emitting elements 1 and 2 and the comparative light-emitting elements 1 and 2. FIG. 45 shows luminance-voltage characteristics. FIG. 46 shows external quantum efficiency-luminance characteristics. FIG. 47 shows power efficiency-luminance characteristics. The measurement of the light-emitting elements was performed at room temperature (in an atmosphere kept at 23° C.).

Table 2 shows the element characteristics of the light-emitting elements 1 and 2 and the comparative light-emitting elements 1 and 2 at around 1000 cd/$m^2$.

complex including, as a ligand, an aryl group including a cyano group as a guest material, a light-emitting element emitting blue light with high emission efficiency can be fabricated.

From FIG. 44 to FIG. 47 and Table 2, it is found that the light-emitting element 2 has higher emission efficiency (higher current efficiency and higher external quantum efficiency) than the comparative light-emitting element 2. The maximum external quantum efficiency of the light-emitting element 2 is 35%, which is an excellent value. The light-emitting element 2 is driven at a voltage lower than the driving voltages of the light-emitting element 1 and the comparative light-emitting elements 1 and 2. Thus, the light-emitting element 2 shows excellent power efficiency.

Figure 48A:
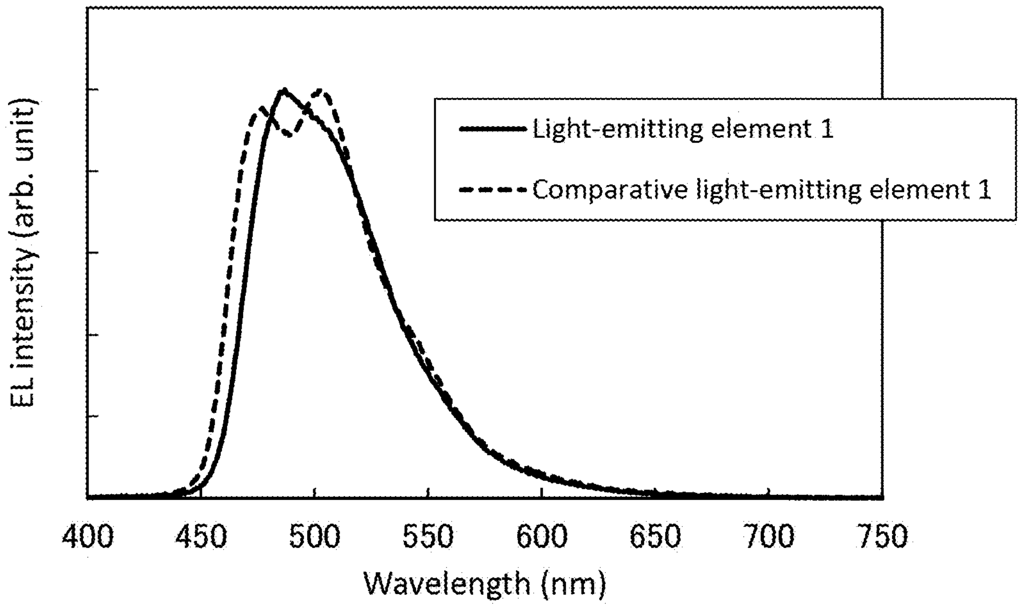
FIGS. 48A and 48B are graphs each showing electroluminescence spectra of light-emitting elements in Example.
Figure 48B:
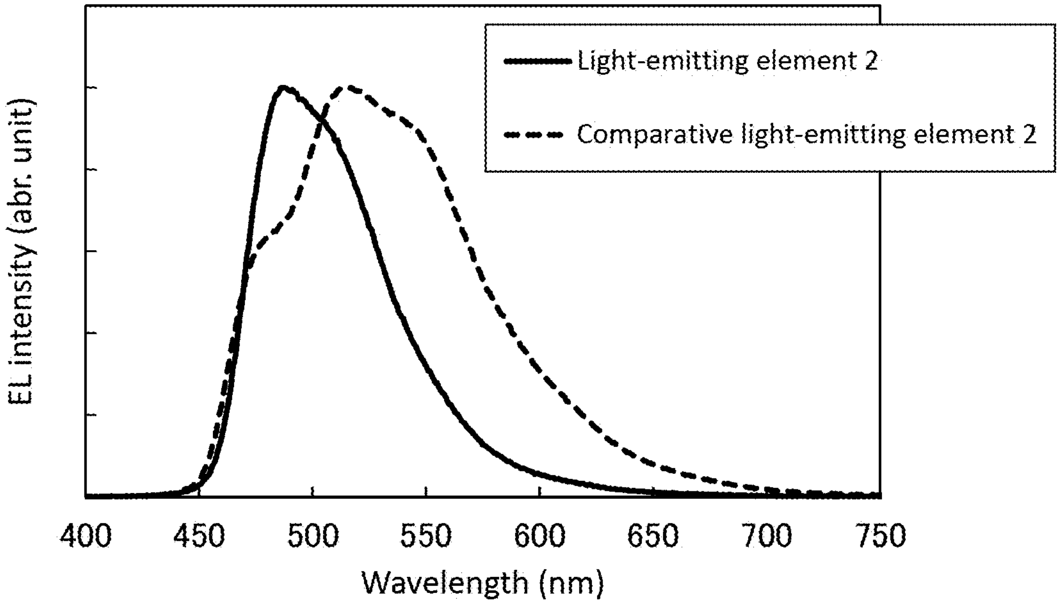

As shown in FIG. 48B, the light-emitting element 2 emits blue light. The electroluminescence spectrum of the light-emitting element 2 has a peak at a wavelength of 487 nm and a full width at half maximum of 65 nm. Whereas, the electroluminescence spectrum of the comparative light-emitting element 2 has a peak at a wavelength of 517 nm and a full width at half maximum of 108 nm, which is a broad spectrum. Although using the same guest material, the comparative light-emitting element 1 and the comparative light-emitting element 2 have greatly different electroluminescence spectra.

<Results of CV Measurement>

The electrochemical characteristics (oxidation reaction characteristics and reduction reaction characteristics) of the compounds used as the host materials (the first organic compound and the second organic compound) and the guest material in the above-described light-emitting elements were examined by cyclic voltammetry (CV). Note that for the measurement, an electrochemical analyzer (ALS model 600A or 600C, produced by BAS Inc.) was used. In the

TABLE 2

| | Voltage (V) | Current density (mA/$cm^2$) | Chromaticity (x, y) | Luminance (cd/$m^2$) | Current efficiency (cd/A) | Power efficiency (lm/W) | External quantum efficiency (%) |
|---|---|---|---|---|---|---|---|
| Light-emitting element 1 | 3.8 | 0.84 | (0.18, 0.47) | 740 | 87 | 72 | 35 |
| Light-emitting element 2 | 3.2 | 1.3 | (0.18, 0.48) | 1100 | 86 | 85 | 34 |
| Comparative light-emitting element 1 | 4.2 | 1.3 | (0.18, 0.42) | 870 | 69 | 52 | 30 |
| Comparative light-emitting element 2 | 3.4 | 2.3 | (0.30, 0.52) | 1000 | 44 | 41 | 15 |

FIG. 48A shows emission spectra of the light-emitting element 1 and the comparative light-emitting element 1 when a current with a current density of 2.5 mA/$cm^2$ was supplied to the light-emitting elements. FIG. 48B shows emission spectra of the light-emitting element 2 and the comparative light-emitting element 2 when a current with a current density of 2.5 mA/$cm^2$ was supplied to the light-emitting elements.

From FIG. 44 to FIG. 47 and Table 2, it is found that the light-emitting element 1 has higher emission efficiency (higher current efficiency and higher external quantum efficiency) than the comparative light-emitting element 1. The maximum external quantum efficiency of the light-emitting element 1 is 35%, which is an excellent value. As shown in FIG. 48A, the light-emitting element 1 emits blue light. The electroluminescence spectrum of the light-emitting element 1 has a peak at a wavelength of 487 nm and a full width at half maximum of 65 nm. Therefore, with use of an iridium measurement, the potential of a working electrode with respect to the reference electrode was changed within an appropriate range, so that the oxidation peak potential and the reduction peak potential were obtained. In addition, the HOMO and LUMO levels of each compound were obtained from the estimated redox potential of the reference electrode of −4.94 eV and the obtained peak potentials.

For the measurement of oxidation reaction characteristics and reduction reaction characteristics of the host materials (PCCP, 35DCzPPy, and 4,6mCzP2Pm), a solution obtained by dissolving the host material in N,N-dimethylformamide (abbreviation: DMF) was used. In general, an organic compound used in an organic EL element has a refractive index of approximately 1.7 to 1.8 and its relative dielectric constant is approximately 3. When DMF, which is a high polarity solvent (relative dielectric constant: 38), is used for measurement of oxidation reaction characteristics of a compound including a substituent with a high polarity (in particular, with a high electron-withdrawing property) such as a cyano group, the accuracy might be decreased. For this reason, in this example, a solution obtained by dissolving the guest material ($Ir(mpptz-diBuCNp)_3$ or $Ir(mpptz-diPrp)_3$) in chloroform with a low polarity (relative dielectric constant: 4.8) was used for the measurement of oxidation reaction characteristics. For the measurement of reduction reaction characteristics of the guest materials, a solution obtained by dissolving the guest material in DMF was used.

Table 3 shows oxidation potentials and reduction potentials obtained by CV measurement and HOMO levels and LUMO levels of the compounds obtained from the CV measurement results.

TABLE 3

| Abbreviation | Oxidation potential (V) | Reduction potential (V) | HOMO level calculated based on oxidation potential (eV) | LUMO level calculated based on reduction potential (eV) |
|---|---|---|---|---|
| PCCP | 0.69 | −2.98 | −5.63 | −1.96 |
| 35DCzPPy | 0.96 | −2.56 | −5.90 | −2.39 |
| 4,6mCzP2Pm | 0.95 | −2.06 | −5.89 | −2.88 |
| Ir (mpptz-diBuCNp)$_3$ | 0.46 | −2.46 | −5.40 | −2.49 |
| Ir (mpptz-diPrp)$_3$ | 0.30 | −2.98 | −5.24 | −1.96 |

As seen from Table 3, in the light-emitting element 2, the reduction potential of the first organic compound (4,6mCzP2Pm) is higher than that of the second organic compound (PCCP), and the oxidation potential of the first organic compound (4,6mCzP2Pm) is higher than that of the second organic compound (PCCP). In addition, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). In that case, carriers (electrons and holes) can be efficiently injected from a pair of electrodes to the first organic compound (4,6mCzP2Pm) and the second organic compound (PCCP), and the first organic compound (4,6mCzP2Pm) and the second organic compound (PCCP) can form an exciplex. Accordingly, the light-emitting element 2 has excellent characteristics that achieve both high emission efficiency and low driving voltage.

In the comparative light-emitting element 2, the LUMO level of the guest material ($Ir(mpptz-diPrp)_3$) is higher than that of the first organic compound (4,6mCzP2Pm), and the HOMO level of the guest material ($Ir(mpptz-diPrp)_3$) is higher than that of the second organic compound (PCCP) by 0.3 eV or more. Therefore, the guest material ($Ir(mpptz-diPrp)_3$) and the first organic compound (4,6mCzP2Pm) might form an exciplex.

As shown in FIG. 48B, the electroluminescence spectrum of the comparative light-emitting element 2 has a full width at half maximum of 108 nm, which is a broad spectrum, and is greatly different from the electroluminescence spectrum of the comparative light-emitting element 1 though the comparative light-emitting element 2 and the comparative light-emitting element 1 include the same guest material. Accordingly, in the comparative light-emitting element 2, the guest material ($Ir(mpptz-diPrp)_3$) and the first organic compound (4,6mCzP2Pm) form an exciplex, and thus, the electroluminescence spectrum is red-shifted. For the same reason, the current efficiency and the external quantum efficiency of the comparative light-emitting element 2 are not sufficiently high.

<Absorption Spectra of Guest Materials>

Figure 49:
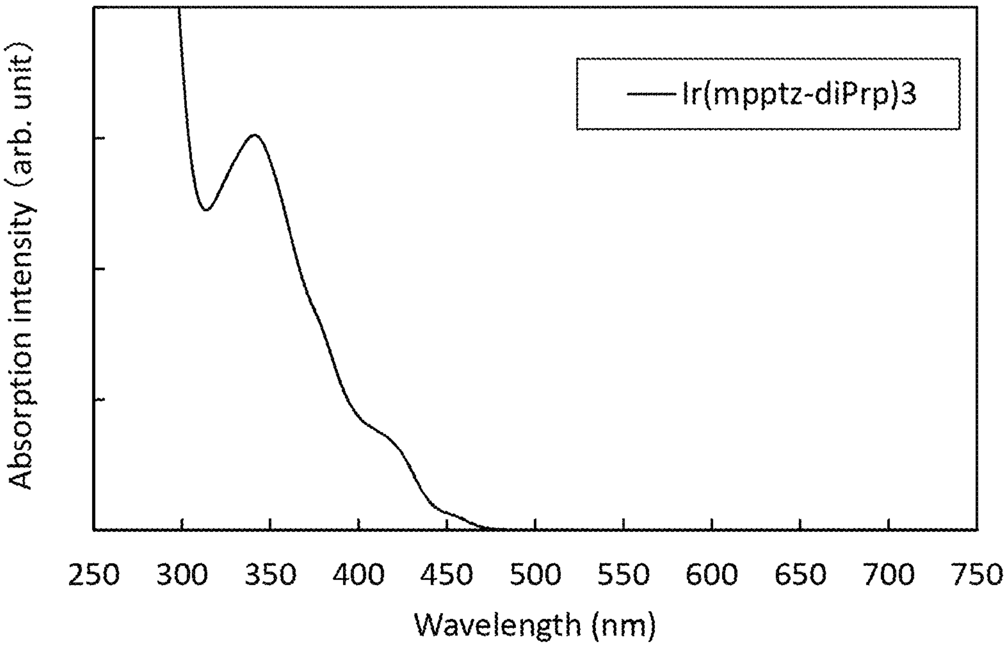
FIG. 49 shows an absorption spectrum of a compound in Example.

FIG. 49 shows the measurement result of the absorption spectrum of $Ir(mpptz-diPrp)_3$ that is a guest material in the light-emitting elements. Note that the absorption spectrum of $Ir(mpptz-diBuCNp)_3$ is shown in FIG. 40 in Example 3.

For the absorption spectrum measurement, a dichloromethane solution in which $Ir(mpptz-diPrp)_3$ was dissolved was prepared, and a quartz cell was used. The absorption spectrum was measured using an ultraviolet-visible spectrophotometer (V-550, produced by JASCO Corporation). Then, the absorption spectrum of quartz cell was subtracted from the measured spectrum of the sample.

Next, the absorption edge was obtained from data of the measured absorption spectrum, and transition energy was estimated on the assumption of direct transition. As the result, the absorption edge of $Ir(mpptz-diBuCNp)_3$ was 478 nm and the transition energy thereof was 2.59 eV. The absorption edge of $Ir(mpptz-diPrp)_3$ was 471 nm and the transition energy thereof was 2.63 eV.

An energy difference between the LUMO level and the HOMO level of $Ir(mpptz-diBuCNp)_3$ was 2.91 eV and that of $Ir(mpptz-diPrp)_3$ was 3.28 eV. These values were obtained from the CV measurement results shown in Table 3.

That is, the energy difference between the LUMO level and the HOMO level of $Ir(mpptz-diBuCNp)_3$ is larger than the transition energy thereof obtained from the absorption edge by 0.32 eV, and the energy difference of $Ir(mpptz-diPrp)_3$ is larger than the transition energy by 0.65 eV.

As shown in FIG. 48A, a peak wavelength on the shortest wavelength side of the electroluminescence spectrum of the light-emitting element 1 was 487 nm and that of the comparative light-emitting element 1 was 477 nm. According to that, the light emission energy of $Ir(mpptz-diBuCNp)_3$ was calculated to be 2.55 eV and that of $Ir(mpptz-diPrp)_3$ was calculated to be 2.60 eV.

That is, the energy difference between the LUMO level and the HOMO level of $Ir(mpptz-diBuCNp)_3$ was larger than the light emission energy by 0.36 eV, and the energy difference of $Ir(mpptz-diPrp)_3$ was larger than the light emission energy by 0.68 eV.

Consequently, in each of the guest materials of the light-emitting elements, the energy difference between the LUMO level and the HOMO level is larger than the transition energy obtained from the absorption edge by 0.3 eV or more. In addition, the energy difference between the LUMO level and the HOMO level is larger than the light emission energy by 0.3 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

Note that in the light-emitting element 2, an energy difference between the LUMO level of the first organic compound (4,6mCzP2Pm) and the HOMO level of the second organic compound (PCCP) (4,6mCzP2Pm and PCCP are host materials in the light-emitting element 2) was calculated to be 2.75 eV from Table 3. Consequently, energy corresponding to the energy difference between the LUMO level and the HOMO level of an exciplex formed by the host materials in the light-emitting element 2 is smaller than the energy difference between the LUMO level and the HOMO level (2.91 eV) of the guest material ($Ir(mpptz\text{-}diBuCNp)_3$), and larger than the transition energy (2.59 eV) obtained from the absorption edge. Therefore, in the light-emitting element 2, the guest material can be excited through the exciplex, whereby the driving voltage can be lowered. Therefore, the light-emitting element of one embodiment of the present invention enables reduction in power consumption.

<Results of Reliability Test>

Figure 50:
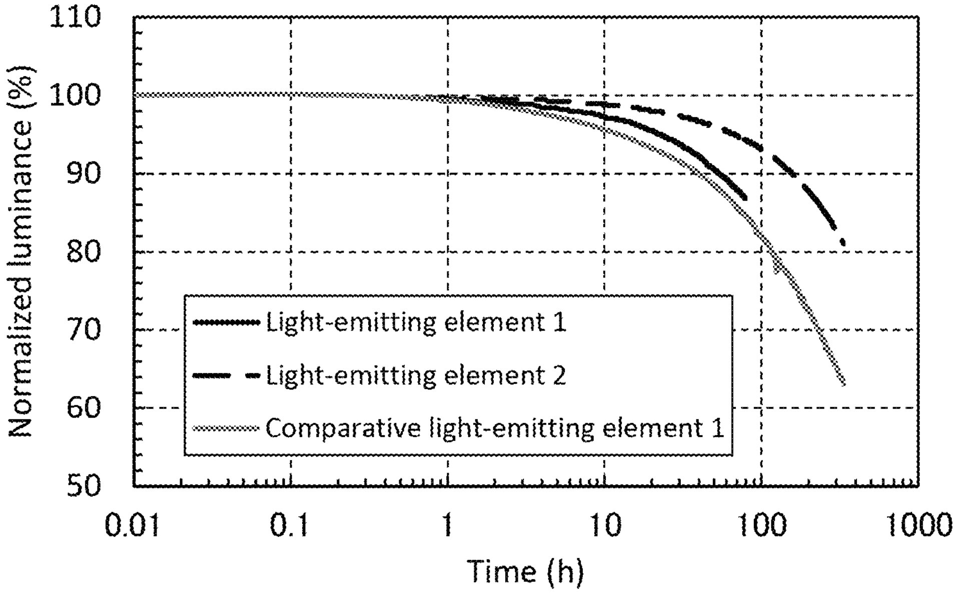
FIG. 50 is a graph showing reliability test results of light-emitting elements in Example.

FIG. 50 shows the results of reliability tests of the light-emitting elements. For the reliability test, the initial luminance was set to 2000 cd/$m^2$, and each of the light-emitting elements (the light-emitting elements 1 and 2 and the comparative light-emitting element 1) was continuously driven with a constant current density.

The time (LT90) taken for the luminance of the light-emitting elements 1 and 2 and the comparative light-emitting element 1 to decrease to 90% of the initial luminance was as follows: the light-emitting element 1, 54 hours; the light-emitting element 2, 160 hours; and the comparative light-emitting element 1, 40 hours. In particular, the light-emitting element 2 shows high reliability.

Consequently, a light-emitting element, like the light-emitting element 2, in which the LUMO level of the first organic compound is lower than the LUMO level of the second organic compound, the HOMO level of the first organic compound is lower than the HOMO level of the second organic compound, a combination of the first organic compound and the second organic compound forms an exciplex, and an iridium complex including a cyano group is used as a guest material can be a highly reliable light-emitting element emitting blue light which can achieve both high emission efficiency and low driving voltage.

As described above, by employing the structure of one embodiment of the present invention, a light-emitting element having high emission efficiency can be provided. A light-emitting element with low power consumption can be provided. A highly reliable light-emitting element can be provided. A highly reliable light-emitting element emitting blue light and having high emission efficiency can be provided.

The structure described in this embodiment can be used in combination with any of the structures described in the other examples and embodiments as appropriate.

Example 5

In this example, examples of fabricating light-emitting elements (light-emitting elements 3 and 4) of one embodiment of the present invention are described. The schematic cross-sectional views of FIG. 42 can be referred to for cross sections of the light-emitting elements fabricated in this example. The detailed element structures are shown in Table 4. For the structures and abbreviations of the compounds used in this embodiment, those in Examples described above can be referred to.

TABLE 4

| | Layer | Reference numeral | Thickness (nm) | Material | Weight ratio |
|---|---|---|---|---|---|
| Light-emitting element 3 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 160(2) | 20 | 4,6mCzP2Pm PCCP:fac-$Ir(mpCNptz\text{-}diPrp)_3$ | 0.8:0.2:0.05 |
| | | 160(1) | 20 | 4,6mCzP2Pm PCCP:fac-$Ir(mpCNptz\text{-}diPrp)_3$ | 0.5:0.5:0.05 |
| | Hole-transport layer | 112 | 20 | PCCP | — |
| | Hole-injection layer | 111 | 20 | DBT3P-II:$MoO_3$ | 1:0.5 |
| | Electrode | 101 | 110 | ITSO | — |
| Light-emitting element 4 | Electrode | 102 | 200 | Al | — |
| | Electron-injection layer | 119 | 1 | LiF | — |
| | Electron-transport layer | 118(2) | 10 | BPhen | — |
| | | 118(1) | 20 | 4,6mCzP2Pm | — |
| | Light-emitting layer | 160(2) | 20 | 4,6mCzP2Pm:PCCP:mer-$Ir(mpCNptz\text{-}diPrp)_3$ | 0.8:0.2:0.05 |
| | | 160(1) | 20 | 4,6mCzP2Pm:PCCP:mer-$Ir(mpCNptz\text{-}diPrp)_3$ | 0.5:0.5:0.05 |
| | Hole-transport layer | 112 | 20 | PCCP | — |
| | Hole-injection layer | 111 | 20 | DBT3P-II:$MoO_3$ | 1:0.5 |
| | Electrode | 101 | 110 | ITSO | — |

<Fabrication of Light-Emitting Elements>

<<Fabrication of Light-Emitting Element 3>>

As the electrode 101, an ITSO film was formed to a thickness of 110 nm over the substrate 200. The electrode area of the electrode 101 was set to 4 $mm^2$ (2 mm×2 mm).

As the hole-injection layer 111, DBT3P-II and $MoO_3$ were deposited over the electrode 101 by co-evaporation in a weight ratio of DBT3P-II:$MoO_3$=1:0.5 to a thickness of 20 nm.

As the hole-transport layer 112, PCCP was deposited over the hole-injection layer 111 by evaporation to a thickness of 20 nm.

As the light-emitting layer 160 over the hole-transport layer 112, 4,6mCzP2Pm, PCCP, and fac-$Ir(mpCNptz\text{-}diPrp)_3$ were deposited by co-evaporation in a weight ratio of 4,6mCzP2Pm:PCCP:fac-$Ir(mpCNptz\text{-}diPrp)_3$=0.5:0.5:0.05 to a thickness of 20 nm, and successively, 4,6mCzP2Pm, PCCP, and fac-$Ir(mpCNptz\text{-}diPrp)_3$ were deposited by co-evaporation in a weight ratio of 4,6mCzP2Pm:PCCP:fac-Ir(mpCNptz-diPrp)$_3$=0.8:0.2:0.05 to a thickness of 20 nm. Note that in the light-emitting layer 160, 4,6mCzP2Pm corresponds to the first organic compound, PCCP corresponds to the second organic compound, and fac-Ir(mpCNptz-diPrp)$_3$ corresponds to the guest material (the phosphorescent compound).

As the electron-transport layer 118, 4,6mCzP2Pm and BPhen were sequentially deposited by evaporation to thicknesses of 20 nm and 10 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 3 was sealed by fixing the substrate 220 to the substrate 200 over which the organic material was deposited using a sealant for an organic EL device. For the detailed method, description of the light-emitting element 1 can be referred to. Through the above steps, the light-emitting element 3 was obtained.

<<Fabrication of Light-Emitting Element 4>>

The light-emitting element 4 was fabricated through the same steps as those for the light-emitting element 3 except for the step of forming the light-emitting layer 160.

As the light-emitting layer 160 in the light-emitting element 4, 4,6mCzP2Pm, PCCP, and mer-Ir(mpCNptz-diPrp)$_3$ were deposited by co-evaporation in a weight ratio of 4,6mCzP2Pm:PCCP:mer-Ir(mpCNptz-diPrp)$_3$=0.5:0.5:0.05 to a thickness of 20 nm, and successively, 4,6mCzP2Pm, PCCP, and mer-Ir(mpCNptz-diPrp)$_3$ were deposited by co-evaporation in a weight ratio of 4,6mCzP2Pm:PCCP:mer-Ir(mpCNptz-diPrp)$_3$=0.8:0.2:0.05 to a thickness of 20 nm. Note that in the light-emitting layer 160, 4,6mCzP2Pm corresponds to the first organic compound, PCCP corresponds to the second organic compound, and mer-Ir(mpCNptz-diPrp)$_3$ corresponds to the guest material (the phosphorescent compound). In other words, the light-emitting element 4 has a structure similar to that of the light-emitting element 3 except for the guest material.

<Characteristics of Light-Emitting Elements>

Figure 51:
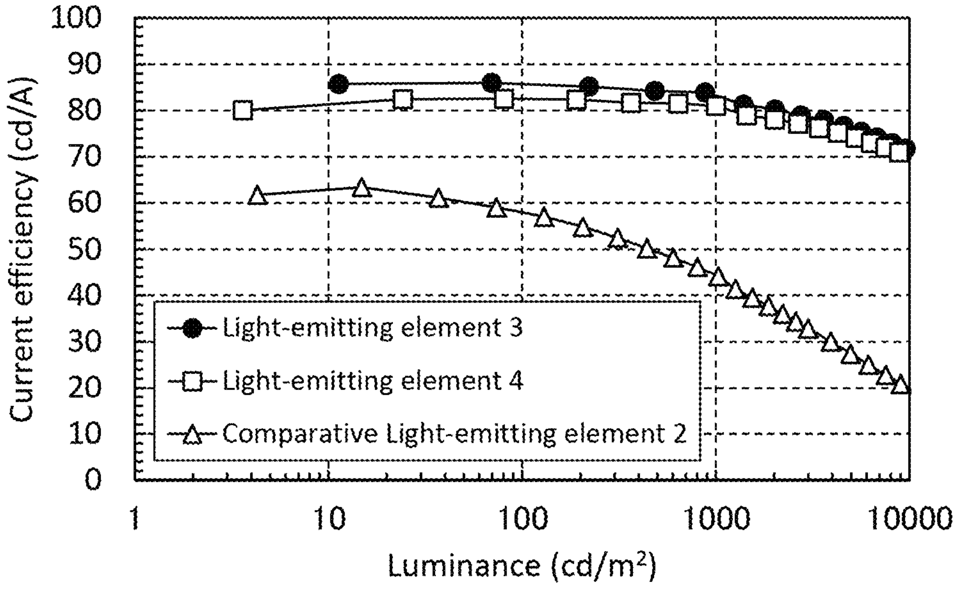
FIG. 51 is a graph showing current efficiency-luminance characteristics of light-emitting elements in Example.
Figure 52:
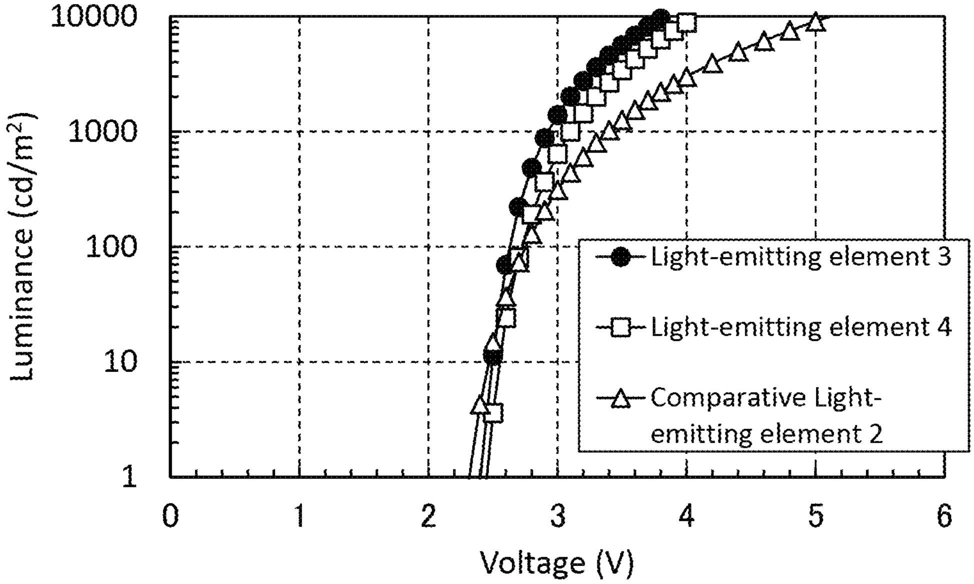
FIG. 52 is a graph showing luminance-voltage characteristics of light-emitting elements in Example.
Figure 53:
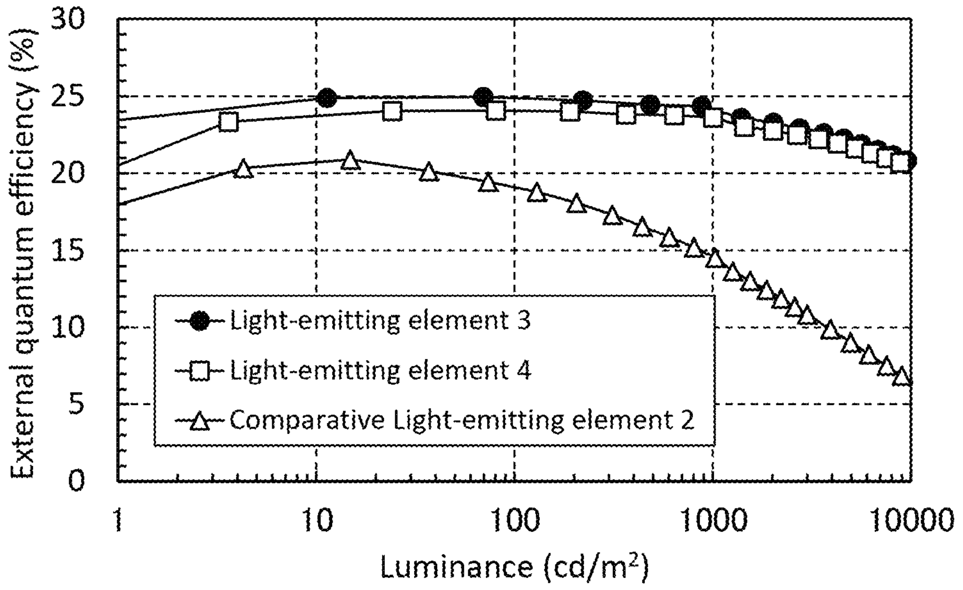
FIG. 53 is a graph showing external quantum efficiency-luminance characteristics of light-emitting elements in Example.
Figure 54:
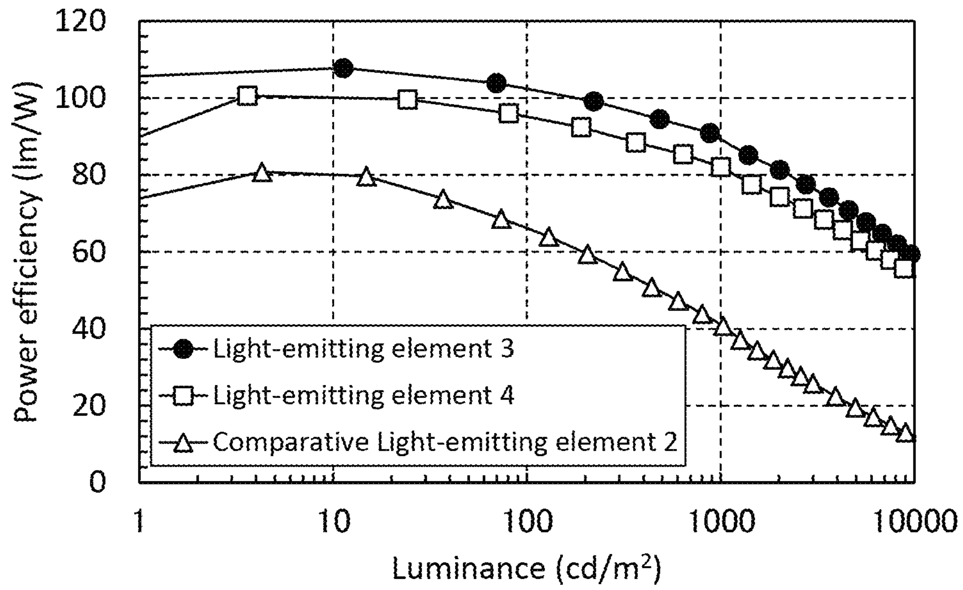
FIG. 54 is a graph showing power efficiency-luminance characteristics of light-emitting elements in Example.

FIG. 51 shows current efficiency-luminance characteristics of the light-emitting elements 3 and 4. FIG. 52 shows luminance-voltage characteristics. FIG. 53 shows external quantum efficiency-luminance characteristics. FIG. 54 shows power efficiency-luminance characteristics. FIG. 51 to FIG. 54 also show the characteristics of the comparative light-emitting element 2 fabricated in Example 4. The measurement of the light-emitting elements was performed at room temperature (in an atmosphere kept at 23° C.).

Table 5 shows element characteristics of the light-emitting elements 3 and 4 at around 1000 cd/m$^2$.

TABLE 5

| | Voltage (V) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 3 | 2.9 | 1.0 | (0.35, 0.61) | 880 | 84 | 91 | 24 |
| Light-emitting element 4 | 3.1 | 1.2 | (0.36, 0.59) | 1000 | 81 | 82 | 24 |

Figure 55:
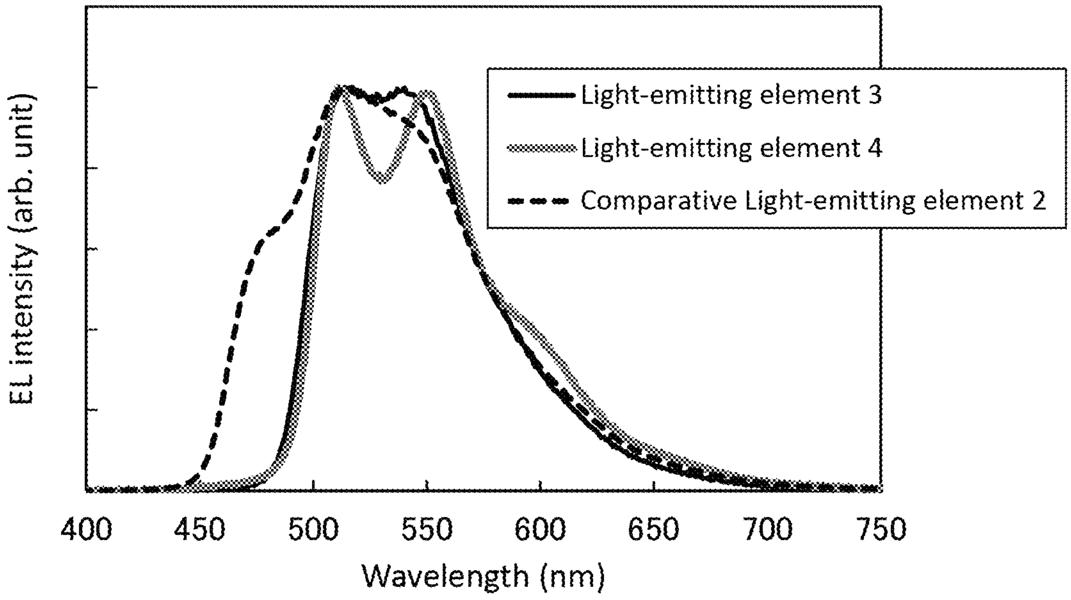
FIG. 55 is a graph showing electroluminescence spectra of light-emitting elements in Example.

FIG. 55 shows the emission spectra of the light-emitting element 3 and the light-emitting element 4 through which current flows at a current density of 2.5 mA/cm$^2$.

From FIG. 51 to FIG. 54 and Table 5, it is found that each of the light-emitting elements 3 and 4 has higher emission efficiency (higher current efficiency and higher external quantum efficiency) than the comparative light-emitting element 2. The maximum external quantum efficiency of the light-emitting element 3 is 25% and that of the light-emitting element 4 is 24%, which are preferable values. Each of the light-emitting elements 3 and 4 is driven at a voltage lower than the driving voltage of the comparative light-emitting element 2. Thus, the light-emitting elements 3 and 4 show excellent power efficiency. As shown in FIG. 55, the light-emitting elements 3 and 4 emit green light. The electroluminescence spectra of the light-emitting elements 3 and 4 have peak wavelengths at 509 nm and 511 nm, respectively. Therefore, with use of an iridium complex including, as a ligand, an aryl group including a cyano group as a guest material, a light-emitting element emitting green light with high emission efficiency can be fabricated.

<Results of CV Measurement>

The electrochemical characteristics of the guest materials in the light-emitting elements were examined by CV. The measurement method was similar to that used in Example 4. That is, for the measurement of oxidation reaction characteristics of the guest materials (fac-Ir(mpCNptz-diPrp)$_3$ and mer-Ir(mpCNptz-diPrp)$_3$), a solvent obtained by dissolving the guest material in chloroform was used, and for the measurement of reduction reaction characteristics of the guest materials, a solvent obtained by dissolving the guest material in DMF was used.

Table 6 shows oxidation potentials and reduction potentials obtained by CV measurement and HOMO levels and LUMO levels of the compounds obtained from the CV measurement results.

TABLE 6

| Abbreviation | Oxidation potential (V) | Reduction potential (V) | HOMO level calculated based on oxidation potential (eV) | LUMO level calculated based on reduction potential (eV) |
|---|---|---|---|---|
| fac-Ir (mpCNptz-diPrp)$_3$ | 0.91 | −2.31 | −5.85 | −2.64 |
| mer-Ir (mpCNptz-diPrp)$_3$ | 0.86 | −2.30 | −5.80 | −2.65 |

According to the CV measurement results shown in Table 3 in Example 4 and Table 6, in each of the light-emitting elements 3 and 4, the reduction potential of the first organic compound (4,6mCzP2Pm) is higher than that of the second organic compound (PCCP), and the oxidation potential of the first organic compound (4,6mCzP2Pm) is higher than that of the second organic compound (PCCP). The oxidation potential of the first organic compound (4,6mCzP2Pm) is higher than that of the second organic compound (PCCP), the reduction potential of each of the guest materials (fac-Ir(mpCNptz-diPrp)$_3$ and mer-Ir(mpCNptz-diPrp)$_3$) is lower than that of the first organic compound (4,6mCzP2Pm), and the oxidation potential of each of the guest materials (fac-Ir(mpCNptz-diPrp)$_3$ and mer-Ir(mpCNptz-diPrp)$_3$) is higher than that of the second organic compound (PCCP). In addition, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). The HOMO level of the first organic compound (4,6mCzP2Pm) is lower than that of the second organic compound (PCCP), the LUMO level of each of the guest materials (fac-Ir(mpCNptz-diPrp)$_3$ and mer-Ir (mpCNptz-diPrp)$_3$) is higher than that of the first organic compound (4,6mCzP2Pm), and the HOMO level of each of the guest materials (fac-Ir(mpCNptz-diPrp)$_3$ and mer-Ir (mpCNptz-diPrp)$_3$) is lower than that of the second organic compound (PCCP). In that case, carriers (electrons and holes) can be efficiently injected from a pair of electrodes to the first organic compound (4,6mCzP2Pm) and the second organic compound (PCCP), and the first organic compound (4,6mCzP2Pm) and the second organic compound (PCCP) can form an exciplex. Accordingly, each of the light-emitting elements 3 and 4 has excellent characteristics that achieve both high emission efficiency and low driving voltage.

<Absorption Spectra of Guest Materials>

The absorption edge was obtained from the measurement result of the absorption spectrum of the guest material used in the light-emitting element, and transition energy was estimated on the assumption of direct transition. Note that the absorption spectra of fac-Ir(mpCNptz-diPrp)$_3$ and mer-Ir(mpCNptz-diPrp)$_3$ are shown in FIG. 35 in Example 1 and FIG. 38 in Example 2.

As the result, the absorption edge of fac-Ir(mpCNptz-diPrp)$_3$ was 513 nm and the transition energy thereof was 2.42 eV. The absorption edge of mer-Ir(mpCNptz-diPrp)$_3$ was 516 nm and the transition energy thereof was 2.40 eV.

An energy difference between the LUMO level and the HOMO level of fac-Ir(mpCNptz-diPrp)$_3$ was 3.21 eV and that of mer-Ir(mpCNptz-diPrp)$_3$ was 3.15 eV. These values were obtained from the CV measurement results shown in Table 6.

That is, the energy difference between the LUMO level and the HOMO level of fac-Ir(mpCNptz-diPrp)$_3$ is larger than the transition energy thereof obtained from the absorption edge by 0.79 eV, and the energy difference of mer-Ir (mpCNptz-diPrp)$_3$ is larger than the transition energy by 0.75 eV.

As shown in FIG. 55, a peak wavelength on the shortest wavelength side of the electroluminescence spectrum of the light-emitting element 3 was 509 nm and that of the light-emitting element 4 was 511 nm. According to that, the light emission energy of fac-Ir(mpCNptz-diPrp)$_3$ was calculated to be 2.44 eV and that of mer-Ir(mpCNptz-diPrp)$_3$ was calculated to be 2.43 eV.

That is, the energy difference between the LUMO level and the HOMO level of fac-Ir(mpCNptz-diPrp)$_3$ was larger than the light emission energy by 0.77 eV, and the energy difference of mer-Ir(mpCNptz-diPrp)$_3$ was larger than the light emission energy by 0.72 eV.

Consequently, in each of the guest materials of the light-emitting elements, the energy difference between the LUMO level and the HOMO level is larger than the transition energy obtained from the absorption edge by 0.4 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

Note that in each of the light-emitting elements 3 and 4, an energy difference between the LUMO level of the first organic compound (4,6mCzP2Pm) and the HOMO level of the second organic compound (PCCP) (4,6mCzP2Pm and PCCP are host materials) was calculated to be 2.75 eV from Table 3 shown in Example 4. Consequently, energy corresponding to the energy difference between the LUMO level and the HOMO level of an exciplex formed by the host materials in the light-emitting elements 3 and 4 is smaller than the energy difference between the LUMO level and the HOMO level (3.21 eV and 3.15 eV) of the guest material (fac-Ir(mpCNptz-diPrp)$_3$ and mer-Ir(mpCNptz-diPrp)$_3$), and larger than the transition energy (2.42 eV and 2.40 eV) obtained from the absorption edge. Therefore, in the light-emitting elements 3 and 4, the guest material can be excited through the exciplex, whereby the driving voltage can be lowered. Therefore, the light-emitting elements of one embodiment of the present invention enable reduction in power consumption.

As described above, by employing the structure of one embodiment of the present invention, a light-emitting element having high emission efficiency can be provided. A light-emitting element with low power consumption can be provided. A light-emitting element emitting green light and having high emission efficiency and low power consumption can be provided.

The structure described in this embodiment can be used in combination with any of the structures described in the other examples and embodiments as appropriate.

Example 6

As described in Embodiment 5, by combination of the light-emitting element of one embodiment of the present invention and the other light-emitting element, a low power consumption display device can be fabricated. In this example, examples of fabricating light-emitting elements (light-emitting elements 5 to 7) that can be used in the display device of one embodiment of the present invention are described. FIG. 42 can be referred to for the cross-sectional views of the light-emitting elements fabricated in this example. Table 7 shows the detailed structures of the elements. In addition, structures and abbreviations of compounds used here are given below. Note that the above Embodiments can be referred to for other compounds.

BPAFLP

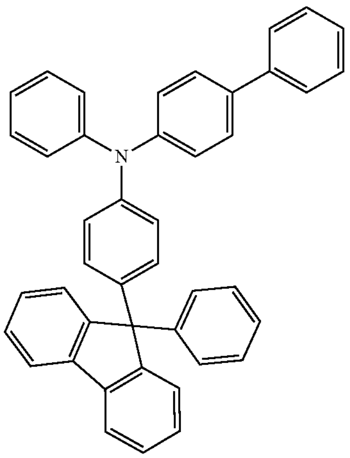

PCBBiF

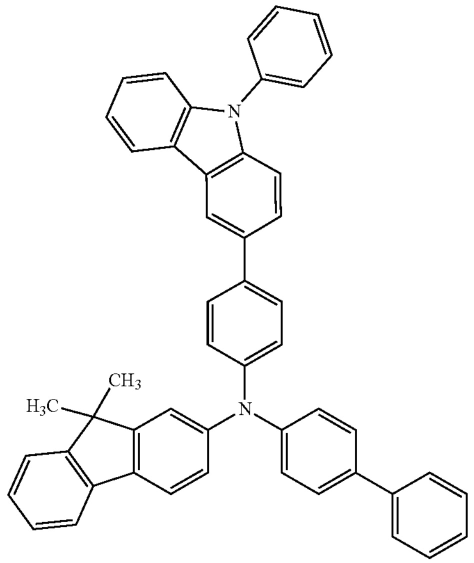

-continued

NBphen

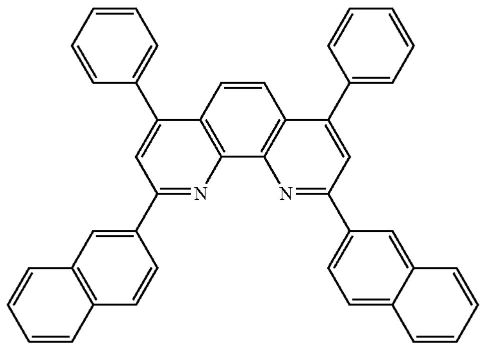

2mDBTBPDBq-II

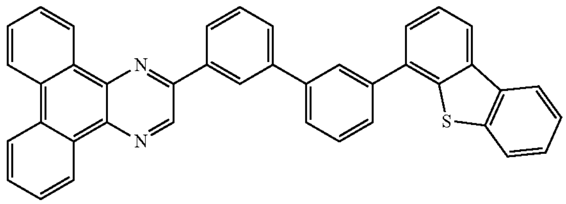

Ir(tBuppm)2(acac)

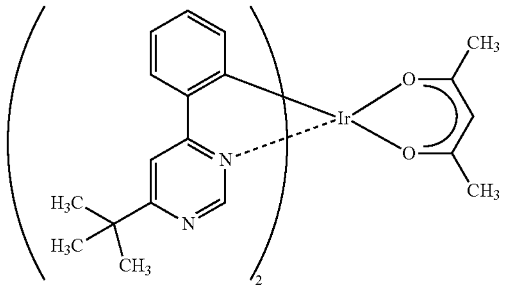

Ir(dmdppr-dmp)2(divm)

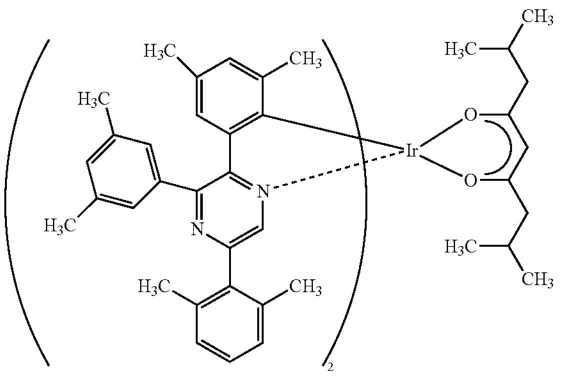

TABLE 7

| | Layer | Reference numeral | Thickness (nm) | Material | Weight ratio |
|---|---|---|---|---|---|
| Light-emitting element 5 | Electrode | 102 | 200 | Al | — |
| | Electron-injection layer | 119 | 1 | LiF | — |
| | Electron-transport layer | 118(2) | 15 | NBphen | — |
| | | 118(1) | 20 | 2mDBTBPDBq-II | — |
| | Light-emitting layer | 160(2) | 20 | 2mDBTBPDBq-II:PCBBiF:Ir(tBuppm)$_2$(acac) | 0.8:0.2:0.05 |
| | | 160(1) | 20 | 2mDBTBPDBq-II:PCBBiF:Ir(tBuppm)$_2$(acac) | 0.7:0.3:0.05 |
| | Hole-transport layer | 112 | 20 | BPAFLP | — |
| | Hole-injection layer | 111 | 40 | DBT3P-II:$MoO_3$ | 1:0.5 |
| | Electrode | 101 | 70 | ITSO | — |
| Light-emitting element 6 | Electrode | 102 | 200 | Al | — |
| | Electron-injection layer | 119 | 1 | LiF | — |
| | Electron-transport layer | 118(2) | 15 | Bphen | — |
| | | 118(1) | 25 | 2mDBTBPDBq-II | — |
| | Light-emitting layer | 160(2) | 20 | 2mDBTBPDBq-II:PCBBiF:Ir(dmdppr-dmp)$_2$(divm) | 0.8:0.2:0.05 |
| | | 160(1) | 20 | 2mDBTBPDBq-II:PCBBiF:Ir(dmdppr-dmp)$_2$(divm) | 0.7:0.3:0.05 |
| | Hole-transport layer | 112 | 20 | BPAFLP | — |
| | Hole-injection layer | 111 | 50 | BPAFLP:$MoO_3$ | 1:0.5 |
| | Electrode | 101 | 70 | ITSO | — |
| Light-emitting element 7 | Electrode | 102 | 200 | Al | — |
| | Electron-injection layer | 119 | 1 | LiF | — |
| | Electron-transport layer | 118(2) | 15 | Bphen | — |
| | | 118(1) | 10 | 35DCzPPy | — |
| | Light-emitting layer | 160(2) | 10 | 35DCzPPy:Ir(mpptz-diBuCNp)$_3$ | 1:0.06 |
| | | 160(1) | 30 | 35DCzPPy:PCCP:Ir(mpptz-diBuCNp)$_3$ | 0.65:0.65:0.06 |
| | Hole-transport layer | 112 | 20 | PCCP | — |
| | Hole-injection layer | 111 | 15 | DBT3P-II:$MoO_3$ | 1:0.5 |
| | Electrode | 101 | 70 | ITSO | — |

<Fabrication of Light-Emitting Elements>

<<Fabrication of Light-Emitting Element 5>>

As the electrode 101, an ITSO film was formed to a thickness of 70 nm over the substrate 200. The electrode area of the electrode 101 was set to 4 $mm^2$ (2 mm×2 mm).

As the hole-injection layer 111, DBT3P-II and $MoO_3$ were deposited over the electrode 101 by co-evaporation in a weight ratio of DBT3P-II:$MoO_3$=1:0.5 to a thickness of 40 nm.

As the hole-transport layer 112, 4-phenyl-4'-(9-phenylfluoren-9-yl)triphenylamine (abbreviation: BPAFLP) was deposited over the hole-injection layer 111 by evaporation to a thickness of 20 nm.

As the light-emitting layer 160 over the hole-transport layer 112, 2-[3'-(dibenzothiophen-4-yl)biphenyl-3-yl]dibenzo[f,h]quinoxaline (abbreviation: 2mDBTBPDBq-II), N-(1,1'-biphenyl-4-yl)-N-[4-(9-phenyl-9H-carbazol-3-yl)phenyl]-9,9-dimethyl-9H-fluoren-2-amine (abbreviation: PCBBiF), and (acetylacetonato)bis(6-tert-butyl-4-phenylpyrimidinato)iridium(III) (abbreviation: Ir(tBuppm)$_2$(acac)) were deposited by co-evaporation in a weight ratio of 2mDBTBPDBq-II:PCBBiF:Ir(tBuppm)$_2$(acac)=0.7:0.3:0.05 to a thickness of 20 nm, and successively, 2mDBTBPDBq-II, PCBBiF, and Ir(tBuppm)$_2$(acac) were deposited by co-evaporation in a weight ratio of 2mDBTBPDBq-II:PCBBiF:Ir(tBuppm)$_2$(acac))=0.8:0.2:0.05 to a thickness of 20 nm. Note that in the light-emitting layer 160, 2mDBTBPDBq-II corresponds to the first organic compound, PCBBiF corresponds to the second organic compound, and Ir(tBuppm)$_2$(acac) corresponds to the guest material (the phosphorescent compound).

As the electron-transport layer 118, 2mDBTBPDBq-II and 2,9-bis(naphthalen-2-yl)-4,7-diphenyl-1,10-phenanthroline (abbreviation: NBPhen) were sequentially deposited by evaporation to thicknesses of 20 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 5 was sealed by fixing the substrate 220 to the substrate 200 over which the organic material was deposited using a sealant for an organic EL device. For the detailed method, description of the light-emitting element 1 can be referred to. Through the above steps, the light-emitting element 5 was obtained.

<<Fabrication of Light-Emitting Element 6>>

As the electrode 101, an ITSO film was formed to a thickness of 70 nm over the substrate 200. The electrode area of the electrode 101 was set to 4 $mm^2$ (2 mm×2 mm).

As the hole-injection layer 111, BPAFLP and $MoO_3$ were deposited over the electrode 101 by co-evaporation in a weight ratio of BPAFLP I:$MoO_3$=1:0.5 to a thickness of 50 nm.

Next, as the hole-transport layer 112, BPAFLP was deposited over the hole-injection layer 111 by evaporation to a thickness of 20 nm.

As the light-emitting layer 160 over the hole-transport layer 112, 2mDBTBPDBq-II, PCBBiF, and bis{4,6-dimethyl-2-[5-(2,6-dimethylphenyl)-3-(3,5-dimethylphenyl)-2-pyrazinyl-κN]phenyl-κC}(2,8-dimethyl-4,6-nonanedionato-κ$^2$O,O')iridium(III) (abbreviation: Ir(dmdppr-dmp)$_2$(divm)) were deposited by co-evaporation in a weight ratio of 2mDBTBPDBq-II:PCBBiF:Ir(dmdppr-dmp)$_2$(divm)=0.7:0.3:0.05 to a thickness of 20 nm, and successively, 2mDBTBPDBq-II, PCBBiF, and Ir(dmdppr-dmp)$_2$(divm) were deposited by co-evaporation in a weight ratio of 2mDBTBPDBq-II:PCBBiF:Ir(dmdppr-dmp)$_2$(divm)=0.8:0.2:0.05 to a thickness of 20 nm. Note that in the light-emitting layer 160, 2mDBTBPDBq-II corresponds to the first organic compound, PCBBiF corresponds to the second organic compound, and Ir(dmdppr-dmp)$_2$(divm) corresponds to the guest material (the phosphorescent compound).

As the electron-transport layer 118, 2mDBTBPDBq-II and BPhen were sequentially deposited by evaporation to thicknesses of 25 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 6 was sealed by fixing the substrate 220 to the substrate 200 over which the organic material was deposited using a sealant for an organic EL device. For the detailed method, description of the light-emitting element 1 can be referred to. Through the above steps, the comparative light-emitting element 6 was obtained.

<<Fabrication of Light-Emitting Element 7>>

As the electrode 101, an ITSO film was formed to a thickness of 70 nm over the substrate 200. The electrode area of the electrode 101 was set to 4 $mm^2$ (2 mm×2 mm).

As the hole-injection layer 111, DBT3P-II and $MoO_3$ were deposited over the electrode 101 by co-evaporation in a weight ratio of DBT3P-II I:$MoO_3$=1:0.5 to a thickness of 15 nm.

Next, as the hole-transport layer 112, PCCP was deposited over the hole-injection layer 111 by evaporation to a thickness of 20 nm.

As the light-emitting layer 160 over the hole-transport layer 112, 35DCzPPy, PCCP, and Ir(mpptz-diBuCNp)$_3$ were deposited by co-evaporation in a weight ratio of 35DCzPPy:PCCP:Ir(mpptz-diBuCNp)$_3$=0.65:0.65:0.06 to a thickness of 30 nm, and successively, 35DCzPPy and Ir(mpptz-diBuCNp)$_3$ were deposited by co-evaporation in a weight ratio of 35DCzPPy:Ir(mpptz-diBuCNp)$_3$=1:0.06 to a thickness of 10 nm. Note that in the light-emitting layer 160, 35DCzPPy corresponds to the first organic compound, PCCP corresponds to the second organic compound, and Ir(mpptz-diBuCNp)$_3$ corresponds to the guest material (the phosphorescent compound).

As the electron-transport layer 118, 35DCzPPy and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 7 was sealed by fixing the substrate 220 to the substrate 200 over which the organic material was deposited using a sealant for an organic EL device. For the detailed method, description of the light-emitting element 1 can be referred to. Through the above steps, the comparative light-emitting element 7 was obtained.

<Characteristics of Light-Emitting Elements>

Figure 56:
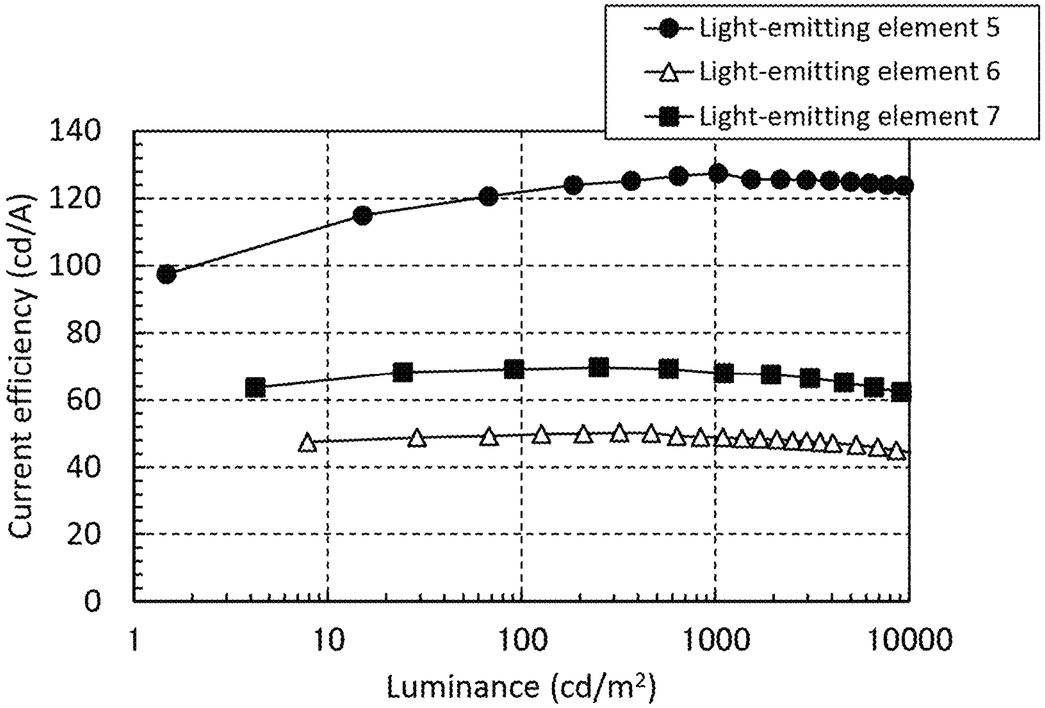
FIG. 56 is a graph showing current efficiency-luminance characteristics of light-emitting elements in Example.
Figure 57:
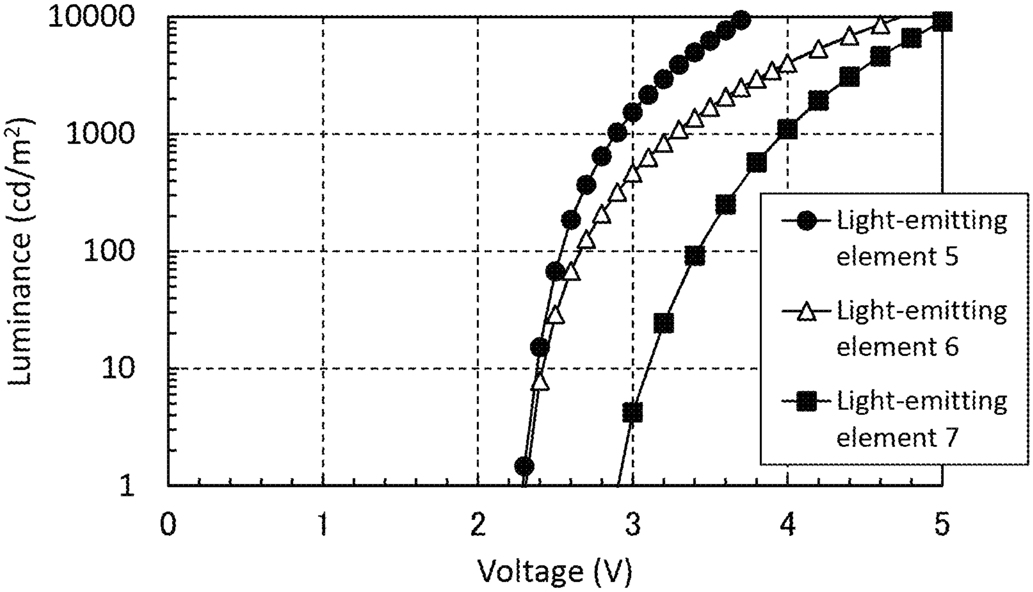
FIG. 57 is a graph showing luminance-voltage characteristics of light-emitting elements in Example.
Figure 58:
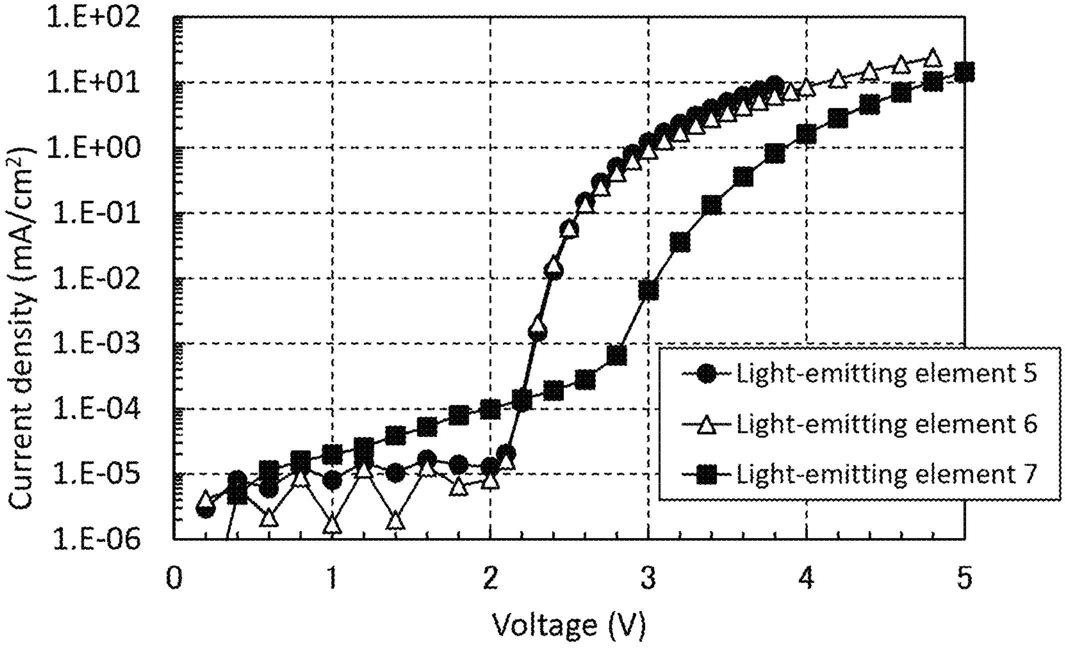
FIG. 58 is a graph showing current density-voltage characteristics of light-emitting elements in Example.
Figure 59:
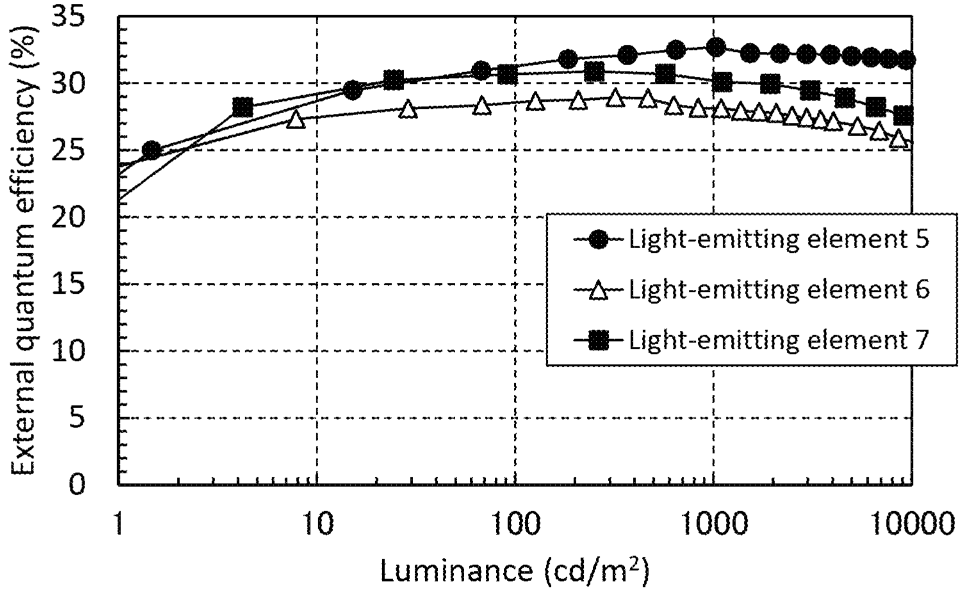
FIG. 59 is a graph showing external quantum efficiency-luminance characteristics of light-emitting elements in Example.
Figure 60:
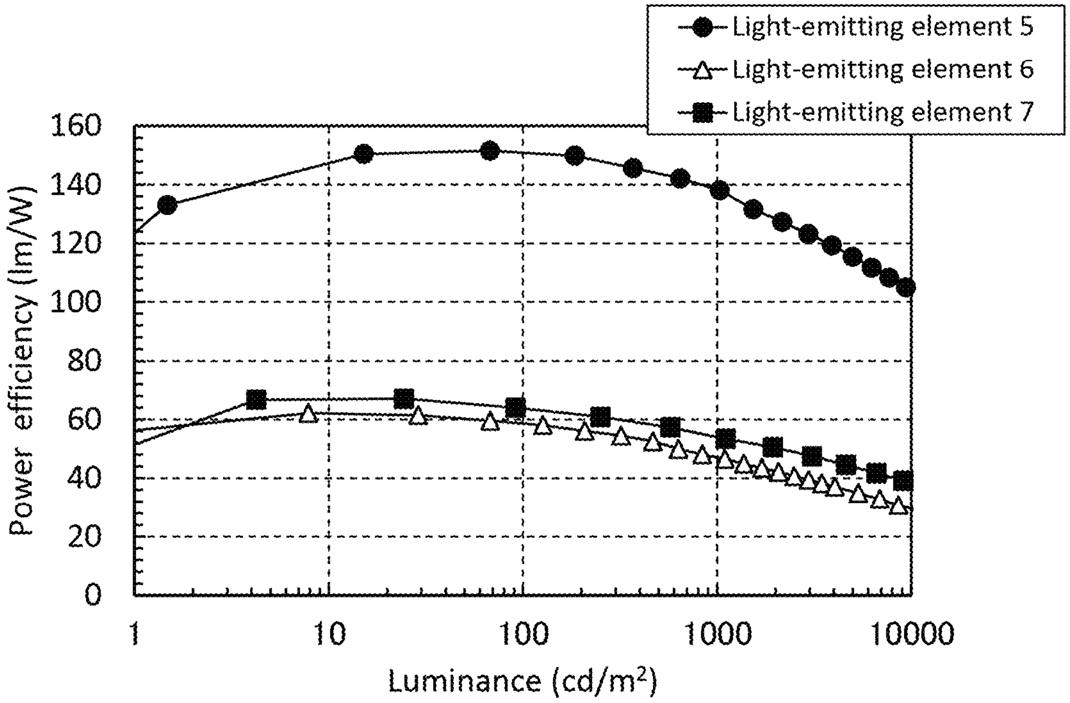
FIG. 60 is a graph showing power efficiency-luminance characteristics of light-emitting elements in Example.

FIG. 56 shows current efficiency-luminance characteristics of the light-emitting elements 5 to 7. FIG. 57 shows luminance-voltage characteristics. FIG. 58 shows current density-voltage characteristics. FIG. 59 shows external quantum efficiency-luminance characteristics. FIG. 60 shows power efficiency-luminance characteristics. The measurement of the light-emitting elements was performed at room temperature (in an atmosphere kept at 23° C.).

Table 8 shows element characteristics of the light-emitting elements 5 to 7 at around 1000 cd/$m^2$.

TABLE 8

| | Voltage (V) | Current density (mA/$cm^2$) | Chromaticity (x, y) | Luminance (cd/$m^2$) | Current efficiency (cd/A) | Power efficiency (lm/W) | External quantum efficiency (%) |
|---|---|---|---|---|---|---|---|
| Light-emitting element 5 | 2.9 | 0.810 | (0.40, 0.59) | 1030 | 127 | 138 | 32.7 |
| Light-emitting element 6 | 3.3 | 2.24 | (0.66, 0.34) | 1100 | 48.9 | 46.5 | 28.1 |
| Light-emitting element 7 | 4.0 | 1.63 | (0.17, 0.41) | 1110 | 68.0 | 53.4 | 30.1 |

Figure 61:
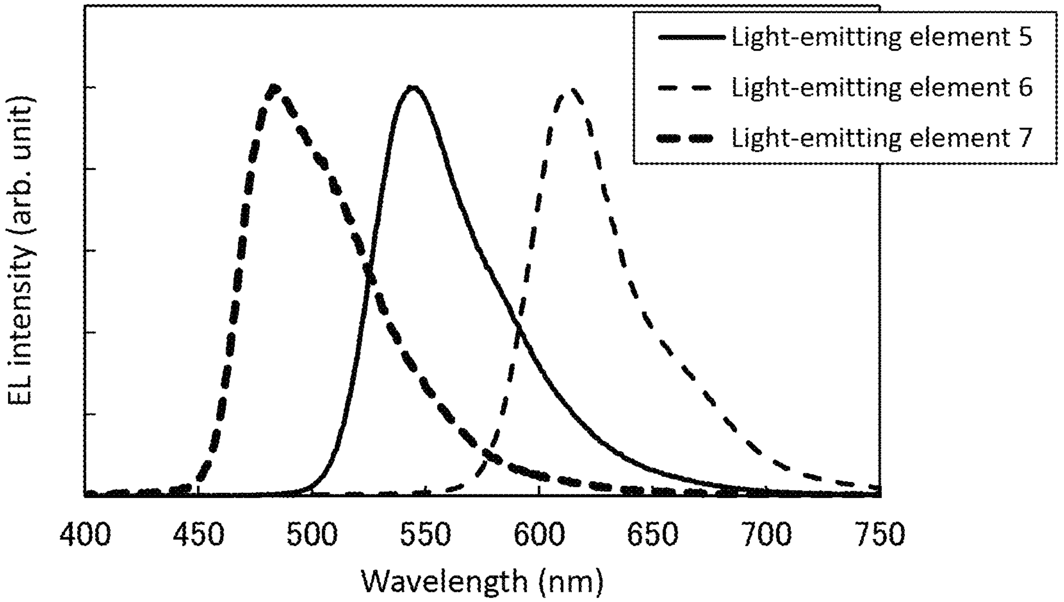
FIG. 61 is a graph showing electroluminescence spectra of light-emitting elements in Example.

FIG. 61 shows the emission spectra of the light-emitting elements 5 to 7 through which current flows at a current density of 2.5 mA/$cm^2$.

From FIG. 56 to FIG. 60 and Table 8, it is found that each of the light-emitting elements 5 to 7 has high current efficiency. The maximum external quantum efficiency of the light-emitting element 5 is 33%, that of the light-emitting element 6 is 29%, and that of the light-emitting element 7 is 31%, which are preferable values. Each of the light-emitting elements 5 to 7 is driven at a lower voltage. Thus, the light-emitting elements 5 to 7 show excellent power efficiency. As shown in FIG. 61, the light-emitting element 5 has a peak wavelength of the electroluminescence spectrum of 543 nm and emits green light with high color purity, the light-emitting element 6 has a peak wavelength of 612 nm and emits red light with high color purity, and the light-emitting element 7 has a peak wavelength of 483 nm and emits blue light with high color purity.

<Power Consumption of Display Device>

The power consumption of display devices using the light-emitting elements 5 to 7 fabricated in the above manner was estimated.

The power consumption of the display devices were estimated on the assumption that the display device has an aspect ratio of 16:9, a diagonal of 4.3 inches, and an area of the display region of 50.97 $cm^2$, and the aperture ratio (abbreviation: $R_A$) is 35%.

In the case where the light-emitting elements 5 to 7 are used as the display elements of the display device, according to Formula (4), when luminance $L_5$ of a display element having the structure of the light-emitting element 5 is 284 cd/$m^2$, luminance $L_6$ of a display element having the structure of the light-emitting element 6 is 979 cd/$m^2$, and luminance $L_7$ of a display element having the structure of the light-emitting element 7 is 1309 cd/$m^2$, white color (chromaticity coordinates (x, y)=(0.405, 0.391)) with a color temperature of 3500 K can be displayed at 300 cd/$m^2$ on the entire display region.

$$(L_5+L_6+L_7)R_A/3=300\ \text{cd/m}^2 \quad (4)$$

The power consumption of the display element portion at this time can be estimated to be 1.7 $mW/cm^2$. Therefore, a display device with significantly low power consumption can be fabricated by including display elements having the structures of the light-emitting elements 5 to 7.

<Results of Reliability Test>

Figure 62:
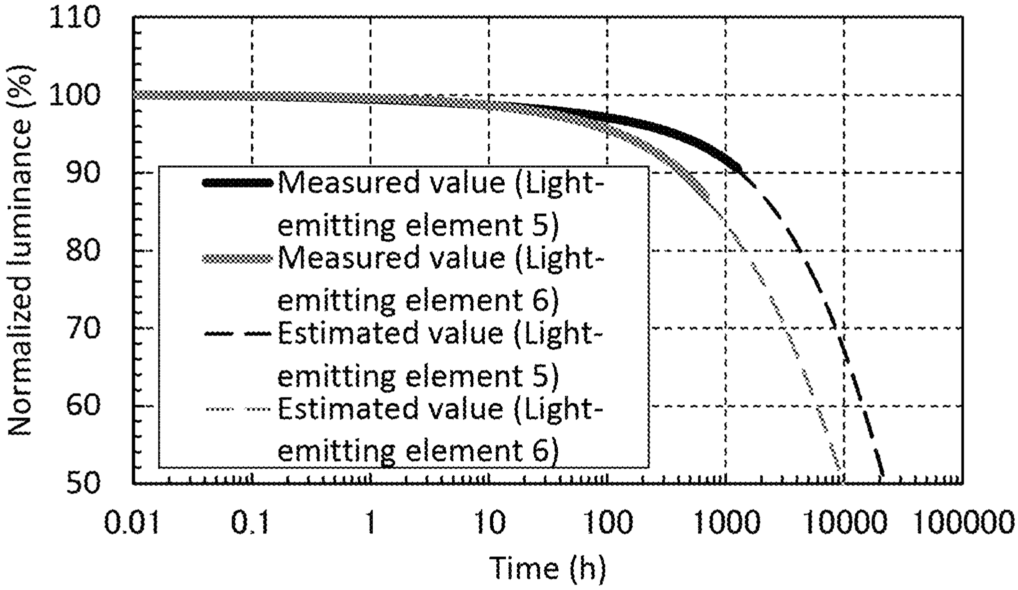
FIG. 62 is a graph showing reliability test results of light-emitting elements in Example.

Next, results of reliability tests of the light-emitting elements 5 and 6 are shown in FIG. 62. For the reliability test, the initial luminance was set to 5000 $cd/m^2$, and each of the light-emitting elements (the light-emitting elements 5 and 6) was continuously driven with a constant current density.

As the results, the time (LT50) taken for the luminance of the light-emitting elements 5 and 6 to decrease to 50% of the initial luminance was estimated as follows: the light-emitting element 5, greater than or equal to 20000 hours; and the light-emitting element 6, greater than or equal to 10000 hours; therefore, the light-emitting elements 5 and 6 have high reliability.

Therefore, by combination of the blue light-emitting element of one embodiment of the present invention (the light-emitting element 7) with a green light-emitting element (such as the light-emitting element 5) and a red light-emitting element (such as the light-emitting element 6) with favorable characteristics, a highly reliable light-emitting element and display device with high emission efficiency of the three primary colors can be provided.

As described above, by combining the structure of this example with the structure of one embodiment of the present invention, a light-emitting element having high emission efficiency can be provided. A light-emitting element with low power consumption can be provided. A highly reliable light-emitting element can be provided. A highly reliable display device having low power consumption and high emission efficiency can be provided.

Example 7

Synthesis Example 4

In this example, a method for synthesizing tris{2-[1-(4-cyano-2,6-diisobutylphenyl)-1H-imidazol-2-yl-κ$N^3$]phenyl-κC}iridium(III) (abbreviation: Ir(pim-diBuCNp)$_3$), which is the organometallic complex of one embodiment of the present invention represented by Structural Formula (118) in Embodiment 2 is described. The structure of Ir(pim-diBuCNp)$_3$ is shown below.

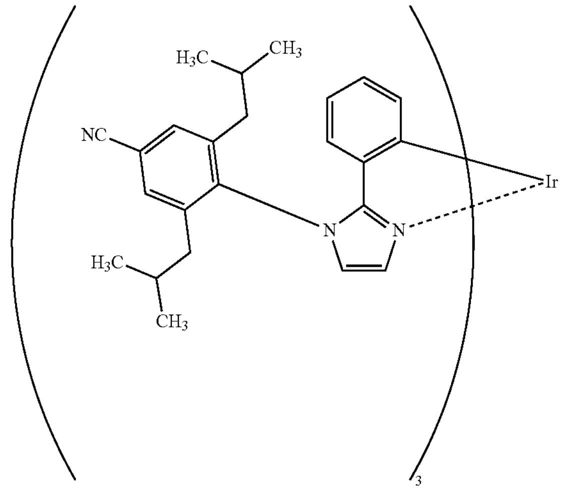

Ir(pim-diBuCNp)$_3$

Step 1: Synthesis of 1-(4-cyano-2,6-diisobutylphenyl)-2-phenyl-4,5-dihydro-1H-imidazole Into a 1000 mL three-neck flask were put 22 g (117 mmol) of N-(2-chloroethyl)benzamide and 260 mL of dehydrated xylene. To this mixed solution was added 33 g (158 mmol) of phosphorus pentachloride, and the mixture was heated and stirred at 140° C. for one hour to be reacted. After the reaction, the mixture was cooled down to room temperature, a mixed solution of 28 g (120 mmol) of 4-amino-3,5-diisobutylbenzonitrile and 60 mL of dehydrated xylene was dropped thereinto, and heating and stirring were performed at 140° C. for 5 hours. This reaction mixture was slowly added to 500 mL of water and stirring was performed at room temperature for 30 minutes. To this mixture was added chloroform. The obtained solution of the extract was slowly added to a 1M sodium hydroxide aqueous solution and the mixture was stirred at room temperature for 30 minutes. An aqueous layer and an organic layer of this mixture were separated. The obtained solution of the extract was washed with a saturated aqueous solution of sodium hydrogen carbonate, and then washed with saturated saline. After the washing, anhydrous magnesium sulfate was added to the organic layer for drying, and the resulting mixture was subjected to gravity filtration to give a filtrate. The obtained filtrate was condensed to give a solid. A mixed solvent of ethyl acetate and hexane was added to the solid, the mixture was subjected to suction filtration, whereby 33 g of a white solid was obtained in a yield of 79%. The obtained white solid was identified as 1-(4-cyano-2,6-diisobutylphenyl)-2-phenyl-4,5-dihydro-1H-imidazole by nuclear magnetic resonance (NMR) spectroscopy. The synthesis scheme of Step 1 is shown in (a-2) below.

(a-2)

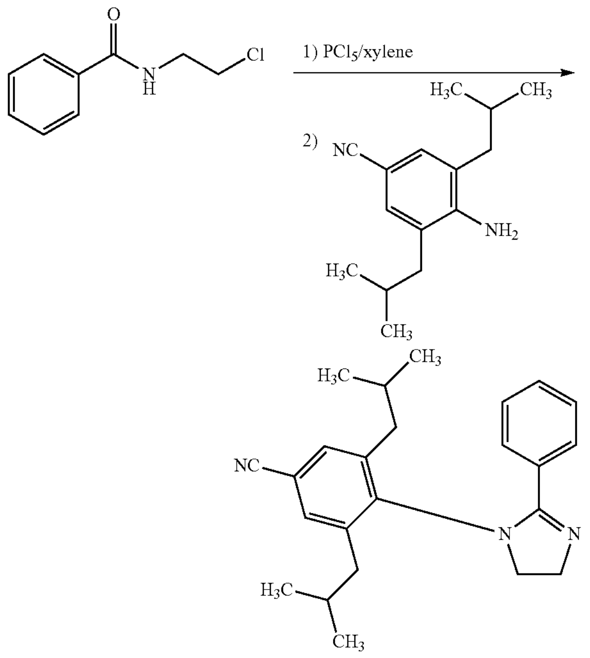

(b-2)

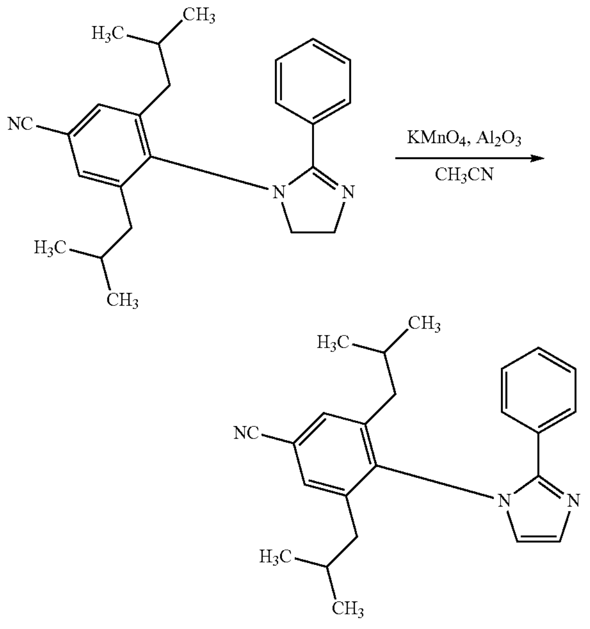

Hpim-diBuCNp

Step 2: Synthesis of 1-(4-cyano-2,6-diisobutylphenyl)-2-phenyl-1H-imidazole (abbreviation: Hpim-diBuCNp)

Into a 200 mL three-neck flask were put 15 g (42 mmol) of 1-(4-cyano-2,6-diisobutylphenyl)-2-phenyl-4,5-dihydro-1H-imidazole synthesized in Step 1 and acetonitrile. To the mixed solution was added a powder obtained by putting 13 g (84 mmol) of potassium permanganate and 29 g of aluminum oxide in a mortar and grinding them, and the mixture was stirred at room temperature for 17 hours to be reacted. This reaction mixture was subjected to suction filtration through Celite. The obtained filtrate was concentrated to give an oily substance. Toluene was added to the obtained oily substance, and the mixture was filtered through a filter aid in which Celite, aluminum oxide, and Celite were stacked in this order. The obtained filtrate was concentrated to give an oily substance. The obtained oily substance was purified by silica column chromatography. As a developing solvent, a 5:1 hexane-ethyl acetate mixed solvent was used. The obtained fraction was concentrated to give 8.0 g of a colorless oily substance in a yield of 53%. The obtained colorless oily substance was identified as 1-(4-cyano-2,6-diisobutylphenyl)-2-phenyl-1H-imidazole (abbreviation: Hpim-diBuCNp) by nuclear magnetic resonance (NMR) spectroscopy. The synthesis scheme of Step 2 is shown in (b-2) below.

Step 3: Synthesis of tris{2-[1-(4-cyano-2,6-diisobutylphenyl)-1H-imidazol-2-yl-κ$N^3$]phenyl-κC}iridium(III) (abbreviation: Ir(pim-diBuCNp)$_3$)

Into a reaction container provided with a three-way cock were put 5.0 g (14 mmol) of Hpim-diBuCNp synthesized in Step 2 and 1.4 g (2.8 mmol) of tris(acetylacetonato)iridium (III), and the mixture was heated under an argon stream at 250° C. for 38 hours to be reacted. Toluene was added to the obtained reaction mixture, and an insoluble matter was removed. The obtained filtrate was concentrated to give a solid. The obtained solid was purified by silica column chromatography. As a developing solvent, first, toluene was used. Next, a 9:1 toluene-ethyl acetate mixed solvent was used. The obtained fraction was concentrated to give a solid. The obtained solid was recrystallized from ethyl acetate/hexane, so that 0.6 g of a yellow solid was obtained in a yield of 18%. Then, 0.6 g of the obtained yellow solid was purified by a train sublimation method. The purification by sublimation was performed by heating at 280° C. under a pressure of 2.6 Pa with an argon flow rate of 5.0 mL/min for 17 hours. After the purification by sublimation, 0.4 g of a yellow solid was obtained at a collection rate of 67%. The synthesis scheme of Step 3 is shown in (c-2) below.

(c-2)

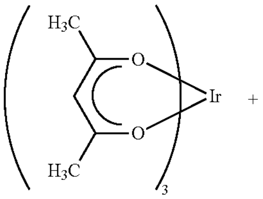

-continued

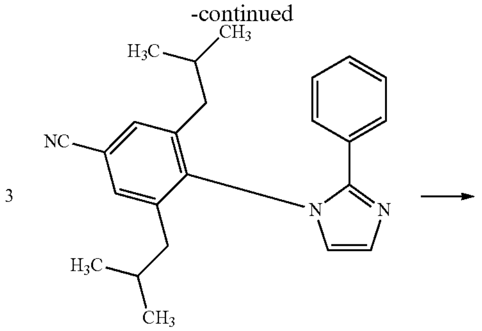

Hpim-diBuCNp

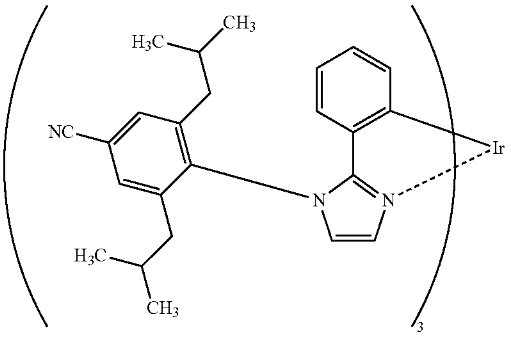

Ir(pim-diBuCNp)3

Figure 63:
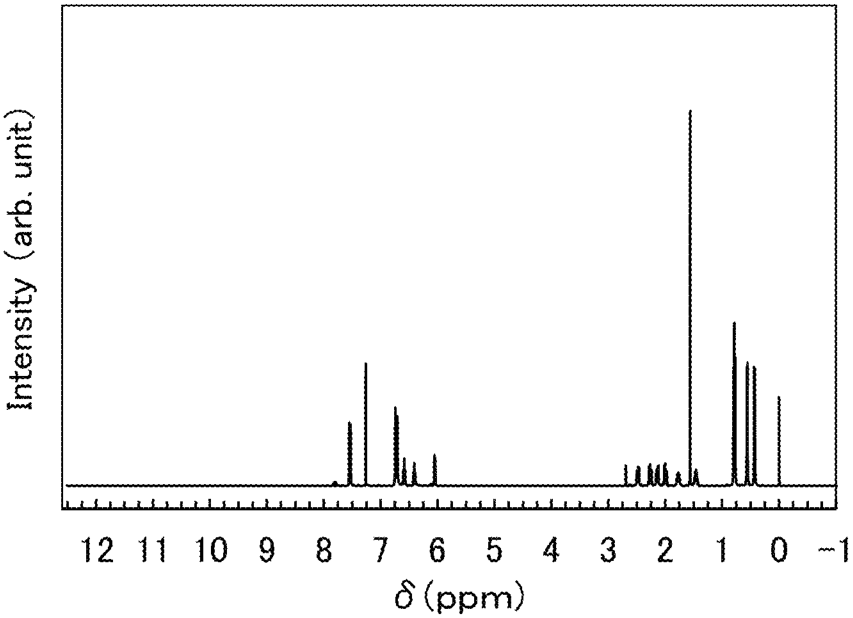
FIG. 63 is an NMR chart of a compound of one embodiment of the present invention.

The protons ($^1$H) of the yellow solid that was obtained in Step 3 was measured by a nuclear magnetic resonance (NMR) spectroscopy. The obtained values are shown below. The $^{1}$H-NMR chart is shown in FIG. 63. These results reveal that Ir(pim-diBuCNp)$_3$, which is the organometallic complex of one embodiment of the present invention represented by Structural Formula (118), was obtained in Synthesis example 4.

$^{1}$H-NMR δ ($CDCl_3$): 0.43 (d, 9H), 0.56 (d, 9H), 0.79 (t, 18H), 1.42-1.50 (m, 3H), 1.73-1.81 (m, 3H), 1.97-2.02 (m, 3H), 2.12-2.17 (m, 3H), 2.24-2.29 (m, 3H), 2.46-2.50 (m, 3H), 6.05 (d, 3H), 6.40 (t, 3H), 6.59 (t, 3H), 6.71-6.76 (m, 9H), 7.54 (d, 6H).

<Characteristics of Ir(Pim-diBuCNp)$_3$>

Figure 64:
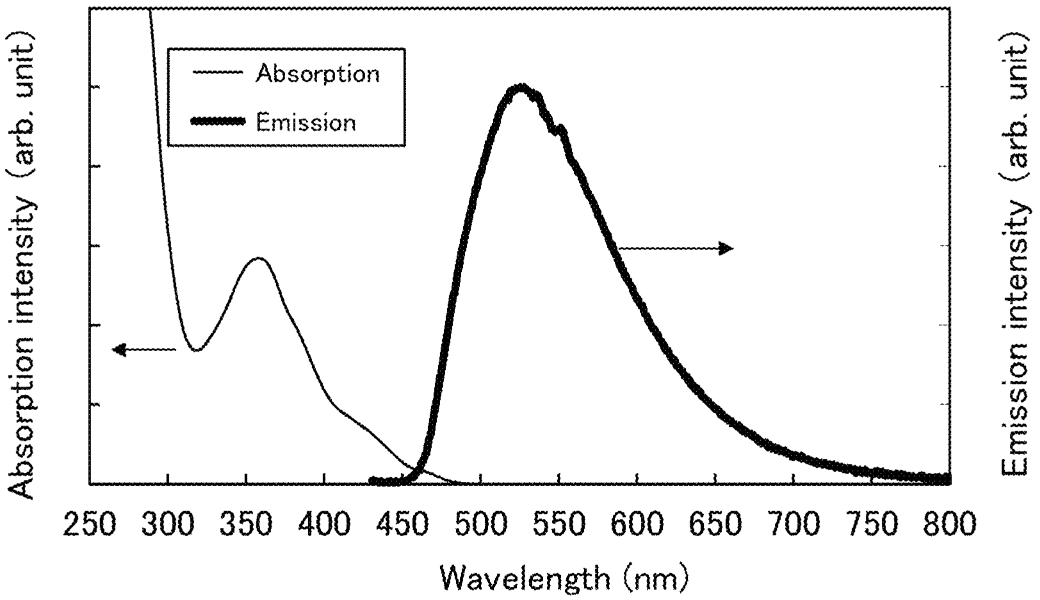
FIG. 64 is a graph showing an absorption spectrum and an emission spectrum of a compound of one embodiment of the present invention.

The absorption and emission spectra of a dichloromethane solution (0.0115 mmol/L) of Ir(pim-diBuCNp)$_3$ were measured. The measurement of the absorption and emission spectra was performed in a manner similar to that described in Example 1. FIG. 64 shows measurement results of the absorption and emission spectra. The horizontal axis represents wavelength and the vertical axes represent absorption intensity and emission intensity.

As shown in FIG. 64, green light emission having an emission peak at 526 nm was observed from the dichloromethane solution of Ir(pim-diBuCNp)$_3$.

Next, Ir(pim-diBuCNp)$_3$ obtained in this example was subjected to mass spectrometric (MS) analysis by liquid chromatography mass spectrometry (LC/MS).

In the LC/MS, liquid chromatography (LC) separation was carried out with ACQUITY UPLC (produced by Waters Corporation) and mass spectrometry (MS) was carried out with Xevo G2 Tof MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that Ir(pim-diBuCNp)$_3$ was dissolved in chloroform at a given concentration and the mixture was diluted with acetonitrile. The injection amount was 5.0 μL.

In the LC separation, a gradient method in which the composition of mobile phases is changed was employed. The ratio of Mobile Phase A to Mobile Phase B was 70:30 for 0 to 1 minute after the start of the measurement, and then the composition was changed such that the ratio of Mobile Phase A to Mobile Phase B after 10 minutes from the start of the measurement was 95:5. The composition was changed linearly.

In the MS analysis, ionization was carried out by an electrospray ionization (ESI) method. At this time, the capillary voltage and the sample cone voltage were set to 3.0 kV and 30 V, respectively, and detection was performed in a positive mode. A component with m/z of 1261.60 which underwent the ionization under the above-described conditions was collided with an argon gas in a collision cell to dissociate into product ions. Energy (collision energy) for the collision with argon was 50 eV. The mass range for the measurement was m/z=100 to 2000. The detection result of the dissociated product ions by time-of-flight (TOF) MS are shown in FIG. 65.

Figure 65:
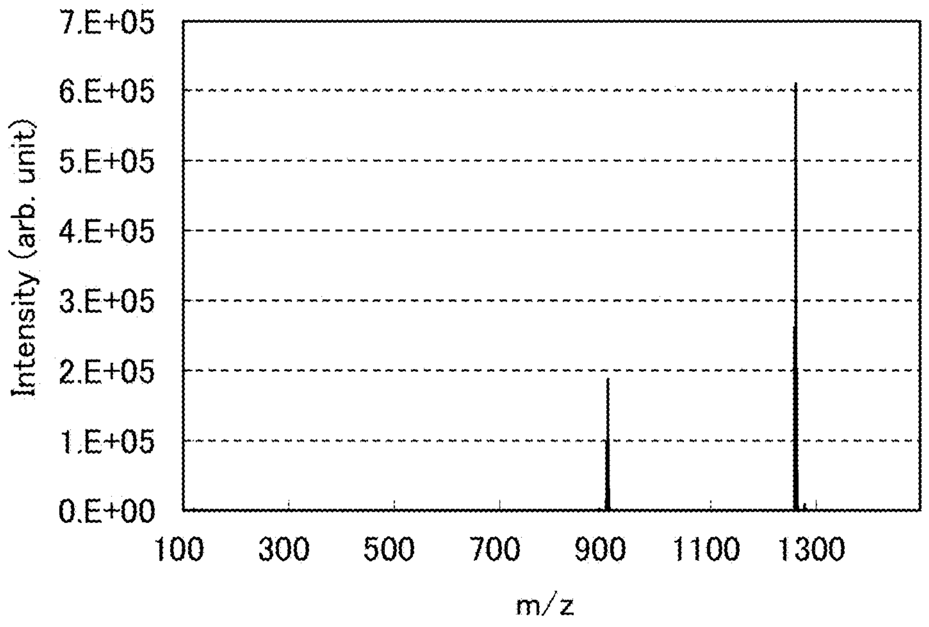
FIG. 65 is a graph showing the liquid chromatography mass spectrometry of a compound of one embodiment of the present invention.

FIG. 65 shows that product ions of Ir(pim-diBuCNp)$_3$ are mainly detected around m/z=905. The results in FIG. 65 show characteristics derived from Ir(pim-diBuCNp)$_3$ and therefore can be regarded as important data for identifying Ir(pim-diBuCNp)$_3$ contained in a mixture.

It is presumed that the product ion around m/z=905 is a cation in a state where the ligand Hpim-diBuCNp is eliminated from Ir(pim-diBuCNp)$_3$, and this is characteristic of Ir(pim-diBuCNp)$_3$.

The electrochemical characteristics (oxidation reaction characteristics and reduction reaction characteristics) of Ir(pim-diBuCNp)$_3$ were examined by cyclic voltammetry (CV). Note that for the measurement, an electrochemical analyzer (ALS model 600A or 600C, produced by BAS Inc.) was used. Note that a solution in which Ir(pim-diBuCNp)$_3$ is dissolved in chloroform was used for the measurement of oxidation reaction characteristics, and a solution in which Ir(pim-diBuCNp)$_3$ is dissolved in N,N-dimethylformamide (abbreviation: DMF) was used for the measurement of reduction reaction characteristics. In the measurement, the potential of a working electrode with respect to the reference electrode was changed within an appropriate range, so that the oxidation peak potential and the reduction peak potential were obtained. In addition, the HOMO and LUMO levels were obtained from the estimated redox potential of the reference electrode of −4.94 eV and the obtained peak potentials.

According to the CV measurement results, the oxidation potential of Ir(pim-diBuCNp)$_3$ was 0.28 V, and the reduction potential thereof was −2.54 V. In addition, the HOMO level and the LUMO level of Ir(pim-diBuCNp)$_3$ which were obtained from the CV measurement results were −5.22 eV and −2.41 eV, respectively.

Example 8

Synthesis Example 5

In Synthesis example 5, an example of synthesizing tris{2-[4-(4-cyano-2,6-dimethylphenyl)-5-(2-methylphenyl)-4H-1,2,4-triazol-3-yl-κ$N^2$]phenyl-κC}iridium(III) (abbreviation: Ir(mpptz-dmCNp)$_3$), which is an organometallic complex of one embodiment of the present invention represented by Structural Formula (124) in Embodiment 2 is described in detail. The structure of Ir(mpptz-dmCNp)$_3$ is shown below.

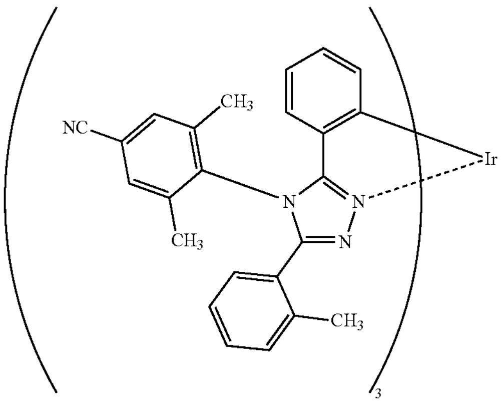

Ir(mpptz-dmCNp)$_3$

Step 1: Synthesis of 4-(4-cyano-2,6-dimethylphenyl)-3-(2-methylphenyl)-5-phenyl-4H-1,2,4-triazole (abbreviation: Hmpptz-dmCNp)

Into a 300 mL three-neck flask were put 6.5 g (44 mmol) of 4-amino-2,6-dimethylbenzonitrile, 10 g (34 mmol) of N-(2-methylphenyl)chloromethylidene-NV-phenylchloromethylidenehydrazine, and 80 mL of N,N-dimethylaniline, and the mixture was stirred under a nitrogen stream at 160° C. for 21 hours to be reacted. After the reaction, the reacted solution was added to 300 mL of 1M hydrochloric acid and stirring was performed for 3 hours, and an organic layer and an aqueous layer were separated. The aqueous layer was subjected to extraction with toluene. The organic layer and the obtained solution of the extract were combined, and washed with a saturated aqueous solution of sodium hydrogen carbonate and then with saturated saline, and anhydrate magnesium sulfate was added to the organic layer for drying. The obtained mixture was subjected to gravity filtration, and the filtrate was concentrated to give an oily substance. The obtained oily substance was purified by silica column chromatography. As developing solvents, first, a mixed solvent of toluene and ethyl acetate in a ratio of 10:1 (v:v) was used, and the proportion of a high-polar solvent was gradually increased until the ratio of toluene to ethyl acetate became 2:1 (v:v). The obtained fraction was concentrated to give a solid. The solid was recrystallized from ethyl acetate to give 3.5 g of a white solid in a yield of 27%. The obtained white solid was identified as 4-(4-cyano-2,6-dimethylphenyl)-3-(2-methylphenyl)-5-phenyl-4H-1,2,4-triazole (abbreviation: Hmpptz-dmCNp) by nuclear magnetic resonance (NMR) spectroscopy. The synthesis scheme of Step 1 is shown in (a-3) below.

(a-3)

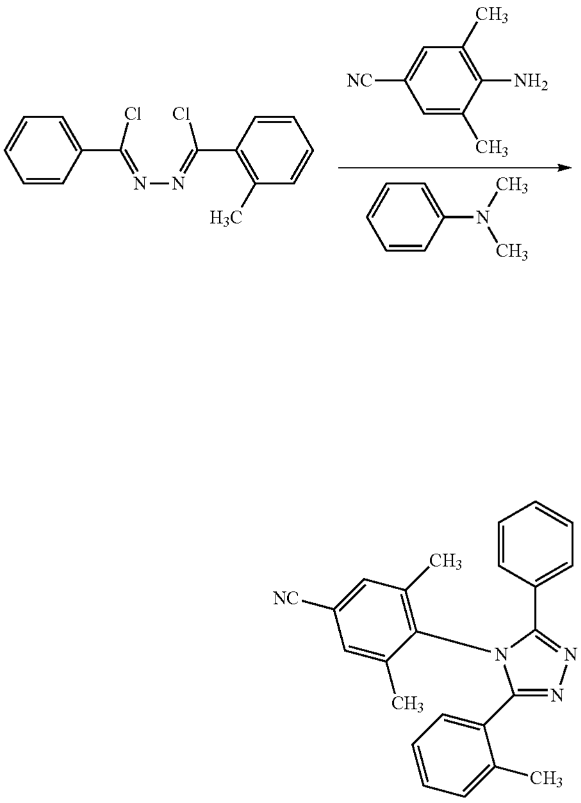

Hmpptz-dmCNp

Step 2: Synthesis of tris{2-[4-(4-cyano-2,6-dimethylphenyl)-5-(2-methylphenyl)-4H-1,2,4-triazol-3-yl-κN$^2$]phenyl-κC}iridium(III) (abbreviation: Ir(mpptz-dmCNp)$_3$)

Into a reaction container provided with a three-way cock were put 3.0 g (8.2 mmol) of Hmpptz-dmCNp obtained in Step 1 and 0.81 g (1.6 mmol) of tris(acetylacetonato)iridium (III), and the mixture was heated at 250° C. for 37 hours to be reacted. The reaction mixture was purified by silica column chromatography. As a developing solvent, a mixed solvent of dichloromethane and ethyl acetate in a ratio of 20:1 (v:v) was used. The obtained fraction was concentrated to give a solid. The obtained solid was recrystallized from ethyl acetate, so that 150 mg of a yellow solid was obtained in a yield of 7.3%. The synthesis scheme of Step 3 is shown in (b-3) below.

(b-3)

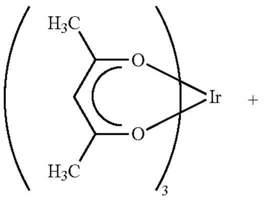

-continued

3

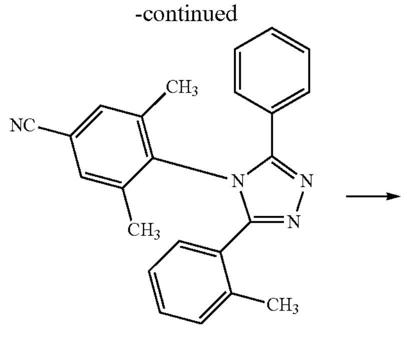

Hmpptz-dmCNp

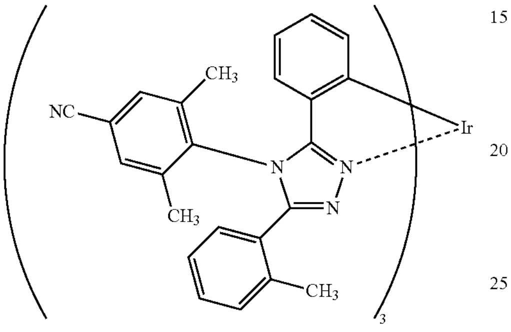

Ir(mpptz-dmCNp)3

Figure 66:
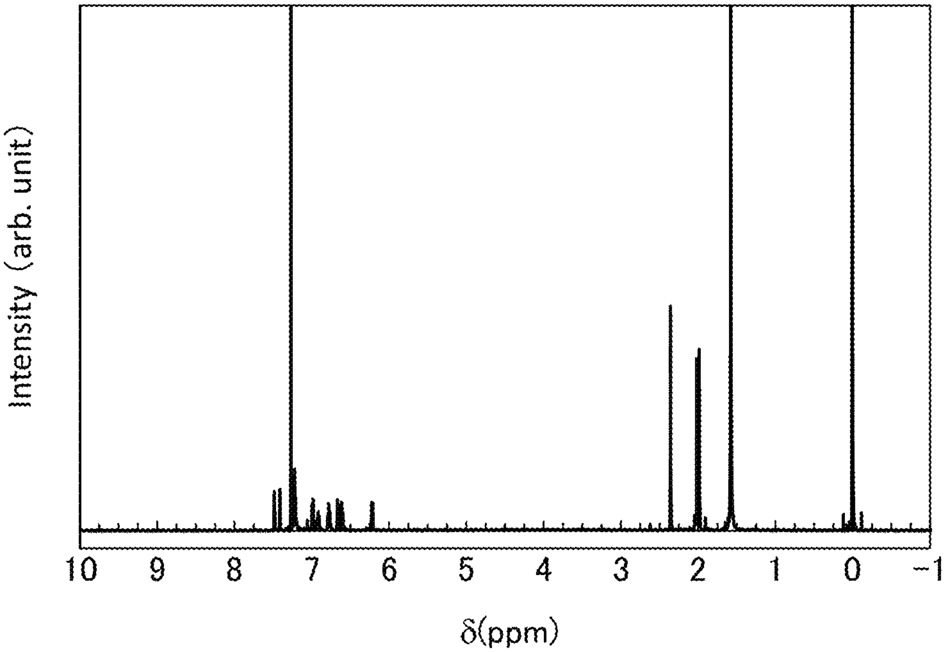
FIG. 66 is an NMR chart of a compound of one embodiment of the present invention.

The protons ($^1H$) of the yellow solid that was obtained in Step 2 was measured by a nuclear magnetic resonance (NMR) spectroscopy. The obtained values are shown below. The $^1H$-NMR chart is shown in FIG. 66. These results reveal that Ir(mpptz-dmCNp)$_3$, which is the organometallic complex of one embodiment of the present invention represented by Structural Formula (124), was obtained in Synthesis example 5.

$^1H$-NMR δ ($CDCl_3$): 1.99 (s, 9H), 2.02 (s, 9H), 2.36 (s, 9H), 6.22 (d, 3H), 6.61 (t, 3H), 6.66 (d, 3H), 6.78 (t, 3H), 6.90-6.93 (m, 3H), 6.99 (d, 3H), 7.19-7.23 (m, 6H), 7.41 (s, 3H), 7.48 (s, 3H).

<Characteristics of Ir(mpptz-dmCNp)$_3$>

Figure 67:
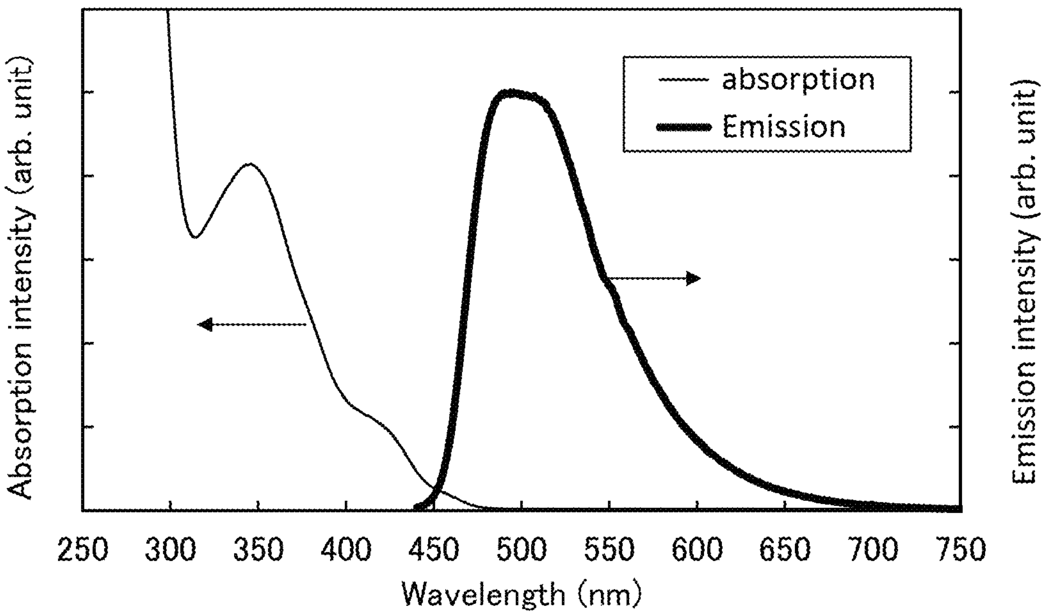
FIG. 67 is a graph showing an absorption spectrum and an emission spectrum of a compound of one embodiment of the present invention.

The absorption and emission spectra of a dichloromethane solution (0.0100 mmol/L) of Ir(mpptz-dmCNp)$_3$ were measured. The measurement of the absorption and emission spectra was performed in a manner similar to that described in Example 1. FIG. 67 shows measurement results of the absorption and emission spectra. The horizontal axis represents wavelength and the vertical axes represent absorption intensity and emission intensity.

As shown in FIG. 67, blue green light emission having an emission peak at 494 nm was observed from the dichloromethane solution of Ir(mpptz-dmCNp)$_3$.

Next, Ir(mpptz-dmCNp)$_3$ obtained in this example was subjected to mass spectrometric (MS) analysis by liquid chromatography mass spectrometry (LC/MS).

In the LC/MS, liquid chromatography (LC) separation was carried out with ACQUITY UPLC (produced by Waters Corporation) and mass spectrometry (MS) was carried out with Xevo G2 Tof MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that Ir(mpptz-dmCNp)$_3$ was dissolved in chloroform at a given concentration and the mixture was diluted with acetonitrile. The injection amount was 5.0 μL.

In the LC separation, a gradient method in which the composition of mobile phases is changed was employed. The ratio of Mobile Phase A to Mobile Phase B was 70:10 for 0 to 1 minute after the start of the measurement, and then the composition was changed such that the ratio of Mobile Phase A to Mobile Phase B after 10 minutes from the start of the measurement was 95:5. The composition was changed linearly.

In the MS analysis, ionization was carried out by an electrospray ionization (ESI) method. At this time, the capillary voltage and the sample cone voltage were set to 3.0 kV and 30 V, respectively, and detection was performed in a positive mode. A component with m/z of 1282.45 which underwent the ionization under the above-described conditions was collided with an argon gas in a collision cell to dissociate into product ions. Energy (collision energy) for the collision with argon was 70 eV. The mass range for the measurement was m/z=100 to 1500. The detection result of the dissociated product ions by time-of-flight (TOF) MS are shown in FIG. 68.

Figure 68:
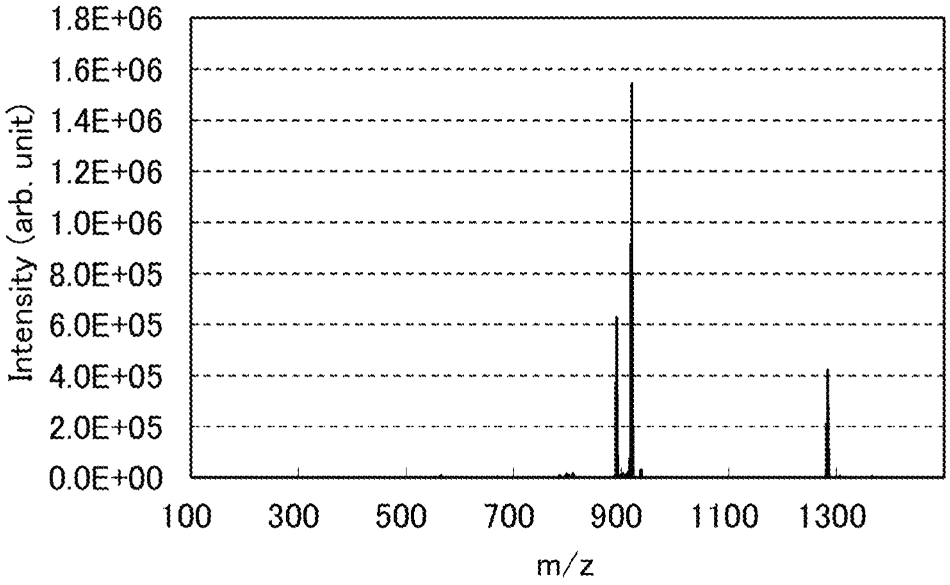
FIG. 68 is a graph showing the liquid chromatography mass spectrometry of a compound of one embodiment of the present invention.

FIG. 68 shows that product ions of Ir(mpptz-dmCNp)$_3$ are mainly detected around m/z=919 and around m/z=891. The results in FIG. 68 show characteristics derived from Ir(mpptz-dmCNp)$_3$ and therefore can be regarded as important data for identifying Ir(mpptz-dmCNp)$_3$ contained in a mixture.

It is presumed that the product ion around m/z=919 is a cation in a state where the ligand Hmpptz-dmCNp is eliminated from Ir(mpptz-dmCNp)$_3$ and the product ion around m/z=891 is a cation in a state where two methyl groups are further eliminated from the product ion around m/z=919, which are characteristic of Ir(mpptz-dmCNp)$_3$.

The electrochemical characteristics (oxidation reaction characteristics and reduction reaction characteristics) of Ir(mpptz-dmCNp)$_3$ were examined by cyclic voltammetry (CV). Note that for the measurement, an electrochemical analyzer (ALS model 600A or 600C, produced by BAS Inc.) was used. Note that a solution in which Ir(mpptz-dmCNp)$_3$ is dissolved in chloroform was used for the measurement of oxidation reaction characteristics, and a solution in which Ir(mpptz-dmCNp)$_3$ is dissolved in N,N-dimethylformamide (abbreviation: DMF) was used for the measurement of reduction reaction characteristics. In the measurement, the potential of a working electrode with respect to the reference electrode was changed within an appropriate range, so that the oxidation peak potential and the reduction peak potential were obtained. In addition, the HOMO and LUMO levels were obtained from the estimated redox potential of the reference electrode of −4.94 eV and the obtained peak potentials.

According to the CV measurement results, the oxidation potential of Ir(mpptz-dmCNp)$_3$ was 0.48 V, and the reduction potential thereof was −2.44 V. In addition, the HOMO level and the LUMO level of Ir(mpptz-dmCNp)$_3$ which were obtained from the CV measurement results were −5.42 eV and −2.51 eV, respectively.

Example 9

Synthesis Example 6

In Synthesis example 6, an example of synthesizing tris{2-[4-(3-cyano-2,4,6-trimethylphenyl)-5-(2-methylphenyl)-4H-1,2,4-triazol-3-yl-κ$N^2$]phenyl-κC}iridium(III) (abbreviation: Ir(mpptz-tm5CNp)$_3$), which is an organometallic complex of one embodiment of the present invention represented by Structural Formula (125) in Embodiment 2 is described in detail. The structure of Ir(mpptz-tm5CNp)$_3$ is shown below.

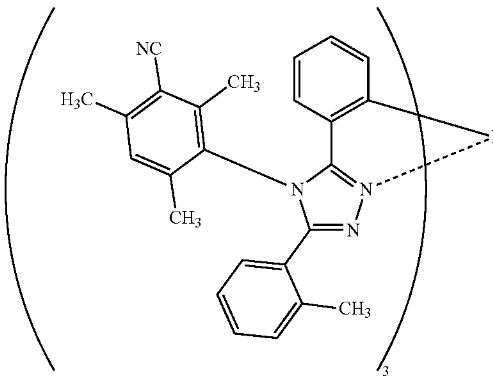

Ir(mpptz-tm5CNp)$_3$

Step 1: Synthesis of 3-amino-2,4,6-trimethylbenzonitrile

Into a 500 mL three-neck flask were put 13 g (61 mmol) of 3-bromo-2,4,6-trimethylaniline, 200 mL of dimethylformamide, and 8.2 g (91 mmol) of copper cyanide, and the mixture was heated and stirred under a nitrogen stream at 150° C. for 16 hours to be reacted. To the reacted solution were added 100 mL of ammonia water and 100 mL of water, and the mixture was stirred at room temperature. An aqueous layer and an organic layer of the obtained mixture were separated. The aqueous layer was subjected to extraction with dichloromethane, and an organic layer was washed with water and saturated saline. Anhydrous magnesium sulfate was added to the obtained organic layer for drying, and the resulting mixture was subjected to gravity filtration to give a filtrate. This filtrate was concentrated to give a brown solid. This brown solid was washed with ethanol to give 7.1 g of a pale red solid in a yield of 73%. The obtained pale red solid was identified as 3-amino-2,4,6-trimethylbenzonitrile by nuclear magnetic resonance (NMR) spectroscopy. The synthesis scheme of Step 2 is shown in (a-4) below.

(a-4)

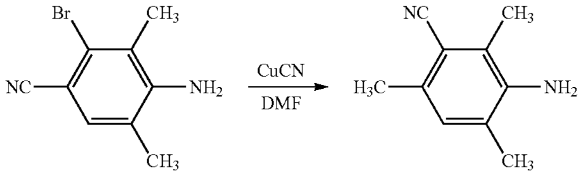

Step 2: Synthesis of 4-(3-cyano-2,4,6-trimethylphenyl)-3-(2-methylphenyl)-5-phenyl-4H-1,2,4-triazole (abbreviation: Hmpptz-tm5CNp)

Into a 300 mL three-neck flask were put 6.5 g (41 mmol) of 3-amino-2,4,6-trimethylbenzonitrile synthesized in Step 1, 9.4 g (34 mmol) of N-(2-methylphenyl)chloromethylidene-N'-phenyl chloromethylidenehydrazine, and 110 mL of N,N-dimethylaniline, and the mixture was stirred under a nitrogen stream at 160° C. for 19 hours to be reacted. After the reaction, the reacted solution was added to 300 mL of 1M hydrochloric acid and stirring was performed for 3 hours, and an organic layer and an aqueous layer were separated. The aqueous layer was subjected to extraction with toluene. The organic layer and the obtained solution of the extract were combined, and washed with a saturated aqueous solution of sodium hydrogen carbonate and then with saturated saline, and anhydrate magnesium sulfate was added to the organic layer for drying. The obtained mixture was subjected to gravity filtration, and the filtrate was concentrated to give an oily substance. The obtained oily substance was purified by silica column chromatography. As developing solvents, first, a mixed solvent of toluene and ethyl acetate in a ratio of 1:1 (v:v) was used. The resulting fraction was concentrated to give a white solid. The obtained white solid was recrystallized from ethyl acetate to give 5.2 g of a white solid in a yield of 40%. The obtained white solid was identified as 4-(3-cyano-2,4,6-trimethylphenyl)-3-(2-methylphenyl)-5-phenyl-4H-1,2,4-triazole (abbreviation: Hmpptz-tm5CNp) by nuclear magnetic resonance (NMR) spectroscopy. The synthesis scheme of Step 2 is shown in (b-4) below.

(b-4)

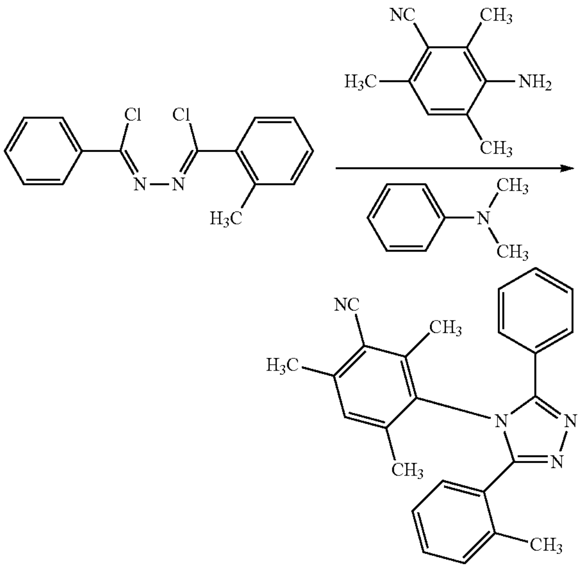

Hmpptz-tm5CNp

Step 3: Synthesis of tris{2-[4-(3-cyano-2,4,6-trimethylphenyl)-5-(2-methylphenyl)-4H-1,2,4-triazol-3-yl-κN$^2$]phenyl-κC}iridium(III) (abbreviation: Ir(mpptz-tm5CNp)$_3$)

Into a reaction container provided with a three-way cock were put 4.5 g (12 mmol) of Hmpptz-tm5CNp obtained in Step 2 and 1.2 g (2.4 mmol) of tris(acetylacetonato)iridium (III), and the mixture was heated at 250° C. for 40 hours. The reaction mixture was purified by silica column chromatography. As a developing solvent, a mixed solvent of dichloromethane and ethyl acetate in a ratio of 20:1 (v:v) was used. The obtained fraction was concentrated to give a solid. The obtained solid was recrystallized from ethyl acetate/hexane, so that 0.80 g of a yellow solid was obtained in a yield of 25%. Then 0.31 g of the obtained yellow solid was purified by a train sublimation method. The purification by sublimation was performed by heating at 315° C. under a pressure of $4.7\times10^{-3}$ Pa for 16 hours and then heating at 320° C. for 8.5 hours. After the purification by sublimation, 0.18 g of a yellow solid was obtained at a collection rate of 58%. The synthesis scheme of Step 3 is shown in (c-4) below.

(c-4)

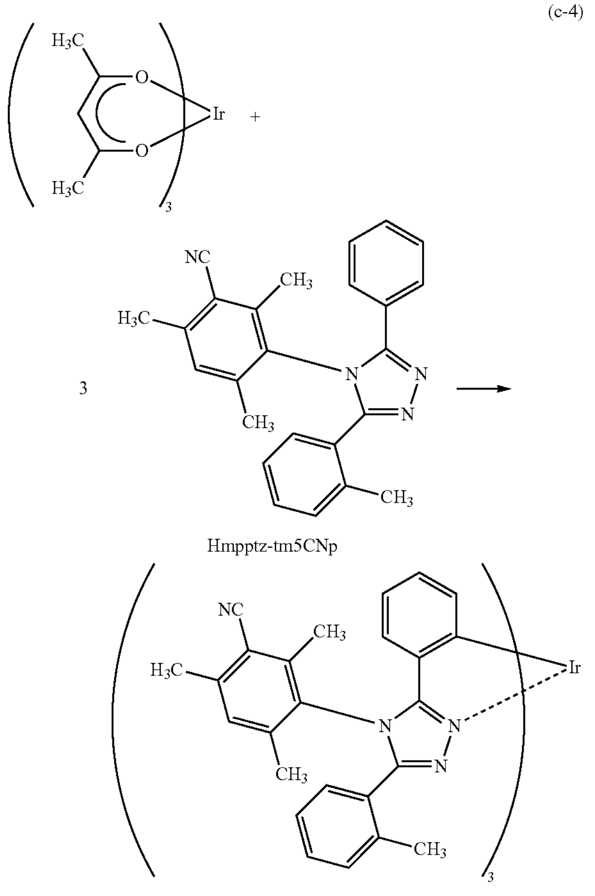

Hmpptz-tm5CNp

Ir(mpptz-tm5CNp)$_3$

Figure 69:
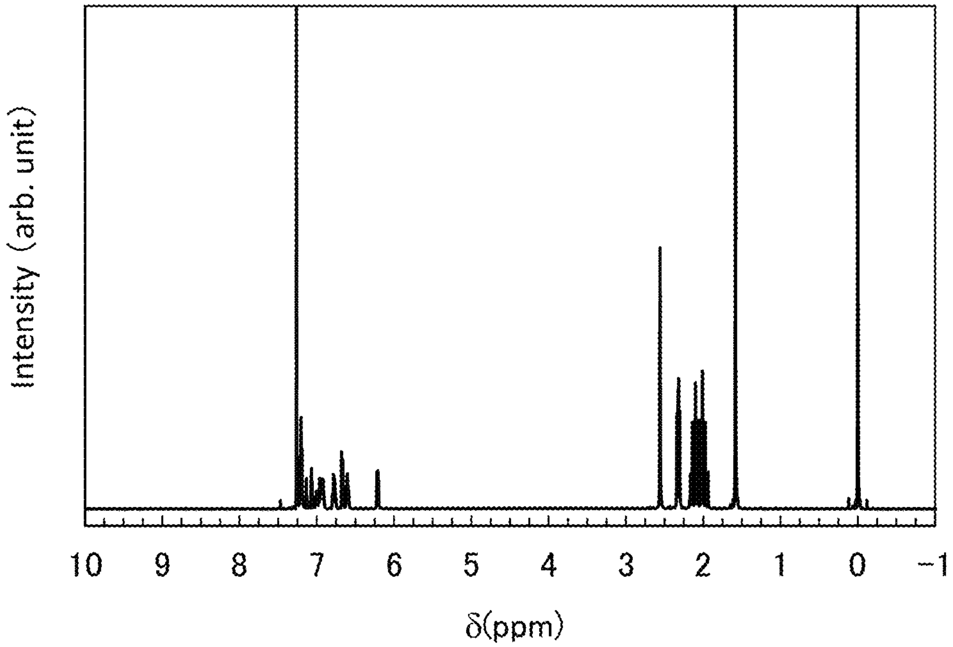
FIG. 69 is an NMR chart of a compound of one embodiment of the present invention.

The protons ($^1$H) of the yellow solid that was obtained in Step 3 was measured by a nuclear magnetic resonance (NMR) spectroscopy. The obtained values are shown below. The $^1$H-NMR chart is shown in FIG. 69. These results reveal that Ir(mpptz-tm5CNp)$_3$, which is the organometallic complex of one embodiment of the present invention represented by Structural Formula (125), was obtained in Synthesis example 6.

$^1$H-NMR δ ($CDCl_3$): 1.37-2.18 (m, 18H), 2.30-2.34 (m, 9H), 2.56 (s, 9H), 6.20-6.22 (m, 3H), 6.58-6.62 (m, 3H), 6.72 (d, 3H), 6.75-6.78 (m, 3H), 6.91-7.02 (m, 6H), 7.05-7.07 (m, 3H), 7.19-7.20 (m, 6H).

<Characteristics of Ir(mpptz-tm5CNp)$_3$>

Figure 70:
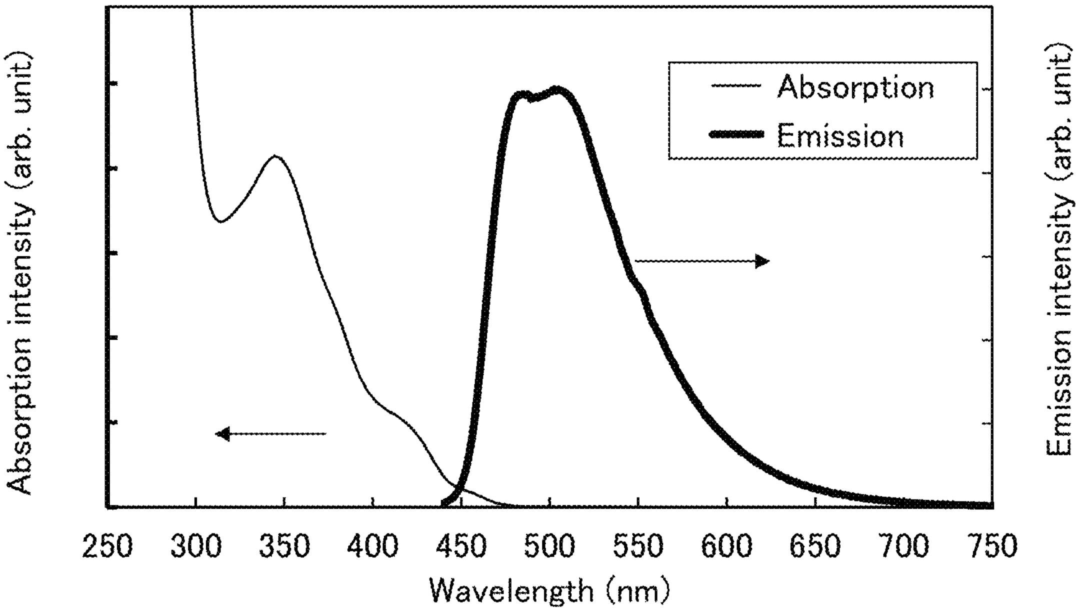
FIG. 70 is a graph showing an absorption spectrum and an emission spectrum of a compound of one embodiment of the present invention.

The absorption and emission spectra of a dichloromethane solution (0.0100 mmol/L) of Ir(mpptz-tm5CNp)$_3$ were measured. The measurement of the absorption and emission spectra was performed in a manner similar to that described in Example 1. FIG. 70 shows measurement results of the absorption and emission spectra. The horizontal axis represents wavelength and the vertical axes represent absorption intensity and emission intensity.

As shown in FIG. 70, blue green light emission having emission peaks at 484 nm and 502 nm was observed from the dichloromethane solution of Ir(mpptz-tm5CNp)$_3$.

Next, Ir(mpptz-tm5CNp)$_3$ obtained in this example was subjected to mass spectrometric (MS) analysis by liquid chromatography mass spectrometry (LC/MS).

In the LC/MS, liquid chromatography (LC) separation was carried out with ACQUITY UPLC (produced by Waters Corporation) and mass spectrometry (MS) was carried out with Xevo G2 Tof MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that Ir(mpptz-tm5CNp)$_3$ was dissolved in chloroform at a given concentration and the mixture was diluted with acetonitrile. The injection amount was 5.0 μL.

In the LC separation, a gradient method in which the composition of mobile phases is changed was employed. The ratio of Mobile Phase A to Mobile Phase B was 70:10 for 0 to 1 minute after the start of the measurement, and then the composition was changed such that the ratio of Mobile Phase A to Mobile Phase B after 10 minutes from the start of the measurement was 95:5. The composition was changed linearly.

In the MS analysis, ionization was carried out by an electrospray ionization (ESI) method. At this time, the capillary voltage and the sample cone voltage were set to 3.0 kV and 30 V, respectively, and detection was performed in a positive mode. A component with m/z of 1324.49 which underwent the ionization under the above-described conditions was collided with an argon gas in a collision cell to dissociate into product ions. Energy (collision energy) for the collision with argon was 50 eV. The mass range for the measurement was m/z=100 to 2000. The detection result of the dissociated product ions by time-of-flight (TOF) MS are shown in FIG. 71.

Figure 71:
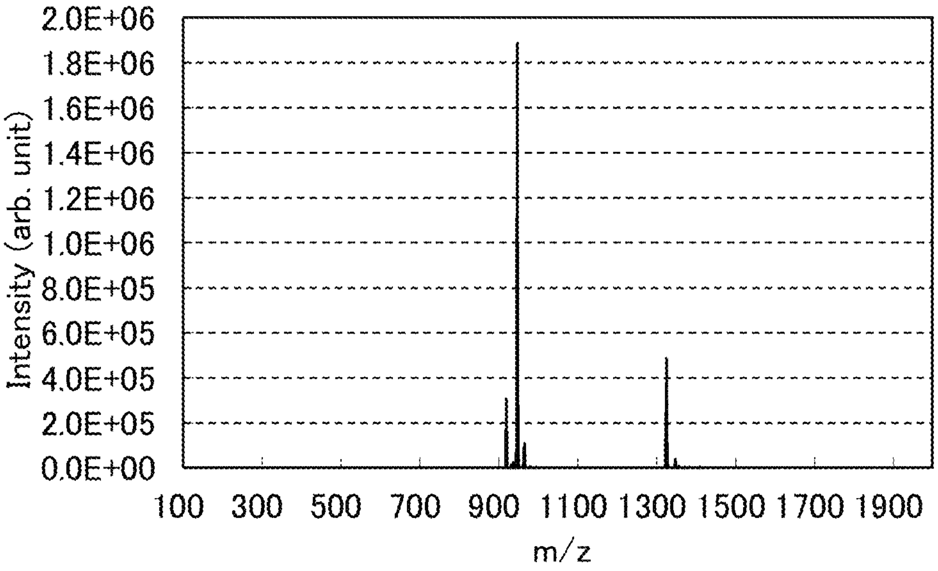
FIG. 71 is a graph showing the liquid chromatography mass spectrometry of a compound of one embodiment of the present invention.

FIG. 71 shows that product ions of Ir(mpptz-tm5CNp)$_3$ are mainly detected around m/z=947 and around m/z=919. The results in FIG. 71 show characteristics derived from Ir(mpptz-tm5CNp)$_3$ and therefore can be regarded as important data for identifying Ir(mpptz-tm5CNp)$_3$ contained in a mixture.

It is presumed that the product ion around m/z=947 is a cation in a state where the ligand Hmpptz-tm5CNp is eliminated from Ir(mpptz-tm5CNp)$_3$ and the product ion around m/z=919 is a cation in a state where two methyl groups are further eliminated from the product ion around m/z=947, which are characteristic of Ir(mpptz-tm5CNp)$_3$.

The electrochemical characteristics (oxidation reaction characteristics and reduction reaction characteristics) of Ir(mpptz-tm5CNp)$_3$ were examined by cyclic voltammetry (CV). Note that for the measurement, an electrochemical analyzer (ALS model 600A or 600C, produced by BAS Inc.) was used. Note that a solution in which Ir(mpptz-tm5CNp)$_3$ is dissolved in chloroform was used for the measurement of oxidation reaction characteristics, and a solution in which Ir(mpptz-tm5CNp)$_3$ is dissolved in N,N-dimethylformamide (abbreviation: DMF) was used for the measurement of reduction reaction characteristics. In the measurement, the potential of a working electrode with respect to the reference electrode was changed within an appropriate range, so that the oxidation peak potential and the reduction peak potential were obtained. In addition, the HOMO and LUMO levels were obtained from the estimated redox potential of the reference electrode of −4.94 eV and the obtained peak potentials.

According to the CV measurement results, the oxidation potential of $Ir(mpptz\text{-}tm5CNp)_3$ was 0.46 V, and the reduction potential thereof was −2.58 V. In addition, the HOMO level and the LUMO level of $Ir(mpptz\text{-}tm5CNp)_3$ which were obtained from the CV measurement results were −5.40 eV and −2.37 eV, respectively.

Example 10

Synthesis Example 7

In this example, a method for synthesizing tris{4-cyano-2-[4-(2,6-diisopropylphenyl)-5-(2-methylphenyl)-4H-1,2,4-triazol-3-yl-κ$N^2$]phenyl-κC}iridium(III) (abbreviation: $Ir(mp5CNptz\text{-}diPrp)_3$), which is an organometallic complex of one embodiment of the present invention represented by Structural Formula (126) in Embodiment 2 is described. The structure of $Ir(mp5CNptz\text{-}diPrp)_3$ is shown below.

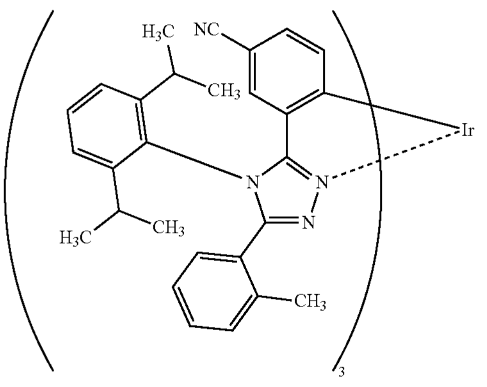

$Ir(mp5CNptz\text{-}diPrp)_3$

Step 1: Synthesis of N-3-bromobenzoyl-N'-2-methylbenzoylhydrazide

Into a 500 mL three-neck flask were put 25 g (166 mmol) of o-toluic hydrazide and 120 mL of N-methyl-2-pyrrolidinone (NMP). The atmosphere in the flask was replaced with nitrogen, and the mixture was stirred while being cooled with ice. To this mixed solution, a mixed solution of 37 g (166 mmol) of 3-bromobenzoyl chloride and 50 mL of NMP was slowly added dropwise, and the mixture was stirred for 20 hours to be reacted. After the reaction, the reacted solution was slowly added to 300 mL of water, so that a solid was precipitated. The precipitated solid was subjected to ultrasonic cleaning in which water and 1M hydrochloric acid were used alternately. Then, ultrasonic cleaning of the solid was performed using ethanol, whereby 40 g of a white solid was obtained in a yield of 71%. The obtained white solid was identified as N-3-bromobenzoylz-N-2-methylbenzoylhydrazide by nuclear magnetic resonance (NMR) spectroscopy. The synthesis scheme of Step 1 is shown in (a-5) below.

(a-5)

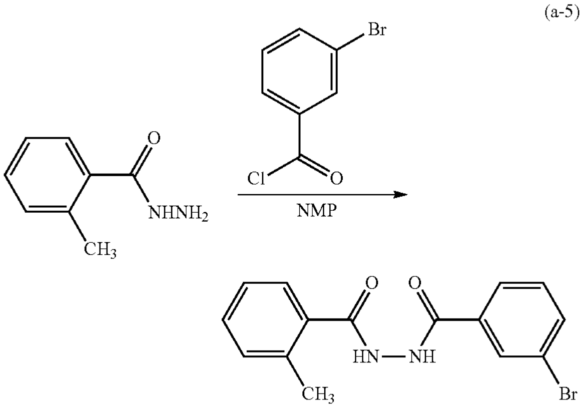

Step 2: Synthesis of N-chloro-3-bromophenylmethylidene-N'-chloro-2-methylphenylmethylidenehydrazone Into a 2000 mL three-neck flask were put 40 g (119 mmol) of N-3-bromobenzoyl-N'-2-methylbenzoylhydrazide synthesized in Step 1 and 800 mL of toluene. To this mixed solution, 75 g (360 mmol) of phosphorus pentachloride was added, and the mixture was heated and stirred at 120° C. under a nitrogen stream for 8 hours to be reacted. After the reaction, the reacted solution was slowly added to 400 mL of water, and the mixture was stirred at room temperature for 30 minutes. After the stirring, the precipitated solid was removed by filtration, the filtrate was separated to an aqueous layer and an organic layer, and the aqueous layer was subjected to extraction with toluene. A solution obtained by combining the obtained solution of the extract and the organic layer was slowly added to 400 mL of a 2M potassium hydroxide solution, and the solution was stirred at room temperature for 48 hours. An aqueous layer and an organic layer of this mixture were separated, and the aqueous layer was subjected to extraction with toluene. The obtained solution of the extract and the organic layer were combined and the combined solution was washed with saturated saline. After the washing, anhydrous magnesium sulfate was added to the solution for drying, and the resulting mixture was subjected to gravity filtration to give a filtrate. The obtained filtrate was concentrated to give an oily substance. The obtained oily substance was purified by silica column chromatography. Toluene was used as a developing solvent. The obtained fraction was concentrated to give 43 g of a yellow solid in a yield of 97%. The obtained yellow solid was identified as N-chloro-3-bromophenylmethylidene-N'-chloro-2-methylphenylmethylidenehydrazone by nuclear magnetic resonance (NMR) spectroscopy. The synthesis scheme of Step 2 is shown in (b-5) below.

(b-5)

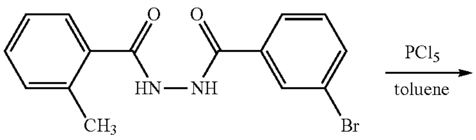

-continued

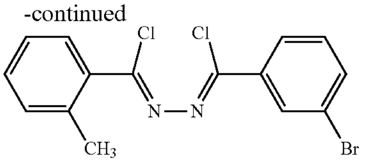

Step 3: Synthesis of 3-(3-bromophenyl)-4-(2,6-diisopropylphenyl)-5-(2-methylphenyl)-4H-1,2,4-triazole Into a 1000 mL three-neck flask were put 30 g (81.0 mmol) of N-chloro-3-bromophenylmethylidene-N'-chloro-2-methylphenylmethylidenehydrazone synthesized in Step 2, 43 g (243 mmol) of 2,6-diisopropylaniline, and 250 mL of N,N-dimethylaniline, and the mixture was heated and stirred under a nitrogen stream at 160° C. for 13 hours to be reacted. After the reaction, the reacted solution was added to 500 mL of 3M hydrochloric acid and stirring was performed for 30 minutes, and an organic layer and an aqueous layer were separated. The aqueous layer was subjected to extraction with toluene. The organic layer and the obtained solution of the extract were combined, and washed with water, a saturated aqueous solution of sodium hydrogen carbonate, and saturated saline, and anhydrate magnesium sulfate was added for drying. The obtained mixture was subjected to gravity filtration, and the filtrate was concentrated to give an oily substance. The obtained oily substance was purified by silica column chromatography. As a developing solvent, a 5:1 hexane-ethyl acetate mixed solvent was used. The obtained fraction was concentrated to give a solid. The solid was recrystallized from a mixed solvent of ethyl acetate and hexane to give 18 g of a white solid in a yield of 46%. The obtained white solid was identified as 3-(3-bromophenyl)-4-(2,6-diisopropylphenyl)-5-(2-methylphenyl)-4H-1,2,4-triazole by nuclear magnetic resonance (NMR) spectroscopy. The synthesis scheme of Step 3 is shown in (c-5) below.

(c-5)

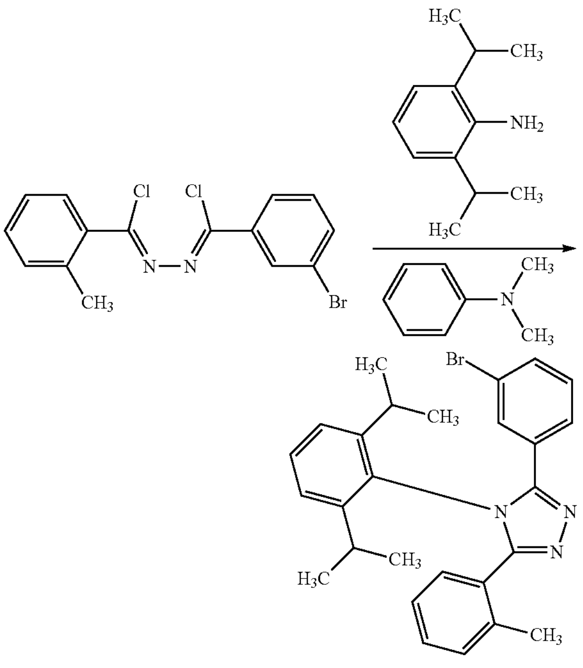

Step 4: Synthesis of tris{4-bromo-2-[4-(2,6-diisopropylphenyl)-5-(2-methylphenyl)-4H-1,2,4-triazol-3-yl-κ$N^2$]phenyl-κC}iridium(III)

Next, 4.8 g (10 mmol) of 3-(3-bromophenyl)-4-(2,6-diisopropylphenyl)-5-(2-methylphenyl)-4H-1,2,4-triazole obtained in Step 3 and 1.0 g (2.0 mmol) of tris(acetylacetonato)iridium(III) were put into a reaction container provided with a three-way cock, and heated at 250° C. for 40 hours to be reacted. The obtained reaction mixture was dissolved in dichloromethane, and an insoluble solid was removed by suction filtration. The obtained filtrate was purified by silica column chromatography. Dichloromethane was used as a developing solvent. The obtained fraction was concentrated to give a solid. This solid was washed with a mixed solvent of dichloromethane and hexane to give 1.7 g of a yellow solid in a yield of 53%. The yellow solid was identified as tris{4-bromo-2-[4-(2,6-diisopropylphenyl)-5-(2-methylphenyl)-4H-1,2,4-triazol-3-yl-κ$N^2$]phenyl-κC}iridium(III) by nuclear magnetic resonance (NMR) spectroscopy. The synthesis scheme of Step 4 is shown in (d-5) below.

(d-5)

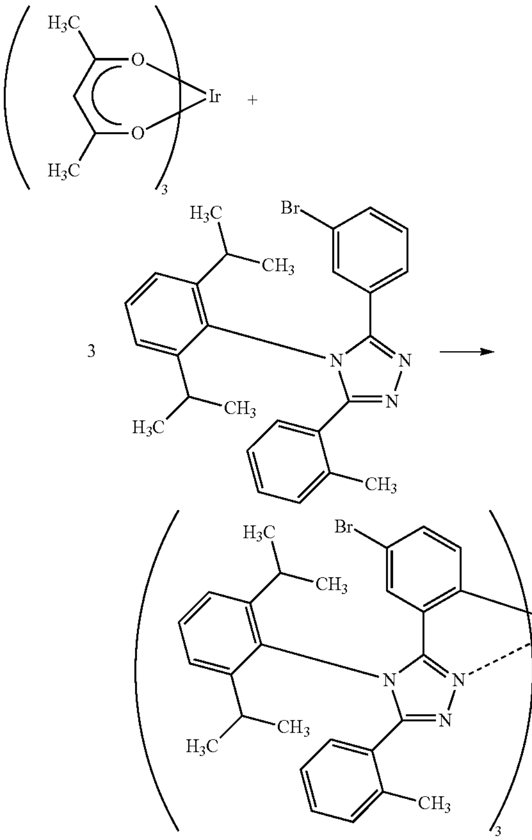

Step 5: Synthesis of tris{4-cyano-2-[4-(2,6-diisopropylphenyl)-5-(2-methylphenyl)-4H-1,2,4-triazol-3-yl-κ$N^2$]phenyl-κC}iridium(III) (abbreviation: $Ir(mp5CNptz-diPrp)_3$)

Next, 1.2 g (0.74 mmol) of tris{4-bromo-2-[4-(2,6-diisopropylphenyl)-5-(2-methylphenyl)-4H-1,2,4-triazol-3-yl-κ$N^2$]phenyl-κC}iridium(III) obtained in Step 4 and 10 mL of dimethylformamide (DMF) were put into a 50 mL three-neck flask, and 0.30 g (3.4 mmol) of copper cyanide was added thereto. This mixture was heated and stirred under a nitrogen stream at 150° C. for 44 hours to be reacted. After the reaction, 10 mL of ammonia water and 10 mL of water were added to the reacted solution, and the solution was stirred at room temperature. The obtained mixed solution was subjected to extraction with dichloromethane, and the solution of the extract was washed with water and saturated saline. Anhydrous magnesium sulfate was added to this solution for drying, and the resulting mixture was subjected to gravity filtration to give a filtrate. The obtained filtrate was concentrated to give an oily substance. This oily substance was purified by silica column chromatography. Dichloromethane was used as a developing solvent. The obtained fraction was concentrated to give a solid. This solid was recrystallized from ethyl acetate to give 0.61 g of a yellow solid in a yield of 57%. The synthesis scheme of Step 5 is shown in (e-5) below.

(e-5)

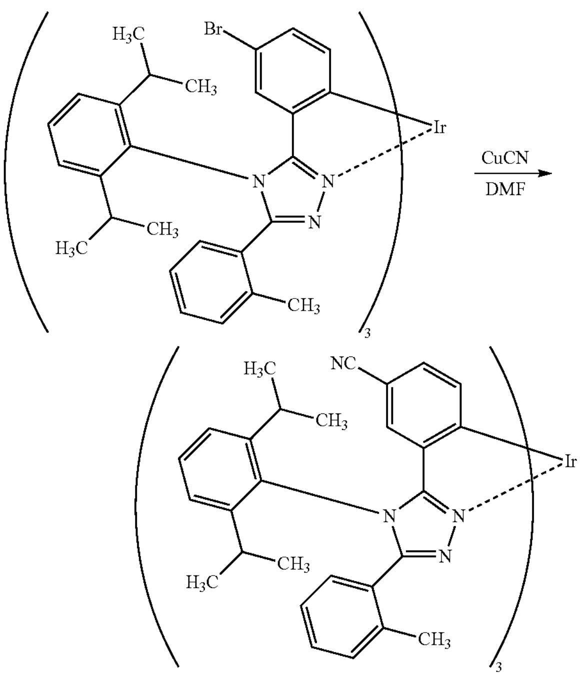

Ir(mp5CNptz-diPrp)3

Figure 72:
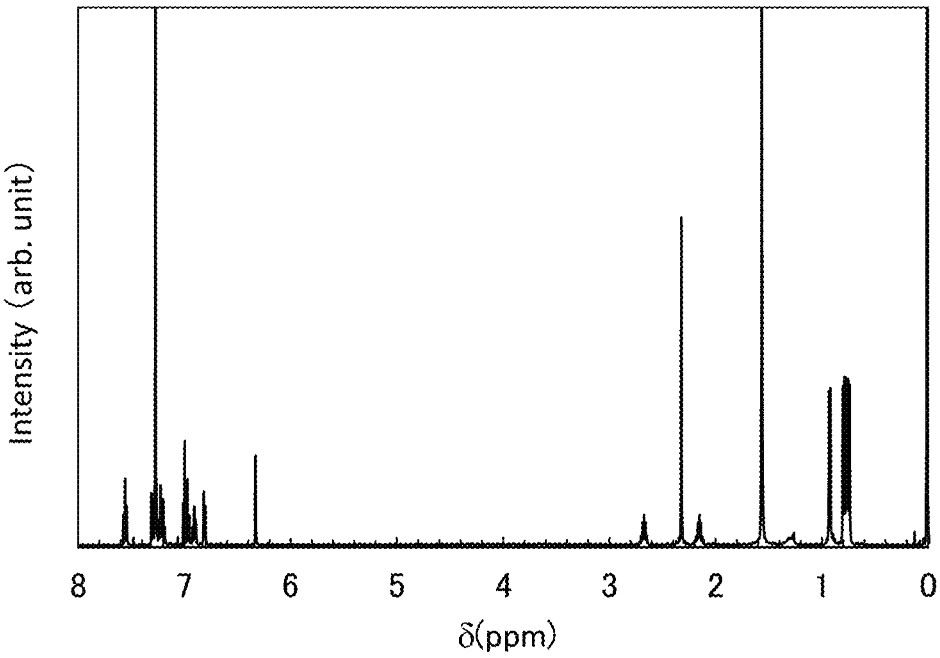
FIG. 72 is an NMR chart of a compound of one embodiment of the present invention.

The protons ($^1H$) of the yellow solid that was obtained in Step 5 was measured by a nuclear magnetic resonance (NMR) spectroscopy. The obtained values are shown below. The $^1H$-NMR chart is shown in FIG. 72. These results reveal that Ir(mp5CNptz-diPrp)$_3$, which is the organometallic complex of one embodiment of the present invention represented by Structural Formula (126), was obtained in Synthesis example 7.

$^1H$-NMR δ ($CDCl_3$): 0.74-0.80 (m, 27H), 0.93 (d, 9H), 2.13-2.17 (m, 3H), 2.32 (s, 9H), 2.65-2.70 (m, 3H), 6.33 (d, 3H), 6.81 (d, 3H), 6.91 (t, 3H), 6.96-7.01 (m, 6H), 7.12-7.27 (m, 9H), 7.30 (d, 3H), 7.56 (t, 3H).

<Characteristics of Ir(mp5CNptz-diPrp)$_3$>

Figure 73:
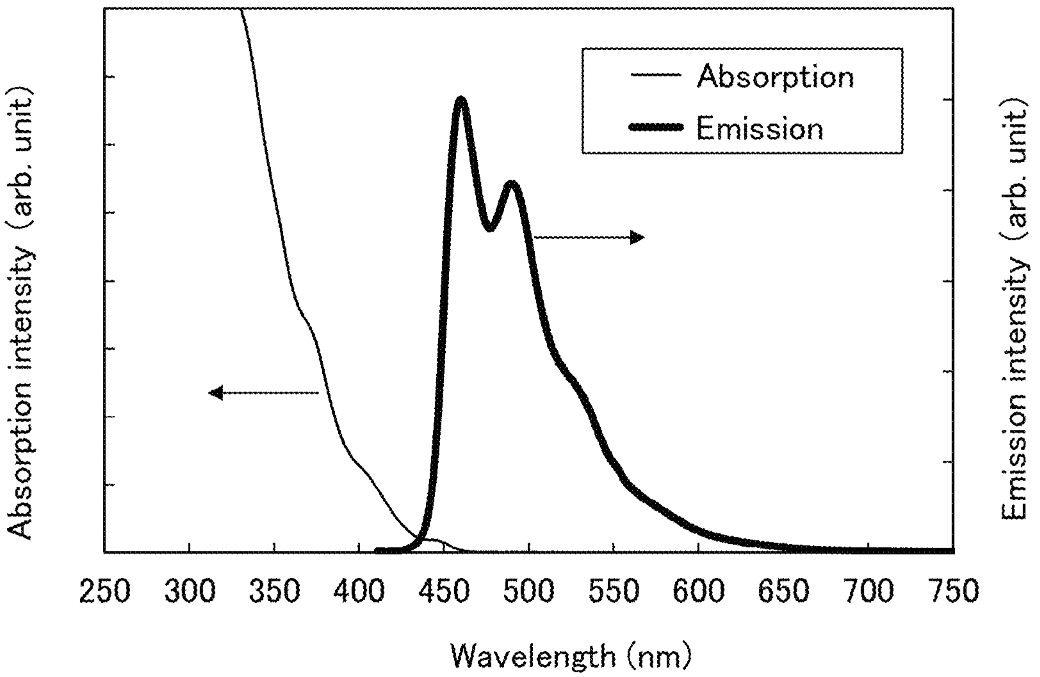
FIG. 73 is a graph showing an absorption spectrum and an emission spectrum of a compound of one embodiment of the present invention.

The absorption and emission spectra of a dichloromethane solution (0.0100 mmol/L) of Ir(mp5CNptz-diPrp)$_3$ were measured. The measurement of the absorption and emission spectra was performed in a manner similar to that described in Example 1. FIG. 73 shows measurement results of the absorption and emission spectra. The horizontal axis represents wavelength and the vertical axes represent absorption intensity and emission intensity. Note that the absorption spectrum in FIG. 73 is a result obtained by subtraction of a measured absorption spectrum of only dichloromethane that was put in a quartz cell from the measured absorption spectrum of the dichloromethane solution in a quartz cell.

As shown in FIG. 73, blue light emission having emission peaks at 460 nm and 489 nm was observed from the dichloromethane solution of Ir(mp5CNptz-diPrp)$_3$.

Next, Ir(mp5CNptz-diPrp)$_3$ obtained in this example was subjected to mass spectrometric (MS) analysis by liquid chromatography mass spectrometry (LC/MS).

In the LC/MS, liquid chromatography (LC) separation was carried out with ACQUITY UPLC (produced by Waters Corporation) and mass spectrometry (MS) was carried out with Xevo G2 Tof MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that Ir(mp5CNptz-diPrp)$_3$ was dissolved in chloroform at a given concentration and the mixture was diluted with acetonitrile. The injection amount was 5.0 μL.

In the LC separation, a gradient method in which the composition of mobile phases is changed was employed. The ratio of Mobile Phase A to Mobile Phase B was 85:15 for 0 to 1 minute after the start of the measurement, and then the composition was changed such that the ratio of Mobile Phase A to Mobile Phase B after 10 minutes from the start of the measurement was 95:5. The composition was changed linearly.

In the MS analysis, ionization was carried out by an electrospray ionization (ESI) method. At this time, the capillary voltage and the sample cone voltage were set to 3.0 kV and 30 V, respectively, and detection was performed in a positive mode. A component with m/z of 1451.64 which underwent the ionization under the above-described conditions was collided with an argon gas in a collision cell to dissociate into product ions. Energy (collision energy) for the collision with argon was 50 eV. The mass range for the measurement was m/z=100 to 2000. The detection result of the dissociated product ions by time-of-flight (TOF) MS are shown in FIG. 74.

Figure 74:
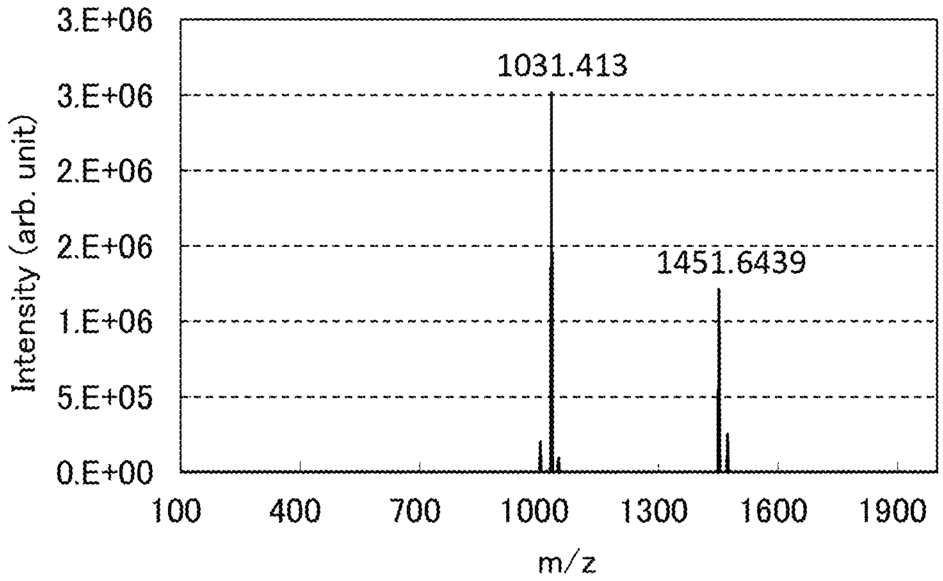
FIG. 74 is a graph showing the liquid chromatography mass spectrometry of a compound of one embodiment of the present invention.

FIG. 74 shows that product ions of Ir(mp5CNptz-diPrp)$_3$ are mainly detected around m/z=1031. The results in FIG. 74 show characteristics derived from Ir(mp5CNptz-diPrp)$_3$ and therefore can be regarded as important data for identifying Ir(mp5CNptz-diPrp)$_3$ contained in a mixture.

It is presumed that the product ion around m/z=1031 is a cation in a state where the ligand 3-(3-cyanophenyl)-4-(2,6-diisopropylphenyl)-5-(2-methylphenyl)-4H-1,2,4-triazole (abbreviation: Hmp5CNptz-diPrp) is eliminated from Ir(mp5CNptz-diPrp)$_3$, and this is characteristic of Ir(mp5CNptz-diPrp)$_3$.

The electrochemical characteristics (oxidation reaction characteristics and reduction reaction characteristics) of Ir(mp5CNptz-diPrp)$_3$ were examined by cyclic voltammetry (CV). Note that for the measurement, an electrochemical analyzer (ALS model 600A or 600C, produced by BAS Inc.) was used. Note that a solution in which Ir(mp5CNptz-diPrp)$_3$ is dissolved in chloroform was used for the measurement of oxidation reaction characteristics, and a solution in which Ir(mp5CNptz-diPrp)$_3$ is dissolved in N,N-dimethylformamide (abbreviation: DMF) was used for the measurement of reduction reaction characteristics. In the measurement, the potential of a working electrode with respect to the reference electrode was changed within an appropriate range, so that the oxidation peak potential and the reduction peak potential were obtained. In addition, the HOMO and LUMO levels were obtained from the estimated redox potential of the reference electrode of −4.94 eV and the obtained peak potentials.

According to the CV measurement results, the oxidation potential of Ir(mp5CNptz-diPrp)$_3$ was 0.96 V, and the reduction potential thereof was −2.59 V. In addition, the HOMO level and the LUMO level of Ir(mp5CNptz-diPrp)$_3$ which were obtained from the CV measurement results were −5.90 eV and −2.35 eV, respectively.

Example 11

Synthesis Example 8

In this example, a method for synthesizing tris{4,6-dicyano-2-[4-(2,6-diisopropylphenyl)-5-(2-methylphenyl)-4H-1,2,4-triazol-3-yl-κN$^2$]phenyl-κC}iridium(III) (abbreviation: Ir(mpdCNptz-diPrp)$_3$), which is an organometallic complex of one embodiment of the present invention represented by Structural Formula (128) in Embodiment 2 is described. The structure of Ir(mpdCNptz-diPrp)$_3$ is shown below.

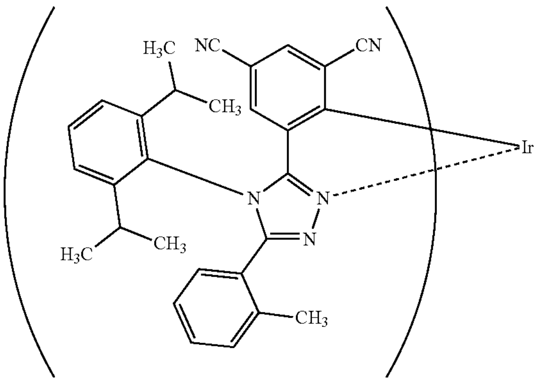

Ir(mpdCNptz-diPrp)$_3$

Step 1: Synthesis of N-3,5-dibromobenzoyl-N'-2-methylbenzoylhydrazide

Into a 500 mL three-neck flask were put 24 g (80 mmol) of 3,5-dibromobenzoylhydrazide and 150 mL of N-methyl-2-pyrrolidinone (NMP), and the mixture was stirred under a nitrogen stream while being cooled with ice. To this mixed solution, a mixed solution of 12 g (80 mmol) of o-toluoylchloride and 25 mL of NMP was slowly added dropwise, and the mixture was stirred for 20 hours to be reacted. After the reaction, the reacted solution was slowly added to 300 mL of water, so that a solid was precipitated. The precipitated solid was subjected to ultrasonic cleaning in which water and 1M hydrochloric acid were used alternately. Then, ultrasonic cleaning of the solid was performed using ethanol, whereby 31 g of a white solid was obtained in a yield of 93%. The obtained white solid was identified as N-3,5-dibromobenzoyl-N'-2-methylbenzoylhydrazide by nuclear magnetic resonance (NMR) spectroscopy. The synthesis scheme of Step 1 is shown in (a-6) below.

(a-6)

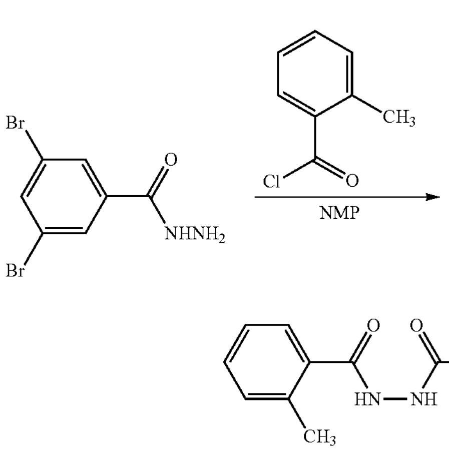

Step 2: Synthesis of N-chloro-3,5-dibromophenylmethylidene-N'-chloro-2-methylphenylmethylidenehydrazone Into a 1000 mL three-neck flask were put 31 g (75 mmol) of N-3,5-dibromobenzoyl-N-2-methylbenzoylhydrazide synthesized in Step 1 and 500 mL of toluene. To this mixed solution, 50 g (240 mmol) of phosphorus pentachloride was added, and the mixture was heated and stirred at 120° C. for 4 hours to be reacted. After the reaction, the reacted solution was slowly added to 500 mL of water, and the mixture was stirred at room temperature for 30 minutes. An aqueous layer and an organic layer of this mixture were separated, and the aqueous layer was subjected to extraction with dichloromethane. A mixture obtained by combining the obtained solution of the extract and the organic layer was slowly added to 400 mL of a 1M sodium hydroxide aqueous solution, and the mixture was stirred at room temperature for 30 minutes. An aqueous layer and an organic layer of this mixture were separated, and the aqueous layer was subjected to extraction with dichloromethane. The obtained solution of the extract was washed with a saturated aqueous solution of sodium hydrogen carbonate and then with saturated saline. After the washing, anhydrate magnesium sulfate was added to the solution for drying, and the resulting mixture was subjected to gravity filtration to give a filtrate. The obtained filtrate was concentrated to give a solid. Hexane was added to the obtained solid, and ultrasonic wave irradiation was performed. A solid was collected by suction filtration to give 27 g of a yellow solid in a yield of 81%. The obtained yellow solid was identified as N-chloro-3,5-dibromophenylmethylidene-N'-chloro-2-methylphenylmethylidenehydrazone by nuclear magnetic resonance (NMR) spectroscopy. The synthesis scheme of Step 2 is shown in (b-6) below.

(b-6)

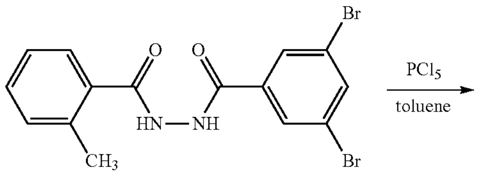

-continued

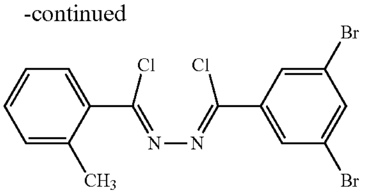

Step 3: Synthesis of 3-(3,5-dibromophenyl)-4-(2,6-diisopropylphenyl)-5-(2-methylphenyl)-4H-1,2,4-triazole Into a 500 mL three-neck flask were put 27 g (60 mmol) of N-chloro-3,5-dibromophenylmethylidene-N'-chloro-2-methylphenylmethylidenehydrazone synthesized in Step 2, 32 g (180 mmol) of 2,6-diisopropylaniline, and 200 mL of N,N-dimethylaniline, and the mixture was stirred under a nitrogen stream at 160° C. for 14 hours to be reacted. After the reaction, the reacted solution was added to 500 mL of 3M hydrochloric acid and stirring was performed for 1 hour, and an organic layer and an aqueous layer were separated. The aqueous layer was subjected to extraction with ethyl acetate. The organic layer and the obtained solution of the extract were combined, and washed with a saturated aqueous solution of sodium hydrogen carbonate and then with saturated saline. Then, anhydrous magnesium sulfate was added to the solution for drying. The obtained mixture was subjected to gravity filtration, and the filtrate was concentrated to give an oily substance. The obtained oily substance was purified by silica column chromatography. As a developing solvent, a 5:1 hexane-ethyl acetate mixed solvent was used. The obtained fraction was concentrated to give a solid. Hexane was added to the obtained solid, and the mixture was irradiated with ultrasonic waves and then subjected to suction filtration to give a solid. The obtained solid was recrystallized from ethyl acetate/hexane to give 9.4 g of a white solid in a yield of 28%. The obtained white solid was identified as 3-(3,5-dibromophenyl)-4-(2,6-diisopropylphenyl)-5-(2-methylphenyl)-4H-1,2,4-triazole by nuclear magnetic resonance (NMR) spectroscopy. The synthesis scheme of Step 3 is shown in (c-6) below.

(c-6)

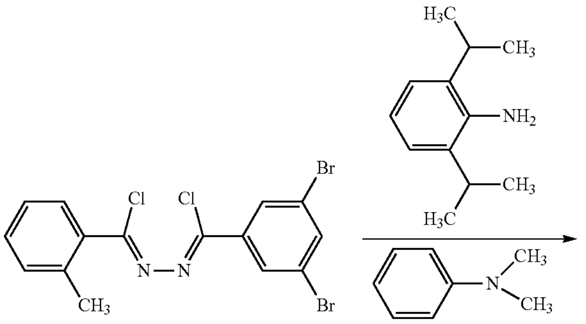

-continued

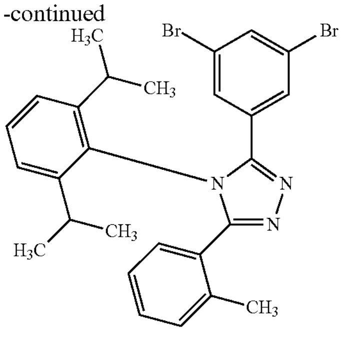

Step 4: Synthesis of 3-(3,5-dicyanophenyl)-4-(2,6-diisopropylphenyl)-5-(2-methylphenyl)-4H-1,2,4-triazole (abbreviation: HmpdCNptz-diPrp)

Into a 200 mL three-neck flask were put 6.0 g (11 mmol) of 3-(3,5-dibromophenyl)-4-(2,6-diisopropylphenyl)-5-(2-methylphenyl)-4H-1,2,4-triazole synthesized in Step 3 and 36 mL of N,N-dimethylformamide. To this mixed solution was added 2.9 g (33 mmol) of copper cyanide, and the solution was heated and stirred at 150° C. for 29.5 hours to be reacted. After the reaction, 60 mL of ammonia water and 60 mL of water were added to this reacted solution and stirring was performed at room temperature for 2 hours. Chloroform was added to this mixture, and the mixture was subjected to extraction. The obtained solution of the extract was washed with saturated saline twice. After the washing, anhydrous magnesium sulfate was added to the solution for drying, and the resulting mixture was subjected to gravity filtration to give a filtrate. The obtained filtrate was concentrated to give an oily substance. The obtained oily substance was purified by silica column chromatography. As a developing solvent, a 1:5 ethyl acetate-hexane mixed solvent was used. The obtained fraction was concentrated to give a solid. The obtained solid was recrystallized from ethyl acetate/hexane to give 2.0 g of a white solid in a yield of 42%. The obtained white solid was identified as 3-(3,5-dicyanophenyl)-4-(2,6-diisopropylphenyl)-5-(2-methylphenyl)-4H-1,2,4-triazole (abbreviation: HmpdCNptz-diPrp) by nuclear magnetic resonance (NMR) spectroscopy. The synthesis scheme of Step 4 is shown in (d-6) below.

(d-6)

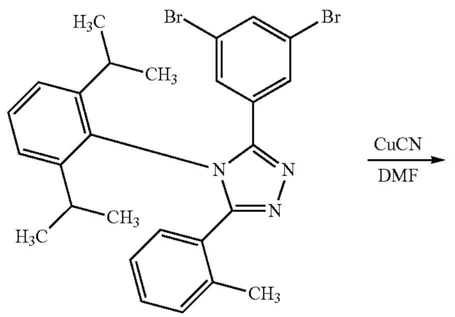

-continued

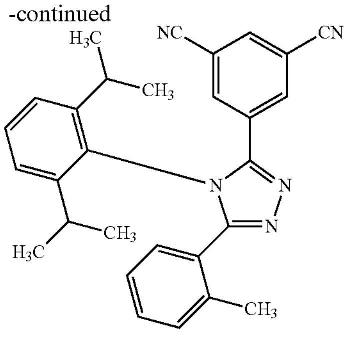

HmpdCNptz-diPrp

Step 5: Synthesis of tris{4, 6-dicyano-2-[4-(2,6-diisopropylphenyl)-5-(2-methylphenyl)-4H-1,2,4-triazol-3-yl-κ$N^2$]phenyl-κC}iridium(III) (abbreviation: Ir(mpdCNptz-diPrp)$_3$)

Into a reaction container provided with a three-way cock were put 2.0 g (4.5 mmol) of HmpdCNptz-diPrp synthesized in Step 4 and 0.44 g (0.90 mmol) of tris(acetylacetonato) iridium(III), and the mixture was stirred under an argon stream at 250° C. for 37 hours to be reacted. The obtained reaction mixture was added to dichloromethane, and the mixture was subjected to filtration to remove an insoluble matter. The obtained filtrate was concentrated to give a solid. The obtained solid was purified by silica column chromatography. As a developing solvent, first, dichloromethane was used, and then, a 100:3 dichloromethane-ethyl acetate mixed solvent was used. The obtained fraction was concentrated to give a solid. The resulting solid was recrystallized from ethyl acetate/hexane to give 0.31 g of a yellow solid in a yield of 22%. Then, 0.31 g of the obtained yellow solid was purified by a train sublimation method. The purification by sublimation was performed by heating at 310° C. under a pressure of $3.0\times10^{-3}$ Pa for 38 hours. After the purification by sublimation, 0.19 g of a yellow solid was obtained at a collection rate of 60%. The synthesis scheme of Step 5 is shown in (e-6) below.

(e-6)

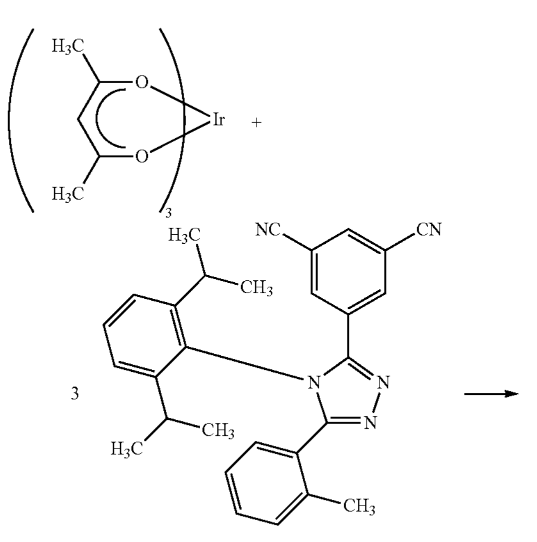

HmpdCNptz-diPrp

-continued

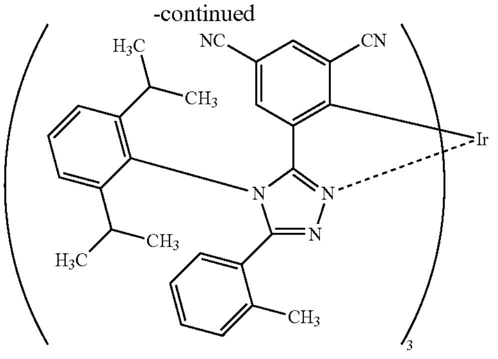

Ir(mpdCNptz-diPrp)$_3$

Figure 75:
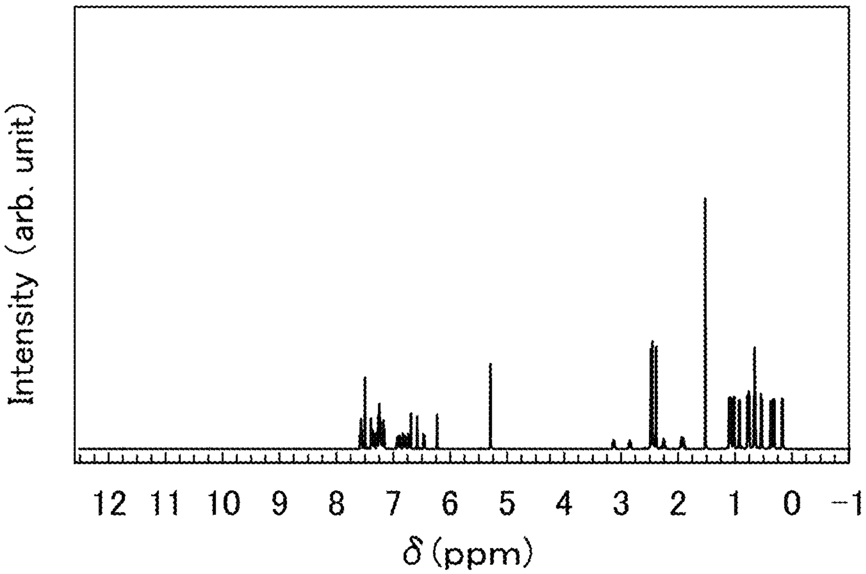
FIG. 75 is an NMR chart of a compound of one embodiment of the present invention.

The protons ($^1$H) of the yellow solid that was obtained in Step 5 was measured by a nuclear magnetic resonance (NMR) spectroscopy. The obtained values are shown below. The $^1$H-NMR chart is shown in FIG. 75. These results reveal that Ir(mpdCNptz-diPrp)$_3$, which is the organometallic complex of one embodiment of the present invention represented by Structural Formula (128), was obtained in this synthesis example.

$^1$H-NMR. δ ($CD_2Cl_2$): 0.17 (d, 3H), 0.32 (d, 3H), 0.37 (d, 3H), 0.54 (d, 3H), 0.64-0.67 (m, 6H), 0.74-0.78 (m, 6H), 0.92 (d, 3H), 1.02 (d, 3H), 1.06-1.11 (m, 6H), 1.88-1.97 (m, 2H), 2.23-2.28 (m, 1H), 2.38 (s, 3H), 2.45 (s, 3H), 2.48 (s, 3H), 2.82-2.87 (m, 1H), 3.11-3.16 (m, 1H), 6.23 (d, 1H), 6.46 (d, 1H), 6.58 (d, 1H), 6.69 (d, 1H), 6.73 (d, 1H), 6.77-6.83 (m, 2H), 6.87-6.94 (m, 2H), 7.16-7.39 (m, 14H), 7.49-7.50 (m, 2H), 7.57 (t, 3H).

<Characteristics of Ir(mpdCNptz-diPrp)$_3$>

Figure 76:
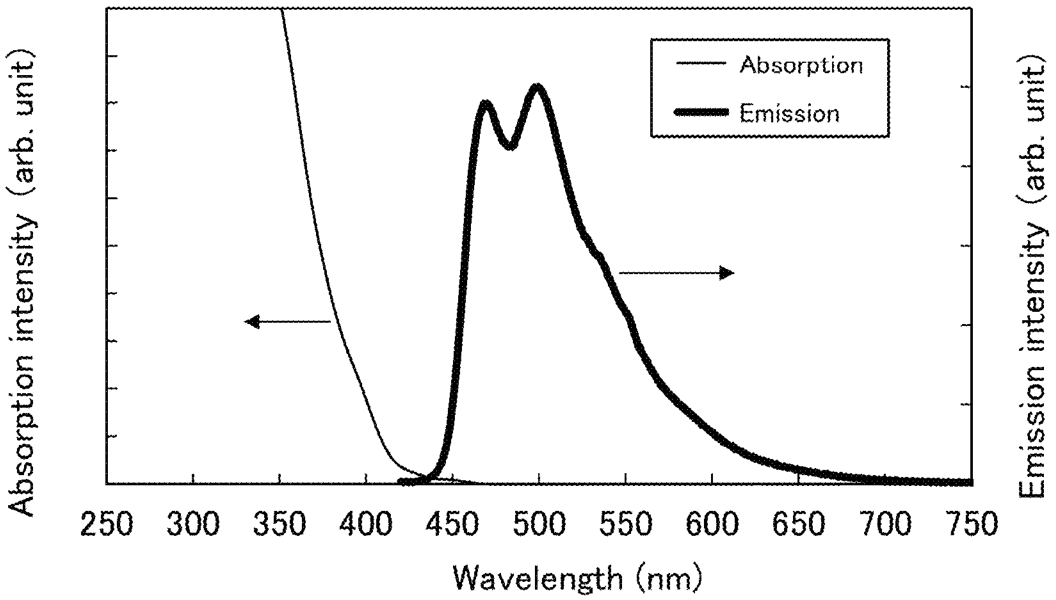
FIG. 76 is a graph showing an absorption spectrum and an emission spectrum of a compound of one embodiment of the present invention.

The absorption and emission spectra of a dichloromethane solution (0.0125 mmol/L) of Ir(mpdCNptz-diPrp)$_3$ were measured. The measurement of the absorption and emission spectra was performed in a manner similar to that described in Example 1. FIG. 76 shows measurement results of the absorption and emission spectra. The horizontal axis represents wavelength and the vertical axes represent absorption intensity and emission intensity. Note that the absorption spectrum in FIG. 76 is a result obtained by subtraction of a measured absorption spectrum of only dichloromethane that was put in a quartz cell from the measured absorption spectrum of the dichloromethane solution (0.0125 mmol/L) in a quartz cell.

As shown in FIG. 76, blue light emission having emission peaks at 470 nm and 499 nm was observed from the dichloromethane solution of Ir(mpdCNptz-diPrp)$_3$.

Next, Ir(mpdCNptz-diPrp)$_3$ obtained in this example was subjected to mass spectrometric (MS) analysis by liquid chromatography mass spectrometry (LC/MS).

In the LC/MS, liquid chromatography (LC) separation was carried out with ACQUITY UPLC (produced by Waters Corporation) and mass spectrometry (MS) was carried out with Xevo G2 Tof MS (produced by Waters Corporation). ACQUITY UPLC BEH C8 (2.1×100 mm, 1.7 m) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that Ir(mpdCNptz-diPrp)$_3$ was dissolved in chloroform at a given concentration and the mixture was diluted with acetonitrile. The injection amount was 5.0 μL.

In the LC separation, a gradient method in which the composition of mobile phases is changed was employed.

The ratio of Mobile Phase A to Mobile Phase B was 80:20 for 0 to 1 minute after the start of the measurement, and then the composition was changed such that the ratio of Mobile Phase A to Mobile Phase B after 10 minutes from the start of the measurement was 95:5. The composition was changed linearly.

In the MS analysis, ionization was carried out by an electrospray ionization (ESI) method. At this time, the capillary voltage and the sample cone voltage were set to 3.0 kV and 30 V, respectively, and detection was performed in a positive mode. A component with m/z of 1526.62 which underwent the ionization under the above-described conditions was collided with an argon gas in a collision cell to dissociate into product ions. Energy (collision energy) for the collision with argon was 50 eV. The mass range for the measurement was m/z=100 to 2000. The detection result of the dissociated product ions by time-of-flight (TOF) MS are shown in FIG. 77.

Figure 77:
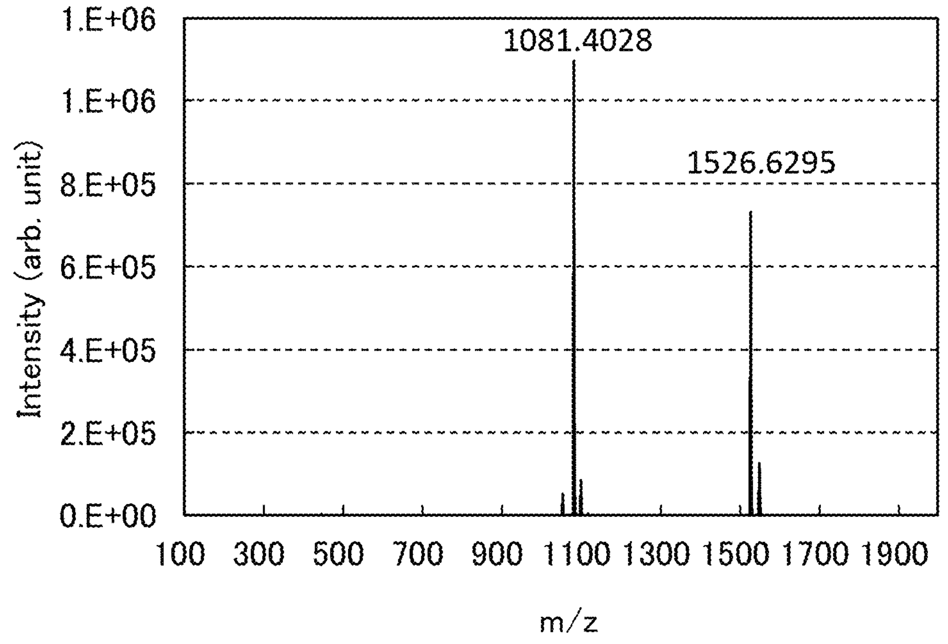
FIG. 77 is a graph showing the liquid chromatography mass spectrometry of a compound of one embodiment of the present invention.

FIG. 77 shows that product ions of Ir(mpdCNptz-diPrp)$_3$ are mainly detected around m/z=1081. The results in FIG. 77 show characteristics derived from Ir(mpdCNptz-diPrp)$_3$ and therefore can be regarded as important data for identifying Ir(mpdCNptz-diPrp)$_3$ contained in a mixture.

It is presumed that the product ion around m/z=1081 is a cation in a state where the ligand HmpdCNptz-diPrp is eliminated from Ir(mpdCNptz-diPrp)$_3$, and this is characteristic of Ir(mpdCNptz-diPrp)$_3$.

The electrochemical characteristics (oxidation reaction characteristics and reduction reaction characteristics) of Ir(mpdCNptz-diPrp)$_3$ were examined by cyclic voltammetry (CV). Note that for the measurement, an electrochemical analyzer (ALS model 600A or 600C, produced by BAS Inc.) was used. Note that a solution in which Ir(mpdCNptz-diPrp)$_3$ is dissolved in chloroform was used for the measurement of oxidation reaction characteristics, and a solution in which Ir(mpdCNptz-diPrp)$_3$ is dissolved in N,N-dimethylformamide (abbreviation: DMF) was used for the measurement of reduction reaction characteristics. In the measurement, the potential of a working electrode with respect to the reference electrode was changed within an appropriate range, so that the oxidation peak potential and the reduction peak potential were obtained. In addition, the HOMO and LUMO levels were obtained from the estimated redox potential of the reference electrode of −4.94 eV and the obtained peak potentials.

According to the CV measurement results, the reduction potential of Ir(mpdCNptz-diPrp)$_3$ was −2.20 V. In addition, the LUMO level of Ir(mpdCNptz-diPrp)$_3$ which was obtained from the CV measurement results was −2.75 eV. The oxidation potential of Ir(mpdCNptz-diPrp)$_3$ was too high to measure the accurate value. Therefore, the HOMO level of Ir(mpdCNptz-diPrp)$_3$ obtained from the CV measurement result is low, which is estimated to be −6 eV or lower.

Example 12

Synthesis Example 9

In this example, a method for synthesizing tris{2-[5-(5-cyano-2-methylphenyl)-4-(2,6-diisopropylphenyl)-4H-1,2,4-triazol-3-yl-κN$^2$]phenyl-κC}iridium(III) (abbreviation: Ir(mCNpptz-diPrp)$_3$), which is an organometallic complex of one embodiment of the present invention represented by Structural Formula (129) in Embodiment 2 is described. The structure of Ir(mCNpptz-diPrp)$_3$ is shown below.

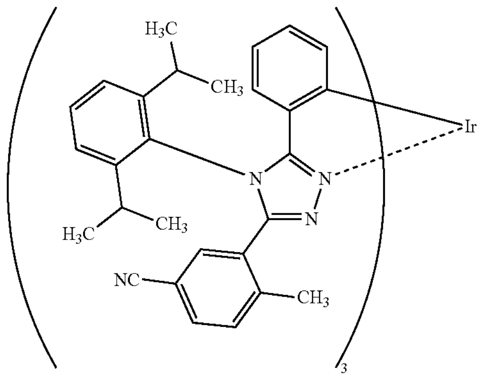

Ir(mCNpptz-diPrp)$_3$

Step 1: Synthesis of N-5-bromo-2-methylbenzoyl-N'-benzoylhydrazide

Into a 500 mL three-neck flask were put 15 g (107 mmol) of benzoylhydrazide and 75 mL of N-methyl-2-pyrrolidinone (NMP), and the mixture was stirred under a nitrogen stream while being cooled with ice. A mixed solution of 25 g (107 mmol) of 5-bromo-2-methylbenzoyl chloride and 32 mL of NMP was slowly dropped into this mixed solution, and stirring was performed for 23 hours to be reacted. After the reaction, this reacted solution was slowly added to 500 mL of water, so that a solid was precipitated. The precipitated solid was subjected to ultrasonic cleaning in which water and 1M hydrochloric acid were used alternately. Then, ultrasonic cleaning was performed using ethanol, whereby 33 g of a white solid was obtained in a yield of 92%. The obtained white solid was identified as N-5-bromo-2-methylbenzoyl-N'-benzoylhydrazide by nuclear magnetic resonance (NMR) spectroscopy. The synthesis scheme of Step 1 is shown in (a-7) below.

(a-7)

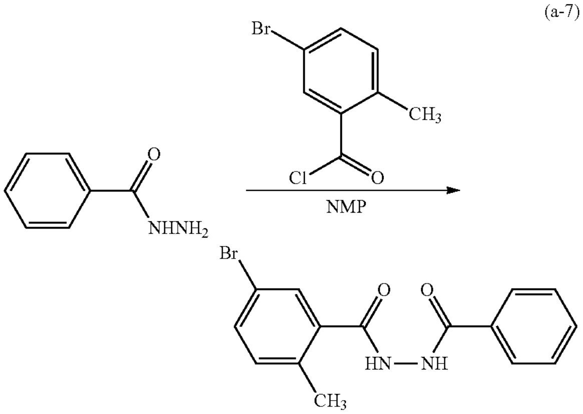

Step 2: Synthesis of N-chloro-5-bromo-2-methylphenylmethylidene-N'-chlorophenylmethylidenehydrazone Into a 1000 mL three-neck flask were put 27 g (80 mmol) of N-5-bromo-2-methylbenzoyl-N'-benzoylhydrazide synthesized in Step 1 and 500 mL of toluene. To this mixed solution, 50 g (240 mmol) of phosphorus pentachloride was added, and the mixture was heated and stirred at 120° C. for 8 hours to be reacted. After the reaction, the reacted solution was slowly added to 500 mL of water, and the mixture was stirred at room temperature for 30 minutes. An aqueous layer and an organic layer of this mixture were separated, and the aqueous layer was subjected to extraction with toluene. The obtained solution of the extract and the organic layer were collected, and the organic layer was slowly added to 400 mL of a 1M sodium hydroxide aqueous solution and the mixture was stirred at room temperature for 30 minutes. An aqueous layer and an organic layer of this mixture were separated, and the aqueous layer was subjected to extraction with toluene. The obtained solution of the extract was washed with a saturated aqueous solution of sodium hydrogen carbonate and then with saturated saline. After the washing, anhydrate magnesium sulfate was added to the solution for drying, and the resulting mixture was subjected to gravity filtration to give a filtrate. The obtained filtrate was concentrated to give a solid. Hexane was added to the obtained solid, and the mixture was irradiated with ultrasonic waves and then subjected to suction filtration to give 22 g of a yellow solid in a yield of 75%. The obtained yellow solid was identified as N-chloro-5-bromo-2-methylphenylmethylidene-N'-chlorophenylmethylidenehydrazone by nuclear magnetic resonance (NMR) spectroscopy. The synthesis scheme of Step 2 is shown in (b-7) below.

(b-7)

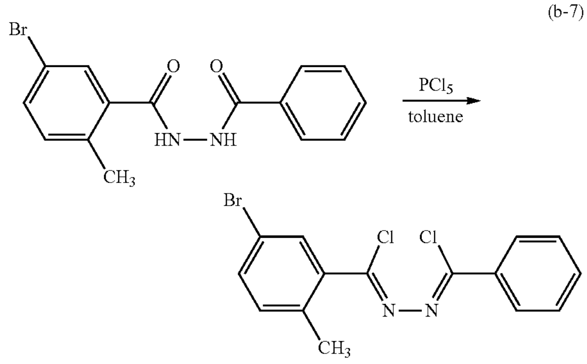

Step 3: Synthesis of 3-(5-bromo-2-methylphenyl)-4-(2,6-diisopropylphenyl)-5-phenyl-4H-1,2,4-triazole Into a 500 mL three-neck flask were put 22 g (66 mmol) of N-chloro-5-bromo-2-methylphenylmethylidene-N'-chlorophenylmethylidenehydrazone synthesized in Step 2, 35 g (199 mmol) of 2,6-diisopropylaniline, and 200 mL of N,N-dimethylaniline, and the mixture was stirred under a nitrogen stream at 160° C. for 11.5 hours to be reacted. After the reaction, the reacted solution was added to 500 mL of 3M hydrochloric acid and stirring was performed for 1 hour, and an organic layer and an aqueous layer were separated. The aqueous layer was subjected to extraction with ethyl acetate. The organic layer and the obtained solution of the extract were combined, and washed with a saturated aqueous solution of sodium hydrogen carbonate and then with saturated saline. Then, anhydrous magnesium sulfate was added to the solution for drying. The obtained mixture was subjected to gravity filtration, and the filtrate was concentrated to give an oily substance. The obtained oily substance was purified by silica column chromatography. As a developing solvent, a 5:1 toluene-ethyl acetate mixed solvent was used. The obtained fraction was concentrated to give a solid. The obtained solid was recrystallized from ethyl acetate/hexane to give 13 g of a white solid in a yield of 42%. The obtained white solid was identified as 3-(5-bromo-2-methylphenyl)-4-(2,6-diisopropylphenyl)-5-phenyl-4H-1,2,4-triazole by nuclear magnetic resonance (NMR) spectroscopy. The synthesis scheme of Step 3 is shown in (c-7) below.

(c-7)

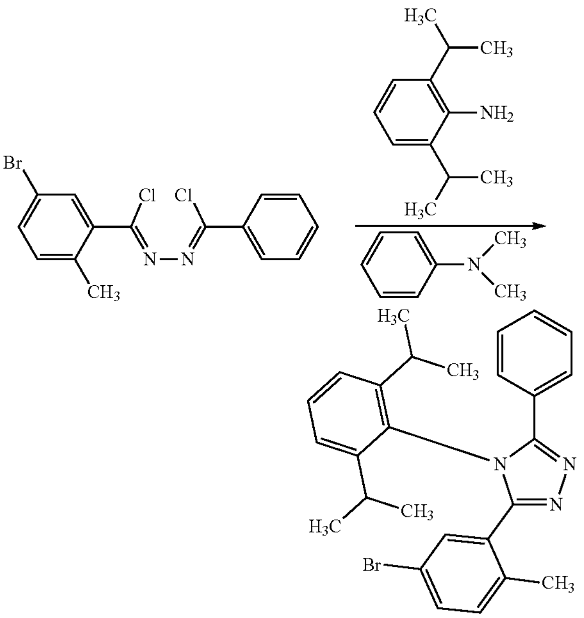

Step 4: Synthesis of 3-(5-cyano-2-methylphenyl)-4-(2,6-diisopropylphenyl)-5-phenyl-4H-1,2,4-triazole (abbreviation: HmCNpptz-diPrp)

Into a 300 mL three-neck flask were put 10 g (21 mmol) of 3-(5-bromo-2-methylphenyl)-4-(2,6-diisopropylphenyl)-5-phenyl-4H-1,2,4-triazole synthesized in Step 3 and 70 mL of N,N-dimethylformamide. To this mixed solution was added 2.8 g (32 mmol) of copper cyanide, and the solution was heated and stirred at 150° C. for 43 hours to be reacted. After the reaction, 100 mL of ammonia water and 100 mL of water were added to this reacted solution and stirring was performed at room temperature for 30 minutes. Chloroform was added to this mixture, and the mixture was subjected to extraction. The obtained solution of the extract was washed with saturated saline twice. After the washing, anhydrous magnesium sulfate was added to the solution for drying, and the resulting mixture was subjected to gravity filtration to give a filtrate. The obtained filtrate was concentrated to give an oily substance. The obtained oily substance was purified by silica column chromatography. As developing solvents, first, a 1:5 ethyl acetate-hexane mixed solvent was used, and then a 1:3 ethyl acetate-hexane mixed solvent was used. The obtained fraction was concentrated to give a solid. The obtained solid was recrystallized from ethyl acetate/hexane to give 1.9 g of a white solid in a yield of 21%. The obtained white solid was identified as 3-(5-cyano-2-methylphenyl)-4-(2,6-diisopropylphenyl)-5-phenyl-4H-1,2,4-triazole (abbreviation: HmCNpptz-diPrp) by nuclear magnetic resonance (NMR) spectroscopy. The synthesis scheme of Step 4 is shown in (d-7) below.

(d-7)

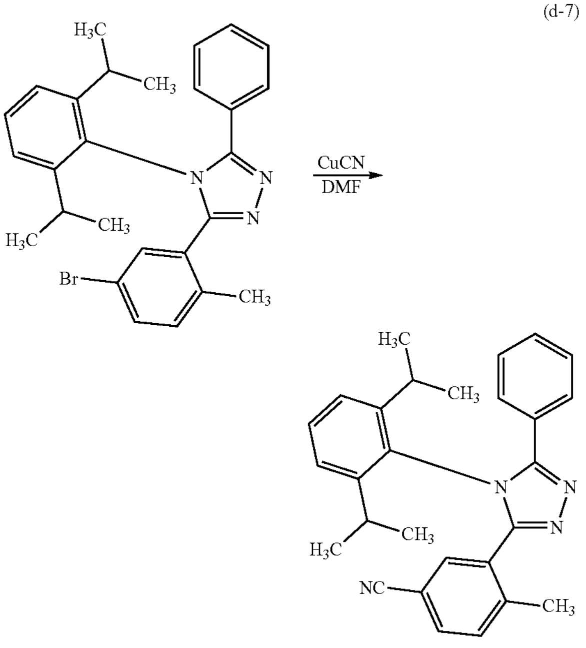

HmCNpptz-diPrp

-continued

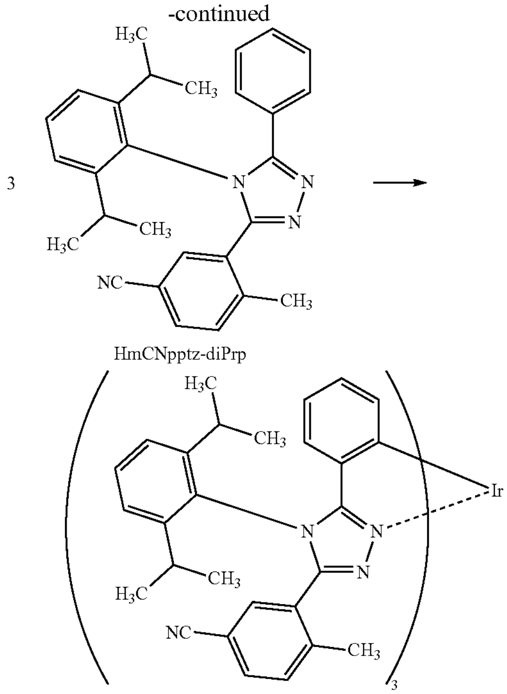

HmCNpptz-diPrp

Ir(mCNpptz-diPrp)3

Step 5: Synthesis of tris{2-[5-(5-cyano-2-methylphenyl)-4-(2,6-diisopropylphenyl)-4H-1,2,4-triazol-3-yl-κ$N^2$]phenyl-κC}iridium(III) (abbreviation: Ir(mCNpptz-diPrp)$_3$)

Into a reaction container provided with a three-way cock were put 1.9 g (4.4 mmol) of HmCNpptz-diPrp synthesized in Step 4 and 0.43 g (0.89 mmol) of tris(acetylacetonato) iridium(III), and the mixture was stirred under an argon stream at 250° C. for 40.5 hours to be reacted. The obtained reaction mixture was added to dichloromethane, and the mixture was subjected to filtration to remove an insoluble matter. The obtained filtrate was concentrated to give a solid. The obtained solid was purified by silica column chromatography. As a developing solvent, first, dichloromethane was used, and then, a 100:3 dichloromethane-ethyl acetate mixed solvent was used. The obtained fraction was concentrated to give a solid. The resulting solid was recrystallized from ethyl acetate/hexane to give 0.27 g of a yellow solid in a yield of 21%. Then, 0.27 g of the obtained yellow solid was purified by a train sublimation method. The purification by sublimation was performed by heating at 310° C. under a pressure of $8.6\times10^{-3}$ Pa for 17 hours. After the purification by sublimation, 0.16 g of a yellow solid was obtained at a collection rate of 61%. The synthesis scheme of Step 5 is shown in (e-7) below.

(e-7)

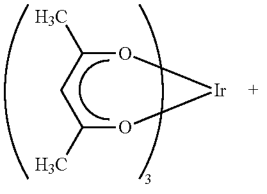

Figure 78:
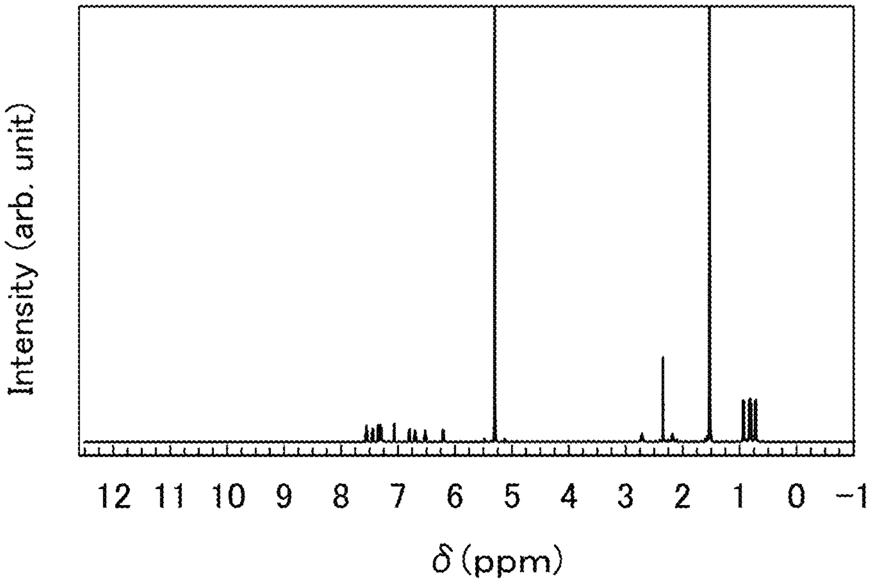
FIG. 78 is an NMR chart of a compound of one embodiment of the present invention.

The protons ($^1$H) of the yellow solid that was obtained in Step 5 was measured by a nuclear magnetic resonance (NMR) spectroscopy. The obtained values are shown below. The $^1$H-NMR chart is shown in FIG. 78. These results reveal that Ir(mCNpptz-diPrp)$_3$, which is the organometallic complex of one embodiment of the present invention represented by Structural Formula (129), was obtained in this synthesis example.

$^1$H-NMR. δ ($CD_2Cl_2$): 0.72 (d, 9H), 0.80-0.83 (m, 18H), 0.93 (d, 9H), 2.15-2.21 (m, 3H), 2.35 (s, 9H), 2.69-2.74 (m, 3H), 6.21 (d, 3H), 6.52 (t, 3H), 6.70 (t, 3H), 6.80 (d, 3H), 7.07 (d, 3H), 7.29-7.31 (m, 6H), 7.34 (d, 3H), 7.45 (d, 3H), 7.56 (t, 3H).

<Characteristics of Ir(mCNpptz-diPrp)$_3$>

Figure 79:
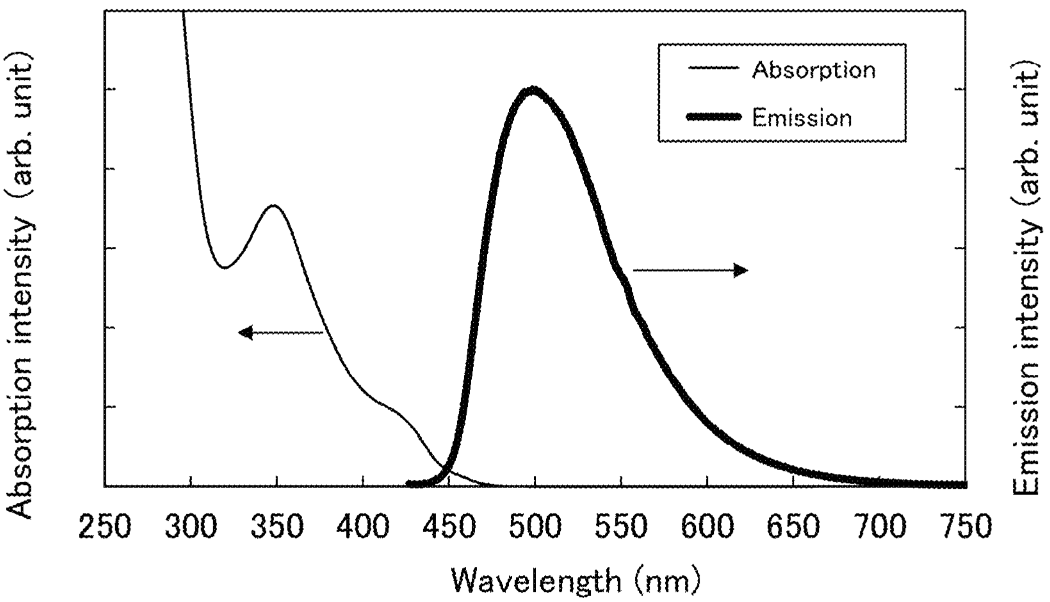
FIG. 79 is a graph showing an absorption spectrum and an emission spectrum of a compound of one embodiment of the present invention.

The absorption and emission spectra of a dichloromethane solution (0.0100 mmol/L) of Ir(mCNpptz-diPrp)$_3$ were measured. The measurement of the absorption and emission spectra was performed in a manner similar to that described in Example 1. FIG. 79 shows measurement results of the absorption and emission spectra. The horizontal axis represents wavelength and the vertical axes represent absorption intensity and emission intensity. Note that the absorption spectrum in FIG. 79 is a result obtained by subtraction of a measured absorption spectrum of only dichloromethane that was put in a quartz cell from the measured absorption spectrum of the dichloromethane solution (0.0100 mmol/L) in a quartz cell.

As shown in FIG. 79, blue green light emission having an emission peak at 499 nm was observed from the dichloromethane solution of Ir(mCNpptz-diPrp)$_3$.

Next, Ir(mCNpptz-diPrp)$_3$ obtained in this example was subjected to mass spectrometric (MS) analysis by liquid chromatography mass spectrometry (LC/MS).

In the LC/MS, liquid chromatography (LC) separation was carried out with ACQUITY UPLC (produced by Waters Corporation) and mass spectrometry (MS) was carried out with Xevo G2 Tof MS (produced by Waters Corporation). ACQUITY UPLC BEH C8 (2.1×100 mm, 1.7 μm) was used as a column for the LC separation, and the column temperature was 40° C. Acetonitrile was used for Mobile Phase A and a 0.1% formic acid aqueous solution was used for Mobile Phase B. Furthermore, a sample was prepared in such a manner that Ir(mCNpptz-diPrp)$_3$ was dissolved in chloroform at a given concentration and the mixture was diluted with acetonitrile. The injection amount was 5.0 μL.

In the LC separation, a gradient method in which the composition of mobile phases is changed was employed. The ratio of Mobile Phase A to Mobile Phase B was 80:20 for 0 to 1 minute after the start of the measurement, and then the composition was changed such that the ratio of Mobile Phase A to Mobile Phase B after 10 minutes from the start of the measurement was 95:5. The ratio was kept the same until the 15th minute. The composition was changed linearly.

In the MS analysis, ionization was carried out by an electrospray ionization (ESI) method. At this time, the capillary voltage and the sample cone voltage were set to 3.0 kV and 30 V, respectively, and detection was performed in a positive mode. A component with m/z of 1451.65 which underwent the ionization under the above-described conditions was collided with an argon gas in a collision cell to dissociate into product ions. Energy (collision energy) for the collision with argon was 50 eV. The mass range for the measurement was m/z=100 to 2000. The detection result of the dissociated product ions by time-of-flight (TOF) MS are shown in FIG. 80.

Figure 80:
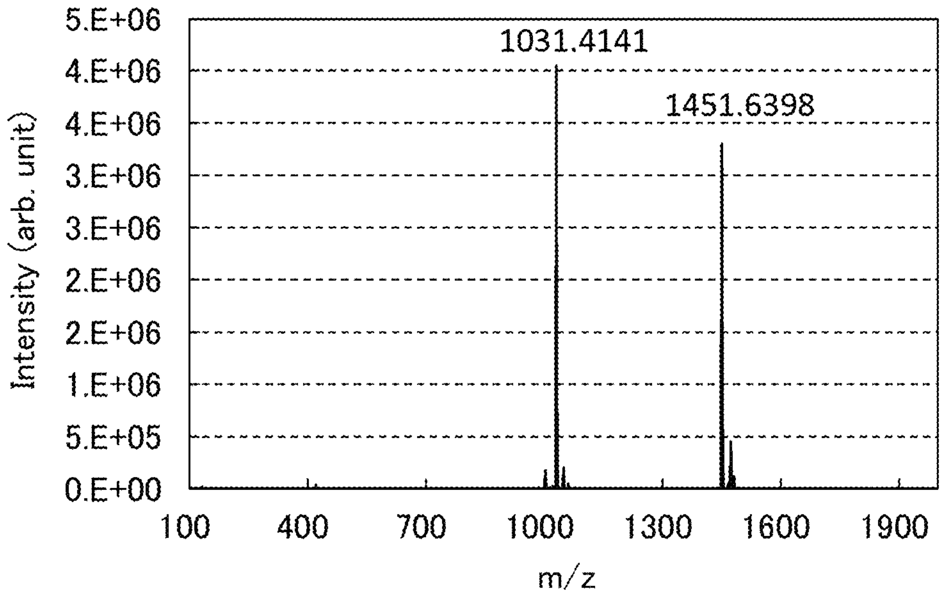
FIG. 80 is a graph showing the liquid chromatography mass spectrometry of a compound of one embodiment of the present invention.

FIG. 80 shows that product ions of Ir(mCNpptz-diPrp)$_3$ are mainly detected around m/z=1031. The results in FIG. 80 show characteristics derived from Ir(mCNpptz-diPrp)$_3$ and therefore can be regarded as important data for identifying Ir(mCNpptz-diPrp)$_3$ contained in a mixture.

It is presumed that the product ion around m/z=1031 is a cation in a state where the ligand HmCNpptz-diPrp is eliminated from Ir(mCNpptz-diPrp)$_3$, and this is characteristic of Ir(mCNpptz-diPrp)$_3$.

The electrochemical characteristics (oxidation reaction characteristics and reduction reaction characteristics) of Ir(mCNpptz-diPrp)$_3$ were examined by cyclic voltammetry (CV). Note that for the measurement, an electrochemical analyzer (ALS model 600A or 600C, produced by BAS Inc.) was used. Note that a solution in which Ir(mCNpptz-diPrp)$_3$ is dissolved in chloroform was used for the measurement of oxidation reaction characteristics, and a solution in which Ir(mCNpptz-diPrp)$_3$ is dissolved in N,N-dimethylformamide (abbreviation: DMF) was used for the measurement of reduction reaction characteristics. In the measurement, the potential of a working electrode with respect to the reference electrode was changed within an appropriate range, so that the oxidation peak potential and the reduction peak potential were obtained. In addition, the HOMO and LUMO levels were obtained from the estimated redox potential of the reference electrode of −4.94 eV and the obtained peak potentials.

According to the CV measurement results, the oxidation potential of Ir(mCNpptz-diPrp)$_3$ was 0.48 V, and the reduction potential thereof was −2.51 V. In addition, the HOMO level and the LUMO level of Ir(mCNpptz-diPrp)$_3$ which were obtained from the CV measurement results were −5.42 eV and −2.43 eV, respectively.

Example 13

Synthesis Example 10

In this example, a synthesis example of tris{4'-cyano-3-[3-methyl-1-(2,4,6-trimethylphenyl)-1H-1,2,4-triazol-5-yl-κN$^4$]-1,1'-biphenyl-4-yl-κC}iridium(III) (abbreviation: Ir(MCN5btz1-tmp)$_3$), which is an organometallic complex of one embodiment of the present invention represented by Structural Formula (130) in Embodiment 2, is described in detail. The structure of Ir(MCN5btz1-tmp)$_3$ is shown below.

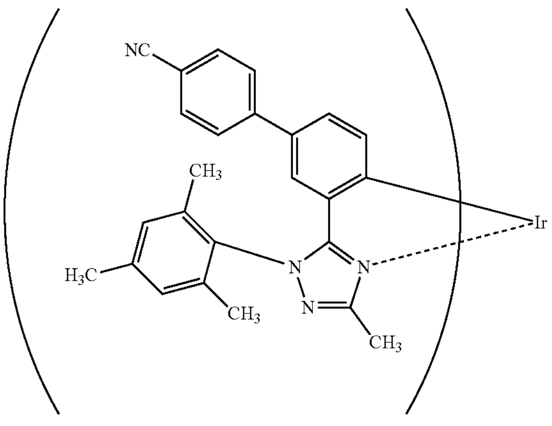

Ir(MCN5btz-tmp)$_3$

Step 1: Synthesis of N-(1-ethoxyethylidene)-3-bromobenzamide

Into a 500 mL three-neck flask were put 10 g (81 mmol) of ethyl acetimidate hydrochloride, 150 mL of toluene, and 20 g (202 mmol) of triethylamine ($Et_3N$), and the mixture was stirred under a nitrogen stream at room temperature for 10 minutes. Then, a mixed solvent of 18 g (81 mmol) of 3-bromobenzoyl chloride and 30 mL of toluene was dropped into this mixture and stirring was performed at room temperature for 24 hours to be reacted. After the reaction, the reacted solution was subjected to suction filtration to remove a solid. The obtained filtrate was concentrated to give 19 g of a yellow oily substance in a yield of 87%. The obtained yellow oily substance was identified as N-(1-ethoxyethylidene)-3-bromobenzamide by nuclear magnetic resonance (NMR) spectroscopy. The synthesis scheme of Step 1 is shown in (a-8) below.

(a-8)

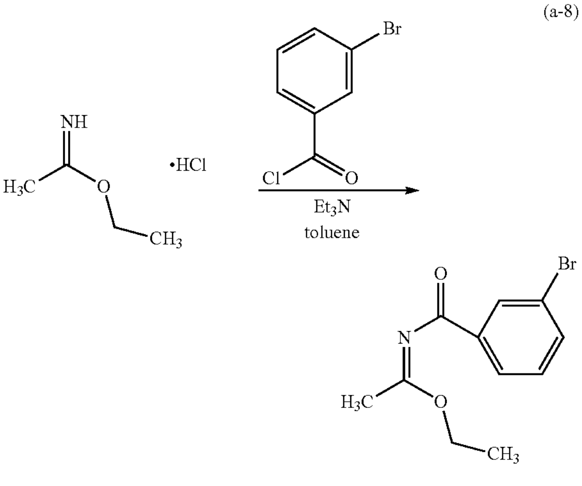

Step 2: Synthesis of 5-(3-bromophenyl)-1-(2,4,6-trimethylphenyl)-3-methyl-1H-1,2,4-triazole Into a 500 mL three-neck flask were put 13 g (70 mmol) of 2,4,6-trimethylphenyl hydrazine hydrochloride and 140 mL of carbon tetrachloride, 14 g (140 mmol) of triethylamine($Et_3N$) was added to this mixture, and the mixture was stirred at room temperature for one hour. Then, 19 g (70 mmol) of N-(1-ethoxyethylidene)-3-bromobenzamide synthesized in Step 1 was added, under a nitrogen stream, and the mixture was stirred at room temperature for 17 hours to be reacted. After the reaction, water was added to the reacted solution, an organic layer and an aqueous layer were separated, and the aqueous layer was subjected to extraction with chloroform. The obtained solution of the extract and the organic layer were combined and washed with water and saturated brine. Anhydrous magnesium sulfate was added to the organic layer for drying. The obtained mixture was subjected to gravity filtration, and the filtrate was concentrated to give an oily substance. The obtained oily substance was purified by silica column chromatography. As developing solvents, first, dichloromethane was used, and then a mixed solvent of dichloromethane and ethyl acetate in a ratio of 9:1 (v:v) dichloromethane-ethyl acetate was used. The resulting fraction was concentrated to give 16 g of a yellow oily substance in a yield of 65%. The obtained yellow oily substance was identified as 5-(3-bromophenyl)-1-(2,4,6-trimethylphenyl)-3-methyl-1H-1,2,4-triazole by nuclear magnetic resonance (NMR) spectroscopy. The synthesis scheme of Step 2 is shown in (b-8) below.

(b-8)

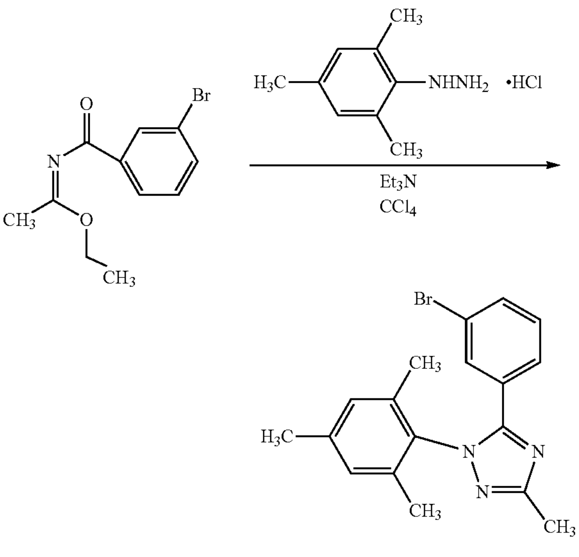

Step 3: Synthesis of Tris[3-bromo-2-{1-(2,4,6-trimethylphenyl)-3-methyl-1H-1,2,4-triazol-5-yl-κ$N^4$}phenyl-κC]iridium(III)

Into a reaction container provided with a three-way cock were put 5.2 g (14 mmol) of 5-(3-bromophenyl)-1-(2,4,6-trimethylphenyl)-3-methyl-1H-1,2,4-triazole synthesized in Step 2 and 1.4 g (2.9 mmol) of tris(acetylacetonato)iridium (III), and the mixture was heated at 250° C. for 42 hours to be reacted. After the reaction, the reaction mixture was purified by silica column chromatography. As a developing solvent, a mixed solvent of dichloromethane and ethyl acetate in a ratio of 40:1 (v:v) was used. The obtained fraction was concentrated to give a solid. This solid was recrystallized from ethyl acetate/hexane, so that 0.77 g of a yellow solid was obtained in a yield of 22%. The obtained yellow solid was identified as tris[3-bromo-2-{1-(2,4,6-trimethylphenyl)-3-methyl-1H-1,2,4-triazol-5-yl-κ$^4$}phenyl-κC]iridium(III) by nuclear magnetic resonance (NMR) spectroscopy. The synthesis scheme of Step 3 is shown in (c-8) below.

(c-8)

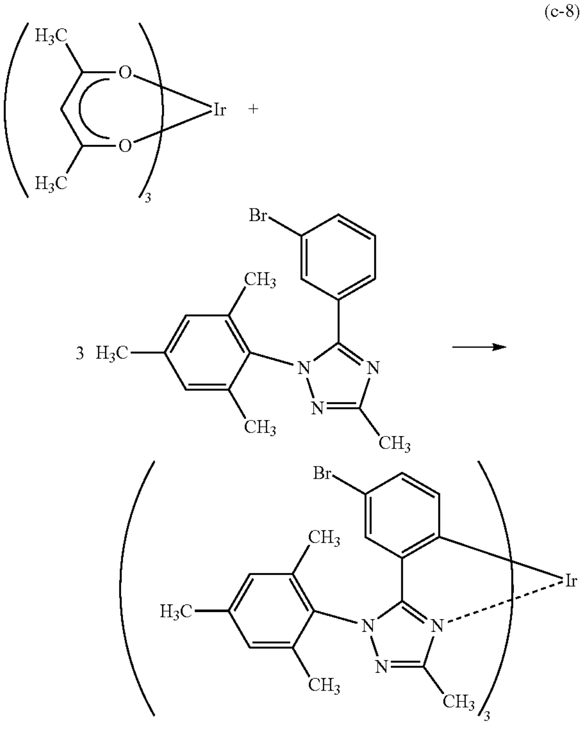

Step 4: Synthesis of tris{4'-cyano-3-[3-methyl-1-(2,4,6-trimethylphenyl)-1H-1,2,4-triazol-5-yl-κ$N^4$]-1,1'-biphenyl-4-yl-κC}iridium(III) (abbreviation: $Ir(MCN5btz1\text{-}tmp)_3$)

Into a 100 mL three-neck flask were put 0.76 g (0.61 mmol) of tris[3-bromo-2-{1-(2,4,6-trimethylphenyl)-3-methyl-1H-1,2,4-triazol-5-yl-κ$N^4$}phenyl-κC]iridium(III) synthesized in Step 3, 0.54 g (3.67 mmol) of 4-cyanophenylboronic acid, 68 mg (0.15 mmol) of 2-dicyclohexylphosphino-2',6'-dimethoxybiphenyl (S-phos), and 0.59 g (0.15 mmol) of potassium phosphate, and 40 mL of toluene and 5 mL of water were added to this mixture. The atmosphere in the flask was replaced with nitrogen. To this mixture was added 42 mg (0.073 mmol) of bis(dibenzylideneacetone) palladium(0), and the mixture was heated at 90° C. for 18 hours. To this mixture were added 64 mg (0.15 mmol) of 2-dicyclohexylphosphino-2',6'-dimethoxybiphenyl (S-phos) and 42 mg (0.073 mmol) of bis(dibenzylideneacetone)palladium(0), and the mixture was heated at 90° C. for 3.5 hours. Then, the aqueous layer of the obtained mixture was subjected to extraction with toluene, and the obtained solution of the extract and the organic layer were combined and washed with water and saturated saline. Anhydrous magnesium sulfate was added to the organic layer for drying. The obtained mixture was subjected to gravity filtration, and the filtrate was concentrated to give a solid. This solid was purified by silica column chromatography. As a developing solvent, a mixed solvent of dichloromethane and ethyl acetate in a ratio of 10:1 (v:v) was used. The obtained fraction was concentrated to give a solid. This solid was recrystallized from ethyl acetate/hexane, so that 0.146 g of a yellow solid was obtained in a yield of 18%. The obtained yellow solid was identified as tris{4'-cyano-3-[3-methyl-1-(2,4,6-trimethylphenyl)-1H-1,2,4-triazol-5-yl-κ$N^4$]-1,1'-biphenyl-4-yl-κC}iridium(III) (abbreviation: Ir(MCN5btz1-tmp)$_3$) by nuclear magnetic resonance (NMR) spectroscopy. The synthesis scheme of Step 4 is shown in (d-8) below.

Figure 82:
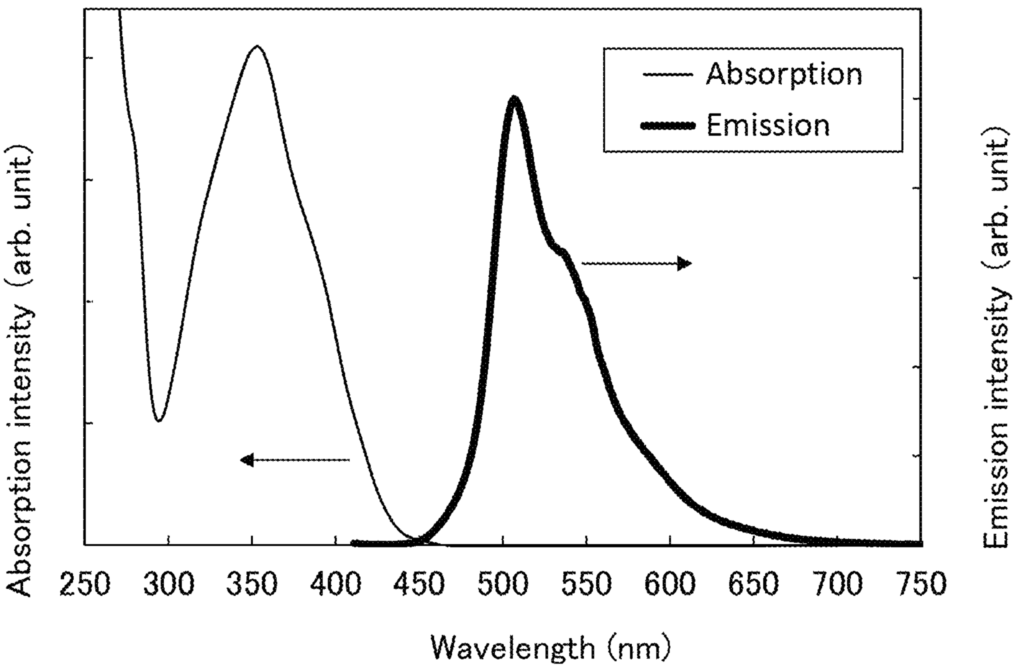
FIG. 82 is a graph showing an absorption spectrum and an emission spectrum of a compound of one embodiment of the present invention.

As shown in FIG. 82, green light emission having emission peaks at 506 nm and 541 nm was observed from the dichloromethane solution of Ir(MCN5btz1-tmp)$_3$.

Example 14

Synthesis Example 11

In this example, a synthesis example of t tris{4'-cyano-2',6'-dimethyl-3-[3-methyl-1-(2,4,6-trimethylphenyl)-1H-1,2,4-triazol-5-yl-κ$N^4$]-1,1'-biphenyl-4-yl-κC}iridium(III)

(d-8)

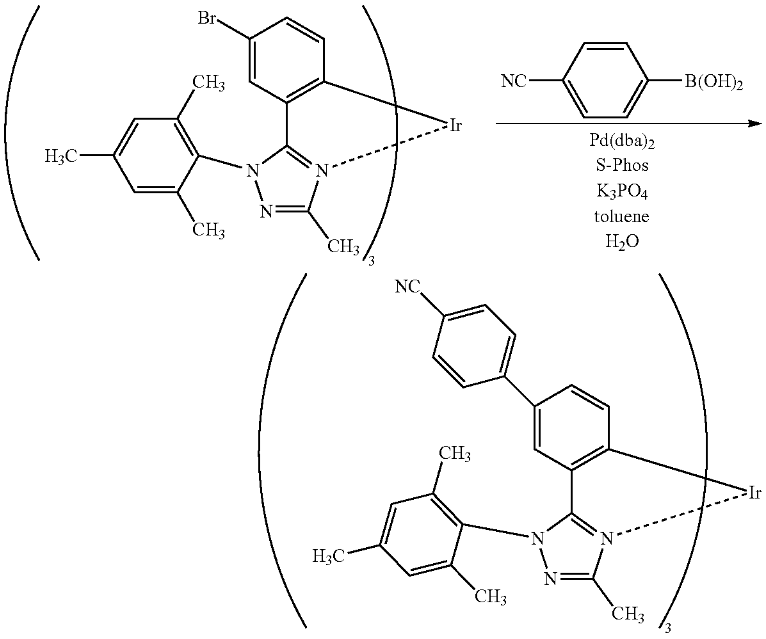

Ir(MCN5btz1-tmp)$_3$

Figure 81:
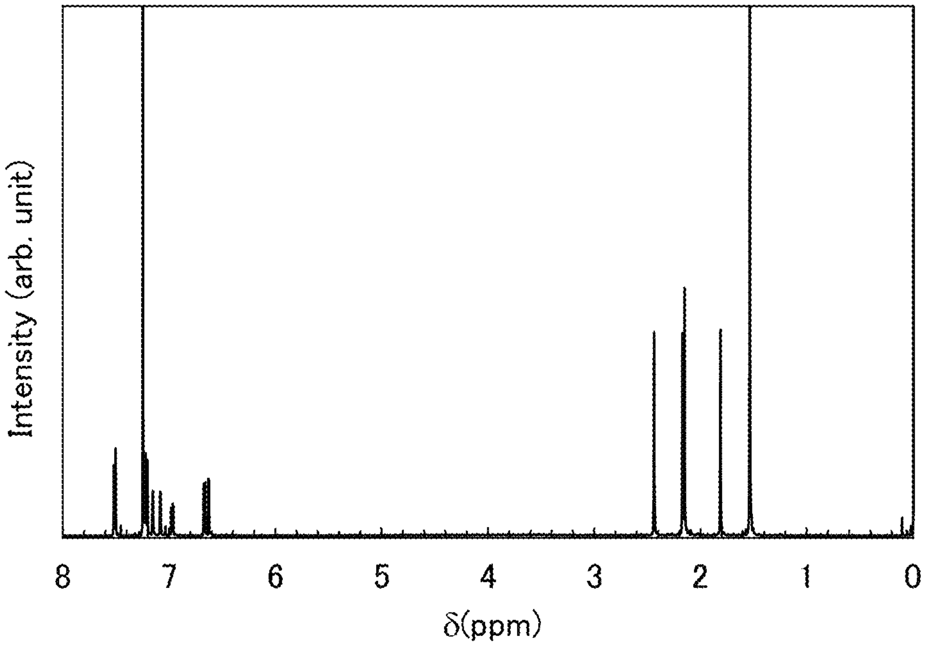
FIG. 81 is an NMR chart of a compound of one embodiment of the present invention.

Measurement was performed on the protons ($^1$H) of the yellow solid that was obtained in Step 4 by nuclear magnetic resonance (NMR) spectroscopy. The obtained values are shown below. The $^1$H-NMR chart is shown in FIG. 81. These results revealed that the organometallic complex Ir(MCN5btz1-tmp)$_3$, which is one embodiment of the present invention represented by Structural Formula (130), was obtained in Synthesis example 10.

$^1$H-NMR δ ($CDCl_3$): 1.8 (s, 9H), 2.15 (s, 9H), 2.17 (s, 9H), 2.44 (s, 9H), 6.62 (d, 3H), 6.67 (d, 3H), 6.97 (dd, 3H), 7.08 (s, 3H), 7.15 (s, 3H), 7.21 (d, 6H), 7.51 (d, 6H).

<Characteristics of Ir(MCN5btz1-tmp)$_3$>

The absorption and emission spectra of a dichloromethane solution (0.0029 mmol/L) of Ir(MCN5btz1-tmp)$_3$ were measured. The measurement of the absorption and emission spectra was performed in a manner similar to that described in Example 1. FIG. 82 shows measurement results of the absorption and emission spectra. The horizontal axis represents wavelength and the vertical axes represent absorption intensity and emission intensity. Note that the absorption spectrum in FIG. 82 is a result obtained by subtraction of a measured absorption spectrum of only dichloromethane that was put in a quartz cell from the measured absorption spectrum of the dichloromethane solution in a quartz cell.

(abbreviation: Ir(MdmCN5btz1-tmp)$_3$), which is an organometallic complex of one embodiment of the present invention represented by Structural Formula (131) in Embodiment 2, is described in detail. The structure of Ir(MdmCN5btz1-tmp)$_3$ is shown below.

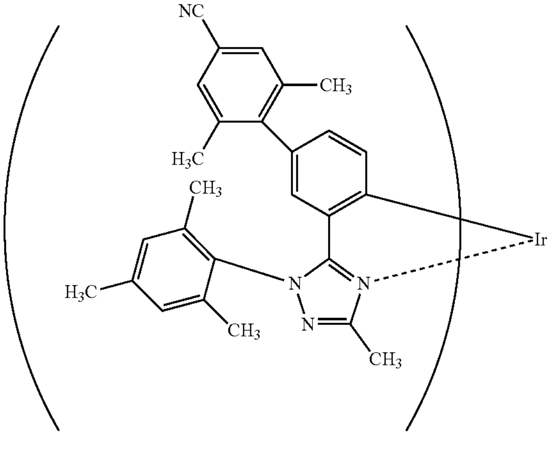

Ir(MdmCN5btz1-tmp)$_3$

Step 1: Synthesis of 4-cyano-2,6-dimethylphenylboronic Acid Pinacol Ester

First, 5.0 g (24 mmol) of 4-bromo-3,5-dimethylbenzonitrile, 7.3 g (29 mmol) of bis(pinacolato)diboron, 8.4 g (86 mmol) of potassium acetate, and 120 mL of dimethyl sulfoxide (DMSO) were put into a three-neck flask, and the atmosphere in the flask was replaced with nitrogen. To this mixture were added 0.20 g (0.24 mmol) of [1,1'-bis(diphenylphosphino)ferrocene]palladium(II) dichloromethane adduct and 0.20 g (0.48 mmol) of 2-dicyclohexylphosphino-2',6'-dimethoxybiphenyl (S-phos), and the mixture was heated and stirred at 90° C. for 7 hours. To this mixture were further added 0.20 g (0.24 mmol) of [1,1'-bis(diphenylphosphino)ferrocene]palladium(II) dichloromethane adduct, 0.20 g (0.48 mmol) of 2-dicyclohexylphosphino-2',6'-dimethoxybiphenyl (S-phos), and 3.5 g (14 mmol) of bis(pinacolato)diboron were further added to, and the mixture was heated and stirred at 100° C. for 17 hours to be reacted. Water was added to the reacted solution to separate the solution into an organic layer and an aqueous layer, and the aqueous layer was subjected to extraction with toluene. A solution obtained by combining the organic layer and the solution of the extract was washed with water and saturated saline, and anhydrous magnesium sulfate was added thereto for drying. The obtained mixture was subjected to gravity filtration, and the filtrate was concentrated to give a solid. This solid was purified by flash column chromatography. As developing solvents, first, a mixed solvent of toluene and ethyl acetate in a ratio of 10:1 (v:v) was used, and then a mixed solvent of toluene and ethyl acetate in a ratio of 5:1 (v:v) was used. The obtained fraction was concentrated to give a solid. This solid was washed with toluene and hexane, so that 3.5 g of a white solid was obtained in a yield of 57%. The obtained white solid was identified as 4-cyano-2,6-dimethylphenylboronic acid pinacol ester by nuclear magnetic resonance (NMR) spectroscopy. The synthesis scheme of Step 1 is shown in (a-9) below.

(a-9)

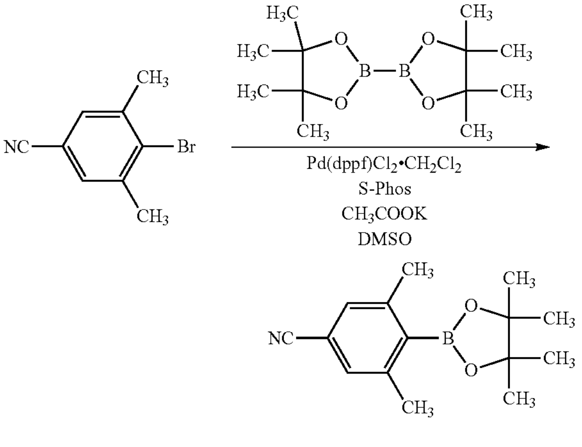

Step 2: Synthesis of 5-(4'-cyano-2',6'-dimethyl-1,1'-biphenyl-3-yl)-3-methyl-1-(2,4,6-trimethylphenyl)-1H-1,2,4-triazole (abbreviation: HMdmCN5btz1-tmp)

Into a three-neck flask were put 4.0 g (11 mmol) of 5-(3-bromophenyl)-1-(2,4,6-trimethylphenyl)-3-methyl-1H-1,2,4-triazole obtained in Step 2 of Synthesis example 10, 3.2 g (12 mmol) of 4-cyano-2,6-dimethylphenylboronic acid pinacol ester obtained in Step 1, 4.1 g (20 mmol) of potassium phosphate, 75 mL of toluene, and 7 mL of water. The atmosphere in the flask was replaced with nitrogen. To this mixture were added 0.26 g (0.45 mmol) of bis(dibenzylideneacetone)palladium(0) and 0.37 g (0.90 mmol) of 2-dicyclohexylphosphino-2',6'-dimethoxybiphenyl (S-phos), and the mixture was heated and stirred at 90° C. for 7.5 hours to be reacted. After the reaction, an organic layer and an aqueous layer of the obtained reacted solution were separated, the aqueous layer was subjected to extraction with toluene, and the solution of the extract and the organic layer were combined and washed with water and saturated saline. Anhydrous magnesium sulfate was added to the organic layer for drying. The obtained mixture was subjected to gravity filtration, and the filtrate was concentrated to give an oily substance. This oily substance was purified by flash column chromatography. As developing solvents, toluene was used, and then ethyl acetate was added to increase the polarity such that the ratio of toluene:ethyl acetate=4:1. The obtained fraction was concentrated to give a solid. This solid was washed with ethanol, so that 3.9 g of a white solid was obtained in a yield of 85%. The obtained white solid was identified as 5-(4'-cyano-2',6'-dimethyl-1,1'-biphenyl-3-yl)-3-methyl-1-(2,4,6-trimethylphenyl)-1H-1,2,4-triazole (abbreviation: HMdmCN5btz1-tmp) by nuclear magnetic resonance (NMR) spectroscopy. The synthesis scheme of Step 2 is shown in (b-9) below.

(b-9)

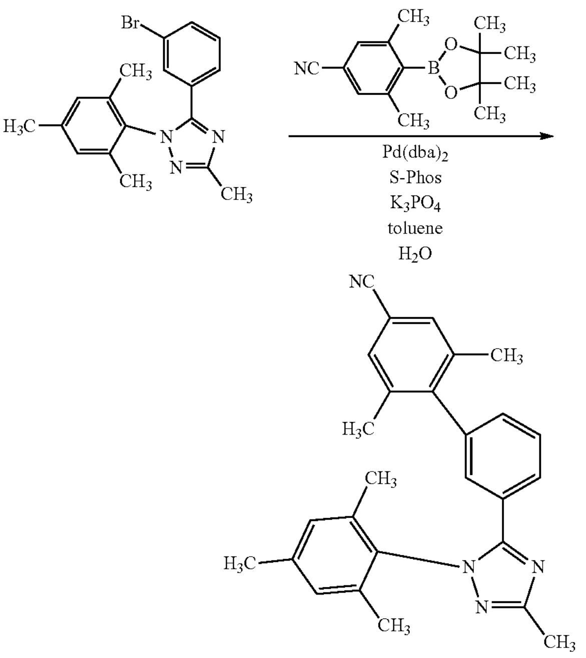

HMdmCN5btz1-tmp

Step 3: Synthesis of tris{4'-cyano-2',6'-dimethyl-3-[3-methyl-1-(2,4,6-trimethylphenyl)-1H-1,2,4-triazol-5-yl-κ$N^4$]-1,1'-biphenyl-4-yl-κC}iridium(III) (abbreviation: Ir(MdmCN5btz1-tmp)$_3$)

Into a 50 mL recovery flask were put 1.0 g (2.5 mmol) of a ligand HMdmCN5btz1-tmp obtained in Step 2, 0.33 g (1.1 mmol) of iridium chloride hydrate, 15 mL of 2-ethoxyethanol, and 5 mL of water. The atmosphere in the flask was replaced with argon. This flask was heated by irradiation with microwaves under conditions of 100 W and 100° C. for one hour to cause a reaction. After the reaction, the reacted solution was concentrated to give a yellow oily substance. To this oily substance were added 0.58 g (2.2 mmol) of silver trifluoromethanesulfonate and 2.28 g (5.61 mmol) of a ligand HMdmCN5btz1-tmp. The atmosphere in the flask was replaced with nitrogen, and the mixture was heated and stirred at 165° C. for 23 hours. After the reaction, the reaction mixture was dissolved in dichloromethane, and the mixture was subjected to suction filtration to remove an insoluble solid. The resulting filtrate was purified by silica column chromatography. As a developing solvent, a mixed solvent of dichloromethane and ethyl acetate in a ratio of 5:1 (v:v) was used. The obtained fraction was concentrated to give a solid. This solid was recrystallized from ethyl acetate/hexane, so that 8 mg of a yellow solid was obtained in a yield of 0.5%. The obtained yellow solid was identified as tris{4'-cyano-2',6'-dimethyl-3-[3-methyl-1-(2,4,6-trimethylphenyl)-1H-1,2,4-triazol-5-yl-κ$N^4$]-1,1'-biphenyl-4-yl-κC}iridium(III) (abbreviation: $Ir(MdmCN5btz1\text{-}tmp)_3$) by nuclear magnetic resonance (NMR) spectroscopy. The synthesis scheme of Step 3 is shown in (c-9) below.

(c-9)

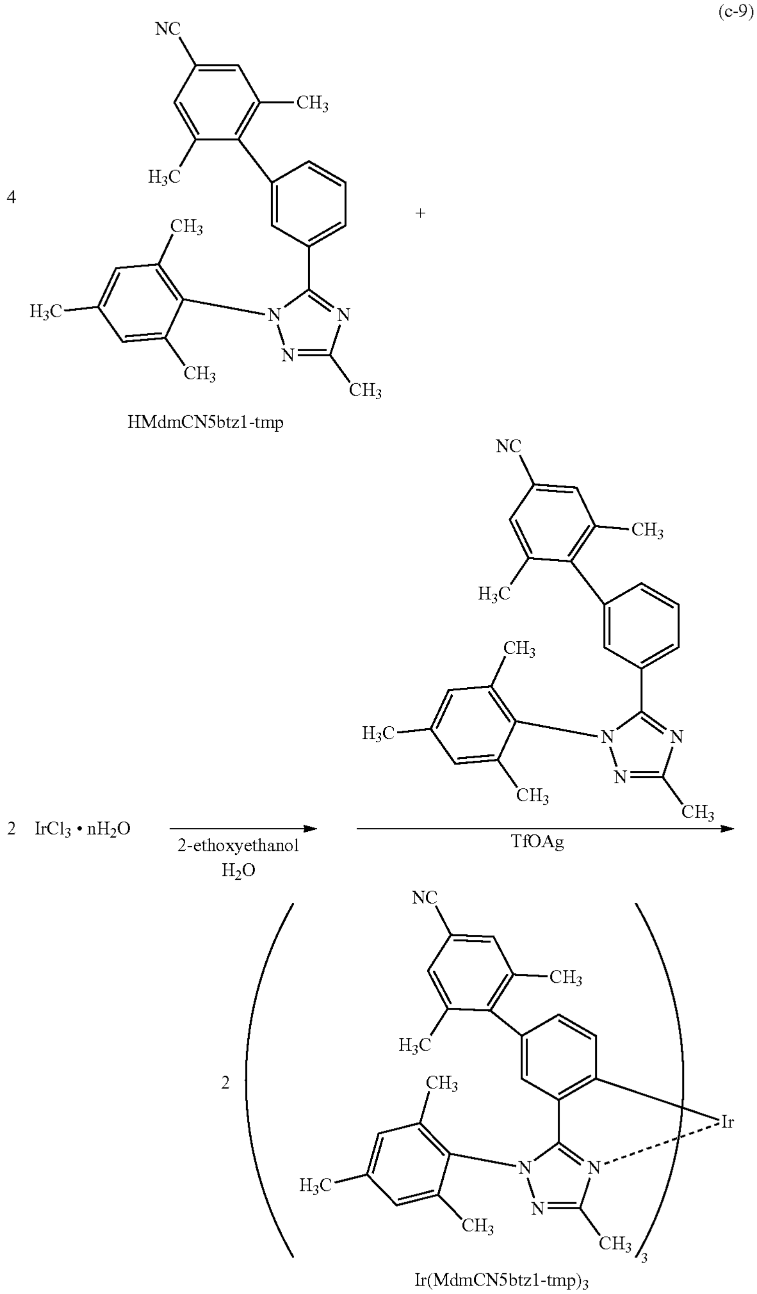

Figure 83:
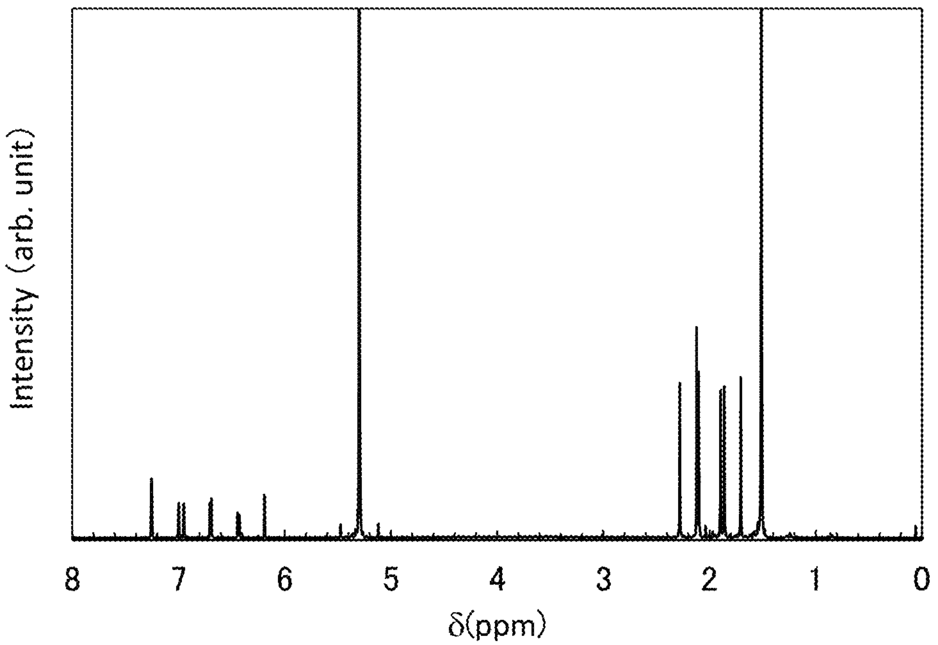
FIG. 83 is an NMR chart of a compound of one embodiment of the present invention.

Measurement was performed on the protons ($^1H$) of the yellow solid that was obtained in Step 3 by nuclear magnetic resonance (NMR) spectroscopy. The obtained values are shown below. The $^1$H-NMR chart is shown in FIG. 83. These results revealed that the organometallic complex Ir(MdmCN5btz1-tmp)$_3$, which is one embodiment of the present invention represented by Structural Formula (131), was obtained in Synthesis example 11.

$^1$H-NMR δ ($CD_2Cl_2$): 1.71 (s, 9H), 1.86 (s, 9H), 1.90 (s, 9H), 2.10 (s, 9H), 2.12 (s, 9H), 2.28 (s, 9H), 6.19 (d, 3H), 6.44 (dd, 3H), 6.70 (d, 3H), 6.95 (s, 3H), 7.00 (s, 3H), 7.25 (s, 6H).

<Characteristics of Ir(MdmCN5btz1-tmp)$_3$>

Figure 84:
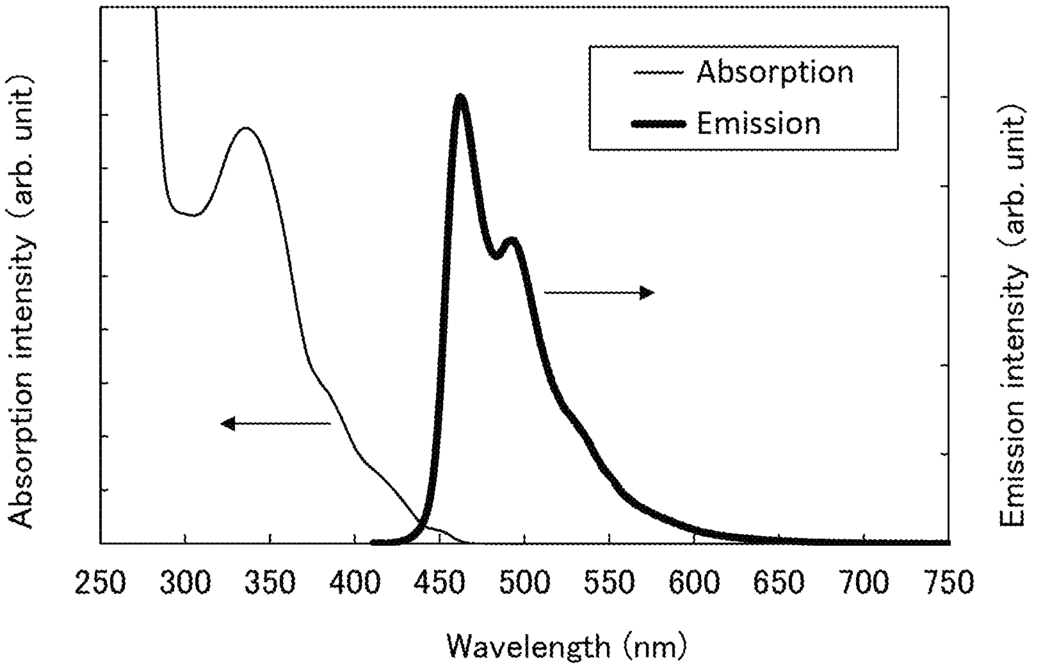
FIG. 84 is a graph showing an absorption spectrum and an emission spectrum of a compound of one embodiment of the present invention.

The absorption and emission spectra of a dichloromethane solution (0.014 mmol/L) of Ir(MdmCN5btz1-tmp)$_3$ were measured. The measurement of the absorption and emission spectra was performed in a manner similar to that described in Example 1. FIG. 84 shows measurement results of the absorption and emission spectra. The horizontal axis represents wavelength and the vertical axes represent absorption intensity and emission intensity. Note that the absorption spectrum in FIG. 84 is a result obtained by subtraction of a measured absorption spectrum of only dichloromethane that was put in a quartz cell from the measured absorption spectrum of the dichloromethane solution in a quartz cell.

As shown in FIG. 84, blue light emission having emission peaks at 462 nm and 490 nm was observed from the dichloromethane solution of Ir(MdmCN5btz1-tmp)$_3$.

The electrochemical characteristics (oxidation reaction characteristics and reduction reaction characteristics) of Ir(MdmCN5btz1-tmp)$_3$ were examined by cyclic voltammetry (CV). Note that for the measurement, an electrochemical analyzer (ALS model 600A or 600C, produced by BAS Inc.)

was used. Note that a solution in which Ir(MdmCN5btz1-tmp)$_3$ is dissolved in chloroform was used for the measurement of oxidation reaction characteristics, and a solution in which Ir(MdmCN5btz1-tmp)$_3$ is dissolved in N,N-dimethylformamide (abbreviation: DMF) was used for the measurement of reduction reaction characteristics. In the measurement, the potential of a working electrode with respect to the reference electrode was changed within an appropriate range, so that the oxidation peak potential and the reduction peak potential were obtained. In addition, the HOMO and LUMO levels were obtained from the estimated redox potential of the reference electrode of −4.94 eV and the obtained peak potentials.

According to the CV measurement results, the oxidation potential of Ir(MdmCN5btz1-tmp)$_3$ was 0.72 V, and the reduction potential thereof was −2.70 V. In addition, the HOMO level and the LUMO level of Ir(MdmCN5btz1-tmp)$_3$ which were obtained from the CV measurement results were −5.66 eV and −2.24 eV, respectively.

Example 15

In this example, examples of fabricating light-emitting elements (light-emitting elements 8 to 11) of one embodiment of the present invention are described. The schematic cross-sectional views of FIG. 42 can be referred to for cross sections of the light-emitting elements fabricated in this example. The detailed element structures are shown in Table 9. For the structures and abbreviations of the compounds used here, those in Examples described above can be referred to.

TABLE 9

| | Layer | Reference numeral | Thickness (nm) | Material | Weight ratio |
|---|---|---|---|---|---|
| Light-emitting element 8 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(pim-diBuCNp)$_3$ | 0.6:0.4:0.125 |
| | | 160(1) | 30 | 4,6mCzP2Pm:PCCP:Ir(pim-diBuCNp)$_3$ | 0.2:0.8:0.125 |
| | Hole-transport layer | 112 | 20 | PCCP | — |
| | Hole-injection layer | 111 | 20 | DBT3P-II:$MoO_3$ | 1:0.5 |
| | Electrode | 101 | 70 | ITSO | — |
| Light-emitting element 9 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 35DCzPPy | — |
| | Light-emitting layer | 160 | 40 | 35DCzPPy:PCCP:Ir(pim-diBuCNp)$_3$ | 0.6:0.4:0.125 |
| | Hole-transport layer | 112 | 20 | PCCP | — |
| | Hole-injection layer | 111 | 20 | DBT3P-II:$MoO_3$ | 1:0.5 |
| | Electrode | 101 | 70 | ITSO | — |
| Light-emitting element 10 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(mpptz-dmCNp)$_3$ | 0.8:0.2:0.125 |
| | | 160(1) | 30 | 4,6mCzP2Pm:PCCP:Ir(mpptz-dmCNp)$_3$ | 0.4:0.6:0.125 |
| | Hole-transport layer | 112 | 20 | PCCP | — |
| | Hole-injection layer | 111 | 20 | DBT3P-II:$MoO_3$ | 1:0.5 |
| | Electrode | 101 | 70 | ITSO | — |
| Light-emitting element 11 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(mpptz-tm5CNp)$_3$ | 0.8:0.2:0.125 |
| | | 160(1) | 30 | 4,6mCzP2Pm:PCCP:Ir(mpptz-tm5CNp)$_3$ | 0.6:0.4:0.125 |
| | Hole-transport layer | 112 | 20 | PCCP | — |
| | Hole-injection layer | 111 | 20 | DBT3P-II:$MoO_3$ | 1:0.5 |
| | Electrode | 101 | 70 | ITSO | — |

<Fabrication of Light-Emitting Elements>

<<Fabrication of Light-Emitting Element 8>>

As the electrode 101, an ITSO film was formed to a thickness of 70 nm over the substrate 200. The electrode area of the electrode 101 was set to 4 $mm^2$ (2 mm×2 mm).

As the hole-injection layer 111, DBT3P-II and $MoO_3$ were deposited over the electrode 101 by co-evaporation in a weight ratio of DBT3P-II:$MoO_3$=1:0.5 to a thickness of 20 nm.

As the hole-transport layer 112, PCCP was deposited over the hole-injection layer 111 by evaporation to a thickness of 20 nm.

As the light-emitting layer 160 over the hole-transport layer 112, 4,6mCzP2Pm, PCCP, and Ir(pim-diBuCNp)$_3$ were deposited by co-evaporation in a weight ratio of 4,6mCzP2Pm:PCCP:Ir(pim-diBuCNp)$_3$=0.2:0.8:0.125 to a thickness of 30 nm, and successively, 4,6mCzP2Pm, PCCP, and Ir(pim-diBuCNp)$_3$ were deposited by co-evaporation in a weight ratio of 4,6mCzP2Pm:PCCP:Ir(pim-diBuCNp)$_3$=0.6:0.4:0.125 to a thickness of 10 nm. Note that in the light-emitting layer 160, 4,6mCzP2Pm corresponds to the first organic compound, PCCP corresponds to the second organic compound, and Ir(pim-diBuCNp)$_3$ corresponds to the guest material (the phosphorescent compound).

As the electron-transport layer 118, 4,6mCzP2Pm and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 8 was sealed by fixing the substrate 220 to the substrate 200 over which the organic material was deposited using a sealant for an organic EL device. For the detailed method, description of the light-emitting element 1 can be referred to. Through the above steps, the light-emitting element 8 was obtained.

<<Fabrication of Light-Emitting Element 9>>

The light-emitting element 9 was fabricated through the same steps as those for the light-emitting element 8 except for the steps of forming the light-emitting layer 160 and the electron-transport layer 118.

As the light-emitting layer 160 in the light-emitting element 9, 35DCzPPy, PCCP, and Ir(pim-diBuCNp)$_3$ were deposited by co-evaporation in a weight ratio of 35DCzPPy:PCCP:Ir(pim-diBuCNp)$_3$=0.6:0.4:0.125 to a thickness of 40 nm. Note that in the light-emitting layer 160, 35DCzPPy corresponds to the first organic compound, PCCP corresponds to the second organic compound, and Ir(pim-diBuCNp)$_3$ corresponds to the guest material (the phosphorescent compound).

As the electron-transport layer 118, 35DCzPPy and BPhen were sequentially deposited by evaporation to thicknesses of 10 nm and 15 nm, respectively, over the light-emitting layer 160.

<<Fabrication of Light-Emitting Element 10>>

The light-emitting element 10 was fabricated through the same steps as those for the light-emitting element 8 except for the step of forming the light-emitting layer 160.

As the light-emitting layer 160 in the light-emitting element 10, 4,6mCzP2Pm, PCCP, and Ir(mpptz-dmCNp)$_3$ were deposited by co-evaporation in a weight ratio of 4,6mCzP2Pm:PCCP:Ir(mpptz-dmCNp)$_3$=0.4:0.6:0.125 to a thickness of 30 nm, and successively, 4,6mCzP2Pm, PCCP, and Ir(mpptz-dmCNp)$_3$ were deposited by co-evaporation in a weight ratio of 4,6mCzP2Pm:PCCP:Ir(mpptz-dmCNp)$_3$=0.8:0.2:0.125 to a thickness of 10 nm. Note that in the light-emitting layer 160, 4,6mCzP2Pm corresponds to the first organic compound, PCCP corresponds to the second organic compound, and Ir(mpptz-dmCNp)$_3$ corresponds to the guest material (the phosphorescent compound).

<<Fabrication of Light-Emitting Element 11>>

The light-emitting element 11 was fabricated through the same steps as those for the light-emitting element 8 except for the step of forming the light-emitting layer 160.

As the light-emitting layer 160 in the light-emitting element 11, 4,6mCzP2Pm, PCCP, and Ir(mpptz-tmCNp)$_3$ were deposited by co-evaporation in a weight ratio of 4,6mCzP2Pm:PCCP:Ir(mpptz-tmCNp)$_3$=0.6:0.4:0.125 to a thickness of 30 nm, and successively, 4,6mCzP2Pm, PCCP, and Ir(mpptz-tmCNp)$_3$ were deposited by co-evaporation in a weight ratio of 4,6mCzP2Pm:PCCP: Ir(mpptz-diBuCNp)$_3$=0.8:0.2:0.125 to a thickness of 10 nm. Note that in the light-emitting layer 160, 4,6mCzP2Pm corresponds to the first organic compound, PCCP corresponds to the second organic compound, and Ir(mpptz-tmCNp)$_3$ corresponds to the guest material (the phosphorescent compound).

<Characteristics of Light-Emitting Elements>

Figure 85:
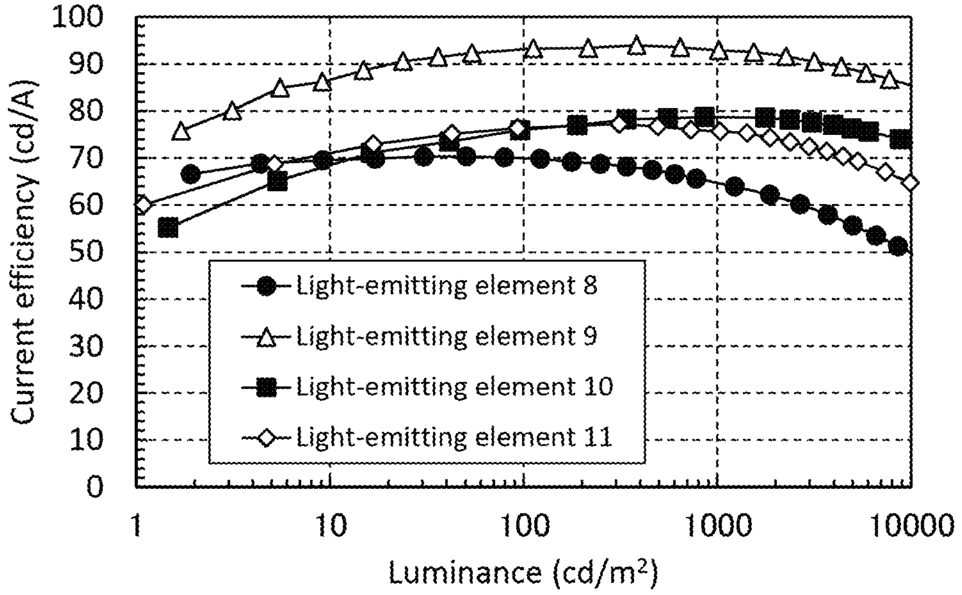
FIG. 85 is a graph showing current efficiency-luminance characteristics of light-emitting elements in Example.
Figure 86:
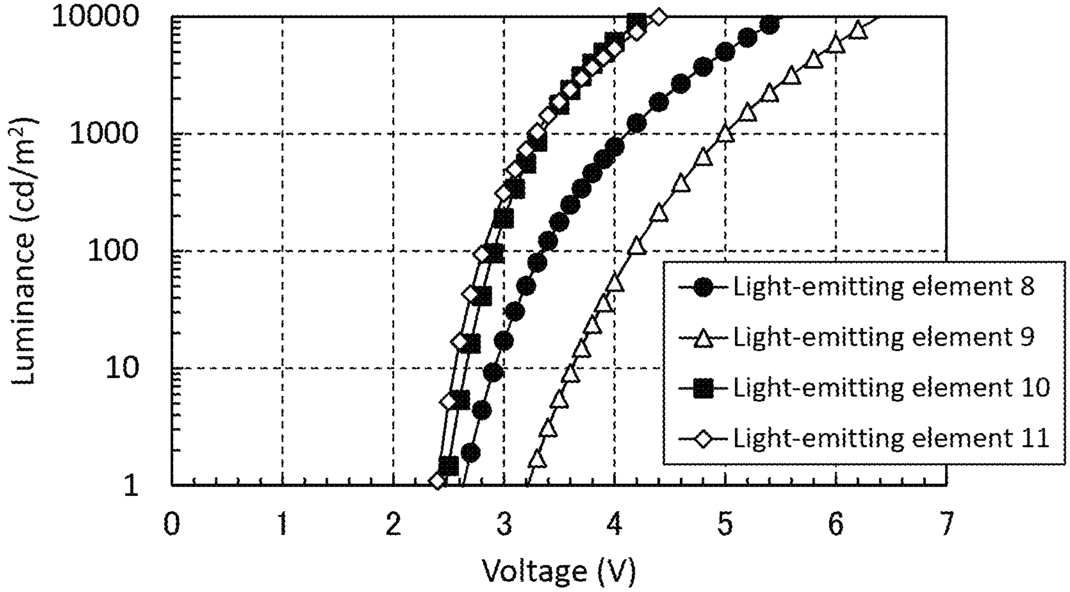
FIG. 86 is a graph showing luminance-voltage characteristics of light-emitting elements in Example.
Figure 87:
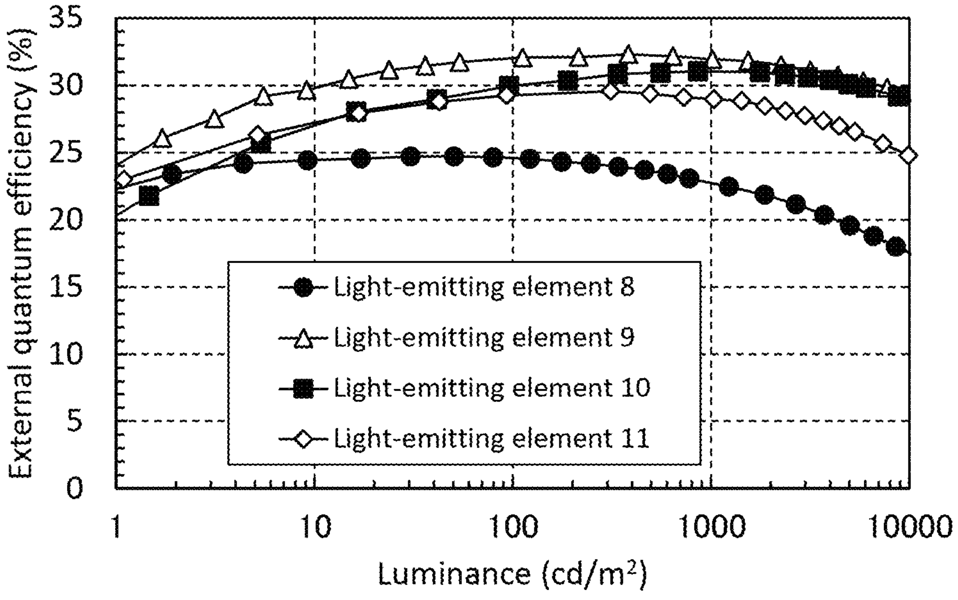
FIG. 87 is a graph showing external quantum efficiency-luminance characteristics of light-emitting elements in Example.
Figure 88:
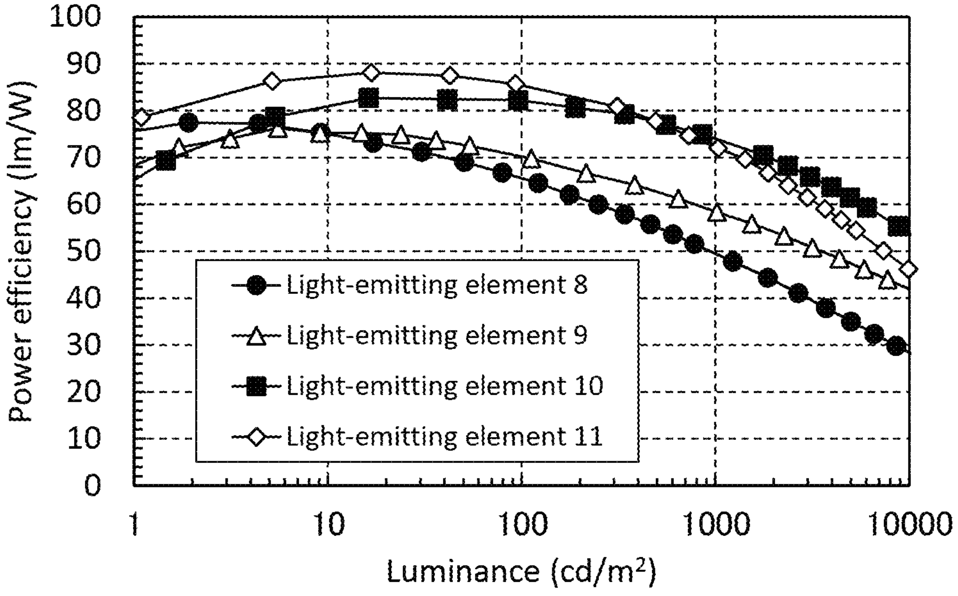
FIG. 88 is a graph showing power efficiency-luminance characteristics of light-emitting elements in Example.

FIG. 85 shows current efficiency-luminance characteristics of the light-emitting elements 8 to 11. FIG. 86 shows luminance-voltage characteristics. FIG. 87 shows external quantum efficiency-luminance characteristics. FIG. 88 shows power efficiency-luminance characteristics. The measurement of the light-emitting elements was performed at room temperature (in an atmosphere kept at 23° C.).

Table 10 shows element characteristics of the light-emitting elements 8 to 11 at around 1000 cd/$m^2$.

TABLE 10

| | Voltage (V) | Current density (mA/$cm^2$) | Chromaticity (x, y) | Luminance (cd/$m^2$) | Current efficiency (cd/A) | Power efficiency (lm/W) | External quantum efficiency (%) |
|---|---|---|---|---|---|---|---|
| Light-emitting element 8 | 4.0 | 1.2 | (0.23, 0.55) | 780 | 66 | 52 | 23 |
| Light-emitting element 9 | 5.0 | 1.1 | (0.23, 0.57) | 1000 | 93 | 58 | 32 |
| Light-emitting element 10 | 3.3 | 1.1 | (0.21, 0.50) | 860 | 79 | 75 | 31 |
| Light-emitting element 11 | 3.3 | 1.4 | (0.21, 0.48) | 1000 | 76 | 72 | 29 |

Figure 89:
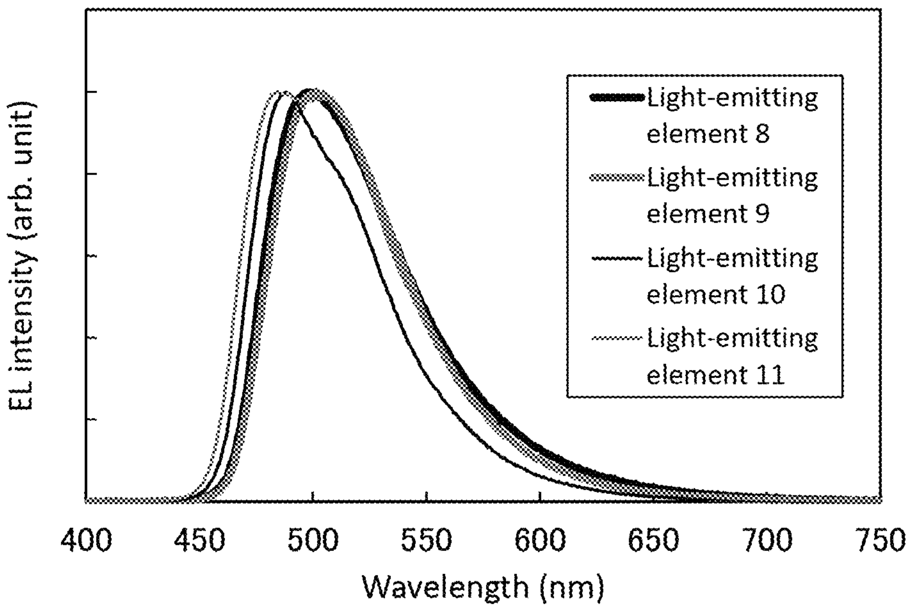
FIG. 89 is a graph showing electroluminescence spectra of light-emitting elements in Example.

FIG. 89 shows the emission spectra of the light-emitting elements 8 to 11 through which current flows at a current density of 2.5 mA/$cm^2$.

From FIG. 85 to FIG. 88 and Table 10, it is found that the light-emitting elements 8 to 11 have high emission efficiency (high current efficiency and high external quantum efficiency). The maximum external quantum efficiency of the light-emitting elements 8 to 11 were 25%, 32%, 31%, and 30%, respectively, which are excellent values.

As shown in FIG. 89, the light-emitting elements 8 to 11 emit blue light. The electroluminescence spectra of blue light from the light-emitting elements 8 to 11 have peak wavelengths at 498 nm, 502 nm, 488 nm, and 485 nm, respectively, and full widths at half maximum of 70 nm, 67 nm, 64 nm, and 77 nm, respectively. Therefore, with use of an iridium complex including, as a ligand, an aryl group including a cyano group as a guest material, a light-emitting element emitting blue light with high emission efficiency can be fabricated.

As seen from FIG. 85 to FIG. 88 and Table 10, the light-emitting element 8, the light-emitting element 10, and the light-emitting element 11 are driven at voltages lower than the driving voltage of the light-emitting element 9.

As described in the above Example, in each of the light-emitting element 8, the light-emitting element 10, and the light-emitting element 11, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). In that case, carriers (electrons and holes) can be efficiently injected from a pair of electrodes to the first organic compound (4,6mCzP2Pm) and the second organic compound (PCCP), and the first organic compound (4,6mCzP2Pm) and the second organic compound (PCCP) can form an exciplex. Accordingly, each of the light-emitting element 8, the light-emitting element 10, and the light-emitting element 11 has excellent characteristics that achieve both high emission efficiency and low driving voltage.

From the absorption spectrum of $Ir(pim\text{-}diBuCNp)_3$ (FIG. 64), the absorption spectrum of $Ir(mpptz\text{-}dmCNp)_3$ (FIG. 67), and the absorption spectrum of $Ir(mpptz\text{-}tm5CNp)_3$ (FIG. 70), the respective absorption edges were obtained, and then transition energy assuming the direct transition was estimated. As the result, the absorption edge of $Ir(pim\text{-}diBuCNp)_3$ was 484 nm and the transition energy thereof was 2.56 eV. The absorption edge of $Ir(mpptz\text{-}dmCNp)_3$ was 475 nm and the transition energy thereof was 2.61 eV. The absorption edge of $Ir(mpptz\text{-}tm5CNp)_3$ was 474 nm and the transition energy thereof was 2.62 eV.

As shown in the above Example, the triplet excitation energy level (T1 level) of the first organic compound (4,6mCzP2Pm) is 2.70 eV and that of the second organic compound (PCCP) is 2.66 eV. Each triplet excitation energy level (T1 level) is higher than the transition energy of the guest material which is obtained from the absorption spectrum edge. Therefore, the first organic compound (4,6mCzP2Pm) and the second organic compound (PCCP), which were used as host materials, have triplet excitation energy levels (T1 levels) high enough for host materials.

An energy difference between the LUMO level and the HOMO level of $Ir(pim\text{-}diBuCNp)_3$ was 2.81 eV, that of $Ir(mpptz\text{-}dmCNp)_3$ was 2.91 eV, and that of $Ir(mpptz\text{-}tm5CNp)_3$ was 3.03 eV. These values were obtained from the CV measurement results.

That is, the energy difference between the LUMO level and the HOMO level of $Ir(pim\text{-}diBuCNp)_3$ is larger than the transition energy thereof obtained from the absorption edge by 0.25 eV. The energy difference of $Ir(mpptz\text{-}dmCNp)_3$ is larger than the transition energy by 0.30 eV. The energy difference of $Ir(mpptz\text{-}tm5CNp)_3$ is larger than the transition energy by 0.41 eV.

As shown in FIG. 89, a peak wavelength on the shortest wavelength side of the electroluminescence spectrum of the light-emitting element 8 was 498 nm, that of the light-emitting element 10 was 488 nm, and that of the light-emitting element 11 was 485 nm. According to that, the light emission energy of $Ir(pim\text{-}diBuCNp)_3$ was calculated to be 2.49 eV, that of $Ir(mpptz\text{-}dmCNp)_3$ was calculated to be 2.54 eV, and that of $Ir(mpptz\text{-}tm5CNp)_3$ was calculated to be 2.56 eV.

That is, the energy difference between the LUMO level and the HOMO level of $Ir(pim\text{-}diBuCNp)_3$ was larger than the light emission energy by 0.32 eV. The energy difference of $Ir(mpptz\text{-}dmCNp)_3$ was larger than the light emission energy by 0.37 eV. The energy difference of $Ir(mpptz\text{-}tm5CNp)_3$ was larger than the light emission energy by 0.47 eV.

Consequently, in each of the guest materials of the light-emitting elements, the energy difference between the LUMO level and the HOMO level is larger than the transition energy obtained from the absorption edge. In addition, the energy difference between the LUMO level and the HOMO level is larger than the light emission energy by 0.3 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

Note that in each of the light-emitting elements 8, 10, and 11, an energy difference between the LUMO level of the first organic compound (4,6mCzP2Pm) and the HOMO level of the second organic compound (PCCP) (4,6mCzP2Pm and PCCP are host materials) was calculated to be 2.75 eV from Table 3. Consequently, energy corresponding to the energy difference between the LUMO level and the HOMO level of an exciplex formed by the host materials in the light-emitting elements 8, 10, and 11 is smaller than the energy difference between the LUMO level and the HOMO level (2.81 eV, 2.91 eV, and 3.03 eV) of the guest materials ($Ir(pim\text{-}diBuCNp)_3$, $Ir(mpptz\text{-}dmCNp)_3$, and $Ir(mpptz\text{-}tm5CNp)_3$), and larger than the transition energy (2.56 eV, 2.61 eV, and 2.62 eV) obtained from the absorption edge. Therefore, in the light-emitting elements 8, 10, and 11, the guest material can be excited through the exciplex, whereby the driving voltage can be lowered. Therefore, the light-emitting elements of one embodiment of the present invention enable reduction in power consumption.

As described above, by employing the structure of one embodiment of the present invention, a light-emitting element having high emission efficiency can be provided. A light-emitting element with low power consumption can be provided. A light-emitting element emitting blue light and having high emission efficiency can be provided.

The structure described in this embodiment can be used in combination with any of the structures described in the other examples and embodiments as appropriate.

Example 16

In this example, examples of fabricating light-emitting elements (light-emitting elements 12 and 13) of one embodiment of the present invention are described. The schematic cross-sectional views of FIG. 42 can be referred to for cross sections of the light-emitting elements fabricated in this example. The detailed element structures are shown in Table 11. For the structures and abbreviations of the compounds used here are given below. Note that the above Examples can be referred to for other compounds.

dmCBP

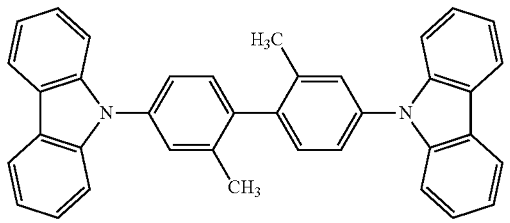

mCzPICz

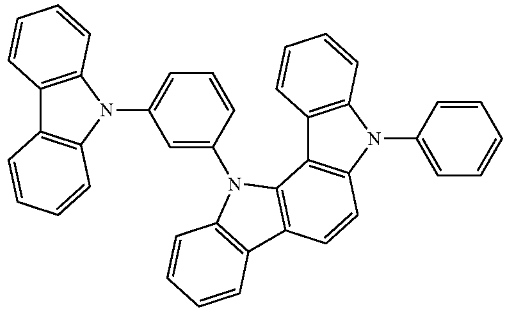

As the light-emitting layer 160 over the hole-transport layer 112, 4,6mCzP2Pm, 12-[3-(9H-carbazol-9-yl)phenyl]-5,12-dihydro-5-phenyl-indolo[3,2-a]carbazole (abbreviation: mCzPICz), and Ir(mp5CNptz-diPrp)$_3$ were deposited by co-evaporation in a weight ratio of 4,6mCzP2Pm:mCzPICz:Ir(mp5CNptz-diPrp)$_3$=0.6:0.4:0.125 to a thickness of 30 nm, and successively, 4,6mCzP2Pm, mCzPICz, and Ir(mp5CNptz-diPrp)$_3$ were deposited by co-evaporation in a weight ratio of 4,6mCzP2Pm:mCzPICz:Ir(mp5CNptz-diPrp)$_3$=0.8:0.2:0.125 to a thickness of 10 nm. Note that in the light-emitting layer 160, 4,6mCzP2Pm corresponds to the first organic compound, mCzPICz corresponds to the second organic compound, and Ir(mp5CNptz-diPrp)$_3$ corresponds to the guest material (the phosphorescent compound).

As the electron-transport layer 118, 4,6mCzP2Pm and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 12 was sealed by fixing the substrate 220 to the substrate 200 over which the organic material was deposited using a sealant for an organic EL device. For the detailed method, description of the light-emitting element 1 can be referred to. Through the above steps, the light-emitting element 12 was obtained.

<<Fabrication of Light-Emitting Element 13>>

The light-emitting element 13 was fabricated through the same steps as those for the light-emitting element 12 except for the step of forming the light-emitting layer 160.

TABLE 11

| | Layer | Reference numeral | Thickness (nm) | Material | Weight ratio |
|---|---|---|---|---|---|
| Light-emitting element 12 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:mCzPICz:Ir(mp5CNptz-diPrp)$_3$ | 0.8:0.2:0.125 |
| | | 160(1) | 30 | 4,6mCzP2Pm:mCzPICz:Ir(mp5CNptz-diPrp)$_3$ | 0.6:0.4:0.125 |
| | Hole-transport layer | 112 | 20 | dmCBP | — |
| | Hole-injection layer | 111 | 20 | DBT3P-II:MoO$_3$ | 1:0.5 |
| | Electrode | 101 | 70 | ITSO | — |
| Light-emitting element 13 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160 | 40 | 4,6mCzP2Pm:mCzPICz:Ir(mpdCNptz-diPrp)$_3$ | 0.8:0.2:0.125 |
| | Hole-transport layer | 112 | 20 | dmCBP | — |
| | Hole-injection layer | 111 | 20 | DBT3P-II:MoO$_3$ | 1:0.5 |
| | Electrode | 101 | 70 | ITSO | — |

<Fabrication of Light-Emitting Elements>

<<Fabrication of Light-Emitting Element 12>>

As the electrode 101, an ITSO film was formed to a thickness of 70 nm over the substrate 200. The electrode area of the electrode 101 was set to 4 mm$^2$ (2 mm×2 mm).

As the hole-injection layer 111, DBT3P-II and MoO$_3$ were deposited over the electrode 101 by co-evaporation in a weight ratio of DBT3P-II:MoO$_3$=1:0.5 to a thickness of 20 nm.

As the hole-transport layer 112, 4,4'-bis(9-carbazole)-2,2'-dimethylbiphenyl (abbreviation: dmCBP) was deposited by evaporation over the hole-injection layer 111 to a thickness of 20 nm.

As the light-emitting layer 160 in the light-emitting element 13, 4,6mCzP2Pm, mCzPICz, and Ir(mpdCNptz-diPrp)$_3$ were deposited by co-evaporation in a weight ratio of 4,6mCzP2Pm:mCzPICz:Ir(mpdCNptz-diPrp)$_3$=0.8:0.2:0.125 to a thickness of 40 nm. Note that in the light-emitting layer 160, 4,6mCzP2Pm corresponds to the first organic compound, mCzPICz corresponds to the second organic compound, and Ir(mpdCNptz-diPrp)$_3$ corresponds to the guest material (the phosphorescent compound).

<Emission Spectra of Host Materials>

Figure 90:
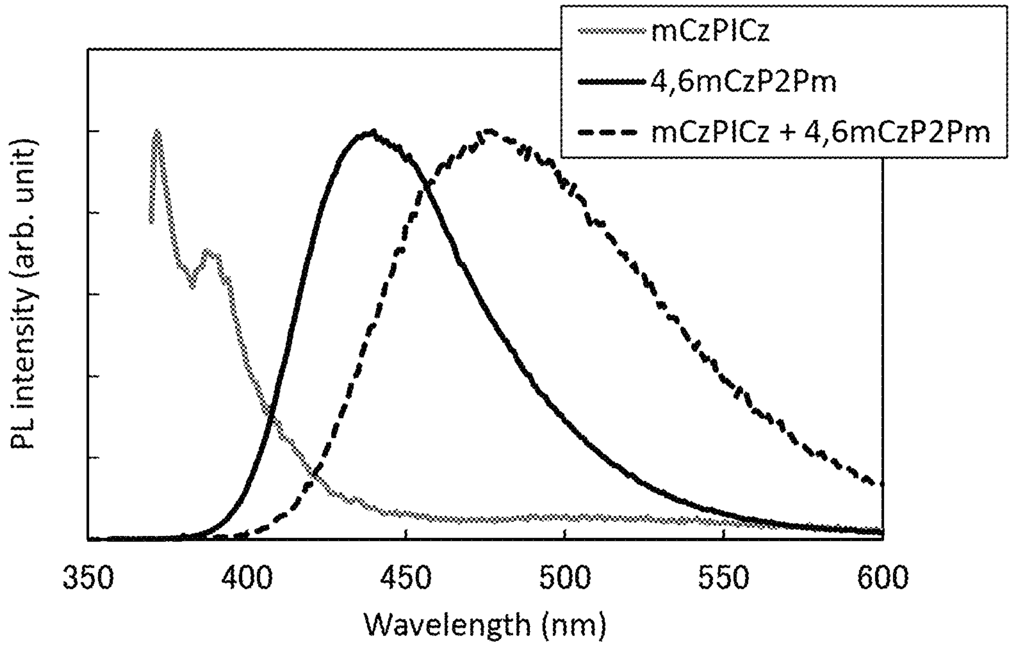
FIG. 90 is a graph showing emission spectra of host materials in Example.

In the fabricated light-emitting elements (the light-emitting elements 12 and 13), 4,6mCzP2Pm and mCzPICz were used as host materials (the first organic compound and the second organic compound). FIG. 90 shows measurement results of emission spectra of a thin film of 4,6mCzP2Pm, a thin film of mCzPICz, and a mixed thin film of 4,6mCzP2Pm and mCzPICz.

For the emission spectrum measurement, thin film samples were formed over a quartz substrate by a vacuum evaporation method. The emission spectra were measured at room temperature (in an atmosphere kept at 23° C.) with a PL-EL measurement apparatus (produced by Hamamatsu Photonics K.K.). The thickness of each thin film was 50 nm. The mixing ratio of the two compounds (4,6mCzP2Pm: mCzPICz) in the mixed thin film was 1:1.

As shown in FIG. 90, a peak wavelength of the emission spectrum of the mixed thin film of 4,6mCzP2Pm and mCzPICz is 477 nm. The emission spectrum differs from the emission spectrum of 4,6mCzP2Pm (peak wavelength: 440 nm) and the emission spectrum of mCzPICz (peak wavelength: 372 nm). As described later, the LUMO level of 4,6mCzP2Pm is lower than that of mCzPICz, and the HOMO level of mCzPICz is higher than that of 4,6mCzP2Pm. The energy of light emission from the mixed thin film of 4,6mCzP2Pm and mCzPICz approximately corresponds to an energy difference between the LUMO level of 4,6mCzP2Pm and the HOMO level of mCzPICz. The light emission from the mixed thin film of 4,6mCzP2Pm and mCzPICz has a longer wavelength (lower energy) than light emission from 4,6mCzP2Pm and light emission from mCzPICz. Therefore, it can be said that the light emission from the mixed thin film of 4,6mCzP2Pm and mCzPICz is light emission from an exciplex formed by 4,6mCzP2Pm and mCzPICz. That is, a combination of 4,6mCzP2Pm and mCzPICz is a combination of organic compounds which forms an exciplex. With use of 4,6mCzP2Pm and mCzPICz as host materials, a light-emitting element utilizing ExTET can be fabricated.

As shown in FIG. 73 and FIG. 76, an absorption band on the lowest energy side (the longest wavelength side) of the absorption spectrum of each of Ir(mp5CNptz-diPrp)$_3$ and Ir(mpdCNptz-diPrp)$_3$ was at around 450 nm, which has a region overlapping the emission spectrum of an exciplex formed by 4,6mCzP2Pm and mCzPICz. Therefore, in the light-emitting element using 4,6mCzP2Pm and mCzPICz as host materials, excitation energy can be effectively transferred to the guest material.

As described above, in each of the light-emitting elements 12 and 13, a combination of the host materials which are 4,6mCzP2Pm (the first organic compound) and mCzPICz (the second organic compound) forms an exciplex.

Next, the triplet excitation energy level (T1 level) of the second organic compound (mCzPICz), which was used as a host material, was measured. Note that the triplet excitation energy level (T1 level) of the first organic compound (4,6mCzP2Pm) is described in Example 4.

For the triplet excitation energy level measurement, phosphorescence from the thin film sample of the compound was measured. The measurement was performed by using a PL microscope, LabRAM HR-PL, produced by HORIBA, Ltd., a He—Cd laser (325 nm) as excitation light, and a CCD detector at a measurement temperature of 10 K. The triplet excitation energy level (T1 level) was obtained from a peak on the shortest wavelength side of the phosphorescent spectrum obtained by the measurement.

A peak wavelength on the shortest wavelength side of the phosphorescence emission spectrum of the second organic compound (mCzPICz) was 441 nm. The triplet excitation energy level (T1 level) of the second organic compound (mCzPICz) was 2.81 eV. As shown in Example 4, a peak wavelength on the shortest wavelength side of the phosphorescence emission spectrum of the first organic compound (4,6mCzP2Pm) was 459 nm and the triplet excitation energy level (T1 level) thereof was 2.70 eV.

A peak wavelength on the shortest wavelength side of the phosphorescence emission spectrum of each of 4,6mCzP2Pm and mCzPICz is shorter than a peak wavelength on the shortest wavelength side of the emission spectrum of the exciplex formed by 4,6mCzP2Pm and mCzPICz which is shown in FIG. 90. The exciplex has a feature in that an energy difference between the singlet excitation energy level (S1 level) and the triplet excitation energy level (T1 level) is small. Therefore, the triplet excitation energy level (T1 level) of the exciplex can be obtained from a peak wavelength on the shortest wavelength side of the emission spectrum. Accordingly, the triplet excitation energy level (T1 level) of each of the first organic compound (4,6mCzP2Pm) and the second organic compound (mCzPICz) is higher than the triplet excitation energy level (T1 level) of the exciplex.

As shown later, the triplet excitation energy level (T1 level) of each of 4,6mCzP2Pm and mCzPICz is higher than the transition energy of the guest material which is obtained from the absorption spectrum edge.

Therefore, the first organic compound (4,6mCzP2Pm) and the second organic compound (mCzPICz), which were used as host materials in this example, have triplet excitation energy levels (T1 levels) high enough for host materials.

<Characteristics of Light-Emitting Elements>

Figure 91:
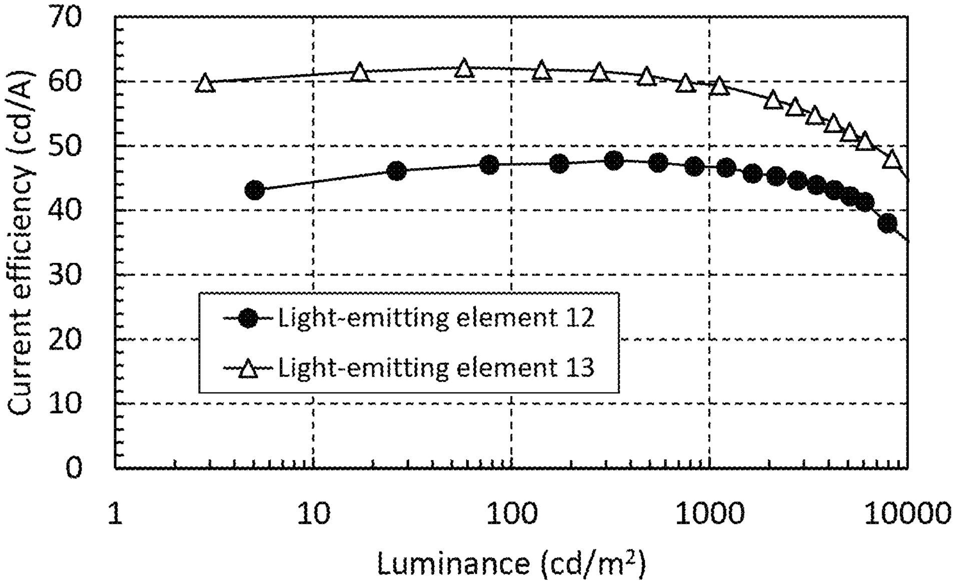
FIG. 91 is a graph showing current efficiency-luminance characteristics of light-emitting elements in Example.
Figure 92:
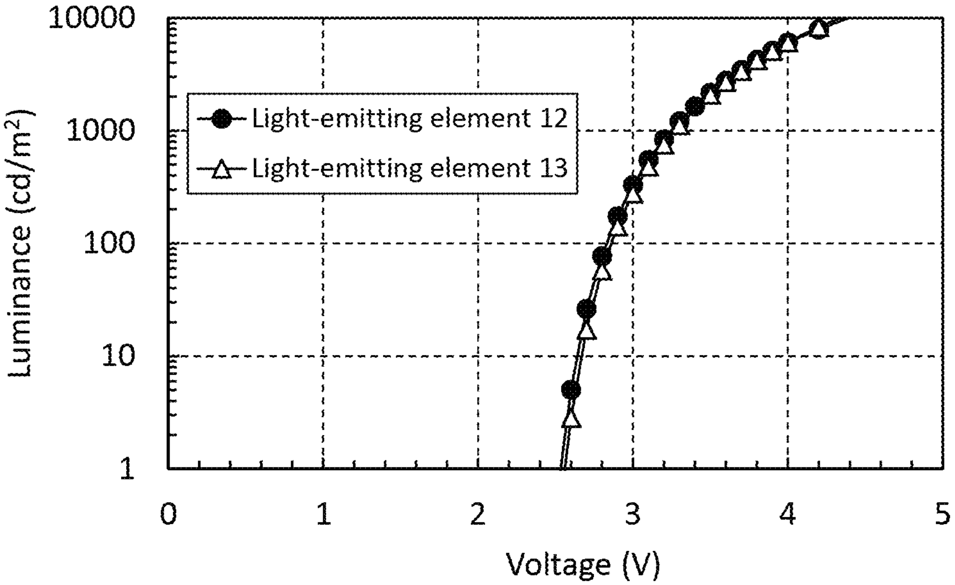
FIG. 92 is a graph showing luminance-voltage characteristics of light-emitting elements in Example.
Figure 93:
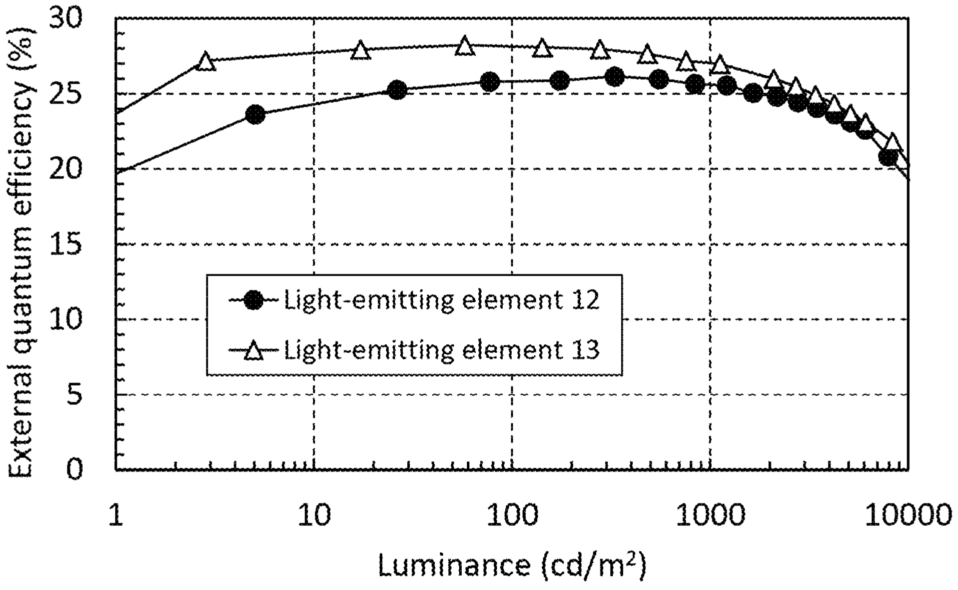
FIG. 93 is a graph showing external quantum efficiency-luminance characteristics of light-emitting elements in Example.
Figure 94:
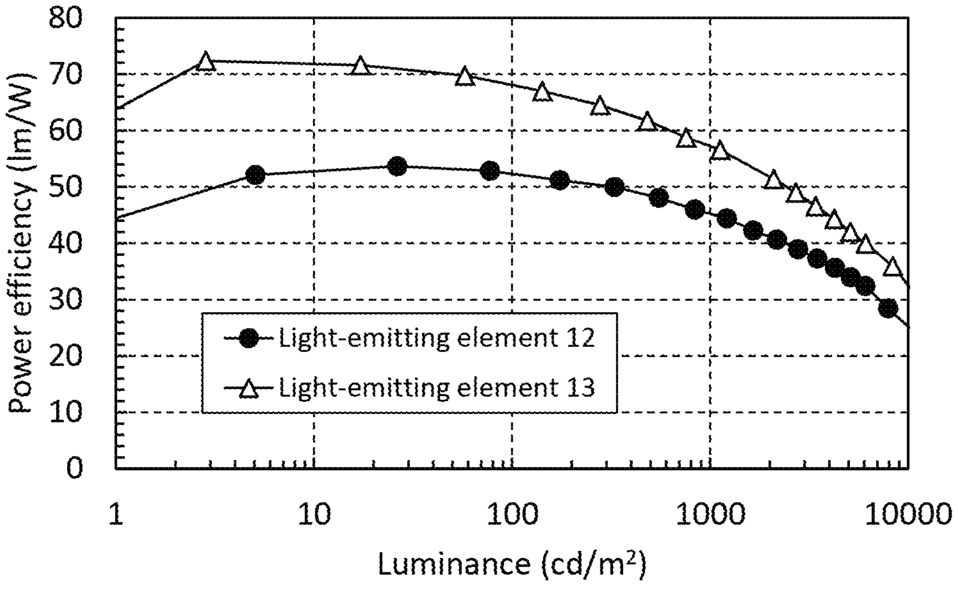
FIG. 94 is a graph showing power efficiency-luminance characteristics of light-emitting elements in Example.

FIG. 91 shows current efficiency-luminance characteristics of the light-emitting elements 12 and 13. FIG. 92 shows luminance-voltage characteristics. FIG. 93 shows external quantum efficiency-luminance characteristics. FIG. 94 shows power efficiency-luminance characteristics. The measurement of the light-emitting elements was performed at room temperature (in an atmosphere kept at 23° C.).

Table 12 shows the element characteristics of the light-emitting elements 12 and 13 at around 1000 cd/m$^2$.

TABLE 12

| | Voltage (V) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 12 | 3.2 | 1.8 | (0.16, 0.28) | 840 | 47 | 46 | 26 |
| Light-emitting element 13 | 3.3 | 1.9 | (0.18, 0.38) | 1100 | 59 | 57 | 27 |

Figure 95:
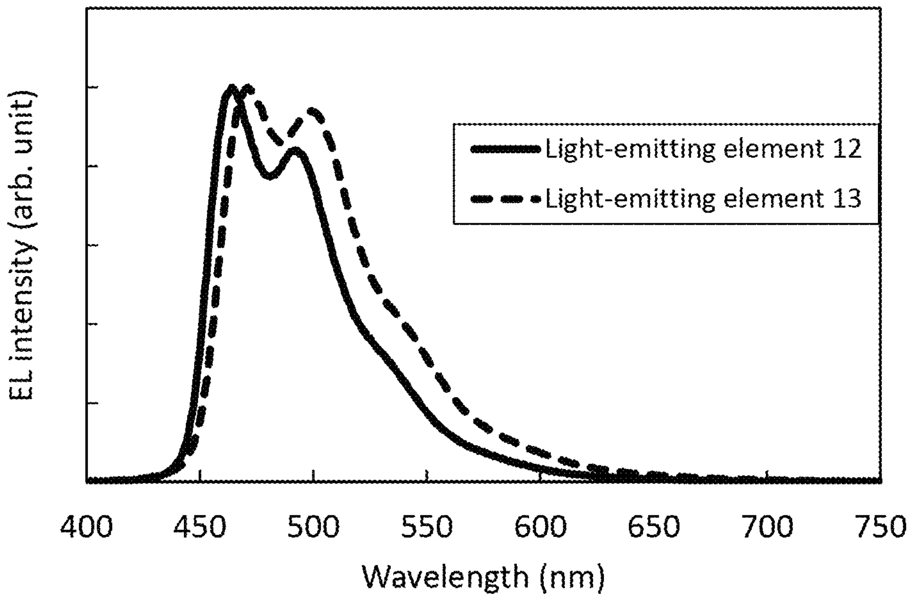
FIG. 95 is a graph showing electroluminescence spectra of light-emitting elements in Example.

FIG. 95 shows the emission spectra of the light-emitting elements 12 and 13 through which current flows at a current density of 2.5 mA/cm$^2$.

From FIG. 91 to FIG. 94 and Table 12, it is found that the light-emitting elements 12 and 13 have high emission efficiency (high current efficiency and high external quantum efficiency). The maximum external quantum efficiency of the light-emitting elements 12 and 13 were 26% and 28%, respectively, which are excellent values.

As shown in FIG. 95, the light-emitting elements 12 and 13 emit blue light with high color purity. The electroluminescence spectra of blue light from the light-emitting elements 12 and 13 have peak wavelengths at 464 nm and 471 nm, respectively, and full widths at half maximum of 60 nm and 70 nm, respectively. Therefore, with use of an iridium complex including, as a ligand, an aryl group including a cyano group as a guest material, a light-emitting element emitting blue light with high emission efficiency can be fabricated.

As seen from FIG. 91 to FIG. 94 and Table 12, the light-emitting elements 12 and 13 are driven at low voltages.

<Results of CV Measurement>

The electrochemical characteristics (oxidation reaction characteristics and reduction reaction characteristics) of the compound (mCzPICz) used as the host material in the above-described light-emitting elements were examined by cyclic voltammetry (CV). Note that for the measurement, an electrochemical analyzer (ALS model 600A or 600C, produced by BAS Inc.) was used, and measurement was performed on a solution obtained by dissolving the compound (mCzPICz) in DMF. In the measurement, the potential of a working electrode with respect to the reference electrode was changed within an appropriate range, so that the oxidation peak potential and the reduction peak potential were obtained. In addition, the HOMO and LUMO levels of each compound were obtained from the estimated redox potential of the reference electrode of −4.94 eV and the obtained peak potentials.

According to the CV measurement results, the oxidation potential of mCzPICz was 0.68 V and the reduction potential thereof was −3.00 V; therefore, it was obtained from the CV measurement that the HOMO level of mCzPICz was −5.62 eV and the LUMO level was −1.95 eV. For the HOMO levels and LUMO levels of 4,6mCzP2Pm and the guest materials ($Ir(mp5CNptz\text{-}diPrp)_3$ and $Ir(mpdCNptz\text{-}diPrp)_3$), description in the above Example can be referred to.

As described above, in each of the light-emitting element 12 and the light-emitting element 13, the LUMO level of the first organic compound (4,6mCzP2Pm) is lower than that of the second organic compound (mCzPICz), and the HOMO level of the first organic compound (4,6mCzP2Pm) is lower than that of the second organic compound (mCzPICz). The HOMO level of the first organic compound (4,6mCzP2Pm) is lower than that of the second organic compound (mCzPICz), the LUMO level of each of the guest materials ($Ir(mp5CNptz\text{-}diPrp)_3$ and $Ir(mpdCNptz\text{-}diPrp)_3$) is higher than that of the first organic compound (4,6mCzP2Pm), and the HOMO level of each of the guest materials ($Ir(mp5CNptz\text{-}diPrp)_3$ and $Ir(mpdCNptz\text{-}diPrp)_3$) is lower than that of the second organic compound (mCzPICz). In that case, carriers (electrons and holes) can be efficiently injected from a pair of electrodes to the first organic compound (4,6mCzP2Pm) and the second organic compound (mCzPICz), and the first organic compound (4,6mCzP2Pm) and the second organic compound (mCzPICz) can form an exciplex. Accordingly, each of the light-emitting elements 12 and 13 has excellent characteristics that achieve both high emission efficiency and low driving voltage.

From the absorption spectrum of $Ir(mp5CNptz\text{-}diPrp)_3$ (FIG. 73) and the absorption spectrum of $Ir(mpdCNptz\text{-}diPrp)_3$ (FIG. 76), the respective absorption edges were obtained, and then transition energy assuming the direct transition was estimated. As the result, the absorption edge of $Ir(mp5CNptz\text{-}diPrp)_3$ was 467 nm and the transition energy thereof was 2.65 eV. The absorption edge of $Ir(mpdCNptz\text{-}diPrp)_3$ was 466 nm and the transition energy thereof was 2.66 eV.

An energy difference between the LUMO level and the HOMO level of $Ir(mp5CNptz\text{-}diPrp)_3$ was 3.55 eV. This value was obtained from the CV measurement results. In addition, the energy difference of $Ir(mpdCNptz\text{-}diPrp)_3$ was estimated to be 3.25 eV or higher.

That is, the energy difference between the LUMO level and the HOMO level of $Ir(mp5CNptz\text{-}diPrp)_3$ is larger than the transition energy thereof obtained from the absorption edge by 0.9 eV. The energy difference between the LUMO level and the HOMO level of $Ir(mpdCNptz\text{-}diPrp)_3$ was estimated to be larger than the transition energy thereof, which was obtained from the absorption edge, by 0.59 eV or more.

As shown in FIG. 95, a peak wavelength on the shortest wavelength side of the electroluminescence spectrum of the light-emitting element 12 was 464 nm and that of the light-emitting element 13 was 471 nm. According to that, the light emission energy of $Ir(mp5CNptz\text{-}diPrp)_3$ was calculated to be 2.67 eV and that of $Ir(mpdCNptz\text{-}diPrp)_3$ was calculated to be 2.63 eV.

That is, the energy difference between the LUMO level and the HOMO level of $Ir(mp5CNptz\text{-}diPrp)_3$ was larger than the light emission energy by 0.88 eV. The energy difference between the LUMO level and the HOMO level of $Ir(mpdCNptz\text{-}diPrp)_3$ was estimated to be larger than the light emission energy thereof by 0.62 eV or more.

Consequently, in each of the guest materials of the light-emitting elements, the energy difference between the LUMO level and the HOMO level is larger than the transition energy obtained from the absorption edge by 0.4 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

Note that in each of the light-emitting elements 12 and 13, an energy difference between the LUMO level of the first organic compound (4,6mCzP2Pm) and the HOMO level of the second organic compound (mCzPICz) (4,6mCzP2Pm and mCzPICz are host materials) was calculated to be 2.74 eV. Consequently, energy corresponding to the energy difference between the LUMO level and the HOMO level of an exciplex formed by the host materials in the light-emitting elements 12 and 13 is smaller than the energy difference between the LUMO level and the HOMO level of the guest materials ($Ir(mp5CNptz\text{-}diPrp)_3$ and $Ir(mpdCNptz\text{-}diPrp)_3$, and larger than the transition energy (2.65 eV and 2.66 eV) obtained from the absorption edge. Therefore, in the light-emitting elements 12 and 13, the guest materials can be excited through the exciplex, whereby the driving voltage can be lowered. Therefore, the light-emitting elements of one embodiment of the present invention enable reduction in power consumption.

As described above, with the structure in which the LUMO level of the first organic compound is lower than that of the second organic compound, the HOMO level of the first organic compound is lower than that of the second organic compound, the LUMO level of the guest material is higher than that of the first organic compound, the HOMO level of the guest material is lower than that of the second organic compound, and a combination of the first organic compound and the second organic compound forms an exciplex, a light-emitting element emitting blue light that achieves high emission efficiency and low driving voltage can be provided. An iridium complex including a cyano group is preferred as the guest material in this structure.

As described above, by employing the structure of one embodiment of the present invention, a light-emitting element having high emission efficiency can be provided. A light-emitting element with low power consumption can be provided. A light-emitting element emitting blue light and having high emission efficiency can be provided.

The structure described in this embodiment can be used in combination with any of the structures described in the other examples and embodiments as appropriate.

Example 17

In this example, an example of fabricating a light-emitting element (a light-emitting element 14) of one embodiment of the present invention is described. The schematic cross-sectional views of FIG. 42 can be referred to for cross section of the light-emitting element fabricated in this example. The detailed element structure is shown in Table 13. For the structures and abbreviations of the compounds used here, those in Examples described above can be referred to.

TABLE 13

| | Layer | Reference numeral | Thickness (nm) | Material | Weight ratio |
|---|---|---|---|---|---|
| Light-emitting element 14 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160(2) | 10 | 4,6mCzP2Pm:PCCP:Ir(mCNpptz-diPrp)$_3$ | 0.8:0.2:0.125 |
| | | 160(1) | 30 | 4,6mCzP2Pm:PCCP:Ir(mCNpptz-diPrp)$_3$ | 0.4:0.6:0.125 |
| | Hole-transport layer | 112 | 20 | PCCP | — |
| | Hole-injection layer | 111 | 20 | DBI3P-II:$MoO_3$ | 1:0.5 |
| | Electrode | 101 | 70 | ITSO | — |

<<Fabrication of Light-Emitting Element 14>>

As the electrode 101, an ITSO film was formed to a thickness of 70 nm over the substrate 200. The electrode area of the electrode 101 was set to 4 $mm^2$ (2 mm×2 mm).

As the hole-injection layer 111, DBT3P-II and $MoO_3$ were deposited over the electrode 101 by co-evaporation in a weight ratio of DBT3P-II:$MoO_3$=1:0.5 to a thickness of 20 nm.

As the hole-transport layer 112, PCCP was deposited over the hole-injection layer 111 by evaporation to a thickness of 20 nm.

As the light-emitting layer 160 over the hole-transport layer 112, 4,6mCzP2Pm, PCCP, and Ir(mCNpptz-diPrp)$_3$ were deposited by co-evaporation in a weight ratio of 4,6mCzP2Pm:PCCP:Ir(mCNpptz-diPrp)$_3$=0.4:0.6:0.125 to a thickness of 30 nm, and successively, 4,6mCzP2Pm, PCCP, and Ir(mCNpptz-diPrp)$_3$ were deposited by co-evaporation in a weight ratio of 4,6mCzP2Pm:PCCP:Ir(mCNpptz-diPrp)$_3$=0.8:0.2:0.125 to a thickness of 10 nm. Note that in the light-emitting layer 160, 4,6mCzP2Pm corresponds to the first organic compound, PCCP corresponds to the second organic compound, and Ir(mCNpptz-diPrp)$_3$ corresponds to the guest material (the phosphorescent compound).

As the electron-transport layer 118, 4,6mCzP2Pm and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 14 was sealed by fixing the substrate 220 to the substrate 200 over which the organic material was deposited using a sealant for an organic EL device. For the detailed method, description of the light-emitting element 1 can be referred to. Through the above steps, the light-emitting element 14 was obtained.

<Characteristics of Light-Emitting Element>

Figure 96:
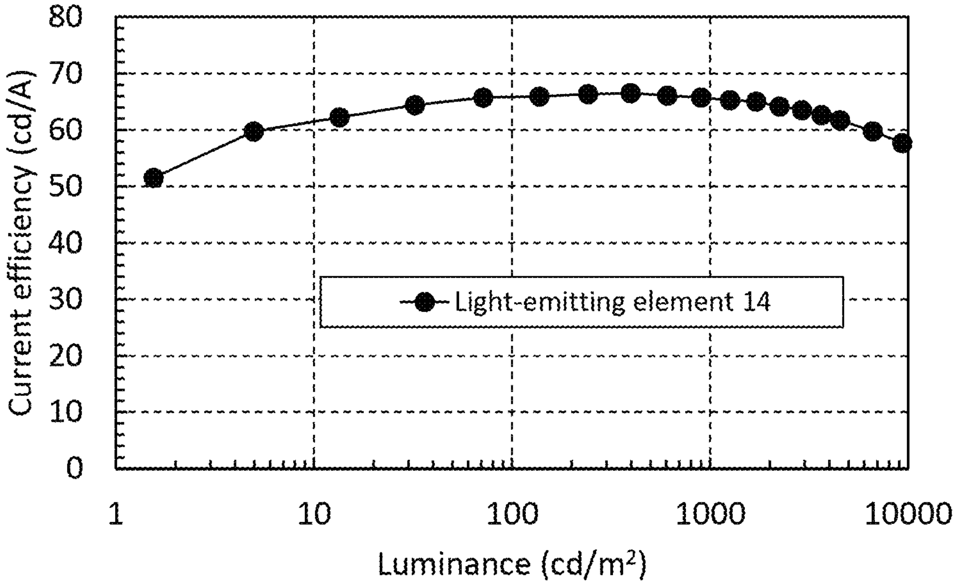
FIG. 96 is a graph showing current efficiency-luminance characteristics of a light-emitting element in Example.
Figure 97:
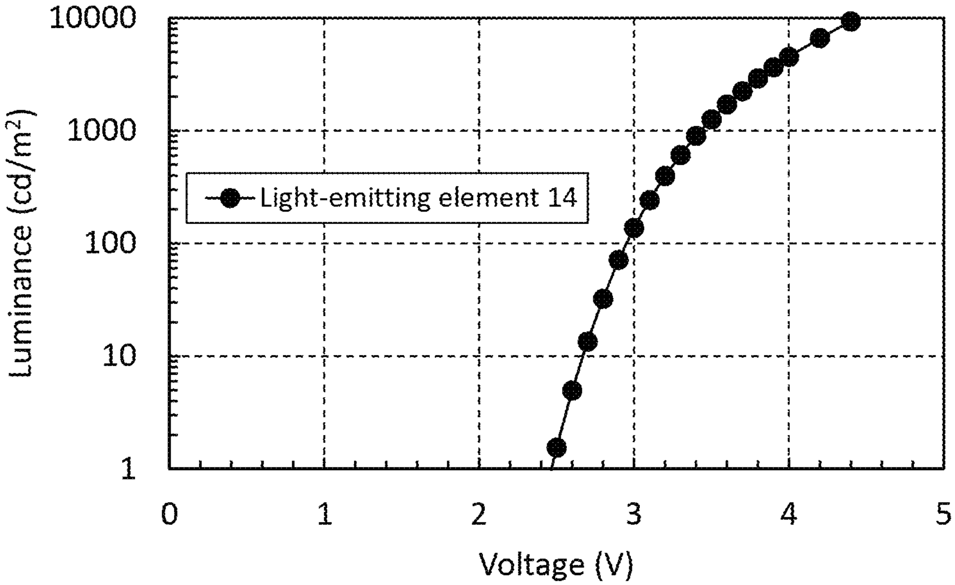
FIG. 97 is a graph showing luminance-voltage characteristics of a light-emitting element in Example.
Figure 98:
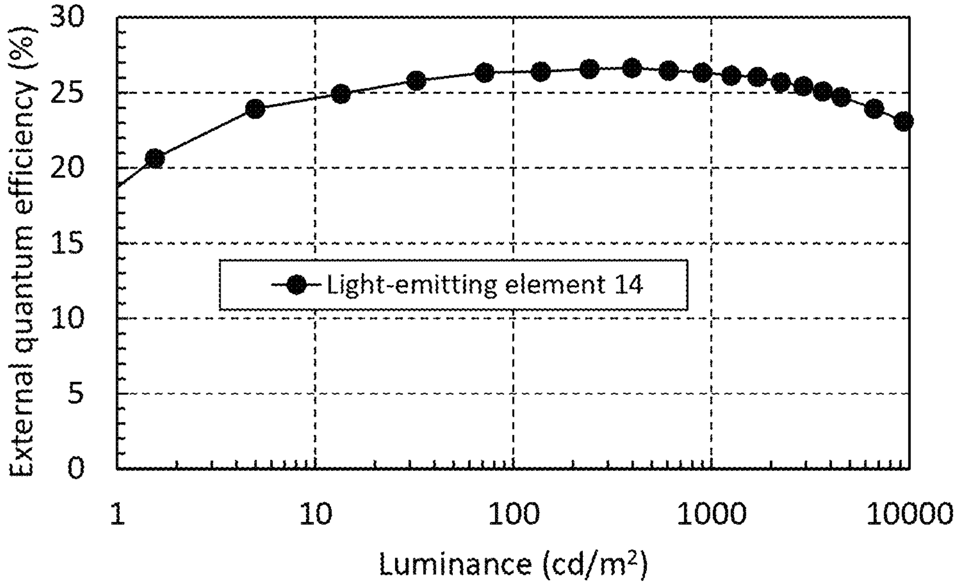
FIG. 98 is a graph showing external quantum efficiency-luminance characteristics of a light-emitting element in Example.
Figure 99:
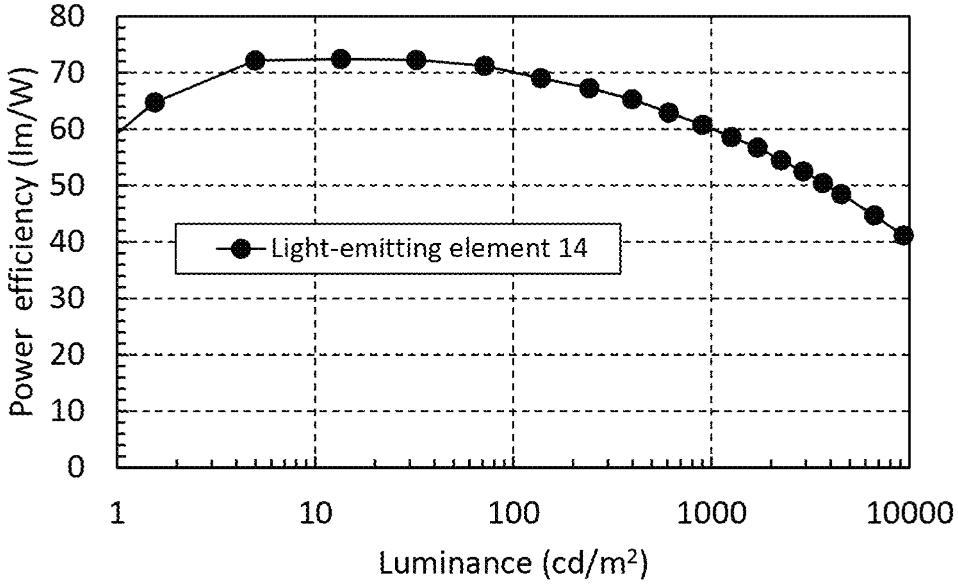
FIG. 99 is a graph showing power efficiency-luminance characteristics of a light-emitting element in Example.

FIG. 96 shows current efficiency-luminance characteristics of the light-emitting element 14. FIG. 97 shows luminance-voltage characteristics. FIG. 98 shows external quantum efficiency-luminance characteristics. FIG. 99 shows power efficiency-luminance characteristics. The measurement of the light-emitting element was performed at room temperature (in an atmosphere kept at 23° C.).

Table 14 shows element characteristics of the light-emitting element 14 at around 1000 cd/$m^2$.

TABLE 14

| | Voltage (V) | Current density ($mA/cm^2$) | Chromaticity (x, y) | Luminance ($cd/m^2$) | Current efficiency (cd/A) | Power efficiency (lm/W) | External quantum efficiency (%) |
|---|---|---|---|---|---|---|---|
| Light-emitting element 14 | 3.4 | 1.4 | (0.20, 0.46) | 900 | 66 | 61 | 26 |

Figure 100:
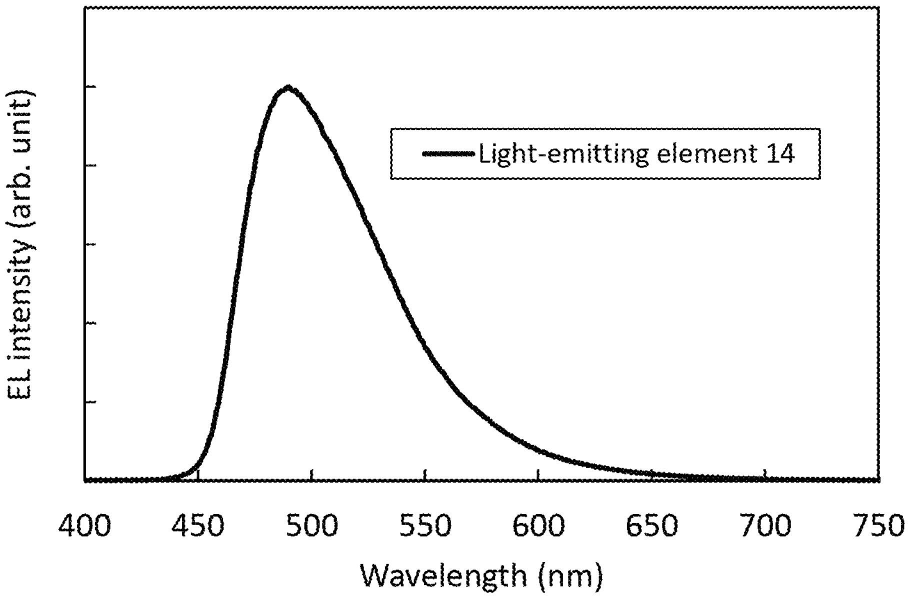
FIG. 100 is a graph showing an electroluminescence spectrum of a light-emitting element in Example.

FIG. 100 shows the emission spectrum of the light-emitting element 14 through which current flows at a current density of 2.5 $mA/cm^2$.

From FIG. 96 to FIG. 99 and Table 14, it is found that the light-emitting element 14 has high emission efficiency (high current efficiency and high external quantum efficiency). The maximum external quantum efficiency of the light-emitting element 14 is 27%, which is a favorable value. As shown in FIG. 100, the light-emitting element 14 emits blue light. The electroluminescence spectrum of the light-emitting element 14 has a peak at a wavelength of 490 nm and a full width at half maximum of 70 nm. Therefore, with use of an iridium complex including, as a ligand, an aryl group including a cyano group as a guest material, a light-emitting element emitting blue light with high emission efficiency can be fabricated.

As seen from FIG. 96 to FIG. 99 and Table 14, the light-emitting element 14 is driven at low driving voltage.

As described in the above Example, in the light-emitting element 14, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). In that case, carriers (electrons and holes) can be efficiently injected from a pair of electrodes to the first organic compound (4,6mCzP2Pm) and the second organic compound (PCCP), and the first organic compound (4,6mCzP2Pm) and the second organic compound (PCCP) can form an exciplex. Accordingly, the light-emitting element 14 has excellent characteristics that achieve both high emission efficiency and low driving voltage.

The absorption edge was obtained from data of the measured absorption spectrum of Ir(mCNpptz-diPrp)$_3$ (FIG. 79) shown in the above Example, and transition energy was estimated on the assumption of direct transition. As the result, the absorption edge of Ir(mCNpptz-diPrp)$_3$ was 472 nm and the transition energy thereof was 2.63 eV.

As shown in the above Example, the triplet excitation energy level (T1 level) of the first organic compound (4,6mCzP2Pm) is 2.70 eV and that of the second organic compound (PCCP) is 2.66 eV. Each triplet excitation energy level (T1 level) is higher than the transition energy of the guest material which is obtained from the absorption spectrum edge. Therefore, the first organic compound (4,6mCzP2Pm) and the second organic compound (PCCP), which were used as host materials, have triplet excitation energy levels (T1 levels) high enough for host materials.

An energy difference between the LUMO level and the HOMO level of Ir(mCNpptz-diPrp)$_3$ was 2.99 eV. The value was obtained from the CV measurement results.

That is, the energy difference between the LUMO level and the HOMO level of Ir(mCNpptz-diPrp)$_3$ is larger than the transition energy thereof obtained from the absorption edge by 0.36 eV.

As shown in FIG. 100, a peak wavelength on the shortest wavelength side of the electroluminescence spectrum of the light-emitting element 14 was 490 nm. According to that, the light emission energy of Ir(mCNpptz-diPrp)$_3$ was calculated to be 2.53 eV.

That is, the energy difference between the LUMO level and the HOMO level of Ir(mCNpptz-diPrp)$_3$ was larger than the light emission energy by 0.46 eV.

Consequently, in each of the guest materials of the light-emitting elements, the energy difference between the LUMO level and the HOMO level is larger than the transition energy obtained from the absorption edge by 0.3 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

Note that in the light-emitting element 14, an energy difference between the LUMO level of the first organic compound (4,6mCzP2Pm) and the HOMO level of the second organic compound (PCCP) (4,6mCzP2Pm and PCCP are host materials) was calculated to be 2.75 eV from Table 3. Consequently, energy corresponding to the energy difference between the LUMO level and the HOMO level of an exciplex formed by the host materials in the light-emitting element 14 is smaller than the energy difference between the LUMO level and the HOMO level (2.99 eV) of the guest material (Ir(mCNpptz-diPrp)$_3$), and larger than the transition energy (2.63 eV) obtained from the absorption edge. Therefore, in the light-emitting element 14, the guest material can be excited through the exciplex, whereby the driving voltage can be lowered. Therefore, the light-emitting element of one embodiment of the present invention enable reduction in power consumption.

As described above, by employing the structure of one embodiment of the present invention, a light-emitting element having high emission efficiency can be provided. A light-emitting element with low power consumption can be provided. A light-emitting element emitting blue light and having high emission efficiency can be provided.

The structure described in this embodiment can be used in combination with any of the structures described in the other examples and embodiments as appropriate.

Example 18

In this example, an example of fabricating a light-emitting element (a light-emitting element 15) of one embodiment of the present invention is described. The schematic cross-sectional views of FIG. 42 can be referred to for cross section of the light-emitting element fabricated in this example. The detailed element structure is shown in Table 15. For the structures and abbreviations of the compounds used here, those in Examples described above can be referred to.

TABLE 15

| | Layer | Reference numeral | Thickness (nm) | Material | Weight ratio |
|---|---|---|---|---|---|
| Light-emitting element 15 | Electrode | 102 | 200 | Al | — |
| | Electron-injection layer | 119 | 1 | LiF | — |
| | Electron-transport layer | 118(2) | 15 | BPhen | — |
| | | 118(1) | 30 | 4,6mCzP2Pm | — |
| | Light-emitting layer | 160 | 22 | 4,6mCzP2Pm:mCzPICz:Ir(MdmCN5btzl-tmp)$_3$ | 0.4:0.6:0.125 |
| | Hole-transport layer | 112 | 20 | dmCBP | — |
| | Hole-injection layer | 111 | 20 | DBT3P-II:$MoO_3$ | 1:0.5 |
| | Electrode | 101 | 70 | ITSO | — |

<<Fabrication of Light-Emitting Element 15>>

As the electrode 101, an ITSO film was formed to a thickness of 70 nm over the substrate 200. The electrode area of the electrode 101 was set to 4 $mm^2$ (2 mm×2 mm).

As the hole-injection layer 111, DBT3P-II and $MoO_3$ were deposited over the electrode 101 by co-evaporation in a weight ratio of DBT3P-II:$MoO_3$=1:0.5 to a thickness of 20 nm.

As the hole-transport layer 112, dmCBP was deposited over the hole-injection layer 111 by evaporation to a thickness of 20 nm.

As the light-emitting layer 160 over the hole-transport layer 112, 4,6mCzP2Pm, mCzPICz, and Ir(MdmCN5btz1-tmp)$_3$ were deposited by co-evaporation in a weight ratio of 4,6mCzP2Pm:mCzPICz:Ir(MdmCN5btz1-tmp)$_3$=0.4:0.6:0.125 to a thickness of 22 nm. Note that in the light-emitting layer 160, 4,6mCzP2Pm corresponds to the first organic compound, mCzPICz corresponds to the second organic compound, and Ir(MdmCN5btz1-tmp)$_3$ corresponds to the guest material (the phosphorescent compound).

As the electron-transport layer 118, 4,6mCzP2Pm and BPhen were sequentially deposited by evaporation to thicknesses of 30 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 15 was sealed by fixing the substrate 220 to the substrate 200 over which the organic material was deposited using a sealant for an organic EL device. For the detailed method, description of the light-emitting element 1 can be referred to. Through the above steps, the light-emitting element 15 was obtained.

<Characteristics of Light-Emitting Elements>

Figure 101:
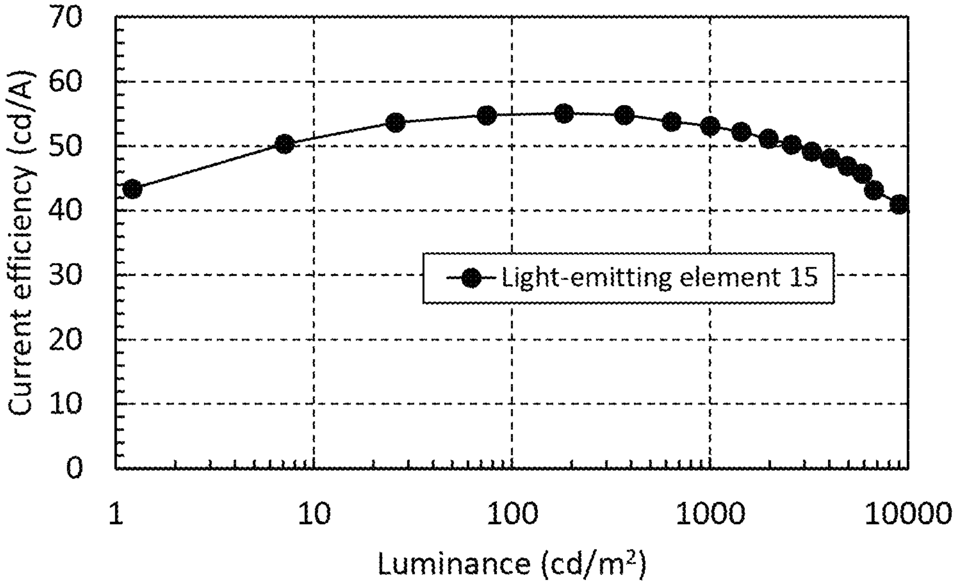
FIG. 101 is a graph showing current efficiency-luminance characteristics of a light-emitting element in Example.
Figure 102:
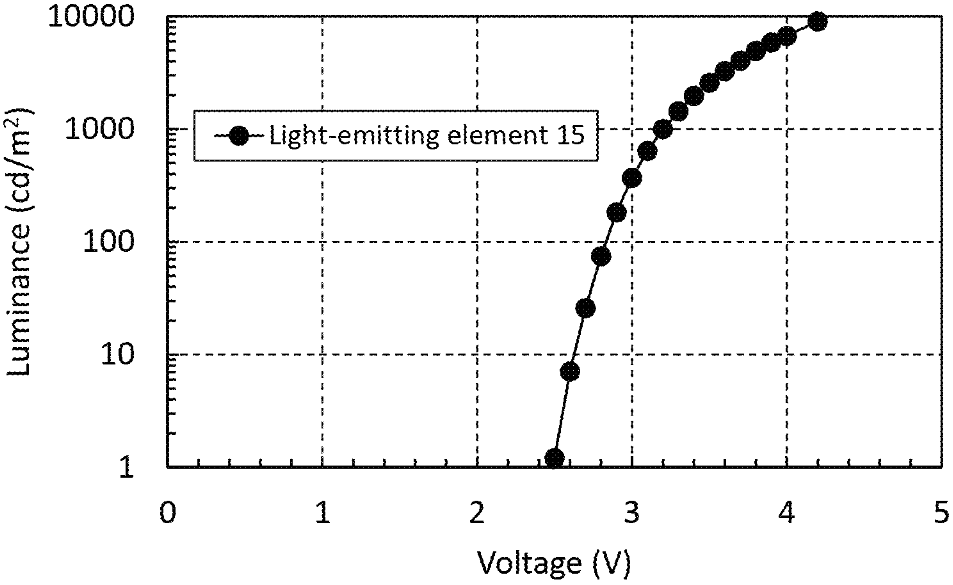
FIG. 102 is a graph showing luminance-voltage characteristics of a light-emitting element in Example.
Figure 103:
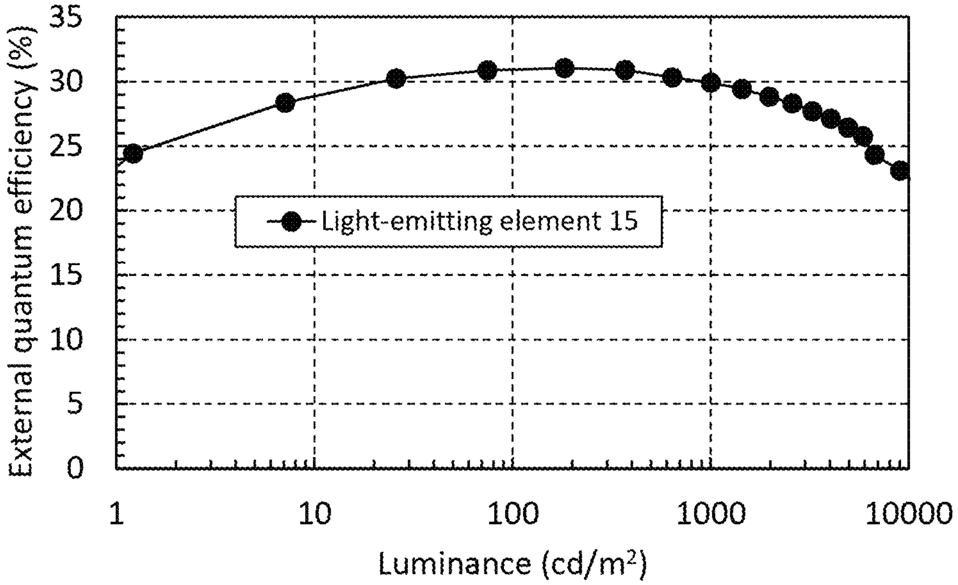
FIG. 103 is a graph showing external quantum efficiency-luminance characteristics of a light-emitting element in Example.
Figure 104:
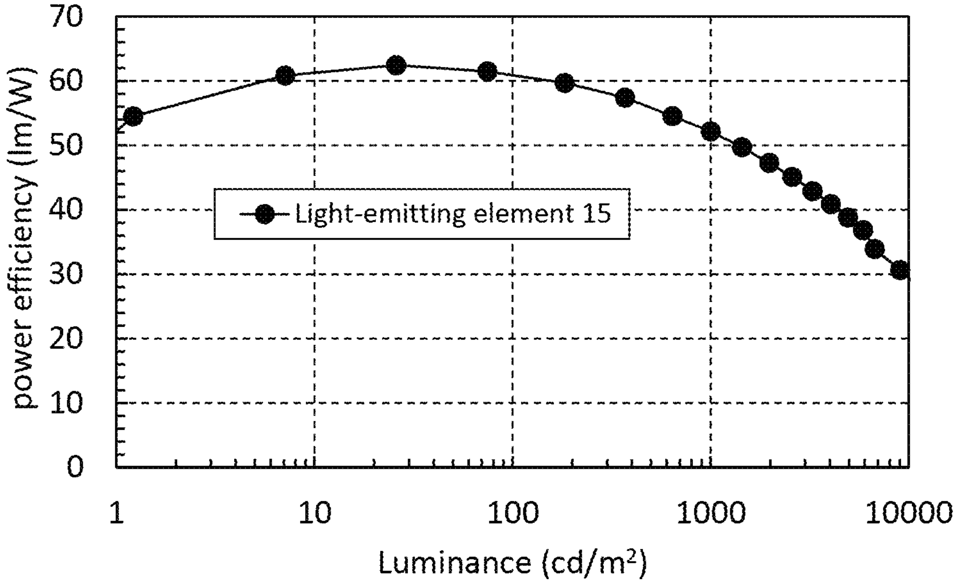
FIG. 104 is a graph showing power efficiency-luminance characteristics of a light-emitting element in Example.

FIG. 101 shows current efficiency-luminance characteristics of the light-emitting element 15. FIG. 102 shows luminance-voltage characteristics. FIG. 103 shows external quantum efficiency-luminance characteristics. FIG. 104 shows power efficiency-luminance characteristics. The measurement of the light-emitting element was performed at room temperature (in an atmosphere kept at 23° C.).

Table 16 shows element characteristics of the light-emitting element 15 at around 1000 cd/$m^2$.

TABLE 16

| | Voltage (V) | Current density (mA/$cm^2$) | Chromaticity (x, y) | Luminance (cd/$m^2$) | Current efficiency (cd/A) | Power efficiency (lm/W) | External quantum efficiency (%) |
|---|---|---|---|---|---|---|---|
| Light-emitting element 15 | 3.2 | 1.9 | (0.16, 0.28) | 1000 | 53 | 52 | 30 |

Figure 105:
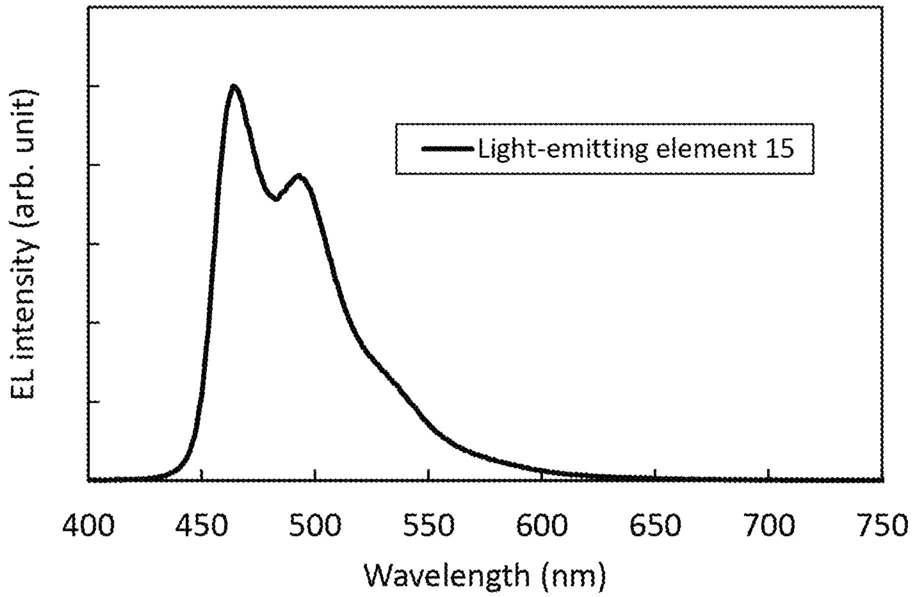
FIG. 105 is a graph showing an electroluminescence spectrum of a light-emitting element in Example.

FIG. 105 shows the emission spectrum of the light-emitting element 15 through which current flows at a current density of 2.5 mA/$cm^2$.

From FIG. 101 to FIG. 104 and Table 16, it is found that the light-emitting element 15 has high emission efficiency (high current efficiency and high external quantum efficiency). The maximum external quantum efficiency of the light-emitting element 15 is 31%, which is an excellent value.

As shown in FIG. 105, the light-emitting element 15 emits blue light with high color purity. The electroluminescence spectrum of the light-emitting element 15 has a peak at a wavelength of 464 nm and a full width at half maximum of 55 nm. Therefore, with use of an iridium complex including, as a ligand, an aryl group including a cyano group as a guest material, a light-emitting element emitting blue light with high emission efficiency can be fabricated.

As seen from FIG. 101 to FIG. 104 and Table 16, the light-emitting element 15 is driven at low driving voltage.

As described in the above Example, in the light-emitting element 15, the LUMO level of the first organic compound (4,6mCzP2Pm) is lower than that of the second organic compound (mCzPICz), the HOMO level of the first organic compound (4,6mCzP2Pm) is lower than that of the second organic compound (mCzPICz), the LUMO level of the guest material (Ir(MdmCN5btz1-tmp)$_3$) is higher than that of the first organic compound (4,6mCzP2Pm), and the HOMO level of the guest material (Ir(MdmCN5btz1-tmp)$_3$) is lower than that of the second organic compound (mCzPICz). In that case, carriers (electrons and holes) can be efficiently injected from a pair of electrodes to the first organic compound (4,6mCzP2Pm) and the second organic compound (mCzPICz), and the first organic compound (4,6mCzP2Pm) and the second organic compound (mCzPICz) can form an exciplex. Accordingly, the light-emitting element 15 has excellent characteristics that achieve both high emission efficiency and low driving voltage.

The absorption edge was obtained from data of the measured absorption spectrum of Ir(MdmCN5btz1-tmp)$_3$ (FIG. 82) shown in the above Example, and transition energy was estimated on the assumption of direct transition. As the result, the absorption edge of Ir(MdmCN5btz1-tmp)$_3$ was 464 nm and the transition energy thereof was 2.67 eV.

As shown in the above Example, the triplet excitation energy level (T1 level) of the first organic compound (4,6mCzP2Pm) is 2.70 eV and that of the second organic compound (mCzPICz) is 2.81 eV. Each triplet excitation energy level (T1 level) is higher than the transition energy of the guest material which is obtained from the absorption spectrum edge. Therefore, the first organic compound (4,6mCzP2Pm) and the second organic compound (mCzPICz), which were used as host materials, have triplet excitation energy levels (T1 levels) high enough for host materials.

An energy difference between the LUMO level and the HOMO level of Ir(MdmCN5btz1-tmp)$_3$ was 3.42 eV. The value was obtained from the CV measurement results.

That is, the energy difference between the LUMO level and the HOMO level of Ir(MdmCN5btz1-tmp)$_3$ is larger than the transition energy thereof obtained from the absorption edge by 0.75 eV.

As shown in FIG. 105, a peak wavelength on the shortest wavelength side of the electroluminescence spectrum of the light-emitting element 15 was 464 nm. According to that, the light emission energy of Ir(MdmCN5btz1-tmp)$_3$ was calculated to be 2.67 eV.

That is, the energy difference between the LUMO level and the HOMO level of Ir(MdmCN5btz1-tmp)$_3$ was larger than the light emission energy by 0.75 eV.

Consequently, in each of the guest materials of the light-emitting elements, the energy difference between the LUMO level and the HOMO level is larger than the transition energy obtained from the absorption edge by 0.4 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

Note that in the light-emitting element 15, an energy difference between the LUMO level of the first organic compound (4,6mCzP2Pm) and the HOMO level of the second organic compound (mCzPICz) (4,6mCzP2Pm and PCCP are host materials) was calculated to be 2.74 eV from Table 3. Consequently, energy corresponding to the energy difference between the LUMO level and the HOMO level of an exciplex formed by the host materials in the light-emitting element 15 is smaller than the energy difference between the LUMO level and the HOMO level (3.42 eV) of the guest material (Ir(MdmCN5btz1-tmp)$_3$), and larger than the transition energy (2.67 eV) obtained from the absorption edge. Therefore, in the light-emitting element 15, the guest material can be excited through the exciplex, whereby the driving voltage can be lowered. Therefore, the light-emitting element of one embodiment of the present invention enable reduction in power consumption.

As described above, with the structure in which the LUMO level of the first organic compound is lower than that of the second organic compound, the HOMO level of the first organic compound is lower than that of the second organic compound, the LUMO level of the guest material is higher than that of the first organic compound, the HOMO level of the guest material is lower than that of the second organic compound, and a combination of the first organic compound and the second organic compound forms an exciplex, a light-emitting element emitting blue light that achieves high emission efficiency and low driving voltage can be provided. An iridium complex including a cyano group is preferred as the guest material in this structure.

As described above, by employing the structure of one embodiment of the present invention, a light-emitting element having high emission efficiency can be provided. A light-emitting element with low power consumption can be provided. A light-emitting element emitting blue light and having high emission efficiency can be provided.

The structure described in this embodiment can be used in combination with any of the structures described in the other examples and embodiments as appropriate.

Example 19

In this example, an example of fabricating a light-emitting element (a light-emitting element 16) of one embodiment of the present invention is described. The schematic cross-sectional views of FIG. 42 can be referred to for cross sections of the light-emitting element fabricated in this example. The detailed element structure is shown in Table 17. For the structures and abbreviations of the compounds used here are given below. Note that the above Examples can be referred to for other compounds.

mCzP2ICz

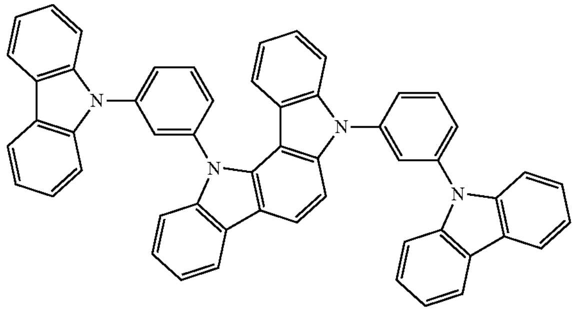

-continued

FIr6

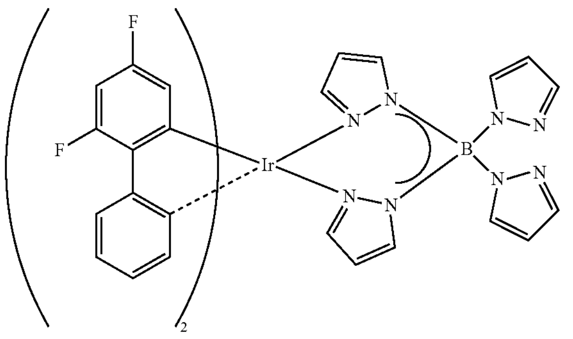

TABLE 17

| | Layer | Reference numeral | Thickness (nm) | Material | Weight ratio |
|---|---|---|---|---|---|
| Light-emitting element 16 | Electrode | 102 | 200 | Al | — |
| | Electron-injection layer | 119 | 1 | LiF | — |
| | Electron-transport layer | 118(2) | 15 | BPhen | — |
| | | 118(1) | 10 | 4,6mCzP2Pm | — |
| | Light-emitting layer | 160 | 40 | 4,6mCzP2Pm:mCzP2ICz:FIr6 | 0.6:0.2:0.2 |
| | Hole-transport layer | 112 | 20 | dmCBP | — |
| | Hole-injection layer | 111 | 20 | DBT3P-II:$MoO_3$ | 1:0.5 |
| | Electrode | 101 | 70 | ITSO | — |

<<Fabrication of Light-Emitting Element 16>>

As the electrode 101, an ITSO film was formed to a thickness of 70 nm over the substrate 200. The electrode area of the electrode 101 was set to 4 $mm^2$ (2 mm×2 mm).

As the hole-injection layer 111, DBT3P-II and $MoO_3$ were deposited over the electrode 101 by co-evaporation in a weight ratio of DBT3P-II:$MoO_3$=1:0.5 to a thickness of 20 nm.

As the hole-transport layer 112, dmCBP was deposited by evaporation over the hole-injection layer 111 to a thickness of 20 nm.

As the light-emitting layer 160 over the hole-transport layer 112, 4,6mCzP2Pm, 5,12-bis[3-(9H-carbazol-9-yl)phenyl]-5,12-dihydro-indolo[3,2-a]carbazole (abbreviation: mCzP2ICz), and FIr6 were deposited by co-evaporation in a weight ratio of 4,6mCzP2Pm:mCzP2ICz:FIr6=0.6:0.2:0.2 to a thickness of 40 nm. Note that in the light-emitting layer 160, 4,6mCzP2Pm corresponds to the first organic compound, mCzP2ICz corresponds to the second organic compound, and FIr6 corresponds to the guest material (the phosphorescent compound).

As the electron-transport layer 118, 4,6mCzP2Pm and BPhen were sequentially deposited by evaporation to thicknesses of 10 nm and 15 nm, respectively, over the light-emitting layer 160. Then, as the electron-injection layer 119, lithium fluoride (LiF) was deposited over the electron-transport layer 118 by evaporation to a thickness of 1 nm.

As the electrode 102, aluminum (Al) was deposited over the electron-injection layer 119 to a thickness of 200 nm.

Next, in a glove box containing a nitrogen atmosphere, the light-emitting element 16 was sealed by fixing the substrate 220 to the substrate 200 over which the organic material was deposited using a sealant for an organic EL device. For the detailed method, description of the light-emitting element 1 can be referred to. Through the above steps, the light-emitting element 16 was obtained.

<Emission Spectra of Host Materials>

Figure 106:
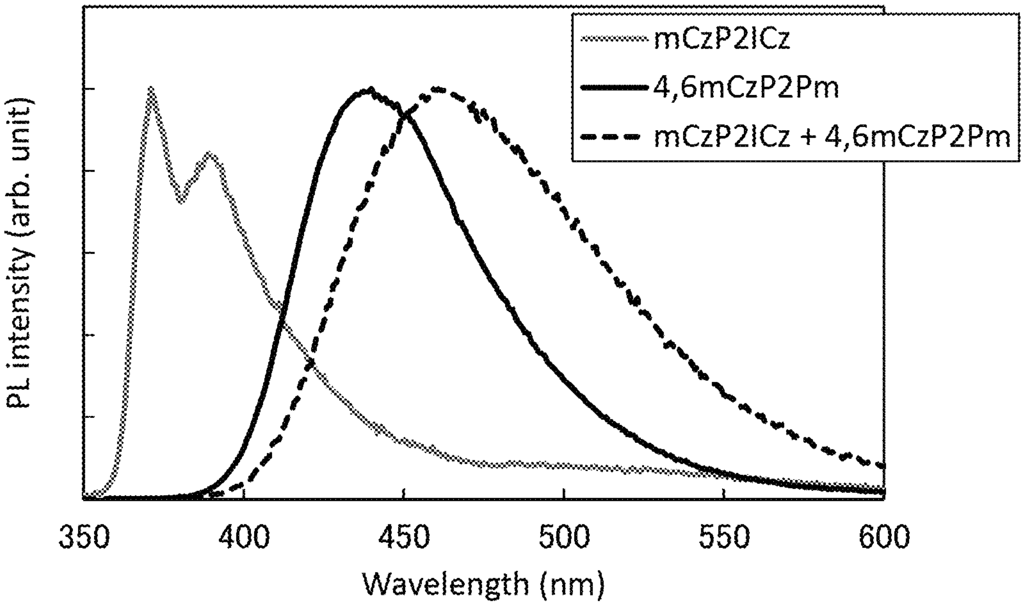
FIG. 106 is a graph showing emission spectra of host materials in Example.

In the fabricated light-emitting element 16, 4,6mCzP2Pm and mCzP2ICz were used as host materials (the first organic compound and the second organic compound). FIG. 106 shows measurement results of emission spectra of a thin film of 4,6mCzP2Pm, a thin film of mCzP2ICz, and a mixed thin film of 4,6mCzP2Pm and mCzP2ICz.

For the emission spectrum measurement, thin film samples were formed over a quartz substrate by a vacuum evaporation method. The emission spectra were measured at room temperature (in an atmosphere kept at 23° C.) with a PL-EL measurement apparatus (produced by Hamamatsu Photonics K.K.). The thickness of each thin film was 50 nm. The mixing ratio of the two compounds (the first organic compound: the second organic compound) in the mixed thin film was 1:1.

As shown in FIG. 106, a peak wavelength of the emission spectrum of the mixed thin film of 4,6mCzP2Pm and mCzP2ICz is 460 nm. The emission spectrum differs from the emission spectrum of 4,6mCzP2Pm (peak wavelength: 440 nm) and the emission spectrum of mCzP2ICz (peak wavelength: 388 nm). As described later, the LUMO level of 4,6mCzP2Pm is lower than that of mCzP2ICz, and the HOMO level of mCzP2ICz is higher than that of 4,6mCzP2Pm. The energy of light emission from the mixed thin film of 4,6mCzP2Pm and mCzP2ICz approximately corresponds to an energy difference between the LUMO level of 4,6mCzP2Pm and the HOMO level of mCzP2ICz. The light emission from the mixed thin film of 4,6mCzP2Pm and mCzP2ICz has a longer wavelength (lower energy) than light emission from 4,6mCzP2Pm and light emission from mCzP2ICz. Therefore, it can be said that the light emission from the mixed thin film of 4,6mCzP2Pm and mCzP2ICz is light emission from an exciplex formed by 4,6mCzP2Pm and mCzP2ICz. That is, a combination of 4,6mCzP2Pm and mCzP2ICz is a combination of organic compounds which forms an exciplex. With use of 4,6mCzP2Pm and mCzP2ICz as host materials, a light-emitting element utilizing ExTET can be fabricated.

Therefore, the light-emitting element 16 includes host materials in which a combination of the first organic compound and the second organic compound forms an exciplex.

As described later, an absorption band on the lowest energy side (the longest wavelength side) of the absorption spectrum of FIr6 has a region overlapping the emission spectrum of an exciplex formed by 4,6mCzP2Pm and mCzP2ICz. Therefore, in the light-emitting element using 4,6mCzP2Pm and mCzP2ICz as host materials, excitation energy can be effectively transferred to the guest material.

Next, the triplet excitation energy level (T1 level) of mCzP2ICz which was used as a host material was measured.

Note that the triplet excitation energy level (T1 level) of 4,6mCzP2Pm is described in the above Example.

For the triplet excitation energy level measurement, phosphorescence from the thin film sample of the compound was measured. The measurement was performed by using a PL microscope, LabRAM HR-PL, produced by HORIBA, Ltd., a He—Cd laser (325 nm) as excitation light, and a CCD detector at a measurement temperature of 10 K. The triplet excitation energy level (T1 level) was obtained from a peak on the shortest wavelength side of the phosphorescent spectrum obtained by the measurement.

A peak wavelength on the shortest wavelength side of the phosphorescence emission spectrum of mCzP2ICz was 442 nm. The triplet excitation energy level (T1 level) of mCzP2ICz was 2.81 eV. As shown in the above Example, the triplet excitation energy level (T1 level) of 4,6mCzP2Pm was 2.70 eV.

A peak wavelength on the shortest wavelength side of the phosphorescence emission spectrum of each of 4,6mCzP2Pm and mCzP2ICz is shorter than a peak wavelength on the shortest wavelength side of the emission spectrum of the exciplex formed by 4,6mCzP2Pm and mCzP2ICz which is shown in FIG. 106. The exciplex has a feature in that an energy difference between the singlet excitation energy level (S1 level) and the triplet excitation energy level (T1 level) is small. Therefore, the triplet excitation energy level (T1 level) of the exciplex can be obtained from a peak wavelength on the shortest wavelength side of the emission spectrum. Accordingly, the triplet excitation energy level (T1 level) of each of the first organic compound (4,6mCzP2Pm) and the second organic compound (mCzP2ICz) is higher than the triplet excitation energy level (T1 level) of the exciplex.

As shown later, the triplet excitation energy level (T1 level) of each of 4,6mCzP2Pm and mCzP2ICz is higher than the transition energy of FIr6 which is obtained from the absorption spectrum edge.

Therefore, the first organic compound (4,6mCzP2Pm) and the second organic compound (mCzP2ICz), which were used as host materials in this example, have triplet excitation energy levels (T1 levels) high enough for host materials.

<Characteristics of Light-Emitting Element>

Figure 107:
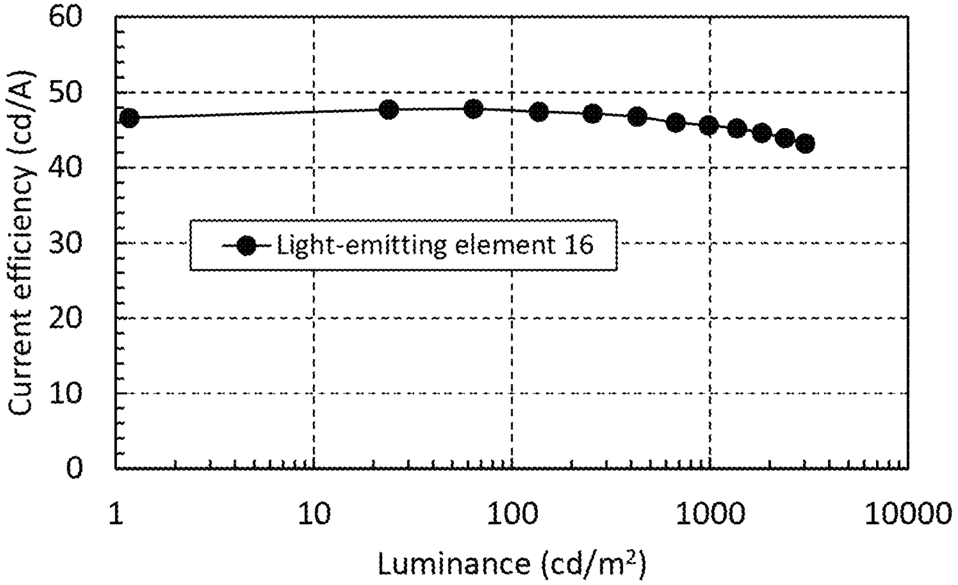
FIG. 107 is a graph showing current efficiency-luminance characteristics of a light-emitting element in Example.
Figure 108:
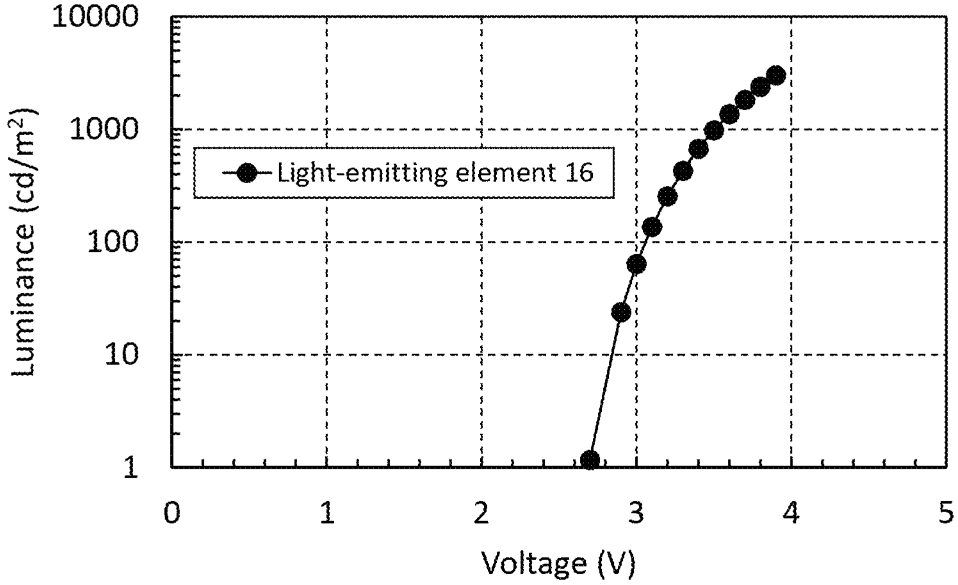
FIG. 108 is a graph showing luminance-voltage characteristics of a light-emitting element in Example.
Figure 109:
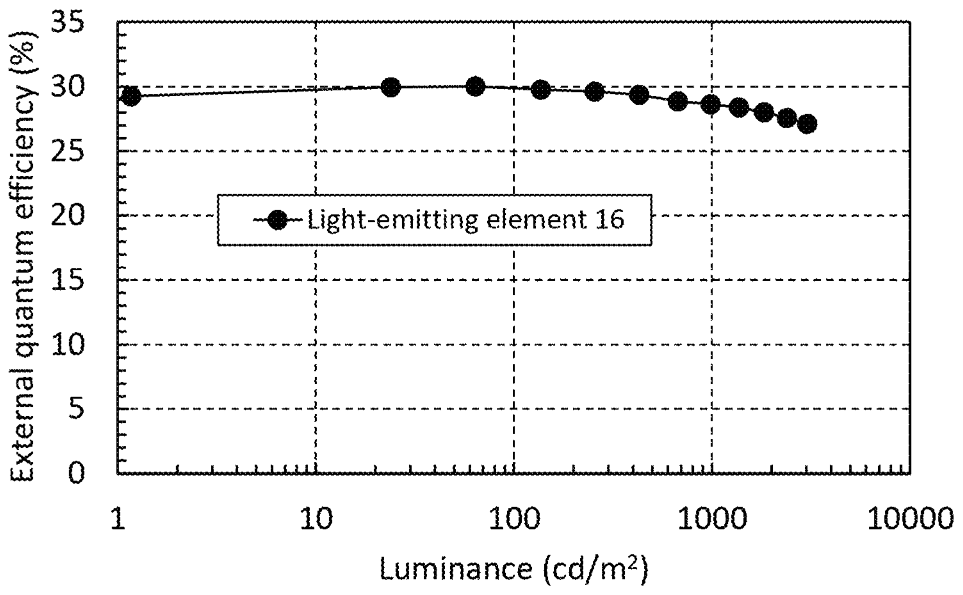
FIG. 109 is a graph showing external quantum efficiency-luminance characteristics of a light-emitting element in Example.
Figure 110:
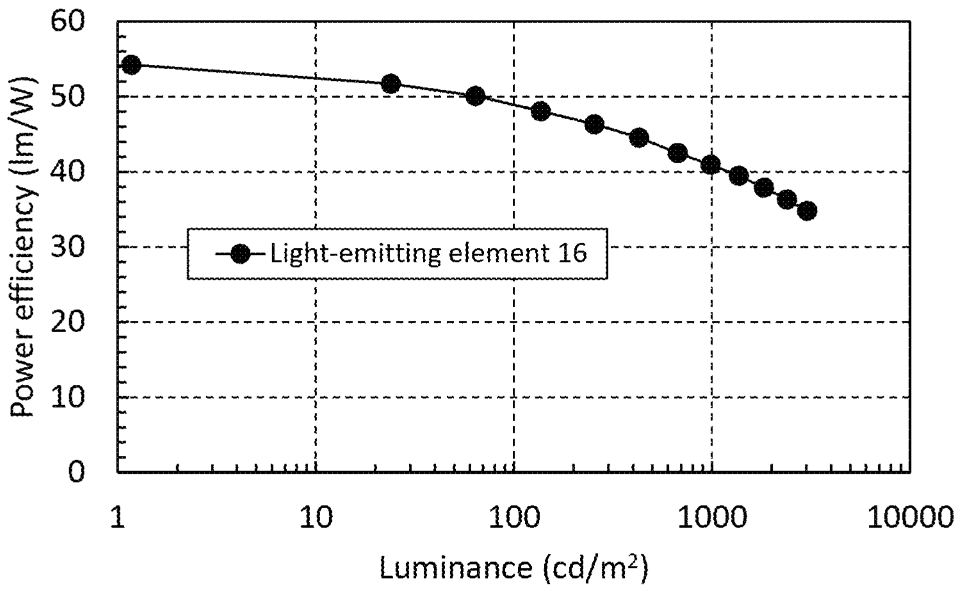
FIG. 110 is a graph showing power efficiency-luminance characteristics of a light-emitting element in Example.

FIG. 107 shows current efficiency-luminance characteristics of the light-emitting element 16. FIG. 108 shows luminance-voltage characteristics. FIG. 109 shows external quantum efficiency-luminance characteristics. FIG. 110 shows power efficiency-luminance characteristics. The measurement of the light-emitting element was performed at room temperature (in an atmosphere kept at 23° C.).

Table 18 shows element characteristics of the light-emitting element 16 at around 1000 cd/m$^2$.

TABLE 18

| | Voltage (V) | Current density (mA/cm$^2$) | Chromaticity (x, y) | Luminance (cd/m$^2$) | Current efficiency (cd/A) | Power efficiency (lm/W) | External quantum efficiency (%) |
|---|---|---|---|---|---|---|---|
| Light-emitting element 16 | 3.5 | 2.2 | (0.15, 0.25) | 980 | 46 | 41 | 29 |

Figure 111:
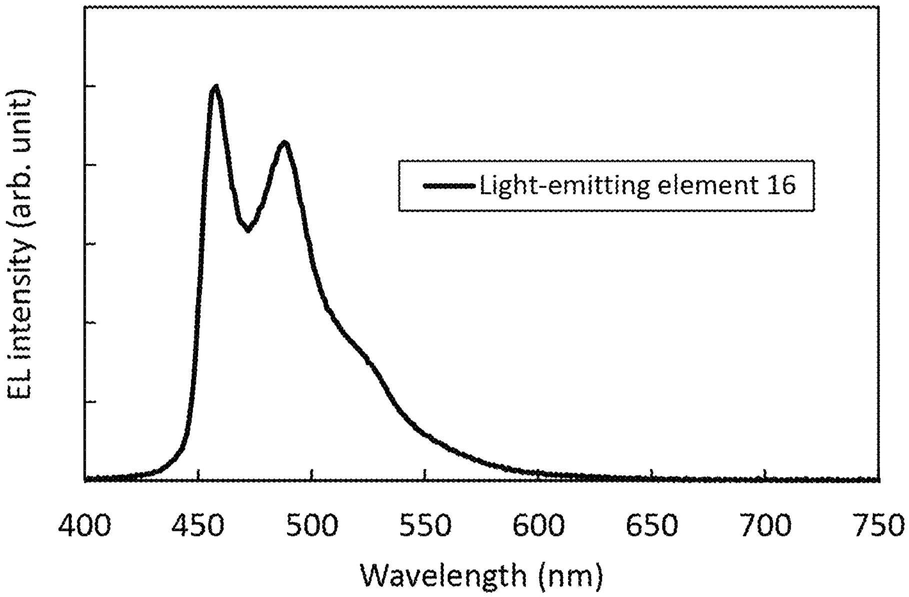
FIG. 111 is a graph showing an electroluminescence spectrum of a light-emitting element in Example.

FIG. 111 shows the emission spectrum of the light-emitting element 16 through which current flows at a current density of 2.5 mA/cm$^2$.

From FIG. 107 to FIG. 110 and Table 18, it is found that the light-emitting element 16 has high emission efficiency (high current efficiency and high external quantum efficiency). The maximum external quantum efficiency of the light-emitting element 16 is 30%, which is an excellent value.

As shown in FIG. 111, the light-emitting element 16 emits blue light with high color purity. The electroluminescence spectrum of the light-emitting element 16 has a peak at a wavelength of 458 nm and a full width at half maximum of 54 nm.

As shown in FIG. 107 to FIG. 110 and Table 18, the light-emitting element 16 was driven at low voltage.

<Results of CV Measurement>

The electrochemical characteristics (oxidation reaction characteristics and reduction reaction characteristics) of the second organic compound (mCzP2ICz) as the host material and the guest material (FIr6) used in the above-described light-emitting element were examined by cyclic voltammetry (CV). Note that for the measurement, an electrochemical analyzer (ALS model 600A or 600C, produced by BAS Inc.) was used, and measurement was performed on solutions obtained by dissolving the compounds in DMF. In the measurement, the potential of a working electrode with respect to the reference electrode was changed within an appropriate range, so that the oxidation peak potential and the reduction peak potential were obtained. In addition, the HOMO and LUMO levels of each compound were obtained from the estimated redox potential of the reference electrode of −4.94 eV and the obtained peak potentials.

Table 19 shows oxidation potentials and reduction potentials obtained by CV measurement and HOMO levels and LUMO levels of the compounds obtained from the CV measurement results. For the measured value of 4,6mCzP2Pm, the above Example is referred to.

TABLE 19

| Abbreviation | Oxidation potential (V) | Reduction potential (V) | HOMO level calculated based on oxidation potential (eV) | LUMO level calculated based on reduction potential (eV) |
|---|---|---|---|---|
| mCzP2ICz | 0.70 | −3.03 | −5.64 | −1.92 |
| 4,6mCzP2Pm | 0.95 | −2.06 | −5.89 | −2.88 |
| FIr6 | 1.18 | −2.34 | −6.12 | −2.61 |

As shown in Table 19, in the light-emitting element 16, the LUMO level of the first organic compound (4,6mCzP2Pm) is lower than that of the second organic compound (mCzP2ICz), the HOMO level of the first organic compound (4,6mCzP2Pm) is lower than that of the second organic compound (mCzP2ICz), the LUMO level of the guest material (FIr6) is higher than that of the first organic compound (4,6mCzP2Pm), and the HOMO level of the guest material (FIr6) is lower than that of the second organic compound (mCzP2ICz). In that case, carriers (electrons and holes) can be efficiently injected from a pair of electrodes to the first organic compound (4,6mCzP2Pm) and the second organic compound (mCzP2ICz), and the first organic compound (4,6mCzP2Pm) and the second organic compound (mCzP2ICz) can form an exciplex. Accordingly, the light-emitting element 16 has excellent characteristics that achieve both high emission efficiency and low driving voltage.

<Absorption Spectra of Guest Material>

Figure 112:
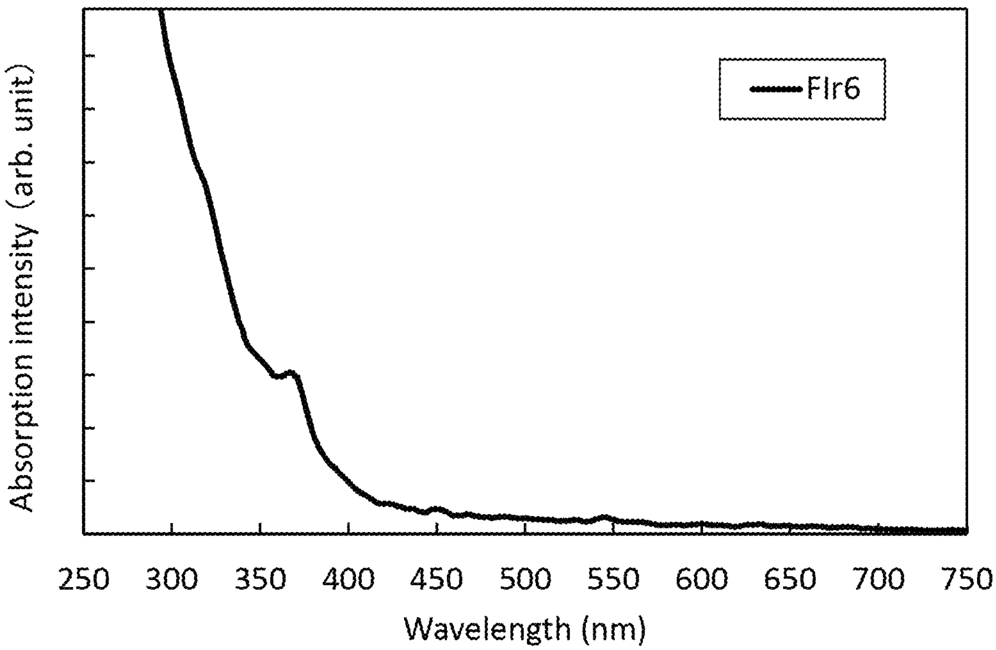
FIG. 112 is a graph showing an absorption spectrum of a compound in Example.

FIG. 112 shows the measurement result of the absorption spectrum of FIr6 that is a guest material in the light-emitting element.

For the absorption spectrum measurement, a dichloromethane solution in which FIr6 was dissolved was prepared, and a quartz cell was used. The absorption spectrum was measured using an ultraviolet-visible spectrophotometer (V-550, produced by JASCO Corporation). Then, the absorption spectrum of quartz cell was subtracted from the measured spectrum of the sample.

Next, the absorption edge was obtained from data of the measured absorption spectrum, and transition energy was estimated on the assumption of direct transition. As the result, the absorption edge of FIr6 was 454 nm and the transition energy thereof was 2.73 eV.

An energy difference between the LUMO level and the HOMO level of FIr6 was 3.52 eV. The value was obtained from the CV measurement results shown in Table 19.

That is, the energy difference between the LUMO level and the HOMO level of FIr6 is larger than the transition energy thereof obtained from the absorption edge by 0.79 eV.

As shown in FIG. 111, a peak wavelength on the shortest wavelength side of the electroluminescence spectrum of the light-emitting element 16 was 458 nm. According to that, the light emission energy of FIr6 was calculated to be 2.70 eV.

That is, the energy difference between the LUMO level and the HOMO level of FIr6 was larger than the light emission energy by 0.82 eV.

Consequently, in each of the guest materials of the light-emitting elements, the energy difference between the LUMO level and the HOMO level is larger than the transition energy obtained from the absorption edge by 0.4 eV or more. In addition, the energy difference between the LUMO level and the HOMO level is larger than the light emission energy by 0.4 eV or more. Therefore, high energy corresponding to the energy difference between the LUMO level and the HOMO level is needed, that is, high voltage is needed when carriers injected from a pair of electrodes are directly recombined in the guest material.

However, in the light-emitting element of one embodiment of the present invention, the guest material can be excited by energy transfer from an exciplex without the direct carrier recombination in the guest material, whereby the driving voltage can be lowered. Therefore, the light-emitting element of one embodiment of the present invention enables reduction in power consumption.

Note that in the light-emitting element 16, an energy difference between the LUMO level of the first organic compound (4,6mCzP2Pm) and the HOMO level of the second organic compound (mCzP2ICz) (4,6mCzP2Pm and mCzP2ICz are host materials) was calculated to be 2.76 eV from Table 19. Consequently, energy corresponding to the energy difference between the LUMO level and the HOMO level of an exciplex formed by the host materials in the light-emitting element 16 is smaller than the energy difference between the LUMO level and the HOMO level (3.52 eV) of the guest material (FIr6), and larger than the transition energy (2.73 eV) obtained from the absorption edge. Therefore, in the light-emitting element 16, the guest material can be excited through the exciplex, whereby the driving voltage can be lowered. Therefore, the light-emitting element of one embodiment of the present invention enable reduction in power consumption.

As described above, with the structure in which the LUMO level of the first organic compound is lower than that of the second organic compound, the HOMO level of the first organic compound is lower than that of the second organic compound, the LUMO level of the guest material is higher than that of the first organic compound, the HOMO level of the guest material is lower than that of the second organic compound, and a combination of the first organic compound and the second organic compound forms an exciplex, a light-emitting element emitting blue light that achieves high emission efficiency and low driving voltage can be provided.

As described above, by employing the structure of one embodiment of the present invention, a light-emitting element having high emission efficiency can be provided. A light-emitting element with low power consumption can be provided. A light-emitting element emitting blue light and having high emission efficiency can be provided.

The structure described in this embodiment can be used in combination with any of the structures described in the other examples and embodiments as appropriate.

Example 20

In this example, an example of fabricating a light-emitting element (a light-emitting element 17) of one embodiment of the present invention which is suitable for a lighting device is described. The schematic cross-sectional views of FIG. 42 can be referred to for cross sections of the light-emitting element fabricated in this example. The detailed element structure is shown in Table 20. For the structures and abbreviations of the compounds used here are given below. Note that the above Examples can be referred to for other compounds.

Ir(dppm)$_2$(acac)

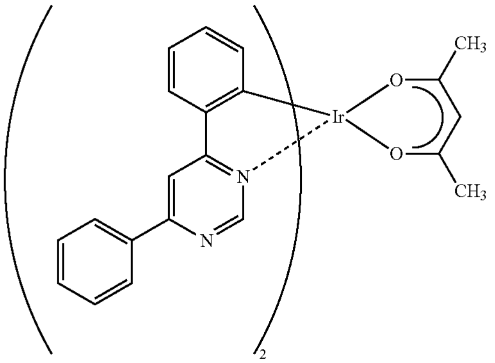

TABLE 20

| | Layer | Reference numeral | Thickness (nm) | Material | Weight ratio *1) |
|---|---|---|---|---|---|
| Light-emitting element 17 | Electrode | 102(2) | 100 | Ag | — |
| | | 102(1) | 1 | Ag:Mg | 0.6:0.2 |
| | Electron-injection layer | 119 | 1 | LiF | — |
| | Electron-transport layer | 118(2) | 20 | BPhen | — |
| | | 118(1) | 20 | 4,6mCzP2Pm | — |
| | Light-emitting layer | 160(2) | 30 | 4,6mCzP2Pm:PCCP:Ir(dppm)$_2$(acac) | 0.8:0.2:0.05 |
| | | 160(1) | 10 | 4,6mCzP2Pm:PCCP:Ir(mpptz-diBuCNp)$_3$ | 0.3:0.7:0.12 |
| | Hole-transport layer | 112 | 20 | PCCP | — |
| | Hole-injection layer | 111 | 30 | DBT3P-II:MoO$_3$ | 1:0.5 |
| | Electrode | 101 | 70 | ITO | — |

*1) The ratio of Ag:Mg is described in volume ratio.

<<Fabrication of Light-Emitting Element 17>>

As the electrode 101, a 70-nm-thick ITO film was formed over the substrate 200 formed of high refractive index glass (refractive index: 1.84) by a sputtering method. The electrode 101 was formed such that the light-emitting element has a light-emitting area of 8100 mm$^2$ (90 mm×90 mm).

As the hole-injection layer 111, DBT3P-II and MoO$_3$ were deposited over the electrode 101 by co-evaporation in a weight ratio of DBT3P-II:MoO$_3$=1:0.5 to a thickness of 30 nm.

As the hole-transport layer 112, PCCP was deposited by evaporation over the hole-injection layer 111 to a thickness of 20 nm.

As the light-emitting layer 160 over the hole-transport layer 112, 4,6mCzP2Pm, PCCP, and Ir(mpptz-diBuCNp)$_3$ were deposited by co-evaporation in a weight ratio of 4,6mCzP2Pm:PCCP:Ir(mpptz-diBuCNp)$_3$=0.3:0.7:0.12 to a thickness of 10 nm, and successively, 4,6mCzP2Pm, PCCP, and Ir(dppm)$_2$(acac) were deposited by co-evaporation in a weight ratio of 4,6mCzP2Pm:PCCP:Ir(dppm)$_2$(acac)=0.8:0.2:0.05 to a thickness of 30 nm. Note that in the light-emitting layer 160, 4,6mCzP2Pm corresponds to the first organic compound, PCCP corresponds to the second organic compound, and Ir(mpptz-diBuCNp)$_3$ and Ir(dppm)$_2$(acac) correspond to the guest materials (the phosphorescent compounds).

As the electron-transport layer 118, 4,6mCzP2Pm and BPhen were sequentially deposited by evaporation to thicknesses of 20 nm and 20 nm, respectively, over the light-emitting layer 160. Then, as the electron-injection layer 119, lithium fluoride (LiF) was deposited over the electron-transport layer 118 by evaporation to a thickness of 1 nm.

Next, as the electrode 102, silver (Ag) and magnesium (Mg) were deposited over the electron-injection layer 119 by co-evaporation in a volume ratio of Ag:Mg=0.6:0.2 to a thickness of 1 nm, and silver (Ag) was further deposited to a thickness of 100 nm.

Next, in a glove box containing a nitrogen atmosphere, the light-emitting element 17 was sealed by fixing the substrate 220 to the substrate 200 over which the organic material was deposited using a sealant for an organic EL device. For the detailed method, description of the light-emitting element 1 can be referred to.

A surface of the substrate 200 through which light is extracted was frosted. Through the above steps, the light-emitting element 17 was obtained.

<Characteristics of Light-Emitting Element>

Figure 113:
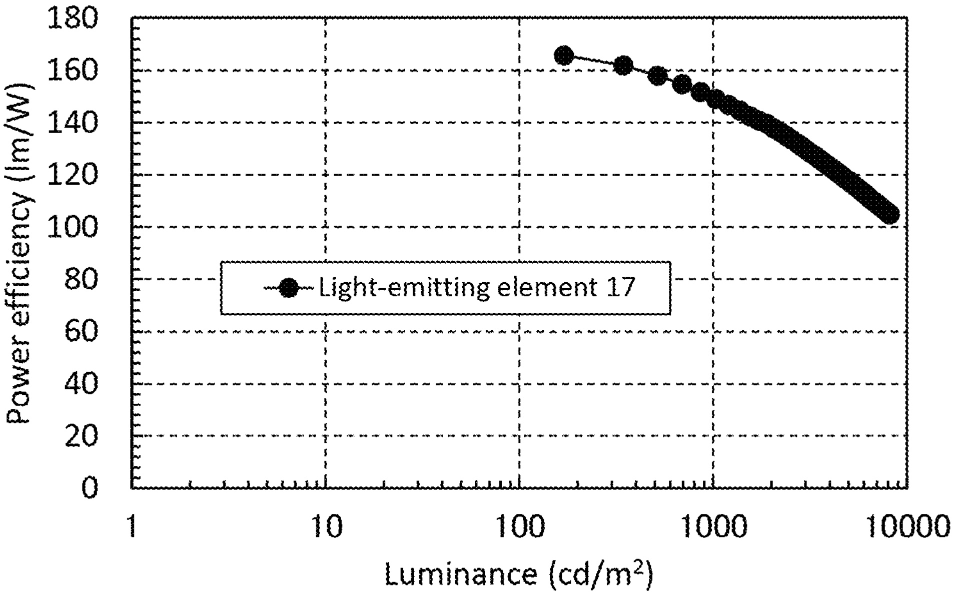
FIG. 113 is a graph showing power efficiency-luminance characteristics of a light-emitting element in Example.
Figure 114:
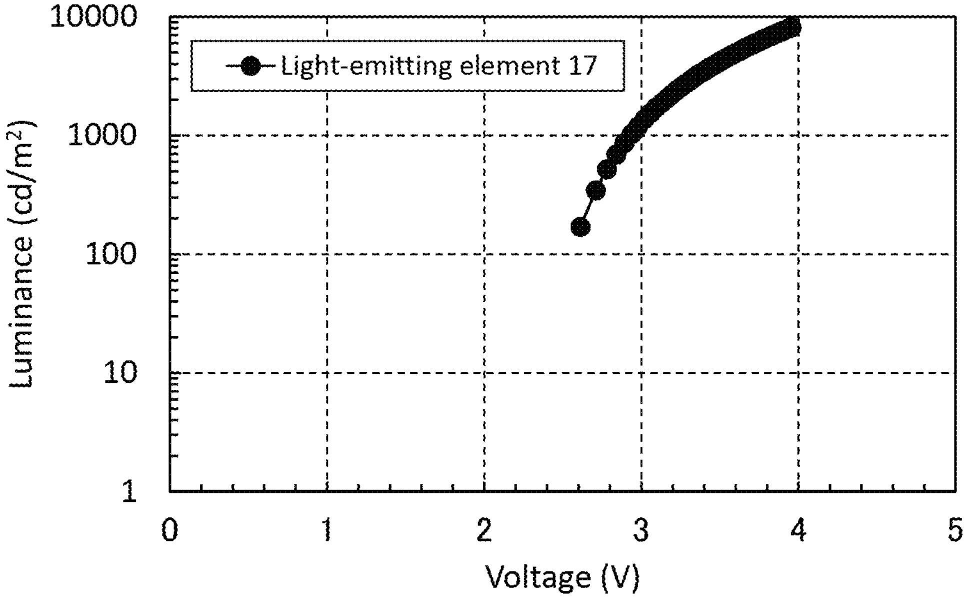
FIG. 114 is a graph showing luminance-voltage characteristics of a light-emitting element in Example.
Figure 115:
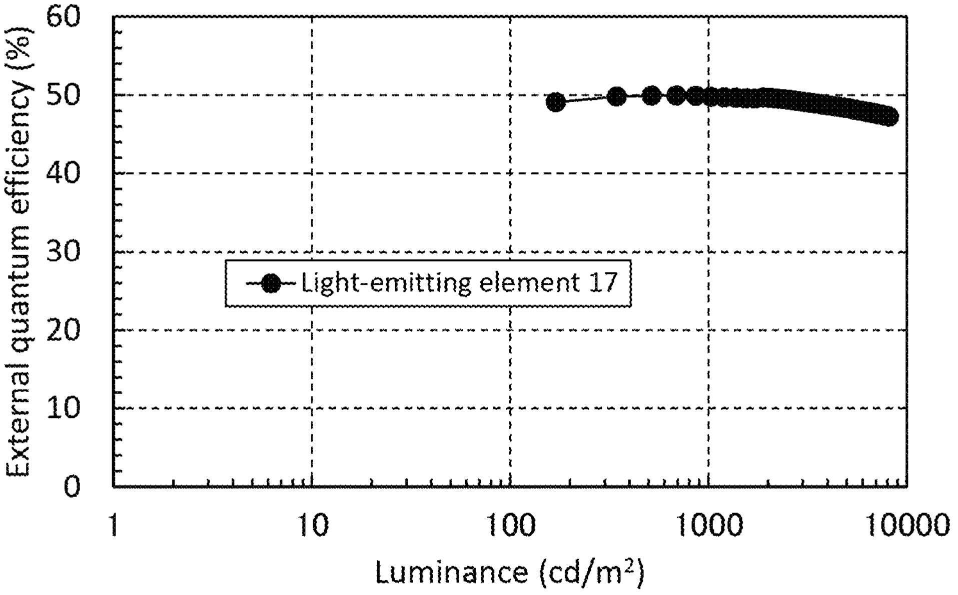
FIG. 115 is a graph showing external quantum efficiency-luminance characteristics of a light-emitting element in Example.

FIG. 113 shows power efficiency-luminance characteristics of the light-emitting element 17. FIG. 114 shows luminance-voltage characteristics. FIG. 115 shows external quantum efficiency-luminance characteristics. The total luminous flux of the light-emitting element was measured with an integrating sphere at room temperature (in an atmosphere kept at 23° C.).

Table 21 shows element characteristics of the light-emitting element 17 at around 1000 cd/m$^2$.

TABLE 21

| | Voltage (V) | Current (mA) | Chromaticity (x, y) | Luminance ($cd/m^2$) | Correlated color temperature (K) | duv | Power efficiency (lm/W) | External quantum efficiency (%) |
|---|---|---|---|---|---|---|---|---|
| Light-emitting element 17 | 2.9 | 60 | (0.48, 0.47) | 1030 | 2880 | 0.018 | 149 | 50 |

Figure 116:
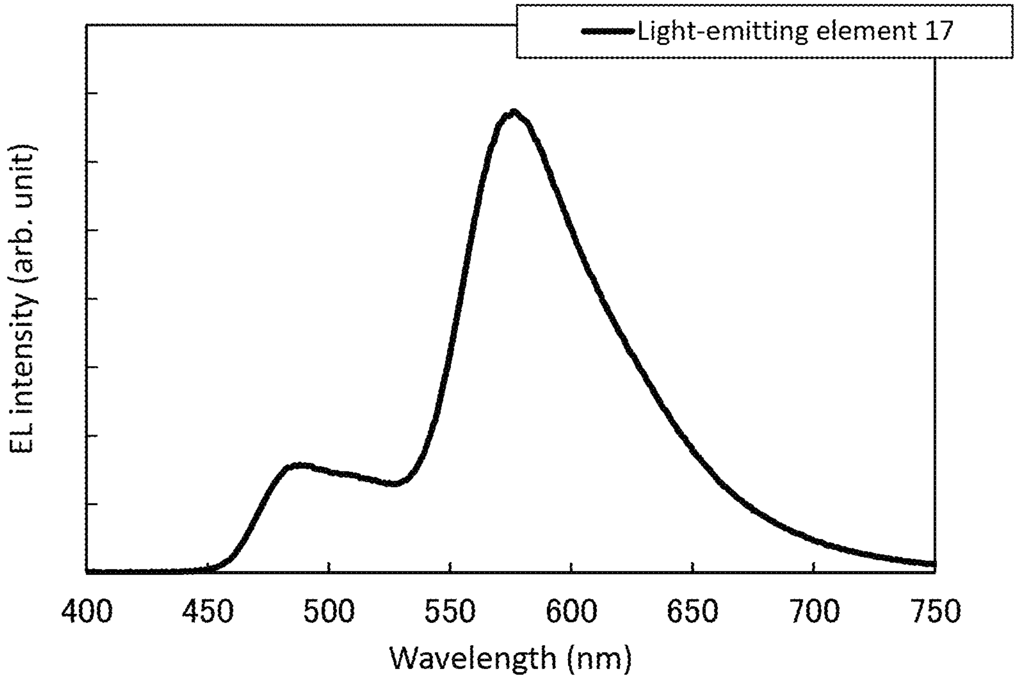
FIG. 116 is a graph showing an electroluminescence spectrum of a light-emitting element in Example.
Figure 117:
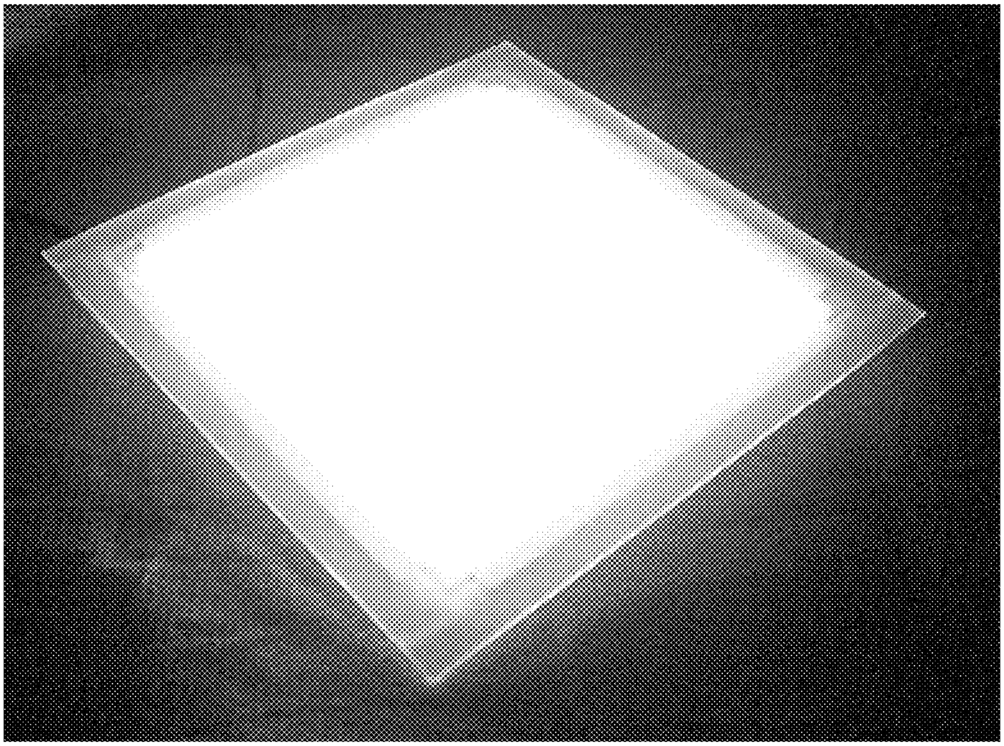
FIG. 117 shows light emission from a light-emitting element in Example.

FIG. 116 shows an emission spectrum of the light-emitting element 17 which was obtained when a current of 60 mA was made to flow through the light-emitting element 17. FIG. 117 is a photograph of light emission from the light-emitting element 17.

As shown in FIG. 113 to FIG. 115 and Table 21, the light-emitting element 17 has high external quantum efficiency and low driving voltage and thus exhibits high power efficiency. The maximum values of the power efficiency and the external quantum efficiency of the light-emitting element 17 are respectively 166 lm/W and 50%, which are excellent values.

As seen from FIG. 116, the electroluminescence spectrum of the light-emitting element 17 shows blue light emitted from Ir(mpptz-diBuCNp)$_3$ (guest material) and orange light emitted from Ir(dppm)$_2$(acac) (guest material). As shown in Table 21, light emitted from the light-emitting element 17 is incandescent color with a correlated color temperature of 2880 K and duv of 0.02 or smaller, which is preferable. Therefore, with use of an iridium complex including, as a ligand, an aryl group including a cyano group as a guest material, a light-emitting element suitably used for a lighting device with high emission efficiency can be fabricated.

As described in Example 4, in the light-emitting element 17, the LUMO level of the first organic compound (4,6mCzP2Pm) is lower than that of the second organic compound (PCCP), and the HOMO level of the first organic compound (4,6mCzP2Pm) is lower than that of the second organic compound (PCCP). In that case, carriers (electrons and holes) can be efficiently injected from a pair of electrodes to the first organic compound (4,6mCzP2Pm) and the second organic compound (PCCP), and the first organic compound (4,6mCzP2Pm) and the second organic compound (PCCP) can form an exciplex. Accordingly, the light-emitting element 17 has excellent characteristics that achieve both high emission efficiency and low driving voltage.

As FIG. 117 shows, the light-emitting element 17 emits light uniformly from the entire surface of the light-emitting area of 8100 mm$^2$. Therefore, the light-emitting element 17 is suitably used for a lighting device.

As described above, by employing the structure of one embodiment of the present invention, a light-emitting element having high emission efficiency can be provided. A light-emitting element with low power consumption can be provided. A light-emitting element emitting light suitable for a lighting device and having high emission efficiency can be provided.

The structure described in this embodiment can be used in combination with any of the structures described in the other examples and embodiments as appropriate.

Example 21

Synthesis Example 12

In this example, a synthesis example of tris[5'-cyano-2'-methyl-3-{3-methyl-1-(2,4,6-trimethylphenyl)-1H-1,2,4-triazol-5-yl-κN$^4$}-1,1'-biphenyl-4-yl-κC]iridium(III) (abbreviation: Ir(Mm3CN5btz1-tmp)$_3$), which is an organometallic complex of one embodiment of the present invention represented by Structural Formula (132) in Embodiment 2, is described in detail. The structure of Ir(Mm3CN5btz1-tmp)$_3$ is shown below.

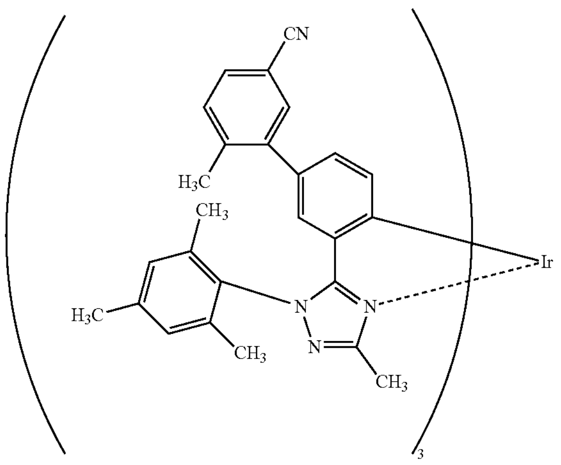

Ir(Mm3CN5btz1-tmp)$_3$

Step 1: Synthesis of 5-cyano-2-methylphenylboronic Acid

First, 9.5 g (50 mmol) of 3-bromo-4-methylbenzonitrile was put into a 500 mL three-neck flask, and the atmosphere in the flask was replaced with nitrogen. Then, 250 mL of tetrahydrofuran (THF) was added, and the mixture was stirred at −78° C. for 30 minutes. Into this mixed solution, 34 mL (55 mmol) of a 1.63M hexane solution of n-butyllithium (n-BuLi) was dropped, followed by stirring at −78° C. for 1.5 hours. After that, 7.3 mL (65 mmol) of trimethyl borate was added to the mixture and this solution was stirred for 20 hours while the temperature was raised to room temperature. To this solution was added 100 mL of 1M hydrochloric acid and stirring was performed for 30 minutes. The obtained mixture was separated to an aqueous layer and an organic layer, and the aqueous layer was subjected to extraction with ethyl acetate. The organic layer and a solution of the extract were combined, and washed with saturated saline. Anhydrous magnesium sulfate was added to the obtained solution for drying. The obtained mixture was subjected to gravity filtration, and the filtrate was concentrated to give a solid. This solid was washed with toluene and hexane, so that 4.3 g of a white solid was obtained in a yield of 53%. The obtained white solid was identified as 5-cyano-2-methylphenylboronic acid by nuclear magnetic resonance (NMR) spectroscopy. The synthesis scheme of Step 1 is shown in (a-10) below.

(a-10)

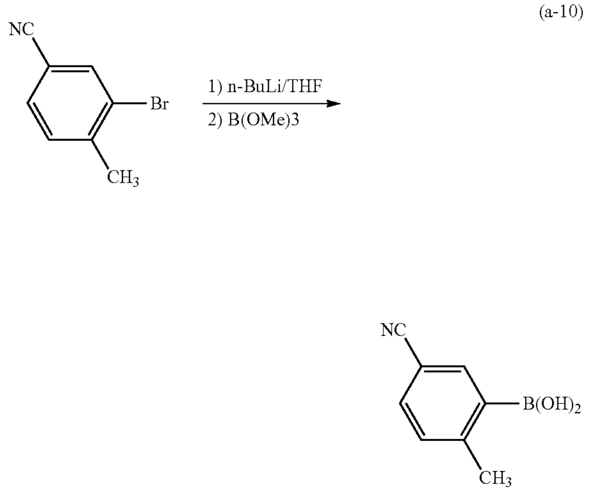

Step 2: Synthesis of 5-(5'-cyano-2'-methyl-1,1'-biphenyl-3-yl)-3-methyl-1-(2,4,6-trimethylphenyl)-1H-1,2,4-triazole (abbreviation: HMm3CN5btz1-tmp)

Into a 300 mL three-neck flask were put 7.6 g (21 mmol) of 5-(3-bromophenyl)-1-(2,4,6-trimethylphenyl)-3-methyl-1H-1,2,4-triazole obtained in Step 1, 4.12 g (26 mmol) of 5-cyano-2-methylphenylboronic acid, 16 g (77 mmol) of potassium phosphate, 130 mL of toluene, and 13 mL of water. The atmosphere in the flask was replaced with nitrogen. To this mixture were added 0.84 g (2.1 mmol) of bis(dibenzylideneacetone)palladium(0) and 0.59 g (1.0 mmol) of 2-dicyclohexylphosphino-2',6'-dimethoxybiphenyl (S-phos), and the mixture was heated and stirred at 90° C. for 3.5 hours to be reacted. After the reaction, an organic layer and an aqueous layer of the obtained reacted solution were separated, and the aqueous layer was subjected to extraction with toluene. The solution of the extract and the organic layer were combined and washed with water and saturated saline. Anhydrous magnesium sulfate was added to the obtained solution for drying. The obtained mixture was subjected to gravity filtration, and the filtrate was concentrated to give an oily substance. This oily substance was purified by flash column chromatography. As a developing solvent, a mixed solvent of toluene and ethyl acetate in a ratio of 5:1 (v:v) was used. The obtained fraction was concentrated to give 6.5 g of a yellow oily substance in a yield of 78%. The obtained yellow oily substance was identified as HMm3CN5btz1-tmp by nuclear magnetic resonance (NMR) spectroscopy. The synthesis scheme of Step 2 is shown in (b-10) below.

(b-10)

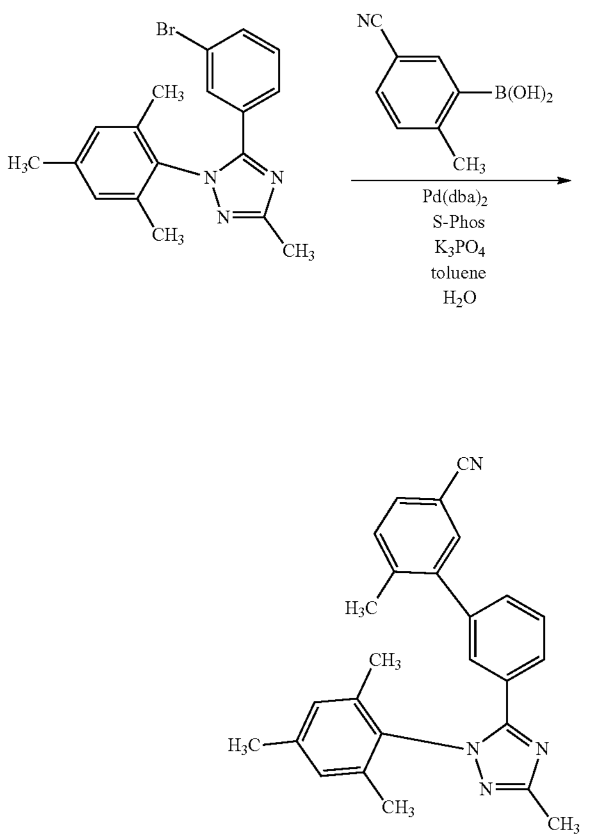

HMm3CN5btz1-tmp

Step 3: Synthesis of Ir(Mm3CN5btz1-tmp)$_3$

Into a 50 mL recovery flask were put 2.0 g (5.1 mmol) of HMm3CN5btz1-tmp obtained in Step 2, 0.69 g (2.3 mmol) of iridium chloride hydrate, 21 mL of 2-ethoxyethanol, and 7 mL of water. The atmosphere in the flask was replaced with argon. This flask was heated by irradiation with microwaves under conditions of 100 W and 100° C. for one hour to cause a reaction. After the reaction, the reacted solution was concentrated to give a brown oily substance. To this oily substance were added 1.2 g (4.6 mmol) of silver trifluoromethanesulfonate and 4.5 g (11.5 mmol) of HMm3CN5btz1-tmp. The atmosphere in the flask was replaced with nitrogen, and the mixture was heated and stirred at 170° C. for 23 hours. After the reaction, the reaction mixture was dissolved in dichloromethane, and the mixture was subjected to suction filtration through Celite to remove an insoluble solid. The resulting filtrate was purified by silica column chromatography. As a developing solvent, a mixed solvent of dichloromethane and ethyl acetate in a ratio of 5:1 (v:v) was used. The obtained fraction was concentrated to give a solid. This solid was recrystallized from ethyl acetate/hexane, so that 23 mg of a yellow solid was obtained in a yield of 0.73%. The obtained yellow solid was identified as Ir(Mm3CN5btz1-tmp)$_3$ by nuclear magnetic resonance (NMR) spectroscopy. The synthesis scheme of Step 3 is shown in (c-10) below.

(c-10)

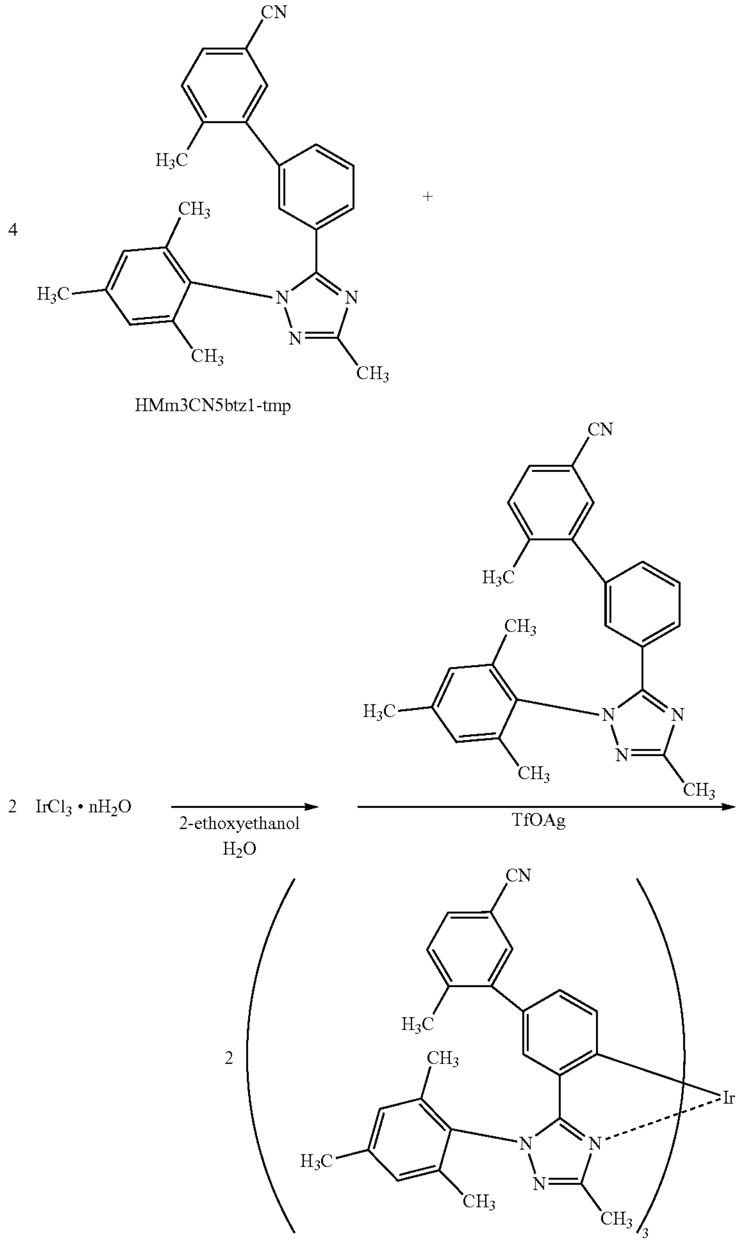

HMm3CN5btz1-tmp $Ir(Mm3CN5btz1\text{-}tmp)_3$

Figure 118:
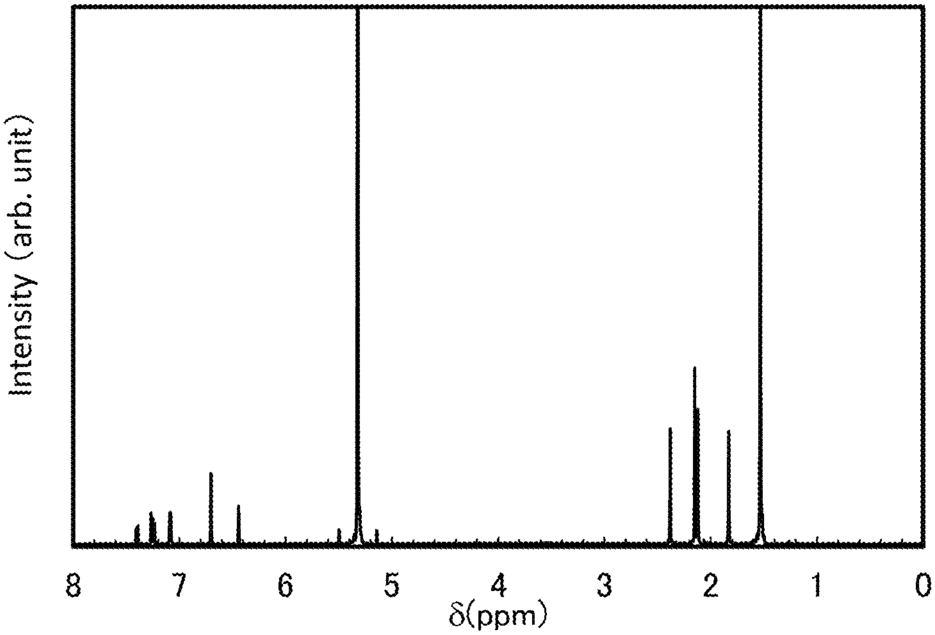
FIG. 118 is an NMR chart of a compound of one embodiment of the present invention.

Measurement was performed on the protons ($^1H$) of the yellow solid that was obtained in Step 3 by nuclear magnetic resonance (NMR) spectroscopy. The obtained values are shown below. The $^1H$-NMR chart is shown in FIG. 118. These results revealed that the organometallic complex $Ir(Mm3CN5btz1\text{-}tmp)_3$, which is one embodiment of the present invention represented by Structural Formula (132), was obtained in Synthesis example 12.

$^1H$-NMR δ ($CD_2Cl_2$): 1.83 (s, 9H), 2.12 (s, 9H), 2.14-2.15 (m, 18H), 2.38 (s, 9H), 6.44 (s, 3H), 6.70 (s, 6H), 7.08 (d, 6H), 7.24 (d, 3H), 7.26 (d, 3H), 7.40 (dd, 3H).

<Characteristics of $Ir(Mm3CN5btz1\text{-}tmp)_3$>

Figure 119:
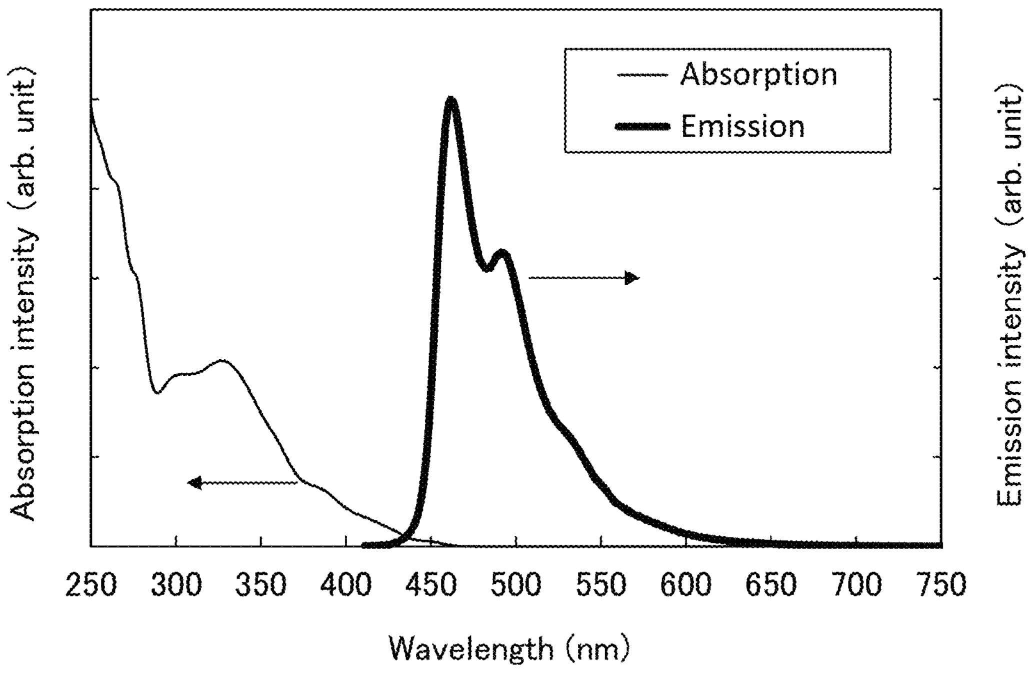
FIG. 119 is a graph showing an absorption spectrum and an emission spectrum of a compound of one embodiment of the present invention.

The absorption and emission spectra of a dichloromethane solution (0.015 mmol/L) of $Ir(Mm3CN5btz1\text{-}tmp)_3$ were measured. The measurement of the absorption and emission spectra was performed in a manner similar to that described in Example 1. FIG. 119 shows measurement results of the absorption and emission spectra. The horizontal axis represents wavelength and the vertical axes represent absorption intensity and emission intensity. Note that the absorption spectrum in FIG. 119 is a result obtained by subtraction of a measured absorption spectrum of only dichloromethane that was put in a quartz cell from the measured absorption spectrum of the dichloromethane solution in a quartz cell.

As shown in FIG. 119, blue light emission having emission peaks at 462 nm and 489 nm was observed from the dichloromethane solution of $Ir(Mm3CN5btz1\text{-}tmp)_3$.

REFERENCE NUMERALS

100: EL layer, 101: electrode, 101*a*: conductive layer, 101*b*: conductive layer, 101*c*: conductive layer, 102: electrode, 103: electrode, 103*a*: conductive layer, 103*b*: conductive layer, 104: electrode, 104*a*: conductive layer, 104*b*: conductive layer, 106: light-emitting unit, 108: light-emitting unit, 111: hole-injection layer, 112: hole-transport layer, 113: electron-transport layer, 114: electron-injection layer, 115: charge-generation layer, 116: hole-injection layer, 117: hole-transport layer, 118: electron-transport layer, 119: electron-injection layer, 123B: light-emitting layer, 123G: light-emitting layer, 123R: light-emitting layer, 130: light-emitting layer, 131: host material, 131_1: organic compound, 131_2: organic compound, 132: guest material, 140: light-emitting layer, 141: host material, 141_1: organic compound, 141_2: organic compound, 142: guest material, 145: partition wall, 150: light-emitting element, 152: light-emitting element, 160: light-emitting layer, 170: light-emitting layer, 180: light-emitting layer, 190: light-emitting layer, 190*a*: light-emitting layer, 190*b*: light-emitting layer, 200: substrate, 220: substrate, 221B: region, 221G: region, 221R: region, 222B: region, 222G: region, 222R: region, 223: light-blocking layer, 224B: optical element, 224G: optical element, 224R: optical element, 250: light-emitting element, 260*a*: light-emitting element, 260*b*: light-emitting element, 262*a*: light-emitting element, 262*b*: light-emitting element, 301_1: wiring, 3015: wiring, 3016: wiring, 301_7: wiring, 302_1: wiring, 302_2: wiring, 3031: transistor, 303_6: transistor, 303_7: transistor, 304: capacitor, 304_1: capacitor, 304_2: capacitor, 305: light-emitting element, 306_1: wiring, 306_3: wiring, 3071: wiring, 307_3: wiring, 308_1: transistor, 308_6: transistor, 3091: transistor, 309_2: transistor, 3111: wiring, 3113: wiring, 312_1: wiring, 312_2: wiring, 600: display device, 601: signal line driver circuit portion, 602: pixel portion, 603: scan line driver circuit portion, 604: sealing substrate, 605: sealing material, 607: region, 607*a*: sealing layer, 607*b*: sealing layer, 607*c*: sealing layer, 608: wiring, 609: FPC, 610: element substrate, 611: transistor, 612: transistor, 613: lower electrode, 614: partition wall, 616: EL layer, 617: upper electrode, 618: light-emitting element, 621: optical element, 622: light-blocking layer, 623: transistor, 624: transistor, 801: pixel circuit, 802: pixel portion, 804: driver circuit portion, 804*a*: scan line driver circuit, 804*b*: signal line driver circuit, 806: protection circuit, 807: terminal portion, 852: transistor, 854: transistor, 862: capacitor, 872: light-emitting element, 1001: substrate, 1002: base insulating film, 1003: gate insulating film, 1006: gate electrode, 1007: gate electrode, 1008: gate electrode, 1020: interlayer insulating film, 1021: interlayer insulating film, 1022: electrode, 1024B: lower electrode, 1024G: lower electrode, 1024R: lower electrode, 1024Y: lower electrode, 1025: partition wall, 1026: upper electrode, 1028: EL layer, 1028B: light-emitting layer, 1028G: light-emitting layer, 1028R: light-emitting layer, 1028Y: light-emitting layer, 1029: sealing layer, 1031: sealing substrate, 1032: sealing material, 1033: base material, 1034B: coloring layer, 1034G: coloring layer, 1034R: coloring layer, 1034Y: coloring layer, 1035: light-blocking layer, 1036: overcoat layer, 1037: interlayer insulating film, 1040: pixel portion, 1041: driver circuit portion, 1042: peripheral portion, 2000: touch panel, 2001: touch panel, 2501: display device, 2502R: pixel, 2502*t*: transistor, 2503*c*: capacitor, 2503 *g*: scan line driver circuit, 2503*s*: signal line driver circuit, 2503*t*: transistor, 2509: FPC, 2510: substrate, 2510*a*: insulating layer, 2510*b*: flexible substrate, 2510*c*: adhesive layer, 2511: wiring, 2519: terminal, 2521: insulating layer, 2528: partition wall, 2550R: light-emitting element, 2560: sealing layer, 2567BM: light-blocking layer, 2567*p*: anti-reflective layer, 2567R: coloring layer, 2570: substrate, 2570*a*: insulating layer, 2570*b*: flexible substrate, 2570*c*: adhesive layer, 2580R: light-emitting module, 2590: substrate, 2591: electrode, 2592: electrode, 2593: insulating layer, 2594: wiring, 2595: touch sensor, 2597: adhesive layer, 2598: wiring, 2599: connection layer, 2601: pulse voltage output circuit, 2602: current sensing circuit, 2603: capacitance, 2611: transistor, 2612: transistor, 2613: transistor, 2621: electrode, 2622: electrode, 3000: light-emitting device, 3001: substrate, 3003: substrate, 3005: light-emitting element, 3007: sealing region, 3009: sealing region, 3011: region, 3013: region, 3014: region, 3015: substrate, 3016: substrate, 3018: desiccant, 3500: multifunction terminal, 3502: housing, 3504: display portion, 3506: camera, 3508: lighting, 3600: light, 3602: housing, 3608: lighting, 3610: speaker, 8000: display module, 8001: upper cover, 8002: lower cover, 8003: FPC, 8004: touch sensor, 8005: FPC, 8006: display device, 8009: frame, 8010: printed board, 8011: battery, 8501: lighting device, 8502: lighting device, 8503: lighting device, 8504: lighting device, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: portable information terminal, 9101: portable information terminal, 9102: portable information terminal, 9200: portable information terminal, 9201: portable information terminal, 9300: television device, 9301: stand, 9311: remote controller, 9500: display device, 9501: display panel, 9502: display region, 9503: region, 9511: axis portion, 9512: bearing, 9700: automobile, 9701: car body, 9702: wheel, 9703: dashboard, 9704: light, 9710: display portion, 9711: display portion, 9712: display portion, 9713: display portion, 9714: display portion, 9715: display portion, 9721: display portion, 9722: display portion, 9723: display portion.

This application is based on Japanese Patent Application serial no. 2015-122398 filed with Japan Patent Office on Jun. 17, 2015, Japanese Patent Application serial no. 2015-157207 filed with Japan Patent Office on Aug. 7, 2015, Japanese Patent Application serial no. 2015-233283 filed with Japan Patent Office on Nov. 30, 2015, Japanese Patent Application serial no. 2016-051311 filed with Japan Patent Office on Mar. 15, 2016, the entire contents of which are hereby incorporated by reference.

The invention claimed is:

1. A light-emitting device comprising:

a light-emitting layer between a pair of electrodes, wherein the light-emitting layer comprises a first organic compound, a second organic compound, and a phosphorescent compound, wherein the first organic compound comprises a pyrimidine derivative or a triazine derivative, wherein a LUMO level of the first organic compound is lower than a LUMO level of the second organic compound, wherein a HOMO level of the first organic compound is lower than a HOMO level of the second organic compound, wherein an energy difference between a LUMO level of the phosphorescent compound and a HOMO level of the phosphorescent compound is larger than an energy difference between the LUMO level of the first organic compound and the HOMO level of the second organic compound, wherein the first organic compound and the second organic compound form an exciplex, wherein the energy difference between the LUMO level of the phosphorescent compound and the HOMO level of the phosphorescent compound is larger than a transition energy obtained from the absorption edge of the phosphorescent compound by 0.4 eV or more, and wherein an energy difference between the LUMO level of the phosphorescent compound and the LUMO level of the first organic compound is larger than or equal to 0.1 eV.

2. The light-emitting device according to claim 1, wherein an emission spectrum of the phosphorescent compound has at least one peak in a wavelength region of greater than or equal to 400 nm and less than 505 nm.

3. The light-emitting device according to claim 1, wherein the LUMO level of the phosphorescent compound is higher than the LUMO level of the first organic compound.

4. The light-emitting device according to claim 1, wherein the HOMO level of the phosphorescent compound is lower than the HOMO level of the second organic compound.

5. The light-emitting device according to claim 1, wherein the phosphorescent compound comprises a ligand coordinated to iridium, and wherein the ligand comprises a nitrogen-containing five-membered heterocyclic skeleton and a cyano group.

6. The light-emitting device according to claim 1, wherein the second organic compound comprises a carbazole derivative.

7. A light-emitting device comprising:

a light-emitting layer between a pair of electrodes, wherein the light-emitting layer comprises a first organic compound, a second organic compound, and a phosphorescent compound, wherein the first organic compound comprises a pyrimidine derivative or a triazine derivative, wherein a LUMO level of the first organic compound is lower than a LUMO level of the second organic compound, wherein a HOMO level of the first organic compound is lower than a HOMO level of the second organic compound, wherein an energy difference between a LUMO level of the phosphorescent compound and a HOMO level of the phosphorescent compound is larger than an energy difference between the LUMO level of the first organic compound and the HOMO level of the second organic compound, wherein the first organic compound and the second organic compound form an exciplex, wherein the energy difference between the LUMO level of the first organic compound and the HOMO level of the second organic compound is larger than or equal to a transition energy obtained from the absorption edge of the phosphorescent compound, and wherein an energy difference between the LUMO level of the phosphorescent compound and the LUMO level of the first organic compound is larger than or equal to 0.1 eV.

8. The light-emitting device according to claim 7, wherein an emission spectrum of the phosphorescent compound has at least one peak in a wavelength region of greater than or equal to 400 nm and less than 505 nm.

9. The light-emitting device according to claim 7, wherein the LUMO level of the phosphorescent compound is higher than the LUMO level of the first organic compound.

10. The light-emitting device according to claim 7, wherein the HOMO level of the phosphorescent compound is lower than the HOMO level of the second organic compound.

11. The light-emitting device according to claim 7, wherein the phosphorescent compound comprises a ligand coordinated to iridium, and wherein the ligand comprises a nitrogen-containing five-membered heterocyclic skeleton and a cyano group.

12. The light-emitting device according to claim 7, wherein the second organic compound comprises a carbazole derivative.

13. A light-emitting device comprising:

a light-emitting layer between a pair of electrodes, wherein the light-emitting layer comprises a first organic compound, a second organic compound, and a phosphorescent compound, wherein the first organic compound comprises a pyrimidine derivative or a triazine derivative, wherein the second organic compound comprises a carbazole derivative, wherein a LUMO level of the first organic compound is lower than a LUMO level of the second organic compound, wherein a HOMO level of the first organic compound is lower than a HOMO level of the second organic compound, wherein an energy difference between a LUMO level of the phosphorescent compound and a HOMO level of the phosphorescent compound is larger than an energy difference between the LUMO level of the first organic compound and the HOMO level of the second organic compound, wherein the first organic compound and the second organic compound form an exciplex, and wherein an energy difference between the LUMO level of the phosphorescent compound and the LUMO level of the first organic compound is larger than or equal to 0.1 eV.

14. The light-emitting device according to claim 13, wherein an emission spectrum of the phosphorescent compound has at least one peak in a wavelength region of greater than or equal to 400 nm and less than 505 nm.

15. The light-emitting device according to claim 13, wherein the LUMO level of the phosphorescent compound is higher than the LUMO level of the first organic compound.

16. The light-emitting device according to claim 13, wherein the HOMO level of the phosphorescent compound is lower than the HOMO level of the second organic compound.

17. The light-emitting device according to claim 13, wherein the phosphorescent compound comprises a ligand coordinated to iridium, and wherein the ligand comprises a nitrogen-containing five-membered heterocyclic skeleton and a cyano group.

* * * * *